US009590194B2

(12) United States Patent
Boudreault et al.

(10) Patent No.: US 9,590,194 B2
(45) Date of Patent: Mar. 7, 2017

(54) ORGANIC ELECTROLUMINESCENT MATERIALS AND DEVICES

(71) Applicant: Universal Display Corporation, Ewing, NJ (US)

(72) Inventors: Pierre-Luc T. Boudreault, Pennington, NJ (US); Alexey Borisovich Dyatkin, Ambler, PA (US); Chuanjun Xia, Lawrenceville, NJ (US); Scott Joseph, Ewing, NJ (US); David Zenan Li, Princeton, NJ (US); Hitoshi Yamamoto, Pennington, NJ (US); Michael S. Weaver, Princeton, NJ (US)

( * ) Notice: Subject to any disclaimer, the term of this patent is extended or adjusted under 35 U.S.C. 154(b) by 573 days.

(21) Appl. No.: 14/181,118

(22) Filed: Feb. 14, 2014

(65) Prior Publication Data

US 2015/0236276 A1 Aug. 20, 2015

(51) Int. Cl.

*H01L 51/00* (2006.01)
*H01L 51/50* (2006.01)

(52) U.S. Cl.

CPC ...... *H01L 51/0085* (2013.01); *H01L 51/5016* (2013.01)

(58) Field of Classification Search

None

See application file for complete search history.

(56) References Cited

U.S. PATENT DOCUMENTS 4,769,292 A 9/1988 Tang et al.
5,061,569 A 10/1991 VanSlyke et al.
5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada (Continued)

FOREIGN PATENT DOCUMENTS

EP 0650955 5/1995
EP 1725079 11/2006

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Nathan T Leong
(74) *Attorney, Agent, or Firm* — Duane Morris LLP

(57) ABSTRACT

The present invention relates to metal complexes having novel ligands. The compounds are useful in organic light emitting devices (OLEDs), particularly as emitting dopants. The incorporation of these novel ligands provides red phosphorescent materials with good external quantum efficiency, good color, and long lifetime.

22 Claims, 3 Drawing Sheets

(56) References Cited

U.S. PATENT DOCUMENTS 6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
8,946,697 B1 * 2/2015 Ma .................... C07F 15/0033 257/40
2002/0034656 A1 3/2002 Thompson et al.
2002/0134984 A1 9/2002 Igarashi
2002/0158242 A1 10/2002 Son et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0128466 A1 * 6/2007 Nomura ................ C09K 11/06 428/690
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 * 12/2008 Knowles ............ C07F 15/0033 313/504
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.

FOREIGN PATENT DOCUMENTS

EP 2034538 3/2009
JP 200511610 1/2005
JP 2007123392 5/2007
JP 2007254297 10/2007
JP 2008074939 4/2008
WO 01/39234 5/2001
WO 02/02714 1/2002
WO 0215654 2/2002
WO 03040257 5/2003
WO 03060956 7/2003
WO 2004093207 10/2004
WO 2004107822 12/2004
WO 2005014551 2/2005
WO 2005019373 3/2005
WO 2005030900 4/2005
WO 2005089025 9/2005
WO 2005123873 12/2005
WO 2006009024 1/2006
WO 2006056418 6/2006
WO 2006072002 7/2006
WO 2006082742 8/2006
WO 2006098120 9/2006
WO 2006100298 9/2006
WO 2006103874 10/2006
WO 2006114966 11/2006
WO 2006132173 12/2006
WO 2007002683 1/2007
WO 2007004380 1/2007
WO 2007063754 6/2007
WO 2007063796 6/2007
WO 2008056746 5/2008
WO 2008101842 8/2008
WO 2008132085 11/2008
WO 2009000673 12/2008
WO 2009003898 1/2009
WO 2009008311 1/2009
WO 2009018009 2/2009
WO 2009021126 2/2009
WO 2009050290 4/2009
WO 2009062578 5/2009
WO 2009063833 5/2009
WO 2009066778 5/2009
WO 2009066779 5/2009
WO 2009086028 7/2009
WO 2009100991 8/2009

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

(56) References Cited

OTHER PUBLICATIONS

Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4''-Tri(N-carbazolyl)triphenylamine (TCTA) and 4,4',4''-Tris(3-methylphenylphenyl-amino) triphenylamine (m-MTDATA), as Hole-Transport Materials," Adv. Mater, 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5''-Bis (dimesitylboryl)-2,2'5',2''-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

Formula I-A

ORGANIC ELECTROLUMINESCENT MATERIALS AND DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to metal complexes having novel ligands. The compounds are useful in organic light emitting devices (OLEDs), particularly as emitting dopants. The incorporation of these novel ligands provides red phosphorescent materials with good external quantum efficiency, good color, and long lifetime.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices, organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

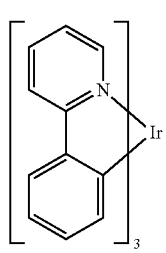

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second lay: For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Compounds comprising a metal complex with novel ligand structures are provided. The compounds may be used in organic light emitting devices. In particular the compounds may be useful as phosphorescent emitting dopants in such devices.

The present invention provides a compound comprising a ligand $L_A$ of formula I:

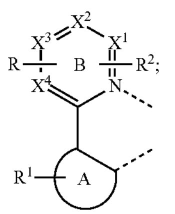

(I)

wherein ring A is a 5-membered or 6-membered carbocyclic or heterocyclic ring;

wherein R is fused to ring B and has formula II:

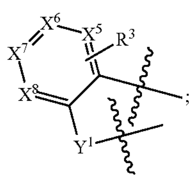

(II)

wherein the wave lines indicate bonds to ring B;

wherein $R^1$ and $R^3$ each independently represent mono, di, tri, or tetra substitution, or no substitution;

wherein $R^2$ represents mono or di substitution, or no substitution;

wherein $X^1$, $X^2$, $X^3$, $X^4$, $X^5$, $X^6$, $X^7$, and $X^8$ are each independently carbon or nitrogen;

wherein at least one of $X^1$, $X^2$, $X^3$, $X^4$, $X^5$, $X^6$, $X^7$, and $X^8$ is nitrogen;

wherein $Y^1$ is selected from the group consisting of BR', NR', PR', O, S, Se, C═O, S═O, $SO_2$, CR'R", SiR'R", and GeR'R";

wherein $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfanyl, sulfonyl, phosphino, and combinations thereof, or wherein any two adjacent substituents are optionally joined to form a ring, which can be further substituted;

wherein $L_A$ is coordinated to a metal M;

wherein $L_A$ is optionally linked with other ligands to comprise a tridentate, tetradentate, pentadentate, or hexadentate ligand; and wherein M is optionally coordinated to other ligands.

In some embodiments, M is selected from the group consisting of Ir, Rh, Re, Ru, Os, Pt, Au, and Cu.

In some embodiments, M is Ir.

In some embodiments, $Y^1$ is selected from the group consisting of NR', O, S, and CR'R".

In some embodiments, $Y^1$ is O.

In some embodiments, one of $X^1$, $X^2$, $X^3$, $X^4$, $X^5$, $X^6$, $X^7$, and $X^8$ is nitrogen.

In some embodiments, two of $X^1$, $X^2$, $X^3$, $X^4$, $X^5$, $X^6$, $X^7$, and $X^8$ are nitrogen.

In some embodiments, one of $X^1$, $X^2$, $X^3$, and $X^4$ is nitrogen; and one of $X^5$, $X^6$, $X^7$, and $X^8$ is nitrogen.

In some embodiments, one of $X^1$, $X^2$, $X^3$, $X^4$ is nitrogen; and $X^5$, $X^6$, $X^7$, and $X^8$ are carbon.

In some embodiments, $X^2$ is nitrogen; and $X^1$, $X^3$, $X^4$, $X^5$, $X^6$, $X^7$ and $X^8$ are carbon.

In some embodiments, A is phenyl.

In some embodiments, $L_A$ is selected from the group consisting of:

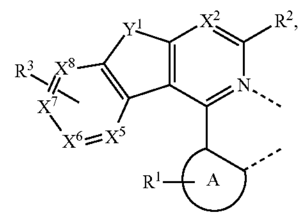

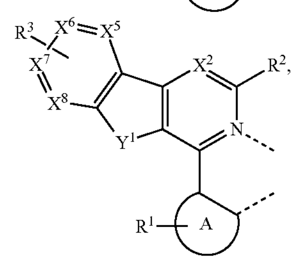

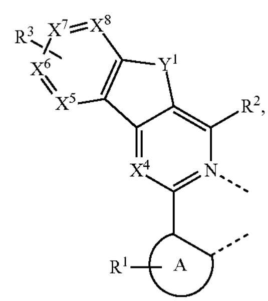

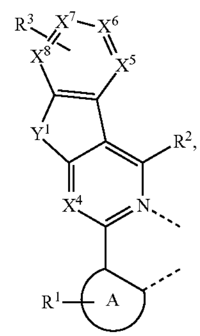

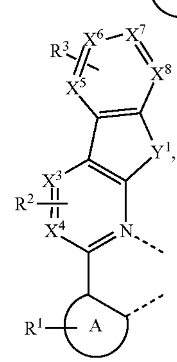

and

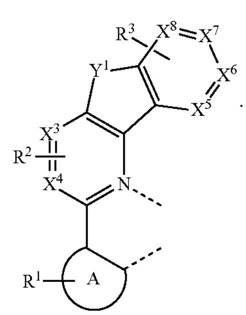
.

In some embodiments, the compound has formula III-A:

$$(L_A)_n Ir(L_B)_{3-n} \quad \text{(III-A);}$$

wherein $L_B$ is a bidentate ligand; and n is 1, 2, or 3.

In some embodiments, $L_A$ is selected from the group consisting of $L_{A1}$ to $L_{A960}$.

In some embodiments, $L_B$ is selected from the group consisting of $L_{B1}$ to $L_{B41}$.

In some embodiments, $L_B$ is selected from the group consisting of $L_{B42}$ to $L_{B45}$.

In some embodiments, the compound has formula IV:

$$(L_A)_3\text{-}M \quad \text{(IV);}$$

and is selected from the group consisting of compound 1 to compound 960 listed in TABLE 1.

In some embodiments, the compound has formula V:

$$(L_A)_1 Ir(L_B)_2 \quad \text{(V);}$$

and is selected from the group consisting of compound 961 to compound 5760 listed in TABLE 2.

In some embodiments, the compound has formula VI:

$$(L_A)_2 Ir(L_B)_1 \quad \text{(VI);}$$

and is selected from the group consisting of compound 5761 to compound 7680 listed in TABLE 3.

In some embodiments, the compound is selected from the group consisting of:

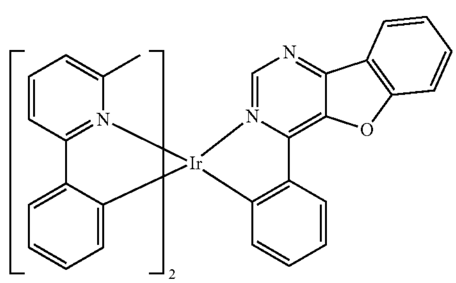

and

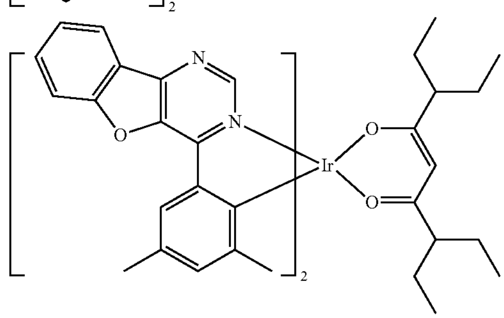

The present invention also provides an organic light emitting device. The organic light emitting device comprises:

an anode;

a cathode; and an organic layer, disposed between the anode and the cathode, wherein the organic layer comprises a compound comprising a ligand $L_A$ of formula I:

(I)

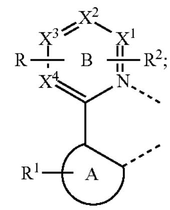

wherein ring A is a 5-membered or 6-membered carbocyclic or heterocyclic ring;

wherein R is fused to ring B and has formula II:

(II)

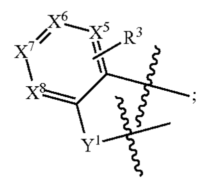

wherein the wave lines indicate bonds to ring B;

wherein $R^1$ and $R^3$ each independently represent mono, di, tri, or tetra substitution, or no substitution;

wherein $R^2$ represents mono or di substitution, or no substitution;

wherein $X^1$, $X^2$, $X^3$, $X^4$, $X^5$, $X^6$, $X^7$, and $X^8$ are each independently carbon or nitrogen;

wherein at least one of $X^1$, $X^2$, $X^3$, $X^4$, $X^5$, $X^6$, $X^7$, and $X^8$ is nitrogen;

wherein $Y^1$ is selected from the group consisting of BR', NR', PR', O, S, Se, C═O, S═O, $SO_2$, CR'R", SiR'R", and GeR'R";

wherein $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, or wherein any two adjacent substituents are optionally joined to form a ring, which can be further substituted;

wherein $L_A$ is coordinated to a metal M;

wherein $L_A$ is optionally linked with other ligands to comprise a tridentate, tetradentate, pentadentate, or hexadentate ligand; and wherein M is optionally coordinated to other ligands.

The present invention also provides a formulation comprising a compound comprising ligand $L_A$ of formula I:

(I)

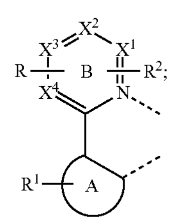

wherein ring A is a 5-membered or 6-membered carbocyclic or heterocyclic ring;

wherein R is fused to ring B and has formula III:

(II)

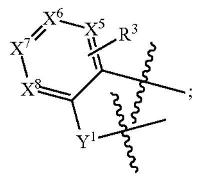

wherein the wave lines indicate bonds to ring B;

wherein $R^1$ and $R^3$ each independently represent mono, di, tri, or tetra substitution, or no substitution;

wherein $R^2$ represents mono or di substitution, or no substitution;

wherein $X^1$, $X^2$, $X^3$, $X^4$, $X^5$, $X^6$, $X^7$, and $X^8$ are each independently carbon or nitrogen;

wherein at least one of $X^1$, $X^2$, $X^3$, $X^4$, $X^5$, $X^6$, $X^7$, and $X^8$ is nitrogen;

wherein $Y^1$ is selected from the group consisting of BR', NR', PR', O, S, Se, C═O, S═O, $SO_2$, CR'R", SiR'R", and GeR'R";

wherein $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, or wherein any two adjacent substituents are optionally joined to form a ring, which can be further substituted;

wherein $L_A$ is coordinated to metal M;

wherein $L_A$ is optionally linked with other ligands to comprise a tridentate, tetradentate, pentadentate, or hexadentate ligand; and wherein M is optionally coordinated to other ligands.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the pertinent art to make and use the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
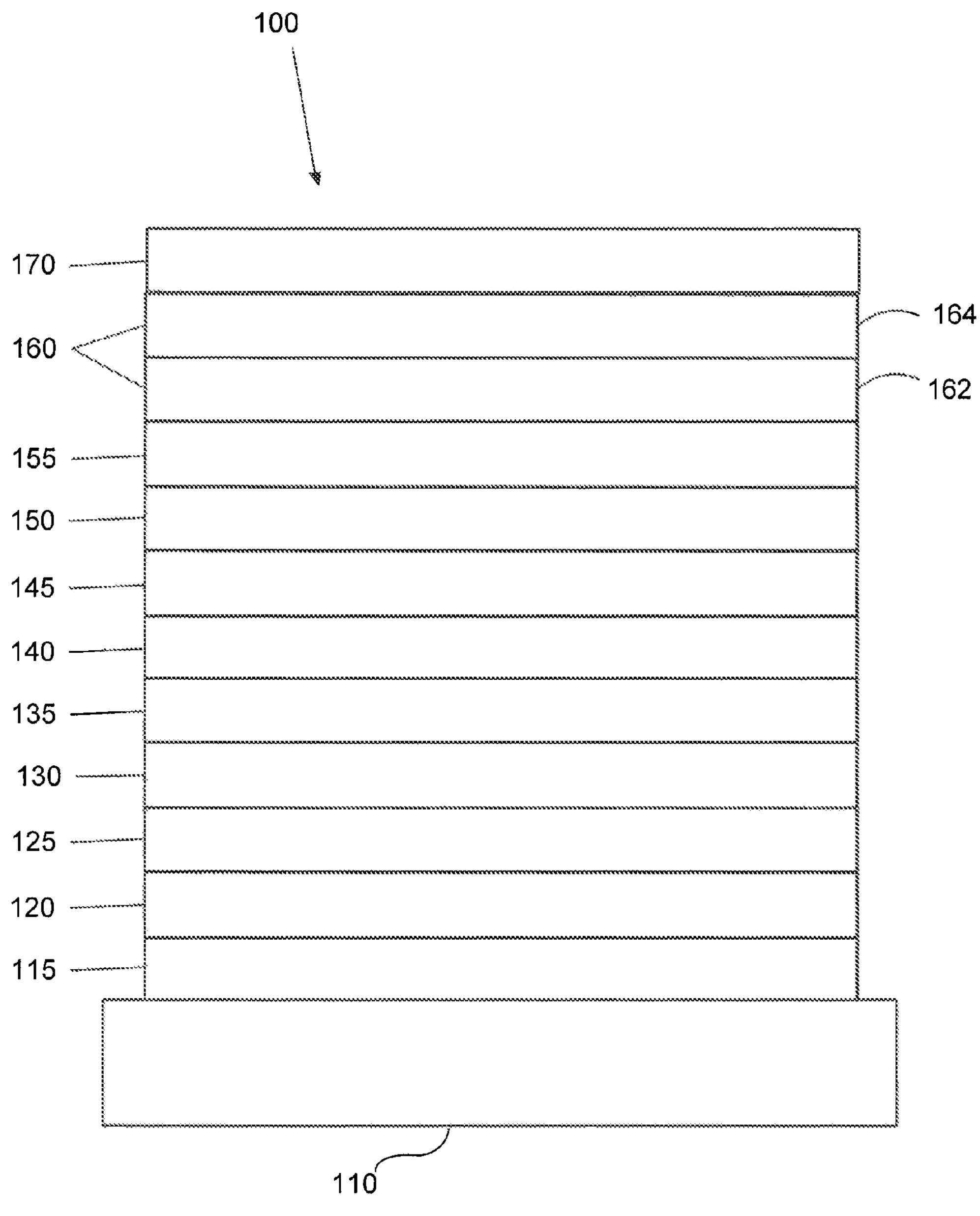
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
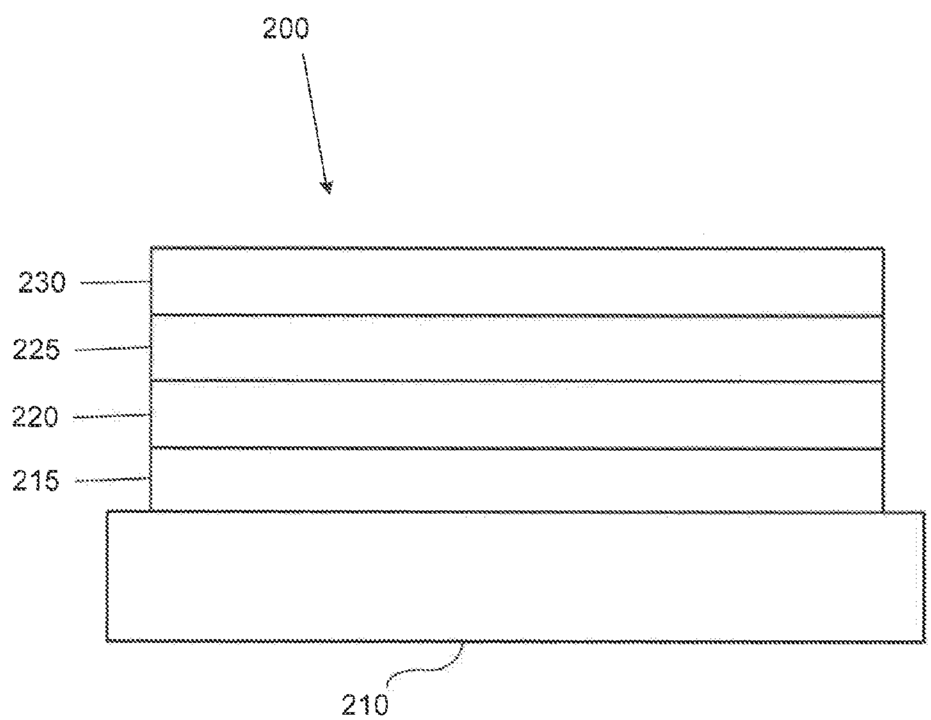
FIG. 2 shows an inverted organic light emitting device that does not have a separate electron transport layer.
Figure 3:
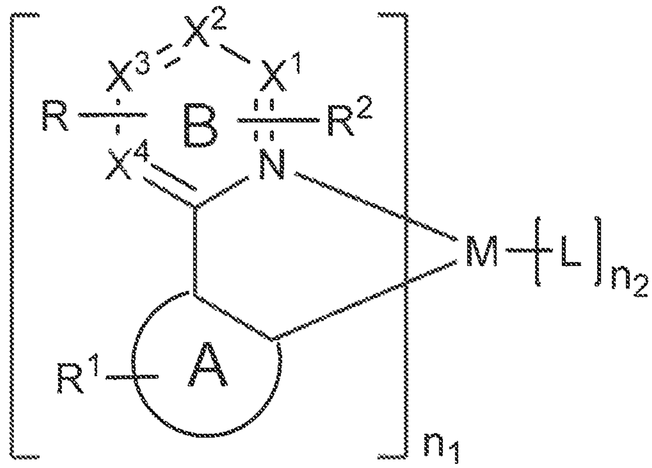
FIG. 3 shows a compound of Formula I-A.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In some embodiments, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degrees C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo" or "halogen" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain Alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkyl groups are those containing two to fifteen carbon atoms. Additionally, the alkynyl group may be optionally substituted.

The terms "aralkyl" or "arylalkyl" as used herein contemplates an alkyl group that has as a substituent an aromatic group. Additionally, the aralkyl group may be optionally substituted.

The term "heterocyclic group" as used herein contemplates non-aromatic cyclic radicals. Preferred heterocyclic groups are those containing 3 or 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in Which two carbons are common by two adjoining rings (the rings are "fused") wherein at least one of the rings is aromatic, e.g., the other rings can be cycloalkyls, cycloalkenyls, aryl, heterocycles, and/or heteroaryls. Additionally, the aryl group may be optionally substituted.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

As used herein, the term "substituted" indicates that a substituent other than hydrogen is bonded to the relevant carbon or nitrogen atom. Thus, where $R^1$ is mono-substituted, then one $R^1$ must be other than hydrogen. Similarly, where $R^1$ is di-substituted, then two of $R^1$ must be other than hydrogen. Similarly, where $R^1$ "represents no substitution," $R^1$ is hydrogen for all available positions.

The "aza" designation in the fragments described herein, i.e., aza-dibenzofuran, aza-dibenzonethiophene, etc., means that one or more of the C—H groups in the respective fragment can be replaced by a nitrogen atom, for example, and without any limitation, azatriphenylene encompasses both dibenzo[f,h] quinoxaline and dibenzo[f,h] quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g., naphthyl, dibenzofuryl) or as if it were the whole molecule (e.g., naphthalene, dibenzofuran). As used herein, these different ways of designating a substituent or attached fragment are considered to be equivalent.

A new class of compounds are provided herein, the compounds comprising a ligand having a novel structure. These compounds may be used in phosphorescent organic light emitting devices. In some embodiments, these compounds are used as an emitting dopant in the emissive layer. The ligands provided herein can be used to tune the properties of the compound to provide more desirable properties. The incorporation of the ligands provided herein provides red phosphorescent materials with good external quantum efficiency, good color, and long lifetime.

In some embodiments, a compound comprising ligand $L_A$ of formula I:

(I)

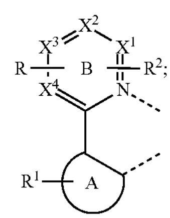

is provided. In the compound of formula I, ring A is a 5-membered or 6-membered carbocyclic or heterocyclic ring; R is fused to ring B and has formula II:

(II)

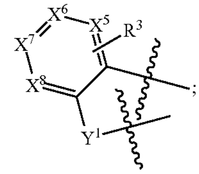

the wave lines indicate bonds to ring B; $R^1$ and $R^3$ each independently represent mono, di, tri, or tetra substitution, or no substitution; $R^2$ represents mono or di substitution, or no substitution; $X^1$, $X^2$, $X^3$, $X^4$, $X^5$, $X^6$, $X^7$, and $X^8$ are each independently carbon or nitrogen; at least one of $X^1$, $X^2$, $X^3$, $X^4$, $X^5$, $X^6$, $X^7$, and $X^8$ is nitrogen; $Y^1$ is selected from the group consisting of BR', NR', PR', O, S, Se, C═O, S═O, $SO_2$, CR'R", SiR'R", and GeR'R"; $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, or wherein any two adjacent substituents are optionally joined to form a ring, which can be further substituted; $L_A$ is coordinated to a metal M; $L_A$ is optionally linked with other ligands to comprise a tridentate, tetradentate, pentadentate, or hexadentate ligand; and M is optionally coordinated to other ligands.

In some embodiments, M is selected from the group consisting of Ir, Rh, Re, Ru, Os, Pt, Au, and Cu.

In some embodiments, M is Ir.

In some embodiments, $Y^1$ is selected from the group consisting of NR', O, S, and

CR'R",

In some embodiments, $Y^1$ is O.

In some embodiments, one of $X^1$, $X^2$, $X^3$, $X^4$, $X^5$, $X^6$, $X^7$, and $X^8$ is nitrogen.

In some embodiments, two of $X^1$, $X^2$, $X^3$, $X^4$, $X^5$, $X^6$, $X^7$, and $X^8$ are nitrogen.

In some embodiments, one of $X^1$, $X^2$, $X^3$, $X^4$ is nitrogen; and one of $X^5$, $X^6$, $X^7$, and $X^8$ is nitrogen.

In some embodiments, one of $X^1$, $X^2$, $X^3$, and $X^4$ is nitrogen and $X^5$, $X^6$, $X^7$, and $X^8$ are carbon.

In some embodiments, $X^2$ is nitrogen; $X^1$, $X^3$, $X^4$, $X^5$, $X^6$, $X^7$, and $X^8$ are carbon.

In some embodiments, A is phenyl.

In some embodiments, $L_A$ is selected from the group consisting of:

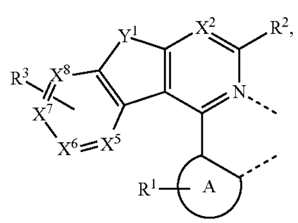

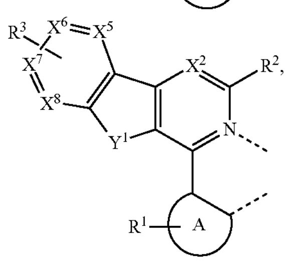

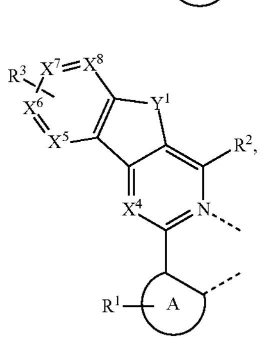

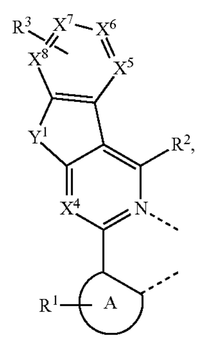

-continued

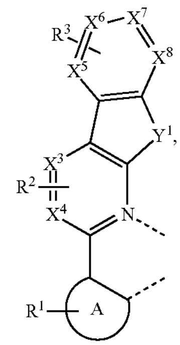

and

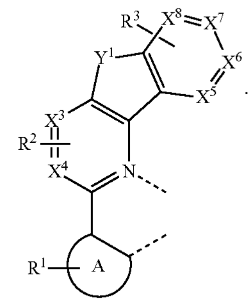

In some embodiments, the compound has formula I-A:

(I-A)

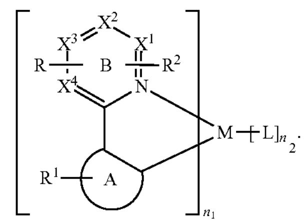

In the compound of formula I-A, L is a ligand, wherein L is not $L_A$; L can be the same or different when $n_2$ is 2 or greater; ring A is a 5-membered or 6-membered carbocyclic or heterocyclic ring; R is fused to ring B and has formula II:

(II)

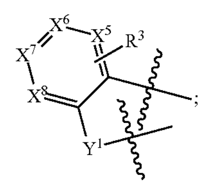

wherein the wave lines indicate bonds to ring B; $R^1$ and $R^3$ each independently represent mono, di, tri, or tetra substitution, or no substitution; $R^2$ represents mono or di substitution, or no substitution; $X^1$, $X^2$, $X^3$, $X^4$, $X^5$, $X^6$, $X^7$, and $X^8$ are each independently carbon or nitrogen; at least one of $X^1$, $X^2$, $X^3$, $X^4$, $X^5$, $X^6$, $X^7$, and $X^8$ is nitrogen; $Y^1$ is selected from the group consisting of BR', NR, PR', O, S, Se, C═O, S═O, $SO_2$, CR'R", SiR'R", and GeR'R"; $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfanyl, sulfonyl, phosphino, and combinations thereof, or wherein any two adjacent substituents are optionally joined to form a ring, which can be further substituted; M is a metal; $n_1$ is an integer from 1 to 6; $n_2$ is an integer from 0 to 3; and $n_1+n_2$ is an integer from 1 to 6.

In some embodiments, L is $L_B$.

In some embodiments, the compound has formula III:

$$(L_A)_nM(L_B)_{3-n} \quad \text{(III);}$$

wherein $L_B$ is a bidentate ligand; and n is 1, 2, or 3.

In some embodiments, the compound has formula III-A:

$$(L_A)_n Ir(L_B)_{3-n} \quad \text{(III-A);}$$

wherein $L_B$ is a bidentate ligand; and n is 1, 2, or 3.

In some embodiments, $L_A$ is selected from the group consisting of $L_{A1}$ to $L_{A960}$ as shown below:

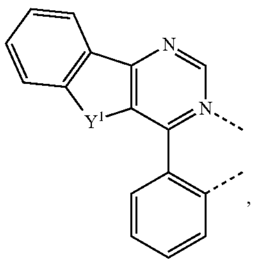

$Y_1$ = O, $L_{A1}$
$Y_1$ = S, $L_{A2}$
$Y_1$ = $NCH_3$, $L_{A3}$
$Y_1$ = $C(CH_3)_2$, $L_{A4}$

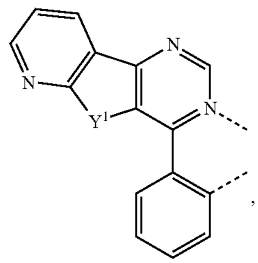

$Y_1$ = O, $L_{A5}$
$Y_1$ = S, $L_{A6}$
$Y_1$ = $NCH_3$, $L_{A7}$
$Y_1$ = $C(CH_3)_2$, $L_{A8}$

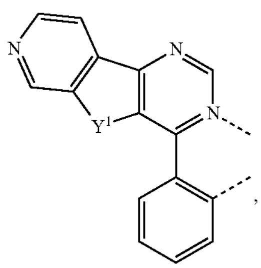

$Y_1$ = O, $L_{A9}$
$Y_1$ = S, $L_{A10}$
$Y_1$ = $NCH_3$, $L_{A11}$
$Y_1$ = $C(CH_3)_2$, $L_{A12}$

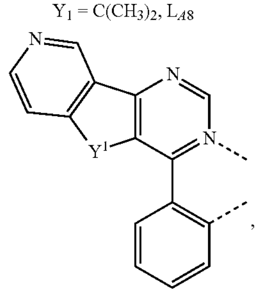

$Y_1$ = O, $L_{A13}$
$Y_1$ = S, $L_{A14}$
$Y_1$ = $NCH_3$, $L_{A15}$
$Y_1$ = $C(CH_3)_2$, $L_{A16}$

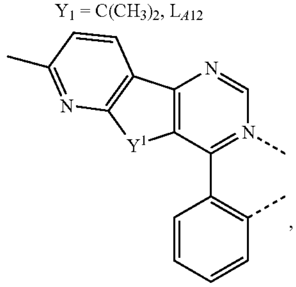

$Y_1$ = O, $L_{A17}$
$Y_1$ = S, $L_{A18}$
$Y_1$ = $NCH_3$, $L_{A19}$
$Y_1$ = $C(CH_3)_2$, $L_{A20}$

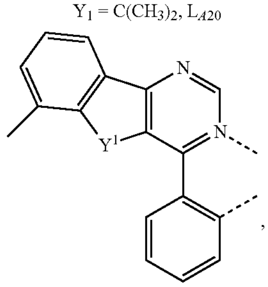

$Y_1$ = O, $L_{A21}$
$Y_1$ = S, $L_{A22}$
$Y_1$ = $NCH_3$, $L_{A23}$
$Y_1$ = $C(CH_3)_2$, $L_{A24}$

-continued

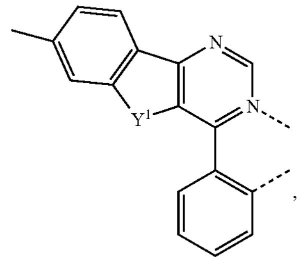

$Y_1$ = O, $L_{A25}$
$Y_1$ = S, $L_{A26}$
$Y_1$ = $NCH_3$, $L_{A27}$
$Y_1$ = $C(CH_3)_2$, $L_{A28}$

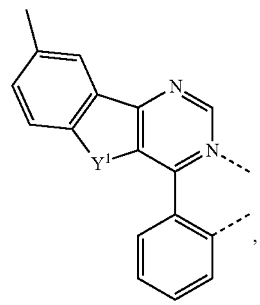

$Y_1$ = O, $L_{A29}$
$Y_1$ = S, $L_{A30}$
$Y_1$ = $NCH_3$, $L_{A31}$
$Y_1$ = $C(CH_3)_2$, $L_{A32}$

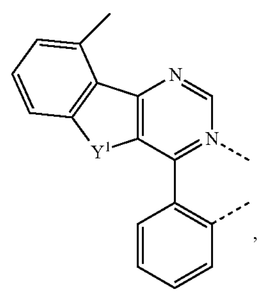

$Y_1$ = O, $L_{A33}$
$Y_1$ = S, $L_{A34}$
$Y_1$ = $NCH_3$, $L_{A35}$
$Y_1$ = $C(CH_3)_2$, $L_{A36}$

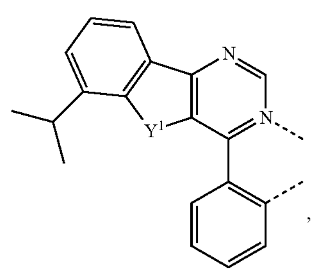

$Y_1$ = O, $L_{A37}$
$Y_1$ = S, $L_{A38}$
$Y_1$ = $NCH_3$, $L_{A39}$
$Y_1$ = $C(CH_3)_2$, $L_{A40}$

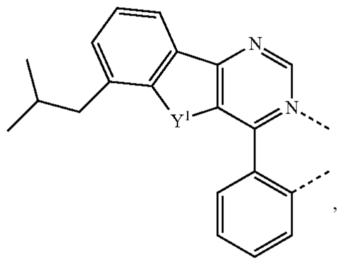

$Y_1$ = O, $L_{A41}$
$Y_1$ = S, $L_{A42}$
$Y_1$ = $NCH_3$, $L_{A43}$
$Y_1$ = $C(CH_3)_2$, $L_{A44}$

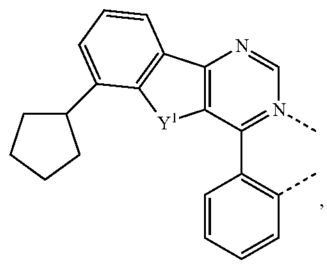

$Y_1$ = O, $L_{A45}$
$Y_1$ = S, $L_{A46}$
$Y_1$ = $NCH_3$, $L_{A47}$
$Y_1$ = $C(CH_3)_2$, $L_{A48}$

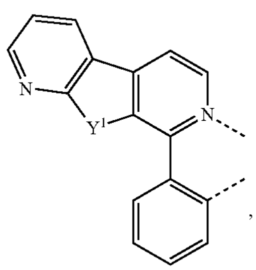

$Y_1$ = O, $L_{A49}$
$Y_1$ = S, $L_{A50}$
$Y_1$ = $NCH_3$, $L_{A51}$
$Y_1$ = $C(CH_3)_2$, $L_{A52}$

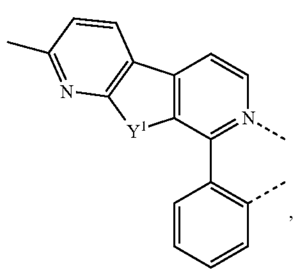

$Y_1$ = O, $L_{A53}$
$Y_1$ = S, $L_{A54}$
$Y_1$ = $NCH_3$, $L_{A55}$
$Y_1$ = $C(CH_3)_2$, $L_{A56}$

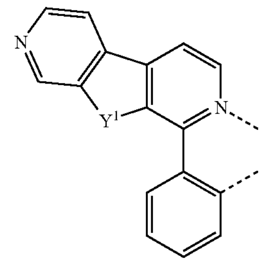

$Y_1$ = O, $L_{A57}$
$Y_1$ = S, $L_{A58}$
$Y_1$ = $NCH_3$, $L_{A59}$
$Y_1$ = $C(CH_3)_2$, $L_{A60}$

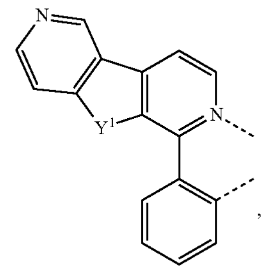

$Y_1$ = O, $L_{A61}$
$Y_1$ = S, $L_{A62}$
$Y_1$ = $NCH_3$, $L_{A63}$
$Y_1$ = $C(CH_3)_2$, $L_{A64}$

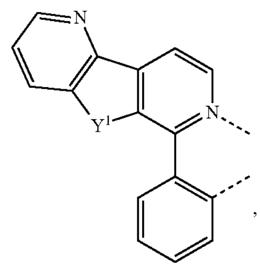

$Y_1$ = O, $L_{A65}$
$Y_1$ = S, $L_{A66}$
$Y_1$ = $NCH_3$, $L_{A67}$
$Y_1$ = $C(CH_3)_2$, $L_{A68}$

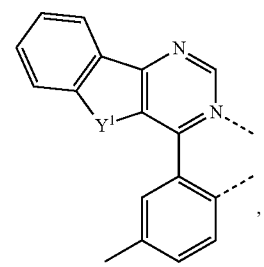

$Y_1$ = O, $L_{A69}$
$Y_1$ = S, $L_{A70}$
$Y_1$ = $NCH_3$, $L_{A71}$
$Y_1$ = $C(CH_3)_2$, $L_{A72}$

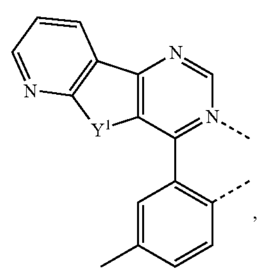

$Y_1$ = O, $L_{A73}$
$Y_1$ = S, $L_{A74}$
$Y_1$ = $NCH_3$, $L_{A75}$
$Y_1$ = $C(CH_3)_2$, $L_{A76}$

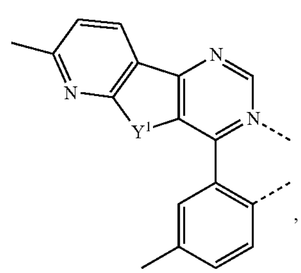

$Y_1$ = O, $L_{A77}$
$Y_1$ = S, $L_{A78}$
$Y_1$ = $NCH_3$, $L_{A79}$
$Y_1$ = $C(CH_3)_2$, $L_{A80}$

-continued

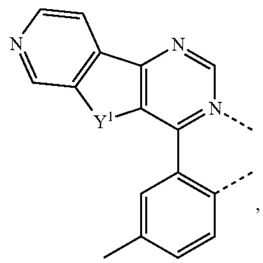

$Y_1$ = O, $L_{A81}$
$Y_1$ = S, $L_{A82}$
$Y_1$ = $NCH_3$, $L_{A83}$
$Y_1$ = $C(CH_3)_2$, $L_{A84}$

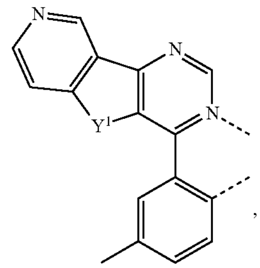

$Y_1$ = O, $L_{A85}$
$Y_1$ = S, $L_{A86}$
$Y_1$ = $NCH_3$, $L_{A87}$
$Y_1$ = $C(CH_3)_2$, $L_{A88}$

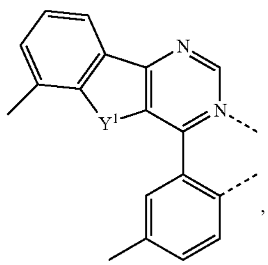

$Y_1$ = O, $L_{A89}$
$Y_1$ = S, $L_{A90}$
$Y_1$ = $NCH_3$, $L_{A91}$
$Y_1$ = $C(CH_3)_2$, $L_{A92}$

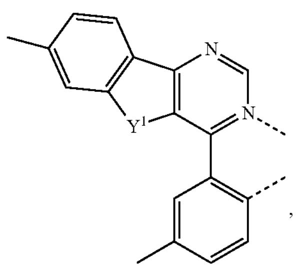

$Y_1$ = O, $L_{A93}$
$Y_1$ = S, $L_{A94}$
$Y_1$ = $NCH_3$, $L_{A95}$
$Y_1$ = $C(CH_3)_2$, $L_{A96}$

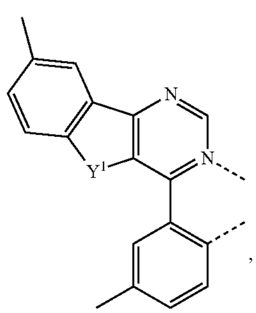

$Y_1$ = O, $L_{A97}$
$Y_1$ = S, $L_{A98}$
$Y_1$ = $NCH_3$, $L_{A99}$
$Y_1$ = $C(CH_3)_2$, $L_{A100}$

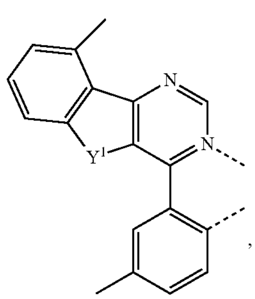

$Y_1$ = O, $L_{A101}$
$Y_1$ = S, $L_{A102}$
$Y_1$ = $NCH_3$, $L_{A103}$
$Y_1$ = $C(CH_3)_2$, $L_{A104}$

-continued

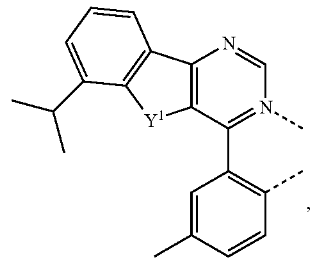

$Y_1$ = O, $L_{A105}$
$Y_1$ = S, $L_{A106}$
$Y_1$ = $NCH_3$, $L_{A107}$
$Y_1$ = $C(CH_3)_2$, $L_{A108}$

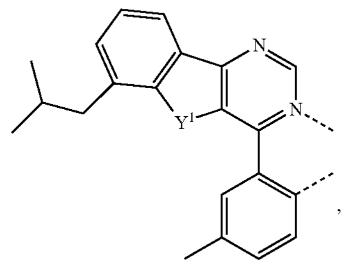

$Y_1$ = O, $L_{A109}$
$Y_1$ = S, $L_{A110}$
$Y_1$ = $NCH_3$, $L_{A111}$
$Y_1$ = $C(CH_3)_2$, $L_{A112}$

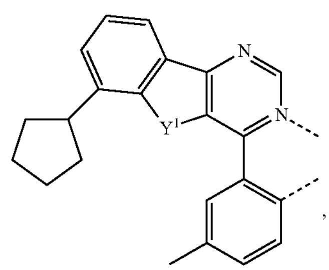

$Y_1$ = O, $L_{A113}$
$Y_1$ = S, $L_{A114}$
$Y_1$ = $NCH_3$, $L_{A115}$
$Y_1$ = $C(CH_3)_2$, $L_{A116}$

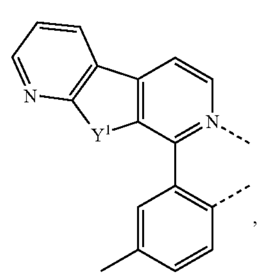

$Y_1$ = O, $L_{A117}$
$Y_1$ = S, $L_{A118}$
$Y_1$ = $NCH_3$, $L_{A119}$
$Y_1$ = $C(CH_3)_2$, $L_{A120}$

-continued

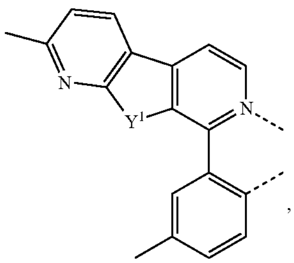

$Y_1 = O, L_{A121}$
$Y_1 = S, L_{A122}$
$Y_1 = NCH_3, L_{A123}$
$Y_1 = C(CH_3)_2, L_{A124}$

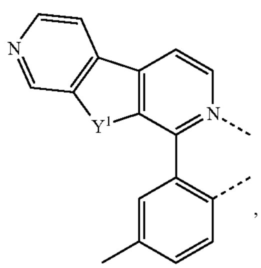

$Y_1 = O, L_{A125}$
$Y_1 = S, L_{A126}$
$Y_1 = NCH_3, L_{A127}$
$Y_1 = C(CH_3)_2, L_{A128}$

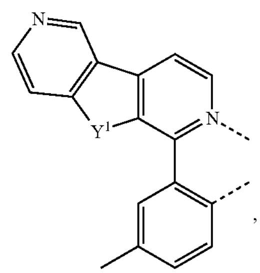

$Y_1 = O, L_{A129}$
$Y_1 = S, L_{A130}$
$Y_1 = NCH_3, L_{A131}$
$Y_1 = C(CH_3)_2, L_{A132}$

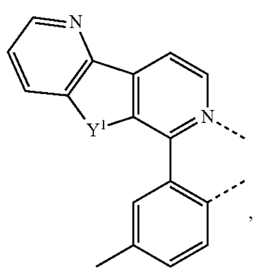

$Y_1 = O, L_{A133}$
$Y_1 = S, L_{A134}$
$Y_1 = NCH_3, L_{A135}$
$Y_1 = C(CH_3)_2, L_{A136}$

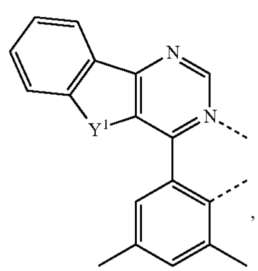

$Y_1 = O, L_{A137}$
$Y_1 = S, L_{A138}$
$Y_1 = NCH_3, L_{A139}$
$Y_1 = C(CH_3)_2, L_{A140}$

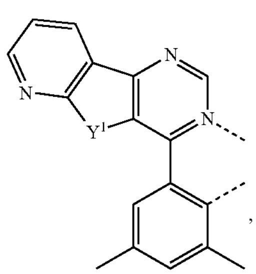

$Y_1 = O, L_{A141}$
$Y_1 = S, L_{A142}$
$Y_1 = NCH_3, L_{A143}$
$Y_1 = C(CH_3)_2, L_{A144}$

-continued

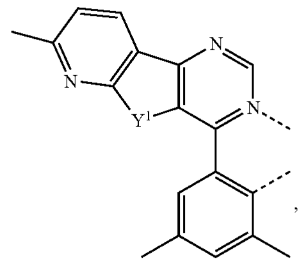

$Y_1 = O, L_{A145}$
$Y_1 = S, L_{A146}$
$Y_1 = NCH_3, L_{A147}$
$Y_1 = C(CH_3)_2, L_{A148}$

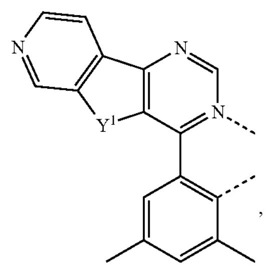

$Y_1 = O, L_{A149}$
$Y_1 = S, L_{A150}$
$Y_1 = NCH_3, L_{A151}$
$Y_1 = C(CH_3)_2, L_{A152}$

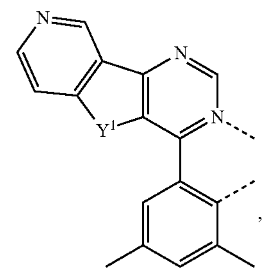

$Y_1 = O, L_{A153}$
$Y_1 = S, L_{A154}$
$Y_1 = NCH_3, L_{A155}$
$Y_1 = C(CH_3)_2, L_{A156}$

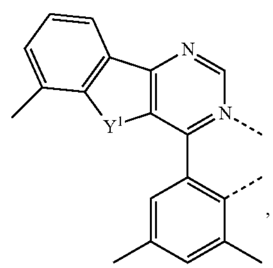

$Y_1 = O, L_{A157}$
$Y_1 = S, L_{A158}$
$Y_1 = NCH_3, L_{A159}$
$Y_1 = C(CH_3)_2, L_{A160}$

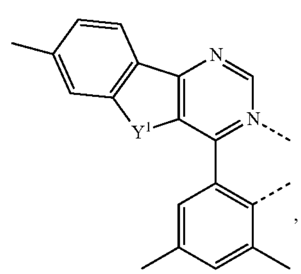

$Y_1 = O, L_{A161}$
$Y_1 = S, L_{A162}$
$Y_1 = NCH_3, L_{A163}$
$Y_1 = C(CH_3)_2, L_{A164}$

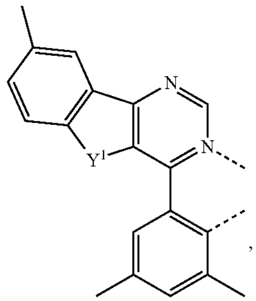

$Y_1 = O, L_{A165}$
$Y_1 = S, L_{A166}$
$Y_1 = NCH_3, L_{A167}$
$Y_1 = C(CH_3)_2, L_{A168}$

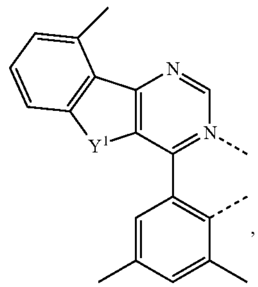

$Y_1 = O, L_{A169}$
$Y_1 = S, L_{A170}$
$Y_1 = NCH_3, L_{A171}$
$Y_1 = C(CH_3)_2, L_{A172}$

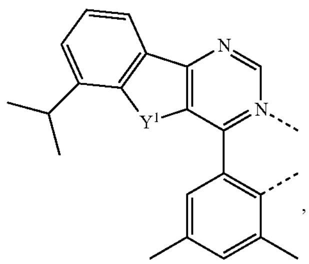

$Y_1 = O, L_{A173}$
$Y_1 = S, L_{A174}$
$Y_1 = NCH_3, L_{A175}$
$Y_1 = C(CH_3)_2, L_{A176}$

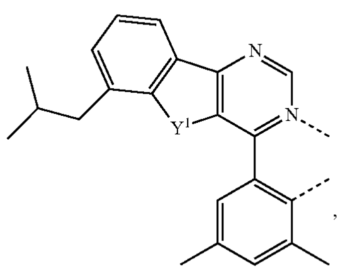

$Y_1 = O, L_{A177}$
$Y_1 = S, L_{A178}$
$Y_1 = NCH_3, L_{A179}$
$Y_1 = C(CH_3)_2, L_{A180}$

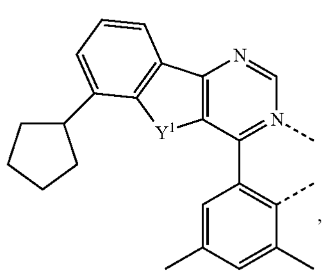

$Y_1 = O, L_{A181}$
$Y_1 = S, L_{A182}$
$Y_1 = NCH_3, L_{A183}$
$Y_1 = C(CH_3)_2, L_{A184}$

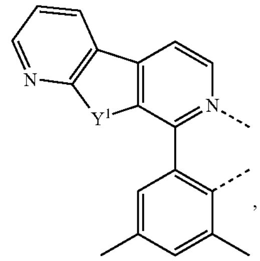

$Y_1 = O, L_{A185}$
$Y_1 = S, L_{A186}$
$Y_1 = NCH_3, L_{A187}$
$Y_1 = C(CH_3)_2, L_{A188}$

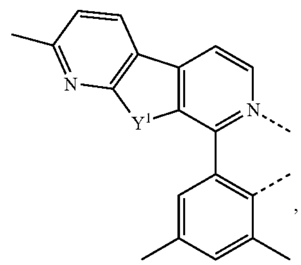

$Y_1 = O, L_{A189}$
$Y_1 = S, L_{A190}$
$Y_1 = NCH_3, L_{A191}$
$Y_1 = C(CH_3)_2, L_{A192}$

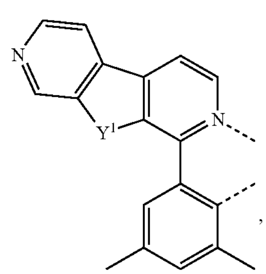

$Y_1 = O, L_{A193}$
$Y_1 = S, L_{A194}$
$Y_1 = NCH_3, L_{A195}$
$Y_1 = C(CH_3)_2, L_{A196}$

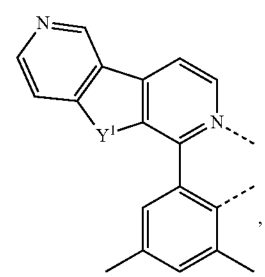

$Y_1 = O, L_{A197}$
$Y_1 = S, L_{A198}$
$Y_1 = NCH_3, L_{A199}$
$Y_1 = C(CH_3)_2, L_{A200}$

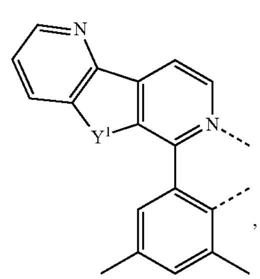

$Y_1 = O, L_{A201}$
$Y_1 = S, L_{A202}$
$Y_1 = NCH_3, L_{A203}$
$Y_1 = C(CH_3)_2, L_{A204}$

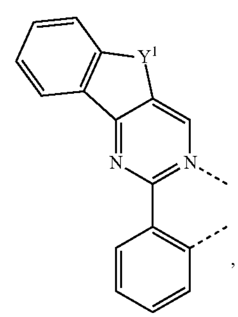

$Y_1 = O, L_{A205}$
$Y_1 = S, L_{A206}$
$Y_1 = NCH_3, L_{A207}$
$Y_1 = C(CH_3)_2, L_{A208}$

-continued

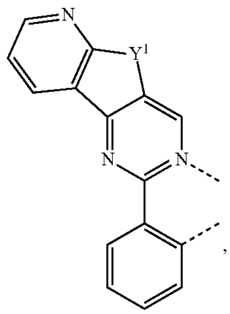

$Y_1$ = O, $L_{A209}$
$Y_1$ = S, $L_{A210}$
$Y_1$ = $NCH_3$, $L_{A211}$
$Y_1$ = $C(CH_3)_2$, $L_{A212}$

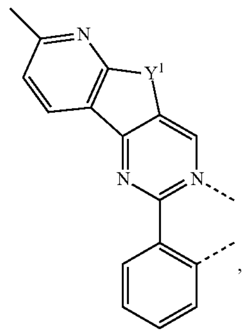

$Y_1$ = O, $L_{A213}$
$Y_1$ = S, $L_{A214}$
$Y_1$ = $NCH_3$, $L_{A215}$
$Y_1$ = $C(CH_3)_2$, $L_{A216}$

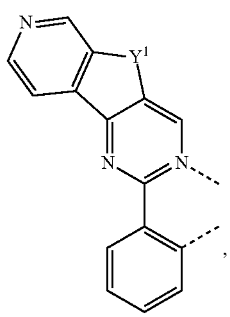

$Y_1$ = O, $L_{A217}$
$Y_1$ = S, $L_{A218}$
$Y_1$ = $NCH_3$, $L_{A219}$
$Y_1$ = $C(CH_3)_2$, $L_{A220}$

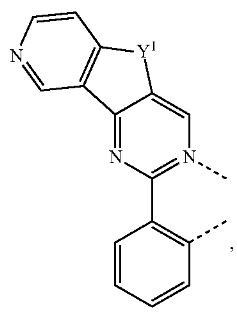

$Y_1$ = O, $L_{A221}$
$Y_1$ = S, $L_{A222}$
$Y_1$ = $NCH_3$, $L_{A223}$
$Y_1$ = $C(CH_3)_2$, $L_{A224}$

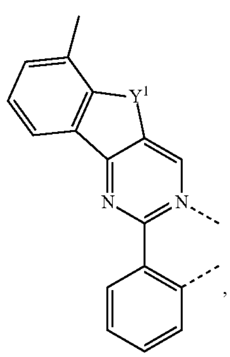

$Y_1$ = O, $L_{A225}$
$Y_1$ = S, $L_{A226}$
$Y_1$ = $NCH_3$, $L_{A227}$
$Y_1$ = $C(CH_3)_2$, $L_{A228}$

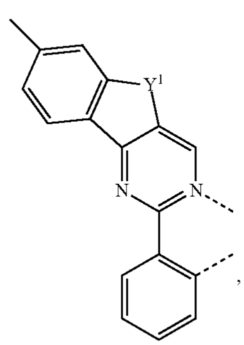

$Y_1$ = O, $L_{A229}$
$Y_1$ = S, $L_{A230}$
$Y_1$ = $NCH_3$, $L_{A231}$
$Y_1$ = $C(CH_3)_2$, $L_{A232}$

-continued

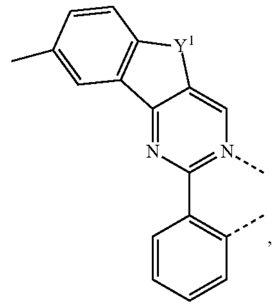

$Y_1$ = O, $L_{A233}$
$Y_1$ = S, $L_{A234}$
$Y_1$ = $NCH_3$, $L_{A235}$
$Y_1$ = $C(CH_3)_2$, $L_{A236}$

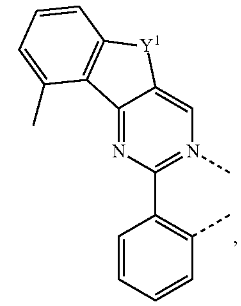

$Y_1$ = O, $L_{A237}$
$Y_1$ = S, $L_{A238}$
$Y_1$ = $NCH_3$, $L_{A239}$
$Y_1$ = $C(CH_3)_2$, $L_{A240}$

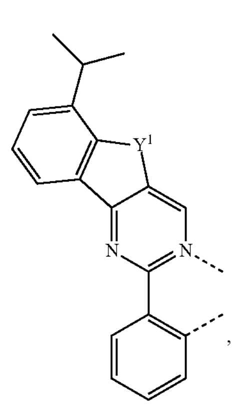

$Y_1$ = O, $L_{A241}$
$Y_1$ = S, $L_{A242}$
$Y_1$ = $NCH_3$, $L_{A243}$
$Y_1$ = $C(CH_3)_2$, $L_{A244}$

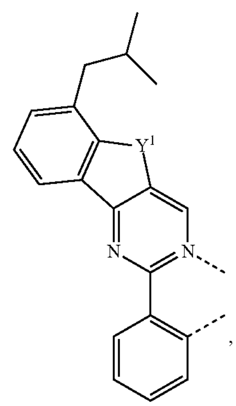

$Y_1$ = O, $L_{A245}$
$Y_1$ = S, $L_{A246}$
$Y_1$ = $NCH_3$, $L_{A247}$
$Y_1$ = $C(CH_3)_2$, $L_{A248}$

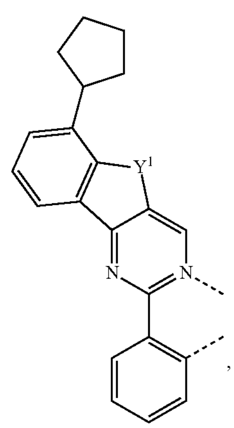

$Y_1$ = O, $L_{A249}$
$Y_1$ = S, $L_{A250}$
$Y_1$ = $NCH_3$, $L_{A251}$
$Y_1$ = $C(CH_3)_2$, $L_{A252}$

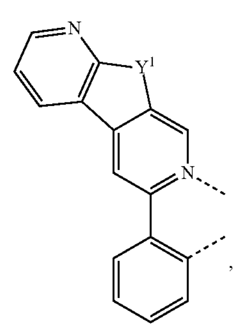

$Y_1$ = O, $L_{A253}$
$Y_1$ = S, $L_{A254}$
$Y_1$ = $NCH_3$, $L_{A255}$
$Y_1$ = $C(CH_3)_2$, $L_{A256}$

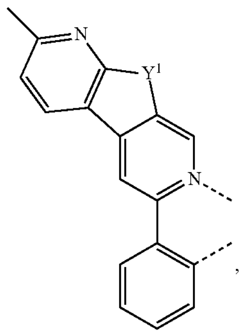

$Y_1$ = O, $L_{A257}$
$Y_1$ = S, $L_{A258}$
$Y_1$ = $NCH_3$, $L_{A259}$
$Y_1$ = $C(CH_3)_2$, $L_{A260}$

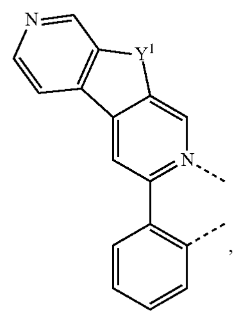

$Y_1$ = O, $L_{A261}$
$Y_1$ = S, $L_{A262}$
$Y_1$ = $NCH_3$, $L_{A263}$
$Y_1$ = $C(CH_3)_2$, $L_{A264}$

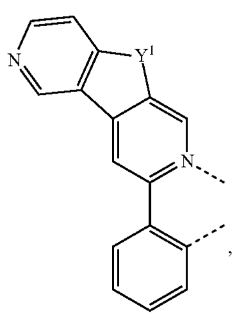

$Y_1$ = O, $L_{A265}$
$Y_1$ = S, $L_{A266}$
$Y_1$ = $NCH_3$, $L_{A267}$
$Y_1$ = $C(CH_3)_2$, $L_{A268}$

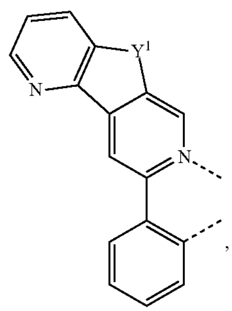

$Y_1$ = O, $L_{A269}$
$Y_1$ = S, $L_{A270}$
$Y_1$ = $NCH_3$, $L_{A271}$
$Y_1$ = $C(CH_3)_2$, $L_{A272}$

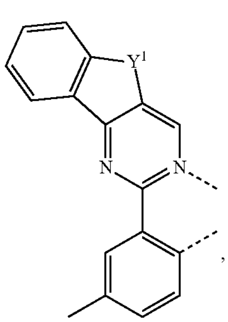

$Y_1$ = O, $L_{A273}$
$Y_1$ = S, $L_{A274}$
$Y_1$ = $NCH_3$, $L_{A275}$
$Y_1$ = $C(CH_3)_2$, $L_{A276}$

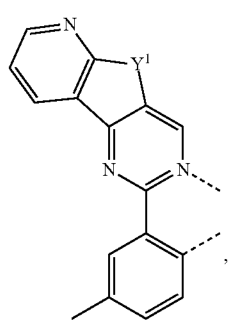

$Y_1$ = O, $L_{A277}$
$Y_1$ = S, $L_{A278}$
$Y_1$ = $NCH_3$, $L_{A279}$
$Y_1$ = $C(CH_3)_2$, $L_{A280}$

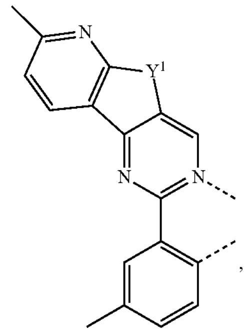

$Y_1$ = O, $L_{A281}$
$Y_1$ = S, $L_{A282}$
$Y_1$ = $NCH_3$, $L_{A283}$
$Y_1$ = $C(CH_3)_2$, $L_{A284}$

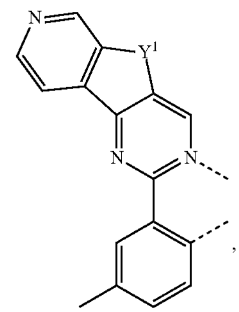

$Y_1$ = O, $L_{A285}$
$Y_1$ = S, $L_{A286}$
$Y_1$ = $NCH_3$, $L_{A287}$
$Y_1$ = $C(CH_3)_2$, $L_{A288}$

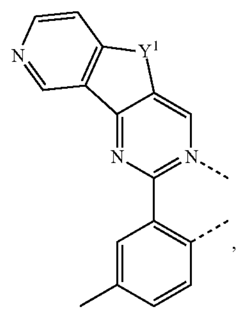

$Y_1$ = O, $L_{A289}$
$Y_1$ = S, $L_{A290}$
$Y_1$ = $NCH_3$, $L_{A291}$
$Y_1$ = $C(CH_3)_2$, $L_{A292}$

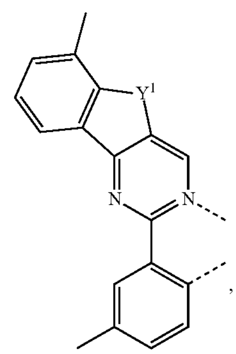

$Y_1$ = O, $L_{A293}$
$Y_1$ = S, $L_{A294}$
$Y_1$ = $NCH_3$, $L_{A295}$
$Y_1$ = $C(CH_3)_2$, $L_{A296}$

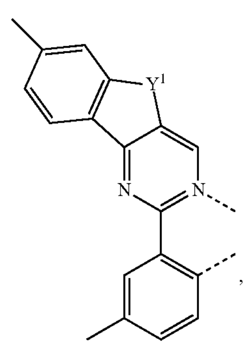

$Y_1$ = O, $L_{A297}$
$Y_1$ = S, $L_{A298}$
$Y_1$ = $NCH_3$, $L_{A299}$
$Y_1$ = $C(CH_3)_2$, $L_{A300}$

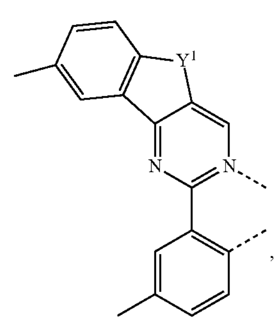

$Y_1$ = O, $L_{A301}$
$Y_1$ = S, $L_{A302}$
$Y_1$ = $NCH_3$, $L_{A303}$
$Y_1$ = $C(CH_3)_2$, $L_{A304}$

-continued

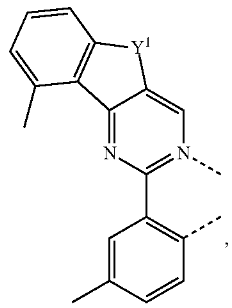

$Y_1$ = O, $L_{A305}$
$Y_1$ = S, $L_{A306}$
$Y_1$ = $NCH_3$, $L_{A307}$
$Y_1$ = $C(CH_3)_2$, $L_{A308}$

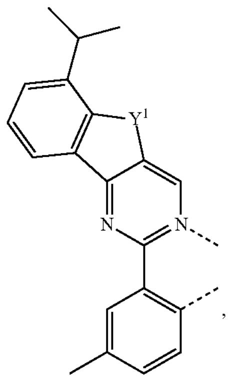

$Y_1$ = O, $L_{A309}$
$Y_1$ = S, $L_{A310}$
$Y_1$ = $NCH_3$, $L_{A311}$
$Y_1$ = $C(CH_3)_2$, $L_{A312}$

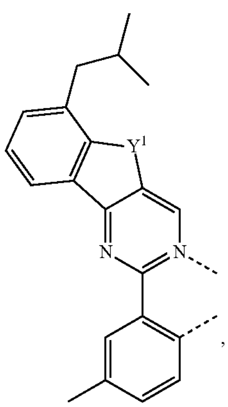

$Y_1$ = O, $L_{A313}$
$Y_1$ = S, $L_{A314}$
$Y_1$ = $NCH_3$, $L_{A315}$
$Y_1$ = $C(CH_3)_2$, $L_{A316}$

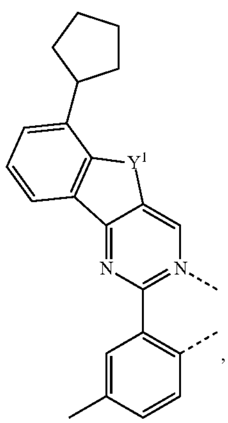

$Y_1$ = O, $L_{A317}$
$Y_1$ = S, $L_{A318}$
$Y_1$ = $NCH_3$, $L_{A319}$
$Y_1$ = $C(CH_3)_2$, $L_{A320}$

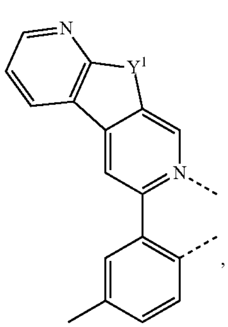

$Y_1$ = O, $L_{A321}$
$Y_1$ = S, $L_{A322}$
$Y_1$ = $NCH_3$, $L_{A323}$
$Y_1$ = $C(CH_3)_2$, $L_{A324}$

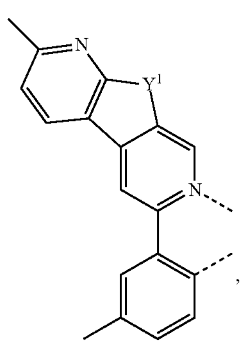

$Y_1$ = O, $L_{A325}$
$Y_1$ = S, $L_{A326}$
$Y_1$ = $NCH_3$, $L_{A327}$
$Y_1$ = $C(CH_3)_2$, $L_{A328}$

-continued

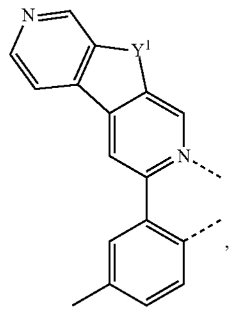

$Y_1$ = O, $L_{A329}$
$Y_1$ = S, $L_{A330}$
$Y_1$ = $NCH_3$, $L_{A331}$
$Y_1$ = $C(CH_3)_2$, $L_{A332}$

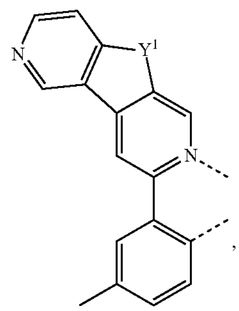

$Y_1$ = O, $L_{A333}$
$Y_1$ = S, $L_{A334}$
$Y_1$ = $NCH_3$, $L_{A335}$
$Y_1$ = $C(CH_3)_2$, $L_{A336}$

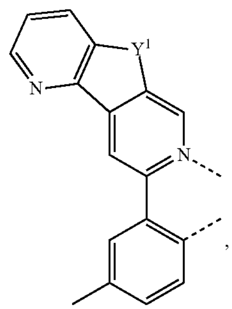

$Y_1$ = O, $L_{A337}$
$Y_1$ = S, $L_{A338}$
$Y_1$ = $NCH_3$, $L_{A339}$
$Y_1$ = $C(CH_3)_2$, $L_{A340}$

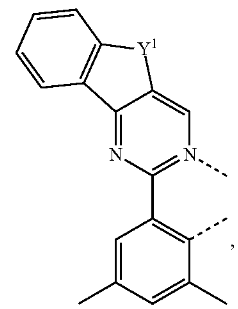

$Y_1$ = O, $L_{A341}$
$Y_1$ = S, $L_{A342}$
$Y_1$ = $NCH_3$, $L_{A343}$
$Y_1$ = $C(CH_3)_2$, $L_{A344}$

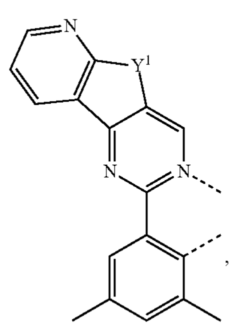

$Y_1$ = O, $L_{A345}$
$Y_1$ = S, $L_{A346}$
$Y_1$ = $NCH_3$, $L_{A347}$
$Y_1$ = $C(CH_3)_2$, $L_{A348}$

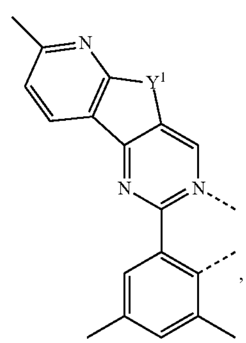

$Y_1$ = O, $L_{A349}$
$Y_1$ = S, $L_{A350}$
$Y_1$ = $NCH_3$, $L_{A351}$
$Y_1$ = $C(CH_3)_2$, $L_{A352}$

-continued

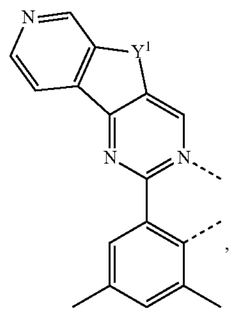

$Y_1$ = O, $L_{A353}$
$Y_1$ = S, $L_{A354}$
$Y_1$ = $NCH_3$, $L_{A355}$
$Y_1$ = $C(CH_3)_2$, $L_{A356}$

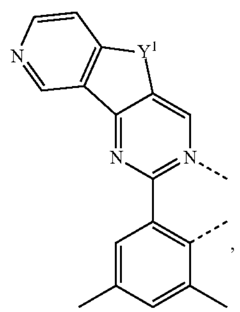

$Y_1$ = O, $L_{A357}$
$Y_1$ = S, $L_{A358}$
$Y_1$ = $NCH_3$, $L_{A359}$
$Y_1$ = $C(CH_3)_2$, $L_{A360}$

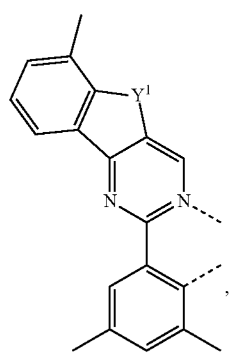

$Y_1$ = O, $L_{A361}$
$Y_1$ = S, $L_{A362}$
$Y_1$ = $NCH_3$, $L_{A363}$
$Y_1$ = $C(CH_3)_2$, $L_{A364}$

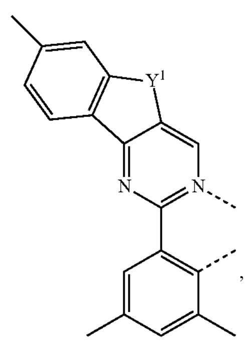

$Y_1$ = O, $L_{A365}$
$Y_1$ = S, $L_{A366}$
$Y_1$ = $NCH_3$, $L_{A367}$
$Y_1$ = $C(CH_3)_2$, $L_{A368}$

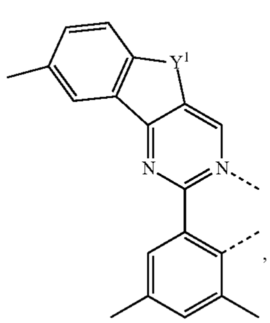

$Y_1$ = O, $L_{A369}$
$Y_1$ = S, $L_{A370}$
$Y_1$ = $NCH_3$, $L_{A371}$
$Y_1$ = $C(CH_3)_2$, $L_{A372}$

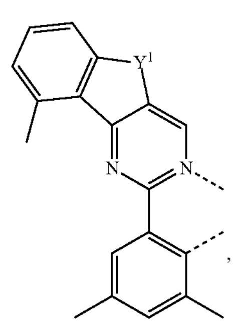

$Y_1$ = O, $L_{A373}$
$Y_1$ = S, $L_{A374}$
$Y_1$ = $NCH_3$, $L_{A375}$
$Y_1$ = $C(CH_3)_2$, $L_{A376}$

-continued

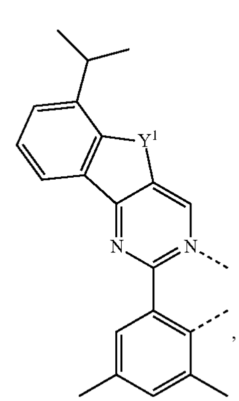

$Y_1$ = O, $L_{A377}$
$Y_1$ = S, $L_{A378}$
$Y_1$ = $NCH_3$, $L_{A379}$
$Y_1$ = $C(CH_3)_2$, $L_{A380}$

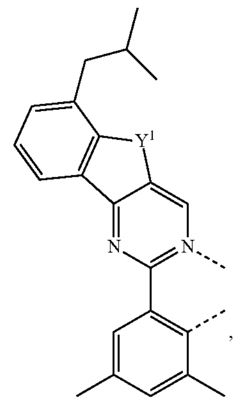

$Y_1$ = O, $L_{A381}$
$Y_1$ = S, $L_{A382}$
$Y_1$ = $NCH_3$, $L_{A383}$
$Y_1$ = $C(CH_3)_2$, $L_{A384}$

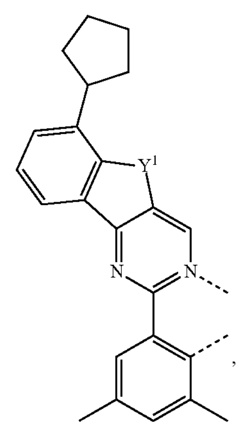

$Y_1$ = O, $L_{A385}$
$Y_1$ = S, $L_{A386}$
$Y_1$ = $NCH_3$, $L_{A387}$
$Y_1$ = $C(CH_3)_2$, $L_{A388}$

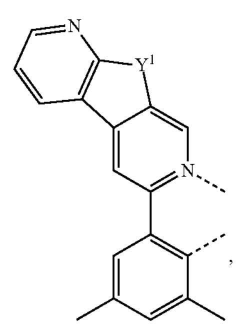

$Y_1$ = O, $L_{A389}$
$Y_1$ = S, $L_{A390}$
$Y_1$ = $NCH_3$, $L_{A391}$
$Y_1$ = $C(CH_3)_2$, $L_{A392}$

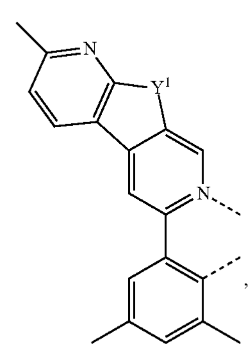

$Y_1$ = O, $L_{A393}$
$Y_1$ = S, $L_{A394}$
$Y_1$ = $NCH_3$, $L_{A395}$
$Y_1$ = $C(CH_3)_2$, $L_{A396}$

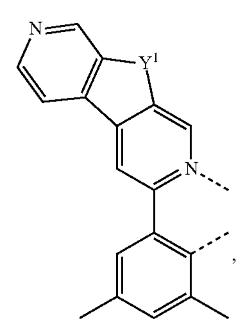

$Y_1$ = O, $L_{A397}$
$Y_1$ = S, $L_{A398}$
$Y_1$ = $NCH_3$, $L_{A399}$
$Y_1$ = $C(CH_3)_2$, $L_{A400}$

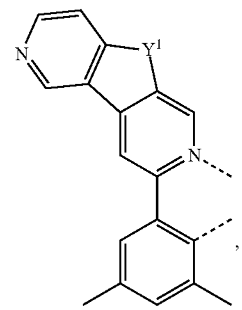

$Y_1$ = O, $L_{A401}$
$Y_1$ = S, $L_{A402}$
$Y_1$ = $NCH_3$, $L_{A403}$
$Y_1$ = $C(CH_3)_2$, $L_{A404}$

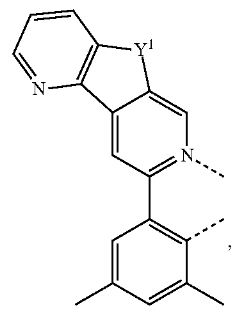

$Y_1$ = O, $L_{A405}$
$Y_1$ = S, $L_{A406}$
$Y_1$ = $NCH_3$, $L_{A407}$
$Y_1$ = $C(CH_3)_2$, $L_{A408}$

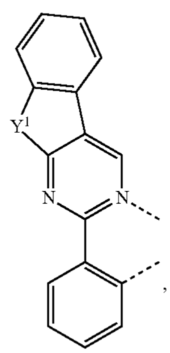

$Y_1$ = O, $L_{A409}$
$Y_1$ = S, $L_{A410}$
$Y_1$ = $NCH_3$, $L_{A411}$
$Y_1$ = $C(CH_3)_2$, $L_{A412}$

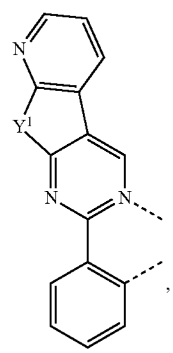

$Y_1$ = O, $L_{A413}$
$Y_1$ = S, $L_{A414}$
$Y_1$ = $NCH_3$, $L_{A415}$
$Y_1$ = $C(CH_3)_2$, $L_{A416}$

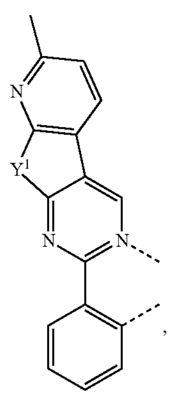

$Y_1$ = O, $L_{A417}$
$Y_1$ = S, $L_{A418}$
$Y_1$ = $NCH_3$, $L_{A419}$
$Y_1$ = $C(CH_3)_2$, $L_{A420}$

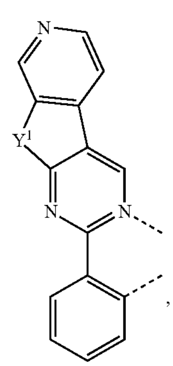

$Y_1$ = O, $L_{A421}$
$Y_1$ = S, $L_{A422}$
$Y_1$ = $NCH_3$, $L_{A423}$
$Y_1$ = $C(CH_3)_2$, $L_{A424}$

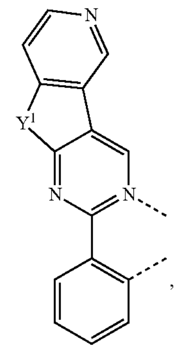

$Y_1$ = O, $L_{A425}$
$Y_1$ = S, $L_{A426}$
$Y_1$ = $NCH_3$, $L_{A427}$
$Y_1$ = $C(CH_3)_2$, $L_{A428}$

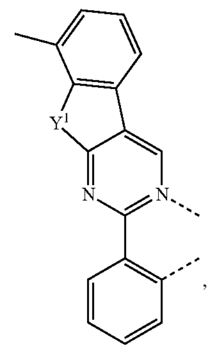

$Y_1$ = O, $L_{A429}$
$Y_1$ = S, $L_{A430}$
$Y_1$ = $NCH_3$, $L_{A431}$
$Y_1$ = $C(CH_3)_2$, $L_{A432}$

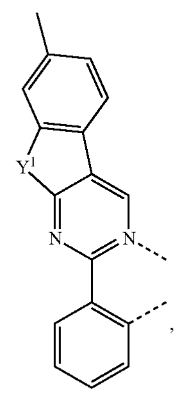

$Y_1$ = O, $L_{A433}$
$Y_1$ = S, $L_{A434}$
$Y_1$ = $NCH_3$, $L_{A435}$
$Y_1$ = $C(CH_3)_2$, $L_{A436}$

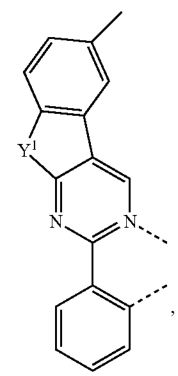

$Y_1$ = O, $L_{A437}$
$Y_1$ = S, $L_{A438}$
$Y_1$ = $NCH_3$, $L_{A439}$
$Y_1$ = $C(CH_3)_2$, $L_{A440}$

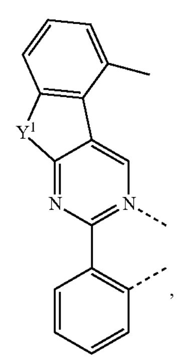

$Y_1$ = O, $L_{A441}$
$Y_1$ = S, $L_{A442}$
$Y_1$ = $NCH_3$, $L_{A443}$
$Y_1$ = $C(CH_3)_2$, $L_{A444}$

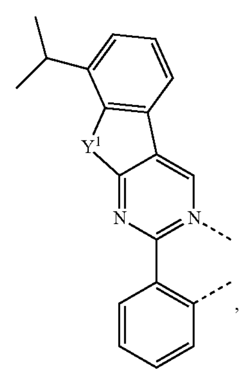

$Y_1$ = O, $L_{A445}$
$Y_1$ = S, $L_{A446}$
$Y_1$ = $NCH_3$, $L_{A447}$
$Y_1$ = $C(CH_3)_2$, $L_{A448}$

-continued

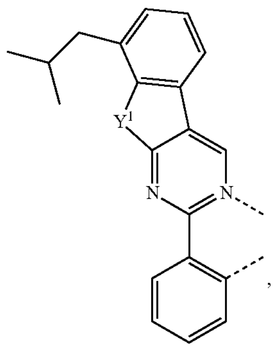

$Y_1$ = O, $L_{A449}$
$Y_1$ = S, $L_{A450}$
$Y_1$ = $NCH_3$, $L_{A451}$
$Y_1$ = $C(CH_3)_2$, $L_{A452}$

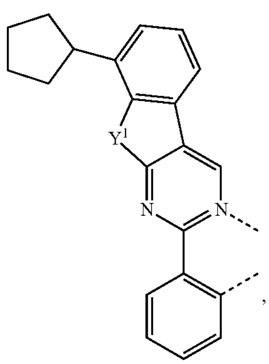

$Y_1$ = O, $L_{A453}$
$Y_1$ = S, $L_{A454}$
$Y_1$ = $NCH_3$, $L_{A455}$
$Y_1$ = $C(CH_3)_2$, $L_{A456}$

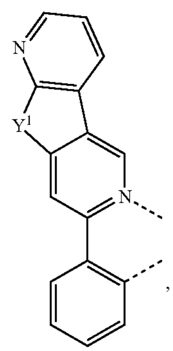

$Y_1$ = O, $L_{A457}$
$Y_1$ = S, $L_{A458}$
$Y_1$ = $NCH_3$, $L_{A459}$
$Y_1$ = $C(CH_3)_2$, $L_{A460}$

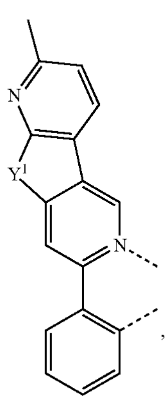

$Y_1$ = O, $L_{A461}$
$Y_1$ = S, $L_{A462}$
$Y_1$ = $NCH_3$, $L_{A463}$
$Y_1$ = $C(CH_3)_2$, $L_{A464}$

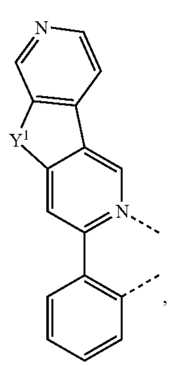

$Y_1$ = O, $L_{A465}$
$Y_1$ = S, $L_{A466}$
$Y_1$ = $NCH_3$, $L_{A467}$
$Y_1$ = $C(CH_3)_2$, $L_{A468}$

-continued

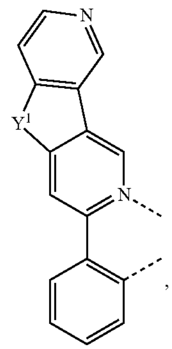

$Y_1$ = O, $L_{A469}$
$Y_1$ = S, $L_{A470}$
$Y_1$ = $NCH_3$, $L_{A471}$
$Y_1$ = $C(CH_3)_2$, $L_{A472}$

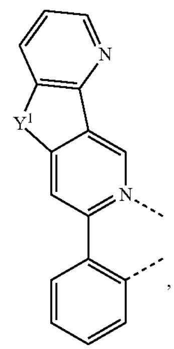

$Y_1$ = O, $L_{A473}$
$Y_1$ = S, $L_{A474}$
$Y_1$ = $NCH_3$, $L_{A475}$
$Y_1$ = $C(CH_3)_2$, $L_{A476}$

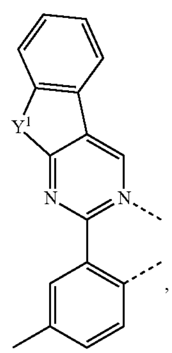

$Y_1$ = O, $L_{A477}$
$Y_1$ = S, $L_{A478}$
$Y_1$ = $NCH_3$, $L_{A479}$
$Y_1$ = $C(CH_3)_2$, $L_{A480}$

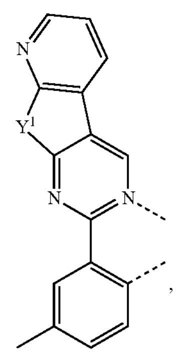

$Y_1$ = O, $L_{A481}$
$Y_1$ = S, $L_{A482}$
$Y_1$ = $NCH_3$, $L_{A483}$
$Y_1$ = $C(CH_3)_2$, $L_{A484}$

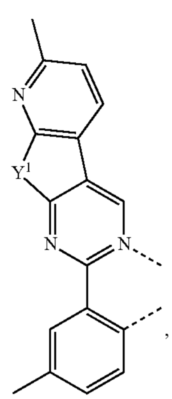

$Y_1$ = O, $L_{A485}$
$Y_1$ = S, $L_{A486}$
$Y_1$ = $NCH_3$, $L_{A487}$
$Y_1$ = $C(CH_3)_2$, $L_{A488}$

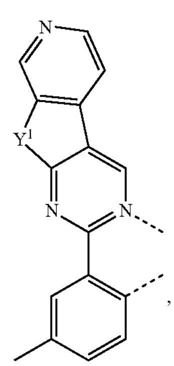

$Y_1$ = O, $L_{A489}$
$Y_1$ = S, $L_{A490}$
$Y_1$ = $NCH_3$, $L_{A491}$
$Y_1$ = $C(CH_3)_2$, $L_{A492}$

-continued

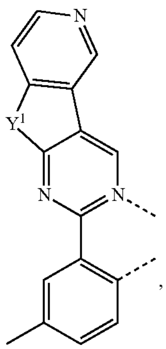

$Y_1$ = O, $L_{A493}$
$Y_1$ = S, $L_{A494}$
$Y_1$ = $NCH_3$, $L_{A495}$
$Y_1$ = $C(CH_3)_2$, $L_{A496}$

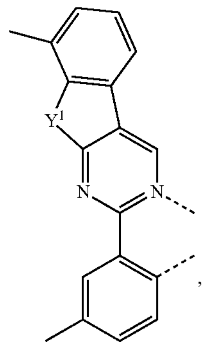

$Y_1$ = O, $L_{A497}$
$Y_1$ = S, $L_{A498}$
$Y_1$ = $NCH_3$, $L_{A499}$
$Y_1$ = $C(CH_3)_2$, $L_{A500}$

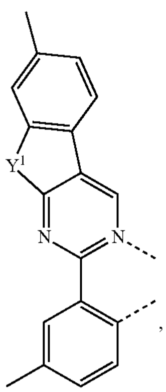

$Y_1$ = O, $L_{A501}$
$Y_1$ = S, $L_{A502}$
$Y_1$ = $NCH_3$, $L_{A503}$
$Y_1$ = $C(CH_3)_2$, $L_{A504}$

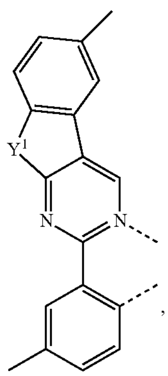

$Y_1$ = O, $L_{A505}$
$Y_1$ = S, $L_{A506}$
$Y_1$ = $NCH_3$, $L_{A507}$
$Y_1$ = $C(CH_3)_2$, $L_{A508}$

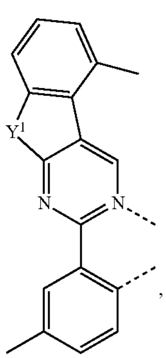

$Y_1$ = O, $L_{A509}$
$Y_1$ = S, $L_{A510}$
$Y_1$ = $NCH_3$, $L_{A511}$
$Y_1$ = $C(CH_3)_2$, $L_{A512}$

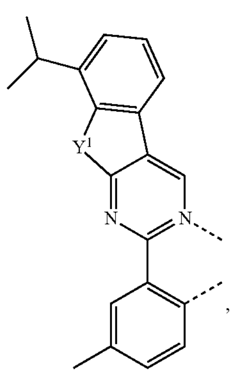

$Y_1$ = O, $L_{A513}$
$Y_1$ = S, $L_{A514}$
$Y_1$ = $NCH_3$, $L_{A515}$
$Y_1$ = $C(CH_3)_2$, $L_{A516}$

-continued

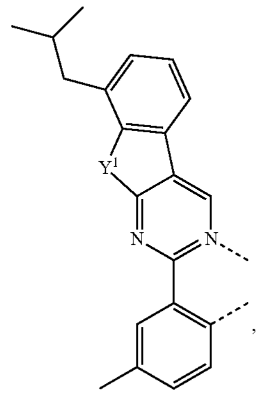

$Y_1$ = O, $L_{A517}$
$Y_1$ = S, $L_{A518}$
$Y_1$ = $NCH_3$, $L_{A519}$
$Y_1$ = $C(CH_3)_2$, $L_{A520}$

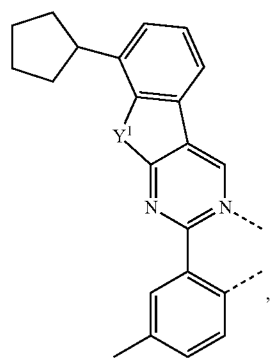

$Y_1$ = O, $L_{A521}$
$Y_1$ = S, $L_{A522}$
$Y_1$ = $NCH_3$, $L_{A523}$
$Y_1$ = $C(CH_3)_2$, $L_{A524}$

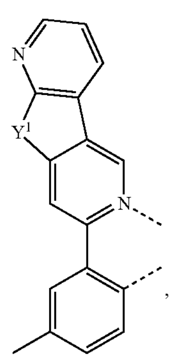

$Y_1$ = O, $L_{A525}$
$Y_1$ = S, $L_{A526}$
$Y_1$ = $NCH_3$, $L_{A527}$
$Y_1$ = $C(CH_3)_2$, $L_{A528}$

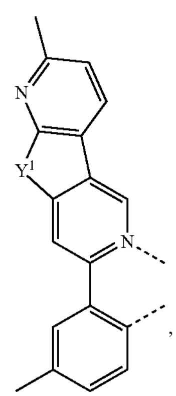

$Y_1$ = O, $L_{A529}$
$Y_1$ = S, $L_{A530}$
$Y_1$ = $NCH_3$, $L_{A531}$
$Y_1$ = $C(CH_3)_2$, $L_{A532}$

-continued

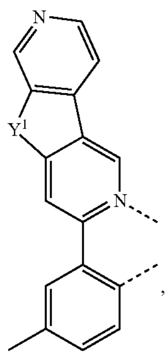

$Y_1 = O$, $L_{A533}$
$Y_1 = S$, $L_{A534}$
$Y_1 = NCH_3$, $L_{A535}$
$Y_1 = C(CH_3)_2$, $L_{A536}$

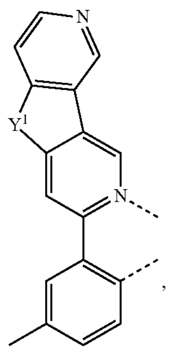

$Y_1 = O$, $L_{A537}$
$Y_1 = S$, $L_{A538}$
$Y_1 = NCH_3$, $L_{A539}$
$Y_1 = C(CH_3)_2$, $L_{A540}$

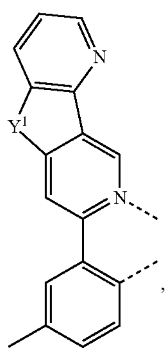

$Y_1 = O$, $L_{A541}$
$Y_1 = S$, $L_{A542}$
$Y_1 = NCH_3$, $L_{A543}$
$Y_1 = C(CH_3)_2$, $L_{A544}$

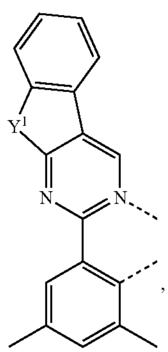

$Y_1 = O$, $L_{A545}$
$Y_1 = S$, $L_{A546}$
$Y_1 = NCH_3$, $L_{A547}$
$Y_1 = C(CH_3)_2$, $L_{A548}$

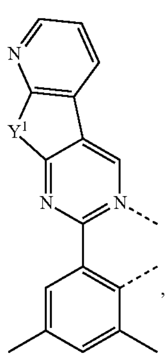

$Y_1 = O$, $L_{A549}$
$Y_1 = S$, $L_{A550}$
$Y_1 = NCH_3$, $L_{A551}$
$Y_1 = C(CH_3)_2$, $L_{A552}$

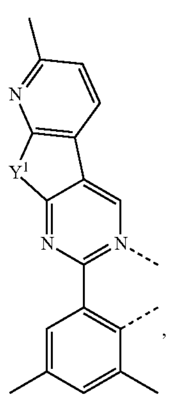

$Y_1 = O$, $L_{A553}$
$Y_1 = S$, $L_{A554}$
$Y_1 = NCH_3$, $L_{A555}$
$Y_1 = C(CH_3)_2$, $L_{A556}$

-continued

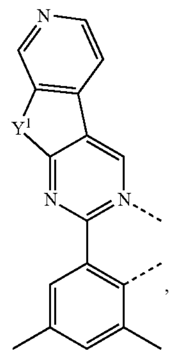

$Y_1 = O$, $L_{A557}$
$Y_1 = S$, $L_{A558}$
$Y_1 = NCH_3$, $L_{A559}$
$Y_1 = C(CH_3)_2$, $L_{A560}$

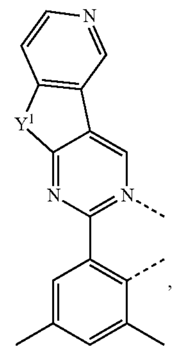

$Y_1 = O$, $L_{A561}$
$Y_1 = S$, $L_{A562}$
$Y_1 = NCH_3$, $L_{A563}$
$Y_1 = C(CH_3)_2$, $L_{A564}$

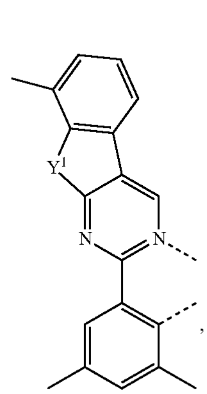

$Y_1 = O$, $L_{A565}$
$Y_1 = S$, $L_{A566}$
$Y_1 = NCH_3$, $L_{A567}$
$Y_1 = C(CH_3)_2$, $L_{A568}$

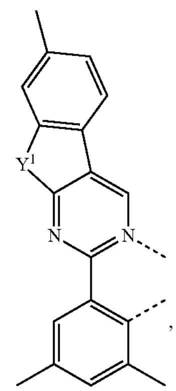

$Y_1 = O$, $L_{A569}$
$Y_1 = S$, $L_{A570}$
$Y_1 = NCH_3$, $L_{A571}$
$Y_1 = C(CH_3)_2$, $L_{A572}$

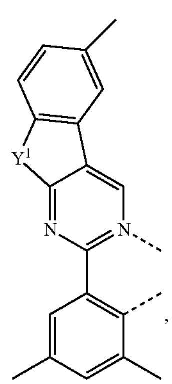

$Y_1 = O$, $L_{A573}$
$Y_1 = S$, $L_{A574}$
$Y_1 = NCH_3$, $L_{A575}$
$Y_1 = C(CH_3)_2$, $L_{A576}$

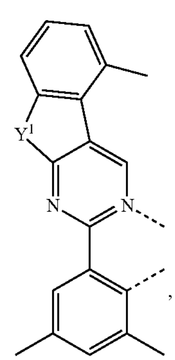

$Y_1 = O$, $L_{A577}$
$Y_1 = S$, $L_{A578}$
$Y_1 = NCH_3$, $L_{A579}$
$Y_1 = C(CH_3)_2$, $L_{A580}$

-continued

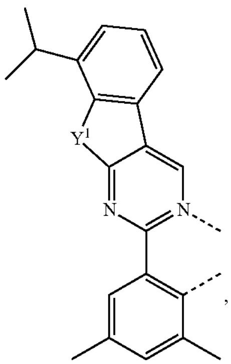

$Y_1$ = O, $L_{A581}$
$Y_1$ = S, $L_{A582}$
$Y_1$ = $NCH_3$, $L_{A583}$
$Y_1$ = $C(CH_3)_2$, $L_{A584}$

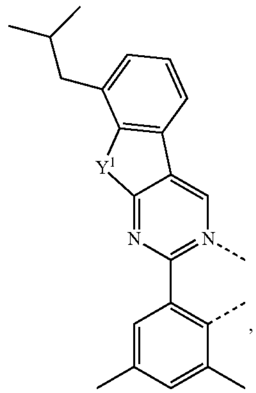

$Y_1$ = O, $L_{A585}$
$Y_1$ = S, $L_{A586}$
$Y_1$ = $NCH_3$, $L_{A587}$
$Y_1$ = $C(CH_3)_2$, $L_{A588}$

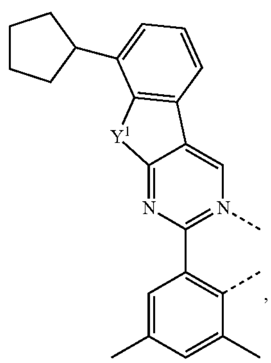

$Y_1$ = O, $L_{A589}$
$Y_1$ = S, $L_{A590}$
$Y_1$ = $NCH_3$, $L_{A591}$
$Y_1$ = $C(CH_3)_2$, $L_{A592}$

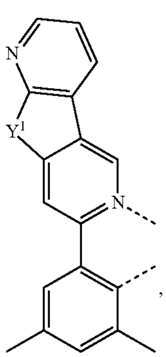

$Y_1$ = O, $L_{A593}$
$Y_1$ = S, $L_{A594}$
$Y_1$ = $NCH_3$, $L_{A595}$
$Y_1$ = $C(CH_3)_2$, $L_{A596}$

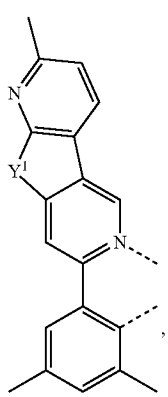

$Y_1$ = O, $L_{A597}$
$Y_1$ = S, $L_{A598}$
$Y_1$ = $NCH_3$, $L_{A599}$
$Y_1$ = $C(CH_3)_2$, $L_{A600}$

-continued

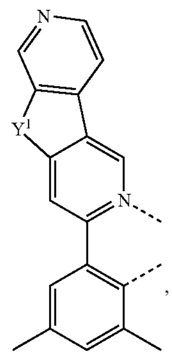

$Y_1$ = O, $L_{A601}$
$Y_1$ = S, $L_{A602}$
$Y_1$ = $NCH_3$, $L_{A603}$
$Y_1$ = $C(CH_3)_2$, $L_{A604}$

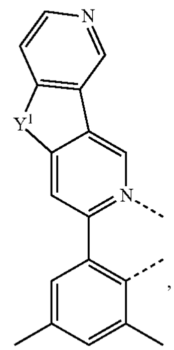

$Y_1$ = O, $L_{A605}$
$Y_1$ = S, $L_{A606}$
$Y_1$ = $NCH_3$, $L_{A607}$
$Y_1$ = $C(CH_3)_2$, $L_{A608}$

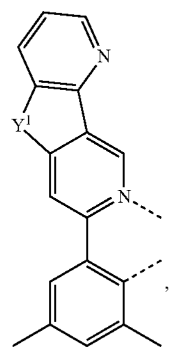

$Y_1$ = O, $L_{A609}$
$Y_1$ = S, $L_{A610}$
$Y_1$ = $NCH_3$, $L_{A611}$
$Y_1$ = $C(CH_3)_2$, $L_{A612}$

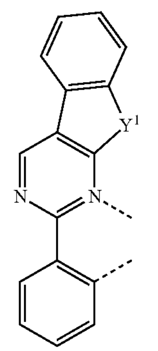

$Y_1$ = O, $L_{A613}$
$Y_1$ = S, $L_{A614}$
$Y_1$ = $NCH_3$, $L_{A615}$
$Y_1$ = $C(CH_3)_2$, $L_{A616}$

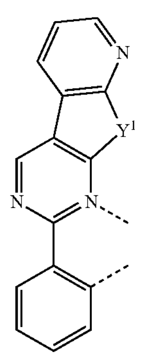

$Y_1$ = O, $L_{A617}$
$Y_1$ = S, $L_{A618}$
$Y_1$ = $NCH_3$, $L_{A619}$
$Y_1$ = $C(CH_3)_2$, $L_{A620}$

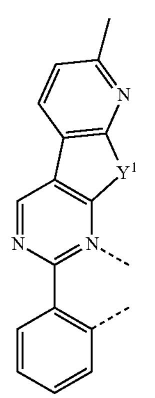

$Y_1$ = O, $L_{A621}$
$Y_1$ = S, $L_{A622}$
$Y_1$ = $NCH_3$, $L_{A623}$
$Y_1$ = $C(CH_3)_2$, $L_{A624}$

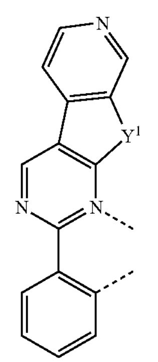

$Y_1$ = O, $L_{A625}$
$Y_1$ = S, $L_{A626}$
$Y_1$ = $NCH_3$, $L_{A627}$
$Y_1$ = $C(CH_3)_2$, $L_{A628}$

-continued

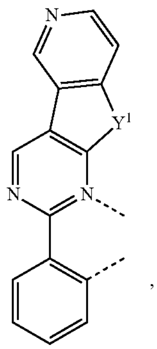

$Y_1$ = O, $L_{A629}$
$Y_1$ = S, $L_{A630}$
$Y_1$ = $NCH_3$, $L_{A631}$
$Y_1$ = $C(CH_3)_2$, $L_{A632}$

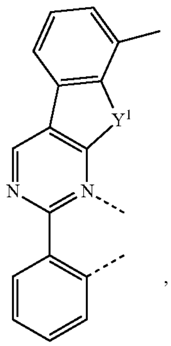

$Y_1$ = O, $L_{A633}$
$Y_1$ = S, $L_{A634}$
$Y_1$ = $NCH_3$, $L_{A635}$
$Y_1$ = $C(CH_3)_2$, $L_{A636}$

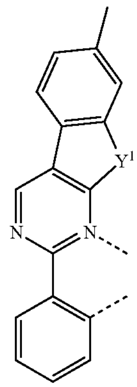

$Y_1$ = O, $L_{A637}$
$Y_1$ = S, $L_{A638}$
$Y_1$ = $NCH_3$, $L_{A639}$
$Y_1$ = $C(CH_3)_2$, $L_{A640}$

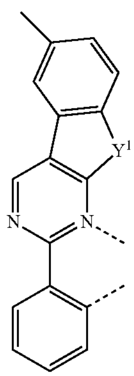

$Y_1$ = O, $L_{A641}$
$Y_1$ = S, $L_{A642}$
$Y_1$ = $NCH_3$, $L_{A643}$
$Y_1$ = $C(CH_3)_2$, $L_{A644}$

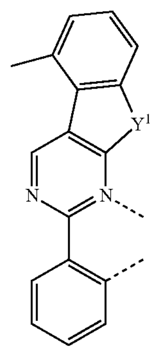

$Y_1$ = O, $L_{A645}$
$Y_1$ = S, $L_{A646}$
$Y_1$ = $NCH_3$, $L_{A647}$
$Y_1$ = $C(CH_3)_2$, $L_{A648}$

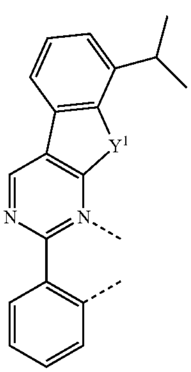

$Y_1$ = O, $L_{A649}$
$Y_1$ = S, $L_{A650}$
$Y_1$ = $NCH_3$, $L_{A651}$
$Y_1$ = $C(CH_3)_2$, $L_{A652}$

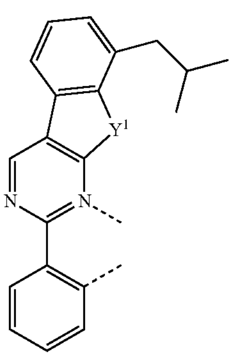

$Y_1$ = O, $L_{A653}$
$Y_1$ = S, $L_{A654}$
$Y_1$ = $NCH_3$, $L_{A655}$
$Y_1$ = $C(CH_3)_2$, $L_{A656}$

-continued

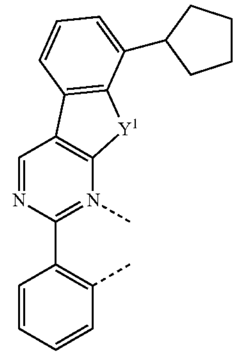

$Y_1$ = O, $L_{A657}$
$Y_1$ = S, $L_{A658}$
$Y_1$ = $NCH_3$, $L_{A659}$
$Y_1$ = $C(CH_3)_2$, $L_{A660}$

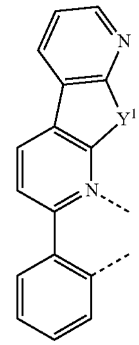

$Y_1$ = O, $L_{A661}$
$Y_1$ = S, $L_{A662}$
$Y_1$ = $NCH_3$, $L_{A663}$
$Y_1$ = $C(CH_3)_2$, $L_{A664}$

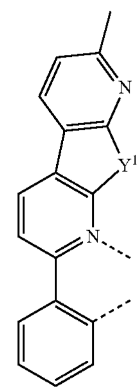

$Y_1$ = O, $L_{A665}$
$Y_1$ = S, $L_{A666}$
$Y_1$ = $NCH_3$, $L_{A667}$
$Y_1$ = $C(CH_3)_2$, $L_{A668}$

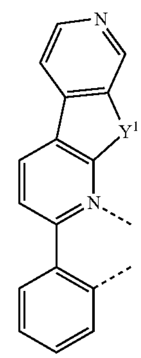

$Y_1$ = O, $L_{A669}$
$Y_1$ = S, $L_{A670}$
$Y_1$ = $NCH_3$, $L_{A671}$
$Y_1$ = $C(CH_3)_2$, $L_{A672}$

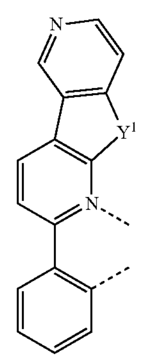

$Y_1$ = O, $L_{A673}$
$Y_1$ = S, $L_{A674}$
$Y_1$ = $NCH_3$, $L_{A675}$
$Y_1$ = $C(CH_3)_2$, $L_{A676}$

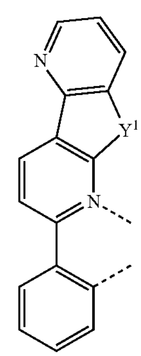

$Y_1$ = O, $L_{A677}$
$Y_1$ = S, $L_{A678}$
$Y_1$ = $NCH_3$, $L_{A679}$
$Y_1$ = $C(CH_3)_2$, $L_{A680}$

-continued

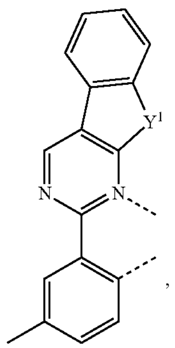

$Y_1 = O, L_{A681}$
$Y_1 = S, L_{A682}$
$Y_1 = NCH_3, L_{A683}$
$Y_1 = C(CH_3)_2, L_{A684}$

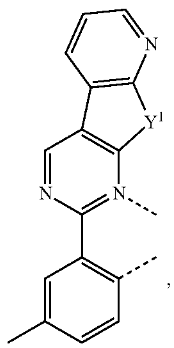

$Y_1 = O, L_{A685}$
$Y_1 = S, L_{A686}$
$Y_1 = NCH_3, L_{A687}$
$Y_1 = C(CH_3)_2, L_{A688}$

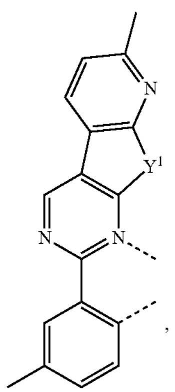

$Y_1 = O, L_{A689}$
$Y_1 = S, L_{A690}$
$Y_1 = NCH_3, L_{A691}$
$Y_1 = C(CH_3)_2, L_{A692}$

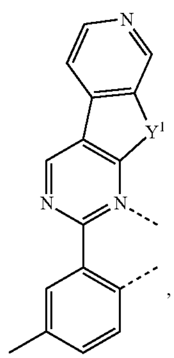

$Y_1 = O, L_{A693}$
$Y_1 = S, L_{A694}$
$Y_1 = NCH_3, L_{A695}$
$Y_1 = C(CH_3)_2, L_{A696}$

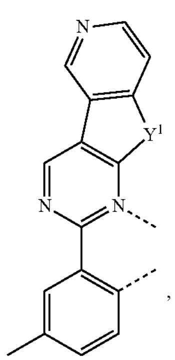

$Y_1 = O, L_{A697}$
$Y_1 = S, L_{A698}$
$Y_1 = NCH_3, L_{A699}$
$Y_1 = C(CH_3)_2, L_{A700}$

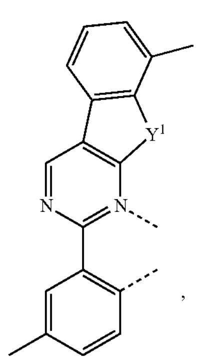

$Y_1 = O, L_{A701}$
$Y_1 = S, L_{A702}$
$Y_1 = NCH_3, L_{A703}$
$Y_1 = C(CH_3)_2, L_{A704}$

-continued

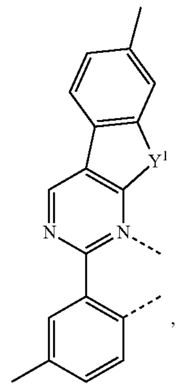

$Y_1 = O, L_{A705}$
$Y_1 = S, L_{A706}$
$Y_1 = NCH_3, L_{A707}$
$Y_1 = C(CH_3)_2, L_{A708}$

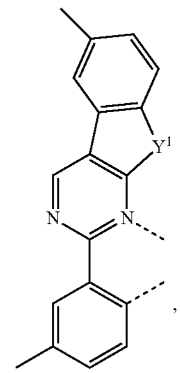

$Y_1 = O, L_{A709}$
$Y_1 = S, L_{A710}$
$Y_1 = NCH_3, L_{A711}$
$Y_1 = C(CH_3)_2, L_{A712}$

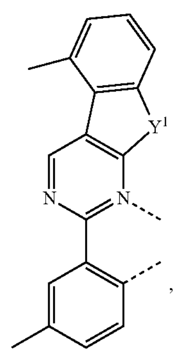

$Y_1 = O, L_{A713}$
$Y_1 = S, L_{A714}$
$Y_1 = NCH_3, L_{A715}$
$Y_1 = C(CH_3)_2, L_{A716}$

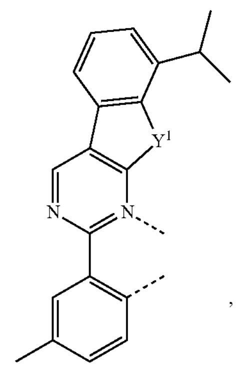

$Y_1 = O, L_{A717}$
$Y_1 = S, L_{A718}$
$Y_1 = NCH_3, L_{A719}$
$Y_1 = C(CH_3)_2, L_{A720}$

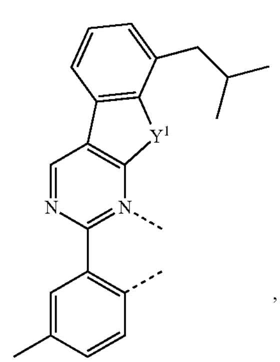

$Y_1 = O, L_{A721}$
$Y_1 = S, L_{A722}$
$Y_1 = NCH_3, L_{A723}$
$Y_1 = C(CH_3)_2, L_{A724}$

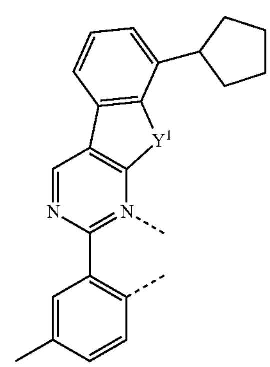

$Y_1 = O, L_{A725}$
$Y_1 = S, L_{A726}$
$Y_1 = NCH_3, L_{A727}$
$Y_1 = C(CH_3)_2, L_{A728}$

-continued

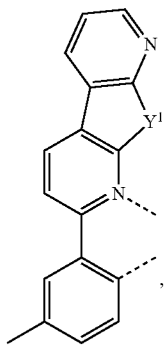

$Y_1 = O$, $L_{A729}$
$Y_1 = S$, $L_{A730}$
$Y_1 = NCH_3$, $L_{A731}$
$Y_1 = C(CH_3)_2$, $L_{A732}$

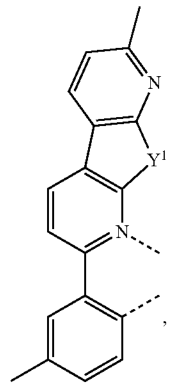

$Y_1 = O$, $L_{A733}$
$Y_1 = S$, $L_{A734}$
$Y_1 = NCH_3$, $L_{A735}$
$Y_1 = C(CH_3)_2$, $L_{A736}$

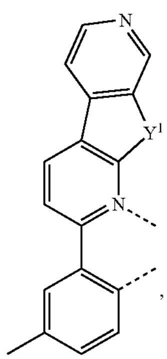

$Y_1 = O$, $L_{A737}$
$Y_1 = S$, $L_{A738}$
$Y_1 = NCH_3$, $L_{A739}$
$Y_1 = C(CH_3)_2$, $L_{A740}$

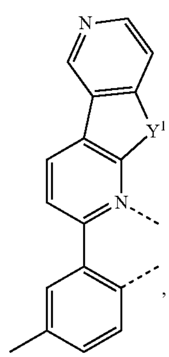

$Y_1 = O$, $L_{A741}$
$Y_1 = S$, $L_{A742}$
$Y_1 = NCH_3$, $L_{A743}$
$Y_1 = C(CH_3)_2$, $L_{A744}$

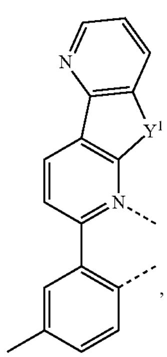

$Y_1 = O$, $L_{A745}$
$Y_1 = S$, $L_{A746}$
$Y_1 = NCH_3$, $L_{A747}$
$Y_1 = C(CH_3)_2$, $L_{A748}$

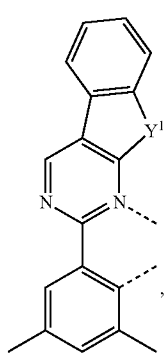

$Y_1 = O$, $L_{A749}$
$Y_1 = S$, $L_{A750}$
$Y_1 = NCH_3$, $L_{A751}$
$Y_1 = C(CH_3)_2$, $L_{A752}$

-continued

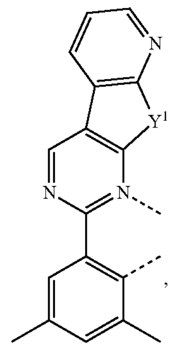

$Y_1 = O$, $L_{A753}$
$Y_1 = S$, $L_{A754}$
$Y_1 = NCH_3$, $L_{A755}$
$Y_1 = C(CH_3)_2$, $L_{A756}$

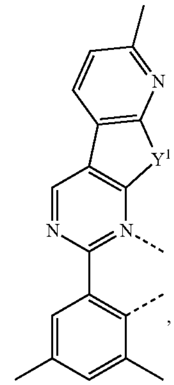

$Y_1 = O$, $L_{A757}$
$Y_1 = S$, $L_{A758}$
$Y_1 = NCH_3$, $L_{A759}$
$Y_1 = C(CH_3)_2$, $L_{A760}$

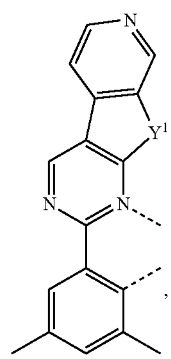

$Y_1 = O$, $L_{A761}$
$Y_1 = S$, $L_{A762}$
$Y_1 = NCH_3$, $L_{A763}$
$Y_1 = C(CH_3)_2$, $L_{A764}$

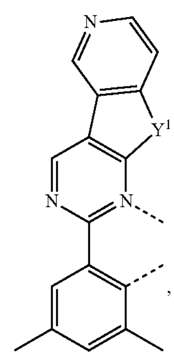

$Y_1 = O$, $L_{A765}$
$Y_1 = S$, $L_{A766}$
$Y_1 = NCH_3$, $L_{A767}$
$Y_1 = C(CH_3)_2$, $L_{A768}$

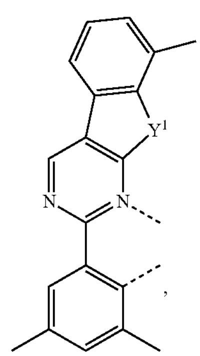

$Y_1 = O$, $L_{A769}$
$Y_1 = S$, $L_{A770}$
$Y_1 = NCH_3$, $L_{A771}$
$Y_1 = C(CH_3)_2$, $L_{A772}$

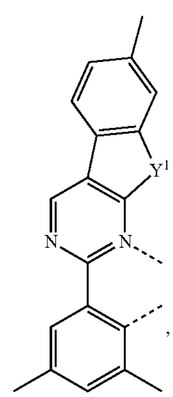

$Y_1 = O$, $L_{A773}$
$Y_1 = S$, $L_{A774}$
$Y_1 = NCH_3$, $L_{A775}$
$Y_1 = C(CH_3)_2$, $L_{A776}$

-continued

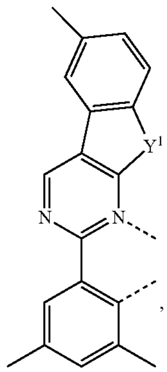

$Y_1 = O, L_{A777}$
$Y_1 = S, L_{A778}$
$Y_1 = NCH_3, L_{A779}$
$Y_1 = C(CH_3)_2, L_{A780}$

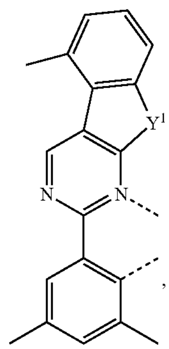

$Y_1 = O, L_{A781}$
$Y_1 = S, L_{A782}$
$Y_1 = NCH_3, L_{A783}$
$Y_1 = C(CH_3)_2, L_{A784}$

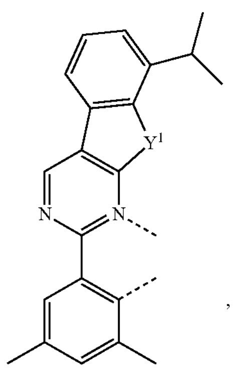

$Y_1 = O, L_{A785}$
$Y_1 = S, L_{A786}$
$Y_1 = NCH_3, L_{A787}$
$Y_1 = C(CH_3)_2, L_{A788}$

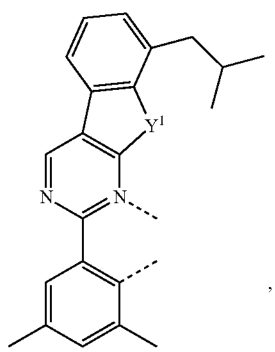

$Y_1 = O, L_{A789}$
$Y_1 = S, L_{A790}$
$Y_1 = NCH_3, L_{A791}$
$Y_1 = C(CH_3)_2, L_{A792}$

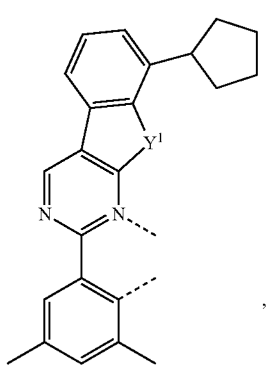

$Y_1 = O, L_{A793}$
$Y_1 = S, L_{A794}$
$Y_1 = NCH_3, L_{A795}$
$Y_1 = C(CH_3)_2, L_{A796}$

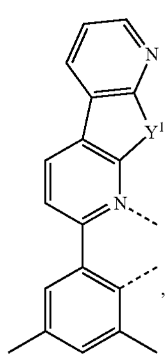

$Y_1 = O, L_{A797}$
$Y_1 = S, L_{A798}$
$Y_1 = NCH_3, L_{A799}$
$Y_1 = C(CH_3)_2, L_{A800}$

-continued

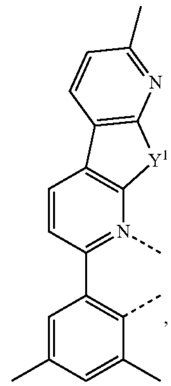

$Y_1 = O, L_{A801}$
$Y_1 = S, L_{A802}$
$Y_1 = NCH_3, L_{A803}$
$Y_1 = C(CH_3)_2, L_{A804}$

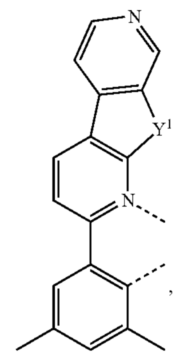

$Y_1 = O, L_{A805}$
$Y_1 = S, L_{A806}$
$Y_1 = NCH_3, L_{A807}$
$Y_1 = C(CH_3)_2, L_{A808}$

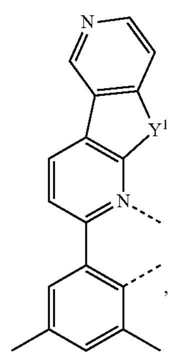

$Y_1 = O, L_{A809}$
$Y_1 = S, L_{A810}$
$Y_1 = NCH_3, L_{A811}$
$Y_1 = C(CH_3)_2, L_{A812}$

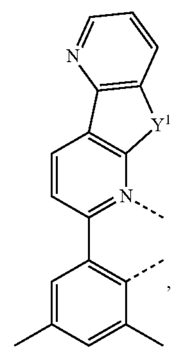

$Y_1 = O, L_{A813}$
$Y_1 = S, L_{A814}$
$Y_1 = NCH_3, L_{A815}$
$Y_1 = C(CH_3)_2, L_{A816}$

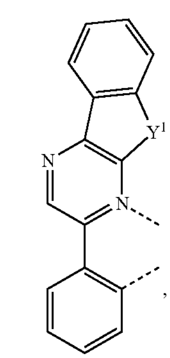

$Y_1 = O, L_{A817}$
$Y_1 = S, L_{A818}$
$Y_1 = NCH_3, L_{A819}$
$Y_1 = C(CH_3)_2, L_{A820}$

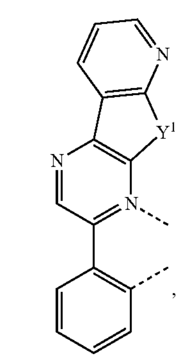

$Y_1 = O, L_{A821}$
$Y_1 = S, L_{A822}$
$Y_1 = NCH_3, L_{A823}$
$Y_1 = C(CH_3)_2, L_{A824}$

-continued

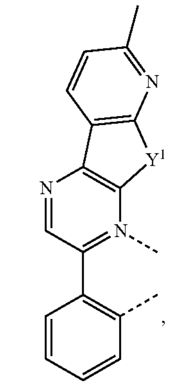

$Y_1$ = O, $L_{A825}$
$Y_1$ = S, $L_{A826}$
$Y_1$ = $NCH_3$, $L_{A827}$
$Y_1$ = $C(CH_3)_2$, $L_{A828}$

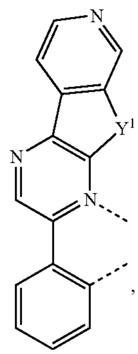

$Y_1$ = O, $L_{A829}$
$Y_1$ = S, $L_{A830}$
$Y_1$ = $NCH_3$, $L_{A831}$
$Y_1$ = $C(CH_3)_2$, $L_{A832}$

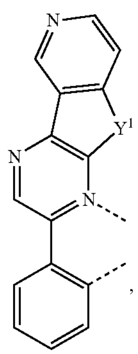

$Y_1$ = O, $L_{A833}$
$Y_1$ = S, $L_{A834}$
$Y_1$ = $NCH_3$, $L_{A835}$
$Y_1$ = $C(CH_3)_2$, $L_{A836}$

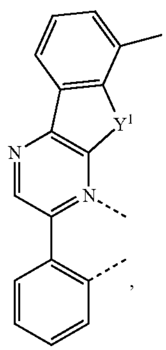

$Y_1$ = O, $L_{A837}$
$Y_1$ = S, $L_{A838}$
$Y_1$ = $NCH_3$, $L_{A839}$
$Y_1$ = $C(CH_3)_2$, $L_{A840}$

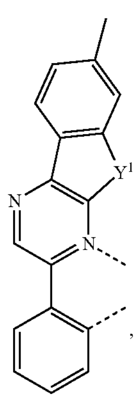

$Y_1$ = O, $L_{A841}$
$Y_1$ = S, $L_{A842}$
$Y_1$ = $NCH_3$, $L_{A843}$
$Y_1$ = $C(CH_3)_2$, $L_{A844}$

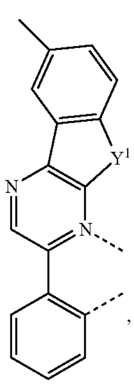

$Y_1$ = O, $L_{A845}$
$Y_1$ = S, $L_{A846}$
$Y_1$ = $NCH_3$, $L_{A847}$
$Y_1$ = $C(CH_3)_2$, $L_{A848}$

-continued

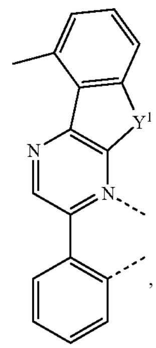

$Y_1$ = O, $L_{A849}$
$Y_1$ = S, $L_{A850}$
$Y_1$ = $NCH_3$, $L_{A851}$
$Y_1$ = $C(CH_3)_2$, $L_{A852}$

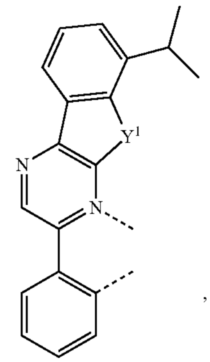

$Y_1$ = O, $L_{A853}$
$Y_1$ = S, $L_{A854}$
$Y_1$ = $NCH_3$, $L_{A855}$
$Y_1$ = $C(CH_3)_2$, $L_{A856}$

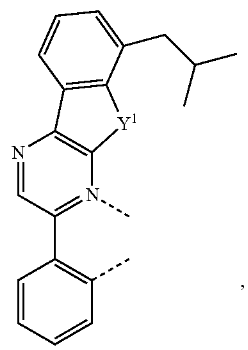

$Y_1$ = O, $L_{A857}$
$Y_1$ = S, $L_{A858}$
$Y_1$ = $NCH_3$, $L_{A859}$
$Y_1$ = $C(CH_3)_2$, $L_{A860}$

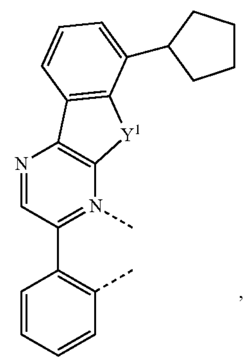

$Y_1$ = O, $L_{A861}$
$Y_1$ = S, $L_{A862}$
$Y_1$ = $NCH_3$, $L_{A863}$
$Y_1$ = $C(CH_3)_2$, $L_{A864}$

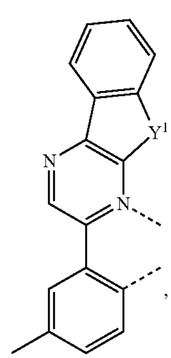

$Y_1$ = O, $L_{A865}$
$Y_1$ = S, $L_{A866}$
$Y_1$ = $NCH_3$, $L_{A867}$
$Y_1$ = $C(CH_3)_2$, $L_{A868}$

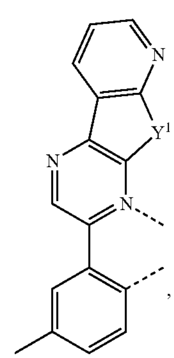

$Y_1$ = O, $L_{A869}$
$Y_1$ = S, $L_{A870}$
$Y_1$ = $NCH_3$, $L_{A871}$
$Y_1$ = $C(CH_3)_2$, $L_{A872}$

-continued

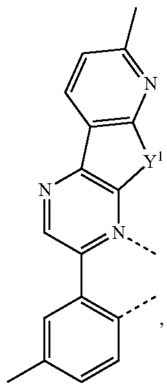

$Y_1 = O$, $L_{A4873}$
$Y_1 = S$, $L_{A4874}$
$Y_1 = NCH_3$, $L_{A4875}$
$Y_1 = C(CH_3)_2$, $L_{A4876}$

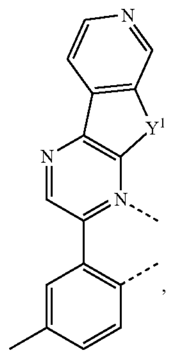

$Y_1 = O$, $L_{A4877}$
$Y_1 = S$, $L_{A4878}$
$Y_1 = NCH_3$, $L_{A4879}$
$Y_1 = C(CH_3)_2$, $L_{A4880}$

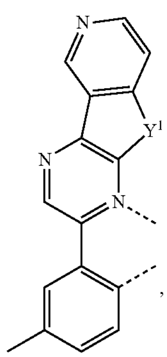

$Y_1 = O$, $L_{A4881}$
$Y_1 = S$, $L_{A4882}$
$Y_1 = NCH_3$, $L_{A4883}$
$Y_1 = C(CH_3)_2$, $L_{A4884}$

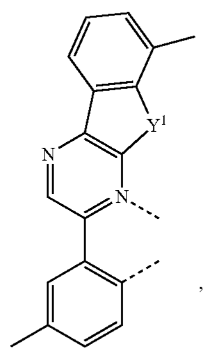

$Y_1 = O$, $L_{A4885}$
$Y_1 = S$, $L_{A4886}$
$Y_1 = NCH_3$, $L_{A4887}$
$Y_1 = C(CH_3)_2$, $L_{A4888}$

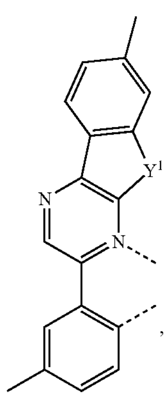

$Y_1 = O$, $L_{A4889}$
$Y_1 = S$, $L_{A4890}$
$Y_1 = NCH_3$, $L_{A4891}$
$Y_1 = C(CH_3)_2$, $L_{A4892}$

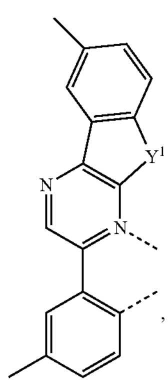

$Y_1 = O$, $L_{A4893}$
$Y_1 = S$, $L_{A4894}$
$Y_1 = NCH_3$, $L_{A4895}$
$Y_1 = C(CH_3)_2$, $L_{A4896}$

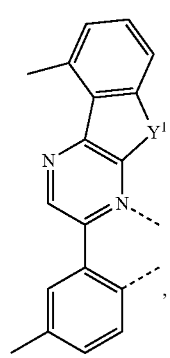

$Y_1 = O$, $L_{A4897}$
$Y_1 = S$, $L_{A4898}$
$Y_1 = NCH_3$, $L_{A4899}$
$Y_1 = C(CH_3)_2$, $L_{A4900}$

-continued

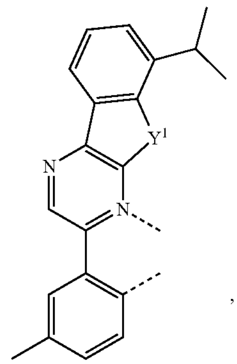

$Y_1 = O$, $L_{A4901}$
$Y_1 = S$, $L_{A4902}$
$Y_1 = NCH_3$, $L_{A4903}$
$Y_1 = C(CH_3)_2$, $L_{A4904}$

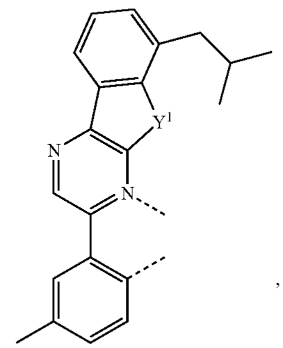

$Y_1 = O$, $L_{A4905}$
$Y_1 = S$, $L_{A4906}$
$Y_1 = NCH_3$, $L_{A4907}$
$Y_1 = C(CH_3)_2$, $L_{A4908}$

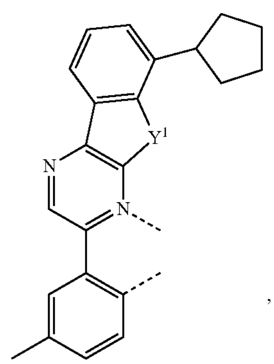

$Y_1 = O$, $L_{A4909}$
$Y_1 = S$, $L_{A4910}$
$Y_1 = NCH_3$, $L_{A4911}$
$Y_1 = C(CH_3)_2$, $L_{A4912}$

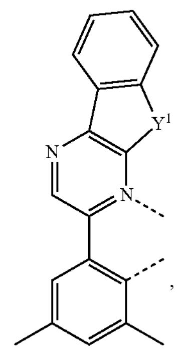

$Y_1 = O$, $L_{A4913}$
$Y_1 = S$, $L_{A4914}$
$Y_1 = NCH_3$, $L_{A4915}$
$Y_1 = C(CH_3)_2$, $L_{A4916}$

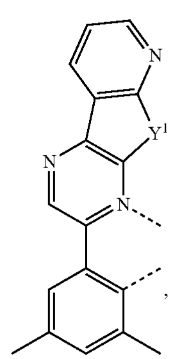

$Y_1 = O$, $L_{A4917}$
$Y_1 = S$, $L_{A4918}$
$Y_1 = NCH_3$, $L_{A4919}$
$Y_1 = C(CH_3)_2$, $L_{A4920}$

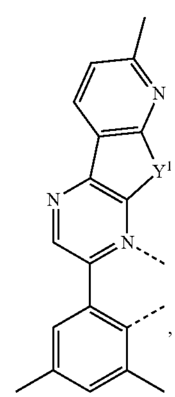

$Y_1 = O$, $L_{A4921}$
$Y_1 = S$, $L_{A4922}$
$Y_1 = NCH_3$, $L_{A4923}$
$Y_1 = C(CH_3)_2$, $L_{A4924}$

-continued

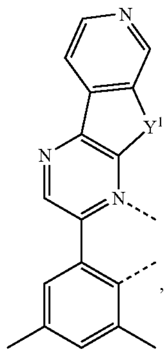

$Y_1 = O, L_{A925}$
$Y_1 = S, L_{A926}$
$Y_1 = NCH_3, L_{A927}$
$Y_1 = C(CH_3)_2, L_{A928}$

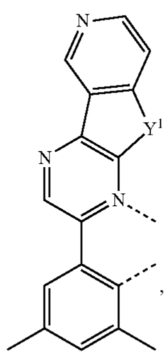

$Y_1 = O, L_{A929}$
$Y_1 = S, L_{A930}$
$Y_1 = NCH_3, L_{A931}$
$Y_1 = C(CH_3)_2, L_{A932}$

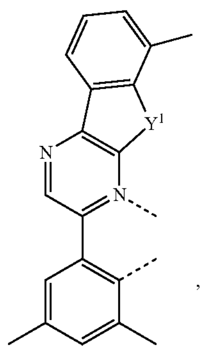

$Y_1 = O, L_{A933}$
$Y_1 = S, L_{A934}$
$Y_1 = NCH_3, L_{A935}$
$Y_1 = C(CH_3)_2, L_{A936}$

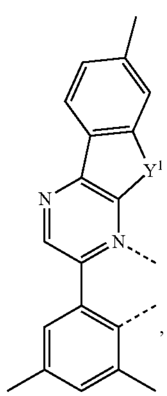

$Y_1 = O, L_{A937}$
$Y_1 = S, L_{A938}$
$Y_1 = NCH_3, L_{A939}$
$Y_1 = C(CH_3)_2, L_{A940}$

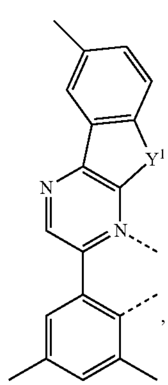

$Y_1 = O, L_{A941}$
$Y_1 = S, L_{A942}$
$Y_1 = NCH_3, L_{A943}$
$Y_1 = C(CH_3)_2, L_{A944}$

-continued

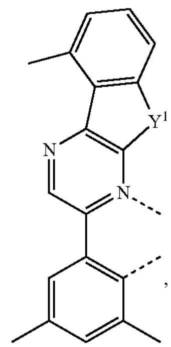

$Y_1 = O, L_{A945}$
$Y_1 = S, L_{A946}$
$Y_1 = NCH_3, L_{A947}$
$Y_1 = C(CH_3)_2, L_{A948}$

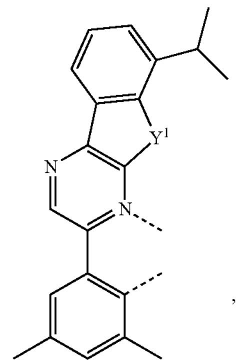

$Y_1 = O, L_{A949}$
$Y_1 = S, L_{A950}$
$Y_1 = NCH_3, L_{A951}$
$Y_1 = C(CH_3)_2, L_{A952}$

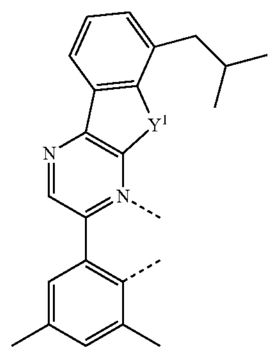

, and $Y_1 = O, L_{A953}$
$Y_1 = S, L_{A954}$
$Y_1 = NCH_3, L_{A955}$
$Y_1 = C(CH_3)_2, L_{A956}$

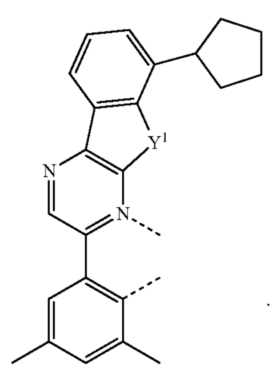

$Y_1 = O, L_{A957}$
$Y_1 = S, L_{A958}$
$Y_1 = NCH_3, L_{A959}$
$Y_1 = C(CH_3)_2, L_{A960}$

In some embodiments, $L_B$ is selected from the group consisting of:
$L_{B1}$
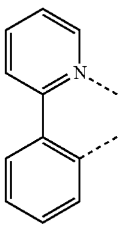
$L_{B2}$
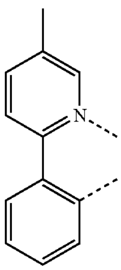
$L_{B3}$
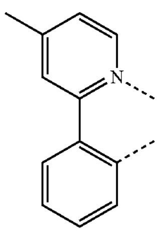
$L_{B4}$
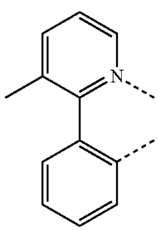
$L_{B5}$
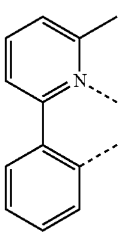
$L_{B6}$
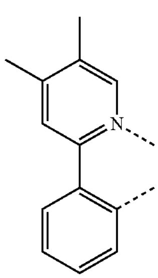
-continued
$L_{B7}$
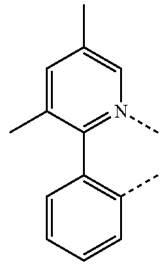
$L_{B8}$
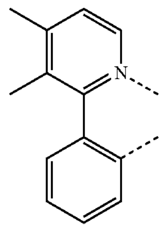
$L_{B9}$
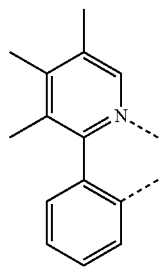
$L_{B10}$
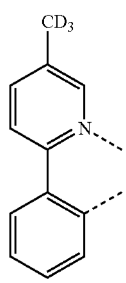
$L_{B11}$
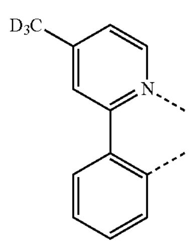
$L_{B12}$
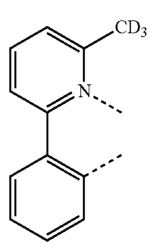

-continued
$L_{B13}$
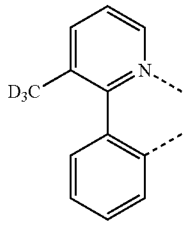
$L_{B14}$
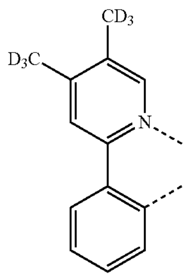
$L_{B15}$
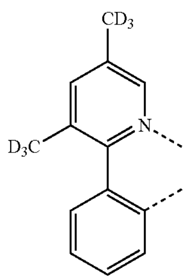
$L_{B16}$
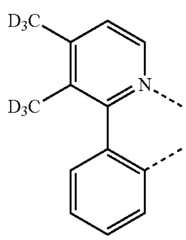
$L_{B17}$
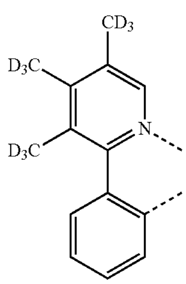
$L_{B18}$
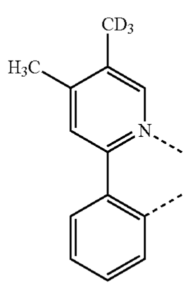
-continued
$L_{B19}$
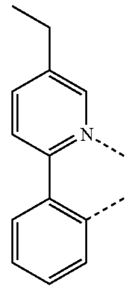
$L_{B20}$
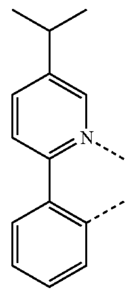
$L_{B21}$
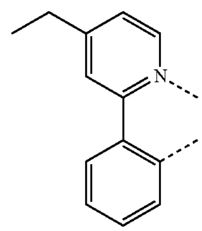
$L_{B22}$
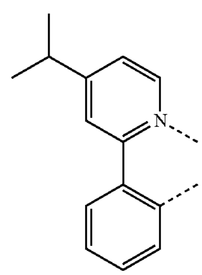
$L_{B23}$
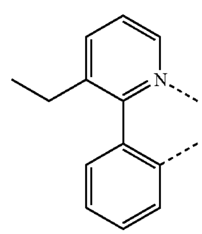
$L_{B24}$
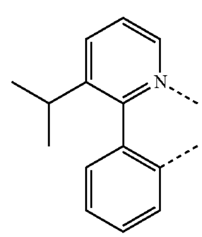

-continued
$L_{B25}$
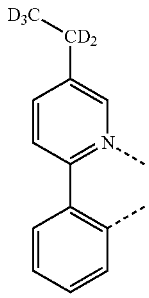
$L_{B26}$
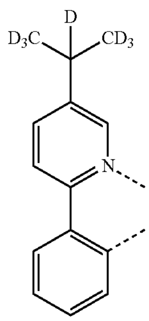
$L_{B27}$
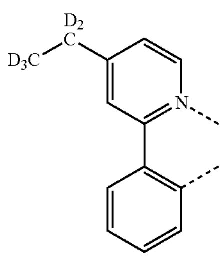
$L_{B28}$
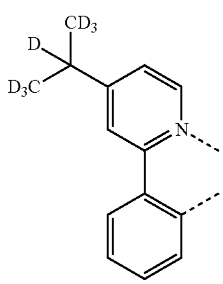
$L_{B30}$
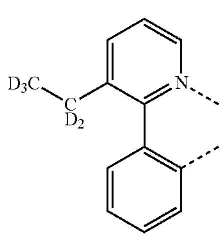
$L_{B31}$
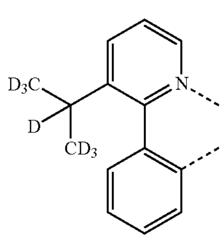
-continued
$L_{B32}$
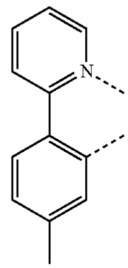
$L_{B33}$
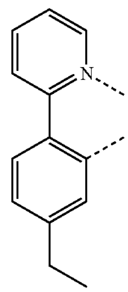
$L_{B34}$
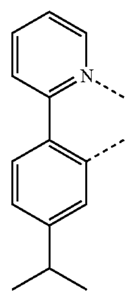
$L_{B35}$
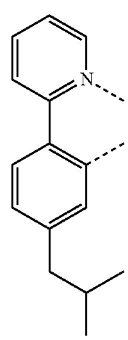
$L_{B36}$
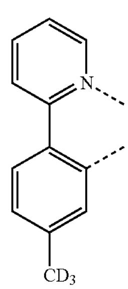

-continued $L_{B37}$

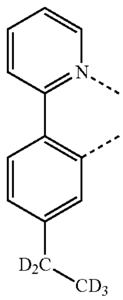

$L_{B38}$

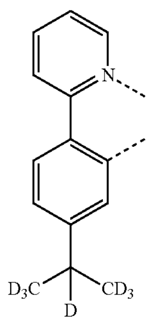

$L_{B39}$

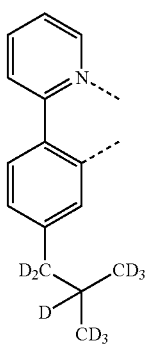

$L_{B40}$

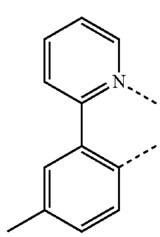

and $L_{B41}$

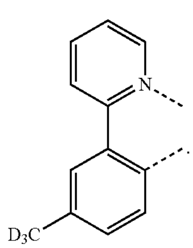

In some embodiments, $L_B$ is selected from the group consisting of:

$L_{B42}$

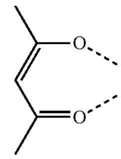

$L_{B43}$

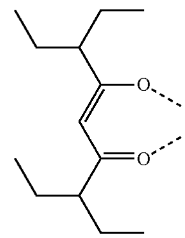

$L_{B44}$

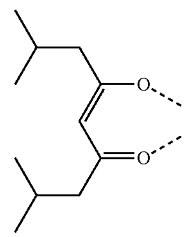

$L_{B45}$

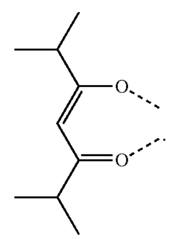

In some embodiments, the compound has formula IV:

$$(L_A)_3\text{-M} \quad \text{(IV);}$$

and is selected from the group consisting of compound 1 to compound 960 listed in TABLE 1.

TABLE 1

| Compound Number | $L_A$ |
|---|---|
| 1 | $L_{A1}$ |
| 2 | $L_{A2}$ |
| 3 | $L_{A3}$ |
| 4 | $L_{A4}$ |
| 5 | $L_{A5}$ |
| 6 | $L_{A6}$ |
| 7 | $L_{A7}$ |
| 8 | $L_{A8}$ |
| 9 | $L_{A9}$ |
| 10 | $L_{A10}$ |
| 11 | $L_{A11}$ |
| 12 | $L_{A12}$ |
| 13 | $L_{A13}$ |
| 14 | $L_{A14}$ |
| 15 | $L_{A15}$ |
| 16 | $L_{A16}$ |
| 17 | $L_{A17}$ |
| 18 | $L_{A18}$ |

TABLE 1-continued

| Compound Number | $L_A$ |
|---|---|
| 19 | $L_{A19}$ |
| 20 | $L_{A20}$ |
| 21 | $L_{A21}$ |
| 22 | $L_{A22}$ |
| 23 | $L_{A23}$ |
| 24 | $L_{A24}$ |
| 25 | $L_{A25}$ |
| 26 | $L_{A26}$ |
| 27 | $L_{A27}$ |
| 28 | $L_{A28}$ |
| 29 | $L_{A29}$ |
| 30 | $L_{A30}$ |
| 31 | $L_{A31}$ |
| 32 | $L_{A32}$ |
| 33 | $L_{A33}$ |
| 34 | $L_{A34}$ |
| 35 | $L_{A35}$ |
| 36 | $L_{A36}$ |
| 37 | $L_{A37}$ |
| 38 | $L_{A38}$ |
| 39 | $L_{A39}$ |
| 40 | $L_{A40}$ |
| 41 | $L_{A41}$ |
| 42 | $L_{A42}$ |
| 43 | $L_{A43}$ |
| 44 | $L_{A44}$ |
| 45 | $L_{A45}$ |
| 46 | $L_{A46}$ |
| 47 | $L_{A47}$ |
| 48 | $L_{A48}$ |
| 49 | $L_{A49}$ |
| 50 | $L_{A50}$ |
| 51 | $L_{A51}$ |
| 52 | $L_{A52}$ |
| 53 | $L_{A53}$ |
| 54 | $L_{A54}$ |
| 55 | $L_{A55}$ |
| 56 | $L_{A56}$ |
| 57 | $L_{A57}$ |
| 58 | $L_{A58}$ |
| 59 | $L_{A59}$ |
| 60 | $L_{A60}$ |
| 61 | $L_{A61}$ |
| 62 | $L_{A62}$ |
| 63 | $L_{A63}$ |
| 64 | $L_{A64}$ |
| 65 | $L_{A65}$ |
| 66 | $L_{A66}$ |
| 67 | $L_{A67}$ |
| 68 | $L_{A68}$ |
| 69 | $L_{A69}$ |
| 70 | $L_{A70}$ |
| 71 | $L_{A71}$ |
| 72 | $L_{A72}$ |
| 73 | $L_{A73}$ |
| 74 | $L_{A74}$ |
| 75 | $L_{A75}$ |
| 76 | $L_{A76}$ |
| 77 | $L_{A77}$ |
| 78 | $L_{A78}$ |
| 79 | $L_{A79}$ |
| 80 | $L_{A80}$ |
| 81 | $L_{A81}$ |
| 82 | $L_{A82}$ |
| 83 | $L_{A83}$ |
| 84 | $L_{A84}$ |
| 85 | $L_{A85}$ |
| 86 | $L_{A86}$ |
| 87 | $L_{A87}$ |
| 88 | $L_{A88}$ |
| 89 | $L_{A89}$ |
| 90 | $L_{A90}$ |
| 91 | $L_{A91}$ |
| 92 | $L_{A92}$ |
| 93 | $L_{A93}$ |
| 94 | $L_{A94}$ |
| 95 | $L_{A95}$ |

TABLE 1-continued

| Compound Number | $L_A$ |
|---|---|
| 96 | $L_{A96}$ |
| 97 | $L_{A97}$ |
| 98 | $L_{A98}$ |
| 99 | $L_{A99}$ |
| 100 | $L_{A100}$ |
| 101 | $L_{A101}$ |
| 102 | $L_{A102}$ |
| 103 | $L_{A103}$ |
| 104 | $L_{A104}$ |
| 105 | $L_{A105}$ |
| 106 | $L_{A106}$ |
| 107 | $L_{A107}$ |
| 108 | $L_{A108}$ |
| 109 | $L_{A109}$ |
| 110 | $L_{A110}$ |
| 111 | $L_{A111}$ |
| 112 | $L_{A112}$ |
| 113 | $L_{A113}$ |
| 114 | $L_{A114}$ |
| 115 | $L_{A115}$ |
| 116 | $L_{A116}$ |
| 117 | $L_{A117}$ |
| 118 | $L_{A118}$ |
| 119 | $L_{A119}$ |
| 120 | $L_{A120}$ |
| 121 | $L_{A121}$ |
| 122 | $L_{A122}$ |
| 123 | $L_{A123}$ |
| 124 | $L_{A124}$ |
| 125 | $L_{A125}$ |
| 126 | $L_{A126}$ |
| 127 | $L_{A127}$ |
| 128 | $L_{A128}$ |
| 129 | $L_{A129}$ |
| 130 | $L_{A130}$ |
| 131 | $L_{A131}$ |
| 132 | $L_{A132}$ |
| 133 | $L_{A133}$ |
| 134 | $L_{A134}$ |
| 135 | $L_{A135}$ |
| 136 | $L_{A136}$ |
| 137 | $L_{A137}$ |
| 138 | $L_{A138}$ |
| 139 | $L_{A139}$ |
| 140 | $L_{A140}$ |
| 141 | $L_{A141}$ |
| 142 | $L_{A142}$ |
| 143 | $L_{A143}$ |
| 144 | $L_{A144}$ |
| 145 | $L_{A145}$ |
| 146 | $L_{A146}$ |
| 147 | $L_{A147}$ |
| 148 | $L_{A148}$ |
| 149 | $L_{A149}$ |
| 150 | $L_{A150}$ |
| 151 | $L_{A151}$ |
| 152 | $L_{A152}$ |
| 153 | $L_{A153}$ |
| 154 | $L_{A154}$ |
| 155 | $L_{A155}$ |
| 156 | $L_{A156}$ |
| 157 | $L_{A157}$ |
| 158 | $L_{A158}$ |
| 159 | $L_{A159}$ |
| 160 | $L_{A160}$ |
| 161 | $L_{A161}$ |
| 162 | $L_{A162}$ |
| 163 | $L_{A163}$ |
| 164 | $L_{A164}$ |
| 165 | $L_{A165}$ |
| 166 | $L_{A166}$ |
| 167 | $L_{A167}$ |
| 168 | $L_{A168}$ |
| 169 | $L_{A169}$ |
| 170 | $L_{A170}$ |
| 171 | $L_{A171}$ |
| 172 | $L_{A172}$ |

TABLE 1-continued

| Compound Number | $L_A$ |
|---|---|
| 173 | $L_{A173}$ |
| 174 | $L_{A174}$ |
| 175 | $L_{A175}$ |
| 176 | $L_{A176}$ |
| 177 | $L_{A177}$ |
| 178 | $L_{A178}$ |
| 179 | $L_{A179}$ |
| 180 | $L_{A180}$ |
| 181 | $L_{A181}$ |
| 182 | $L_{A182}$ |
| 183 | $L_{A183}$ |
| 184 | $L_{A184}$ |
| 185 | $L_{A185}$ |
| 186 | $L_{A186}$ |
| 187 | $L_{A187}$ |
| 188 | $L_{A188}$ |
| 189 | $L_{A189}$ |
| 190 | $L_{A190}$ |
| 191 | $L_{A191}$ |
| 192 | $L_{A192}$ |
| 193 | $L_{A193}$ |
| 194 | $L_{A194}$ |
| 195 | $L_{A195}$ |
| 196 | $L_{A196}$ |
| 197 | $L_{A197}$ |
| 198 | $L_{A198}$ |
| 199 | $L_{A199}$ |
| 200 | $L_{A200}$ |
| 201 | $L_{A201}$ |
| 202 | $L_{A202}$ |
| 203 | $L_{A203}$ |
| 204 | $L_{A204}$ |
| 205 | $L_{A205}$ |
| 206 | $L_{A206}$ |
| 207 | $L_{A207}$ |
| 208 | $L_{A208}$ |
| 209 | $L_{A209}$ |
| 210 | $L_{A210}$ |
| 211 | $L_{A211}$ |
| 212 | $L_{A212}$ |
| 213 | $L_{A213}$ |
| 214 | $L_{A214}$ |
| 215 | $L_{A215}$ |
| 216 | $L_{A216}$ |
| 217 | $L_{A217}$ |
| 218 | $L_{A218}$ |
| 219 | $L_{A219}$ |
| 220 | $L_{A220}$ |
| 221 | $L_{A221}$ |
| 222 | $L_{A222}$ |
| 223 | $L_{A223}$ |
| 224 | $L_{A224}$ |
| 225 | $L_{A225}$ |
| 226 | $L_{A226}$ |
| 227 | $L_{A227}$ |
| 228 | $L_{A228}$ |
| 229 | $L_{A229}$ |
| 230 | $L_{A230}$ |
| 231 | $L_{A231}$ |
| 232 | $L_{A232}$ |
| 233 | $L_{A233}$ |
| 234 | $L_{A234}$ |
| 235 | $L_{A235}$ |
| 236 | $L_{A236}$ |
| 237 | $L_{A237}$ |
| 238 | $L_{A238}$ |
| 239 | $L_{A239}$ |
| 240 | $L_{A240}$ |
| 241 | $L_{A241}$ |
| 242 | $L_{A242}$ |
| 243 | $L_{A243}$ |
| 244 | $L_{A244}$ |
| 245 | $L_{A245}$ |
| 246 | $L_{A246}$ |
| 247 | $L_{A247}$ |
| 248 | $L_{A248}$ |
| 249 | $L_{A249}$ |

TABLE 1-continued

| Compound Number | $L_A$ |
|---|---|
| 250 | $L_{A250}$ |
| 251 | $L_{A251}$ |
| 252 | $L_{A252}$ |
| 253 | $L_{A253}$ |
| 254 | $L_{A254}$ |
| 255 | $L_{A255}$ |
| 256 | $L_{A256}$ |
| 257 | $L_{A257}$ |
| 258 | $L_{A258}$ |
| 259 | $L_{A259}$ |
| 260 | $L_{A260}$ |
| 261 | $L_{A261}$ |
| 262 | $L_{A262}$ |
| 263 | $L_{A263}$ |
| 264 | $L_{A264}$ |
| 265 | $L_{A265}$ |
| 266 | $L_{A266}$ |
| 267 | $L_{A267}$ |
| 268 | $L_{A268}$ |
| 269 | $L_{A269}$ |
| 270 | $L_{A270}$ |
| 271 | $L_{A271}$ |
| 272 | $L_{A272}$ |
| 273 | $L_{A273}$ |
| 274 | $L_{A274}$ |
| 275 | $L_{A275}$ |
| 276 | $L_{A276}$ |
| 277 | $L_{A277}$ |
| 278 | $L_{A278}$ |
| 279 | $L_{A279}$ |
| 280 | $L_{A280}$ |
| 281 | $L_{A281}$ |
| 282 | $L_{A282}$ |
| 283 | $L_{A283}$ |
| 284 | $L_{A284}$ |
| 285 | $L_{A285}$ |
| 286 | $L_{A286}$ |
| 287 | $L_{A287}$ |
| 288 | $L_{A288}$ |
| 289 | $L_{A289}$ |
| 290 | $L_{A290}$ |
| 291 | $L_{A291}$ |
| 292 | $L_{A292}$ |
| 293 | $L_{A293}$ |
| 294 | $L_{A294}$ |
| 295 | $L_{A295}$ |
| 296 | $L_{A296}$ |
| 297 | $L_{A297}$ |
| 298 | $L_{A298}$ |
| 299 | $L_{A299}$ |
| 300 | $L_{A300}$ |
| 301 | $L_{A301}$ |
| 302 | $L_{A302}$ |
| 303 | $L_{A303}$ |
| 304 | $L_{A304}$ |
| 305 | $L_{A305}$ |
| 306 | $L_{A306}$ |
| 307 | $L_{A307}$ |
| 308 | $L_{A308}$ |
| 309 | $L_{A309}$ |
| 310 | $L_{A310}$ |
| 311 | $L_{A311}$ |
| 312 | $L_{A312}$ |
| 313 | $L_{A313}$ |
| 314 | $L_{A314}$ |
| 315 | $L_{A315}$ |
| 316 | $L_{A316}$ |
| 317 | $L_{A317}$ |
| 318 | $L_{A318}$ |
| 319 | $L_{A319}$ |
| 320 | $L_{A320}$ |
| 321 | $L_{A321}$ |
| 322 | $L_{A322}$ |
| 323 | $L_{A323}$ |
| 324 | $L_{A324}$ |
| 325 | $L_{A325}$ |
| 326 | $L_{A326}$ |

TABLE 1-continued

| Compound Number | $L_A$ |
|---|---|
| 327 | $L_{A327}$ |
| 328 | $L_{A328}$ |
| 329 | $L_{A329}$ |
| 330 | $L_{A330}$ |
| 331 | $L_{A331}$ |
| 332 | $L_{A332}$ |
| 333 | $L_{A333}$ |
| 334 | $L_{A334}$ |
| 335 | $L_{A335}$ |
| 336 | $L_{A336}$ |
| 337 | $L_{A337}$ |
| 338 | $L_{A338}$ |
| 339 | $L_{A339}$ |
| 340 | $L_{A340}$ |
| 341 | $L_{A341}$ |
| 342 | $L_{A342}$ |
| 343 | $L_{A343}$ |
| 344 | $L_{A344}$ |
| 345 | $L_{A345}$ |
| 346 | $L_{A346}$ |
| 347 | $L_{A347}$ |
| 348 | $L_{A348}$ |
| 349 | $L_{A349}$ |
| 350 | $L_{A350}$ |
| 351 | $L_{A351}$ |
| 352 | $L_{A352}$ |
| 353 | $L_{A353}$ |
| 354 | $L_{A354}$ |
| 355 | $L_{A355}$ |
| 356 | $L_{A356}$ |
| 357 | $L_{A357}$ |
| 358 | $L_{A358}$ |
| 359 | $L_{A359}$ |
| 360 | $L_{A360}$ |
| 361 | $L_{A361}$ |
| 362 | $L_{A362}$ |
| 363 | $L_{A363}$ |
| 364 | $L_{A364}$ |
| 365 | $L_{A365}$ |
| 366 | $L_{A366}$ |
| 367 | $L_{A367}$ |
| 368 | $L_{A368}$ |
| 369 | $L_{A369}$ |
| 370 | $L_{A370}$ |
| 371 | $L_{A371}$ |
| 372 | $L_{A372}$ |
| 373 | $L_{A373}$ |
| 374 | $L_{A374}$ |
| 375 | $L_{A375}$ |
| 376 | $L_{A376}$ |
| 377 | $L_{A377}$ |
| 378 | $L_{A378}$ |
| 379 | $L_{A379}$ |
| 380 | $L_{A380}$ |
| 381 | $L_{A381}$ |
| 382 | $L_{A382}$ |
| 383 | $L_{A383}$ |
| 384 | $L_{A384}$ |
| 385 | $L_{A385}$ |
| 386 | $L_{A386}$ |
| 387 | $L_{A387}$ |
| 388 | $L_{A388}$ |
| 389 | $L_{A389}$ |
| 390 | $L_{A390}$ |
| 391 | $L_{A391}$ |
| 392 | $L_{A392}$ |
| 393 | $L_{A393}$ |
| 394 | $L_{A394}$ |
| 395 | $L_{A395}$ |
| 396 | $L_{A396}$ |
| 397 | $L_{A397}$ |
| 398 | $L_{A398}$ |
| 399 | $L_{A399}$ |
| 400 | $L_{A400}$ |
| 401 | $L_{A401}$ |
| 402 | $L_{A402}$ |
| 403 | $L_{A403}$ |

TABLE 1-continued

| Compound Number | $L_A$ |
|---|---|
| 404 | $L_{A404}$ |
| 405 | $L_{A405}$ |
| 406 | $L_{A406}$ |
| 407 | $L_{A407}$ |
| 408 | $L_{A408}$ |
| 409 | $L_{A409}$ |
| 410 | $L_{A410}$ |
| 411 | $L_{A411}$ |
| 412 | $L_{A412}$ |
| 413 | $L_{A413}$ |
| 414 | $L_{A414}$ |
| 415 | $L_{A415}$ |
| 416 | $L_{A416}$ |
| 417 | $L_{A417}$ |
| 418 | $L_{A418}$ |
| 419 | $L_{A419}$ |
| 420 | $L_{A420}$ |
| 421 | $L_{A421}$ |
| 422 | $L_{A422}$ |
| 423 | $L_{A423}$ |
| 424 | $L_{A424}$ |
| 425 | $L_{A425}$ |
| 426 | $L_{A426}$ |
| 427 | $L_{A427}$ |
| 428 | $L_{A428}$ |
| 429 | $L_{A429}$ |
| 430 | $L_{A430}$ |
| 431 | $L_{A431}$ |
| 432 | $L_{A432}$ |
| 433 | $L_{A433}$ |
| 434 | $L_{A434}$ |
| 435 | $L_{A435}$ |
| 436 | $L_{A436}$ |
| 437 | $L_{A437}$ |
| 438 | $L_{A438}$ |
| 439 | $L_{A439}$ |
| 440 | $L_{A440}$ |
| 441 | $L_{A441}$ |
| 442 | $L_{A442}$ |
| 443 | $L_{A443}$ |
| 444 | $L_{A444}$ |
| 445 | $L_{A445}$ |
| 446 | $L_{A446}$ |
| 447 | $L_{A447}$ |
| 448 | $L_{A448}$ |
| 449 | $L_{A449}$ |
| 450 | $L_{A450}$ |
| 451 | $L_{A451}$ |
| 452 | $L_{A452}$ |
| 453 | $L_{A453}$ |
| 454 | $L_{A454}$ |
| 455 | $L_{A455}$ |
| 456 | $L_{A456}$ |
| 457 | $L_{A457}$ |
| 458 | $L_{A458}$ |
| 459 | $L_{A459}$ |
| 460 | $L_{A460}$ |
| 461 | $L_{A461}$ |
| 462 | $L_{A462}$ |
| 463 | $L_{A463}$ |
| 464 | $L_{A464}$ |
| 465 | $L_{A465}$ |
| 466 | $L_{A466}$ |
| 467 | $L_{A467}$ |
| 468 | $L_{A468}$ |
| 469 | $L_{A469}$ |
| 470 | $L_{A470}$ |
| 471 | $L_{A471}$ |
| 472 | $L_{A472}$ |
| 473 | $L_{A473}$ |
| 474 | $L_{A474}$ |
| 475 | $L_{A475}$ |
| 476 | $L_{A476}$ |
| 477 | $L_{A477}$ |
| 478 | $L_{A478}$ |
| 479 | $L_{A479}$ |
| 480 | $L_{A480}$ |

TABLE 1-continued

| Compound Number | $L_A$ |
|---|---|
| 481 | $L_{A481}$ |
| 482 | $L_{A482}$ |
| 483 | $L_{A483}$ |
| 484 | $L_{A484}$ |
| 485 | $L_{A485}$ |
| 486 | $L_{A486}$ |
| 487 | $L_{A487}$ |
| 488 | $L_{A488}$ |
| 489 | $L_{A489}$ |
| 490 | $L_{A490}$ |
| 491 | $L_{A491}$ |
| 492 | $L_{A492}$ |
| 493 | $L_{A493}$ |
| 494 | $L_{A494}$ |
| 495 | $L_{A495}$ |
| 496 | $L_{A496}$ |
| 497 | $L_{A497}$ |
| 498 | $L_{A498}$ |
| 499 | $L_{A499}$ |
| 500 | $L_{A500}$ |
| 501 | $L_{A501}$ |
| 502 | $L_{A502}$ |
| 503 | $L_{A503}$ |
| 504 | $L_{A504}$ |
| 505 | $L_{A505}$ |
| 506 | $L_{A506}$ |
| 507 | $L_{A507}$ |
| 508 | $L_{A508}$ |
| 509 | $L_{A509}$ |
| 510 | $L_{A510}$ |
| 511 | $L_{A511}$ |
| 512 | $L_{A512}$ |
| 513 | $L_{A513}$ |
| 514 | $L_{A514}$ |
| 515 | $L_{A515}$ |
| 516 | $L_{A516}$ |
| 517 | $L_{A517}$ |
| 518 | $L_{A518}$ |
| 519 | $L_{A519}$ |
| 520 | $L_{A520}$ |
| 521 | $L_{A521}$ |
| 522 | $L_{A522}$ |
| 523 | $L_{A523}$ |
| 524 | $L_{A524}$ |
| 525 | $L_{A525}$ |
| 526 | $L_{A526}$ |
| 527 | $L_{A527}$ |
| 528 | $L_{A528}$ |
| 529 | $L_{A529}$ |
| 530 | $L_{A530}$ |
| 531 | $L_{A531}$ |
| 532 | $L_{A532}$ |
| 533 | $L_{A533}$ |
| 534 | $L_{A534}$ |
| 535 | $L_{A535}$ |
| 536 | $L_{A536}$ |
| 537 | $L_{A537}$ |
| 538 | $L_{A538}$ |
| 539 | $L_{A539}$ |
| 540 | $L_{A540}$ |
| 541 | $L_{A541}$ |
| 542 | $L_{A542}$ |
| 543 | $L_{A543}$ |
| 544 | $L_{A544}$ |
| 545 | $L_{A545}$ |
| 546 | $L_{A546}$ |
| 547 | $L_{A547}$ |
| 548 | $L_{A548}$ |
| 549 | $L_{A549}$ |
| 550 | $L_{A550}$ |
| 551 | $L_{A551}$ |
| 552 | $L_{A552}$ |
| 553 | $L_{A553}$ |
| 554 | $L_{A554}$ |
| 555 | $L_{A555}$ |
| 556 | $L_{A556}$ |
| 557 | $L_{A557}$ |

TABLE 1-continued

| Compound Number | $L_A$ |
|---|---|
| 558 | $L_{A558}$ |
| 559 | $L_{A559}$ |
| 560 | $L_{A560}$ |
| 561 | $L_{A561}$ |
| 562 | $L_{A562}$ |
| 563 | $L_{A563}$ |
| 564 | $L_{A564}$ |
| 565 | $L_{A565}$ |
| 566 | $L_{A566}$ |
| 567 | $L_{A567}$ |
| 568 | $L_{A568}$ |
| 569 | $L_{A569}$ |
| 570 | $L_{A570}$ |
| 571 | $L_{A571}$ |
| 572 | $L_{A572}$ |
| 573 | $L_{A573}$ |
| 574 | $L_{A574}$ |
| 575 | $L_{A575}$ |
| 576 | $L_{A576}$ |
| 577 | $L_{A577}$ |
| 578 | $L_{A578}$ |
| 579 | $L_{A579}$ |
| 580 | $L_{A580}$ |
| 581 | $L_{A581}$ |
| 582 | $L_{A582}$ |
| 583 | $L_{A583}$ |
| 584 | $L_{A584}$ |
| 585 | $L_{A585}$ |
| 586 | $L_{A586}$ |
| 587 | $L_{A587}$ |
| 588 | $L_{A588}$ |
| 589 | $L_{A589}$ |
| 590 | $L_{A590}$ |
| 591 | $L_{A591}$ |
| 592 | $L_{A592}$ |
| 593 | $L_{A593}$ |
| 594 | $L_{A594}$ |
| 595 | $L_{A595}$ |
| 596 | $L_{A596}$ |
| 597 | $L_{A597}$ |
| 598 | $L_{A598}$ |
| 599 | $L_{A599}$ |
| 600 | $L_{A600}$ |
| 601 | $L_{A601}$ |
| 602 | $L_{A602}$ |
| 603 | $L_{A603}$ |
| 604 | $L_{A604}$ |
| 605 | $L_{A605}$ |
| 606 | $L_{A606}$ |
| 607 | $L_{A607}$ |
| 608 | $L_{A608}$ |
| 609 | $L_{A609}$ |
| 610 | $L_{A610}$ |
| 611 | $L_{A611}$ |
| 612 | $L_{A612}$ |
| 613 | $L_{A613}$ |
| 614 | $L_{A614}$ |
| 615 | $L_{A615}$ |
| 616 | $L_{A616}$ |
| 617 | $L_{A617}$ |
| 618 | $L_{A618}$ |
| 619 | $L_{A619}$ |
| 620 | $L_{A620}$ |
| 621 | $L_{A621}$ |
| 622 | $L_{A622}$ |
| 623 | $L_{A623}$ |
| 624 | $L_{A624}$ |
| 625 | $L_{A625}$ |
| 626 | $L_{A626}$ |
| 627 | $L_{A627}$ |
| 628 | $L_{A628}$ |
| 629 | $L_{A629}$ |
| 630 | $L_{A630}$ |
| 631 | $L_{A631}$ |
| 632 | $L_{A632}$ |
| 633 | $L_{A633}$ |
| 634 | $L_{A634}$ |

TABLE 1-continued

| Compound Number | $L_A$ |
|---|---|
| 635 | $L_{A635}$ |
| 636 | $L_{A636}$ |
| 637 | $L_{A637}$ |
| 638 | $L_{A638}$ |
| 639 | $L_{A639}$ |
| 640 | $L_{A640}$ |
| 641 | $L_{A641}$ |
| 642 | $L_{A642}$ |
| 643 | $L_{A643}$ |
| 644 | $L_{A644}$ |
| 645 | $L_{A645}$ |
| 646 | $L_{A646}$ |
| 647 | $L_{A647}$ |
| 648 | $L_{A648}$ |
| 649 | $L_{A649}$ |
| 650 | $L_{A650}$ |
| 651 | $L_{A651}$ |
| 652 | $L_{A652}$ |
| 653 | $L_{A653}$ |
| 654 | $L_{A654}$ |
| 655 | $L_{A655}$ |
| 656 | $L_{A656}$ |
| 657 | $L_{A657}$ |
| 658 | $L_{A658}$ |
| 659 | $L_{A659}$ |
| 660 | $L_{A660}$ |
| 661 | $L_{A661}$ |
| 662 | $L_{A662}$ |
| 663 | $L_{A663}$ |
| 664 | $L_{A664}$ |
| 665 | $L_{A665}$ |
| 666 | $L_{A666}$ |
| 667 | $L_{A667}$ |
| 668 | $L_{A668}$ |
| 669 | $L_{A669}$ |
| 670 | $L_{A670}$ |
| 671 | $L_{A671}$ |
| 672 | $L_{A672}$ |
| 673 | $L_{A673}$ |
| 674 | $L_{A674}$ |
| 675 | $L_{A675}$ |
| 676 | $L_{A676}$ |
| 677 | $L_{A677}$ |
| 678 | $L_{A678}$ |
| 679 | $L_{A679}$ |
| 680 | $L_{A680}$ |
| 681 | $L_{A681}$ |
| 682 | $L_{A682}$ |
| 683 | $L_{A683}$ |
| 684 | $L_{A684}$ |
| 685 | $L_{A685}$ |
| 686 | $L_{A686}$ |
| 687 | $L_{A687}$ |
| 688 | $L_{A688}$ |
| 689 | $L_{A689}$ |
| 690 | $L_{A690}$ |
| 691 | $L_{A691}$ |
| 692 | $L_{A692}$ |
| 693 | $L_{A693}$ |
| 694 | $L_{A694}$ |
| 695 | $L_{A695}$ |
| 696 | $L_{A696}$ |
| 697 | $L_{A697}$ |
| 698 | $L_{A698}$ |
| 699 | $L_{A699}$ |
| 700 | $L_{A700}$ |
| 701 | $L_{A701}$ |
| 702 | $L_{A702}$ |
| 703 | $L_{A703}$ |
| 704 | $L_{A704}$ |
| 705 | $L_{A705}$ |
| 706 | $L_{A706}$ |
| 707 | $L_{A707}$ |
| 708 | $L_{A708}$ |
| 709 | $L_{A709}$ |
| 710 | $L_{A710}$ |
| 711 | $L_{A711}$ |

TABLE 1-continued

| Compound Number | $L_A$ |
|---|---|
| 712 | $L_{A712}$ |
| 713 | $L_{A713}$ |
| 714 | $L_{A714}$ |
| 715 | $L_{A715}$ |
| 716 | $L_{A716}$ |
| 717 | $L_{A717}$ |
| 718 | $L_{A718}$ |
| 719 | $L_{A719}$ |
| 720 | $L_{A720}$ |
| 721 | $L_{A721}$ |
| 722 | $L_{A722}$ |
| 723 | $L_{A723}$ |
| 724 | $L_{A724}$ |
| 725 | $L_{A725}$ |
| 726 | $L_{A726}$ |
| 727 | $L_{A727}$ |
| 728 | $L_{A728}$ |
| 729 | $L_{A729}$ |
| 730 | $L_{A730}$ |
| 731 | $L_{A731}$ |
| 732 | $L_{A732}$ |
| 733 | $L_{A733}$ |
| 734 | $L_{A734}$ |
| 735 | $L_{A735}$ |
| 736 | $L_{A736}$ |
| 737 | $L_{A737}$ |
| 738 | $L_{A738}$ |
| 739 | $L_{A739}$ |
| 740 | $L_{A740}$ |
| 741 | $L_{A741}$ |
| 742 | $L_{A742}$ |
| 743 | $L_{A743}$ |
| 744 | $L_{A744}$ |
| 745 | $L_{A745}$ |
| 746 | $L_{A746}$ |
| 747 | $L_{A747}$ |
| 748 | $L_{A748}$ |
| 749 | $L_{A749}$ |
| 750 | $L_{A750}$ |
| 751 | $L_{A751}$ |
| 752 | $L_{A752}$ |
| 753 | $L_{A753}$ |
| 754 | $L_{A754}$ |
| 755 | $L_{A755}$ |
| 756 | $L_{A756}$ |
| 757 | $L_{A757}$ |
| 758 | $L_{A758}$ |
| 759 | $L_{A759}$ |
| 760 | $L_{A760}$ |
| 761 | $L_{A761}$ |
| 762 | $L_{A762}$ |
| 763 | $L_{A763}$ |
| 764 | $L_{A764}$ |
| 765 | $L_{A765}$ |
| 766 | $L_{A766}$ |
| 767 | $L_{A767}$ |
| 768 | $L_{A768}$ |
| 769 | $L_{A769}$ |
| 770 | $L_{A770}$ |
| 771 | $L_{A771}$ |
| 772 | $L_{A772}$ |
| 773 | $L_{A773}$ |
| 774 | $L_{A774}$ |
| 775 | $L_{A775}$ |
| 776 | $L_{A776}$ |
| 777 | $L_{A777}$ |
| 778 | $L_{A778}$ |
| 779 | $L_{A779}$ |
| 780 | $L_{A780}$ |
| 781 | $L_{A781}$ |
| 782 | $L_{A782}$ |
| 783 | $L_{A783}$ |
| 784 | $L_{A784}$ |
| 785 | $L_{A785}$ |
| 786 | $L_{A786}$ |
| 787 | $L_{A787}$ |
| 788 | $L_{A788}$ |

TABLE 1-continued

| Compound Number | $L_A$ |
|---|---|
| 789 | $L_{A789}$ |
| 790 | $L_{A790}$ |
| 791 | $L_{A791}$ |
| 792 | $L_{A792}$ |
| 793 | $L_{A793}$ |
| 794 | $L_{A794}$ |
| 795 | $L_{A795}$ |
| 796 | $L_{A796}$ |
| 797 | $L_{A797}$ |
| 798 | $L_{A798}$ |
| 799 | $L_{A799}$ |
| 800 | $L_{A800}$ |
| 801 | $L_{A801}$ |
| 802 | $L_{A802}$ |
| 803 | $L_{A803}$ |
| 804 | $L_{A804}$ |
| 805 | $L_{A805}$ |
| 806 | $L_{A806}$ |
| 807 | $L_{A807}$ |
| 808 | $L_{A808}$ |
| 809 | $L_{A809}$ |
| 810 | $L_{A810}$ |
| 811 | $L_{A811}$ |
| 812 | $L_{A812}$ |
| 813 | $L_{A813}$ |
| 814 | $L_{A814}$ |
| 815 | $L_{A815}$ |
| 816 | $L_{A816}$ |
| 817 | $L_{A817}$ |
| 818 | $L_{A818}$ |
| 819 | $L_{A819}$ |
| 820 | $L_{A820}$ |
| 821 | $L_{A821}$ |
| 822 | $L_{A822}$ |
| 823 | $L_{A823}$ |
| 824 | $L_{A824}$ |
| 825 | $L_{A825}$ |
| 826 | $L_{A826}$ |
| 827 | $L_{A827}$ |
| 828 | $L_{A828}$ |
| 829 | $L_{A829}$ |
| 830 | $L_{A830}$ |
| 831 | $L_{A831}$ |
| 832 | $L_{A832}$ |
| 833 | $L_{A833}$ |
| 834 | $L_{A834}$ |
| 835 | $L_{A835}$ |
| 836 | $L_{A836}$ |
| 837 | $L_{A837}$ |
| 838 | $L_{A838}$ |
| 839 | $L_{A839}$ |
| 840 | $L_{A840}$ |
| 841 | $L_{A841}$ |
| 842 | $L_{A842}$ |
| 843 | $L_{A843}$ |
| 844 | $L_{A844}$ |
| 845 | $L_{A845}$ |
| 846 | $L_{A846}$ |
| 847 | $L_{A847}$ |
| 848 | $L_{A848}$ |
| 849 | $L_{A849}$ |
| 850 | $L_{A850}$ |
| 851 | $L_{A851}$ |
| 852 | $L_{A852}$ |
| 853 | $L_{A853}$ |
| 854 | $L_{A854}$ |
| 855 | $L_{A855}$ |
| 856 | $L_{A856}$ |
| 857 | $L_{A857}$ |
| 858 | $L_{A858}$ |
| 859 | $L_{A859}$ |
| 860 | $L_{A860}$ |
| 861 | $L_{A861}$ |
| 862 | $L_{A862}$ |
| 863 | $L_{A863}$ |
| 864 | $L_{A864}$ |
| 865 | $L_{A865}$ |

TABLE 1-continued

| Compound Number | $L_A$ |
|---|---|
| 866 | $L_{A866}$ |
| 867 | $L_{A867}$ |
| 868 | $L_{A868}$ |
| 869 | $L_{A869}$ |
| 870 | $L_{A870}$ |
| 871 | $L_{A871}$ |
| 872 | $L_{A872}$ |
| 873 | $L_{A873}$ |
| 874 | $L_{A874}$ |
| 875 | $L_{A875}$ |
| 876 | $L_{A876}$ |
| 877 | $L_{A877}$ |
| 878 | $L_{A878}$ |
| 879 | $L_{A879}$ |
| 880 | $L_{A880}$ |
| 881 | $L_{A881}$ |
| 882 | $L_{A882}$ |
| 883 | $L_{A883}$ |
| 884 | $L_{A884}$ |
| 885 | $L_{A885}$ |
| 886 | $L_{A886}$ |
| 887 | $L_{A887}$ |
| 888 | $L_{A888}$ |
| 889 | $L_{A889}$ |
| 890 | $L_{A890}$ |
| 891 | $L_{A891}$ |
| 892 | $L_{A892}$ |
| 893 | $L_{A893}$ |
| 894 | $L_{A894}$ |
| 895 | $L_{A895}$ |
| 896 | $L_{A896}$ |
| 897 | $L_{A897}$ |
| 898 | $L_{A898}$ |
| 899 | $L_{A899}$ |
| 900 | $L_{A900}$ |
| 901 | $L_{A901}$ |
| 902 | $L_{A902}$ |
| 903 | $L_{A903}$ |
| 904 | $L_{A904}$ |
| 905 | $L_{A905}$ |
| 906 | $L_{A906}$ |
| 907 | $L_{A907}$ |
| 908 | $L_{A908}$ |
| 909 | $L_{A909}$ |
| 910 | $L_{A910}$ |
| 911 | $L_{A911}$ |
| 912 | $L_{A912}$ |
| 913 | $L_{A913}$ |
| 914 | $L_{A914}$ |
| 915 | $L_{A915}$ |
| 916 | $L_{A916}$ |
| 917 | $L_{A917}$ |
| 918 | $L_{A918}$ |
| 919 | $L_{A919}$ |
| 920 | $L_{A920}$ |
| 921 | $L_{A921}$ |
| 922 | $L_{A922}$ |
| 923 | $L_{A923}$ |
| 924 | $L_{A924}$ |
| 925 | $L_{A925}$ |
| 926 | $L_{A926}$ |
| 927 | $L_{A927}$ |
| 928 | $L_{A928}$ |
| 929 | $L_{A929}$ |
| 930 | $L_{A930}$ |
| 931 | $L_{A931}$ |
| 932 | $L_{A932}$ |
| 933 | $L_{A933}$ |
| 934 | $L_{A934}$ |
| 935 | $L_{A935}$ |
| 936 | $L_{A936}$ |
| 937 | $L_{A937}$ |
| 938 | $L_{A938}$ |
| 939 | $L_{A939}$ |
| 940 | $L_{A940}$ |
| 941 | $L_{A941}$ |
| 942 | $L_{A942}$ |

TABLE 1-continued

| Compound Number | $L_A$ |
|---|---|
| 943 | $L_{A943}$ |
| 944 | $L_{A944}$ |
| 945 | $L_{A945}$ |
| 946 | $L_{A946}$ |
| 947 | $L_{A947}$ |
| 948 | $L_{A948}$ |
| 949 | $L_{A949}$ |
| 950 | $L_{A950}$ |
| 951 | $L_{A951}$ |
| 952 | $L_{A952}$ |
| 953 | $L_{A953}$ |
| 954 | $L_{A954}$ |
| 955 | $L_{A955}$ |
| 956 | $L_{A956}$ |
| 957 | $L_{A957}$ |
| 958 | $L_{A958}$ |
| 959 | $L_{A959}$ |
| 960 | $L_{A960}$ |

In some embodiments, the compound has formula V:

$$(L_A)_1Ir(L_B)_2 \quad (V);$$

and is selected from the group consisting of compound 961 to compound 5760 listed in TABLE 2.

TABLE 2

| Compound Number | $L_A$ | $L_B$ |
|---|---|---|
| 961 | $L_{A1}$ | $L_{B1}$ |
| 962 | $L_{A2}$ | $L_{B1}$ |
| 963 | $L_{A3}$ | $L_{B1}$ |
| 964 | $L_{A4}$ | $L_{B1}$ |
| 965 | $L_{A5}$ | $L_{B1}$ |
| 966 | $L_{A6}$ | $L_{B1}$ |
| 967 | $L_{A7}$ | $L_{B1}$ |
| 968 | $L_{A8}$ | $L_{B1}$ |
| 969 | $L_{A9}$ | $L_{B1}$ |
| 970 | $L_{A10}$ | $L_{B1}$ |
| 971 | $L_{A11}$ | $L_{B1}$ |
| 972 | $L_{A12}$ | $L_{B1}$ |
| 973 | $L_{A13}$ | $L_{B1}$ |
| 974 | $L_{A14}$ | $L_{B1}$ |
| 975 | $L_{A15}$ | $L_{B1}$ |
| 976 | $L_{A16}$ | $L_{B1}$ |
| 977 | $L_{A17}$ | $L_{B1}$ |
| 978 | $L_{A18}$ | $L_{B1}$ |
| 979 | $L_{A19}$ | $L_{B1}$ |
| 980 | $L_{A20}$ | $L_{B1}$ |
| 981 | $L_{A21}$ | $L_{B1}$ |
| 982 | $L_{A22}$ | $L_{B1}$ |
| 983 | $L_{A23}$ | $L_{B1}$ |
| 984 | $L_{A24}$ | $L_{B1}$ |
| 985 | $L_{A25}$ | $L_{B1}$ |
| 986 | $L_{A26}$ | $L_{B1}$ |
| 987 | $L_{A27}$ | $L_{B1}$ |
| 988 | $L_{A28}$ | $L_{B1}$ |
| 989 | $L_{A29}$ | $L_{B1}$ |
| 990 | $L_{A30}$ | $L_{B1}$ |
| 991 | $L_{A31}$ | $L_{B1}$ |
| 992 | $L_{A32}$ | $L_{B1}$ |
| 993 | $L_{A33}$ | $L_{B1}$ |
| 994 | $L_{A34}$ | $L_{B1}$ |
| 995 | $L_{A35}$ | $L_{B1}$ |
| 996 | $L_{A36}$ | $L_{B1}$ |
| 997 | $L_{A37}$ | $L_{B1}$ |
| 998 | $L_{A38}$ | $L_{B1}$ |
| 999 | $L_{A39}$ | $L_{B1}$ |
| 1000 | $L_{A40}$ | $L_{B1}$ |
| 1001 | $L_{A41}$ | $L_{B1}$ |
| 1002 | $L_{A42}$ | $L_{B1}$ |
| 1003 | $L_{A43}$ | $L_{B1}$ |
| 1004 | $L_{A44}$ | $L_{B1}$ |
| 1005 | $L_{A45}$ | $L_{B1}$ |

TABLE 2-continued

| Compound Number | $L_A$ | $L_B$ |
|---|---|---|
| 1006 | $L_{A46}$ | $L_{B1}$ |
| 1007 | $L_{A47}$ | $L_{B1}$ |
| 1008 | $L_{A48}$ | $L_{B1}$ |
| 1009 | $L_{A49}$ | $L_{B1}$ |
| 1010 | $L_{A50}$ | $L_{B1}$ |
| 1011 | $L_{A51}$ | $L_{B1}$ |
| 1012 | $L_{A52}$ | $L_{B1}$ |
| 1013 | $L_{A53}$ | $L_{B1}$ |
| 1014 | $L_{A54}$ | $L_{B1}$ |
| 1015 | $L_{A55}$ | $L_{B1}$ |
| 1016 | $L_{A56}$ | $L_{B1}$ |
| 1017 | $L_{A57}$ | $L_{B1}$ |
| 1018 | $L_{A58}$ | $L_{B1}$ |
| 1019 | $L_{A59}$ | $L_{B1}$ |
| 1020 | $L_{A60}$ | $L_{B1}$ |
| 1021 | $L_{A61}$ | $L_{B1}$ |
| 1022 | $L_{A62}$ | $L_{B1}$ |
| 1023 | $L_{A63}$ | $L_{B1}$ |
| 1024 | $L_{A64}$ | $L_{B1}$ |
| 1025 | $L_{A65}$ | $L_{B1}$ |
| 1026 | $L_{A66}$ | $L_{B1}$ |
| 1027 | $L_{A67}$ | $L_{B1}$ |
| 1028 | $L_{A68}$ | $L_{B1}$ |
| 1029 | $L_{A69}$ | $L_{B1}$ |
| 1030 | $L_{A70}$ | $L_{B1}$ |
| 1031 | $L_{A71}$ | $L_{B1}$ |
| 1032 | $L_{A72}$ | $L_{B1}$ |
| 1033 | $L_{A73}$ | $L_{B1}$ |
| 1034 | $L_{A74}$ | $L_{B1}$ |
| 1035 | $L_{A75}$ | $L_{B1}$ |
| 1036 | $L_{A76}$ | $L_{B1}$ |
| 1037 | $L_{A77}$ | $L_{B1}$ |
| 1038 | $L_{A78}$ | $L_{B1}$ |
| 1039 | $L_{A79}$ | $L_{B1}$ |
| 1040 | $L_{A80}$ | $L_{B1}$ |
| 1041 | $L_{A81}$ | $L_{B1}$ |
| 1042 | $L_{A82}$ | $L_{B1}$ |
| 1043 | $L_{A83}$ | $L_{B1}$ |
| 1044 | $L_{A84}$ | $L_{B1}$ |
| 1045 | $L_{A85}$ | $L_{B1}$ |
| 1046 | $L_{A86}$ | $L_{B1}$ |
| 1047 | $L_{A87}$ | $L_{B1}$ |
| 1048 | $L_{A88}$ | $L_{B1}$ |
| 1049 | $L_{A89}$ | $L_{B1}$ |
| 1050 | $L_{A90}$ | $L_{B1}$ |
| 1051 | $L_{A91}$ | $L_{B1}$ |
| 1052 | $L_{A92}$ | $L_{B1}$ |
| 1053 | $L_{A93}$ | $L_{B1}$ |
| 1054 | $L_{A94}$ | $L_{B1}$ |
| 1055 | $L_{A95}$ | $L_{B1}$ |
| 1056 | $L_{A96}$ | $L_{B1}$ |
| 1057 | $L_{A97}$ | $L_{B1}$ |
| 1058 | $L_{A98}$ | $L_{B1}$ |
| 1059 | $L_{A99}$ | $L_{B1}$ |
| 1060 | $L_{A100}$ | $L_{B1}$ |
| 1061 | $L_{A101}$ | $L_{B1}$ |
| 1062 | $L_{A102}$ | $L_{B1}$ |
| 1063 | $L_{A103}$ | $L_{B1}$ |
| 1064 | $L_{A104}$ | $L_{B1}$ |
| 1065 | $L_{A105}$ | $L_{B1}$ |
| 1066 | $L_{A106}$ | $L_{B1}$ |
| 1067 | $L_{A107}$ | $L_{B1}$ |
| 1068 | $L_{A108}$ | $L_{B1}$ |
| 1069 | $L_{A109}$ | $L_{B1}$ |
| 1070 | $L_{A110}$ | $L_{B1}$ |
| 1071 | $L_{A111}$ | $L_{B1}$ |
| 1072 | $L_{A112}$ | $L_{B1}$ |
| 1073 | $L_{A113}$ | $L_{B1}$ |
| 1074 | $L_{A114}$ | $L_{B1}$ |
| 1075 | $L_{A115}$ | $L_{B1}$ |
| 1076 | $L_{A116}$ | $L_{B1}$ |
| 1077 | $L_{A117}$ | $L_{B1}$ |
| 1078 | $L_{A118}$ | $L_{B1}$ |
| 1079 | $L_{A119}$ | $L_{B1}$ |
| 1080 | $L_{A120}$ | $L_{B1}$ |
| 1081 | $L_{A121}$ | $L_{B1}$ |
| 1082 | $L_{A122}$ | $L_{B1}$ |

TABLE 2-continued

| Compound Number | $L_A$ | $L_B$ |
|---|---|---|
| 1083 | $L_{A123}$ | $L_{B1}$ |
| 1084 | $L_{A124}$ | $L_{B1}$ |
| 1085 | $L_{A125}$ | $L_{B1}$ |
| 1086 | $L_{A126}$ | $L_{B1}$ |
| 1087 | $L_{A127}$ | $L_{B1}$ |
| 1088 | $L_{A128}$ | $L_{B1}$ |
| 1089 | $L_{A129}$ | $L_{B1}$ |
| 1090 | $L_{A130}$ | $L_{B1}$ |
| 1091 | $L_{A131}$ | $L_{B1}$ |
| 1092 | $L_{A132}$ | $L_{B1}$ |
| 1093 | $L_{A133}$ | $L_{B1}$ |
| 1094 | $L_{A134}$ | $L_{B1}$ |
| 1095 | $L_{A135}$ | $L_{B1}$ |
| 1096 | $L_{A136}$ | $L_{B1}$ |
| 1097 | $L_{A137}$ | $L_{B1}$ |
| 1098 | $L_{A138}$ | $L_{B1}$ |
| 1099 | $L_{A139}$ | $L_{B1}$ |
| 1100 | $L_{A140}$ | $L_{B1}$ |
| 1101 | $L_{A141}$ | $L_{B1}$ |
| 1102 | $L_{A142}$ | $L_{B1}$ |
| 1103 | $L_{A143}$ | $L_{B1}$ |
| 1104 | $L_{A144}$ | $L_{B1}$ |
| 1105 | $L_{A145}$ | $L_{B1}$ |
| 1106 | $L_{A146}$ | $L_{B1}$ |
| 1107 | $L_{A147}$ | $L_{B1}$ |
| 1108 | $L_{A148}$ | $L_{B1}$ |
| 1109 | $L_{A149}$ | $L_{B1}$ |
| 1110 | $L_{A150}$ | $L_{B1}$ |
| 1111 | $L_{A151}$ | $L_{B1}$ |
| 1112 | $L_{A152}$ | $L_{B1}$ |
| 1113 | $L_{A153}$ | $L_{B1}$ |
| 1114 | $L_{A154}$ | $L_{B1}$ |
| 1115 | $L_{A155}$ | $L_{B1}$ |
| 1116 | $L_{A156}$ | $L_{B1}$ |
| 1117 | $L_{A157}$ | $L_{B1}$ |
| 1118 | $L_{A158}$ | $L_{B1}$ |
| 1119 | $L_{A159}$ | $L_{B1}$ |
| 1120 | $L_{A160}$ | $L_{B1}$ |
| 1121 | $L_{A161}$ | $L_{B1}$ |
| 1122 | $L_{A162}$ | $L_{B1}$ |
| 1123 | $L_{A163}$ | $L_{B1}$ |
| 1124 | $L_{A164}$ | $L_{B1}$ |
| 1125 | $L_{A165}$ | $L_{B1}$ |
| 1126 | $L_{A166}$ | $L_{B1}$ |
| 1127 | $L_{A167}$ | $L_{B1}$ |
| 1128 | $L_{A168}$ | $L_{B1}$ |
| 1129 | $L_{A169}$ | $L_{B1}$ |
| 1130 | $L_{A170}$ | $L_{B1}$ |
| 1131 | $L_{A171}$ | $L_{B1}$ |
| 1132 | $L_{A172}$ | $L_{B1}$ |
| 1133 | $L_{A173}$ | $L_{B1}$ |
| 1134 | $L_{A174}$ | $L_{B1}$ |
| 1135 | $L_{A175}$ | $L_{B1}$ |
| 1136 | $L_{A176}$ | $L_{B1}$ |
| 1137 | $L_{A177}$ | $L_{B1}$ |
| 1138 | $L_{A178}$ | $L_{B1}$ |
| 1139 | $L_{A179}$ | $L_{B1}$ |
| 1140 | $L_{A180}$ | $L_{B1}$ |
| 1141 | $L_{A181}$ | $L_{B1}$ |
| 1142 | $L_{A182}$ | $L_{B1}$ |
| 1143 | $L_{A183}$ | $L_{B1}$ |
| 1144 | $L_{A184}$ | $L_{B1}$ |
| 1145 | $L_{A185}$ | $L_{B1}$ |
| 1146 | $L_{A186}$ | $L_{B1}$ |
| 1147 | $L_{A187}$ | $L_{B1}$ |
| 1148 | $L_{A188}$ | $L_{B1}$ |
| 1149 | $L_{A189}$ | $L_{B1}$ |
| 1150 | $L_{A190}$ | $L_{B1}$ |
| 1151 | $L_{A191}$ | $L_{B1}$ |
| 1152 | $L_{A192}$ | $L_{B1}$ |
| 1153 | $L_{A193}$ | $L_{B1}$ |
| 1154 | $L_{A194}$ | $L_{B1}$ |
| 1155 | $L_{A195}$ | $L_{B1}$ |
| 1156 | $L_{A196}$ | $L_{B1}$ |
| 1157 | $L_{A197}$ | $L_{B1}$ |
| 1158 | $L_{A198}$ | $L_{B1}$ |
| 1159 | $L_{A199}$ | $L_{B1}$ |

TABLE 2-continued

| Compound Number | $L_A$ | $L_B$ |
|---|---|---|
| 1160 | $L_{A200}$ | $L_{B1}$ |
| 1161 | $L_{A201}$ | $L_{B1}$ |
| 1162 | $L_{A202}$ | $L_{B1}$ |
| 1163 | $L_{A203}$ | $L_{B1}$ |
| 1164 | $L_{A204}$ | $L_{B1}$ |
| 1165 | $L_{A205}$ | $L_{B1}$ |
| 1166 | $L_{A206}$ | $L_{B1}$ |
| 1167 | $L_{A207}$ | $L_{B1}$ |
| 1168 | $L_{A208}$ | $L_{B1}$ |
| 1169 | $L_{A209}$ | $L_{B1}$ |
| 1170 | $L_{A210}$ | $L_{B1}$ |
| 1171 | $L_{A211}$ | $L_{B1}$ |
| 1172 | $L_{A212}$ | $L_{B1}$ |
| 1173 | $L_{A213}$ | $L_{B1}$ |
| 1174 | $L_{A214}$ | $L_{B1}$ |
| 1175 | $L_{A215}$ | $L_{B1}$ |
| 1176 | $L_{A216}$ | $L_{B1}$ |
| 1177 | $L_{A217}$ | $L_{B1}$ |
| 1178 | $L_{A218}$ | $L_{B1}$ |
| 1179 | $L_{A219}$ | $L_{B1}$ |
| 1180 | $L_{A220}$ | $L_{B1}$ |
| 1181 | $L_{A221}$ | $L_{B1}$ |
| 1182 | $L_{A222}$ | $L_{B1}$ |
| 1183 | $L_{A223}$ | $L_{B1}$ |
| 1184 | $L_{A224}$ | $L_{B1}$ |
| 1185 | $L_{A225}$ | $L_{B1}$ |
| 1186 | $L_{A226}$ | $L_{B1}$ |
| 1187 | $L_{A227}$ | $L_{B1}$ |
| 1188 | $L_{A228}$ | $L_{B1}$ |
| 1189 | $L_{A229}$ | $L_{B1}$ |
| 1190 | $L_{A230}$ | $L_{B1}$ |
| 1191 | $L_{A231}$ | $L_{B1}$ |
| 1192 | $L_{A232}$ | $L_{B1}$ |
| 1193 | $L_{A233}$ | $L_{B1}$ |
| 1194 | $L_{A234}$ | $L_{B1}$ |
| 1195 | $L_{A235}$ | $L_{B1}$ |
| 1196 | $L_{A236}$ | $L_{B1}$ |
| 1197 | $L_{A237}$ | $L_{B1}$ |
| 1198 | $L_{A238}$ | $L_{B1}$ |
| 1199 | $L_{A239}$ | $L_{B1}$ |
| 1200 | $L_{A240}$ | $L_{B1}$ |
| 1201 | $L_{A241}$ | $L_{B1}$ |
| 1202 | $L_{A242}$ | $L_{B1}$ |
| 1203 | $L_{A243}$ | $L_{B1}$ |
| 1204 | $L_{A244}$ | $L_{B1}$ |
| 1205 | $L_{A245}$ | $L_{B1}$ |
| 1206 | $L_{A246}$ | $L_{B1}$ |
| 1207 | $L_{A247}$ | $L_{B1}$ |
| 1208 | $L_{A248}$ | $L_{B1}$ |
| 1209 | $L_{A249}$ | $L_{B1}$ |
| 1210 | $L_{A250}$ | $L_{B1}$ |
| 1211 | $L_{A251}$ | $L_{B1}$ |
| 1212 | $L_{A252}$ | $L_{B1}$ |
| 1213 | $L_{A253}$ | $L_{B1}$ |
| 1214 | $L_{A254}$ | $L_{B1}$ |
| 1215 | $L_{A255}$ | $L_{B1}$ |
| 1216 | $L_{A256}$ | $L_{B1}$ |
| 1217 | $L_{A257}$ | $L_{B1}$ |
| 1218 | $L_{A258}$ | $L_{B1}$ |
| 1219 | $L_{A259}$ | $L_{B1}$ |
| 1220 | $L_{A260}$ | $L_{B1}$ |
| 1221 | $L_{A261}$ | $L_{B1}$ |
| 1222 | $L_{A262}$ | $L_{B1}$ |
| 1223 | $L_{A263}$ | $L_{B1}$ |
| 1224 | $L_{A264}$ | $L_{B1}$ |
| 1225 | $L_{A265}$ | $L_{B1}$ |
| 1226 | $L_{A266}$ | $L_{B1}$ |
| 1227 | $L_{A267}$ | $L_{B1}$ |
| 1228 | $L_{A268}$ | $L_{B1}$ |
| 1229 | $L_{A269}$ | $L_{B1}$ |
| 1230 | $L_{A270}$ | $L_{B1}$ |
| 1231 | $L_{A271}$ | $L_{B1}$ |
| 1232 | $L_{A272}$ | $L_{B1}$ |
| 1233 | $L_{A273}$ | $L_{B1}$ |
| 1234 | $L_{A274}$ | $L_{B1}$ |
| 1235 | $L_{A275}$ | $L_{B1}$ |
| 1236 | $L_{A276}$ | $L_{B1}$ |

TABLE 2-continued

| Compound Number | $L_A$ | $L_B$ |
|---|---|---|
| 1237 | $L_{A277}$ | $L_{B1}$ |
| 1238 | $L_{A278}$ | $L_{B1}$ |
| 1239 | $L_{A279}$ | $L_{B1}$ |
| 1240 | $L_{A280}$ | $L_{B1}$ |
| 1241 | $L_{A281}$ | $L_{B1}$ |
| 1242 | $L_{A282}$ | $L_{B1}$ |
| 1243 | $L_{A283}$ | $L_{B1}$ |
| 1244 | $L_{A284}$ | $L_{B1}$ |
| 1245 | $L_{A285}$ | $L_{B1}$ |
| 1246 | $L_{A286}$ | $L_{B1}$ |
| 1247 | $L_{A287}$ | $L_{B1}$ |
| 1248 | $L_{A288}$ | $L_{B1}$ |
| 1249 | $L_{A289}$ | $L_{B1}$ |
| 1250 | $L_{A290}$ | $L_{B1}$ |
| 1251 | $L_{A291}$ | $L_{B1}$ |
| 1252 | $L_{A292}$ | $L_{B1}$ |
| 1253 | $L_{A293}$ | $L_{B1}$ |
| 1254 | $L_{A294}$ | $L_{B1}$ |
| 1255 | $L_{A295}$ | $L_{B1}$ |
| 1256 | $L_{A296}$ | $L_{B1}$ |
| 1257 | $L_{A297}$ | $L_{B1}$ |
| 1258 | $L_{A298}$ | $L_{B1}$ |
| 1259 | $L_{A299}$ | $L_{B1}$ |
| 1260 | $L_{A300}$ | $L_{B1}$ |
| 1261 | $L_{A301}$ | $L_{B1}$ |
| 1262 | $L_{A302}$ | $L_{B1}$ |
| 1263 | $L_{A303}$ | $L_{B1}$ |
| 1264 | $L_{A304}$ | $L_{B1}$ |
| 1265 | $L_{A305}$ | $L_{B1}$ |
| 1266 | $L_{A306}$ | $L_{B1}$ |
| 1267 | $L_{A307}$ | $L_{B1}$ |
| 1268 | $L_{A308}$ | $L_{B1}$ |
| 1269 | $L_{A309}$ | $L_{B1}$ |
| 1270 | $L_{A310}$ | $L_{B1}$ |
| 1271 | $L_{A311}$ | $L_{B1}$ |
| 1272 | $L_{A312}$ | $L_{B1}$ |
| 1273 | $L_{A313}$ | $L_{B1}$ |
| 1274 | $L_{A314}$ | $L_{B1}$ |
| 1275 | $L_{A315}$ | $L_{B1}$ |
| 1276 | $L_{A316}$ | $L_{B1}$ |
| 1277 | $L_{A317}$ | $L_{B1}$ |
| 1278 | $L_{A318}$ | $L_{B1}$ |
| 1279 | $L_{A319}$ | $L_{B1}$ |
| 1280 | $L_{A320}$ | $L_{B1}$ |
| 1281 | $L_{A321}$ | $L_{B1}$ |
| 1282 | $L_{A322}$ | $L_{B1}$ |
| 1283 | $L_{A323}$ | $L_{B1}$ |
| 1284 | $L_{A324}$ | $L_{B1}$ |
| 1285 | $L_{A325}$ | $L_{B1}$ |
| 1286 | $L_{A326}$ | $L_{B1}$ |
| 1287 | $L_{A327}$ | $L_{B1}$ |
| 1288 | $L_{A328}$ | $L_{B1}$ |
| 1289 | $L_{A329}$ | $L_{B1}$ |
| 1290 | $L_{A330}$ | $L_{B1}$ |
| 1291 | $L_{A331}$ | $L_{B1}$ |
| 1292 | $L_{A332}$ | $L_{B1}$ |
| 1293 | $L_{A333}$ | $L_{B1}$ |
| 1294 | $L_{A334}$ | $L_{B1}$ |
| 1295 | $L_{A335}$ | $L_{B1}$ |
| 1296 | $L_{A336}$ | $L_{B1}$ |
| 1297 | $L_{A337}$ | $L_{B1}$ |
| 1298 | $L_{A338}$ | $L_{B1}$ |
| 1299 | $L_{A339}$ | $L_{B1}$ |
| 1300 | $L_{A340}$ | $L_{B1}$ |
| 1301 | $L_{A341}$ | $L_{B1}$ |
| 1302 | $L_{A342}$ | $L_{B1}$ |
| 1303 | $L_{A343}$ | $L_{B1}$ |
| 1304 | $L_{A344}$ | $L_{B1}$ |
| 1305 | $L_{A345}$ | $L_{B1}$ |
| 1306 | $L_{A346}$ | $L_{B1}$ |
| 1307 | $L_{A347}$ | $L_{B1}$ |
| 1308 | $L_{A348}$ | $L_{B1}$ |
| 1309 | $L_{A349}$ | $L_{B1}$ |
| 1310 | $L_{A350}$ | $L_{B1}$ |
| 1311 | $L_{A351}$ | $L_{B1}$ |
| 1312 | $L_{A352}$ | $L_{B1}$ |
| 1313 | $L_{A353}$ | $L_{B1}$ |

TABLE 2-continued

| Compound Number | $L_A$ | $L_B$ |
|---|---|---|
| 1314 | $L_{A354}$ | $L_{B1}$ |
| 1315 | $L_{A355}$ | $L_{B1}$ |
| 1316 | $L_{A356}$ | $L_{B1}$ |
| 1317 | $L_{A357}$ | $L_{B1}$ |
| 1318 | $L_{A358}$ | $L_{B1}$ |
| 1319 | $L_{A359}$ | $L_{B1}$ |
| 1320 | $L_{A360}$ | $L_{B1}$ |
| 1321 | $L_{A361}$ | $L_{B1}$ |
| 1322 | $L_{A362}$ | $L_{B1}$ |
| 1323 | $L_{A363}$ | $L_{B1}$ |
| 1324 | $L_{A364}$ | $L_{B1}$ |
| 1325 | $L_{A365}$ | $L_{B1}$ |
| 1326 | $L_{A366}$ | $L_{B1}$ |
| 1327 | $L_{A367}$ | $L_{B1}$ |
| 1328 | $L_{A368}$ | $L_{B1}$ |
| 1329 | $L_{A369}$ | $L_{B1}$ |
| 1330 | $L_{A370}$ | $L_{B1}$ |
| 1331 | $L_{A371}$ | $L_{B1}$ |
| 1332 | $L_{A372}$ | $L_{B1}$ |
| 1333 | $L_{A373}$ | $L_{B1}$ |
| 1334 | $L_{A374}$ | $L_{B1}$ |
| 1335 | $L_{A375}$ | $L_{B1}$ |
| 1336 | $L_{A376}$ | $L_{B1}$ |
| 1337 | $L_{A377}$ | $L_{B1}$ |
| 1338 | $L_{A378}$ | $L_{B1}$ |
| 1339 | $L_{A379}$ | $L_{B1}$ |
| 1340 | $L_{A380}$ | $L_{B1}$ |
| 1341 | $L_{A381}$ | $L_{B1}$ |
| 1342 | $L_{A382}$ | $L_{B1}$ |
| 1343 | $L_{A383}$ | $L_{B1}$ |
| 1344 | $L_{A384}$ | $L_{B1}$ |
| 1345 | $L_{A385}$ | $L_{B1}$ |
| 1346 | $L_{A386}$ | $L_{B1}$ |
| 1347 | $L_{A387}$ | $L_{B1}$ |
| 1348 | $L_{A388}$ | $L_{B1}$ |
| 1349 | $L_{A389}$ | $L_{B1}$ |
| 1350 | $L_{A390}$ | $L_{B1}$ |
| 1351 | $L_{A391}$ | $L_{B1}$ |
| 1352 | $L_{A392}$ | $L_{B1}$ |
| 1353 | $L_{A393}$ | $L_{B1}$ |
| 1354 | $L_{A394}$ | $L_{B1}$ |
| 1355 | $L_{A395}$ | $L_{B1}$ |
| 1356 | $L_{A396}$ | $L_{B1}$ |
| 1357 | $L_{A397}$ | $L_{B1}$ |
| 1358 | $L_{A398}$ | $L_{B1}$ |
| 1359 | $L_{A399}$ | $L_{B1}$ |
| 1360 | $L_{A400}$ | $L_{B1}$ |
| 1361 | $L_{A401}$ | $L_{B1}$ |
| 1362 | $L_{A402}$ | $L_{B1}$ |
| 1363 | $L_{A403}$ | $L_{B1}$ |
| 1364 | $L_{A404}$ | $L_{B1}$ |
| 1365 | $L_{A405}$ | $L_{B1}$ |
| 1366 | $L_{A406}$ | $L_{B1}$ |
| 1367 | $L_{A407}$ | $L_{B1}$ |
| 1368 | $L_{A408}$ | $L_{B1}$ |
| 1369 | $L_{A409}$ | $L_{B1}$ |
| 1370 | $L_{A410}$ | $L_{B1}$ |
| 1371 | $L_{A411}$ | $L_{B1}$ |
| 1372 | $L_{A412}$ | $L_{B1}$ |
| 1373 | $L_{A413}$ | $L_{B1}$ |
| 1374 | $L_{A414}$ | $L_{B1}$ |
| 1375 | $L_{A415}$ | $L_{B1}$ |
| 1376 | $L_{A416}$ | $L_{B1}$ |
| 1377 | $L_{A417}$ | $L_{B1}$ |
| 1378 | $L_{A418}$ | $L_{B1}$ |
| 1379 | $L_{A419}$ | $L_{B1}$ |
| 1380 | $L_{A420}$ | $L_{B1}$ |
| 1381 | $L_{A421}$ | $L_{B1}$ |
| 1382 | $L_{A422}$ | $L_{B1}$ |
| 1383 | $L_{A423}$ | $L_{B1}$ |
| 1384 | $L_{A424}$ | $L_{B1}$ |
| 1385 | $L_{A425}$ | $L_{B1}$ |
| 1386 | $L_{A426}$ | $L_{B1}$ |
| 1387 | $L_{A427}$ | $L_{B1}$ |
| 1388 | $L_{A428}$ | $L_{B1}$ |
| 1389 | $L_{A429}$ | $L_{B1}$ |
| 1390 | $L_{A430}$ | $L_{B1}$ |

TABLE 2-continued

| Compound Number | $L_A$ | $L_B$ |
|---|---|---|
| 1391 | $L_{A431}$ | $L_{B1}$ |
| 1392 | $L_{A432}$ | $L_{B1}$ |
| 1393 | $L_{A433}$ | $L_{B1}$ |
| 1394 | $L_{A434}$ | $L_{B1}$ |
| 1395 | $L_{A435}$ | $L_{B1}$ |
| 1396 | $L_{A436}$ | $L_{B1}$ |
| 1397 | $L_{A437}$ | $L_{B1}$ |
| 1398 | $L_{A438}$ | $L_{B1}$ |
| 1399 | $L_{A439}$ | $L_{B1}$ |
| 1400 | $L_{A440}$ | $L_{B1}$ |
| 1401 | $L_{A441}$ | $L_{B1}$ |
| 1402 | $L_{A442}$ | $L_{B1}$ |
| 1403 | $L_{A443}$ | $L_{B1}$ |
| 1404 | $L_{A444}$ | $L_{B1}$ |
| 1405 | $L_{A445}$ | $L_{B1}$ |
| 1406 | $L_{A446}$ | $L_{B1}$ |
| 1407 | $L_{A447}$ | $L_{B1}$ |
| 1408 | $L_{A448}$ | $L_{B1}$ |
| 1409 | $L_{A449}$ | $L_{B1}$ |
| 1410 | $L_{A450}$ | $L_{B1}$ |
| 1411 | $L_{A451}$ | $L_{B1}$ |
| 1412 | $L_{A452}$ | $L_{B1}$ |
| 1413 | $L_{A453}$ | $L_{B1}$ |
| 1414 | $L_{A454}$ | $L_{B1}$ |
| 1415 | $L_{A455}$ | $L_{B1}$ |
| 1416 | $L_{A456}$ | $L_{B1}$ |
| 1417 | $L_{A457}$ | $L_{B1}$ |
| 1418 | $L_{A458}$ | $L_{B1}$ |
| 1419 | $L_{A459}$ | $L_{B1}$ |
| 1420 | $L_{A460}$ | $L_{B1}$ |
| 1421 | $L_{A461}$ | $L_{B1}$ |
| 1422 | $L_{A462}$ | $L_{B1}$ |
| 1423 | $L_{A463}$ | $L_{B1}$ |
| 1424 | $L_{A464}$ | $L_{B1}$ |
| 1425 | $L_{A465}$ | $L_{B1}$ |
| 1426 | $L_{A466}$ | $L_{B1}$ |
| 1427 | $L_{A467}$ | $L_{B1}$ |
| 1428 | $L_{A468}$ | $L_{B1}$ |
| 1429 | $L_{A469}$ | $L_{B1}$ |
| 1430 | $L_{A470}$ | $L_{B1}$ |
| 1431 | $L_{A471}$ | $L_{B1}$ |
| 1432 | $L_{A472}$ | $L_{B1}$ |
| 1433 | $L_{A473}$ | $L_{B1}$ |
| 1434 | $L_{A474}$ | $L_{B1}$ |
| 1435 | $L_{A475}$ | $L_{B1}$ |
| 1436 | $L_{A476}$ | $L_{B1}$ |
| 1437 | $L_{A477}$ | $L_{B1}$ |
| 1438 | $L_{A478}$ | $L_{B1}$ |
| 1439 | $L_{A479}$ | $L_{B1}$ |
| 1440 | $L_{A480}$ | $L_{B1}$ |
| 1441 | $L_{A481}$ | $L_{B1}$ |
| 1442 | $L_{A482}$ | $L_{B1}$ |
| 1443 | $L_{A483}$ | $L_{B1}$ |
| 1444 | $L_{A484}$ | $L_{B1}$ |
| 1445 | $L_{A485}$ | $L_{B1}$ |
| 1446 | $L_{A486}$ | $L_{B1}$ |
| 1447 | $L_{A487}$ | $L_{B1}$ |
| 1448 | $L_{A488}$ | $L_{B1}$ |
| 1449 | $L_{A489}$ | $L_{B1}$ |
| 1450 | $L_{A490}$ | $L_{B1}$ |
| 1451 | $L_{A491}$ | $L_{B1}$ |
| 1452 | $L_{A492}$ | $L_{B1}$ |
| 1453 | $L_{A493}$ | $L_{B1}$ |
| 1454 | $L_{A494}$ | $L_{B1}$ |
| 1455 | $L_{A495}$ | $L_{B1}$ |
| 1456 | $L_{A496}$ | $L_{B1}$ |
| 1457 | $L_{A497}$ | $L_{B1}$ |
| 1458 | $L_{A498}$ | $L_{B1}$ |
| 1459 | $L_{A499}$ | $L_{B1}$ |
| 1460 | $L_{A500}$ | $L_{B1}$ |
| 1461 | $L_{A501}$ | $L_{B1}$ |
| 1462 | $L_{A502}$ | $L_{B1}$ |
| 1463 | $L_{A503}$ | $L_{B1}$ |
| 1464 | $L_{A504}$ | $L_{B1}$ |
| 1465 | $L_{A505}$ | $L_{B1}$ |
| 1466 | $L_{A506}$ | $L_{B1}$ |
| 1467 | $L_{A507}$ | $L_{B1}$ |

TABLE 2-continued

| Compound Number | $L_A$ | $L_B$ |
|---|---|---|
| 1468 | $L_{A508}$ | $L_{B1}$ |
| 1469 | $L_{A509}$ | $L_{B1}$ |
| 1470 | $L_{A510}$ | $L_{B1}$ |
| 1471 | $L_{A511}$ | $L_{B1}$ |
| 1472 | $L_{A512}$ | $L_{B1}$ |
| 1473 | $L_{A513}$ | $L_{B1}$ |
| 1474 | $L_{A514}$ | $L_{B1}$ |
| 1475 | $L_{A515}$ | $L_{B1}$ |
| 1476 | $L_{A516}$ | $L_{B1}$ |
| 1477 | $L_{A517}$ | $L_{B1}$ |
| 1478 | $L_{A518}$ | $L_{B1}$ |
| 1479 | $L_{A519}$ | $L_{B1}$ |
| 1480 | $L_{A520}$ | $L_{B1}$ |
| 1481 | $L_{A521}$ | $L_{B1}$ |
| 1482 | $L_{A522}$ | $L_{B1}$ |
| 1483 | $L_{A523}$ | $L_{B1}$ |
| 1484 | $L_{A524}$ | $L_{B1}$ |
| 1485 | $L_{A525}$ | $L_{B1}$ |
| 1486 | $L_{A526}$ | $L_{B1}$ |
| 1487 | $L_{A527}$ | $L_{B1}$ |
| 1488 | $L_{A528}$ | $L_{B1}$ |
| 1489 | $L_{A529}$ | $L_{B1}$ |
| 1490 | $L_{A530}$ | $L_{B1}$ |
| 1491 | $L_{A531}$ | $L_{B1}$ |
| 1492 | $L_{A532}$ | $L_{B1}$ |
| 1493 | $L_{A533}$ | $L_{B1}$ |
| 1494 | $L_{A534}$ | $L_{B1}$ |
| 1495 | $L_{A535}$ | $L_{B1}$ |
| 1496 | $L_{A536}$ | $L_{B1}$ |
| 1497 | $L_{A537}$ | $L_{B1}$ |
| 1498 | $L_{A538}$ | $L_{B1}$ |
| 1499 | $L_{A539}$ | $L_{B1}$ |
| 1500 | $L_{A540}$ | $L_{B1}$ |
| 1501 | $L_{A541}$ | $L_{B1}$ |
| 1502 | $L_{A542}$ | $L_{B1}$ |
| 1503 | $L_{A543}$ | $L_{B1}$ |
| 1504 | $L_{A544}$ | $L_{B1}$ |
| 1505 | $L_{A545}$ | $L_{B1}$ |
| 1506 | $L_{A546}$ | $L_{B1}$ |
| 1507 | $L_{A547}$ | $L_{B1}$ |
| 1508 | $L_{A548}$ | $L_{B1}$ |
| 1509 | $L_{A549}$ | $L_{B1}$ |
| 1510 | $L_{A550}$ | $L_{B1}$ |
| 1511 | $L_{A551}$ | $L_{B1}$ |
| 1512 | $L_{A552}$ | $L_{B1}$ |
| 1513 | $L_{A553}$ | $L_{B1}$ |
| 1514 | $L_{A554}$ | $L_{B1}$ |
| 1515 | $L_{A555}$ | $L_{B1}$ |
| 1516 | $L_{A556}$ | $L_{B1}$ |
| 1517 | $L_{A557}$ | $L_{B1}$ |
| 1518 | $L_{A558}$ | $L_{B1}$ |
| 1519 | $L_{A559}$ | $L_{B1}$ |
| 1520 | $L_{A560}$ | $L_{B1}$ |
| 1521 | $L_{A561}$ | $L_{B1}$ |
| 1522 | $L_{A562}$ | $L_{B1}$ |
| 1523 | $L_{A563}$ | $L_{B1}$ |
| 1524 | $L_{A564}$ | $L_{B1}$ |
| 1525 | $L_{A565}$ | $L_{B1}$ |
| 1526 | $L_{A566}$ | $L_{B1}$ |
| 1527 | $L_{A567}$ | $L_{B1}$ |
| 1528 | $L_{A568}$ | $L_{B1}$ |
| 1529 | $L_{A569}$ | $L_{B1}$ |
| 1530 | $L_{A570}$ | $L_{B1}$ |
| 1531 | $L_{A571}$ | $L_{B1}$ |
| 1532 | $L_{A572}$ | $L_{B1}$ |
| 1533 | $L_{A573}$ | $L_{B1}$ |
| 1534 | $L_{A574}$ | $L_{B1}$ |
| 1535 | $L_{A575}$ | $L_{B1}$ |
| 1536 | $L_{A576}$ | $L_{B1}$ |
| 1537 | $L_{A577}$ | $L_{B1}$ |
| 1538 | $L_{A578}$ | $L_{B1}$ |
| 1539 | $L_{A579}$ | $L_{B1}$ |
| 1540 | $L_{A580}$ | $L_{B1}$ |
| 1541 | $L_{A581}$ | $L_{B1}$ |
| 1542 | $L_{A582}$ | $L_{B1}$ |
| 1543 | $L_{A583}$ | $L_{B1}$ |
| 1544 | $L_{A584}$ | $L_{B1}$ |

TABLE 2-continued

| Compound Number | $L_A$ | $L_B$ |
|---|---|---|
| 1545 | $L_{A585}$ | $L_{B1}$ |
| 1546 | $L_{A586}$ | $L_{B1}$ |
| 1547 | $L_{A587}$ | $L_{B1}$ |
| 1548 | $L_{A588}$ | $L_{B1}$ |
| 1549 | $L_{A589}$ | $L_{B1}$ |
| 1550 | $L_{A590}$ | $L_{B1}$ |
| 1551 | $L_{A591}$ | $L_{B1}$ |
| 1552 | $L_{A592}$ | $L_{B1}$ |
| 1553 | $L_{A593}$ | $L_{B1}$ |
| 1554 | $L_{A594}$ | $L_{B1}$ |
| 1555 | $L_{A595}$ | $L_{B1}$ |
| 1556 | $L_{A596}$ | $L_{B1}$ |
| 1557 | $L_{A597}$ | $L_{B1}$ |
| 1558 | $L_{A598}$ | $L_{B1}$ |
| 1559 | $L_{A599}$ | $L_{B1}$ |
| 1560 | $L_{A600}$ | $L_{B1}$ |
| 1561 | $L_{A601}$ | $L_{B1}$ |
| 1562 | $L_{A602}$ | $L_{B1}$ |
| 1563 | $L_{A603}$ | $L_{B1}$ |
| 1564 | $L_{A604}$ | $L_{B1}$ |
| 1565 | $L_{A605}$ | $L_{B1}$ |
| 1566 | $L_{A606}$ | $L_{B1}$ |
| 1567 | $L_{A607}$ | $L_{B1}$ |
| 1568 | $L_{A608}$ | $L_{B1}$ |
| 1569 | $L_{A609}$ | $L_{B1}$ |
| 1570 | $L_{A610}$ | $L_{B1}$ |
| 1571 | $L_{A611}$ | $L_{B1}$ |
| 1572 | $L_{A612}$ | $L_{B1}$ |
| 1573 | $L_{A613}$ | $L_{B1}$ |
| 1574 | $L_{A614}$ | $L_{B1}$ |
| 1575 | $L_{A615}$ | $L_{B1}$ |
| 1576 | $L_{A616}$ | $L_{B1}$ |
| 1577 | $L_{A617}$ | $L_{B1}$ |
| 1578 | $L_{A618}$ | $L_{B1}$ |
| 1579 | $L_{A619}$ | $L_{B1}$ |
| 1580 | $L_{A620}$ | $L_{B1}$ |
| 1581 | $L_{A621}$ | $L_{B1}$ |
| 1582 | $L_{A622}$ | $L_{B1}$ |
| 1583 | $L_{A623}$ | $L_{B1}$ |
| 1584 | $L_{A624}$ | $L_{B1}$ |
| 1585 | $L_{A625}$ | $L_{B1}$ |
| 1586 | $L_{A626}$ | $L_{B1}$ |
| 1587 | $L_{A627}$ | $L_{B1}$ |
| 1588 | $L_{A628}$ | $L_{B1}$ |
| 1589 | $L_{A629}$ | $L_{B1}$ |
| 1590 | $L_{A630}$ | $L_{B1}$ |
| 1591 | $L_{A631}$ | $L_{B1}$ |
| 1592 | $L_{A632}$ | $L_{B1}$ |
| 1593 | $L_{A633}$ | $L_{B1}$ |
| 1594 | $L_{A634}$ | $L_{B1}$ |
| 1595 | $L_{A635}$ | $L_{B1}$ |
| 1596 | $L_{A636}$ | $L_{B1}$ |
| 1597 | $L_{A637}$ | $L_{B1}$ |
| 1598 | $L_{A638}$ | $L_{B1}$ |
| 1599 | $L_{A639}$ | $L_{B1}$ |
| 1600 | $L_{A640}$ | $L_{B1}$ |
| 1601 | $L_{A641}$ | $L_{B1}$ |
| 1602 | $L_{A642}$ | $L_{B1}$ |
| 1603 | $L_{A643}$ | $L_{B1}$ |
| 1604 | $L_{A644}$ | $L_{B1}$ |
| 1605 | $L_{A645}$ | $L_{B1}$ |
| 1606 | $L_{A646}$ | $L_{B1}$ |
| 1607 | $L_{A647}$ | $L_{B1}$ |
| 1608 | $L_{A648}$ | $L_{B1}$ |
| 1609 | $L_{A649}$ | $L_{B1}$ |
| 1610 | $L_{A650}$ | $L_{B1}$ |
| 1611 | $L_{A651}$ | $L_{B1}$ |
| 1612 | $L_{A652}$ | $L_{B1}$ |
| 1613 | $L_{A653}$ | $L_{B1}$ |
| 1614 | $L_{A654}$ | $L_{B1}$ |
| 1615 | $L_{A655}$ | $L_{B1}$ |
| 1616 | $L_{A656}$ | $L_{B1}$ |
| 1617 | $L_{A657}$ | $L_{B1}$ |
| 1618 | $L_{A658}$ | $L_{B1}$ |
| 1619 | $L_{A659}$ | $L_{B1}$ |
| 1620 | $L_{A660}$ | $L_{B1}$ |
| 1621 | $L_{A661}$ | $L_{B1}$ |

TABLE 2-continued

| Compound Number | $L_A$ | $L_B$ |
|---|---|---|
| 1622 | $L_{A662}$ | $L_{B1}$ |
| 1623 | $L_{A663}$ | $L_{B1}$ |
| 1624 | $L_{A664}$ | $L_{B1}$ |
| 1625 | $L_{A665}$ | $L_{B1}$ |
| 1626 | $L_{A666}$ | $L_{B1}$ |
| 1627 | $L_{A667}$ | $L_{B1}$ |
| 1628 | $L_{A668}$ | $L_{B1}$ |
| 1629 | $L_{A669}$ | $L_{B1}$ |
| 1630 | $L_{A670}$ | $L_{B1}$ |
| 1631 | $L_{A671}$ | $L_{B1}$ |
| 1632 | $L_{A672}$ | $L_{B1}$ |
| 1633 | $L_{A673}$ | $L_{B1}$ |
| 1634 | $L_{A674}$ | $L_{B1}$ |
| 1635 | $L_{A675}$ | $L_{B1}$ |
| 1636 | $L_{A676}$ | $L_{B1}$ |
| 1637 | $L_{A677}$ | $L_{B1}$ |
| 1638 | $L_{A678}$ | $L_{B1}$ |
| 1639 | $L_{A679}$ | $L_{B1}$ |
| 1640 | $L_{A680}$ | $L_{B1}$ |
| 1641 | $L_{A681}$ | $L_{B1}$ |
| 1642 | $L_{A682}$ | $L_{B1}$ |
| 1643 | $L_{A683}$ | $L_{B1}$ |
| 1644 | $L_{A684}$ | $L_{B1}$ |
| 1645 | $L_{A685}$ | $L_{B1}$ |
| 1646 | $L_{A686}$ | $L_{B1}$ |
| 1647 | $L_{A687}$ | $L_{B1}$ |
| 1648 | $L_{A688}$ | $L_{B1}$ |
| 1649 | $L_{A689}$ | $L_{B1}$ |
| 1650 | $L_{A690}$ | $L_{B1}$ |
| 1651 | $L_{A691}$ | $L_{B1}$ |
| 1652 | $L_{A692}$ | $L_{B1}$ |
| 1653 | $L_{A693}$ | $L_{B1}$ |
| 1654 | $L_{A694}$ | $L_{B1}$ |
| 1655 | $L_{A695}$ | $L_{B1}$ |
| 1656 | $L_{A696}$ | $L_{B1}$ |
| 1657 | $L_{A697}$ | $L_{B1}$ |
| 1658 | $L_{A698}$ | $L_{B1}$ |
| 1659 | $L_{A699}$ | $L_{B1}$ |
| 1660 | $L_{A700}$ | $L_{B1}$ |
| 1661 | $L_{A701}$ | $L_{B1}$ |
| 1662 | $L_{A702}$ | $L_{B1}$ |
| 1663 | $L_{A703}$ | $L_{B1}$ |
| 1664 | $L_{A704}$ | $L_{B1}$ |
| 1665 | $L_{A705}$ | $L_{B1}$ |
| 1666 | $L_{A706}$ | $L_{B1}$ |
| 1667 | $L_{A707}$ | $L_{B1}$ |
| 1668 | $L_{A708}$ | $L_{B1}$ |
| 1669 | $L_{A709}$ | $L_{B1}$ |
| 1670 | $L_{A710}$ | $L_{B1}$ |
| 1671 | $L_{A711}$ | $L_{B1}$ |
| 1672 | $L_{A712}$ | $L_{B1}$ |
| 1673 | $L_{A713}$ | $L_{B1}$ |
| 1674 | $L_{A714}$ | $L_{B1}$ |
| 1675 | $L_{A715}$ | $L_{B1}$ |
| 1676 | $L_{A716}$ | $L_{B1}$ |
| 1677 | $L_{A717}$ | $L_{B1}$ |
| 1678 | $L_{A718}$ | $L_{B1}$ |
| 1679 | $L_{A719}$ | $L_{B1}$ |
| 1680 | $L_{A720}$ | $L_{B1}$ |
| 1681 | $L_{A721}$ | $L_{B1}$ |
| 1682 | $L_{A722}$ | $L_{B1}$ |
| 1683 | $L_{A723}$ | $L_{B1}$ |
| 1684 | $L_{A724}$ | $L_{B1}$ |
| 1685 | $L_{A725}$ | $L_{B1}$ |
| 1686 | $L_{A726}$ | $L_{B1}$ |
| 1687 | $L_{A727}$ | $L_{B1}$ |
| 1688 | $L_{A728}$ | $L_{B1}$ |
| 1689 | $L_{A729}$ | $L_{B1}$ |
| 1690 | $L_{A730}$ | $L_{B1}$ |
| 1691 | $L_{A731}$ | $L_{B1}$ |
| 1692 | $L_{A732}$ | $L_{B1}$ |
| 1693 | $L_{A733}$ | $L_{B1}$ |
| 1694 | $L_{A734}$ | $L_{B1}$ |
| 1695 | $L_{A735}$ | $L_{B1}$ |
| 1696 | $L_{A736}$ | $L_{B1}$ |
| 1697 | $L_{A737}$ | $L_{B1}$ |
| 1698 | $L_{A738}$ | $L_{B1}$ |

TABLE 2-continued

| Compound Number | $L_A$ | $L_B$ |
|---|---|---|
| 1699 | $L_{A739}$ | $L_{B1}$ |
| 1700 | $L_{A740}$ | $L_{B1}$ |
| 1701 | $L_{A741}$ | $L_{B1}$ |
| 1702 | $L_{A742}$ | $L_{B1}$ |
| 1703 | $L_{A743}$ | $L_{B1}$ |
| 1704 | $L_{A744}$ | $L_{B1}$ |
| 1705 | $L_{A745}$ | $L_{B1}$ |
| 1706 | $L_{A746}$ | $L_{B1}$ |
| 1707 | $L_{A747}$ | $L_{B1}$ |
| 1708 | $L_{A748}$ | $L_{B1}$ |
| 1709 | $L_{A749}$ | $L_{B1}$ |
| 1710 | $L_{A750}$ | $L_{B1}$ |
| 1711 | $L_{A751}$ | $L_{B1}$ |
| 1712 | $L_{A752}$ | $L_{B1}$ |
| 1713 | $L_{A753}$ | $L_{B1}$ |
| 1714 | $L_{A754}$ | $L_{B1}$ |
| 1715 | $L_{A755}$ | $L_{B1}$ |
| 1716 | $L_{A756}$ | $L_{B1}$ |
| 1717 | $L_{A757}$ | $L_{B1}$ |
| 1718 | $L_{A758}$ | $L_{B1}$ |
| 1719 | $L_{A759}$ | $L_{B1}$ |
| 1720 | $L_{A760}$ | $L_{B1}$ |
| 1721 | $L_{A761}$ | $L_{B1}$ |
| 1722 | $L_{A762}$ | $L_{B1}$ |
| 1723 | $L_{A763}$ | $L_{B1}$ |
| 1724 | $L_{A764}$ | $L_{B1}$ |
| 1725 | $L_{A765}$ | $L_{B1}$ |
| 1726 | $L_{A766}$ | $L_{B1}$ |
| 1727 | $L_{A767}$ | $L_{B1}$ |
| 1728 | $L_{A768}$ | $L_{B1}$ |
| 1729 | $L_{A769}$ | $L_{B1}$ |
| 1730 | $L_{A770}$ | $L_{B1}$ |
| 1731 | $L_{A771}$ | $L_{B1}$ |
| 1732 | $L_{A772}$ | $L_{B1}$ |
| 1733 | $L_{A773}$ | $L_{B1}$ |
| 1734 | $L_{A774}$ | $L_{B1}$ |
| 1735 | $L_{A775}$ | $L_{B1}$ |
| 1736 | $L_{A776}$ | $L_{B1}$ |
| 1737 | $L_{A777}$ | $L_{B1}$ |
| 1738 | $L_{A778}$ | $L_{B1}$ |
| 1739 | $L_{A779}$ | $L_{B1}$ |
| 1740 | $L_{A780}$ | $L_{B1}$ |
| 1741 | $L_{A781}$ | $L_{B1}$ |
| 1742 | $L_{A782}$ | $L_{B1}$ |
| 1743 | $L_{A783}$ | $L_{B1}$ |
| 1744 | $L_{A784}$ | $L_{B1}$ |
| 1745 | $L_{A785}$ | $L_{B1}$ |
| 1746 | $L_{A786}$ | $L_{B1}$ |
| 1747 | $L_{A787}$ | $L_{B1}$ |
| 1748 | $L_{A788}$ | $L_{B1}$ |
| 1749 | $L_{A789}$ | $L_{B1}$ |
| 1750 | $L_{A790}$ | $L_{B1}$ |
| 1751 | $L_{A791}$ | $L_{B1}$ |
| 1752 | $L_{A792}$ | $L_{B1}$ |
| 1753 | $L_{A793}$ | $L_{B1}$ |
| 1754 | $L_{A794}$ | $L_{B1}$ |
| 1755 | $L_{A795}$ | $L_{B1}$ |
| 1756 | $L_{A796}$ | $L_{B1}$ |
| 1757 | $L_{A797}$ | $L_{B1}$ |
| 1758 | $L_{A798}$ | $L_{B1}$ |
| 1759 | $L_{A799}$ | $L_{B1}$ |
| 1760 | $L_{A800}$ | $L_{B1}$ |
| 1761 | $L_{A801}$ | $L_{B1}$ |
| 1762 | $L_{A802}$ | $L_{B1}$ |
| 1763 | $L_{A803}$ | $L_{B1}$ |
| 1764 | $L_{A804}$ | $L_{B1}$ |
| 1765 | $L_{A805}$ | $L_{B1}$ |
| 1766 | $L_{A806}$ | $L_{B1}$ |
| 1767 | $L_{A807}$ | $L_{B1}$ |
| 1768 | $L_{A808}$ | $L_{B1}$ |
| 1769 | $L_{A809}$ | $L_{B1}$ |
| 1770 | $L_{A810}$ | $L_{B1}$ |
| 1771 | $L_{A811}$ | $L_{B1}$ |
| 1772 | $L_{A812}$ | $L_{B1}$ |
| 1773 | $L_{A813}$ | $L_{B1}$ |
| 1774 | $L_{A814}$ | $L_{B1}$ |
| 1775 | $L_{A815}$ | $L_{B1}$ |

TABLE 2-continued

| Compound Number | $L_A$ | $L_B$ |
|---|---|---|
| 1776 | $L_{A816}$ | $L_{B1}$ |
| 1777 | $L_{A817}$ | $L_{B1}$ |
| 1778 | $L_{A818}$ | $L_{B1}$ |
| 1779 | $L_{A819}$ | $L_{B1}$ |
| 1780 | $L_{A820}$ | $L_{B1}$ |
| 1781 | $L_{A821}$ | $L_{B1}$ |
| 1782 | $L_{A822}$ | $L_{B1}$ |
| 1783 | $L_{A823}$ | $L_{B1}$ |
| 1784 | $L_{A824}$ | $L_{B1}$ |
| 1785 | $L_{A825}$ | $L_{B1}$ |
| 1786 | $L_{A826}$ | $L_{B1}$ |
| 1787 | $L_{A827}$ | $L_{B1}$ |
| 1788 | $L_{A828}$ | $L_{B1}$ |
| 1789 | $L_{A829}$ | $L_{B1}$ |
| 1790 | $L_{A830}$ | $L_{B1}$ |
| 1791 | $L_{A831}$ | $L_{B1}$ |
| 1792 | $L_{A832}$ | $L_{B1}$ |
| 1793 | $L_{A833}$ | $L_{B1}$ |
| 1794 | $L_{A834}$ | $L_{B1}$ |
| 1795 | $L_{A835}$ | $L_{B1}$ |
| 1796 | $L_{A836}$ | $L_{B1}$ |
| 1797 | $L_{A837}$ | $L_{B1}$ |
| 1798 | $L_{A838}$ | $L_{B1}$ |
| 1799 | $L_{A839}$ | $L_{B1}$ |
| 1800 | $L_{A840}$ | $L_{B1}$ |
| 1801 | $L_{A841}$ | $L_{B1}$ |
| 1802 | $L_{A842}$ | $L_{B1}$ |
| 1803 | $L_{A843}$ | $L_{B1}$ |
| 1804 | $L_{A844}$ | $L_{B1}$ |
| 1805 | $L_{A845}$ | $L_{B1}$ |
| 1806 | $L_{A846}$ | $L_{B1}$ |
| 1807 | $L_{A847}$ | $L_{B1}$ |
| 1808 | $L_{A848}$ | $L_{B1}$ |
| 1809 | $L_{A849}$ | $L_{B1}$ |
| 1810 | $L_{A850}$ | $L_{B1}$ |
| 1811 | $L_{A851}$ | $L_{B1}$ |
| 1812 | $L_{A852}$ | $L_{B1}$ |
| 1813 | $L_{A853}$ | $L_{B1}$ |
| 1814 | $L_{A854}$ | $L_{B1}$ |
| 1815 | $L_{A855}$ | $L_{B1}$ |
| 1816 | $L_{A856}$ | $L_{B1}$ |
| 1817 | $L_{A857}$ | $L_{B1}$ |
| 1818 | $L_{A858}$ | $L_{B1}$ |
| 1819 | $L_{A859}$ | $L_{B1}$ |
| 1820 | $L_{A860}$ | $L_{B1}$ |
| 1821 | $L_{A861}$ | $L_{B1}$ |
| 1822 | $L_{A862}$ | $L_{B1}$ |
| 1823 | $L_{A863}$ | $L_{B1}$ |
| 1824 | $L_{A864}$ | $L_{B1}$ |
| 1825 | $L_{A865}$ | $L_{B1}$ |
| 1826 | $L_{A866}$ | $L_{B1}$ |
| 1827 | $L_{A867}$ | $L_{B1}$ |
| 1828 | $L_{A868}$ | $L_{B1}$ |
| 1829 | $L_{A869}$ | $L_{B1}$ |
| 1830 | $L_{A870}$ | $L_{B1}$ |
| 1831 | $L_{A871}$ | $L_{B1}$ |
| 1832 | $L_{A872}$ | $L_{B1}$ |
| 1833 | $L_{A873}$ | $L_{B1}$ |
| 1834 | $L_{A874}$ | $L_{B1}$ |
| 1835 | $L_{A875}$ | $L_{B1}$ |
| 1836 | $L_{A876}$ | $L_{B1}$ |
| 1837 | $L_{A877}$ | $L_{B1}$ |
| 1838 | $L_{A878}$ | $L_{B1}$ |
| 1839 | $L_{A879}$ | $L_{B1}$ |
| 1840 | $L_{A880}$ | $L_{B1}$ |
| 1841 | $L_{A881}$ | $L_{B1}$ |
| 1842 | $L_{A882}$ | $L_{B1}$ |
| 1843 | $L_{A883}$ | $L_{B1}$ |
| 1844 | $L_{A884}$ | $L_{B1}$ |
| 1845 | $L_{A885}$ | $L_{B1}$ |
| 1846 | $L_{A886}$ | $L_{B1}$ |
| 1847 | $L_{A887}$ | $L_{B1}$ |
| 1848 | $L_{A888}$ | $L_{B1}$ |
| 1849 | $L_{A889}$ | $L_{B1}$ |
| 1850 | $L_{A890}$ | $L_{B1}$ |
| 1851 | $L_{A891}$ | $L_{B1}$ |
| 1852 | $L_{A892}$ | $L_{B1}$ |

TABLE 2-continued

| Compound Number | $L_A$ | $L_B$ |
|---|---|---|
| 1853 | $L_{A893}$ | $L_{B1}$ |
| 1854 | $L_{A894}$ | $L_{B1}$ |
| 1855 | $L_{A895}$ | $L_{B1}$ |
| 1856 | $L_{A896}$ | $L_{B1}$ |
| 1857 | $L_{A897}$ | $L_{B1}$ |
| 1858 | $L_{A898}$ | $L_{B1}$ |
| 1859 | $L_{A899}$ | $L_{B1}$ |
| 1860 | $L_{A900}$ | $L_{B1}$ |
| 1861 | $L_{A901}$ | $L_{B1}$ |
| 1862 | $L_{A902}$ | $L_{B1}$ |
| 1863 | $L_{A903}$ | $L_{B1}$ |
| 1864 | $L_{A904}$ | $L_{B1}$ |
| 1865 | $L_{A905}$ | $L_{B1}$ |
| 1866 | $L_{A906}$ | $L_{B1}$ |
| 1867 | $L_{A907}$ | $L_{B1}$ |
| 1868 | $L_{A908}$ | $L_{B1}$ |
| 1869 | $L_{A909}$ | $L_{B1}$ |
| 1870 | $L_{A910}$ | $L_{B1}$ |
| 1871 | $L_{A911}$ | $L_{B1}$ |
| 1872 | $L_{A912}$ | $L_{B1}$ |
| 1873 | $L_{A913}$ | $L_{B1}$ |
| 1874 | $L_{A914}$ | $L_{B1}$ |
| 1875 | $L_{A915}$ | $L_{B1}$ |
| 1876 | $L_{A916}$ | $L_{B1}$ |
| 1877 | $L_{A917}$ | $L_{B1}$ |
| 1878 | $L_{A918}$ | $L_{B1}$ |
| 1879 | $L_{A919}$ | $L_{B1}$ |
| 1880 | $L_{A920}$ | $L_{B1}$ |
| 1881 | $L_{A921}$ | $L_{B1}$ |
| 1882 | $L_{A922}$ | $L_{B1}$ |
| 1883 | $L_{A923}$ | $L_{B1}$ |
| 1884 | $L_{A924}$ | $L_{B1}$ |
| 1885 | $L_{A925}$ | $L_{B1}$ |
| 1886 | $L_{A926}$ | $L_{B1}$ |
| 1887 | $L_{A927}$ | $L_{B1}$ |
| 1888 | $L_{A928}$ | $L_{B1}$ |
| 1889 | $L_{A929}$ | $L_{B1}$ |
| 1890 | $L_{A930}$ | $L_{B1}$ |
| 1891 | $L_{A931}$ | $L_{B1}$ |
| 1892 | $L_{A932}$ | $L_{B1}$ |
| 1893 | $L_{A933}$ | $L_{B1}$ |
| 1894 | $L_{A934}$ | $L_{B1}$ |
| 1895 | $L_{A935}$ | $L_{B1}$ |
| 1896 | $L_{A936}$ | $L_{B1}$ |
| 1897 | $L_{A937}$ | $L_{B1}$ |
| 1898 | $L_{A938}$ | $L_{B1}$ |
| 1899 | $L_{A939}$ | $L_{B1}$ |
| 1900 | $L_{A940}$ | $L_{B1}$ |
| 1901 | $L_{A941}$ | $L_{B1}$ |
| 1902 | $L_{A942}$ | $L_{B1}$ |
| 1903 | $L_{A943}$ | $L_{B1}$ |
| 1904 | $L_{A944}$ | $L_{B1}$ |
| 1905 | $L_{A945}$ | $L_{B1}$ |
| 1906 | $L_{A946}$ | $L_{B1}$ |
| 1907 | $L_{A947}$ | $L_{B1}$ |
| 1908 | $L_{A948}$ | $L_{B1}$ |
| 1909 | $L_{A949}$ | $L_{B1}$ |
| 1910 | $L_{A950}$ | $L_{B1}$ |
| 1911 | $L_{A951}$ | $L_{B1}$ |
| 1912 | $L_{A952}$ | $L_{B1}$ |
| 1913 | $L_{A953}$ | $L_{B1}$ |
| 1914 | $L_{A954}$ | $L_{B1}$ |
| 1915 | $L_{A955}$ | $L_{B1}$ |
| 1916 | $L_{A956}$ | $L_{B1}$ |
| 1917 | $L_{A957}$ | $L_{B1}$ |
| 1918 | $L_{A958}$ | $L_{B1}$ |
| 1919 | $L_{A959}$ | $L_{B1}$ |
| 1920 | $L_{A960}$ | $L_{B1}$ |
| 1921 | $L_{A1}$ | $L_{B2}$ |
| 1922 | $L_{A2}$ | $L_{B2}$ |
| 1923 | $L_{A3}$ | $L_{B2}$ |
| 1924 | $L_{A4}$ | $L_{B2}$ |
| 1925 | $L_{A5}$ | $L_{B2}$ |
| 1926 | $L_{A6}$ | $L_{B2}$ |
| 1927 | $L_{A7}$ | $L_{B2}$ |
| 1928 | $L_{A8}$ | $L_{B2}$ |
| 1929 | $L_{A9}$ | $L_{B2}$ |

TABLE 2-continued

| Compound Number | $L_A$ | $L_B$ |
|---|---|---|
| 1930 | $L_{A10}$ | $L_{B2}$ |
| 1931 | $L_{A11}$ | $L_{B2}$ |
| 1932 | $L_{A12}$ | $L_{B2}$ |
| 1933 | $L_{A13}$ | $L_{B2}$ |
| 1934 | $L_{A14}$ | $L_{B2}$ |
| 1935 | $L_{A15}$ | $L_{B2}$ |
| 1936 | $L_{A16}$ | $L_{B2}$ |
| 1937 | $L_{A17}$ | $L_{B2}$ |
| 1938 | $L_{A18}$ | $L_{B2}$ |
| 1939 | $L_{A19}$ | $L_{B2}$ |
| 1940 | $L_{A20}$ | $L_{B2}$ |
| 1941 | $L_{A21}$ | $L_{B2}$ |
| 1942 | $L_{A22}$ | $L_{B2}$ |
| 1943 | $L_{A23}$ | $L_{B2}$ |
| 1944 | $L_{A24}$ | $L_{B2}$ |
| 1945 | $L_{A25}$ | $L_{B2}$ |
| 1946 | $L_{A26}$ | $L_{B2}$ |
| 1947 | $L_{A27}$ | $L_{B2}$ |
| 1948 | $L_{A28}$ | $L_{B2}$ |
| 1949 | $L_{A29}$ | $L_{B2}$ |
| 1950 | $L_{A30}$ | $L_{B2}$ |
| 1951 | $L_{A31}$ | $L_{B2}$ |
| 1952 | $L_{A32}$ | $L_{B2}$ |
| 1953 | $L_{A33}$ | $L_{B2}$ |
| 1954 | $L_{A34}$ | $L_{B2}$ |
| 1955 | $L_{A35}$ | $L_{B2}$ |
| 1956 | $L_{A36}$ | $L_{B2}$ |
| 1957 | $L_{A37}$ | $L_{B2}$ |
| 1958 | $L_{A38}$ | $L_{B2}$ |
| 1959 | $L_{A39}$ | $L_{B2}$ |
| 1960 | $L_{A40}$ | $L_{B2}$ |
| 1961 | $L_{A41}$ | $L_{B2}$ |
| 1962 | $L_{A42}$ | $L_{B2}$ |
| 1963 | $L_{A43}$ | $L_{B2}$ |
| 1964 | $L_{A44}$ | $L_{B2}$ |
| 1965 | $L_{A45}$ | $L_{B2}$ |
| 1966 | $L_{A46}$ | $L_{B2}$ |
| 1967 | $L_{A47}$ | $L_{B2}$ |
| 1968 | $L_{A48}$ | $L_{B2}$ |
| 1969 | $L_{A49}$ | $L_{B2}$ |
| 1970 | $L_{A50}$ | $L_{B2}$ |
| 1971 | $L_{A51}$ | $L_{B2}$ |
| 1972 | $L_{A52}$ | $L_{B2}$ |
| 1973 | $L_{A53}$ | $L_{B2}$ |
| 1974 | $L_{A54}$ | $L_{B2}$ |
| 1975 | $L_{A55}$ | $L_{B2}$ |
| 1976 | $L_{A56}$ | $L_{B2}$ |
| 1977 | $L_{A57}$ | $L_{B2}$ |
| 1978 | $L_{A58}$ | $L_{B2}$ |
| 1979 | $L_{A59}$ | $L_{B2}$ |
| 1980 | $L_{A60}$ | $L_{B2}$ |
| 1981 | $L_{A61}$ | $L_{B2}$ |
| 1982 | $L_{A62}$ | $L_{B2}$ |
| 1983 | $L_{A63}$ | $L_{B2}$ |
| 1984 | $L_{A64}$ | $L_{B2}$ |
| 1985 | $L_{A65}$ | $L_{B2}$ |
| 1986 | $L_{A66}$ | $L_{B2}$ |
| 1987 | $L_{A67}$ | $L_{B2}$ |
| 1988 | $L_{A68}$ | $L_{B2}$ |
| 1989 | $L_{A69}$ | $L_{B2}$ |
| 1990 | $L_{A70}$ | $L_{B2}$ |
| 1991 | $L_{A71}$ | $L_{B2}$ |
| 1992 | $L_{A72}$ | $L_{B2}$ |
| 1993 | $L_{A73}$ | $L_{B2}$ |
| 1994 | $L_{A74}$ | $L_{B2}$ |
| 1995 | $L_{A75}$ | $L_{B2}$ |
| 1996 | $L_{A76}$ | $L_{B2}$ |
| 1997 | $L_{A77}$ | $L_{B2}$ |
| 1998 | $L_{A78}$ | $L_{B2}$ |
| 1999 | $L_{A79}$ | $L_{B2}$ |
| 2000 | $L_{A80}$ | $L_{B2}$ |
| 2001 | $L_{A81}$ | $L_{B2}$ |
| 2002 | $L_{A82}$ | $L_{B2}$ |
| 2003 | $L_{A83}$ | $L_{B2}$ |
| 2004 | $L_{A84}$ | $L_{B2}$ |
| 2005 | $L_{A85}$ | $L_{B2}$ |
| 2006 | $L_{A86}$ | $L_{B2}$ |

TABLE 2-continued

| Compound Number | $L_A$ | $L_B$ |
|---|---|---|
| 2007 | $L_{A87}$ | $L_{B2}$ |
| 2008 | $L_{A88}$ | $L_{B2}$ |
| 2009 | $L_{A89}$ | $L_{B2}$ |
| 2010 | $L_{A90}$ | $L_{B2}$ |
| 2011 | $L_{A91}$ | $L_{B2}$ |
| 2012 | $L_{A92}$ | $L_{B2}$ |
| 2013 | $L_{A93}$ | $L_{B2}$ |
| 2014 | $L_{A94}$ | $L_{B2}$ |
| 2015 | $L_{A95}$ | $L_{B2}$ |
| 2016 | $L_{A96}$ | $L_{B2}$ |
| 2017 | $L_{A97}$ | $L_{B2}$ |
| 2018 | $L_{A98}$ | $L_{B2}$ |
| 2019 | $L_{A99}$ | $L_{B2}$ |
| 2020 | $L_{A100}$ | $L_{B2}$ |
| 2021 | $L_{A101}$ | $L_{B2}$ |
| 2022 | $L_{A102}$ | $L_{B2}$ |
| 2023 | $L_{A103}$ | $L_{B2}$ |
| 2024 | $L_{A104}$ | $L_{B2}$ |
| 2025 | $L_{A105}$ | $L_{B2}$ |
| 2026 | $L_{A106}$ | $L_{B2}$ |
| 2027 | $L_{A107}$ | $L_{B2}$ |
| 2028 | $L_{A108}$ | $L_{B2}$ |
| 2029 | $L_{A109}$ | $L_{B2}$ |
| 2030 | $L_{A110}$ | $L_{B2}$ |
| 2031 | $L_{A111}$ | $L_{B2}$ |
| 2032 | $L_{A112}$ | $L_{B2}$ |
| 2033 | $L_{A113}$ | $L_{B2}$ |
| 2034 | $L_{A114}$ | $L_{B2}$ |
| 2035 | $L_{A115}$ | $L_{B2}$ |
| 2036 | $L_{A116}$ | $L_{B2}$ |
| 2037 | $L_{A117}$ | $L_{B2}$ |
| 2038 | $L_{A118}$ | $L_{B2}$ |
| 2039 | $L_{A119}$ | $L_{B2}$ |
| 2040 | $L_{A120}$ | $L_{B2}$ |
| 2041 | $L_{A121}$ | $L_{B2}$ |
| 2042 | $L_{A122}$ | $L_{B2}$ |
| 2043 | $L_{A123}$ | $L_{B2}$ |
| 2044 | $L_{A124}$ | $L_{B2}$ |
| 2045 | $L_{A125}$ | $L_{B2}$ |
| 2046 | $L_{A126}$ | $L_{B2}$ |
| 2047 | $L_{A127}$ | $L_{B2}$ |
| 2048 | $L_{A128}$ | $L_{B2}$ |
| 2049 | $L_{A129}$ | $L_{B2}$ |
| 2050 | $L_{A130}$ | $L_{B2}$ |
| 2051 | $L_{A131}$ | $L_{B2}$ |
| 2052 | $L_{A132}$ | $L_{B2}$ |
| 2053 | $L_{A133}$ | $L_{B2}$ |
| 2054 | $L_{A134}$ | $L_{B2}$ |
| 2055 | $L_{A135}$ | $L_{B2}$ |
| 2056 | $L_{A136}$ | $L_{B2}$ |
| 2057 | $L_{A137}$ | $L_{B2}$ |
| 2058 | $L_{A138}$ | $L_{B2}$ |
| 2059 | $L_{A139}$ | $L_{B2}$ |
| 2060 | $L_{A140}$ | $L_{B2}$ |
| 2061 | $L_{A141}$ | $L_{B2}$ |
| 2062 | $L_{A142}$ | $L_{B2}$ |
| 2063 | $L_{A143}$ | $L_{B2}$ |
| 2064 | $L_{A144}$ | $L_{B2}$ |
| 2065 | $L_{A145}$ | $L_{B2}$ |
| 2066 | $L_{A146}$ | $L_{B2}$ |
| 2067 | $L_{A147}$ | $L_{B2}$ |
| 2068 | $L_{A148}$ | $L_{B2}$ |
| 2069 | $L_{A149}$ | $L_{B2}$ |
| 2070 | $L_{A150}$ | $L_{B2}$ |
| 2071 | $L_{A151}$ | $L_{B2}$ |
| 2072 | $L_{A152}$ | $L_{B2}$ |
| 2073 | $L_{A153}$ | $L_{B2}$ |
| 2074 | $L_{A154}$ | $L_{B2}$ |
| 2075 | $L_{A155}$ | $L_{B2}$ |
| 2076 | $L_{A156}$ | $L_{B2}$ |
| 2077 | $L_{A157}$ | $L_{B2}$ |
| 2078 | $L_{A158}$ | $L_{B2}$ |
| 2079 | $L_{A159}$ | $L_{B2}$ |
| 2080 | $L_{A160}$ | $L_{B2}$ |
| 2081 | $L_{A161}$ | $L_{B2}$ |
| 2082 | $L_{A162}$ | $L_{B2}$ |
| 2083 | $L_{A163}$ | $L_{B2}$ |

TABLE 2-continued

| Compound Number | $L_A$ | $L_B$ |
|---|---|---|
| 2084 | $L_{A164}$ | $L_{B2}$ |
| 2085 | $L_{A165}$ | $L_{B2}$ |
| 2086 | $L_{A166}$ | $L_{B2}$ |
| 2087 | $L_{A167}$ | $L_{B2}$ |
| 2088 | $L_{A168}$ | $L_{B2}$ |
| 2089 | $L_{A169}$ | $L_{B2}$ |
| 2090 | $L_{A170}$ | $L_{B2}$ |
| 2091 | $L_{A171}$ | $L_{B2}$ |
| 2092 | $L_{A172}$ | $L_{B2}$ |
| 2093 | $L_{A173}$ | $L_{B2}$ |
| 2094 | $L_{A174}$ | $L_{B2}$ |
| 2095 | $L_{A175}$ | $L_{B2}$ |
| 2096 | $L_{A176}$ | $L_{B2}$ |
| 2097 | $L_{A177}$ | $L_{B2}$ |
| 2098 | $L_{A178}$ | $L_{B2}$ |
| 2099 | $L_{A179}$ | $L_{B2}$ |
| 2100 | $L_{A180}$ | $L_{B2}$ |
| 2101 | $L_{A181}$ | $L_{B2}$ |
| 2102 | $L_{A182}$ | $L_{B2}$ |
| 2103 | $L_{A183}$ | $L_{B2}$ |
| 2104 | $L_{A184}$ | $L_{B2}$ |
| 2105 | $L_{A185}$ | $L_{B2}$ |
| 2106 | $L_{A186}$ | $L_{B2}$ |
| 2107 | $L_{A187}$ | $L_{B2}$ |
| 2108 | $L_{A188}$ | $L_{B2}$ |
| 2109 | $L_{A189}$ | $L_{B2}$ |
| 2110 | $L_{A190}$ | $L_{B2}$ |
| 2111 | $L_{A191}$ | $L_{B2}$ |
| 2112 | $L_{A192}$ | $L_{B2}$ |
| 2113 | $L_{A193}$ | $L_{B2}$ |
| 2114 | $L_{A194}$ | $L_{B2}$ |
| 2115 | $L_{A195}$ | $L_{B2}$ |
| 2116 | $L_{A196}$ | $L_{B2}$ |
| 2117 | $L_{A197}$ | $L_{B2}$ |
| 2118 | $L_{A198}$ | $L_{B2}$ |
| 2119 | $L_{A199}$ | $L_{B2}$ |
| 2120 | $L_{A200}$ | $L_{B2}$ |
| 2121 | $L_{A201}$ | $L_{B2}$ |
| 2122 | $L_{A202}$ | $L_{B2}$ |
| 2123 | $L_{A203}$ | $L_{B2}$ |
| 2124 | $L_{A204}$ | $L_{B2}$ |
| 2125 | $L_{A205}$ | $L_{B2}$ |
| 2126 | $L_{A206}$ | $L_{B2}$ |
| 2127 | $L_{A207}$ | $L_{B2}$ |
| 2128 | $L_{A208}$ | $L_{B2}$ |
| 2129 | $L_{A209}$ | $L_{B2}$ |
| 2130 | $L_{A210}$ | $L_{B2}$ |
| 2131 | $L_{A211}$ | $L_{B2}$ |
| 2132 | $L_{A212}$ | $L_{B2}$ |
| 2133 | $L_{A213}$ | $L_{B2}$ |
| 2134 | $L_{A214}$ | $L_{B2}$ |
| 2135 | $L_{A215}$ | $L_{B2}$ |
| 2136 | $L_{A216}$ | $L_{B2}$ |
| 2137 | $L_{A217}$ | $L_{B2}$ |
| 2138 | $L_{A218}$ | $L_{B2}$ |
| 2139 | $L_{A219}$ | $L_{B2}$ |
| 2140 | $L_{A220}$ | $L_{B2}$ |
| 2141 | $L_{A221}$ | $L_{B2}$ |
| 2142 | $L_{A222}$ | $L_{B2}$ |
| 2143 | $L_{A223}$ | $L_{B2}$ |
| 2144 | $L_{A224}$ | $L_{B2}$ |
| 2145 | $L_{A225}$ | $L_{B2}$ |
| 2146 | $L_{A226}$ | $L_{B2}$ |
| 2147 | $L_{A227}$ | $L_{B2}$ |
| 2148 | $L_{A228}$ | $L_{B2}$ |
| 2149 | $L_{A229}$ | $L_{B2}$ |
| 2150 | $L_{A230}$ | $L_{B2}$ |
| 2151 | $L_{A231}$ | $L_{B2}$ |
| 2152 | $L_{A232}$ | $L_{B2}$ |
| 2153 | $L_{A233}$ | $L_{B2}$ |
| 2154 | $L_{A234}$ | $L_{B2}$ |
| 2155 | $L_{A235}$ | $L_{B2}$ |
| 2156 | $L_{A236}$ | $L_{B2}$ |
| 2157 | $L_{A237}$ | $L_{B2}$ |
| 2158 | $L_{A238}$ | $L_{B2}$ |
| 2159 | $L_{A239}$ | $L_{B2}$ |
| 2160 | $L_{A240}$ | $L_{B2}$ |

TABLE 2-continued

| Compound Number | $L_A$ | $L_B$ |
|---|---|---|
| 2161 | $L_{A241}$ | $L_{B2}$ |
| 2162 | $L_{A242}$ | $L_{B2}$ |
| 2163 | $L_{A243}$ | $L_{B2}$ |
| 2164 | $L_{A244}$ | $L_{B2}$ |
| 2165 | $L_{A245}$ | $L_{B2}$ |
| 2166 | $L_{A246}$ | $L_{B2}$ |
| 2167 | $L_{A247}$ | $L_{B2}$ |
| 2168 | $L_{A248}$ | $L_{B2}$ |
| 2169 | $L_{A249}$ | $L_{B2}$ |
| 2170 | $L_{A250}$ | $L_{B2}$ |
| 2171 | $L_{A251}$ | $L_{B2}$ |
| 2172 | $L_{A252}$ | $L_{B2}$ |
| 2173 | $L_{A253}$ | $L_{B2}$ |
| 2174 | $L_{A254}$ | $L_{B2}$ |
| 2175 | $L_{A255}$ | $L_{B2}$ |
| 2176 | $L_{A256}$ | $L_{B2}$ |
| 2177 | $L_{A257}$ | $L_{B2}$ |
| 2178 | $L_{A258}$ | $L_{B2}$ |
| 2179 | $L_{A259}$ | $L_{B2}$ |
| 2180 | $L_{A260}$ | $L_{B2}$ |
| 2181 | $L_{A261}$ | $L_{B2}$ |
| 2182 | $L_{A262}$ | $L_{B2}$ |
| 2183 | $L_{A263}$ | $L_{B2}$ |
| 2184 | $L_{A264}$ | $L_{B2}$ |
| 2185 | $L_{A265}$ | $L_{B2}$ |
| 2186 | $L_{A266}$ | $L_{B2}$ |
| 2187 | $L_{A267}$ | $L_{B2}$ |
| 2188 | $L_{A268}$ | $L_{B2}$ |
| 2189 | $L_{A269}$ | $L_{B2}$ |
| 2190 | $L_{A270}$ | $L_{B2}$ |
| 2191 | $L_{A271}$ | $L_{B2}$ |
| 2192 | $L_{A272}$ | $L_{B2}$ |
| 2193 | $L_{A273}$ | $L_{B2}$ |
| 2194 | $L_{A274}$ | $L_{B2}$ |
| 2195 | $L_{A275}$ | $L_{B2}$ |
| 2196 | $L_{A276}$ | $L_{B2}$ |
| 2197 | $L_{A277}$ | $L_{B2}$ |
| 2198 | $L_{A278}$ | $L_{B2}$ |
| 2199 | $L_{A279}$ | $L_{B2}$ |
| 2200 | $L_{A280}$ | $L_{B2}$ |
| 2201 | $L_{A281}$ | $L_{B2}$ |
| 2202 | $L_{A282}$ | $L_{B2}$ |
| 2203 | $L_{A283}$ | $L_{B2}$ |
| 2204 | $L_{A284}$ | $L_{B2}$ |
| 2205 | $L_{A285}$ | $L_{B2}$ |
| 2206 | $L_{A286}$ | $L_{B2}$ |
| 2207 | $L_{A287}$ | $L_{B2}$ |
| 2208 | $L_{A288}$ | $L_{B2}$ |
| 2209 | $L_{A289}$ | $L_{B2}$ |
| 2210 | $L_{A290}$ | $L_{B2}$ |
| 2211 | $L_{A291}$ | $L_{B2}$ |
| 2212 | $L_{A292}$ | $L_{B2}$ |
| 2213 | $L_{A293}$ | $L_{B2}$ |
| 2214 | $L_{A294}$ | $L_{B2}$ |
| 2215 | $L_{A295}$ | $L_{B2}$ |
| 2216 | $L_{A296}$ | $L_{B2}$ |
| 2217 | $L_{A297}$ | $L_{B2}$ |
| 2218 | $L_{A298}$ | $L_{B2}$ |
| 2219 | $L_{A299}$ | $L_{B2}$ |
| 2220 | $L_{A300}$ | $L_{B2}$ |
| 2221 | $L_{A301}$ | $L_{B2}$ |
| 2222 | $L_{A302}$ | $L_{B2}$ |
| 2223 | $L_{A303}$ | $L_{B2}$ |
| 2224 | $L_{A304}$ | $L_{B2}$ |
| 2225 | $L_{A305}$ | $L_{B2}$ |
| 2226 | $L_{A306}$ | $L_{B2}$ |
| 2227 | $L_{A307}$ | $L_{B2}$ |
| 2228 | $L_{A308}$ | $L_{B2}$ |
| 2229 | $L_{A309}$ | $L_{B2}$ |
| 2230 | $L_{A310}$ | $L_{B2}$ |
| 2231 | $L_{A311}$ | $L_{B2}$ |
| 2232 | $L_{A312}$ | $L_{B2}$ |
| 2233 | $L_{A313}$ | $L_{B2}$ |
| 2234 | $L_{A314}$ | $L_{B2}$ |
| 2235 | $L_{A315}$ | $L_{B2}$ |
| 2236 | $L_{A316}$ | $L_{B2}$ |
| 2237 | $L_{A317}$ | $L_{B2}$ |
| 2238 | $L_{A318}$ | $L_{B2}$ |
| 2239 | $L_{A319}$ | $L_{B2}$ |
| 2240 | $L_{A320}$ | $L_{B2}$ |
| 2241 | $L_{A321}$ | $L_{B2}$ |
| 2242 | $L_{A322}$ | $L_{B2}$ |
| 2243 | $L_{A323}$ | $L_{B2}$ |
| 2244 | $L_{A324}$ | $L_{B2}$ |
| 2245 | $L_{A325}$ | $L_{B2}$ |
| 2246 | $L_{A326}$ | $L_{B2}$ |
| 2247 | $L_{A327}$ | $L_{B2}$ |
| 2248 | $L_{A328}$ | $L_{B2}$ |
| 2249 | $L_{A329}$ | $L_{B2}$ |
| 2250 | $L_{A330}$ | $L_{B2}$ |
| 2251 | $L_{A331}$ | $L_{B2}$ |
| 2252 | $L_{A332}$ | $L_{B2}$ |
| 2253 | $L_{A333}$ | $L_{B2}$ |
| 2254 | $L_{A334}$ | $L_{B2}$ |
| 2255 | $L_{A335}$ | $L_{B2}$ |
| 2256 | $L_{A336}$ | $L_{B2}$ |
| 2257 | $L_{A337}$ | $L_{B2}$ |
| 2258 | $L_{A338}$ | $L_{B2}$ |
| 2259 | $L_{A339}$ | $L_{B2}$ |
| 2260 | $L_{A340}$ | $L_{B2}$ |
| 2261 | $L_{A341}$ | $L_{B2}$ |
| 2262 | $L_{A342}$ | $L_{B2}$ |
| 2263 | $L_{A343}$ | $L_{B2}$ |
| 2264 | $L_{A344}$ | $L_{B2}$ |
| 2265 | $L_{A345}$ | $L_{B2}$ |
| 2266 | $L_{A346}$ | $L_{B2}$ |
| 2267 | $L_{A347}$ | $L_{B2}$ |
| 2268 | $L_{A348}$ | $L_{B2}$ |
| 2269 | $L_{A349}$ | $L_{B2}$ |
| 2270 | $L_{A350}$ | $L_{B2}$ |
| 2271 | $L_{A351}$ | $L_{B2}$ |
| 2272 | $L_{A352}$ | $L_{B2}$ |
| 2273 | $L_{A353}$ | $L_{B2}$ |
| 2274 | $L_{A354}$ | $L_{B2}$ |
| 2275 | $L_{A355}$ | $L_{B2}$ |
| 2276 | $L_{A356}$ | $L_{B2}$ |
| 2277 | $L_{A357}$ | $L_{B2}$ |
| 2278 | $L_{A358}$ | $L_{B2}$ |
| 2279 | $L_{A359}$ | $L_{B2}$ |
| 2280 | $L_{A360}$ | $L_{B2}$ |
| 2281 | $L_{A361}$ | $L_{B2}$ |
| 2282 | $L_{A362}$ | $L_{B2}$ |
| 2283 | $L_{A363}$ | $L_{B2}$ |
| 2284 | $L_{A364}$ | $L_{B2}$ |
| 2285 | $L_{A365}$ | $L_{B2}$ |
| 2286 | $L_{A366}$ | $L_{B2}$ |
| 2287 | $L_{A367}$ | $L_{B2}$ |
| 2288 | $L_{A368}$ | $L_{B2}$ |
| 2289 | $L_{A369}$ | $L_{B2}$ |
| 2290 | $L_{A370}$ | $L_{B2}$ |
| 2291 | $L_{A371}$ | $L_{B2}$ |
| 2292 | $L_{A372}$ | $L_{B2}$ |
| 2293 | $L_{A373}$ | $L_{B2}$ |
| 2294 | $L_{A374}$ | $L_{B2}$ |
| 2295 | $L_{A375}$ | $L_{B2}$ |
| 2296 | $L_{A376}$ | $L_{B2}$ |
| 2297 | $L_{A377}$ | $L_{B2}$ |
| 2298 | $L_{A378}$ | $L_{B2}$ |
| 2299 | $L_{A379}$ | $L_{B2}$ |
| 2300 | $L_{A380}$ | $L_{B2}$ |
| 2301 | $L_{A381}$ | $L_{B2}$ |
| 2302 | $L_{A382}$ | $L_{B2}$ |
| 2303 | $L_{A383}$ | $L_{B2}$ |
| 2304 | $L_{A384}$ | $L_{B2}$ |
| 2305 | $L_{A385}$ | $L_{B2}$ |
| 2306 | $L_{A386}$ | $L_{B2}$ |
| 2307 | $L_{A387}$ | $L_{B2}$ |
| 2308 | $L_{A388}$ | $L_{B2}$ |
| 2309 | $L_{A389}$ | $L_{B2}$ |
| 2310 | $L_{A390}$ | $L_{B2}$ |
| 2311 | $L_{A391}$ | $L_{B2}$ |
| 2312 | $L_{A392}$ | $L_{B2}$ |
| 2313 | $L_{A393}$ | $L_{B2}$ |
| 2314 | $L_{A394}$ | $L_{B2}$ |

TABLE 2-continued

| Compound Number | $L_A$ | $L_B$ |
|---|---|---|
| 2315 | $L_{A395}$ | $L_{B2}$ |
| 2316 | $L_{A396}$ | $L_{B2}$ |
| 2317 | $L_{A397}$ | $L_{B2}$ |
| 2318 | $L_{A398}$ | $L_{B2}$ |
| 2319 | $L_{A399}$ | $L_{B2}$ |
| 2320 | $L_{A400}$ | $L_{B2}$ |
| 2321 | $L_{A401}$ | $L_{B2}$ |
| 2322 | $L_{A402}$ | $L_{B2}$ |
| 2323 | $L_{A403}$ | $L_{B2}$ |
| 2324 | $L_{A404}$ | $L_{B2}$ |
| 2325 | $L_{A405}$ | $L_{B2}$ |
| 2326 | $L_{A406}$ | $L_{B2}$ |
| 2327 | $L_{A407}$ | $L_{B2}$ |
| 2328 | $L_{A408}$ | $L_{B2}$ |
| 2329 | $L_{A409}$ | $L_{B2}$ |
| 2330 | $L_{A410}$ | $L_{B2}$ |
| 2331 | $L_{A411}$ | $L_{B2}$ |
| 2332 | $L_{A412}$ | $L_{B2}$ |
| 2333 | $L_{A413}$ | $L_{B2}$ |
| 2334 | $L_{A414}$ | $L_{B2}$ |
| 2335 | $L_{A415}$ | $L_{B2}$ |
| 2336 | $L_{A416}$ | $L_{B2}$ |
| 2337 | $L_{A417}$ | $L_{B2}$ |
| 2338 | $L_{A418}$ | $L_{B2}$ |
| 2339 | $L_{A419}$ | $L_{B2}$ |
| 2340 | $L_{A420}$ | $L_{B2}$ |
| 2341 | $L_{A421}$ | $L_{B2}$ |
| 2342 | $L_{A422}$ | $L_{B2}$ |
| 2343 | $L_{A423}$ | $L_{B2}$ |
| 2344 | $L_{A424}$ | $L_{B2}$ |
| 2345 | $L_{A425}$ | $L_{B2}$ |
| 2346 | $L_{A426}$ | $L_{B2}$ |
| 2347 | $L_{A427}$ | $L_{B2}$ |
| 2348 | $L_{A428}$ | $L_{B2}$ |
| 2349 | $L_{A429}$ | $L_{B2}$ |
| 2350 | $L_{A430}$ | $L_{B2}$ |
| 2351 | $L_{A431}$ | $L_{B2}$ |
| 2352 | $L_{A432}$ | $L_{B2}$ |
| 2353 | $L_{A433}$ | $L_{B2}$ |
| 2354 | $L_{A434}$ | $L_{B2}$ |
| 2355 | $L_{A435}$ | $L_{B2}$ |
| 2356 | $L_{A436}$ | $L_{B2}$ |
| 2357 | $L_{A437}$ | $L_{B2}$ |
| 2358 | $L_{A438}$ | $L_{B2}$ |
| 2359 | $L_{A439}$ | $L_{B2}$ |
| 2360 | $L_{A440}$ | $L_{B2}$ |
| 2361 | $L_{A441}$ | $L_{B2}$ |
| 2362 | $L_{A442}$ | $L_{B2}$ |
| 2363 | $L_{A443}$ | $L_{B2}$ |
| 2364 | $L_{A444}$ | $L_{B2}$ |
| 2365 | $L_{A445}$ | $L_{B2}$ |
| 2366 | $L_{A446}$ | $L_{B2}$ |
| 2367 | $L_{A447}$ | $L_{B2}$ |
| 2368 | $L_{A448}$ | $L_{B2}$ |
| 2369 | $L_{A449}$ | $L_{B2}$ |
| 2370 | $L_{A450}$ | $L_{B2}$ |
| 2371 | $L_{A451}$ | $L_{B2}$ |
| 2372 | $L_{A452}$ | $L_{B2}$ |
| 2373 | $L_{A453}$ | $L_{B2}$ |
| 2374 | $L_{A454}$ | $L_{B2}$ |
| 2375 | $L_{A455}$ | $L_{B2}$ |
| 2376 | $L_{A456}$ | $L_{B2}$ |
| 2377 | $L_{A457}$ | $L_{B2}$ |
| 2378 | $L_{A458}$ | $L_{B2}$ |
| 2379 | $L_{A459}$ | $L_{B2}$ |
| 2380 | $L_{A460}$ | $L_{B2}$ |
| 2381 | $L_{A461}$ | $L_{B2}$ |
| 2382 | $L_{A462}$ | $L_{B2}$ |
| 2383 | $L_{A463}$ | $L_{B2}$ |
| 2384 | $L_{A464}$ | $L_{B2}$ |
| 2385 | $L_{A465}$ | $L_{B2}$ |
| 2386 | $L_{A466}$ | $L_{B2}$ |
| 2387 | $L_{A467}$ | $L_{B2}$ |
| 2388 | $L_{A468}$ | $L_{B2}$ |
| 2389 | $L_{A469}$ | $L_{B2}$ |
| 2390 | $L_{A470}$ | $L_{B2}$ |
| 2391 | $L_{A471}$ | $L_{B2}$ |

TABLE 2-continued

| Compound Number | $L_A$ | $L_B$ |
|---|---|---|
| 2392 | $L_{A472}$ | $L_{B2}$ |
| 2393 | $L_{A473}$ | $L_{B2}$ |
| 2394 | $L_{A474}$ | $L_{B2}$ |
| 2395 | $L_{A475}$ | $L_{B2}$ |
| 2396 | $L_{A476}$ | $L_{B2}$ |
| 2397 | $L_{A477}$ | $L_{B2}$ |
| 2398 | $L_{A478}$ | $L_{B2}$ |
| 2399 | $L_{A479}$ | $L_{B2}$ |
| 2400 | $L_{A480}$ | $L_{B2}$ |
| 2401 | $L_{A481}$ | $L_{B2}$ |
| 2402 | $L_{A482}$ | $L_{B2}$ |
| 2403 | $L_{A483}$ | $L_{B2}$ |
| 2404 | $L_{A484}$ | $L_{B2}$ |
| 2405 | $L_{A485}$ | $L_{B2}$ |
| 2406 | $L_{A486}$ | $L_{B2}$ |
| 2407 | $L_{A487}$ | $L_{B2}$ |
| 2408 | $L_{A488}$ | $L_{B2}$ |
| 2409 | $L_{A489}$ | $L_{B2}$ |
| 2410 | $L_{A490}$ | $L_{B2}$ |
| 2411 | $L_{A491}$ | $L_{B2}$ |
| 2412 | $L_{A492}$ | $L_{B2}$ |
| 2413 | $L_{A493}$ | $L_{B2}$ |
| 2414 | $L_{A494}$ | $L_{B2}$ |
| 2415 | $L_{A495}$ | $L_{B2}$ |
| 2416 | $L_{A496}$ | $L_{B2}$ |
| 2417 | $L_{A497}$ | $L_{B2}$ |
| 2418 | $L_{A498}$ | $L_{B2}$ |
| 2419 | $L_{A499}$ | $L_{B2}$ |
| 2420 | $L_{A500}$ | $L_{B2}$ |
| 2421 | $L_{A501}$ | $L_{B2}$ |
| 2422 | $L_{A502}$ | $L_{B2}$ |
| 2423 | $L_{A503}$ | $L_{B2}$ |
| 2424 | $L_{A504}$ | $L_{B2}$ |
| 2425 | $L_{A505}$ | $L_{B2}$ |
| 2426 | $L_{A506}$ | $L_{B2}$ |
| 2427 | $L_{A507}$ | $L_{B2}$ |
| 2428 | $L_{A508}$ | $L_{B2}$ |
| 2429 | $L_{A509}$ | $L_{B2}$ |
| 2430 | $L_{A510}$ | $L_{B2}$ |
| 2431 | $L_{A511}$ | $L_{B2}$ |
| 2432 | $L_{A512}$ | $L_{B2}$ |
| 2433 | $L_{A513}$ | $L_{B2}$ |
| 2434 | $L_{A514}$ | $L_{B2}$ |
| 2435 | $L_{A515}$ | $L_{B2}$ |
| 2436 | $L_{A516}$ | $L_{B2}$ |
| 2437 | $L_{A517}$ | $L_{B2}$ |
| 2438 | $L_{A518}$ | $L_{B2}$ |
| 2439 | $L_{A519}$ | $L_{B2}$ |
| 2440 | $L_{A520}$ | $L_{B2}$ |
| 2441 | $L_{A521}$ | $L_{B2}$ |
| 2442 | $L_{A522}$ | $L_{B2}$ |
| 2443 | $L_{A523}$ | $L_{B2}$ |
| 2444 | $L_{A524}$ | $L_{B2}$ |
| 2445 | $L_{A525}$ | $L_{B2}$ |
| 2446 | $L_{A526}$ | $L_{B2}$ |
| 2447 | $L_{A527}$ | $L_{B2}$ |
| 2448 | $L_{A528}$ | $L_{B2}$ |
| 2449 | $L_{A529}$ | $L_{B2}$ |
| 2450 | $L_{A530}$ | $L_{B2}$ |
| 2451 | $L_{A531}$ | $L_{B2}$ |
| 2452 | $L_{A532}$ | $L_{B2}$ |
| 2453 | $L_{A533}$ | $L_{B2}$ |
| 2454 | $L_{A534}$ | $L_{B2}$ |
| 2455 | $L_{A535}$ | $L_{B2}$ |
| 2456 | $L_{A536}$ | $L_{B2}$ |
| 2457 | $L_{A537}$ | $L_{B2}$ |
| 2458 | $L_{A538}$ | $L_{B2}$ |
| 2459 | $L_{A539}$ | $L_{B2}$ |
| 2460 | $L_{A540}$ | $L_{B2}$ |
| 2461 | $L_{A541}$ | $L_{B2}$ |
| 2462 | $L_{A542}$ | $L_{B2}$ |
| 2463 | $L_{A543}$ | $L_{B2}$ |
| 2464 | $L_{A544}$ | $L_{B2}$ |
| 2465 | $L_{A545}$ | $L_{B2}$ |
| 2466 | $L_{A546}$ | $L_{B2}$ |
| 2467 | $L_{A547}$ | $L_{B2}$ |
| 2468 | $L_{A548}$ | $L_{B2}$ |

TABLE 2-continued

| Compound Number | $L_A$ | $L_B$ |
|---|---|---|
| 2469 | $L_{A549}$ | $L_{B2}$ |
| 2470 | $L_{A550}$ | $L_{B2}$ |
| 2471 | $L_{A551}$ | $L_{B2}$ |
| 2472 | $L_{A552}$ | $L_{B2}$ |
| 2473 | $L_{A553}$ | $L_{B2}$ |
| 2474 | $L_{A554}$ | $L_{B2}$ |
| 2475 | $L_{A555}$ | $L_{B2}$ |
| 2476 | $L_{A556}$ | $L_{B2}$ |
| 2477 | $L_{A557}$ | $L_{B2}$ |
| 2478 | $L_{A558}$ | $L_{B2}$ |
| 2479 | $L_{A559}$ | $L_{B2}$ |
| 2480 | $L_{A560}$ | $L_{B2}$ |
| 2481 | $L_{A561}$ | $L_{B2}$ |
| 2482 | $L_{A562}$ | $L_{B2}$ |
| 2483 | $L_{A563}$ | $L_{B2}$ |
| 2484 | $L_{A564}$ | $L_{B2}$ |
| 2485 | $L_{A565}$ | $L_{B2}$ |
| 2486 | $L_{A566}$ | $L_{B2}$ |
| 2487 | $L_{A567}$ | $L_{B2}$ |
| 2488 | $L_{A568}$ | $L_{B2}$ |
| 2489 | $L_{A569}$ | $L_{B2}$ |
| 2490 | $L_{A570}$ | $L_{B2}$ |
| 2491 | $L_{A571}$ | $L_{B2}$ |
| 2492 | $L_{A572}$ | $L_{B2}$ |
| 2493 | $L_{A573}$ | $L_{B2}$ |
| 2494 | $L_{A574}$ | $L_{B2}$ |
| 2495 | $L_{A575}$ | $L_{B2}$ |
| 2496 | $L_{A576}$ | $L_{B2}$ |
| 2497 | $L_{A577}$ | $L_{B2}$ |
| 2498 | $L_{A578}$ | $L_{B2}$ |
| 2499 | $L_{A579}$ | $L_{B2}$ |
| 2500 | $L_{A580}$ | $L_{B2}$ |
| 2501 | $L_{A581}$ | $L_{B2}$ |
| 2502 | $L_{A582}$ | $L_{B2}$ |
| 2503 | $L_{A583}$ | $L_{B2}$ |
| 2504 | $L_{A584}$ | $L_{B2}$ |
| 2505 | $L_{A585}$ | $L_{B2}$ |
| 2506 | $L_{A586}$ | $L_{B2}$ |
| 2507 | $L_{A587}$ | $L_{B2}$ |
| 2508 | $L_{A588}$ | $L_{B2}$ |
| 2509 | $L_{A589}$ | $L_{B2}$ |
| 2510 | $L_{A590}$ | $L_{B2}$ |
| 2511 | $L_{A591}$ | $L_{B2}$ |
| 2512 | $L_{A592}$ | $L_{B2}$ |
| 2513 | $L_{A593}$ | $L_{B2}$ |
| 2514 | $L_{A594}$ | $L_{B2}$ |
| 2515 | $L_{A595}$ | $L_{B2}$ |
| 2516 | $L_{A596}$ | $L_{B2}$ |
| 2517 | $L_{A597}$ | $L_{B2}$ |
| 2518 | $L_{A598}$ | $L_{B2}$ |
| 2519 | $L_{A599}$ | $L_{B2}$ |
| 2520 | $L_{A600}$ | $L_{B2}$ |
| 2521 | $L_{A601}$ | $L_{B2}$ |
| 2522 | $L_{A602}$ | $L_{B2}$ |
| 2523 | $L_{A603}$ | $L_{B2}$ |
| 2524 | $L_{A604}$ | $L_{B2}$ |
| 2525 | $L_{A605}$ | $L_{B2}$ |
| 2526 | $L_{A606}$ | $L_{B2}$ |
| 2527 | $L_{A607}$ | $L_{B2}$ |
| 2528 | $L_{A608}$ | $L_{B2}$ |
| 2529 | $L_{A609}$ | $L_{B2}$ |
| 2530 | $L_{A610}$ | $L_{B2}$ |
| 2531 | $L_{A611}$ | $L_{B2}$ |
| 2532 | $L_{A612}$ | $L_{B2}$ |
| 2533 | $L_{A613}$ | $L_{B2}$ |
| 2534 | $L_{A614}$ | $L_{B2}$ |
| 2535 | $L_{A615}$ | $L_{B2}$ |
| 2536 | $L_{A616}$ | $L_{B2}$ |
| 2537 | $L_{A617}$ | $L_{B2}$ |
| 2538 | $L_{A618}$ | $L_{B2}$ |
| 2539 | $L_{A619}$ | $L_{B2}$ |
| 2540 | $L_{A620}$ | $L_{B2}$ |
| 2541 | $L_{A621}$ | $L_{B2}$ |
| 2542 | $L_{A622}$ | $L_{B2}$ |
| 2543 | $L_{A623}$ | $L_{B2}$ |
| 2544 | $L_{A624}$ | $L_{B2}$ |
| 2545 | $L_{A625}$ | $L_{B2}$ |

TABLE 2-continued

| Compound Number | $L_A$ | $L_B$ |
|---|---|---|
| 2546 | $L_{A626}$ | $L_{B2}$ |
| 2547 | $L_{A627}$ | $L_{B2}$ |
| 2548 | $L_{A628}$ | $L_{B2}$ |
| 2549 | $L_{A629}$ | $L_{B2}$ |
| 2550 | $L_{A630}$ | $L_{B2}$ |
| 2551 | $L_{A631}$ | $L_{B2}$ |
| 2552 | $L_{A632}$ | $L_{B2}$ |
| 2553 | $L_{A633}$ | $L_{B2}$ |
| 2554 | $L_{A634}$ | $L_{B2}$ |
| 2555 | $L_{A635}$ | $L_{B2}$ |
| 2556 | $L_{A636}$ | $L_{B2}$ |
| 2557 | $L_{A637}$ | $L_{B2}$ |
| 2558 | $L_{A638}$ | $L_{B2}$ |
| 2559 | $L_{A639}$ | $L_{B2}$ |
| 2560 | $L_{A640}$ | $L_{B2}$ |
| 2561 | $L_{A641}$ | $L_{B2}$ |
| 2562 | $L_{A642}$ | $L_{B2}$ |
| 2563 | $L_{A643}$ | $L_{B2}$ |
| 2564 | $L_{A644}$ | $L_{B2}$ |
| 2565 | $L_{A645}$ | $L_{B2}$ |
| 2566 | $L_{A646}$ | $L_{B2}$ |
| 2567 | $L_{A647}$ | $L_{B2}$ |
| 2568 | $L_{A648}$ | $L_{B2}$ |
| 2569 | $L_{A649}$ | $L_{B2}$ |
| 2570 | $L_{A650}$ | $L_{B2}$ |
| 2571 | $L_{A651}$ | $L_{B2}$ |
| 2572 | $L_{A652}$ | $L_{B2}$ |
| 2573 | $L_{A653}$ | $L_{B2}$ |
| 2574 | $L_{A654}$ | $L_{B2}$ |
| 2575 | $L_{A655}$ | $L_{B2}$ |
| 2576 | $L_{A656}$ | $L_{B2}$ |
| 2577 | $L_{A657}$ | $L_{B2}$ |
| 2578 | $L_{A658}$ | $L_{B2}$ |
| 2579 | $L_{A659}$ | $L_{B2}$ |
| 2580 | $L_{A660}$ | $L_{B2}$ |
| 2581 | $L_{A661}$ | $L_{B2}$ |
| 2582 | $L_{A662}$ | $L_{B2}$ |
| 2583 | $L_{A663}$ | $L_{B2}$ |
| 2584 | $L_{A664}$ | $L_{B2}$ |
| 2585 | $L_{A665}$ | $L_{B2}$ |
| 2586 | $L_{A666}$ | $L_{B2}$ |
| 2587 | $L_{A667}$ | $L_{B2}$ |
| 2588 | $L_{A668}$ | $L_{B2}$ |
| 2589 | $L_{A669}$ | $L_{B2}$ |
| 2590 | $L_{A670}$ | $L_{B2}$ |
| 2591 | $L_{A671}$ | $L_{B2}$ |
| 2592 | $L_{A672}$ | $L_{B2}$ |
| 2593 | $L_{A673}$ | $L_{B2}$ |
| 2594 | $L_{A674}$ | $L_{B2}$ |
| 2595 | $L_{A675}$ | $L_{B2}$ |
| 2596 | $L_{A676}$ | $L_{B2}$ |
| 2597 | $L_{A677}$ | $L_{B2}$ |
| 2598 | $L_{A678}$ | $L_{B2}$ |
| 2599 | $L_{A679}$ | $L_{B2}$ |
| 2600 | $L_{A680}$ | $L_{B2}$ |
| 2601 | $L_{A681}$ | $L_{B2}$ |
| 2602 | $L_{A682}$ | $L_{B2}$ |
| 2603 | $L_{A683}$ | $L_{B2}$ |
| 2604 | $L_{A684}$ | $L_{B2}$ |
| 2605 | $L_{A685}$ | $L_{B2}$ |
| 2606 | $L_{A686}$ | $L_{B2}$ |
| 2607 | $L_{A687}$ | $L_{B2}$ |
| 2608 | $L_{A688}$ | $L_{B2}$ |
| 2609 | $L_{A689}$ | $L_{B2}$ |
| 2610 | $L_{A690}$ | $L_{B2}$ |
| 2611 | $L_{A691}$ | $L_{B2}$ |
| 2612 | $L_{A692}$ | $L_{B2}$ |
| 2613 | $L_{A693}$ | $L_{B2}$ |
| 2614 | $L_{A694}$ | $L_{B2}$ |
| 2615 | $L_{A695}$ | $L_{B2}$ |
| 2616 | $L_{A696}$ | $L_{B2}$ |
| 2617 | $L_{A697}$ | $L_{B2}$ |
| 2618 | $L_{A698}$ | $L_{B2}$ |
| 2619 | $L_{A699}$ | $L_{B2}$ |
| 2620 | $L_{A700}$ | $L_{B2}$ |
| 2621 | $L_{A701}$ | $L_{B2}$ |
| 2622 | $L_{A702}$ | $L_{B2}$ |

TABLE 2-continued

| Compound Number | $L_A$ | $L_B$ |
|---|---|---|
| 2623 | $L_{A703}$ | $L_{B2}$ |
| 2624 | $L_{A704}$ | $L_{B2}$ |
| 2625 | $L_{A705}$ | $L_{B2}$ |
| 2626 | $L_{A706}$ | $L_{B2}$ |
| 2627 | $L_{A707}$ | $L_{B2}$ |
| 2628 | $L_{A708}$ | $L_{B2}$ |
| 2629 | $L_{A709}$ | $L_{B2}$ |
| 2630 | $L_{A710}$ | $L_{B2}$ |
| 2631 | $L_{A711}$ | $L_{B2}$ |
| 2632 | $L_{A712}$ | $L_{B2}$ |
| 2633 | $L_{A713}$ | $L_{B2}$ |
| 2634 | $L_{A714}$ | $L_{B2}$ |
| 2635 | $L_{A715}$ | $L_{B2}$ |
| 2636 | $L_{A716}$ | $L_{B2}$ |
| 2637 | $L_{A717}$ | $L_{B2}$ |
| 2638 | $L_{A718}$ | $L_{B2}$ |
| 2639 | $L_{A719}$ | $L_{B2}$ |
| 2640 | $L_{A720}$ | $L_{B2}$ |
| 2641 | $L_{A721}$ | $L_{B2}$ |
| 2642 | $L_{A722}$ | $L_{B2}$ |
| 2643 | $L_{A723}$ | $L_{B2}$ |
| 2644 | $L_{A724}$ | $L_{B2}$ |
| 2645 | $L_{A725}$ | $L_{B2}$ |
| 2646 | $L_{A726}$ | $L_{B2}$ |
| 2647 | $L_{A727}$ | $L_{B2}$ |
| 2648 | $L_{A728}$ | $L_{B2}$ |
| 2649 | $L_{A729}$ | $L_{B2}$ |
| 2650 | $L_{A730}$ | $L_{B2}$ |
| 2651 | $L_{A731}$ | $L_{B2}$ |
| 2652 | $L_{A732}$ | $L_{B2}$ |
| 2653 | $L_{A733}$ | $L_{B2}$ |
| 2654 | $L_{A734}$ | $L_{B2}$ |
| 2655 | $L_{A735}$ | $L_{B2}$ |
| 2656 | $L_{A736}$ | $L_{B2}$ |
| 2657 | $L_{A737}$ | $L_{B2}$ |
| 2658 | $L_{A738}$ | $L_{B2}$ |
| 2659 | $L_{A739}$ | $L_{B2}$ |
| 2660 | $L_{A740}$ | $L_{B2}$ |
| 2661 | $L_{A741}$ | $L_{B2}$ |
| 2662 | $L_{A742}$ | $L_{B2}$ |
| 2663 | $L_{A743}$ | $L_{B2}$ |
| 2664 | $L_{A744}$ | $L_{B2}$ |
| 2665 | $L_{A745}$ | $L_{B2}$ |
| 2666 | $L_{A746}$ | $L_{B2}$ |
| 2667 | $L_{A747}$ | $L_{B2}$ |
| 2668 | $L_{A748}$ | $L_{B2}$ |
| 2669 | $L_{A749}$ | $L_{B2}$ |
| 2670 | $L_{A750}$ | $L_{B2}$ |
| 2671 | $L_{A751}$ | $L_{B2}$ |
| 2672 | $L_{A752}$ | $L_{B2}$ |
| 2673 | $L_{A753}$ | $L_{B2}$ |
| 2674 | $L_{A754}$ | $L_{B2}$ |
| 2675 | $L_{A755}$ | $L_{B2}$ |
| 2676 | $L_{A756}$ | $L_{B2}$ |
| 2677 | $L_{A757}$ | $L_{B2}$ |
| 2678 | $L_{A758}$ | $L_{B2}$ |
| 2679 | $L_{A759}$ | $L_{B2}$ |
| 2680 | $L_{A760}$ | $L_{B2}$ |
| 2681 | $L_{A761}$ | $L_{B2}$ |
| 2682 | $L_{A762}$ | $L_{B2}$ |
| 2683 | $L_{A763}$ | $L_{B2}$ |
| 2684 | $L_{A764}$ | $L_{B2}$ |
| 2685 | $L_{A765}$ | $L_{B2}$ |
| 2686 | $L_{A766}$ | $L_{B2}$ |
| 2687 | $L_{A767}$ | $L_{B2}$ |
| 2688 | $L_{A768}$ | $L_{B2}$ |
| 2689 | $L_{A769}$ | $L_{B2}$ |
| 2690 | $L_{A770}$ | $L_{B2}$ |
| 2691 | $L_{A771}$ | $L_{B2}$ |
| 2692 | $L_{A772}$ | $L_{B2}$ |
| 2693 | $L_{A773}$ | $L_{B2}$ |
| 2694 | $L_{A774}$ | $L_{B2}$ |
| 2695 | $L_{A775}$ | $L_{B2}$ |
| 2696 | $L_{A776}$ | $L_{B2}$ |
| 2697 | $L_{A777}$ | $L_{B2}$ |
| 2698 | $L_{A778}$ | $L_{B2}$ |
| 2699 | $L_{A779}$ | $L_{B2}$ |

TABLE 2-continued

| Compound Number | $L_A$ | $L_B$ |
|---|---|---|
| 2700 | $L_{A780}$ | $L_{B2}$ |
| 2701 | $L_{A781}$ | $L_{B2}$ |
| 2702 | $L_{A782}$ | $L_{B2}$ |
| 2703 | $L_{A783}$ | $L_{B2}$ |
| 2704 | $L_{A784}$ | $L_{B2}$ |
| 2705 | $L_{A785}$ | $L_{B2}$ |
| 2706 | $L_{A786}$ | $L_{B2}$ |
| 2707 | $L_{A787}$ | $L_{B2}$ |
| 2708 | $L_{A788}$ | $L_{B2}$ |
| 2709 | $L_{A789}$ | $L_{B2}$ |
| 2710 | $L_{A790}$ | $L_{B2}$ |
| 2711 | $L_{A791}$ | $L_{B2}$ |
| 2712 | $L_{A792}$ | $L_{B2}$ |
| 2713 | $L_{A793}$ | $L_{B2}$ |
| 2714 | $L_{A794}$ | $L_{B2}$ |
| 2715 | $L_{A795}$ | $L_{B2}$ |
| 2716 | $L_{A796}$ | $L_{B2}$ |
| 2717 | $L_{A797}$ | $L_{B2}$ |
| 2718 | $L_{A798}$ | $L_{B2}$ |
| 2719 | $L_{A799}$ | $L_{B2}$ |
| 2720 | $L_{A800}$ | $L_{B2}$ |
| 2721 | $L_{A801}$ | $L_{B2}$ |
| 2722 | $L_{A802}$ | $L_{B2}$ |
| 2723 | $L_{A803}$ | $L_{B2}$ |
| 2724 | $L_{A804}$ | $L_{B2}$ |
| 2725 | $L_{A805}$ | $L_{B2}$ |
| 2726 | $L_{A806}$ | $L_{B2}$ |
| 2727 | $L_{A807}$ | $L_{B2}$ |
| 2728 | $L_{A808}$ | $L_{B2}$ |
| 2729 | $L_{A809}$ | $L_{B2}$ |
| 2730 | $L_{A810}$ | $L_{B2}$ |
| 2731 | $L_{A811}$ | $L_{B2}$ |
| 2732 | $L_{A812}$ | $L_{B2}$ |
| 2733 | $L_{A813}$ | $L_{B2}$ |
| 2734 | $L_{A814}$ | $L_{B2}$ |
| 2735 | $L_{A815}$ | $L_{B2}$ |
| 2736 | $L_{A816}$ | $L_{B2}$ |
| 2737 | $L_{A817}$ | $L_{B2}$ |
| 2738 | $L_{A818}$ | $L_{B2}$ |
| 2739 | $L_{A819}$ | $L_{B2}$ |
| 2740 | $L_{A820}$ | $L_{B2}$ |
| 2741 | $L_{A821}$ | $L_{B2}$ |
| 2742 | $L_{A822}$ | $L_{B2}$ |
| 2743 | $L_{A823}$ | $L_{B2}$ |
| 2744 | $L_{A824}$ | $L_{B2}$ |
| 2745 | $L_{A825}$ | $L_{B2}$ |
| 2746 | $L_{A826}$ | $L_{B2}$ |
| 2747 | $L_{A827}$ | $L_{B2}$ |
| 2748 | $L_{A828}$ | $L_{B2}$ |
| 2749 | $L_{A829}$ | $L_{B2}$ |
| 2750 | $L_{A830}$ | $L_{B2}$ |
| 2751 | $L_{A831}$ | $L_{B2}$ |
| 2752 | $L_{A832}$ | $L_{B2}$ |
| 2753 | $L_{A833}$ | $L_{B2}$ |
| 2754 | $L_{A834}$ | $L_{B2}$ |
| 2755 | $L_{A835}$ | $L_{B2}$ |
| 2756 | $L_{A836}$ | $L_{B2}$ |
| 2757 | $L_{A837}$ | $L_{B2}$ |
| 2758 | $L_{A838}$ | $L_{B2}$ |
| 2759 | $L_{A839}$ | $L_{B2}$ |
| 2760 | $L_{A840}$ | $L_{B2}$ |
| 2761 | $L_{A841}$ | $L_{B2}$ |
| 2762 | $L_{A842}$ | $L_{B2}$ |
| 2763 | $L_{A843}$ | $L_{B2}$ |
| 2764 | $L_{A844}$ | $L_{B2}$ |
| 2765 | $L_{A845}$ | $L_{B2}$ |
| 2766 | $L_{A846}$ | $L_{B2}$ |
| 2767 | $L_{A847}$ | $L_{B2}$ |
| 2768 | $L_{A848}$ | $L_{B2}$ |
| 2769 | $L_{A849}$ | $L_{B2}$ |
| 2770 | $L_{A850}$ | $L_{B2}$ |
| 2771 | $L_{A851}$ | $L_{B2}$ |
| 2772 | $L_{A852}$ | $L_{B2}$ |
| 2773 | $L_{A853}$ | $L_{B2}$ |
| 2774 | $L_{A854}$ | $L_{B2}$ |
| 2775 | $L_{A855}$ | $L_{B2}$ |
| 2776 | $L_{A856}$ | $L_{B2}$ |

TABLE 2-continued

| Compound Number | $L_A$ | $L_B$ |
|---|---|---|
| 2777 | $L_{A857}$ | $L_{B2}$ |
| 2778 | $L_{A858}$ | $L_{B2}$ |
| 2779 | $L_{A859}$ | $L_{B2}$ |
| 2780 | $L_{A860}$ | $L_{B2}$ |
| 2781 | $L_{A861}$ | $L_{B2}$ |
| 2782 | $L_{A862}$ | $L_{B2}$ |
| 2783 | $L_{A863}$ | $L_{B2}$ |
| 2784 | $L_{A864}$ | $L_{B2}$ |
| 2785 | $L_{A865}$ | $L_{B2}$ |
| 2786 | $L_{A866}$ | $L_{B2}$ |
| 2787 | $L_{A867}$ | $L_{B2}$ |
| 2788 | $L_{A868}$ | $L_{B2}$ |
| 2789 | $L_{A869}$ | $L_{B2}$ |
| 2790 | $L_{A870}$ | $L_{B2}$ |
| 2791 | $L_{A871}$ | $L_{B2}$ |
| 2792 | $L_{A872}$ | $L_{B2}$ |
| 2793 | $L_{A873}$ | $L_{B2}$ |
| 2794 | $L_{A874}$ | $L_{B2}$ |
| 2795 | $L_{A875}$ | $L_{B2}$ |
| 2796 | $L_{A876}$ | $L_{B2}$ |
| 2797 | $L_{A877}$ | $L_{B2}$ |
| 2798 | $L_{A878}$ | $L_{B2}$ |
| 2799 | $L_{A879}$ | $L_{B2}$ |
| 2800 | $L_{A880}$ | $L_{B2}$ |
| 2801 | $L_{A881}$ | $L_{B2}$ |
| 2802 | $L_{A882}$ | $L_{B2}$ |
| 2803 | $L_{A883}$ | $L_{B2}$ |
| 2804 | $L_{A884}$ | $L_{B2}$ |
| 2805 | $L_{A885}$ | $L_{B2}$ |
| 2806 | $L_{A886}$ | $L_{B2}$ |
| 2807 | $L_{A887}$ | $L_{B2}$ |
| 2808 | $L_{A888}$ | $L_{B2}$ |
| 2809 | $L_{A889}$ | $L_{B2}$ |
| 2810 | $L_{A890}$ | $L_{B2}$ |
| 2811 | $L_{A891}$ | $L_{B2}$ |
| 2812 | $L_{A892}$ | $L_{B2}$ |
| 2813 | $L_{A893}$ | $L_{B2}$ |
| 2814 | $L_{A894}$ | $L_{B2}$ |
| 2815 | $L_{A895}$ | $L_{B2}$ |
| 2816 | $L_{A896}$ | $L_{B2}$ |
| 2817 | $L_{A897}$ | $L_{B2}$ |
| 2818 | $L_{A898}$ | $L_{B2}$ |
| 2819 | $L_{A899}$ | $L_{B2}$ |
| 2820 | $L_{A900}$ | $L_{B2}$ |
| 2821 | $L_{A901}$ | $L_{B2}$ |
| 2822 | $L_{A902}$ | $L_{B2}$ |
| 2823 | $L_{A903}$ | $L_{B2}$ |
| 2824 | $L_{A904}$ | $L_{B2}$ |
| 2825 | $L_{A905}$ | $L_{B2}$ |
| 2826 | $L_{A906}$ | $L_{B2}$ |
| 2827 | $L_{A907}$ | $L_{B2}$ |
| 2828 | $L_{A908}$ | $L_{B2}$ |
| 2829 | $L_{A909}$ | $L_{B2}$ |
| 2830 | $L_{A910}$ | $L_{B2}$ |
| 2831 | $L_{A911}$ | $L_{B2}$ |
| 2832 | $L_{A912}$ | $L_{B2}$ |
| 2833 | $L_{A913}$ | $L_{B2}$ |
| 2834 | $L_{A914}$ | $L_{B2}$ |
| 2835 | $L_{A915}$ | $L_{B2}$ |
| 2836 | $L_{A916}$ | $L_{B2}$ |
| 2837 | $L_{A917}$ | $L_{B2}$ |
| 2838 | $L_{A918}$ | $L_{B2}$ |
| 2839 | $L_{A919}$ | $L_{B2}$ |
| 2840 | $L_{A920}$ | $L_{B2}$ |
| 2841 | $L_{A921}$ | $L_{B2}$ |
| 2842 | $L_{A922}$ | $L_{B2}$ |
| 2843 | $L_{A923}$ | $L_{B2}$ |
| 2844 | $L_{A924}$ | $L_{B2}$ |
| 2845 | $L_{A925}$ | $L_{B2}$ |
| 2846 | $L_{A926}$ | $L_{B2}$ |
| 2847 | $L_{A927}$ | $L_{B2}$ |
| 2848 | $L_{A928}$ | $L_{B2}$ |
| 2849 | $L_{A929}$ | $L_{B2}$ |
| 2850 | $L_{A930}$ | $L_{B2}$ |
| 2851 | $L_{A931}$ | $L_{B2}$ |
| 2852 | $L_{A932}$ | $L_{B2}$ |
| 2853 | $L_{A933}$ | $L_{B2}$ |

TABLE 2-continued

| Compound Number | $L_A$ | $L_B$ |
|---|---|---|
| 2854 | $L_{A934}$ | $L_{B2}$ |
| 2855 | $L_{A935}$ | $L_{B2}$ |
| 2856 | $L_{A936}$ | $L_{B2}$ |
| 2857 | $L_{A937}$ | $L_{B2}$ |
| 2858 | $L_{A938}$ | $L_{B2}$ |
| 2859 | $L_{A939}$ | $L_{B2}$ |
| 2860 | $L_{A940}$ | $L_{B2}$ |
| 2861 | $L_{A941}$ | $L_{B2}$ |
| 2862 | $L_{A942}$ | $L_{B2}$ |
| 2863 | $L_{A943}$ | $L_{B2}$ |
| 2864 | $L_{A944}$ | $L_{B2}$ |
| 2865 | $L_{A945}$ | $L_{B2}$ |
| 2866 | $L_{A946}$ | $L_{B2}$ |
| 2867 | $L_{A947}$ | $L_{B2}$ |
| 2868 | $L_{A948}$ | $L_{B2}$ |
| 2869 | $L_{A949}$ | $L_{B2}$ |
| 2870 | $L_{A950}$ | $L_{B2}$ |
| 2871 | $L_{A951}$ | $L_{B2}$ |
| 2872 | $L_{A952}$ | $L_{B2}$ |
| 2873 | $L_{A953}$ | $L_{B2}$ |
| 2874 | $L_{A954}$ | $L_{B2}$ |
| 2875 | $L_{A955}$ | $L_{B2}$ |
| 2876 | $L_{A956}$ | $L_{B2}$ |
| 2877 | $L_{A957}$ | $L_{B2}$ |
| 2878 | $L_{A958}$ | $L_{B2}$ |
| 2879 | $L_{A959}$ | $L_{B2}$ |
| 2880 | $L_{A960}$ | $L_{B2}$ |
| 2881 | $L_{A1}$ | $L_{B5}$ |
| 2882 | $L_{A2}$ | $L_{B5}$ |
| 2883 | $L_{A3}$ | $L_{B5}$ |
| 2884 | $L_{A4}$ | $L_{B5}$ |
| 2885 | $L_{A5}$ | $L_{B5}$ |
| 2886 | $L_{A6}$ | $L_{B5}$ |
| 2887 | $L_{A7}$ | $L_{B5}$ |
| 2888 | $L_{A8}$ | $L_{B5}$ |
| 2889 | $L_{A9}$ | $L_{B5}$ |
| 2890 | $L_{A10}$ | $L_{B5}$ |
| 2891 | $L_{A11}$ | $L_{B5}$ |
| 2892 | $L_{A12}$ | $L_{B5}$ |
| 2893 | $L_{A13}$ | $L_{B5}$ |
| 2894 | $L_{A14}$ | $L_{B5}$ |
| 2895 | $L_{A15}$ | $L_{B5}$ |
| 2896 | $L_{A16}$ | $L_{B5}$ |
| 2897 | $L_{A17}$ | $L_{B5}$ |
| 2898 | $L_{A18}$ | $L_{B5}$ |
| 2899 | $L_{A19}$ | $L_{B5}$ |
| 2900 | $L_{A20}$ | $L_{B5}$ |
| 2901 | $L_{A21}$ | $L_{B5}$ |
| 2902 | $L_{A22}$ | $L_{B5}$ |
| 2903 | $L_{A23}$ | $L_{B5}$ |
| 2904 | $L_{A24}$ | $L_{B5}$ |
| 2905 | $L_{A25}$ | $L_{B5}$ |
| 2906 | $L_{A26}$ | $L_{B5}$ |
| 2907 | $L_{A27}$ | $L_{B5}$ |
| 2908 | $L_{A28}$ | $L_{B5}$ |
| 2909 | $L_{A29}$ | $L_{B5}$ |
| 2910 | $L_{A30}$ | $L_{B5}$ |
| 2911 | $L_{A31}$ | $L_{B5}$ |
| 2912 | $L_{A32}$ | $L_{B5}$ |
| 2913 | $L_{A33}$ | $L_{B5}$ |
| 2914 | $L_{A34}$ | $L_{B5}$ |
| 2915 | $L_{A35}$ | $L_{B5}$ |
| 2916 | $L_{A36}$ | $L_{B5}$ |
| 2917 | $L_{A37}$ | $L_{B5}$ |
| 2918 | $L_{A38}$ | $L_{B5}$ |
| 2919 | $L_{A39}$ | $L_{B5}$ |
| 2920 | $L_{A40}$ | $L_{B5}$ |
| 2921 | $L_{A41}$ | $L_{B5}$ |
| 2922 | $L_{A42}$ | $L_{B5}$ |
| 2923 | $L_{A43}$ | $L_{B5}$ |
| 2924 | $L_{A44}$ | $L_{B5}$ |
| 2925 | $L_{A45}$ | $L_{B5}$ |
| 2926 | $L_{A46}$ | $L_{B5}$ |
| 2927 | $L_{A47}$ | $L_{B5}$ |
| 2928 | $L_{A48}$ | $L_{B5}$ |
| 2929 | $L_{A49}$ | $L_{B5}$ |
| 2930 | $L_{A50}$ | $L_{B5}$ |

TABLE 2-continued

| Compound Number | $L_A$ | $L_B$ |
|---|---|---|
| 2931 | $L_{A51}$ | $L_{B5}$ |
| 2932 | $L_{A52}$ | $L_{B5}$ |
| 2933 | $L_{A53}$ | $L_{B5}$ |
| 2934 | $L_{A54}$ | $L_{B5}$ |
| 2935 | $L_{A55}$ | $L_{B5}$ |
| 2936 | $L_{A56}$ | $L_{B5}$ |
| 2937 | $L_{A57}$ | $L_{B5}$ |
| 2938 | $L_{A58}$ | $L_{B5}$ |
| 2939 | $L_{A59}$ | $L_{B5}$ |
| 2940 | $L_{A60}$ | $L_{B5}$ |
| 2941 | $L_{A61}$ | $L_{B5}$ |
| 2942 | $L_{A62}$ | $L_{B5}$ |
| 2943 | $L_{A63}$ | $L_{B5}$ |
| 2944 | $L_{A64}$ | $L_{B5}$ |
| 2945 | $L_{A65}$ | $L_{B5}$ |
| 2946 | $L_{A66}$ | $L_{B5}$ |
| 2947 | $L_{A67}$ | $L_{B5}$ |
| 2948 | $L_{A68}$ | $L_{B5}$ |
| 2949 | $L_{A69}$ | $L_{B5}$ |
| 2950 | $L_{A70}$ | $L_{B5}$ |
| 2951 | $L_{A71}$ | $L_{B5}$ |
| 2952 | $L_{A72}$ | $L_{B5}$ |
| 2953 | $L_{A73}$ | $L_{B5}$ |
| 2954 | $L_{A74}$ | $L_{B5}$ |
| 2955 | $L_{A75}$ | $L_{B5}$ |
| 2956 | $L_{A76}$ | $L_{B5}$ |
| 2957 | $L_{A77}$ | $L_{B5}$ |
| 2958 | $L_{A78}$ | $L_{B5}$ |
| 2959 | $L_{A79}$ | $L_{B5}$ |
| 2960 | $L_{A80}$ | $L_{B5}$ |
| 2961 | $L_{A81}$ | $L_{B5}$ |
| 2962 | $L_{A82}$ | $L_{B5}$ |
| 2963 | $L_{A83}$ | $L_{B5}$ |
| 2964 | $L_{A84}$ | $L_{B5}$ |
| 2965 | $L_{A85}$ | $L_{B5}$ |
| 2966 | $L_{A86}$ | $L_{B5}$ |
| 2967 | $L_{A87}$ | $L_{B5}$ |
| 2968 | $L_{A88}$ | $L_{B5}$ |
| 2969 | $L_{A89}$ | $L_{B5}$ |
| 2970 | $L_{A90}$ | $L_{B5}$ |
| 2971 | $L_{A91}$ | $L_{B5}$ |
| 2972 | $L_{A92}$ | $L_{B5}$ |
| 2973 | $L_{A93}$ | $L_{B5}$ |
| 2974 | $L_{A94}$ | $L_{B5}$ |
| 2975 | $L_{A95}$ | $L_{B5}$ |
| 2976 | $L_{A96}$ | $L_{B5}$ |
| 2977 | $L_{A97}$ | $L_{B5}$ |
| 2978 | $L_{A98}$ | $L_{B5}$ |
| 2979 | $L_{A99}$ | $L_{B5}$ |
| 2980 | $L_{A100}$ | $L_{B5}$ |
| 2981 | $L_{A101}$ | $L_{B5}$ |
| 2982 | $L_{A102}$ | $L_{B5}$ |
| 2983 | $L_{A103}$ | $L_{B5}$ |
| 2984 | $L_{A104}$ | $L_{B5}$ |
| 2985 | $L_{A105}$ | $L_{B5}$ |
| 2986 | $L_{A106}$ | $L_{B5}$ |
| 2987 | $L_{A107}$ | $L_{B5}$ |
| 2988 | $L_{A108}$ | $L_{B5}$ |
| 2989 | $L_{A109}$ | $L_{B5}$ |
| 2990 | $L_{A110}$ | $L_{B5}$ |
| 2991 | $L_{A111}$ | $L_{B5}$ |
| 2992 | $L_{A112}$ | $L_{B5}$ |
| 2993 | $L_{A113}$ | $L_{B5}$ |
| 2994 | $L_{A114}$ | $L_{B5}$ |
| 2995 | $L_{A115}$ | $L_{B5}$ |
| 2996 | $L_{A116}$ | $L_{B5}$ |
| 2997 | $L_{A117}$ | $L_{B5}$ |
| 2998 | $L_{A118}$ | $L_{B5}$ |
| 2999 | $L_{A119}$ | $L_{B5}$ |
| 3000 | $L_{A120}$ | $L_{B5}$ |
| 3001 | $L_{A121}$ | $L_{B5}$ |
| 3002 | $L_{A122}$ | $L_{B5}$ |
| 3003 | $L_{A123}$ | $L_{B5}$ |
| 3004 | $L_{A124}$ | $L_{B5}$ |
| 3005 | $L_{A125}$ | $L_{B5}$ |
| 3006 | $L_{A126}$ | $L_{B5}$ |
| 3007 | $L_{A127}$ | $L_{B5}$ |

TABLE 2-continued

| Compound Number | $L_A$ | $L_B$ |
|---|---|---|
| 3008 | $L_{A128}$ | $L_{B5}$ |
| 3009 | $L_{A129}$ | $L_{B5}$ |
| 3010 | $L_{A130}$ | $L_{B5}$ |
| 3011 | $L_{A131}$ | $L_{B5}$ |
| 3012 | $L_{A132}$ | $L_{B5}$ |
| 3013 | $L_{A133}$ | $L_{B5}$ |
| 3014 | $L_{A134}$ | $L_{B5}$ |
| 3015 | $L_{A135}$ | $L_{B5}$ |
| 3016 | $L_{A136}$ | $L_{B5}$ |
| 3017 | $L_{A137}$ | $L_{B5}$ |
| 3018 | $L_{A138}$ | $L_{B5}$ |
| 3019 | $L_{A139}$ | $L_{B5}$ |
| 3020 | $L_{A140}$ | $L_{B5}$ |
| 3021 | $L_{A141}$ | $L_{B5}$ |
| 3022 | $L_{A142}$ | $L_{B5}$ |
| 3023 | $L_{A143}$ | $L_{B5}$ |
| 3024 | $L_{A144}$ | $L_{B5}$ |
| 3025 | $L_{A145}$ | $L_{B5}$ |
| 3026 | $L_{A146}$ | $L_{B5}$ |
| 3027 | $L_{A147}$ | $L_{B5}$ |
| 3028 | $L_{A148}$ | $L_{B5}$ |
| 3029 | $L_{A149}$ | $L_{B5}$ |
| 3030 | $L_{A150}$ | $L_{B5}$ |
| 3031 | $L_{A151}$ | $L_{B5}$ |
| 3032 | $L_{A152}$ | $L_{B5}$ |
| 3033 | $L_{A153}$ | $L_{B5}$ |
| 3034 | $L_{A154}$ | $L_{B5}$ |
| 3035 | $L_{A155}$ | $L_{B5}$ |
| 3036 | $L_{A156}$ | $L_{B5}$ |
| 3037 | $L_{A157}$ | $L_{B5}$ |
| 3038 | $L_{A158}$ | $L_{B5}$ |
| 3039 | $L_{A159}$ | $L_{B5}$ |
| 3040 | $L_{A160}$ | $L_{B5}$ |
| 3041 | $L_{A161}$ | $L_{B5}$ |
| 3042 | $L_{A162}$ | $L_{B5}$ |
| 3043 | $L_{A163}$ | $L_{B5}$ |
| 3044 | $L_{A164}$ | $L_{B5}$ |
| 3045 | $L_{A165}$ | $L_{B5}$ |
| 3046 | $L_{A166}$ | $L_{B5}$ |
| 3047 | $L_{A167}$ | $L_{B5}$ |
| 3048 | $L_{A168}$ | $L_{B5}$ |
| 3049 | $L_{A169}$ | $L_{B5}$ |
| 3050 | $L_{A170}$ | $L_{B5}$ |
| 3051 | $L_{A171}$ | $L_{B5}$ |
| 3052 | $L_{A172}$ | $L_{B5}$ |
| 3053 | $L_{A173}$ | $L_{B5}$ |
| 3054 | $L_{A174}$ | $L_{B5}$ |
| 3055 | $L_{A175}$ | $L_{B5}$ |
| 3056 | $L_{A176}$ | $L_{B5}$ |
| 3057 | $L_{A177}$ | $L_{B5}$ |
| 3058 | $L_{A178}$ | $L_{B5}$ |
| 3059 | $L_{A179}$ | $L_{B5}$ |
| 3060 | $L_{A180}$ | $L_{B5}$ |
| 3061 | $L_{A181}$ | $L_{B5}$ |
| 3062 | $L_{A182}$ | $L_{B5}$ |
| 3063 | $L_{A183}$ | $L_{B5}$ |
| 3064 | $L_{A184}$ | $L_{B5}$ |
| 3065 | $L_{A185}$ | $L_{B5}$ |
| 3066 | $L_{A186}$ | $L_{B5}$ |
| 3067 | $L_{A187}$ | $L_{B5}$ |
| 3068 | $L_{A188}$ | $L_{B5}$ |
| 3069 | $L_{A189}$ | $L_{B5}$ |
| 3070 | $L_{A190}$ | $L_{B5}$ |
| 3071 | $L_{A191}$ | $L_{B5}$ |
| 3072 | $L_{A192}$ | $L_{B5}$ |
| 3073 | $L_{A193}$ | $L_{B5}$ |
| 3074 | $L_{A194}$ | $L_{B5}$ |
| 3075 | $L_{A195}$ | $L_{B5}$ |
| 3076 | $L_{A196}$ | $L_{B5}$ |
| 3077 | $L_{A197}$ | $L_{B5}$ |
| 3078 | $L_{A198}$ | $L_{B5}$ |
| 3079 | $L_{A199}$ | $L_{B5}$ |
| 3080 | $L_{A200}$ | $L_{B5}$ |
| 3081 | $L_{A201}$ | $L_{B5}$ |
| 3082 | $L_{A202}$ | $L_{B5}$ |
| 3083 | $L_{A203}$ | $L_{B5}$ |
| 3084 | $L_{A204}$ | $L_{B5}$ |

TABLE 2-continued

| Compound Number | $L_A$ | $L_B$ |
|---|---|---|
| 3085 | $L_{A205}$ | $L_{B5}$ |
| 3086 | $L_{A206}$ | $L_{B5}$ |
| 3087 | $L_{A207}$ | $L_{B5}$ |
| 3088 | $L_{A208}$ | $L_{B5}$ |
| 3089 | $L_{A209}$ | $L_{B5}$ |
| 3090 | $L_{A210}$ | $L_{B5}$ |
| 3091 | $L_{A211}$ | $L_{B5}$ |
| 3092 | $L_{A212}$ | $L_{B5}$ |
| 3093 | $L_{A213}$ | $L_{B5}$ |
| 3094 | $L_{A214}$ | $L_{B5}$ |
| 3095 | $L_{A215}$ | $L_{B5}$ |
| 3096 | $L_{A216}$ | $L_{B5}$ |
| 3097 | $L_{A217}$ | $L_{B5}$ |
| 3098 | $L_{A218}$ | $L_{B5}$ |
| 3099 | $L_{A219}$ | $L_{B5}$ |
| 3100 | $L_{A220}$ | $L_{B5}$ |
| 3101 | $L_{A221}$ | $L_{B5}$ |
| 3102 | $L_{A222}$ | $L_{B5}$ |
| 3103 | $L_{A223}$ | $L_{B5}$ |
| 3104 | $L_{A224}$ | $L_{B5}$ |
| 3105 | $L_{A225}$ | $L_{B5}$ |
| 3106 | $L_{A226}$ | $L_{B5}$ |
| 3107 | $L_{A227}$ | $L_{B5}$ |
| 3108 | $L_{A228}$ | $L_{B5}$ |
| 3109 | $L_{A229}$ | $L_{B5}$ |
| 3110 | $L_{A230}$ | $L_{B5}$ |
| 3111 | $L_{A231}$ | $L_{B5}$ |
| 3112 | $L_{A232}$ | $L_{B5}$ |
| 3113 | $L_{A233}$ | $L_{B5}$ |
| 3114 | $L_{A234}$ | $L_{B5}$ |
| 3115 | $L_{A235}$ | $L_{B5}$ |
| 3116 | $L_{A236}$ | $L_{B5}$ |
| 3117 | $L_{A237}$ | $L_{B5}$ |
| 3118 | $L_{A238}$ | $L_{B5}$ |
| 3119 | $L_{A239}$ | $L_{B5}$ |
| 3120 | $L_{A240}$ | $L_{B5}$ |
| 3121 | $L_{A241}$ | $L_{B5}$ |
| 3122 | $L_{A242}$ | $L_{B5}$ |
| 3123 | $L_{A243}$ | $L_{B5}$ |
| 3124 | $L_{A244}$ | $L_{B5}$ |
| 3125 | $L_{A245}$ | $L_{B5}$ |
| 3126 | $L_{A246}$ | $L_{B5}$ |
| 3127 | $L_{A247}$ | $L_{B5}$ |
| 3128 | $L_{A248}$ | $L_{B5}$ |
| 3129 | $L_{A249}$ | $L_{B5}$ |
| 3130 | $L_{A250}$ | $L_{B5}$ |
| 3131 | $L_{A251}$ | $L_{B5}$ |
| 3132 | $L_{A252}$ | $L_{B5}$ |
| 3133 | $L_{A253}$ | $L_{B5}$ |
| 3134 | $L_{A254}$ | $L_{B5}$ |
| 3135 | $L_{A255}$ | $L_{B5}$ |
| 3136 | $L_{A256}$ | $L_{B5}$ |
| 3137 | $L_{A257}$ | $L_{B5}$ |
| 3138 | $L_{A258}$ | $L_{B5}$ |
| 3139 | $L_{A259}$ | $L_{B5}$ |
| 3140 | $L_{A260}$ | $L_{B5}$ |
| 3141 | $L_{A261}$ | $L_{B5}$ |
| 3142 | $L_{A262}$ | $L_{B5}$ |
| 3143 | $L_{A263}$ | $L_{B5}$ |
| 3144 | $L_{A264}$ | $L_{B5}$ |
| 3145 | $L_{A265}$ | $L_{B5}$ |
| 3146 | $L_{A266}$ | $L_{B5}$ |
| 3147 | $L_{A267}$ | $L_{B5}$ |
| 3148 | $L_{A268}$ | $L_{B5}$ |
| 3149 | $L_{A269}$ | $L_{B5}$ |
| 3150 | $L_{A270}$ | $L_{B5}$ |
| 3151 | $L_{A271}$ | $L_{B5}$ |
| 3152 | $L_{A272}$ | $L_{B5}$ |
| 3153 | $L_{A273}$ | $L_{B5}$ |
| 3154 | $L_{A274}$ | $L_{B5}$ |
| 3155 | $L_{A275}$ | $L_{B5}$ |
| 3156 | $L_{A276}$ | $L_{B5}$ |
| 3157 | $L_{A277}$ | $L_{B5}$ |
| 3158 | $L_{A278}$ | $L_{B5}$ |
| 3159 | $L_{A279}$ | $L_{B5}$ |
| 3160 | $L_{A280}$ | $L_{B5}$ |
| 3161 | $L_{A281}$ | $L_{B5}$ |

TABLE 2-continued

| Compound Number | $L_A$ | $L_B$ |
|---|---|---|
| 3162 | $L_{A282}$ | $L_{B5}$ |
| 3163 | $L_{A283}$ | $L_{B5}$ |
| 3164 | $L_{A284}$ | $L_{B5}$ |
| 3165 | $L_{A285}$ | $L_{B5}$ |
| 3166 | $L_{A286}$ | $L_{B5}$ |
| 3167 | $L_{A287}$ | $L_{B5}$ |
| 3168 | $L_{A288}$ | $L_{B5}$ |
| 3169 | $L_{A289}$ | $L_{B5}$ |
| 3170 | $L_{A290}$ | $L_{B5}$ |
| 3171 | $L_{A291}$ | $L_{B5}$ |
| 3172 | $L_{A292}$ | $L_{B5}$ |
| 3173 | $L_{A293}$ | $L_{B5}$ |
| 3174 | $L_{A294}$ | $L_{B5}$ |
| 3175 | $L_{A295}$ | $L_{B5}$ |
| 3176 | $L_{A296}$ | $L_{B5}$ |
| 3177 | $L_{A297}$ | $L_{B5}$ |
| 3178 | $L_{A298}$ | $L_{B5}$ |
| 3179 | $L_{A299}$ | $L_{B5}$ |
| 3180 | $L_{A300}$ | $L_{B5}$ |
| 3181 | $L_{A301}$ | $L_{B5}$ |
| 3182 | $L_{A302}$ | $L_{B5}$ |
| 3183 | $L_{A303}$ | $L_{B5}$ |
| 3184 | $L_{A304}$ | $L_{B5}$ |
| 3185 | $L_{A305}$ | $L_{B5}$ |
| 3186 | $L_{A306}$ | $L_{B5}$ |
| 3187 | $L_{A307}$ | $L_{B5}$ |
| 3188 | $L_{A308}$ | $L_{B5}$ |
| 3189 | $L_{A309}$ | $L_{B5}$ |
| 3190 | $L_{A310}$ | $L_{B5}$ |
| 3191 | $L_{A311}$ | $L_{B5}$ |
| 3192 | $L_{A312}$ | $L_{B5}$ |
| 3193 | $L_{A313}$ | $L_{B5}$ |
| 3194 | $L_{A314}$ | $L_{B5}$ |
| 3195 | $L_{A315}$ | $L_{B5}$ |
| 3196 | $L_{A316}$ | $L_{B5}$ |
| 3197 | $L_{A317}$ | $L_{B5}$ |
| 3198 | $L_{A318}$ | $L_{B5}$ |
| 3199 | $L_{A319}$ | $L_{B5}$ |
| 3200 | $L_{A320}$ | $L_{B5}$ |
| 3201 | $L_{A321}$ | $L_{B5}$ |
| 3202 | $L_{A322}$ | $L_{B5}$ |
| 3203 | $L_{A323}$ | $L_{B5}$ |
| 3204 | $L_{A324}$ | $L_{B5}$ |
| 3205 | $L_{A325}$ | $L_{B5}$ |
| 3206 | $L_{A326}$ | $L_{B5}$ |
| 3207 | $L_{A327}$ | $L_{B5}$ |
| 3208 | $L_{A328}$ | $L_{B5}$ |
| 3209 | $L_{A329}$ | $L_{B5}$ |
| 3210 | $L_{A330}$ | $L_{B5}$ |
| 3211 | $L_{A331}$ | $L_{B5}$ |
| 3212 | $L_{A332}$ | $L_{B5}$ |
| 3213 | $L_{A333}$ | $L_{B5}$ |
| 3214 | $L_{A334}$ | $L_{B5}$ |
| 3215 | $L_{A335}$ | $L_{B5}$ |
| 3216 | $L_{A336}$ | $L_{B5}$ |
| 3217 | $L_{A337}$ | $L_{B5}$ |
| 3218 | $L_{A338}$ | $L_{B5}$ |
| 3219 | $L_{A339}$ | $L_{B5}$ |
| 3220 | $L_{A340}$ | $L_{B5}$ |
| 3221 | $L_{A341}$ | $L_{B5}$ |
| 3222 | $L_{A342}$ | $L_{B5}$ |
| 3223 | $L_{A343}$ | $L_{B5}$ |
| 3224 | $L_{A344}$ | $L_{B5}$ |
| 3225 | $L_{A345}$ | $L_{B5}$ |
| 3226 | $L_{A346}$ | $L_{B5}$ |
| 3227 | $L_{A347}$ | $L_{B5}$ |
| 3228 | $L_{A348}$ | $L_{B5}$ |
| 3229 | $L_{A349}$ | $L_{B5}$ |
| 3230 | $L_{A350}$ | $L_{B5}$ |
| 3231 | $L_{A351}$ | $L_{B5}$ |
| 3232 | $L_{A352}$ | $L_{B5}$ |
| 3233 | $L_{A353}$ | $L_{B5}$ |
| 3234 | $L_{A354}$ | $L_{B5}$ |
| 3235 | $L_{A355}$ | $L_{B5}$ |
| 3236 | $L_{A356}$ | $L_{B5}$ |
| 3237 | $L_{A357}$ | $L_{B5}$ |
| 3238 | $L_{A358}$ | $L_{B5}$ |

TABLE 2-continued

| Compound Number | $L_A$ | $L_B$ |
|---|---|---|
| 3239 | $L_{A359}$ | $L_{B5}$ |
| 3240 | $L_{A360}$ | $L_{B5}$ |
| 3241 | $L_{A361}$ | $L_{B5}$ |
| 3242 | $L_{A362}$ | $L_{B5}$ |
| 3243 | $L_{A363}$ | $L_{B5}$ |
| 3244 | $L_{A364}$ | $L_{B5}$ |
| 3245 | $L_{A365}$ | $L_{B5}$ |
| 3246 | $L_{A366}$ | $L_{B5}$ |
| 3247 | $L_{A367}$ | $L_{B5}$ |
| 3248 | $L_{A368}$ | $L_{B5}$ |
| 3249 | $L_{A369}$ | $L_{B5}$ |
| 3250 | $L_{A370}$ | $L_{B5}$ |
| 3251 | $L_{A371}$ | $L_{B5}$ |
| 3252 | $L_{A372}$ | $L_{B5}$ |
| 3253 | $L_{A373}$ | $L_{B5}$ |
| 3254 | $L_{A374}$ | $L_{B5}$ |
| 3255 | $L_{A375}$ | $L_{B5}$ |
| 3256 | $L_{A376}$ | $L_{B5}$ |
| 3257 | $L_{A377}$ | $L_{B5}$ |
| 3258 | $L_{A378}$ | $L_{B5}$ |
| 3259 | $L_{A379}$ | $L_{B5}$ |
| 3260 | $L_{A380}$ | $L_{B5}$ |
| 3261 | $L_{A381}$ | $L_{B5}$ |
| 3262 | $L_{A382}$ | $L_{B5}$ |
| 3263 | $L_{A383}$ | $L_{B5}$ |
| 3264 | $L_{A384}$ | $L_{B5}$ |
| 3265 | $L_{A385}$ | $L_{B5}$ |
| 3266 | $L_{A386}$ | $L_{B5}$ |
| 3267 | $L_{A387}$ | $L_{B5}$ |
| 3268 | $L_{A388}$ | $L_{B5}$ |
| 3269 | $L_{A389}$ | $L_{B5}$ |
| 3270 | $L_{A390}$ | $L_{B5}$ |
| 3271 | $L_{A391}$ | $L_{B5}$ |
| 3272 | $L_{A392}$ | $L_{B5}$ |
| 3273 | $L_{A393}$ | $L_{B5}$ |
| 3274 | $L_{A394}$ | $L_{B5}$ |
| 3275 | $L_{A395}$ | $L_{B5}$ |
| 3276 | $L_{A396}$ | $L_{B5}$ |
| 3277 | $L_{A397}$ | $L_{B5}$ |
| 3278 | $L_{A398}$ | $L_{B5}$ |
| 3279 | $L_{A399}$ | $L_{B5}$ |
| 3280 | $L_{A400}$ | $L_{B5}$ |
| 3281 | $L_{A401}$ | $L_{B5}$ |
| 3282 | $L_{A402}$ | $L_{B5}$ |
| 3283 | $L_{A403}$ | $L_{B5}$ |
| 3284 | $L_{A404}$ | $L_{B5}$ |
| 3285 | $L_{A405}$ | $L_{B5}$ |
| 3286 | $L_{A406}$ | $L_{B5}$ |
| 3287 | $L_{A407}$ | $L_{B5}$ |
| 3288 | $L_{A408}$ | $L_{B5}$ |
| 3289 | $L_{A409}$ | $L_{B5}$ |
| 3290 | $L_{A410}$ | $L_{B5}$ |
| 3291 | $L_{A411}$ | $L_{B5}$ |
| 3292 | $L_{A412}$ | $L_{B5}$ |
| 3293 | $L_{A413}$ | $L_{B5}$ |
| 3294 | $L_{A414}$ | $L_{B5}$ |
| 3295 | $L_{A415}$ | $L_{B5}$ |
| 3296 | $L_{A416}$ | $L_{B5}$ |
| 3297 | $L_{A417}$ | $L_{B5}$ |
| 3298 | $L_{A418}$ | $L_{B5}$ |
| 3299 | $L_{A419}$ | $L_{B5}$ |
| 3300 | $L_{A420}$ | $L_{B5}$ |
| 3301 | $L_{A421}$ | $L_{B5}$ |
| 3302 | $L_{A422}$ | $L_{B5}$ |
| 3303 | $L_{A423}$ | $L_{B5}$ |
| 3304 | $L_{A424}$ | $L_{B5}$ |
| 3305 | $L_{A425}$ | $L_{B5}$ |
| 3306 | $L_{A426}$ | $L_{B5}$ |
| 3307 | $L_{A427}$ | $L_{B5}$ |
| 3308 | $L_{A428}$ | $L_{B5}$ |
| 3309 | $L_{A429}$ | $L_{B5}$ |
| 3310 | $L_{A430}$ | $L_{B5}$ |
| 3311 | $L_{A431}$ | $L_{B5}$ |
| 3312 | $L_{A432}$ | $L_{B5}$ |
| 3313 | $L_{A433}$ | $L_{B5}$ |
| 3314 | $L_{A434}$ | $L_{B5}$ |
| 3315 | $L_{A435}$ | $L_{B5}$ |

TABLE 2-continued

| Compound Number | $L_A$ | $L_B$ |
|---|---|---|
| 3316 | $L_{A436}$ | $L_{B5}$ |
| 3317 | $L_{A437}$ | $L_{B5}$ |
| 3318 | $L_{A438}$ | $L_{B5}$ |
| 3319 | $L_{A439}$ | $L_{B5}$ |
| 3320 | $L_{A440}$ | $L_{B5}$ |
| 3321 | $L_{A441}$ | $L_{B5}$ |
| 3322 | $L_{A442}$ | $L_{B5}$ |
| 3323 | $L_{A443}$ | $L_{B5}$ |
| 3324 | $L_{A444}$ | $L_{B5}$ |
| 3325 | $L_{A445}$ | $L_{B5}$ |
| 3326 | $L_{A446}$ | $L_{B5}$ |
| 3327 | $L_{A447}$ | $L_{B5}$ |
| 3328 | $L_{A448}$ | $L_{B5}$ |
| 3329 | $L_{A449}$ | $L_{B5}$ |
| 3330 | $L_{A450}$ | $L_{B5}$ |
| 3331 | $L_{A451}$ | $L_{B5}$ |
| 3332 | $L_{A452}$ | $L_{B5}$ |
| 3333 | $L_{A453}$ | $L_{B5}$ |
| 3334 | $L_{A454}$ | $L_{B5}$ |
| 3335 | $L_{A455}$ | $L_{B5}$ |
| 3336 | $L_{A456}$ | $L_{B5}$ |
| 3337 | $L_{A457}$ | $L_{B5}$ |
| 3338 | $L_{A458}$ | $L_{B5}$ |
| 3339 | $L_{A459}$ | $L_{B5}$ |
| 3340 | $L_{A460}$ | $L_{B5}$ |
| 3341 | $L_{A461}$ | $L_{B5}$ |
| 3342 | $L_{A462}$ | $L_{B5}$ |
| 3343 | $L_{A463}$ | $L_{B5}$ |
| 3344 | $L_{A464}$ | $L_{B5}$ |
| 3345 | $L_{A465}$ | $L_{B5}$ |
| 3346 | $L_{A466}$ | $L_{B5}$ |
| 3347 | $L_{A467}$ | $L_{B5}$ |
| 3348 | $L_{A468}$ | $L_{B5}$ |
| 3349 | $L_{A469}$ | $L_{B5}$ |
| 3350 | $L_{A470}$ | $L_{B5}$ |
| 3351 | $L_{A471}$ | $L_{B5}$ |
| 3352 | $L_{A472}$ | $L_{B5}$ |
| 3353 | $L_{A473}$ | $L_{B5}$ |
| 3354 | $L_{A474}$ | $L_{B5}$ |
| 3355 | $L_{A475}$ | $L_{B5}$ |
| 3356 | $L_{A476}$ | $L_{B5}$ |
| 3357 | $L_{A477}$ | $L_{B5}$ |
| 3358 | $L_{A478}$ | $L_{B5}$ |
| 3359 | $L_{A479}$ | $L_{B5}$ |
| 3360 | $L_{A480}$ | $L_{B5}$ |
| 3361 | $L_{A481}$ | $L_{B5}$ |
| 3362 | $L_{A482}$ | $L_{B5}$ |
| 3363 | $L_{A483}$ | $L_{B5}$ |
| 3364 | $L_{A484}$ | $L_{B5}$ |
| 3365 | $L_{A485}$ | $L_{B5}$ |
| 3366 | $L_{A486}$ | $L_{B5}$ |
| 3367 | $L_{A487}$ | $L_{B5}$ |
| 3368 | $L_{A488}$ | $L_{B5}$ |
| 3369 | $L_{A489}$ | $L_{B5}$ |
| 3370 | $L_{A490}$ | $L_{B5}$ |
| 3371 | $L_{A491}$ | $L_{B5}$ |
| 3372 | $L_{A492}$ | $L_{B5}$ |
| 3373 | $L_{A493}$ | $L_{B5}$ |
| 3374 | $L_{A494}$ | $L_{B5}$ |
| 3375 | $L_{A495}$ | $L_{B5}$ |
| 3376 | $L_{A496}$ | $L_{B5}$ |
| 3377 | $L_{A497}$ | $L_{B5}$ |
| 3378 | $L_{A498}$ | $L_{B5}$ |
| 3379 | $L_{A499}$ | $L_{B5}$ |
| 3380 | $L_{A500}$ | $L_{B5}$ |
| 3381 | $L_{A501}$ | $L_{B5}$ |
| 3382 | $L_{A502}$ | $L_{B5}$ |
| 3383 | $L_{A503}$ | $L_{B5}$ |
| 3384 | $L_{A504}$ | $L_{B5}$ |
| 3385 | $L_{A505}$ | $L_{B5}$ |
| 3386 | $L_{A506}$ | $L_{B5}$ |
| 3387 | $L_{A507}$ | $L_{B5}$ |
| 3388 | $L_{A508}$ | $L_{B5}$ |
| 3389 | $L_{A509}$ | $L_{B5}$ |
| 3390 | $L_{A510}$ | $L_{B5}$ |
| 3391 | $L_{A511}$ | $L_{B5}$ |
| 3392 | $L_{A512}$ | $L_{B5}$ |

TABLE 2-continued

| Compound Number | $L_A$ | $L_B$ |
|---|---|---|
| 3393 | $L_{A513}$ | $L_{B5}$ |
| 3394 | $L_{A514}$ | $L_{B5}$ |
| 3395 | $L_{A515}$ | $L_{B5}$ |
| 3396 | $L_{A516}$ | $L_{B5}$ |
| 3397 | $L_{A517}$ | $L_{B5}$ |
| 3398 | $L_{A518}$ | $L_{B5}$ |
| 3399 | $L_{A519}$ | $L_{B5}$ |
| 3400 | $L_{A520}$ | $L_{B5}$ |
| 3401 | $L_{A521}$ | $L_{B5}$ |
| 3402 | $L_{A522}$ | $L_{B5}$ |
| 3403 | $L_{A523}$ | $L_{B5}$ |
| 3404 | $L_{A524}$ | $L_{B5}$ |
| 3405 | $L_{A525}$ | $L_{B5}$ |
| 3406 | $L_{A526}$ | $L_{B5}$ |
| 3407 | $L_{A527}$ | $L_{B5}$ |
| 3408 | $L_{A528}$ | $L_{B5}$ |
| 3409 | $L_{A529}$ | $L_{B5}$ |
| 3410 | $L_{A530}$ | $L_{B5}$ |
| 3411 | $L_{A531}$ | $L_{B5}$ |
| 3412 | $L_{A532}$ | $L_{B5}$ |
| 3413 | $L_{A533}$ | $L_{B5}$ |
| 3414 | $L_{A534}$ | $L_{B5}$ |
| 3415 | $L_{A535}$ | $L_{B5}$ |
| 3416 | $L_{A536}$ | $L_{B5}$ |
| 3417 | $L_{A537}$ | $L_{B5}$ |
| 3418 | $L_{A538}$ | $L_{B5}$ |
| 3419 | $L_{A539}$ | $L_{B5}$ |
| 3420 | $L_{A540}$ | $L_{B5}$ |
| 3421 | $L_{A541}$ | $L_{B5}$ |
| 3422 | $L_{A542}$ | $L_{B5}$ |
| 3423 | $L_{A543}$ | $L_{B5}$ |
| 3424 | $L_{A544}$ | $L_{B5}$ |
| 3425 | $L_{A545}$ | $L_{B5}$ |
| 3426 | $L_{A546}$ | $L_{B5}$ |
| 3427 | $L_{A547}$ | $L_{B5}$ |
| 3428 | $L_{A548}$ | $L_{B5}$ |
| 3429 | $L_{A549}$ | $L_{B5}$ |
| 3430 | $L_{A550}$ | $L_{B5}$ |
| 3431 | $L_{A551}$ | $L_{B5}$ |
| 3432 | $L_{A552}$ | $L_{B5}$ |
| 3433 | $L_{A553}$ | $L_{B5}$ |
| 3434 | $L_{A554}$ | $L_{B5}$ |
| 3435 | $L_{A555}$ | $L_{B5}$ |
| 3436 | $L_{A556}$ | $L_{B5}$ |
| 3437 | $L_{A557}$ | $L_{B5}$ |
| 3438 | $L_{A558}$ | $L_{B5}$ |
| 3439 | $L_{A559}$ | $L_{B5}$ |
| 3440 | $L_{A560}$ | $L_{B5}$ |
| 3441 | $L_{A561}$ | $L_{B5}$ |
| 3442 | $L_{A562}$ | $L_{B5}$ |
| 3443 | $L_{A563}$ | $L_{B5}$ |
| 3444 | $L_{A564}$ | $L_{B5}$ |
| 3445 | $L_{A565}$ | $L_{B5}$ |
| 3446 | $L_{A566}$ | $L_{B5}$ |
| 3447 | $L_{A567}$ | $L_{B5}$ |
| 3448 | $L_{A568}$ | $L_{B5}$ |
| 3449 | $L_{A569}$ | $L_{B5}$ |
| 3450 | $L_{A570}$ | $L_{B5}$ |
| 3451 | $L_{A571}$ | $L_{B5}$ |
| 3452 | $L_{A572}$ | $L_{B5}$ |
| 3453 | $L_{A573}$ | $L_{B5}$ |
| 3454 | $L_{A574}$ | $L_{B5}$ |
| 3455 | $L_{A575}$ | $L_{B5}$ |
| 3456 | $L_{A576}$ | $L_{B5}$ |
| 3457 | $L_{A577}$ | $L_{B5}$ |
| 3458 | $L_{A578}$ | $L_{B5}$ |
| 3459 | $L_{A579}$ | $L_{B5}$ |
| 3460 | $L_{A580}$ | $L_{B5}$ |
| 3461 | $L_{A581}$ | $L_{B5}$ |
| 3462 | $L_{A582}$ | $L_{B5}$ |
| 3463 | $L_{A583}$ | $L_{B5}$ |
| 3464 | $L_{A584}$ | $L_{B5}$ |
| 3465 | $L_{A585}$ | $L_{B5}$ |
| 3466 | $L_{A586}$ | $L_{B5}$ |
| 3467 | $L_{A587}$ | $L_{B5}$ |
| 3468 | $L_{A588}$ | $L_{B5}$ |
| 3469 | $L_{A589}$ | $L_{B5}$ |

TABLE 2-continued

| Compound Number | $L_A$ | $L_B$ |
|---|---|---|
| 3470 | $L_{A590}$ | $L_{B5}$ |
| 3471 | $L_{A591}$ | $L_{B5}$ |
| 3472 | $L_{A592}$ | $L_{B5}$ |
| 3473 | $L_{A593}$ | $L_{B5}$ |
| 3474 | $L_{A594}$ | $L_{B5}$ |
| 3475 | $L_{A595}$ | $L_{B5}$ |
| 3476 | $L_{A596}$ | $L_{B5}$ |
| 3477 | $L_{A597}$ | $L_{B5}$ |
| 3478 | $L_{A598}$ | $L_{B5}$ |
| 3479 | $L_{A599}$ | $L_{B5}$ |
| 3480 | $L_{A600}$ | $L_{B5}$ |
| 3481 | $L_{A601}$ | $L_{B5}$ |
| 3482 | $L_{A602}$ | $L_{B5}$ |
| 3483 | $L_{A603}$ | $L_{B5}$ |
| 3484 | $L_{A604}$ | $L_{B5}$ |
| 3485 | $L_{A605}$ | $L_{B5}$ |
| 3486 | $L_{A606}$ | $L_{B5}$ |
| 3487 | $L_{A607}$ | $L_{B5}$ |
| 3488 | $L_{A608}$ | $L_{B5}$ |
| 3489 | $L_{A609}$ | $L_{B5}$ |
| 3490 | $L_{A610}$ | $L_{B5}$ |
| 3491 | $L_{A611}$ | $L_{B5}$ |
| 3492 | $L_{A612}$ | $L_{B5}$ |
| 3493 | $L_{A613}$ | $L_{B5}$ |
| 3494 | $L_{A614}$ | $L_{B5}$ |
| 3495 | $L_{A615}$ | $L_{B5}$ |
| 3496 | $L_{A616}$ | $L_{B5}$ |
| 3497 | $L_{A617}$ | $L_{B5}$ |
| 3498 | $L_{A618}$ | $L_{B5}$ |
| 3499 | $L_{A619}$ | $L_{B5}$ |
| 3500 | $L_{A620}$ | $L_{B5}$ |
| 3501 | $L_{A621}$ | $L_{B5}$ |
| 3502 | $L_{A622}$ | $L_{B5}$ |
| 3503 | $L_{A623}$ | $L_{B5}$ |
| 3504 | $L_{A624}$ | $L_{B5}$ |
| 3505 | $L_{A625}$ | $L_{B5}$ |
| 3506 | $L_{A626}$ | $L_{B5}$ |
| 3507 | $L_{A627}$ | $L_{B5}$ |
| 3508 | $L_{A628}$ | $L_{B5}$ |
| 3509 | $L_{A629}$ | $L_{B5}$ |
| 3510 | $L_{A630}$ | $L_{B5}$ |
| 3511 | $L_{A631}$ | $L_{B5}$ |
| 3512 | $L_{A632}$ | $L_{B5}$ |
| 3513 | $L_{A633}$ | $L_{B5}$ |
| 3514 | $L_{A634}$ | $L_{B5}$ |
| 3515 | $L_{A635}$ | $L_{B5}$ |
| 3516 | $L_{A636}$ | $L_{B5}$ |
| 3517 | $L_{A637}$ | $L_{B5}$ |
| 3518 | $L_{A638}$ | $L_{B5}$ |
| 3519 | $L_{A639}$ | $L_{B5}$ |
| 3520 | $L_{A640}$ | $L_{B5}$ |
| 3521 | $L_{A641}$ | $L_{B5}$ |
| 3522 | $L_{A642}$ | $L_{B5}$ |
| 3523 | $L_{A643}$ | $L_{B5}$ |
| 3524 | $L_{A644}$ | $L_{B5}$ |
| 3525 | $L_{A645}$ | $L_{B5}$ |
| 3526 | $L_{A646}$ | $L_{B5}$ |
| 3527 | $L_{A647}$ | $L_{B5}$ |
| 3528 | $L_{A648}$ | $L_{B5}$ |
| 3529 | $L_{A649}$ | $L_{B5}$ |
| 3530 | $L_{A650}$ | $L_{B5}$ |
| 3531 | $L_{A651}$ | $L_{B5}$ |
| 3532 | $L_{A652}$ | $L_{B5}$ |
| 3533 | $L_{A653}$ | $L_{B5}$ |
| 3534 | $L_{A654}$ | $L_{B5}$ |
| 3535 | $L_{A655}$ | $L_{B5}$ |
| 3536 | $L_{A656}$ | $L_{B5}$ |
| 3537 | $L_{A657}$ | $L_{B5}$ |
| 3538 | $L_{A658}$ | $L_{B5}$ |
| 3539 | $L_{A659}$ | $L_{B5}$ |
| 3540 | $L_{A660}$ | $L_{B5}$ |
| 3541 | $L_{A661}$ | $L_{B5}$ |
| 3542 | $L_{A662}$ | $L_{B5}$ |
| 3543 | $L_{A663}$ | $L_{B5}$ |
| 3544 | $L_{A664}$ | $L_{B5}$ |
| 3545 | $L_{A665}$ | $L_{B5}$ |
| 3546 | $L_{A666}$ | $L_{B5}$ |

TABLE 2-continued

| Compound Number | $L_A$ | $L_B$ |
|---|---|---|
| 3547 | $L_{A667}$ | $L_{B5}$ |
| 3548 | $L_{A668}$ | $L_{B5}$ |
| 3549 | $L_{A669}$ | $L_{B5}$ |
| 3550 | $L_{A670}$ | $L_{B5}$ |
| 3551 | $L_{A671}$ | $L_{B5}$ |
| 3552 | $L_{A672}$ | $L_{B5}$ |
| 3553 | $L_{A673}$ | $L_{B5}$ |
| 3554 | $L_{A674}$ | $L_{B5}$ |
| 3555 | $L_{A675}$ | $L_{B5}$ |
| 3556 | $L_{A676}$ | $L_{B5}$ |
| 3557 | $L_{A677}$ | $L_{B5}$ |
| 3558 | $L_{A678}$ | $L_{B5}$ |
| 3559 | $L_{A679}$ | $L_{B5}$ |
| 3560 | $L_{A680}$ | $L_{B5}$ |
| 3561 | $L_{A681}$ | $L_{B5}$ |
| 3562 | $L_{A682}$ | $L_{B5}$ |
| 3563 | $L_{A683}$ | $L_{B5}$ |
| 3564 | $L_{A684}$ | $L_{B5}$ |
| 3565 | $L_{A685}$ | $L_{B5}$ |
| 3566 | $L_{A686}$ | $L_{B5}$ |
| 3567 | $L_{A687}$ | $L_{B5}$ |
| 3568 | $L_{A688}$ | $L_{B5}$ |
| 3569 | $L_{A689}$ | $L_{B5}$ |
| 3570 | $L_{A690}$ | $L_{B5}$ |
| 3571 | $L_{A691}$ | $L_{B5}$ |
| 3572 | $L_{A692}$ | $L_{B5}$ |
| 3573 | $L_{A693}$ | $L_{B5}$ |
| 3574 | $L_{A694}$ | $L_{B5}$ |
| 3575 | $L_{A695}$ | $L_{B5}$ |
| 3576 | $L_{A696}$ | $L_{B5}$ |
| 3577 | $L_{A697}$ | $L_{B5}$ |
| 3578 | $L_{A698}$ | $L_{B5}$ |
| 3579 | $L_{A699}$ | $L_{B5}$ |
| 3580 | $L_{A700}$ | $L_{B5}$ |
| 3581 | $L_{A701}$ | $L_{B5}$ |
| 3582 | $L_{A702}$ | $L_{B5}$ |
| 3583 | $L_{A703}$ | $L_{B5}$ |
| 3584 | $L_{A704}$ | $L_{B5}$ |
| 3585 | $L_{A705}$ | $L_{B5}$ |
| 3586 | $L_{A706}$ | $L_{B5}$ |
| 3587 | $L_{A707}$ | $L_{B5}$ |
| 3588 | $L_{A708}$ | $L_{B5}$ |
| 3589 | $L_{A709}$ | $L_{B5}$ |
| 3590 | $L_{A710}$ | $L_{B5}$ |
| 3591 | $L_{A711}$ | $L_{B5}$ |
| 3592 | $L_{A712}$ | $L_{B5}$ |
| 3593 | $L_{A713}$ | $L_{B5}$ |
| 3594 | $L_{A714}$ | $L_{B5}$ |
| 3595 | $L_{A715}$ | $L_{B5}$ |
| 3596 | $L_{A716}$ | $L_{B5}$ |
| 3597 | $L_{A717}$ | $L_{B5}$ |
| 3598 | $L_{A718}$ | $L_{B5}$ |
| 3599 | $L_{A719}$ | $L_{B5}$ |
| 3600 | $L_{A720}$ | $L_{B5}$ |
| 3601 | $L_{A721}$ | $L_{B5}$ |
| 3602 | $L_{A722}$ | $L_{B5}$ |
| 3603 | $L_{A723}$ | $L_{B5}$ |
| 3604 | $L_{A724}$ | $L_{B5}$ |
| 3605 | $L_{A725}$ | $L_{B5}$ |
| 3606 | $L_{A726}$ | $L_{B5}$ |
| 3607 | $L_{A727}$ | $L_{B5}$ |
| 3608 | $L_{A728}$ | $L_{B5}$ |
| 3609 | $L_{A729}$ | $L_{B5}$ |
| 3610 | $L_{A730}$ | $L_{B5}$ |
| 3611 | $L_{A731}$ | $L_{B5}$ |
| 3612 | $L_{A732}$ | $L_{B5}$ |
| 3613 | $L_{A733}$ | $L_{B5}$ |
| 3614 | $L_{A734}$ | $L_{B5}$ |
| 3615 | $L_{A735}$ | $L_{B5}$ |
| 3616 | $L_{A736}$ | $L_{B5}$ |
| 3617 | $L_{A737}$ | $L_{B5}$ |
| 3618 | $L_{A738}$ | $L_{B5}$ |
| 3619 | $L_{A739}$ | $L_{B5}$ |
| 3620 | $L_{A740}$ | $L_{B5}$ |
| 3621 | $L_{A741}$ | $L_{B5}$ |
| 3622 | $L_{A742}$ | $L_{B5}$ |
| 3623 | $L_{A743}$ | $L_{B5}$ |

TABLE 2-continued

| Compound Number | $L_A$ | $L_B$ |
|---|---|---|
| 3624 | $L_{A744}$ | $L_{B5}$ |
| 3625 | $L_{A745}$ | $L_{B5}$ |
| 3626 | $L_{A746}$ | $L_{B5}$ |
| 3627 | $L_{A747}$ | $L_{B5}$ |
| 3628 | $L_{A748}$ | $L_{B5}$ |
| 3629 | $L_{A749}$ | $L_{B5}$ |
| 3630 | $L_{A750}$ | $L_{B5}$ |
| 3631 | $L_{A751}$ | $L_{B5}$ |
| 3632 | $L_{A752}$ | $L_{B5}$ |
| 3633 | $L_{A753}$ | $L_{B5}$ |
| 3634 | $L_{A754}$ | $L_{B5}$ |
| 3635 | $L_{A755}$ | $L_{B5}$ |
| 3636 | $L_{A756}$ | $L_{B5}$ |
| 3637 | $L_{A757}$ | $L_{B5}$ |
| 3638 | $L_{A758}$ | $L_{B5}$ |
| 3639 | $L_{A759}$ | $L_{B5}$ |
| 3640 | $L_{A760}$ | $L_{B5}$ |
| 3641 | $L_{A761}$ | $L_{B5}$ |
| 3642 | $L_{A762}$ | $L_{B5}$ |
| 3643 | $L_{A763}$ | $L_{B5}$ |
| 3644 | $L_{A764}$ | $L_{B5}$ |
| 3645 | $L_{A765}$ | $L_{B5}$ |
| 3646 | $L_{A766}$ | $L_{B5}$ |
| 3647 | $L_{A767}$ | $L_{B5}$ |
| 3648 | $L_{A768}$ | $L_{B5}$ |
| 3649 | $L_{A769}$ | $L_{B5}$ |
| 3650 | $L_{A770}$ | $L_{B5}$ |
| 3651 | $L_{A771}$ | $L_{B5}$ |
| 3652 | $L_{A772}$ | $L_{B5}$ |
| 3653 | $L_{A773}$ | $L_{B5}$ |
| 3654 | $L_{A774}$ | $L_{B5}$ |
| 3655 | $L_{A775}$ | $L_{B5}$ |
| 3656 | $L_{A776}$ | $L_{B5}$ |
| 3657 | $L_{A777}$ | $L_{B5}$ |
| 3658 | $L_{A778}$ | $L_{B5}$ |
| 3659 | $L_{A779}$ | $L_{B5}$ |
| 3660 | $L_{A780}$ | $L_{B5}$ |
| 3661 | $L_{A781}$ | $L_{B5}$ |
| 3662 | $L_{A782}$ | $L_{B5}$ |
| 3663 | $L_{A783}$ | $L_{B5}$ |
| 3664 | $L_{A784}$ | $L_{B5}$ |
| 3665 | $L_{A785}$ | $L_{B5}$ |
| 3666 | $L_{A786}$ | $L_{B5}$ |
| 3667 | $L_{A787}$ | $L_{B5}$ |
| 3668 | $L_{A788}$ | $L_{B5}$ |
| 3669 | $L_{A789}$ | $L_{B5}$ |
| 3670 | $L_{A790}$ | $L_{B5}$ |
| 3671 | $L_{A791}$ | $L_{B5}$ |
| 3672 | $L_{A792}$ | $L_{B5}$ |
| 3673 | $L_{A793}$ | $L_{B5}$ |
| 3674 | $L_{A794}$ | $L_{B5}$ |
| 3675 | $L_{A795}$ | $L_{B5}$ |
| 3676 | $L_{A796}$ | $L_{B5}$ |
| 3677 | $L_{A797}$ | $L_{B5}$ |
| 3678 | $L_{A798}$ | $L_{B5}$ |
| 3679 | $L_{A799}$ | $L_{B5}$ |
| 3680 | $L_{A800}$ | $L_{B5}$ |
| 3681 | $L_{A801}$ | $L_{B5}$ |
| 3682 | $L_{A802}$ | $L_{B5}$ |
| 3683 | $L_{A803}$ | $L_{B5}$ |
| 3684 | $L_{A804}$ | $L_{B5}$ |
| 3685 | $L_{A805}$ | $L_{B5}$ |
| 3686 | $L_{A806}$ | $L_{B5}$ |
| 3687 | $L_{A807}$ | $L_{B5}$ |
| 3688 | $L_{A808}$ | $L_{B5}$ |
| 3689 | $L_{A809}$ | $L_{B5}$ |
| 3690 | $L_{A810}$ | $L_{B5}$ |
| 3691 | $L_{A811}$ | $L_{B5}$ |
| 3692 | $L_{A812}$ | $L_{B5}$ |
| 3693 | $L_{A813}$ | $L_{B5}$ |
| 3694 | $L_{A814}$ | $L_{B5}$ |
| 3695 | $L_{A815}$ | $L_{B5}$ |
| 3696 | $L_{A816}$ | $L_{B5}$ |
| 3697 | $L_{A817}$ | $L_{B5}$ |
| 3698 | $L_{A818}$ | $L_{B5}$ |
| 3699 | $L_{A819}$ | $L_{B5}$ |
| 3700 | $L_{A820}$ | $L_{B5}$ |

TABLE 2-continued

| Compound Number | $L_A$ | $L_B$ |
|---|---|---|
| 3701 | $L_{A821}$ | $L_{B5}$ |
| 3702 | $L_{A822}$ | $L_{B5}$ |
| 3703 | $L_{A823}$ | $L_{B5}$ |
| 3704 | $L_{A824}$ | $L_{B5}$ |
| 3705 | $L_{A825}$ | $L_{B5}$ |
| 3706 | $L_{A826}$ | $L_{B5}$ |
| 3707 | $L_{A827}$ | $L_{B5}$ |
| 3708 | $L_{A828}$ | $L_{B5}$ |
| 3709 | $L_{A829}$ | $L_{B5}$ |
| 3710 | $L_{A830}$ | $L_{B5}$ |
| 3711 | $L_{A831}$ | $L_{B5}$ |
| 3712 | $L_{A832}$ | $L_{B5}$ |
| 3713 | $L_{A833}$ | $L_{B5}$ |
| 3714 | $L_{A834}$ | $L_{B5}$ |
| 3715 | $L_{A835}$ | $L_{B5}$ |
| 3716 | $L_{A836}$ | $L_{B5}$ |
| 3717 | $L_{A837}$ | $L_{B5}$ |
| 3718 | $L_{A838}$ | $L_{B5}$ |
| 3719 | $L_{A839}$ | $L_{B5}$ |
| 3720 | $L_{A840}$ | $L_{B5}$ |
| 3721 | $L_{A841}$ | $L_{B5}$ |
| 3722 | $L_{A842}$ | $L_{B5}$ |
| 3723 | $L_{A843}$ | $L_{B5}$ |
| 3724 | $L_{A844}$ | $L_{B5}$ |
| 3725 | $L_{A845}$ | $L_{B5}$ |
| 3726 | $L_{A846}$ | $L_{B5}$ |
| 3727 | $L_{A847}$ | $L_{B5}$ |
| 3728 | $L_{A848}$ | $L_{B5}$ |
| 3729 | $L_{A849}$ | $L_{B5}$ |
| 3730 | $L_{A850}$ | $L_{B5}$ |
| 3731 | $L_{A851}$ | $L_{B5}$ |
| 3732 | $L_{A852}$ | $L_{B5}$ |
| 3733 | $L_{A853}$ | $L_{B5}$ |
| 3734 | $L_{A854}$ | $L_{B5}$ |
| 3735 | $L_{A855}$ | $L_{B5}$ |
| 3736 | $L_{A856}$ | $L_{B5}$ |
| 3737 | $L_{A857}$ | $L_{B5}$ |
| 3738 | $L_{A858}$ | $L_{B5}$ |
| 3739 | $L_{A859}$ | $L_{B5}$ |
| 3740 | $L_{A860}$ | $L_{B5}$ |
| 3741 | $L_{A861}$ | $L_{B5}$ |
| 3742 | $L_{A862}$ | $L_{B5}$ |
| 3743 | $L_{A863}$ | $L_{B5}$ |
| 3744 | $L_{A864}$ | $L_{B5}$ |
| 3745 | $L_{A865}$ | $L_{B5}$ |
| 3746 | $L_{A866}$ | $L_{B5}$ |
| 3747 | $L_{A867}$ | $L_{B5}$ |
| 3748 | $L_{A868}$ | $L_{B5}$ |
| 3749 | $L_{A869}$ | $L_{B5}$ |
| 3750 | $L_{A870}$ | $L_{B5}$ |
| 3751 | $L_{A871}$ | $L_{B5}$ |
| 3752 | $L_{A872}$ | $L_{B5}$ |
| 3753 | $L_{A873}$ | $L_{B5}$ |
| 3754 | $L_{A874}$ | $L_{B5}$ |
| 3755 | $L_{A875}$ | $L_{B5}$ |
| 3756 | $L_{A876}$ | $L_{B5}$ |
| 3757 | $L_{A877}$ | $L_{B5}$ |
| 3758 | $L_{A878}$ | $L_{B5}$ |
| 3759 | $L_{A879}$ | $L_{B5}$ |
| 3760 | $L_{A880}$ | $L_{B5}$ |
| 3761 | $L_{A881}$ | $L_{B5}$ |
| 3762 | $L_{A882}$ | $L_{B5}$ |
| 3763 | $L_{A883}$ | $L_{B5}$ |
| 3764 | $L_{A884}$ | $L_{B5}$ |
| 3765 | $L_{A885}$ | $L_{B5}$ |
| 3766 | $L_{A886}$ | $L_{B5}$ |
| 3767 | $L_{A887}$ | $L_{B5}$ |
| 3768 | $L_{A888}$ | $L_{B5}$ |
| 3769 | $L_{A889}$ | $L_{B5}$ |
| 3770 | $L_{A890}$ | $L_{B5}$ |
| 3771 | $L_{A891}$ | $L_{B5}$ |
| 3772 | $L_{A892}$ | $L_{B5}$ |
| 3773 | $L_{A893}$ | $L_{B5}$ |
| 3774 | $L_{A894}$ | $L_{B5}$ |
| 3775 | $L_{A895}$ | $L_{B5}$ |
| 3776 | $L_{A896}$ | $L_{B5}$ |
| 3777 | $L_{A897}$ | $L_{B5}$ |

TABLE 2-continued

| Compound Number | $L_A$ | $L_B$ |
|---|---|---|
| 3778 | $L_{A898}$ | $L_{B5}$ |
| 3779 | $L_{A899}$ | $L_{B5}$ |
| 3780 | $L_{A900}$ | $L_{B5}$ |
| 3781 | $L_{A901}$ | $L_{B5}$ |
| 3782 | $L_{A902}$ | $L_{B5}$ |
| 3783 | $L_{A903}$ | $L_{B5}$ |
| 3784 | $L_{A904}$ | $L_{B5}$ |
| 3785 | $L_{A905}$ | $L_{B5}$ |
| 3786 | $L_{A906}$ | $L_{B5}$ |
| 3787 | $L_{A907}$ | $L_{B5}$ |
| 3788 | $L_{A908}$ | $L_{B5}$ |
| 3789 | $L_{A909}$ | $L_{B5}$ |
| 3790 | $L_{A910}$ | $L_{B5}$ |
| 3791 | $L_{A911}$ | $L_{B5}$ |
| 3792 | $L_{A912}$ | $L_{B5}$ |
| 3793 | $L_{A913}$ | $L_{B5}$ |
| 3794 | $L_{A914}$ | $L_{B5}$ |
| 3795 | $L_{A915}$ | $L_{B5}$ |
| 3796 | $L_{A916}$ | $L_{B5}$ |
| 3797 | $L_{A917}$ | $L_{B5}$ |
| 3798 | $L_{A918}$ | $L_{B5}$ |
| 3799 | $L_{A919}$ | $L_{B5}$ |
| 3800 | $L_{A920}$ | $L_{B5}$ |
| 3801 | $L_{A921}$ | $L_{B5}$ |
| 3802 | $L_{A922}$ | $L_{B5}$ |
| 3803 | $L_{A923}$ | $L_{B5}$ |
| 3804 | $L_{A924}$ | $L_{B5}$ |
| 3805 | $L_{A925}$ | $L_{B5}$ |
| 3806 | $L_{A926}$ | $L_{B5}$ |
| 3807 | $L_{A927}$ | $L_{B5}$ |
| 3808 | $L_{A928}$ | $L_{B5}$ |
| 3809 | $L_{A929}$ | $L_{B5}$ |
| 3810 | $L_{A930}$ | $L_{B5}$ |
| 3811 | $L_{A931}$ | $L_{B5}$ |
| 3812 | $L_{A932}$ | $L_{B5}$ |
| 3813 | $L_{A933}$ | $L_{B5}$ |
| 3814 | $L_{A934}$ | $L_{B5}$ |
| 3815 | $L_{A935}$ | $L_{B5}$ |
| 3816 | $L_{A936}$ | $L_{B5}$ |
| 3817 | $L_{A937}$ | $L_{B5}$ |
| 3818 | $L_{A938}$ | $L_{B5}$ |
| 3819 | $L_{A939}$ | $L_{B5}$ |
| 3820 | $L_{A940}$ | $L_{B5}$ |
| 3821 | $L_{A941}$ | $L_{B5}$ |
| 3822 | $L_{A942}$ | $L_{B5}$ |
| 3823 | $L_{A943}$ | $L_{B5}$ |
| 3824 | $L_{A944}$ | $L_{B5}$ |
| 3825 | $L_{A945}$ | $L_{B5}$ |
| 3826 | $L_{A946}$ | $L_{B5}$ |
| 3827 | $L_{A947}$ | $L_{B5}$ |
| 3828 | $L_{A948}$ | $L_{B5}$ |
| 3829 | $L_{A949}$ | $L_{B5}$ |
| 3830 | $L_{A950}$ | $L_{B5}$ |
| 3831 | $L_{A951}$ | $L_{B5}$ |
| 3832 | $L_{A952}$ | $L_{B5}$ |
| 3833 | $L_{A953}$ | $L_{B5}$ |
| 3834 | $L_{A954}$ | $L_{B5}$ |
| 3835 | $L_{A955}$ | $L_{B5}$ |
| 3836 | $L_{A956}$ | $L_{B5}$ |
| 3837 | $L_{A957}$ | $L_{B5}$ |
| 3838 | $L_{A958}$ | $L_{B5}$ |
| 3839 | $L_{A959}$ | $L_{B5}$ |
| 3840 | $L_{A960}$ | $L_{B5}$ |
| 3841 | $L_{A1}$ | $L_{B10}$ |
| 3842 | $L_{A2}$ | $L_{B10}$ |
| 3843 | $L_{A3}$ | $L_{B10}$ |
| 3844 | $L_{A4}$ | $L_{B10}$ |
| 3845 | $L_{A5}$ | $L_{B10}$ |
| 3846 | $L_{A6}$ | $L_{B10}$ |
| 3847 | $L_{A7}$ | $L_{B10}$ |
| 3848 | $L_{A8}$ | $L_{B10}$ |
| 3849 | $L_{A9}$ | $L_{B10}$ |
| 3850 | $L_{A10}$ | $L_{B10}$ |
| 3851 | $L_{A11}$ | $L_{B10}$ |
| 3852 | $L_{A12}$ | $L_{B10}$ |
| 3853 | $L_{A13}$ | $L_{B10}$ |
| 3854 | $L_{A14}$ | $L_{B10}$ |

TABLE 2-continued

| Compound Number | $L_A$ | $L_B$ |
|---|---|---|
| 3855 | $L_{A15}$ | $L_{B10}$ |
| 3856 | $L_{A16}$ | $L_{B10}$ |
| 3857 | $L_{A17}$ | $L_{B10}$ |
| 3858 | $L_{A18}$ | $L_{B10}$ |
| 3859 | $L_{A19}$ | $L_{B10}$ |
| 3860 | $L_{A20}$ | $L_{B10}$ |
| 3861 | $L_{A21}$ | $L_{B10}$ |
| 3862 | $L_{A22}$ | $L_{B10}$ |
| 3863 | $L_{A23}$ | $L_{B10}$ |
| 3864 | $L_{A24}$ | $L_{B10}$ |
| 3865 | $L_{A25}$ | $L_{B10}$ |
| 3866 | $L_{A26}$ | $L_{B10}$ |
| 3867 | $L_{A27}$ | $L_{B10}$ |
| 3868 | $L_{A28}$ | $L_{B10}$ |
| 3869 | $L_{A29}$ | $L_{B10}$ |
| 3870 | $L_{A30}$ | $L_{B10}$ |
| 3871 | $L_{A31}$ | $L_{B10}$ |
| 3872 | $L_{A32}$ | $L_{B10}$ |
| 3873 | $L_{A33}$ | $L_{B10}$ |
| 3874 | $L_{A34}$ | $L_{B10}$ |
| 3875 | $L_{A35}$ | $L_{B10}$ |
| 3876 | $L_{A36}$ | $L_{B10}$ |
| 3877 | $L_{A37}$ | $L_{B10}$ |
| 3878 | $L_{A38}$ | $L_{B10}$ |
| 3879 | $L_{A39}$ | $L_{B10}$ |
| 3880 | $L_{A40}$ | $L_{B10}$ |
| 3881 | $L_{A41}$ | $L_{B10}$ |
| 3882 | $L_{A42}$ | $L_{B10}$ |
| 3883 | $L_{A43}$ | $L_{B10}$ |
| 3884 | $L_{A44}$ | $L_{B10}$ |
| 3885 | $L_{A45}$ | $L_{B10}$ |
| 3886 | $L_{A46}$ | $L_{B10}$ |
| 3887 | $L_{A47}$ | $L_{B10}$ |
| 3888 | $L_{A48}$ | $L_{B10}$ |
| 3889 | $L_{A49}$ | $L_{B10}$ |
| 3890 | $L_{A50}$ | $L_{B10}$ |
| 3891 | $L_{A51}$ | $L_{B10}$ |
| 3892 | $L_{A52}$ | $L_{B10}$ |
| 3893 | $L_{A53}$ | $L_{B10}$ |
| 3894 | $L_{A54}$ | $L_{B10}$ |
| 3895 | $L_{A55}$ | $L_{B10}$ |
| 3896 | $L_{A56}$ | $L_{B10}$ |
| 3897 | $L_{A57}$ | $L_{B10}$ |
| 3898 | $L_{A58}$ | $L_{B10}$ |
| 3899 | $L_{A59}$ | $L_{B10}$ |
| 3900 | $L_{A60}$ | $L_{B10}$ |
| 3901 | $L_{A61}$ | $L_{B10}$ |
| 3902 | $L_{A62}$ | $L_{B10}$ |
| 3903 | $L_{A63}$ | $L_{B10}$ |
| 3904 | $L_{A64}$ | $L_{B10}$ |
| 3905 | $L_{A65}$ | $L_{B10}$ |
| 3906 | $L_{A66}$ | $L_{B10}$ |
| 3907 | $L_{A67}$ | $L_{B10}$ |
| 3908 | $L_{A68}$ | $L_{B10}$ |
| 3909 | $L_{A69}$ | $L_{B10}$ |
| 3910 | $L_{A70}$ | $L_{B10}$ |
| 3911 | $L_{A71}$ | $L_{B10}$ |
| 3912 | $L_{A72}$ | $L_{B10}$ |
| 3913 | $L_{A73}$ | $L_{B10}$ |
| 3914 | $L_{A74}$ | $L_{B10}$ |
| 3915 | $L_{A75}$ | $L_{B10}$ |
| 3916 | $L_{A76}$ | $L_{B10}$ |
| 3917 | $L_{A77}$ | $L_{B10}$ |
| 3918 | $L_{A78}$ | $L_{B10}$ |
| 3919 | $L_{A79}$ | $L_{B10}$ |
| 3920 | $L_{A80}$ | $L_{B10}$ |
| 3921 | $L_{A81}$ | $L_{B10}$ |
| 3922 | $L_{A82}$ | $L_{B10}$ |
| 3923 | $L_{A83}$ | $L_{B10}$ |
| 3924 | $L_{A84}$ | $L_{B10}$ |
| 3925 | $L_{A85}$ | $L_{B10}$ |
| 3926 | $L_{A86}$ | $L_{B10}$ |
| 3927 | $L_{A87}$ | $L_{B10}$ |
| 3928 | $L_{A88}$ | $L_{B10}$ |
| 3929 | $L_{A89}$ | $L_{B10}$ |
| 3930 | $L_{A90}$ | $L_{B10}$ |
| 3931 | $L_{A91}$ | $L_{B10}$ |

TABLE 2-continued

| Compound Number | $L_A$ | $L_B$ |
|---|---|---|
| 3932 | $L_{A92}$ | $L_{B10}$ |
| 3933 | $L_{A93}$ | $L_{B10}$ |
| 3934 | $L_{A94}$ | $L_{B10}$ |
| 3935 | $L_{A95}$ | $L_{B10}$ |
| 3936 | $L_{A96}$ | $L_{B10}$ |
| 3937 | $L_{A97}$ | $L_{B10}$ |
| 3938 | $L_{A98}$ | $L_{B10}$ |
| 3939 | $L_{A99}$ | $L_{B10}$ |
| 3940 | $L_{A100}$ | $L_{B10}$ |
| 3941 | $L_{A101}$ | $L_{B10}$ |
| 3942 | $L_{A102}$ | $L_{B10}$ |
| 3943 | $L_{A103}$ | $L_{B10}$ |
| 3944 | $L_{A104}$ | $L_{B10}$ |
| 3945 | $L_{A105}$ | $L_{B10}$ |
| 3946 | $L_{A106}$ | $L_{B10}$ |
| 3947 | $L_{A107}$ | $L_{B10}$ |
| 3948 | $L_{A108}$ | $L_{B10}$ |
| 3949 | $L_{A109}$ | $L_{B10}$ |
| 3950 | $L_{A110}$ | $L_{B10}$ |
| 3951 | $L_{A111}$ | $L_{B10}$ |
| 3952 | $L_{A112}$ | $L_{B10}$ |
| 3953 | $L_{A113}$ | $L_{B10}$ |
| 3954 | $L_{A114}$ | $L_{B10}$ |
| 3955 | $L_{A115}$ | $L_{B10}$ |
| 3956 | $L_{A116}$ | $L_{B10}$ |
| 3957 | $L_{A117}$ | $L_{B10}$ |
| 3958 | $L_{A118}$ | $L_{B10}$ |
| 3959 | $L_{A119}$ | $L_{B10}$ |
| 3960 | $L_{A120}$ | $L_{B10}$ |
| 3961 | $L_{A121}$ | $L_{B10}$ |
| 3962 | $L_{A122}$ | $L_{B10}$ |
| 3963 | $L_{A123}$ | $L_{B10}$ |
| 3964 | $L_{A124}$ | $L_{B10}$ |
| 3965 | $L_{A125}$ | $L_{B10}$ |
| 3966 | $L_{A126}$ | $L_{B10}$ |
| 3967 | $L_{A127}$ | $L_{B10}$ |
| 3968 | $L_{A128}$ | $L_{B10}$ |
| 3969 | $L_{A129}$ | $L_{B10}$ |
| 3970 | $L_{A130}$ | $L_{B10}$ |
| 3971 | $L_{A131}$ | $L_{B10}$ |
| 3972 | $L_{A132}$ | $L_{B10}$ |
| 3973 | $L_{A133}$ | $L_{B10}$ |
| 3974 | $L_{A134}$ | $L_{B10}$ |
| 3975 | $L_{A135}$ | $L_{B10}$ |
| 3976 | $L_{A136}$ | $L_{B10}$ |
| 3977 | $L_{A137}$ | $L_{B10}$ |
| 3978 | $L_{A138}$ | $L_{B10}$ |
| 3979 | $L_{A139}$ | $L_{B10}$ |
| 3980 | $L_{A140}$ | $L_{B10}$ |
| 3981 | $L_{A141}$ | $L_{B10}$ |
| 3982 | $L_{A142}$ | $L_{B10}$ |
| 3983 | $L_{A143}$ | $L_{B10}$ |
| 3984 | $L_{A144}$ | $L_{B10}$ |
| 3985 | $L_{A145}$ | $L_{B10}$ |
| 3986 | $L_{A146}$ | $L_{B10}$ |
| 3987 | $L_{A147}$ | $L_{B10}$ |
| 3988 | $L_{A148}$ | $L_{B10}$ |
| 3989 | $L_{A149}$ | $L_{B10}$ |
| 3990 | $L_{A150}$ | $L_{B10}$ |
| 3991 | $L_{A151}$ | $L_{B10}$ |
| 3992 | $L_{A152}$ | $L_{B10}$ |
| 3993 | $L_{A153}$ | $L_{B10}$ |
| 3994 | $L_{A154}$ | $L_{B10}$ |
| 3995 | $L_{A155}$ | $L_{B10}$ |
| 3996 | $L_{A156}$ | $L_{B10}$ |
| 3997 | $L_{A157}$ | $L_{B10}$ |
| 3998 | $L_{A158}$ | $L_{B10}$ |
| 3999 | $L_{A159}$ | $L_{B10}$ |
| 4000 | $L_{A160}$ | $L_{B10}$ |
| 4001 | $L_{A161}$ | $L_{B10}$ |
| 4002 | $L_{A162}$ | $L_{B10}$ |
| 4003 | $L_{A163}$ | $L_{B10}$ |
| 4004 | $L_{A164}$ | $L_{B10}$ |
| 4005 | $L_{A165}$ | $L_{B10}$ |
| 4006 | $L_{A166}$ | $L_{B10}$ |
| 4007 | $L_{A167}$ | $L_{B10}$ |
| 4008 | $L_{A168}$ | $L_{B10}$ |

TABLE 2-continued

| Compound Number | $L_A$ | $L_B$ |
|---|---|---|
| 4009 | $L_{A169}$ | $L_{B10}$ |
| 4010 | $L_{A170}$ | $L_{B10}$ |
| 4011 | $L_{A171}$ | $L_{B10}$ |
| 4012 | $L_{A172}$ | $L_{B10}$ |
| 4013 | $L_{A173}$ | $L_{B10}$ |
| 4014 | $L_{A174}$ | $L_{B10}$ |
| 4015 | $L_{A175}$ | $L_{B10}$ |
| 4016 | $L_{A176}$ | $L_{B10}$ |
| 4017 | $L_{A177}$ | $L_{B10}$ |
| 4018 | $L_{A178}$ | $L_{B10}$ |
| 4019 | $L_{A179}$ | $L_{B10}$ |
| 4020 | $L_{A180}$ | $L_{B10}$ |
| 4021 | $L_{A181}$ | $L_{B10}$ |
| 4022 | $L_{A182}$ | $L_{B10}$ |
| 4023 | $L_{A183}$ | $L_{B10}$ |
| 4024 | $L_{A184}$ | $L_{B10}$ |
| 4025 | $L_{A185}$ | $L_{B10}$ |
| 4026 | $L_{A186}$ | $L_{B10}$ |
| 4027 | $L_{A187}$ | $L_{B10}$ |
| 4028 | $L_{A188}$ | $L_{B10}$ |
| 4029 | $L_{A189}$ | $L_{B10}$ |
| 4030 | $L_{A190}$ | $L_{B10}$ |
| 4031 | $L_{A191}$ | $L_{B10}$ |
| 4032 | $L_{A192}$ | $L_{B10}$ |
| 4033 | $L_{A193}$ | $L_{B10}$ |
| 4034 | $L_{A194}$ | $L_{B10}$ |
| 4035 | $L_{A195}$ | $L_{B10}$ |
| 4036 | $L_{A196}$ | $L_{B10}$ |
| 4037 | $L_{A197}$ | $L_{B10}$ |
| 4038 | $L_{A198}$ | $L_{B10}$ |
| 4039 | $L_{A199}$ | $L_{B10}$ |
| 4040 | $L_{A200}$ | $L_{B10}$ |
| 4041 | $L_{A201}$ | $L_{B10}$ |
| 4042 | $L_{A202}$ | $L_{B10}$ |
| 4043 | $L_{A203}$ | $L_{B10}$ |
| 4044 | $L_{A204}$ | $L_{B10}$ |
| 4045 | $L_{A205}$ | $L_{B10}$ |
| 4046 | $L_{A206}$ | $L_{B10}$ |
| 4047 | $L_{A207}$ | $L_{B10}$ |
| 4048 | $L_{A208}$ | $L_{B10}$ |
| 4049 | $L_{A209}$ | $L_{B10}$ |
| 4050 | $L_{A210}$ | $L_{B10}$ |
| 4051 | $L_{A211}$ | $L_{B10}$ |
| 4052 | $L_{A212}$ | $L_{B10}$ |
| 4053 | $L_{A213}$ | $L_{B10}$ |
| 4054 | $L_{A214}$ | $L_{B10}$ |
| 4055 | $L_{A215}$ | $L_{B10}$ |
| 4056 | $L_{A216}$ | $L_{B10}$ |
| 4057 | $L_{A217}$ | $L_{B10}$ |
| 4058 | $L_{A218}$ | $L_{B10}$ |
| 4059 | $L_{A219}$ | $L_{B10}$ |
| 4060 | $L_{A220}$ | $L_{B10}$ |
| 4061 | $L_{A221}$ | $L_{B10}$ |
| 4062 | $L_{A222}$ | $L_{B10}$ |
| 4063 | $L_{A223}$ | $L_{B10}$ |
| 4064 | $L_{A224}$ | $L_{B10}$ |
| 4065 | $L_{A225}$ | $L_{B10}$ |
| 4066 | $L_{A226}$ | $L_{B10}$ |
| 4067 | $L_{A227}$ | $L_{B10}$ |
| 4068 | $L_{A228}$ | $L_{B10}$ |
| 4069 | $L_{A229}$ | $L_{B10}$ |
| 4070 | $L_{A230}$ | $L_{B10}$ |
| 4071 | $L_{A231}$ | $L_{B10}$ |
| 4072 | $L_{A232}$ | $L_{B10}$ |
| 4073 | $L_{A233}$ | $L_{B10}$ |
| 4074 | $L_{A234}$ | $L_{B10}$ |
| 4075 | $L_{A235}$ | $L_{B10}$ |
| 4076 | $L_{A236}$ | $L_{B10}$ |
| 4077 | $L_{A237}$ | $L_{B10}$ |
| 4078 | $L_{A238}$ | $L_{B10}$ |
| 4079 | $L_{A239}$ | $L_{B10}$ |
| 4080 | $L_{A240}$ | $L_{B10}$ |
| 4081 | $L_{A241}$ | $L_{B10}$ |
| 4082 | $L_{A242}$ | $L_{B10}$ |
| 4083 | $L_{A243}$ | $L_{B10}$ |
| 4084 | $L_{A244}$ | $L_{B10}$ |
| 4085 | $L_{A245}$ | $L_{B10}$ |

TABLE 2-continued

| Compound Number | $L_A$ | $L_B$ |
|---|---|---|
| 4086 | $L_{A246}$ | $L_{B10}$ |
| 4087 | $L_{A247}$ | $L_{B10}$ |
| 4088 | $L_{A248}$ | $L_{B10}$ |
| 4089 | $L_{A249}$ | $L_{B10}$ |
| 4090 | $L_{A250}$ | $L_{B10}$ |
| 4091 | $L_{A251}$ | $L_{B10}$ |
| 4092 | $L_{A252}$ | $L_{B10}$ |
| 4093 | $L_{A253}$ | $L_{B10}$ |
| 4094 | $L_{A254}$ | $L_{B10}$ |
| 4095 | $L_{A255}$ | $L_{B10}$ |
| 4096 | $L_{A256}$ | $L_{B10}$ |
| 4097 | $L_{A257}$ | $L_{B10}$ |
| 4098 | $L_{A258}$ | $L_{B10}$ |
| 4099 | $L_{A259}$ | $L_{B10}$ |
| 4100 | $L_{A260}$ | $L_{B10}$ |
| 4101 | $L_{A261}$ | $L_{B10}$ |
| 4102 | $L_{A262}$ | $L_{B10}$ |
| 4103 | $L_{A263}$ | $L_{B10}$ |
| 4104 | $L_{A264}$ | $L_{B10}$ |
| 4105 | $L_{A265}$ | $L_{B10}$ |
| 4106 | $L_{A266}$ | $L_{B10}$ |
| 4107 | $L_{A267}$ | $L_{B10}$ |
| 4108 | $L_{A268}$ | $L_{B10}$ |
| 4109 | $L_{A269}$ | $L_{B10}$ |
| 4110 | $L_{A270}$ | $L_{B10}$ |
| 4111 | $L_{A271}$ | $L_{B10}$ |
| 4112 | $L_{A272}$ | $L_{B10}$ |
| 4113 | $L_{A273}$ | $L_{B10}$ |
| 4114 | $L_{A274}$ | $L_{B10}$ |
| 4115 | $L_{A275}$ | $L_{B10}$ |
| 4116 | $L_{A276}$ | $L_{B10}$ |
| 4117 | $L_{A277}$ | $L_{B10}$ |
| 4118 | $L_{A278}$ | $L_{B10}$ |
| 4119 | $L_{A279}$ | $L_{B10}$ |
| 4120 | $L_{A280}$ | $L_{B10}$ |
| 4121 | $L_{A281}$ | $L_{B10}$ |
| 4122 | $L_{A282}$ | $L_{B10}$ |
| 4123 | $L_{A283}$ | $L_{B10}$ |
| 4124 | $L_{A284}$ | $L_{B10}$ |
| 4125 | $L_{A285}$ | $L_{B10}$ |
| 4126 | $L_{A286}$ | $L_{B10}$ |
| 4127 | $L_{A287}$ | $L_{B10}$ |
| 4128 | $L_{A288}$ | $L_{B10}$ |
| 4129 | $L_{A289}$ | $L_{B10}$ |
| 4130 | $L_{A290}$ | $L_{B10}$ |
| 4131 | $L_{A291}$ | $L_{B10}$ |
| 4132 | $L_{A292}$ | $L_{B10}$ |
| 4133 | $L_{A293}$ | $L_{B10}$ |
| 4134 | $L_{A294}$ | $L_{B10}$ |
| 4135 | $L_{A295}$ | $L_{B10}$ |
| 4136 | $L_{A296}$ | $L_{B10}$ |
| 4137 | $L_{A297}$ | $L_{B10}$ |
| 4138 | $L_{A298}$ | $L_{B10}$ |
| 4139 | $L_{A299}$ | $L_{B10}$ |
| 4140 | $L_{A300}$ | $L_{B10}$ |
| 4141 | $L_{A301}$ | $L_{B10}$ |
| 4142 | $L_{A302}$ | $L_{B10}$ |
| 4143 | $L_{A303}$ | $L_{B10}$ |
| 4144 | $L_{A304}$ | $L_{B10}$ |
| 4145 | $L_{A305}$ | $L_{B10}$ |
| 4146 | $L_{A306}$ | $L_{B10}$ |
| 4147 | $L_{A307}$ | $L_{B10}$ |
| 4148 | $L_{A308}$ | $L_{B10}$ |
| 4149 | $L_{A309}$ | $L_{B10}$ |
| 4150 | $L_{A310}$ | $L_{B10}$ |
| 4151 | $L_{A311}$ | $L_{B10}$ |
| 4152 | $L_{A312}$ | $L_{B10}$ |
| 4153 | $L_{A313}$ | $L_{B10}$ |
| 4154 | $L_{A314}$ | $L_{B10}$ |
| 4155 | $L_{A315}$ | $L_{B10}$ |
| 4156 | $L_{A316}$ | $L_{B10}$ |
| 4157 | $L_{A317}$ | $L_{B10}$ |
| 4158 | $L_{A318}$ | $L_{B10}$ |
| 4159 | $L_{A319}$ | $L_{B10}$ |
| 4160 | $L_{A320}$ | $L_{B10}$ |
| 4161 | $L_{A321}$ | $L_{B10}$ |
| 4162 | $L_{A322}$ | $L_{B10}$ |

TABLE 2-continued

| Compound Number | $L_A$ | $L_B$ |
|---|---|---|
| 4163 | $L_{A323}$ | $L_{B10}$ |
| 4164 | $L_{A324}$ | $L_{B10}$ |
| 4165 | $L_{A325}$ | $L_{B10}$ |
| 4166 | $L_{A326}$ | $L_{B10}$ |
| 4167 | $L_{A327}$ | $L_{B10}$ |
| 4168 | $L_{A328}$ | $L_{B10}$ |
| 4169 | $L_{A329}$ | $L_{B10}$ |
| 4170 | $L_{A330}$ | $L_{B10}$ |
| 4171 | $L_{A331}$ | $L_{B10}$ |
| 4172 | $L_{A332}$ | $L_{B10}$ |
| 4173 | $L_{A333}$ | $L_{B10}$ |
| 4174 | $L_{A334}$ | $L_{B10}$ |
| 4175 | $L_{A335}$ | $L_{B10}$ |
| 4176 | $L_{A336}$ | $L_{B10}$ |
| 4177 | $L_{A337}$ | $L_{B10}$ |
| 4178 | $L_{A338}$ | $L_{B10}$ |
| 4179 | $L_{A339}$ | $L_{B10}$ |
| 4180 | $L_{A340}$ | $L_{B10}$ |
| 4181 | $L_{A341}$ | $L_{B10}$ |
| 4182 | $L_{A342}$ | $L_{B10}$ |
| 4183 | $L_{A343}$ | $L_{B10}$ |
| 4184 | $L_{A344}$ | $L_{B10}$ |
| 4185 | $L_{A345}$ | $L_{B10}$ |
| 4186 | $L_{A346}$ | $L_{B10}$ |
| 4187 | $L_{A347}$ | $L_{B10}$ |
| 4188 | $L_{A348}$ | $L_{B10}$ |
| 4189 | $L_{A349}$ | $L_{B10}$ |
| 4190 | $L_{A350}$ | $L_{B10}$ |
| 4191 | $L_{A351}$ | $L_{B10}$ |
| 4192 | $L_{A352}$ | $L_{B10}$ |
| 4193 | $L_{A353}$ | $L_{B10}$ |
| 4194 | $L_{A354}$ | $L_{B10}$ |
| 4195 | $L_{A355}$ | $L_{B10}$ |
| 4196 | $L_{A356}$ | $L_{B10}$ |
| 4197 | $L_{A357}$ | $L_{B10}$ |
| 4198 | $L_{A358}$ | $L_{B10}$ |
| 4199 | $L_{A359}$ | $L_{B10}$ |
| 4200 | $L_{A360}$ | $L_{B10}$ |
| 4201 | $L_{A361}$ | $L_{B10}$ |
| 4202 | $L_{A362}$ | $L_{B10}$ |
| 4203 | $L_{A363}$ | $L_{B10}$ |
| 4204 | $L_{A364}$ | $L_{B10}$ |
| 4205 | $L_{A365}$ | $L_{B10}$ |
| 4206 | $L_{A366}$ | $L_{B10}$ |
| 4207 | $L_{A367}$ | $L_{B10}$ |
| 4208 | $L_{A368}$ | $L_{B10}$ |
| 4209 | $L_{A369}$ | $L_{B10}$ |
| 4210 | $L_{A370}$ | $L_{B10}$ |
| 4211 | $L_{A371}$ | $L_{B10}$ |
| 4212 | $L_{A372}$ | $L_{B10}$ |
| 4213 | $L_{A373}$ | $L_{B10}$ |
| 4214 | $L_{A374}$ | $L_{B10}$ |
| 4215 | $L_{A375}$ | $L_{B10}$ |
| 4216 | $L_{A376}$ | $L_{B10}$ |
| 4217 | $L_{A377}$ | $L_{B10}$ |
| 4218 | $L_{A378}$ | $L_{B10}$ |
| 4219 | $L_{A379}$ | $L_{B10}$ |
| 4220 | $L_{A380}$ | $L_{B10}$ |
| 4221 | $L_{A381}$ | $L_{B10}$ |
| 4222 | $L_{A382}$ | $L_{B10}$ |
| 4223 | $L_{A383}$ | $L_{B10}$ |
| 4224 | $L_{A384}$ | $L_{B10}$ |
| 4225 | $L_{A385}$ | $L_{B10}$ |
| 4226 | $L_{A386}$ | $L_{B10}$ |
| 4227 | $L_{A387}$ | $L_{B10}$ |
| 4228 | $L_{A388}$ | $L_{B10}$ |
| 4229 | $L_{A389}$ | $L_{B10}$ |
| 4230 | $L_{A390}$ | $L_{B10}$ |
| 4231 | $L_{A391}$ | $L_{B10}$ |
| 4232 | $L_{A392}$ | $L_{B10}$ |
| 4233 | $L_{A393}$ | $L_{B10}$ |
| 4234 | $L_{A394}$ | $L_{B10}$ |
| 4235 | $L_{A395}$ | $L_{B10}$ |
| 4236 | $L_{A396}$ | $L_{B10}$ |
| 4237 | $L_{A397}$ | $L_{B10}$ |
| 4238 | $L_{A398}$ | $L_{B10}$ |
| 4239 | $L_{A399}$ | $L_{B10}$ |
| 4240 | $L_{A400}$ | $L_{B10}$ |
| 4241 | $L_{A401}$ | $L_{B10}$ |
| 4242 | $L_{A402}$ | $L_{B10}$ |
| 4243 | $L_{A403}$ | $L_{B10}$ |
| 4244 | $L_{A404}$ | $L_{B10}$ |
| 4245 | $L_{A405}$ | $L_{B10}$ |
| 4246 | $L_{A406}$ | $L_{B10}$ |
| 4247 | $L_{A407}$ | $L_{B10}$ |
| 4248 | $L_{A408}$ | $L_{B10}$ |
| 4249 | $L_{A409}$ | $L_{B10}$ |
| 4250 | $L_{A410}$ | $L_{B10}$ |
| 4251 | $L_{A411}$ | $L_{B10}$ |
| 4252 | $L_{A412}$ | $L_{B10}$ |
| 4253 | $L_{A413}$ | $L_{B10}$ |
| 4254 | $L_{A414}$ | $L_{B10}$ |
| 4255 | $L_{A415}$ | $L_{B10}$ |
| 4256 | $L_{A416}$ | $L_{B10}$ |
| 4257 | $L_{A417}$ | $L_{B10}$ |
| 4258 | $L_{A418}$ | $L_{B10}$ |
| 4259 | $L_{A419}$ | $L_{B10}$ |
| 4260 | $L_{A420}$ | $L_{B10}$ |
| 4261 | $L_{A421}$ | $L_{B10}$ |
| 4262 | $L_{A422}$ | $L_{B10}$ |
| 4263 | $L_{A423}$ | $L_{B10}$ |
| 4264 | $L_{A424}$ | $L_{B10}$ |
| 4265 | $L_{A425}$ | $L_{B10}$ |
| 4266 | $L_{A426}$ | $L_{B10}$ |
| 4267 | $L_{A427}$ | $L_{B10}$ |
| 4268 | $L_{A428}$ | $L_{B10}$ |
| 4269 | $L_{A429}$ | $L_{B10}$ |
| 4270 | $L_{A430}$ | $L_{B10}$ |
| 4271 | $L_{A431}$ | $L_{B10}$ |
| 4272 | $L_{A432}$ | $L_{B10}$ |
| 4273 | $L_{A433}$ | $L_{B10}$ |
| 4274 | $L_{A434}$ | $L_{B10}$ |
| 4275 | $L_{A435}$ | $L_{B10}$ |
| 4276 | $L_{A436}$ | $L_{B10}$ |
| 4277 | $L_{A437}$ | $L_{B10}$ |
| 4278 | $L_{A438}$ | $L_{B10}$ |
| 4279 | $L_{A439}$ | $L_{B10}$ |
| 4280 | $L_{A440}$ | $L_{B10}$ |
| 4281 | $L_{A441}$ | $L_{B10}$ |
| 4282 | $L_{A442}$ | $L_{B10}$ |
| 4283 | $L_{A443}$ | $L_{B10}$ |
| 4284 | $L_{A444}$ | $L_{B10}$ |
| 4285 | $L_{A445}$ | $L_{B10}$ |
| 4286 | $L_{A446}$ | $L_{B10}$ |
| 4287 | $L_{A447}$ | $L_{B10}$ |
| 4288 | $L_{A448}$ | $L_{B10}$ |
| 4289 | $L_{A449}$ | $L_{B10}$ |
| 4290 | $L_{A450}$ | $L_{B10}$ |
| 4291 | $L_{A451}$ | $L_{B10}$ |
| 4292 | $L_{A452}$ | $L_{B10}$ |
| 4293 | $L_{A453}$ | $L_{B10}$ |
| 4294 | $L_{A454}$ | $L_{B10}$ |
| 4295 | $L_{A455}$ | $L_{B10}$ |
| 4296 | $L_{A456}$ | $L_{B10}$ |
| 4297 | $L_{A457}$ | $L_{B10}$ |
| 4298 | $L_{A458}$ | $L_{B10}$ |
| 4299 | $L_{A459}$ | $L_{B10}$ |
| 4300 | $L_{A460}$ | $L_{B10}$ |
| 4301 | $L_{A461}$ | $L_{B10}$ |
| 4302 | $L_{A462}$ | $L_{B10}$ |
| 4303 | $L_{A463}$ | $L_{B10}$ |
| 4304 | $L_{A464}$ | $L_{B10}$ |
| 4305 | $L_{A465}$ | $L_{B10}$ |
| 4306 | $L_{A466}$ | $L_{B10}$ |
| 4307 | $L_{A467}$ | $L_{B10}$ |
| 4308 | $L_{A468}$ | $L_{B10}$ |
| 4309 | $L_{A469}$ | $L_{B10}$ |
| 4310 | $L_{A470}$ | $L_{B10}$ |
| 4311 | $L_{A471}$ | $L_{B10}$ |
| 4312 | $L_{A472}$ | $L_{B10}$ |
| 4313 | $L_{A473}$ | $L_{B10}$ |
| 4314 | $L_{A474}$ | $L_{B10}$ |
| 4315 | $L_{A475}$ | $L_{B10}$ |
| 4316 | $L_{A476}$ | $L_{B10}$ |

TABLE 2-continued

| Compound Number | $L_A$ | $L_B$ |
|---|---|---|
| 4317 | $L_{A477}$ | $L_{B10}$ |
| 4318 | $L_{A478}$ | $L_{B10}$ |
| 4319 | $L_{A479}$ | $L_{B10}$ |
| 4320 | $L_{A480}$ | $L_{B10}$ |
| 4321 | $L_{A481}$ | $L_{B10}$ |
| 4322 | $L_{A482}$ | $L_{B10}$ |
| 4323 | $L_{A483}$ | $L_{B10}$ |
| 4324 | $L_{A484}$ | $L_{B10}$ |
| 4325 | $L_{A485}$ | $L_{B10}$ |
| 4326 | $L_{A486}$ | $L_{B10}$ |
| 4327 | $L_{A487}$ | $L_{B10}$ |
| 4328 | $L_{A488}$ | $L_{B10}$ |
| 4329 | $L_{A489}$ | $L_{B10}$ |
| 4330 | $L_{A490}$ | $L_{B10}$ |
| 4331 | $L_{A491}$ | $L_{B10}$ |
| 4332 | $L_{A492}$ | $L_{B10}$ |
| 4333 | $L_{A493}$ | $L_{B10}$ |
| 4334 | $L_{A494}$ | $L_{B10}$ |
| 4335 | $L_{A495}$ | $L_{B10}$ |
| 4336 | $L_{A496}$ | $L_{B10}$ |
| 4337 | $L_{A497}$ | $L_{B10}$ |
| 4338 | $L_{A498}$ | $L_{B10}$ |
| 4339 | $L_{A499}$ | $L_{B10}$ |
| 4340 | $L_{A500}$ | $L_{B10}$ |
| 4341 | $L_{A501}$ | $L_{B10}$ |
| 4342 | $L_{A502}$ | $L_{B10}$ |
| 4343 | $L_{A503}$ | $L_{B10}$ |
| 4344 | $L_{A504}$ | $L_{B10}$ |
| 4345 | $L_{A505}$ | $L_{B10}$ |
| 4346 | $L_{A506}$ | $L_{B10}$ |
| 4347 | $L_{A507}$ | $L_{B10}$ |
| 4348 | $L_{A508}$ | $L_{B10}$ |
| 4349 | $L_{A509}$ | $L_{B10}$ |
| 4350 | $L_{A510}$ | $L_{B10}$ |
| 4351 | $L_{A511}$ | $L_{B10}$ |
| 4352 | $L_{A512}$ | $L_{B10}$ |
| 4353 | $L_{A513}$ | $L_{B10}$ |
| 4354 | $L_{A514}$ | $L_{B10}$ |
| 4355 | $L_{A515}$ | $L_{B10}$ |
| 4356 | $L_{A516}$ | $L_{B10}$ |
| 4357 | $L_{A517}$ | $L_{B10}$ |
| 4358 | $L_{A518}$ | $L_{B10}$ |
| 4359 | $L_{A519}$ | $L_{B10}$ |
| 4360 | $L_{A520}$ | $L_{B10}$ |
| 4361 | $L_{A521}$ | $L_{B10}$ |
| 4362 | $L_{A522}$ | $L_{B10}$ |
| 4363 | $L_{A523}$ | $L_{B10}$ |
| 4364 | $L_{A524}$ | $L_{B10}$ |
| 4365 | $L_{A525}$ | $L_{B10}$ |
| 4366 | $L_{A526}$ | $L_{B10}$ |
| 4367 | $L_{A527}$ | $L_{B10}$ |
| 4368 | $L_{A528}$ | $L_{B10}$ |
| 4369 | $L_{A529}$ | $L_{B10}$ |
| 4370 | $L_{A530}$ | $L_{B10}$ |
| 4371 | $L_{A531}$ | $L_{B10}$ |
| 4372 | $L_{A532}$ | $L_{B10}$ |
| 4373 | $L_{A533}$ | $L_{B10}$ |
| 4374 | $L_{A534}$ | $L_{B10}$ |
| 4375 | $L_{A535}$ | $L_{B10}$ |
| 4376 | $L_{A536}$ | $L_{B10}$ |
| 4377 | $L_{A537}$ | $L_{B10}$ |
| 4378 | $L_{A538}$ | $L_{B10}$ |
| 4379 | $L_{A539}$ | $L_{B10}$ |
| 4380 | $L_{A540}$ | $L_{B10}$ |
| 4381 | $L_{A541}$ | $L_{B10}$ |
| 4382 | $L_{A542}$ | $L_{B10}$ |
| 4383 | $L_{A543}$ | $L_{B10}$ |
| 4384 | $L_{A544}$ | $L_{B10}$ |
| 4385 | $L_{A545}$ | $L_{B10}$ |
| 4386 | $L_{A546}$ | $L_{B10}$ |
| 4387 | $L_{A547}$ | $L_{B10}$ |
| 4388 | $L_{A548}$ | $L_{B10}$ |
| 4389 | $L_{A549}$ | $L_{B10}$ |
| 4390 | $L_{A550}$ | $L_{B10}$ |
| 4391 | $L_{A551}$ | $L_{B10}$ |
| 4392 | $L_{A552}$ | $L_{B10}$ |
| 4393 | $L_{A553}$ | $L_{B10}$ |
| 4394 | $L_{A554}$ | $L_{B10}$ |
| 4395 | $L_{A555}$ | $L_{B10}$ |
| 4396 | $L_{A556}$ | $L_{B10}$ |
| 4397 | $L_{A557}$ | $L_{B10}$ |
| 4398 | $L_{A558}$ | $L_{B10}$ |
| 4399 | $L_{A559}$ | $L_{B10}$ |
| 4400 | $L_{A560}$ | $L_{B10}$ |
| 4401 | $L_{A561}$ | $L_{B10}$ |
| 4402 | $L_{A562}$ | $L_{B10}$ |
| 4403 | $L_{A563}$ | $L_{B10}$ |
| 4404 | $L_{A564}$ | $L_{B10}$ |
| 4405 | $L_{A565}$ | $L_{B10}$ |
| 4406 | $L_{A566}$ | $L_{B10}$ |
| 4407 | $L_{A567}$ | $L_{B10}$ |
| 4408 | $L_{A568}$ | $L_{B10}$ |
| 4409 | $L_{A569}$ | $L_{B10}$ |
| 4410 | $L_{A570}$ | $L_{B10}$ |
| 4411 | $L_{A571}$ | $L_{B10}$ |
| 4412 | $L_{A572}$ | $L_{B10}$ |
| 4413 | $L_{A573}$ | $L_{B10}$ |
| 4414 | $L_{A574}$ | $L_{B10}$ |
| 4415 | $L_{A575}$ | $L_{B10}$ |
| 4416 | $L_{A576}$ | $L_{B10}$ |
| 4417 | $L_{A577}$ | $L_{B10}$ |
| 4418 | $L_{A578}$ | $L_{B10}$ |
| 4419 | $L_{A579}$ | $L_{B10}$ |
| 4420 | $L_{A580}$ | $L_{B10}$ |
| 4421 | $L_{A581}$ | $L_{B10}$ |
| 4422 | $L_{A582}$ | $L_{B10}$ |
| 4423 | $L_{A583}$ | $L_{B10}$ |
| 4424 | $L_{A584}$ | $L_{B10}$ |
| 4425 | $L_{A585}$ | $L_{B10}$ |
| 4426 | $L_{A586}$ | $L_{B10}$ |
| 4427 | $L_{A587}$ | $L_{B10}$ |
| 4428 | $L_{A588}$ | $L_{B10}$ |
| 4429 | $L_{A589}$ | $L_{B10}$ |
| 4430 | $L_{A590}$ | $L_{B10}$ |
| 4431 | $L_{A591}$ | $L_{B10}$ |
| 4432 | $L_{A592}$ | $L_{B10}$ |
| 4433 | $L_{A593}$ | $L_{B10}$ |
| 4434 | $L_{A594}$ | $L_{B10}$ |
| 4435 | $L_{A595}$ | $L_{B10}$ |
| 4436 | $L_{A596}$ | $L_{B10}$ |
| 4437 | $L_{A597}$ | $L_{B10}$ |
| 4438 | $L_{A598}$ | $L_{B10}$ |
| 4439 | $L_{A599}$ | $L_{B10}$ |
| 4440 | $L_{A600}$ | $L_{B10}$ |
| 4441 | $L_{A601}$ | $L_{B10}$ |
| 4442 | $L_{A602}$ | $L_{B10}$ |
| 4443 | $L_{A603}$ | $L_{B10}$ |
| 4444 | $L_{A604}$ | $L_{B10}$ |
| 4445 | $L_{A605}$ | $L_{B10}$ |
| 4446 | $L_{A606}$ | $L_{B10}$ |
| 4447 | $L_{A607}$ | $L_{B10}$ |
| 4448 | $L_{A608}$ | $L_{B10}$ |
| 4449 | $L_{A609}$ | $L_{B10}$ |
| 4450 | $L_{A610}$ | $L_{B10}$ |
| 4451 | $L_{A611}$ | $L_{B10}$ |
| 4452 | $L_{A612}$ | $L_{B10}$ |
| 4453 | $L_{A613}$ | $L_{B10}$ |
| 4454 | $L_{A614}$ | $L_{B10}$ |
| 4455 | $L_{A615}$ | $L_{B10}$ |
| 4456 | $L_{A616}$ | $L_{B10}$ |
| 4457 | $L_{A617}$ | $L_{B10}$ |
| 4458 | $L_{A618}$ | $L_{B10}$ |
| 4459 | $L_{A619}$ | $L_{B10}$ |
| 4460 | $L_{A620}$ | $L_{B10}$ |
| 4461 | $L_{A621}$ | $L_{B10}$ |
| 4462 | $L_{A622}$ | $L_{B10}$ |
| 4463 | $L_{A623}$ | $L_{B10}$ |
| 4464 | $L_{A624}$ | $L_{B10}$ |
| 4465 | $L_{A625}$ | $L_{B10}$ |
| 4466 | $L_{A626}$ | $L_{B10}$ |
| 4467 | $L_{A627}$ | $L_{B10}$ |
| 4468 | $L_{A628}$ | $L_{B10}$ |
| 4469 | $L_{A629}$ | $L_{B10}$ |
| 4470 | $L_{A630}$ | $L_{B10}$ |

TABLE 2-continued

| Compound Number | $L_A$ | $L_B$ |
|---|---|---|
| 4471 | $L_{A631}$ | $L_{B10}$ |
| 4472 | $L_{A632}$ | $L_{B10}$ |
| 4473 | $L_{A633}$ | $L_{B10}$ |
| 4474 | $L_{A634}$ | $L_{B10}$ |
| 4475 | $L_{A635}$ | $L_{B10}$ |
| 4476 | $L_{A636}$ | $L_{B10}$ |
| 4477 | $L_{A637}$ | $L_{B10}$ |
| 4478 | $L_{A638}$ | $L_{B10}$ |
| 4479 | $L_{A639}$ | $L_{B10}$ |
| 4480 | $L_{A640}$ | $L_{B10}$ |
| 4481 | $L_{A641}$ | $L_{B10}$ |
| 4482 | $L_{A642}$ | $L_{B10}$ |
| 4483 | $L_{A643}$ | $L_{B10}$ |
| 4484 | $L_{A644}$ | $L_{B10}$ |
| 4485 | $L_{A645}$ | $L_{B10}$ |
| 4486 | $L_{A646}$ | $L_{B10}$ |
| 4487 | $L_{A647}$ | $L_{B10}$ |
| 4488 | $L_{A648}$ | $L_{B10}$ |
| 4489 | $L_{A649}$ | $L_{B10}$ |
| 4490 | $L_{A650}$ | $L_{B10}$ |
| 4491 | $L_{A651}$ | $L_{B10}$ |
| 4492 | $L_{A652}$ | $L_{B10}$ |
| 4493 | $L_{A653}$ | $L_{B10}$ |
| 4494 | $L_{A654}$ | $L_{B10}$ |
| 4495 | $L_{A655}$ | $L_{B10}$ |
| 4496 | $L_{A656}$ | $L_{B10}$ |
| 4497 | $L_{A657}$ | $L_{B10}$ |
| 4498 | $L_{A658}$ | $L_{B10}$ |
| 4499 | $L_{A659}$ | $L_{B10}$ |
| 4500 | $L_{A660}$ | $L_{B10}$ |
| 4501 | $L_{A661}$ | $L_{B10}$ |
| 4502 | $L_{A662}$ | $L_{B10}$ |
| 4503 | $L_{A663}$ | $L_{B10}$ |
| 4504 | $L_{A664}$ | $L_{B10}$ |
| 4505 | $L_{A665}$ | $L_{B10}$ |
| 4506 | $L_{A666}$ | $L_{B10}$ |
| 4507 | $L_{A667}$ | $L_{B10}$ |
| 4508 | $L_{A668}$ | $L_{B10}$ |
| 4509 | $L_{A669}$ | $L_{B10}$ |
| 4510 | $L_{A670}$ | $L_{B10}$ |
| 4511 | $L_{A671}$ | $L_{B10}$ |
| 4512 | $L_{A672}$ | $L_{B10}$ |
| 4513 | $L_{A673}$ | $L_{B10}$ |
| 4514 | $L_{A674}$ | $L_{B10}$ |
| 4515 | $L_{A675}$ | $L_{B10}$ |
| 4516 | $L_{A676}$ | $L_{B10}$ |
| 4517 | $L_{A677}$ | $L_{B10}$ |
| 4518 | $L_{A678}$ | $L_{B10}$ |
| 4519 | $L_{A679}$ | $L_{B10}$ |
| 4520 | $L_{A680}$ | $L_{B10}$ |
| 4521 | $L_{A681}$ | $L_{B10}$ |
| 4522 | $L_{A682}$ | $L_{B10}$ |
| 4523 | $L_{A683}$ | $L_{B10}$ |
| 4524 | $L_{A684}$ | $L_{B10}$ |
| 4525 | $L_{A685}$ | $L_{B10}$ |
| 4526 | $L_{A686}$ | $L_{B10}$ |
| 4527 | $L_{A687}$ | $L_{B10}$ |
| 4528 | $L_{A688}$ | $L_{B10}$ |
| 4529 | $L_{A689}$ | $L_{B10}$ |
| 4530 | $L_{A690}$ | $L_{B10}$ |
| 4531 | $L_{A691}$ | $L_{B10}$ |
| 4532 | $L_{A692}$ | $L_{B10}$ |
| 4533 | $L_{A693}$ | $L_{B10}$ |
| 4534 | $L_{A694}$ | $L_{B10}$ |
| 4535 | $L_{A695}$ | $L_{B10}$ |
| 4536 | $L_{A696}$ | $L_{B10}$ |
| 4537 | $L_{A697}$ | $L_{B10}$ |
| 4538 | $L_{A698}$ | $L_{B10}$ |
| 4539 | $L_{A699}$ | $L_{B10}$ |
| 4540 | $L_{A700}$ | $L_{B10}$ |
| 4541 | $L_{A701}$ | $L_{B10}$ |
| 4542 | $L_{A702}$ | $L_{B10}$ |
| 4543 | $L_{A703}$ | $L_{B10}$ |
| 4544 | $L_{A704}$ | $L_{B10}$ |
| 4545 | $L_{A705}$ | $L_{B10}$ |
| 4546 | $L_{A706}$ | $L_{B10}$ |
| 4547 | $L_{A707}$ | $L_{B10}$ |
| 4548 | $L_{A708}$ | $L_{B10}$ |
| 4549 | $L_{A709}$ | $L_{B10}$ |
| 4550 | $L_{A710}$ | $L_{B10}$ |
| 4551 | $L_{A711}$ | $L_{B10}$ |
| 4552 | $L_{A712}$ | $L_{B10}$ |
| 4553 | $L_{A713}$ | $L_{B10}$ |
| 4554 | $L_{A714}$ | $L_{B10}$ |
| 4555 | $L_{A715}$ | $L_{B10}$ |
| 4556 | $L_{A716}$ | $L_{B10}$ |
| 4557 | $L_{A717}$ | $L_{B10}$ |
| 4558 | $L_{A718}$ | $L_{B10}$ |
| 4559 | $L_{A719}$ | $L_{B10}$ |
| 4560 | $L_{A720}$ | $L_{B10}$ |
| 4561 | $L_{A721}$ | $L_{B10}$ |
| 4562 | $L_{A722}$ | $L_{B10}$ |
| 4563 | $L_{A723}$ | $L_{B10}$ |
| 4564 | $L_{A724}$ | $L_{B10}$ |
| 4565 | $L_{A725}$ | $L_{B10}$ |
| 4566 | $L_{A726}$ | $L_{B10}$ |
| 4567 | $L_{A727}$ | $L_{B10}$ |
| 4568 | $L_{A728}$ | $L_{B10}$ |
| 4569 | $L_{A729}$ | $L_{B10}$ |
| 4570 | $L_{A730}$ | $L_{B10}$ |
| 4571 | $L_{A731}$ | $L_{B10}$ |
| 4572 | $L_{A732}$ | $L_{B10}$ |
| 4573 | $L_{A733}$ | $L_{B10}$ |
| 4574 | $L_{A734}$ | $L_{B10}$ |
| 4575 | $L_{A735}$ | $L_{B10}$ |
| 4576 | $L_{A736}$ | $L_{B10}$ |
| 4577 | $L_{A737}$ | $L_{B10}$ |
| 4578 | $L_{A738}$ | $L_{B10}$ |
| 4579 | $L_{A739}$ | $L_{B10}$ |
| 4580 | $L_{A740}$ | $L_{B10}$ |
| 4581 | $L_{A741}$ | $L_{B10}$ |
| 4582 | $L_{A742}$ | $L_{B10}$ |
| 4583 | $L_{A743}$ | $L_{B10}$ |
| 4584 | $L_{A744}$ | $L_{B10}$ |
| 4585 | $L_{A745}$ | $L_{B10}$ |
| 4586 | $L_{A746}$ | $L_{B10}$ |
| 4587 | $L_{A747}$ | $L_{B10}$ |
| 4588 | $L_{A748}$ | $L_{B10}$ |
| 4589 | $L_{A749}$ | $L_{B10}$ |
| 4590 | $L_{A750}$ | $L_{B10}$ |
| 4591 | $L_{A751}$ | $L_{B10}$ |
| 4592 | $L_{A752}$ | $L_{B10}$ |
| 4593 | $L_{A753}$ | $L_{B10}$ |
| 4594 | $L_{A754}$ | $L_{B10}$ |
| 4595 | $L_{A755}$ | $L_{B10}$ |
| 4596 | $L_{A756}$ | $L_{B10}$ |
| 4597 | $L_{A757}$ | $L_{B10}$ |
| 4598 | $L_{A758}$ | $L_{B10}$ |
| 4599 | $L_{A759}$ | $L_{B10}$ |
| 4600 | $L_{A760}$ | $L_{B10}$ |
| 4601 | $L_{A761}$ | $L_{B10}$ |
| 4602 | $L_{A762}$ | $L_{B10}$ |
| 4603 | $L_{A763}$ | $L_{B10}$ |
| 4604 | $L_{A764}$ | $L_{B10}$ |
| 4605 | $L_{A765}$ | $L_{B10}$ |
| 4606 | $L_{A766}$ | $L_{B10}$ |
| 4607 | $L_{A767}$ | $L_{B10}$ |
| 4608 | $L_{A768}$ | $L_{B10}$ |
| 4609 | $L_{A769}$ | $L_{B10}$ |
| 4610 | $L_{A770}$ | $L_{B10}$ |
| 4611 | $L_{A771}$ | $L_{B10}$ |
| 4612 | $L_{A772}$ | $L_{B10}$ |
| 4613 | $L_{A773}$ | $L_{B10}$ |
| 4614 | $L_{A774}$ | $L_{B10}$ |
| 4615 | $L_{A775}$ | $L_{B10}$ |
| 4616 | $L_{A776}$ | $L_{B10}$ |
| 4617 | $L_{A777}$ | $L_{B10}$ |
| 4618 | $L_{A778}$ | $L_{B10}$ |
| 4619 | $L_{A779}$ | $L_{B10}$ |
| 4620 | $L_{A780}$ | $L_{B10}$ |
| 4621 | $L_{A781}$ | $L_{B10}$ |
| 4622 | $L_{A782}$ | $L_{B10}$ |
| 4623 | $L_{A783}$ | $L_{B10}$ |
| 4624 | $L_{A784}$ | $L_{B10}$ |

TABLE 2-continued

| Compound Number | $L_A$ | $L_B$ |
|---|---|---|
| 4625 | $L_{A785}$ | $L_{B10}$ |
| 4626 | $L_{A786}$ | $L_{B10}$ |
| 4627 | $L_{A787}$ | $L_{B10}$ |
| 4628 | $L_{A788}$ | $L_{B10}$ |
| 4629 | $L_{A789}$ | $L_{B10}$ |
| 4630 | $L_{A790}$ | $L_{B10}$ |
| 4631 | $L_{A791}$ | $L_{B10}$ |
| 4632 | $L_{A792}$ | $L_{B10}$ |
| 4633 | $L_{A793}$ | $L_{B10}$ |
| 4634 | $L_{A794}$ | $L_{B10}$ |
| 4635 | $L_{A795}$ | $L_{B10}$ |
| 4636 | $L_{A796}$ | $L_{B10}$ |
| 4637 | $L_{A797}$ | $L_{B10}$ |
| 4638 | $L_{A798}$ | $L_{B10}$ |
| 4639 | $L_{A799}$ | $L_{B10}$ |
| 4640 | $L_{A800}$ | $L_{B10}$ |
| 4641 | $L_{A801}$ | $L_{B10}$ |
| 4642 | $L_{A802}$ | $L_{B10}$ |
| 4643 | $L_{A803}$ | $L_{B10}$ |
| 4644 | $L_{A804}$ | $L_{B10}$ |
| 4645 | $L_{A805}$ | $L_{B10}$ |
| 4646 | $L_{A806}$ | $L_{B10}$ |
| 4647 | $L_{A807}$ | $L_{B10}$ |
| 4648 | $L_{A808}$ | $L_{B10}$ |
| 4649 | $L_{A809}$ | $L_{B10}$ |
| 4650 | $L_{A810}$ | $L_{B10}$ |
| 4651 | $L_{A811}$ | $L_{B10}$ |
| 4652 | $L_{A812}$ | $L_{B10}$ |
| 4653 | $L_{A813}$ | $L_{B10}$ |
| 4654 | $L_{A814}$ | $L_{B10}$ |
| 4655 | $L_{A815}$ | $L_{B10}$ |
| 4656 | $L_{A816}$ | $L_{B10}$ |
| 4657 | $L_{A817}$ | $L_{B10}$ |
| 4658 | $L_{A818}$ | $L_{B10}$ |
| 4659 | $L_{A819}$ | $L_{B10}$ |
| 4660 | $L_{A820}$ | $L_{B10}$ |
| 4661 | $L_{A821}$ | $L_{B10}$ |
| 4662 | $L_{A822}$ | $L_{B10}$ |
| 4663 | $L_{A823}$ | $L_{B10}$ |
| 4664 | $L_{A824}$ | $L_{B10}$ |
| 4665 | $L_{A825}$ | $L_{B10}$ |
| 4666 | $L_{A826}$ | $L_{B10}$ |
| 4667 | $L_{A827}$ | $L_{B10}$ |
| 4668 | $L_{A828}$ | $L_{B10}$ |
| 4669 | $L_{A829}$ | $L_{B10}$ |
| 4670 | $L_{A830}$ | $L_{B10}$ |
| 4671 | $L_{A831}$ | $L_{B10}$ |
| 4672 | $L_{A832}$ | $L_{B10}$ |
| 4673 | $L_{A833}$ | $L_{B10}$ |
| 4674 | $L_{A834}$ | $L_{B10}$ |
| 4675 | $L_{A835}$ | $L_{B10}$ |
| 4676 | $L_{A836}$ | $L_{B10}$ |
| 4677 | $L_{A837}$ | $L_{B10}$ |
| 4678 | $L_{A838}$ | $L_{B10}$ |
| 4679 | $L_{A839}$ | $L_{B10}$ |
| 4680 | $L_{A840}$ | $L_{B10}$ |
| 4681 | $L_{A841}$ | $L_{B10}$ |
| 4682 | $L_{A842}$ | $L_{B10}$ |
| 4683 | $L_{A843}$ | $L_{B10}$ |
| 4684 | $L_{A844}$ | $L_{B10}$ |
| 4685 | $L_{A845}$ | $L_{B10}$ |
| 4686 | $L_{A846}$ | $L_{B10}$ |
| 4687 | $L_{A847}$ | $L_{B10}$ |
| 4688 | $L_{A848}$ | $L_{B10}$ |
| 4689 | $L_{A849}$ | $L_{B10}$ |
| 4690 | $L_{A850}$ | $L_{B10}$ |
| 4691 | $L_{A851}$ | $L_{B10}$ |
| 4692 | $L_{A852}$ | $L_{B10}$ |
| 4693 | $L_{A853}$ | $L_{B10}$ |
| 4694 | $L_{A854}$ | $L_{B10}$ |
| 4695 | $L_{A855}$ | $L_{B10}$ |
| 4696 | $L_{A856}$ | $L_{B10}$ |
| 4697 | $L_{A857}$ | $L_{B10}$ |
| 4698 | $L_{A858}$ | $L_{B10}$ |
| 4699 | $L_{A859}$ | $L_{B10}$ |
| 4700 | $L_{A860}$ | $L_{B10}$ |
| 4701 | $L_{A861}$ | $L_{B10}$ |

TABLE 2-continued

| Compound Number | $L_A$ | $L_B$ |
|---|---|---|
| 4702 | $L_{A862}$ | $L_{B10}$ |
| 4703 | $L_{A863}$ | $L_{B10}$ |
| 4704 | $L_{A864}$ | $L_{B10}$ |
| 4705 | $L_{A865}$ | $L_{B10}$ |
| 4706 | $L_{A866}$ | $L_{B10}$ |
| 4707 | $L_{A867}$ | $L_{B10}$ |
| 4708 | $L_{A868}$ | $L_{B10}$ |
| 4709 | $L_{A869}$ | $L_{B10}$ |
| 4710 | $L_{A870}$ | $L_{B10}$ |
| 4711 | $L_{A871}$ | $L_{B10}$ |
| 4712 | $L_{A872}$ | $L_{B10}$ |
| 4713 | $L_{A873}$ | $L_{B10}$ |
| 4714 | $L_{A874}$ | $L_{B10}$ |
| 4715 | $L_{A875}$ | $L_{B10}$ |
| 4716 | $L_{A876}$ | $L_{B10}$ |
| 4717 | $L_{A877}$ | $L_{B10}$ |
| 4718 | $L_{A878}$ | $L_{B10}$ |
| 4719 | $L_{A879}$ | $L_{B10}$ |
| 4720 | $L_{A880}$ | $L_{B10}$ |
| 4721 | $L_{A881}$ | $L_{B10}$ |
| 4722 | $L_{A882}$ | $L_{B10}$ |
| 4723 | $L_{A883}$ | $L_{B10}$ |
| 4724 | $L_{A884}$ | $L_{B10}$ |
| 4725 | $L_{A885}$ | $L_{B10}$ |
| 4726 | $L_{A886}$ | $L_{B10}$ |
| 4727 | $L_{A887}$ | $L_{B10}$ |
| 4728 | $L_{A888}$ | $L_{B10}$ |
| 4729 | $L_{A889}$ | $L_{B10}$ |
| 4730 | $L_{A890}$ | $L_{B10}$ |
| 4731 | $L_{A891}$ | $L_{B10}$ |
| 4732 | $L_{A892}$ | $L_{B10}$ |
| 4733 | $L_{A893}$ | $L_{B10}$ |
| 4734 | $L_{A894}$ | $L_{B10}$ |
| 4735 | $L_{A895}$ | $L_{B10}$ |
| 4736 | $L_{A896}$ | $L_{B10}$ |
| 4737 | $L_{A897}$ | $L_{B10}$ |
| 4738 | $L_{A898}$ | $L_{B10}$ |
| 4739 | $L_{A899}$ | $L_{B10}$ |
| 4740 | $L_{A900}$ | $L_{B10}$ |
| 4741 | $L_{A901}$ | $L_{B10}$ |
| 4742 | $L_{A902}$ | $L_{B10}$ |
| 4743 | $L_{A903}$ | $L_{B10}$ |
| 4744 | $L_{A904}$ | $L_{B10}$ |
| 4745 | $L_{A905}$ | $L_{B10}$ |
| 4746 | $L_{A906}$ | $L_{B10}$ |
| 4747 | $L_{A907}$ | $L_{B10}$ |
| 4748 | $L_{A908}$ | $L_{B10}$ |
| 4749 | $L_{A909}$ | $L_{B10}$ |
| 4750 | $L_{A910}$ | $L_{B10}$ |
| 4751 | $L_{A911}$ | $L_{B10}$ |
| 4752 | $L_{A912}$ | $L_{B10}$ |
| 4753 | $L_{A913}$ | $L_{B10}$ |
| 4754 | $L_{A914}$ | $L_{B10}$ |
| 4755 | $L_{A915}$ | $L_{B10}$ |
| 4756 | $L_{A916}$ | $L_{B10}$ |
| 4757 | $L_{A917}$ | $L_{B10}$ |
| 4758 | $L_{A918}$ | $L_{B10}$ |
| 4759 | $L_{A919}$ | $L_{B10}$ |
| 4760 | $L_{A920}$ | $L_{B10}$ |
| 4761 | $L_{A921}$ | $L_{B10}$ |
| 4762 | $L_{A922}$ | $L_{B10}$ |
| 4763 | $L_{A923}$ | $L_{B10}$ |
| 4764 | $L_{A924}$ | $L_{B10}$ |
| 4765 | $L_{A925}$ | $L_{B10}$ |
| 4766 | $L_{A926}$ | $L_{B10}$ |
| 4767 | $L_{A927}$ | $L_{B10}$ |
| 4768 | $L_{A928}$ | $L_{B10}$ |
| 4769 | $L_{A929}$ | $L_{B10}$ |
| 4770 | $L_{A930}$ | $L_{B10}$ |
| 4771 | $L_{A931}$ | $L_{B10}$ |
| 4772 | $L_{A932}$ | $L_{B10}$ |
| 4773 | $L_{A933}$ | $L_{B10}$ |
| 4774 | $L_{A934}$ | $L_{B10}$ |
| 4775 | $L_{A935}$ | $L_{B10}$ |
| 4776 | $L_{A936}$ | $L_{B10}$ |
| 4777 | $L_{A937}$ | $L_{B10}$ |
| 4778 | $L_{A938}$ | $L_{B10}$ |

TABLE 2-continued

| Compound Number | $L_A$ | $L_B$ |
|---|---|---|
| 4779 | $L_{A939}$ | $L_{B10}$ |
| 4780 | $L_{A940}$ | $L_{B10}$ |
| 4781 | $L_{A941}$ | $L_{B10}$ |
| 4782 | $L_{A942}$ | $L_{B10}$ |
| 4783 | $L_{A943}$ | $L_{B10}$ |
| 4784 | $L_{A944}$ | $L_{B10}$ |
| 4785 | $L_{A945}$ | $L_{B10}$ |
| 4786 | $L_{A946}$ | $L_{B10}$ |
| 4787 | $L_{A947}$ | $L_{B10}$ |
| 4788 | $L_{A948}$ | $L_{B10}$ |
| 4789 | $L_{A949}$ | $L_{B10}$ |
| 4790 | $L_{A950}$ | $L_{B10}$ |
| 4791 | $L_{A951}$ | $L_{B10}$ |
| 4792 | $L_{A952}$ | $L_{B10}$ |
| 4793 | $L_{A953}$ | $L_{B10}$ |
| 4794 | $L_{A954}$ | $L_{B10}$ |
| 4795 | $L_{A955}$ | $L_{B10}$ |
| 4796 | $L_{A956}$ | $L_{B10}$ |
| 4797 | $L_{A957}$ | $L_{B10}$ |
| 4798 | $L_{A958}$ | $L_{B10}$ |
| 4799 | $L_{A959}$ | $L_{B10}$ |
| 4800 | $L_{A960}$ | $L_{B10}$ |
| 4801 | $L_{A1}$ | $L_{B12}$ |
| 4802 | $L_{A2}$ | $L_{B12}$ |
| 4803 | $L_{A3}$ | $L_{B12}$ |
| 4804 | $L_{A4}$ | $L_{B12}$ |
| 4805 | $L_{A5}$ | $L_{B12}$ |
| 4806 | $L_{A6}$ | $L_{B12}$ |
| 4807 | $L_{A7}$ | $L_{B12}$ |
| 4808 | $L_{A8}$ | $L_{B12}$ |
| 4809 | $L_{A9}$ | $L_{B12}$ |
| 4810 | $L_{A10}$ | $L_{B12}$ |
| 4811 | $L_{A11}$ | $L_{B12}$ |
| 4812 | $L_{A12}$ | $L_{B12}$ |
| 4813 | $L_{A13}$ | $L_{B12}$ |
| 4814 | $L_{A14}$ | $L_{B12}$ |
| 4815 | $L_{A15}$ | $L_{B12}$ |
| 4816 | $L_{A16}$ | $L_{B12}$ |
| 4817 | $L_{A17}$ | $L_{B12}$ |
| 4818 | $L_{A18}$ | $L_{B12}$ |
| 4819 | $L_{A19}$ | $L_{B12}$ |
| 4820 | $L_{A20}$ | $L_{B12}$ |
| 4821 | $L_{A21}$ | $L_{B12}$ |
| 4822 | $L_{A22}$ | $L_{B12}$ |
| 4823 | $L_{A23}$ | $L_{B12}$ |
| 4824 | $L_{A24}$ | $L_{B12}$ |
| 4825 | $L_{A25}$ | $L_{B12}$ |
| 4826 | $L_{A26}$ | $L_{B12}$ |
| 4827 | $L_{A27}$ | $L_{B12}$ |
| 4828 | $L_{A28}$ | $L_{B12}$ |
| 4829 | $L_{A29}$ | $L_{B12}$ |
| 4830 | $L_{A30}$ | $L_{B12}$ |
| 4831 | $L_{A31}$ | $L_{B12}$ |
| 4832 | $L_{A32}$ | $L_{B12}$ |
| 4833 | $L_{A33}$ | $L_{B12}$ |
| 4834 | $L_{A34}$ | $L_{B12}$ |
| 4835 | $L_{A35}$ | $L_{B12}$ |
| 4836 | $L_{A36}$ | $L_{B12}$ |
| 4837 | $L_{A37}$ | $L_{B12}$ |
| 4838 | $L_{A38}$ | $L_{B12}$ |
| 4839 | $L_{A39}$ | $L_{B12}$ |
| 4840 | $L_{A40}$ | $L_{B12}$ |
| 4841 | $L_{A41}$ | $L_{B12}$ |
| 4842 | $L_{A42}$ | $L_{B12}$ |
| 4843 | $L_{A43}$ | $L_{B12}$ |
| 4844 | $L_{A44}$ | $L_{B12}$ |
| 4845 | $L_{A45}$ | $L_{B12}$ |
| 4846 | $L_{A46}$ | $L_{B12}$ |
| 4847 | $L_{A47}$ | $L_{B12}$ |
| 4848 | $L_{A48}$ | $L_{B12}$ |
| 4849 | $L_{A49}$ | $L_{B12}$ |
| 4850 | $L_{A50}$ | $L_{B12}$ |
| 4851 | $L_{A51}$ | $L_{B12}$ |
| 4852 | $L_{A52}$ | $L_{B12}$ |
| 4853 | $L_{A53}$ | $L_{B12}$ |
| 4854 | $L_{A54}$ | $L_{B12}$ |
| 4855 | $L_{A55}$ | $L_{B12}$ |
| 4856 | $L_{A56}$ | $L_{B12}$ |
| 4857 | $L_{A57}$ | $L_{B12}$ |
| 4858 | $L_{A58}$ | $L_{B12}$ |
| 4859 | $L_{A59}$ | $L_{B12}$ |
| 4860 | $L_{A60}$ | $L_{B12}$ |
| 4861 | $L_{A61}$ | $L_{B12}$ |
| 4862 | $L_{A62}$ | $L_{B12}$ |
| 4863 | $L_{A63}$ | $L_{B12}$ |
| 4864 | $L_{A64}$ | $L_{B12}$ |
| 4865 | $L_{A65}$ | $L_{B12}$ |
| 4866 | $L_{A66}$ | $L_{B12}$ |
| 4867 | $L_{A67}$ | $L_{B12}$ |
| 4868 | $L_{A68}$ | $L_{B12}$ |
| 4869 | $L_{A69}$ | $L_{B12}$ |
| 4870 | $L_{A70}$ | $L_{B12}$ |
| 4871 | $L_{A71}$ | $L_{B12}$ |
| 4872 | $L_{A72}$ | $L_{B12}$ |
| 4873 | $L_{A73}$ | $L_{B12}$ |
| 4874 | $L_{A74}$ | $L_{B12}$ |
| 4875 | $L_{A75}$ | $L_{B12}$ |
| 4876 | $L_{A76}$ | $L_{B12}$ |
| 4877 | $L_{A77}$ | $L_{B12}$ |
| 4878 | $L_{A78}$ | $L_{B12}$ |
| 4879 | $L_{A79}$ | $L_{B12}$ |
| 4880 | $L_{A80}$ | $L_{B12}$ |
| 4881 | $L_{A81}$ | $L_{B12}$ |
| 4882 | $L_{A82}$ | $L_{B12}$ |
| 4883 | $L_{A83}$ | $L_{B12}$ |
| 4884 | $L_{A84}$ | $L_{B12}$ |
| 4885 | $L_{A85}$ | $L_{B12}$ |
| 4886 | $L_{A86}$ | $L_{B12}$ |
| 4887 | $L_{A87}$ | $L_{B12}$ |
| 4888 | $L_{A88}$ | $L_{B12}$ |
| 4889 | $L_{A89}$ | $L_{B12}$ |
| 4890 | $L_{A90}$ | $L_{B12}$ |
| 4891 | $L_{A91}$ | $L_{B12}$ |
| 4892 | $L_{A92}$ | $L_{B12}$ |
| 4893 | $L_{A93}$ | $L_{B12}$ |
| 4894 | $L_{A94}$ | $L_{B12}$ |
| 4895 | $L_{A95}$ | $L_{B12}$ |
| 4896 | $L_{A96}$ | $L_{B12}$ |
| 4897 | $L_{A97}$ | $L_{B12}$ |
| 4898 | $L_{A98}$ | $L_{B12}$ |
| 4899 | $L_{A99}$ | $L_{B12}$ |
| 4900 | $L_{A100}$ | $L_{B12}$ |
| 4901 | $L_{A101}$ | $L_{B12}$ |
| 4902 | $L_{A102}$ | $L_{B12}$ |
| 4903 | $L_{A103}$ | $L_{B12}$ |
| 4904 | $L_{A104}$ | $L_{B12}$ |
| 4905 | $L_{A105}$ | $L_{B12}$ |
| 4906 | $L_{A106}$ | $L_{B12}$ |
| 4907 | $L_{A107}$ | $L_{B12}$ |
| 4908 | $L_{A108}$ | $L_{B12}$ |
| 4909 | $L_{A109}$ | $L_{B12}$ |
| 4910 | $L_{A110}$ | $L_{B12}$ |
| 4911 | $L_{A111}$ | $L_{B12}$ |
| 4912 | $L_{A112}$ | $L_{B12}$ |
| 4913 | $L_{A113}$ | $L_{B12}$ |
| 4914 | $L_{A114}$ | $L_{B12}$ |
| 4915 | $L_{A115}$ | $L_{B12}$ |
| 4916 | $L_{A116}$ | $L_{B12}$ |
| 4917 | $L_{A117}$ | $L_{B12}$ |
| 4918 | $L_{A118}$ | $L_{B12}$ |
| 4919 | $L_{A119}$ | $L_{B12}$ |
| 4920 | $L_{A120}$ | $L_{B12}$ |
| 4921 | $L_{A121}$ | $L_{B12}$ |
| 4922 | $L_{A122}$ | $L_{B12}$ |
| 4923 | $L_{A123}$ | $L_{B12}$ |
| 4924 | $L_{A124}$ | $L_{B12}$ |
| 4925 | $L_{A125}$ | $L_{B12}$ |
| 4926 | $L_{A126}$ | $L_{B12}$ |
| 4927 | $L_{A127}$ | $L_{B12}$ |
| 4928 | $L_{A128}$ | $L_{B12}$ |
| 4929 | $L_{A129}$ | $L_{B12}$ |
| 4930 | $L_{A130}$ | $L_{B12}$ |
| 4931 | $L_{A131}$ | $L_{B12}$ |
| 4932 | $L_{A132}$ | $L_{B12}$ |

TABLE 2-continued

| Compound Number | $L_A$ | $L_B$ |
|---|---|---|
| 4933 | $L_{A133}$ | $L_{B12}$ |
| 4934 | $L_{A134}$ | $L_{B12}$ |
| 4935 | $L_{A135}$ | $L_{B12}$ |
| 4936 | $L_{A136}$ | $L_{B12}$ |
| 4937 | $L_{A137}$ | $L_{B12}$ |
| 4938 | $L_{A138}$ | $L_{B12}$ |
| 4939 | $L_{A139}$ | $L_{B12}$ |
| 4940 | $L_{A140}$ | $L_{B12}$ |
| 4941 | $L_{A141}$ | $L_{B12}$ |
| 4942 | $L_{A142}$ | $L_{B12}$ |
| 4943 | $L_{A143}$ | $L_{B12}$ |
| 4944 | $L_{A144}$ | $L_{B12}$ |
| 4945 | $L_{A145}$ | $L_{B12}$ |
| 4946 | $L_{A146}$ | $L_{B12}$ |
| 4947 | $L_{A147}$ | $L_{B12}$ |
| 4948 | $L_{A148}$ | $L_{B12}$ |
| 4949 | $L_{A149}$ | $L_{B12}$ |
| 4950 | $L_{A150}$ | $L_{B12}$ |
| 4951 | $L_{A151}$ | $L_{B12}$ |
| 4952 | $L_{A152}$ | $L_{B12}$ |
| 4953 | $L_{A153}$ | $L_{B12}$ |
| 4954 | $L_{A154}$ | $L_{B12}$ |
| 4955 | $L_{A155}$ | $L_{B12}$ |
| 4956 | $L_{A156}$ | $L_{B12}$ |
| 4957 | $L_{A157}$ | $L_{B12}$ |
| 4958 | $L_{A158}$ | $L_{B12}$ |
| 4959 | $L_{A159}$ | $L_{B12}$ |
| 4960 | $L_{A160}$ | $L_{B12}$ |
| 4961 | $L_{A161}$ | $L_{B12}$ |
| 4962 | $L_{A162}$ | $L_{B12}$ |
| 4963 | $L_{A163}$ | $L_{B12}$ |
| 4964 | $L_{A164}$ | $L_{B12}$ |
| 4965 | $L_{A165}$ | $L_{B12}$ |
| 4966 | $L_{A166}$ | $L_{B12}$ |
| 4967 | $L_{A167}$ | $L_{B12}$ |
| 4968 | $L_{A168}$ | $L_{B12}$ |
| 4969 | $L_{A169}$ | $L_{B12}$ |
| 4970 | $L_{A170}$ | $L_{B12}$ |
| 4971 | $L_{A171}$ | $L_{B12}$ |
| 4972 | $L_{A172}$ | $L_{B12}$ |
| 4973 | $L_{A173}$ | $L_{B12}$ |
| 4974 | $L_{A174}$ | $L_{B12}$ |
| 4975 | $L_{A175}$ | $L_{B12}$ |
| 4976 | $L_{A176}$ | $L_{B12}$ |
| 4977 | $L_{A177}$ | $L_{B12}$ |
| 4978 | $L_{A178}$ | $L_{B12}$ |
| 4979 | $L_{A179}$ | $L_{B12}$ |
| 4980 | $L_{A180}$ | $L_{B12}$ |
| 4981 | $L_{A181}$ | $L_{B12}$ |
| 4982 | $L_{A182}$ | $L_{B12}$ |
| 4983 | $L_{A183}$ | $L_{B12}$ |
| 4984 | $L_{A184}$ | $L_{B12}$ |
| 4985 | $L_{A185}$ | $L_{B12}$ |
| 4986 | $L_{A186}$ | $L_{B12}$ |
| 4987 | $L_{A187}$ | $L_{B12}$ |
| 4988 | $L_{A188}$ | $L_{B12}$ |
| 4989 | $L_{A189}$ | $L_{B12}$ |
| 4990 | $L_{A190}$ | $L_{B12}$ |
| 4991 | $L_{A191}$ | $L_{B12}$ |
| 4992 | $L_{A192}$ | $L_{B12}$ |
| 4993 | $L_{A193}$ | $L_{B12}$ |
| 4994 | $L_{A194}$ | $L_{B12}$ |
| 4995 | $L_{A195}$ | $L_{B12}$ |
| 4996 | $L_{A196}$ | $L_{B12}$ |
| 4997 | $L_{A197}$ | $L_{B12}$ |
| 4998 | $L_{A198}$ | $L_{B12}$ |
| 4999 | $L_{A199}$ | $L_{B12}$ |
| 5000 | $L_{A200}$ | $L_{B12}$ |
| 5001 | $L_{A201}$ | $L_{B12}$ |
| 5002 | $L_{A202}$ | $L_{B12}$ |
| 5003 | $L_{A203}$ | $L_{B12}$ |
| 5004 | $L_{A204}$ | $L_{B12}$ |
| 5005 | $L_{A205}$ | $L_{B12}$ |
| 5006 | $L_{A206}$ | $L_{B12}$ |
| 5007 | $L_{A207}$ | $L_{B12}$ |
| 5008 | $L_{A208}$ | $L_{B12}$ |
| 5009 | $L_{A209}$ | $L_{B12}$ |

TABLE 2-continued

| Compound Number | $L_A$ | $L_B$ |
|---|---|---|
| 5010 | $L_{A210}$ | $L_{B12}$ |
| 5011 | $L_{A211}$ | $L_{B12}$ |
| 5012 | $L_{A212}$ | $L_{B12}$ |
| 5013 | $L_{A213}$ | $L_{B12}$ |
| 5014 | $L_{A214}$ | $L_{B12}$ |
| 5015 | $L_{A215}$ | $L_{B12}$ |
| 5016 | $L_{A216}$ | $L_{B12}$ |
| 5017 | $L_{A217}$ | $L_{B12}$ |
| 5018 | $L_{A218}$ | $L_{B12}$ |
| 5019 | $L_{A219}$ | $L_{B12}$ |
| 5020 | $L_{A220}$ | $L_{B12}$ |
| 5021 | $L_{A221}$ | $L_{B12}$ |
| 5022 | $L_{A222}$ | $L_{B12}$ |
| 5023 | $L_{A223}$ | $L_{B12}$ |
| 5024 | $L_{A224}$ | $L_{B12}$ |
| 5025 | $L_{A225}$ | $L_{B12}$ |
| 5026 | $L_{A226}$ | $L_{B12}$ |
| 5027 | $L_{A227}$ | $L_{B12}$ |
| 5028 | $L_{A228}$ | $L_{B12}$ |
| 5029 | $L_{A229}$ | $L_{B12}$ |
| 5030 | $L_{A230}$ | $L_{B12}$ |
| 5031 | $L_{A231}$ | $L_{B12}$ |
| 5032 | $L_{A232}$ | $L_{B12}$ |
| 5033 | $L_{A233}$ | $L_{B12}$ |
| 5034 | $L_{A234}$ | $L_{B12}$ |
| 5035 | $L_{A235}$ | $L_{B12}$ |
| 5036 | $L_{A236}$ | $L_{B12}$ |
| 5037 | $L_{A237}$ | $L_{B12}$ |
| 5038 | $L_{A238}$ | $L_{B12}$ |
| 5039 | $L_{A239}$ | $L_{B12}$ |
| 5040 | $L_{A240}$ | $L_{B12}$ |
| 5041 | $L_{A241}$ | $L_{B12}$ |
| 5042 | $L_{A242}$ | $L_{B12}$ |
| 5043 | $L_{A243}$ | $L_{B12}$ |
| 5044 | $L_{A244}$ | $L_{B12}$ |
| 5045 | $L_{A245}$ | $L_{B12}$ |
| 5046 | $L_{A246}$ | $L_{B12}$ |
| 5047 | $L_{A247}$ | $L_{B12}$ |
| 5048 | $L_{A248}$ | $L_{B12}$ |
| 5049 | $L_{A249}$ | $L_{B12}$ |
| 5050 | $L_{A250}$ | $L_{B12}$ |
| 5051 | $L_{A251}$ | $L_{B12}$ |
| 5052 | $L_{A252}$ | $L_{B12}$ |
| 5053 | $L_{A253}$ | $L_{B12}$ |
| 5054 | $L_{A254}$ | $L_{B12}$ |
| 5055 | $L_{A255}$ | $L_{B12}$ |
| 5056 | $L_{A256}$ | $L_{B12}$ |
| 5057 | $L_{A257}$ | $L_{B12}$ |
| 5058 | $L_{A258}$ | $L_{B12}$ |
| 5059 | $L_{A259}$ | $L_{B12}$ |
| 5060 | $L_{A260}$ | $L_{B12}$ |
| 5061 | $L_{A261}$ | $L_{B12}$ |
| 5062 | $L_{A262}$ | $L_{B12}$ |
| 5063 | $L_{A263}$ | $L_{B12}$ |
| 5064 | $L_{A264}$ | $L_{B12}$ |
| 5065 | $L_{A265}$ | $L_{B12}$ |
| 5066 | $L_{A266}$ | $L_{B12}$ |
| 5067 | $L_{A267}$ | $L_{B12}$ |
| 5068 | $L_{A268}$ | $L_{B12}$ |
| 5069 | $L_{A269}$ | $L_{B12}$ |
| 5070 | $L_{A270}$ | $L_{B12}$ |
| 5071 | $L_{A271}$ | $L_{B12}$ |
| 5072 | $L_{A272}$ | $L_{B12}$ |
| 5073 | $L_{A273}$ | $L_{B12}$ |
| 5074 | $L_{A274}$ | $L_{B12}$ |
| 5075 | $L_{A275}$ | $L_{B12}$ |
| 5076 | $L_{A276}$ | $L_{B12}$ |
| 5077 | $L_{A277}$ | $L_{B12}$ |
| 5078 | $L_{A278}$ | $L_{B12}$ |
| 5079 | $L_{A279}$ | $L_{B12}$ |
| 5080 | $L_{A280}$ | $L_{B12}$ |
| 5081 | $L_{A281}$ | $L_{B12}$ |
| 5082 | $L_{A282}$ | $L_{B12}$ |
| 5083 | $L_{A283}$ | $L_{B12}$ |
| 5084 | $L_{A284}$ | $L_{B12}$ |
| 5085 | $L_{A285}$ | $L_{B12}$ |
| 5086 | $L_{A286}$ | $L_{B12}$ |

TABLE 2-continued

| Compound Number | $L_A$ | $L_B$ |
|---|---|---|
| 5087 | $L_{A287}$ | $L_{B12}$ |
| 5088 | $L_{A288}$ | $L_{B12}$ |
| 5089 | $L_{A289}$ | $L_{B12}$ |
| 5090 | $L_{A290}$ | $L_{B12}$ |
| 5091 | $L_{A291}$ | $L_{B12}$ |
| 5092 | $L_{A292}$ | $L_{B12}$ |
| 5093 | $L_{A293}$ | $L_{B12}$ |
| 5094 | $L_{A294}$ | $L_{B12}$ |
| 5095 | $L_{A295}$ | $L_{B12}$ |
| 5096 | $L_{A296}$ | $L_{B12}$ |
| 5097 | $L_{A297}$ | $L_{B12}$ |
| 5098 | $L_{A298}$ | $L_{B12}$ |
| 5099 | $L_{A299}$ | $L_{B12}$ |
| 5100 | $L_{A300}$ | $L_{B12}$ |
| 5101 | $L_{A301}$ | $L_{B12}$ |
| 5102 | $L_{A302}$ | $L_{B12}$ |
| 5103 | $L_{A303}$ | $L_{B12}$ |
| 5104 | $L_{A304}$ | $L_{B12}$ |
| 5105 | $L_{A305}$ | $L_{B12}$ |
| 5106 | $L_{A306}$ | $L_{B12}$ |
| 5107 | $L_{A307}$ | $L_{B12}$ |
| 5108 | $L_{A308}$ | $L_{B12}$ |
| 5109 | $L_{A309}$ | $L_{B12}$ |
| 5110 | $L_{A310}$ | $L_{B12}$ |
| 5111 | $L_{A311}$ | $L_{B12}$ |
| 5112 | $L_{A312}$ | $L_{B12}$ |
| 5113 | $L_{A313}$ | $L_{B12}$ |
| 5114 | $L_{A314}$ | $L_{B12}$ |
| 5115 | $L_{A315}$ | $L_{B12}$ |
| 5116 | $L_{A316}$ | $L_{B12}$ |
| 5117 | $L_{A317}$ | $L_{B12}$ |
| 5118 | $L_{A318}$ | $L_{B12}$ |
| 5119 | $L_{A319}$ | $L_{B12}$ |
| 5120 | $L_{A320}$ | $L_{B12}$ |
| 5121 | $L_{A321}$ | $L_{B12}$ |
| 5122 | $L_{A322}$ | $L_{B12}$ |
| 5123 | $L_{A323}$ | $L_{B12}$ |
| 5124 | $L_{A324}$ | $L_{B12}$ |
| 5125 | $L_{A325}$ | $L_{B12}$ |
| 5126 | $L_{A326}$ | $L_{B12}$ |
| 5127 | $L_{A327}$ | $L_{B12}$ |
| 5128 | $L_{A328}$ | $L_{B12}$ |
| 5129 | $L_{A329}$ | $L_{B12}$ |
| 5130 | $L_{A330}$ | $L_{B12}$ |
| 5131 | $L_{A331}$ | $L_{B12}$ |
| 5132 | $L_{A332}$ | $L_{B12}$ |
| 5133 | $L_{A333}$ | $L_{B12}$ |
| 5134 | $L_{A334}$ | $L_{B12}$ |
| 5135 | $L_{A335}$ | $L_{B12}$ |
| 5136 | $L_{A336}$ | $L_{B12}$ |
| 5137 | $L_{A337}$ | $L_{B12}$ |
| 5138 | $L_{A338}$ | $L_{B12}$ |
| 5139 | $L_{A339}$ | $L_{B12}$ |
| 5140 | $L_{A340}$ | $L_{B12}$ |
| 5141 | $L_{A341}$ | $L_{B12}$ |
| 5142 | $L_{A342}$ | $L_{B12}$ |
| 5143 | $L_{A343}$ | $L_{B12}$ |
| 5144 | $L_{A344}$ | $L_{B12}$ |
| 5145 | $L_{A345}$ | $L_{B12}$ |
| 5146 | $L_{A346}$ | $L_{B12}$ |
| 5147 | $L_{A347}$ | $L_{B12}$ |
| 5148 | $L_{A348}$ | $L_{B12}$ |
| 5149 | $L_{A349}$ | $L_{B12}$ |
| 5150 | $L_{A350}$ | $L_{B12}$ |
| 5151 | $L_{A351}$ | $L_{B12}$ |
| 5152 | $L_{A352}$ | $L_{B12}$ |
| 5153 | $L_{A353}$ | $L_{B12}$ |
| 5154 | $L_{A354}$ | $L_{B12}$ |
| 5155 | $L_{A355}$ | $L_{B12}$ |
| 5156 | $L_{A356}$ | $L_{B12}$ |
| 5157 | $L_{A357}$ | $L_{B12}$ |
| 5158 | $L_{A358}$ | $L_{B12}$ |
| 5159 | $L_{A359}$ | $L_{B12}$ |
| 5160 | $L_{A360}$ | $L_{B12}$ |
| 5161 | $L_{A361}$ | $L_{B12}$ |
| 5162 | $L_{A362}$ | $L_{B12}$ |
| 5163 | $L_{A363}$ | $L_{B12}$ |

TABLE 2-continued

| Compound Number | $L_A$ | $L_B$ |
|---|---|---|
| 5164 | $L_{A364}$ | $L_{B12}$ |
| 5165 | $L_{A365}$ | $L_{B12}$ |
| 5166 | $L_{A366}$ | $L_{B12}$ |
| 5167 | $L_{A367}$ | $L_{B12}$ |
| 5168 | $L_{A368}$ | $L_{B12}$ |
| 5169 | $L_{A369}$ | $L_{B12}$ |
| 5170 | $L_{A370}$ | $L_{B12}$ |
| 5171 | $L_{A371}$ | $L_{B12}$ |
| 5172 | $L_{A372}$ | $L_{B12}$ |
| 5173 | $L_{A373}$ | $L_{B12}$ |
| 5174 | $L_{A374}$ | $L_{B12}$ |
| 5175 | $L_{A375}$ | $L_{B12}$ |
| 5176 | $L_{A376}$ | $L_{B12}$ |
| 5177 | $L_{A377}$ | $L_{B12}$ |
| 5178 | $L_{A378}$ | $L_{B12}$ |
| 5179 | $L_{A379}$ | $L_{B12}$ |
| 5180 | $L_{A380}$ | $L_{B12}$ |
| 5181 | $L_{A381}$ | $L_{B12}$ |
| 5182 | $L_{A382}$ | $L_{B12}$ |
| 5183 | $L_{A383}$ | $L_{B12}$ |
| 5184 | $L_{A384}$ | $L_{B12}$ |
| 5185 | $L_{A385}$ | $L_{B12}$ |
| 5186 | $L_{A386}$ | $L_{B12}$ |
| 5187 | $L_{A387}$ | $L_{B12}$ |
| 5188 | $L_{A388}$ | $L_{B12}$ |
| 5189 | $L_{A389}$ | $L_{B12}$ |
| 5190 | $L_{A390}$ | $L_{B12}$ |
| 5191 | $L_{A391}$ | $L_{B12}$ |
| 5192 | $L_{A392}$ | $L_{B12}$ |
| 5193 | $L_{A393}$ | $L_{B12}$ |
| 5194 | $L_{A394}$ | $L_{B12}$ |
| 5195 | $L_{A395}$ | $L_{B12}$ |
| 5196 | $L_{A396}$ | $L_{B12}$ |
| 5197 | $L_{A397}$ | $L_{B12}$ |
| 5198 | $L_{A398}$ | $L_{B12}$ |
| 5199 | $L_{A399}$ | $L_{B12}$ |
| 5200 | $L_{A400}$ | $L_{B12}$ |
| 5201 | $L_{A401}$ | $L_{B12}$ |
| 5202 | $L_{A402}$ | $L_{B12}$ |
| 5203 | $L_{A403}$ | $L_{B12}$ |
| 5204 | $L_{A404}$ | $L_{B12}$ |
| 5205 | $L_{A405}$ | $L_{B12}$ |
| 5206 | $L_{A406}$ | $L_{B12}$ |
| 5207 | $L_{A407}$ | $L_{B12}$ |
| 5208 | $L_{A408}$ | $L_{B12}$ |
| 5209 | $L_{A409}$ | $L_{B12}$ |
| 5210 | $L_{A410}$ | $L_{B12}$ |
| 5211 | $L_{A411}$ | $L_{B12}$ |
| 5212 | $L_{A412}$ | $L_{B12}$ |
| 5213 | $L_{A413}$ | $L_{B12}$ |
| 5214 | $L_{A414}$ | $L_{B12}$ |
| 5215 | $L_{A415}$ | $L_{B12}$ |
| 5216 | $L_{A416}$ | $L_{B12}$ |
| 5217 | $L_{A417}$ | $L_{B12}$ |
| 5218 | $L_{A418}$ | $L_{B12}$ |
| 5219 | $L_{A419}$ | $L_{B12}$ |
| 5220 | $L_{A420}$ | $L_{B12}$ |
| 5221 | $L_{A421}$ | $L_{B12}$ |
| 5222 | $L_{A422}$ | $L_{B12}$ |
| 5223 | $L_{A423}$ | $L_{B12}$ |
| 5224 | $L_{A424}$ | $L_{B12}$ |
| 5225 | $L_{A425}$ | $L_{B12}$ |
| 5226 | $L_{A426}$ | $L_{B12}$ |
| 5227 | $L_{A427}$ | $L_{B12}$ |
| 5228 | $L_{A428}$ | $L_{B12}$ |
| 5229 | $L_{A429}$ | $L_{B12}$ |
| 5230 | $L_{A430}$ | $L_{B12}$ |
| 5231 | $L_{A431}$ | $L_{B12}$ |
| 5232 | $L_{A432}$ | $L_{B12}$ |
| 5233 | $L_{A433}$ | $L_{B12}$ |
| 5234 | $L_{A434}$ | $L_{B12}$ |
| 5235 | $L_{A435}$ | $L_{B12}$ |
| 5236 | $L_{A436}$ | $L_{B12}$ |
| 5237 | $L_{A437}$ | $L_{B12}$ |
| 5238 | $L_{A438}$ | $L_{B12}$ |
| 5239 | $L_{A439}$ | $L_{B12}$ |
| 5240 | $L_{A440}$ | $L_{B12}$ |

TABLE 2-continued

| Compound Number | $L_A$ | $L_B$ |
|---|---|---|
| 5241 | $L_{A441}$ | $L_{B12}$ |
| 5242 | $L_{A442}$ | $L_{B12}$ |
| 5243 | $L_{A443}$ | $L_{B12}$ |
| 5244 | $L_{A444}$ | $L_{B12}$ |
| 5245 | $L_{A445}$ | $L_{B12}$ |
| 5246 | $L_{A446}$ | $L_{B12}$ |
| 5247 | $L_{A447}$ | $L_{B12}$ |
| 5248 | $L_{A448}$ | $L_{B12}$ |
| 5249 | $L_{A449}$ | $L_{B12}$ |
| 5250 | $L_{A450}$ | $L_{B12}$ |
| 5251 | $L_{A451}$ | $L_{B12}$ |
| 5252 | $L_{A452}$ | $L_{B12}$ |
| 5253 | $L_{A453}$ | $L_{B12}$ |
| 5254 | $L_{A454}$ | $L_{B12}$ |
| 5255 | $L_{A455}$ | $L_{B12}$ |
| 5256 | $L_{A456}$ | $L_{B12}$ |
| 5257 | $L_{A457}$ | $L_{B12}$ |
| 5258 | $L_{A458}$ | $L_{B12}$ |
| 5259 | $L_{A459}$ | $L_{B12}$ |
| 5260 | $L_{A460}$ | $L_{B12}$ |
| 5261 | $L_{A461}$ | $L_{B12}$ |
| 5262 | $L_{A462}$ | $L_{B12}$ |
| 5263 | $L_{A463}$ | $L_{B12}$ |
| 5264 | $L_{A464}$ | $L_{B12}$ |
| 5265 | $L_{A465}$ | $L_{B12}$ |
| 5266 | $L_{A466}$ | $L_{B12}$ |
| 5267 | $L_{A467}$ | $L_{B12}$ |
| 5268 | $L_{A468}$ | $L_{B12}$ |
| 5269 | $L_{A469}$ | $L_{B12}$ |
| 5270 | $L_{A470}$ | $L_{B12}$ |
| 5271 | $L_{A471}$ | $L_{B12}$ |
| 5272 | $L_{A472}$ | $L_{B12}$ |
| 5273 | $L_{A473}$ | $L_{B12}$ |
| 5274 | $L_{A474}$ | $L_{B12}$ |
| 5275 | $L_{A475}$ | $L_{B12}$ |
| 5276 | $L_{A476}$ | $L_{B12}$ |
| 5277 | $L_{A477}$ | $L_{B12}$ |
| 5278 | $L_{A478}$ | $L_{B12}$ |
| 5279 | $L_{A479}$ | $L_{B12}$ |
| 5280 | $L_{A480}$ | $L_{B12}$ |
| 5281 | $L_{A481}$ | $L_{B12}$ |
| 5282 | $L_{A482}$ | $L_{B12}$ |
| 5283 | $L_{A483}$ | $L_{B12}$ |
| 5284 | $L_{A484}$ | $L_{B12}$ |
| 5285 | $L_{A485}$ | $L_{B12}$ |
| 5286 | $L_{A486}$ | $L_{B12}$ |
| 5287 | $L_{A487}$ | $L_{B12}$ |
| 5288 | $L_{A488}$ | $L_{B12}$ |
| 5289 | $L_{A489}$ | $L_{B12}$ |
| 5290 | $L_{A490}$ | $L_{B12}$ |
| 5291 | $L_{A491}$ | $L_{B12}$ |
| 5292 | $L_{A492}$ | $L_{B12}$ |
| 5293 | $L_{A493}$ | $L_{B12}$ |
| 5294 | $L_{A494}$ | $L_{B12}$ |
| 5295 | $L_{A495}$ | $L_{B12}$ |
| 5296 | $L_{A496}$ | $L_{B12}$ |
| 5297 | $L_{A497}$ | $L_{B12}$ |
| 5298 | $L_{A498}$ | $L_{B12}$ |
| 5299 | $L_{A499}$ | $L_{B12}$ |
| 5300 | $L_{A500}$ | $L_{B12}$ |
| 5301 | $L_{A501}$ | $L_{B12}$ |
| 5302 | $L_{A502}$ | $L_{B12}$ |
| 5303 | $L_{A503}$ | $L_{B12}$ |
| 5304 | $L_{A504}$ | $L_{B12}$ |
| 5305 | $L_{A505}$ | $L_{B12}$ |
| 5306 | $L_{A506}$ | $L_{B12}$ |
| 5307 | $L_{A507}$ | $L_{B12}$ |
| 5308 | $L_{A508}$ | $L_{B12}$ |
| 5309 | $L_{A509}$ | $L_{B12}$ |
| 5310 | $L_{A510}$ | $L_{B12}$ |
| 5311 | $L_{A511}$ | $L_{B12}$ |
| 5312 | $L_{A512}$ | $L_{B12}$ |
| 5313 | $L_{A513}$ | $L_{B12}$ |
| 5314 | $L_{A514}$ | $L_{B12}$ |
| 5315 | $L_{A515}$ | $L_{B12}$ |
| 5316 | $L_{A516}$ | $L_{B12}$ |
| 5317 | $L_{A517}$ | $L_{B12}$ |

TABLE 2-continued

| Compound Number | $L_A$ | $L_B$ |
|---|---|---|
| 5318 | $L_{A518}$ | $L_{B12}$ |
| 5319 | $L_{A519}$ | $L_{B12}$ |
| 5320 | $L_{A520}$ | $L_{B12}$ |
| 5321 | $L_{A521}$ | $L_{B12}$ |
| 5322 | $L_{A522}$ | $L_{B12}$ |
| 5323 | $L_{A523}$ | $L_{B12}$ |
| 5324 | $L_{A524}$ | $L_{B12}$ |
| 5325 | $L_{A525}$ | $L_{B12}$ |
| 5326 | $L_{A526}$ | $L_{B12}$ |
| 5327 | $L_{A527}$ | $L_{B12}$ |
| 5328 | $L_{A528}$ | $L_{B12}$ |
| 5329 | $L_{A529}$ | $L_{B12}$ |
| 5330 | $L_{A530}$ | $L_{B12}$ |
| 5331 | $L_{A531}$ | $L_{B12}$ |
| 5332 | $L_{A532}$ | $L_{B12}$ |
| 5333 | $L_{A533}$ | $L_{B12}$ |
| 5334 | $L_{A534}$ | $L_{B12}$ |
| 5335 | $L_{A535}$ | $L_{B12}$ |
| 5336 | $L_{A536}$ | $L_{B12}$ |
| 5337 | $L_{A537}$ | $L_{B12}$ |
| 5338 | $L_{A538}$ | $L_{B12}$ |
| 5339 | $L_{A539}$ | $L_{B12}$ |
| 5340 | $L_{A540}$ | $L_{B12}$ |
| 5341 | $L_{A541}$ | $L_{B12}$ |
| 5342 | $L_{A542}$ | $L_{B12}$ |
| 5343 | $L_{A543}$ | $L_{B12}$ |
| 5344 | $L_{A544}$ | $L_{B12}$ |
| 5345 | $L_{A545}$ | $L_{B12}$ |
| 5346 | $L_{A546}$ | $L_{B12}$ |
| 5347 | $L_{A547}$ | $L_{B12}$ |
| 5348 | $L_{A548}$ | $L_{B12}$ |
| 5349 | $L_{A549}$ | $L_{B12}$ |
| 5350 | $L_{A550}$ | $L_{B12}$ |
| 5351 | $L_{A551}$ | $L_{B12}$ |
| 5352 | $L_{A552}$ | $L_{B12}$ |
| 5353 | $L_{A553}$ | $L_{B12}$ |
| 5354 | $L_{A554}$ | $L_{B12}$ |
| 5355 | $L_{A555}$ | $L_{B12}$ |
| 5356 | $L_{A556}$ | $L_{B12}$ |
| 5357 | $L_{A557}$ | $L_{B12}$ |
| 5358 | $L_{A558}$ | $L_{B12}$ |
| 5359 | $L_{A559}$ | $L_{B12}$ |
| 5360 | $L_{A560}$ | $L_{B12}$ |
| 5361 | $L_{A561}$ | $L_{B12}$ |
| 5362 | $L_{A562}$ | $L_{B12}$ |
| 5363 | $L_{A563}$ | $L_{B12}$ |
| 5364 | $L_{A564}$ | $L_{B12}$ |
| 5365 | $L_{A565}$ | $L_{B12}$ |
| 5366 | $L_{A566}$ | $L_{B12}$ |
| 5367 | $L_{A567}$ | $L_{B12}$ |
| 5368 | $L_{A568}$ | $L_{B12}$ |
| 5369 | $L_{A569}$ | $L_{B12}$ |
| 5370 | $L_{A570}$ | $L_{B12}$ |
| 5371 | $L_{A571}$ | $L_{B12}$ |
| 5372 | $L_{A572}$ | $L_{B12}$ |
| 5373 | $L_{A573}$ | $L_{B12}$ |
| 5374 | $L_{A574}$ | $L_{B12}$ |
| 5375 | $L_{A575}$ | $L_{B12}$ |
| 5376 | $L_{A576}$ | $L_{B12}$ |
| 5377 | $L_{A577}$ | $L_{B12}$ |
| 5378 | $L_{A578}$ | $L_{B12}$ |
| 5379 | $L_{A579}$ | $L_{B12}$ |
| 5380 | $L_{A580}$ | $L_{B12}$ |
| 5381 | $L_{A581}$ | $L_{B12}$ |
| 5382 | $L_{A582}$ | $L_{B12}$ |
| 5383 | $L_{A583}$ | $L_{B12}$ |
| 5384 | $L_{A584}$ | $L_{B12}$ |
| 5385 | $L_{A585}$ | $L_{B12}$ |
| 5386 | $L_{A586}$ | $L_{B12}$ |
| 5387 | $L_{A587}$ | $L_{B12}$ |
| 5388 | $L_{A588}$ | $L_{B12}$ |
| 5389 | $L_{A589}$ | $L_{B12}$ |
| 5390 | $L_{A590}$ | $L_{B12}$ |
| 5391 | $L_{A591}$ | $L_{B12}$ |
| 5392 | $L_{A592}$ | $L_{B12}$ |
| 5393 | $L_{A593}$ | $L_{B12}$ |
| 5394 | $L_{A594}$ | $L_{B12}$ |

TABLE 2-continued

| Compound Number | $L_A$ | $L_B$ |
|---|---|---|
| 5395 | $L_{A595}$ | $L_{B12}$ |
| 5396 | $L_{A596}$ | $L_{B12}$ |
| 5397 | $L_{A597}$ | $L_{B12}$ |
| 5398 | $L_{A598}$ | $L_{B12}$ |
| 5399 | $L_{A599}$ | $L_{B12}$ |
| 5400 | $L_{A600}$ | $L_{B12}$ |
| 5401 | $L_{A601}$ | $L_{B12}$ |
| 5402 | $L_{A602}$ | $L_{B12}$ |
| 5403 | $L_{A603}$ | $L_{B12}$ |
| 5404 | $L_{A604}$ | $L_{B12}$ |
| 5405 | $L_{A605}$ | $L_{B12}$ |
| 5406 | $L_{A606}$ | $L_{B12}$ |
| 5407 | $L_{A607}$ | $L_{B12}$ |
| 5408 | $L_{A608}$ | $L_{B12}$ |
| 5409 | $L_{A609}$ | $L_{B12}$ |
| 5410 | $L_{A610}$ | $L_{B12}$ |
| 5411 | $L_{A611}$ | $L_{B12}$ |
| 5412 | $L_{A612}$ | $L_{B12}$ |
| 5413 | $L_{A613}$ | $L_{B12}$ |
| 5414 | $L_{A614}$ | $L_{B12}$ |
| 5415 | $L_{A615}$ | $L_{B12}$ |
| 5416 | $L_{A616}$ | $L_{B12}$ |
| 5417 | $L_{A617}$ | $L_{B12}$ |
| 5418 | $L_{A618}$ | $L_{B12}$ |
| 5419 | $L_{A619}$ | $L_{B12}$ |
| 5420 | $L_{A620}$ | $L_{B12}$ |
| 5421 | $L_{A621}$ | $L_{B12}$ |
| 5422 | $L_{A622}$ | $L_{B12}$ |
| 5423 | $L_{A623}$ | $L_{B12}$ |
| 5424 | $L_{A624}$ | $L_{B12}$ |
| 5425 | $L_{A625}$ | $L_{B12}$ |
| 5426 | $L_{A626}$ | $L_{B12}$ |
| 5427 | $L_{A627}$ | $L_{B12}$ |
| 5428 | $L_{A628}$ | $L_{B12}$ |
| 5429 | $L_{A629}$ | $L_{B12}$ |
| 5430 | $L_{A630}$ | $L_{B12}$ |
| 5431 | $L_{A631}$ | $L_{B12}$ |
| 5432 | $L_{A632}$ | $L_{B12}$ |
| 5433 | $L_{A633}$ | $L_{B12}$ |
| 5434 | $L_{A634}$ | $L_{B12}$ |
| 5435 | $L_{A635}$ | $L_{B12}$ |
| 5436 | $L_{A636}$ | $L_{B12}$ |
| 5437 | $L_{A637}$ | $L_{B12}$ |
| 5438 | $L_{A638}$ | $L_{B12}$ |
| 5439 | $L_{A639}$ | $L_{B12}$ |
| 5440 | $L_{A640}$ | $L_{B12}$ |
| 5441 | $L_{A641}$ | $L_{B12}$ |
| 5442 | $L_{A642}$ | $L_{B12}$ |
| 5443 | $L_{A643}$ | $L_{B12}$ |
| 5444 | $L_{A644}$ | $L_{B12}$ |
| 5445 | $L_{A645}$ | $L_{B12}$ |
| 5446 | $L_{A646}$ | $L_{B12}$ |
| 5447 | $L_{A647}$ | $L_{B12}$ |
| 5448 | $L_{A648}$ | $L_{B12}$ |
| 5449 | $L_{A649}$ | $L_{B12}$ |
| 5450 | $L_{A650}$ | $L_{B12}$ |
| 5451 | $L_{A651}$ | $L_{B12}$ |
| 5452 | $L_{A652}$ | $L_{B12}$ |
| 5453 | $L_{A653}$ | $L_{B12}$ |
| 5454 | $L_{A654}$ | $L_{B12}$ |
| 5455 | $L_{A655}$ | $L_{B12}$ |
| 5456 | $L_{A656}$ | $L_{B12}$ |
| 5457 | $L_{A657}$ | $L_{B12}$ |
| 5458 | $L_{A658}$ | $L_{B12}$ |
| 5459 | $L_{A659}$ | $L_{B12}$ |
| 5460 | $L_{A660}$ | $L_{B12}$ |
| 5461 | $L_{A661}$ | $L_{B12}$ |
| 5462 | $L_{A662}$ | $L_{B12}$ |
| 5463 | $L_{A663}$ | $L_{B12}$ |
| 5464 | $L_{A664}$ | $L_{B12}$ |
| 5465 | $L_{A665}$ | $L_{B12}$ |
| 5466 | $L_{A666}$ | $L_{B12}$ |
| 5467 | $L_{A667}$ | $L_{B12}$ |
| 5468 | $L_{A668}$ | $L_{B12}$ |
| 5469 | $L_{A669}$ | $L_{B12}$ |
| 5470 | $L_{A670}$ | $L_{B12}$ |
| 5471 | $L_{A671}$ | $L_{B12}$ |

TABLE 2-continued

| Compound Number | $L_A$ | $L_B$ |
|---|---|---|
| 5472 | $L_{A672}$ | $L_{B12}$ |
| 5473 | $L_{A673}$ | $L_{B12}$ |
| 5474 | $L_{A674}$ | $L_{B12}$ |
| 5475 | $L_{A675}$ | $L_{B12}$ |
| 5476 | $L_{A676}$ | $L_{B12}$ |
| 5477 | $L_{A677}$ | $L_{B12}$ |
| 5478 | $L_{A678}$ | $L_{B12}$ |
| 5479 | $L_{A679}$ | $L_{B12}$ |
| 5480 | $L_{A680}$ | $L_{B12}$ |
| 5481 | $L_{A681}$ | $L_{B12}$ |
| 5482 | $L_{A682}$ | $L_{B12}$ |
| 5483 | $L_{A683}$ | $L_{B12}$ |
| 5484 | $L_{A684}$ | $L_{B12}$ |
| 5485 | $L_{A685}$ | $L_{B12}$ |
| 5486 | $L_{A686}$ | $L_{B12}$ |
| 5487 | $L_{A687}$ | $L_{B12}$ |
| 5488 | $L_{A688}$ | $L_{B12}$ |
| 5489 | $L_{A689}$ | $L_{B12}$ |
| 5490 | $L_{A690}$ | $L_{B12}$ |
| 5491 | $L_{A691}$ | $L_{B12}$ |
| 5492 | $L_{A692}$ | $L_{B12}$ |
| 5493 | $L_{A693}$ | $L_{B12}$ |
| 5494 | $L_{A694}$ | $L_{B12}$ |
| 5495 | $L_{A695}$ | $L_{B12}$ |
| 5496 | $L_{A696}$ | $L_{B12}$ |
| 5497 | $L_{A697}$ | $L_{B12}$ |
| 5498 | $L_{A698}$ | $L_{B12}$ |
| 5499 | $L_{A699}$ | $L_{B12}$ |
| 5500 | $L_{A700}$ | $L_{B12}$ |
| 5501 | $L_{A701}$ | $L_{B12}$ |
| 5502 | $L_{A702}$ | $L_{B12}$ |
| 5503 | $L_{A703}$ | $L_{B12}$ |
| 5504 | $L_{A704}$ | $L_{B12}$ |
| 5505 | $L_{A705}$ | $L_{B12}$ |
| 5506 | $L_{A706}$ | $L_{B12}$ |
| 5507 | $L_{A707}$ | $L_{B12}$ |
| 5508 | $L_{A708}$ | $L_{B12}$ |
| 5509 | $L_{A709}$ | $L_{B12}$ |
| 5510 | $L_{A710}$ | $L_{B12}$ |
| 5511 | $L_{A711}$ | $L_{B12}$ |
| 5512 | $L_{A712}$ | $L_{B12}$ |
| 5513 | $L_{A713}$ | $L_{B12}$ |
| 5514 | $L_{A714}$ | $L_{B12}$ |
| 5515 | $L_{A715}$ | $L_{B12}$ |
| 5516 | $L_{A716}$ | $L_{B12}$ |
| 5517 | $L_{A717}$ | $L_{B12}$ |
| 5518 | $L_{A718}$ | $L_{B12}$ |
| 5519 | $L_{A719}$ | $L_{B12}$ |
| 5520 | $L_{A720}$ | $L_{B12}$ |
| 5521 | $L_{A721}$ | $L_{B12}$ |
| 5522 | $L_{A722}$ | $L_{B12}$ |
| 5523 | $L_{A723}$ | $L_{B12}$ |
| 5524 | $L_{A724}$ | $L_{B12}$ |
| 5525 | $L_{A725}$ | $L_{B12}$ |
| 5526 | $L_{A726}$ | $L_{B12}$ |
| 5527 | $L_{A727}$ | $L_{B12}$ |
| 5528 | $L_{A728}$ | $L_{B12}$ |
| 5529 | $L_{A729}$ | $L_{B12}$ |
| 5530 | $L_{A730}$ | $L_{B12}$ |
| 5531 | $L_{A731}$ | $L_{B12}$ |
| 5532 | $L_{A732}$ | $L_{B12}$ |
| 5533 | $L_{A733}$ | $L_{B12}$ |
| 5534 | $L_{A734}$ | $L_{B12}$ |
| 5535 | $L_{A735}$ | $L_{B12}$ |
| 5536 | $L_{A736}$ | $L_{B12}$ |
| 5537 | $L_{A737}$ | $L_{B12}$ |
| 5538 | $L_{A738}$ | $L_{B12}$ |
| 5539 | $L_{A739}$ | $L_{B12}$ |
| 5540 | $L_{A740}$ | $L_{B12}$ |
| 5541 | $L_{A741}$ | $L_{B12}$ |
| 5542 | $L_{A742}$ | $L_{B12}$ |
| 5543 | $L_{A743}$ | $L_{B12}$ |
| 5544 | $L_{A744}$ | $L_{B12}$ |
| 5545 | $L_{A745}$ | $L_{B12}$ |
| 5546 | $L_{A746}$ | $L_{B12}$ |
| 5547 | $L_{A747}$ | $L_{B12}$ |
| 5548 | $L_{A748}$ | $L_{B12}$ |

TABLE 2-continued

| Compound Number | $L_A$ | $L_B$ |
|---|---|---|
| 5549 | $L_{A749}$ | $L_{B12}$ |
| 5550 | $L_{A750}$ | $L_{B12}$ |
| 5551 | $L_{A751}$ | $L_{B12}$ |
| 5552 | $L_{A752}$ | $L_{B12}$ |
| 5553 | $L_{A753}$ | $L_{B12}$ |
| 5554 | $L_{A754}$ | $L_{B12}$ |
| 5555 | $L_{A755}$ | $L_{B12}$ |
| 5556 | $L_{A756}$ | $L_{B12}$ |
| 5557 | $L_{A757}$ | $L_{B12}$ |
| 5558 | $L_{A758}$ | $L_{B12}$ |
| 5559 | $L_{A759}$ | $L_{B12}$ |
| 5560 | $L_{A760}$ | $L_{B12}$ |
| 5561 | $L_{A761}$ | $L_{B12}$ |
| 5562 | $L_{A762}$ | $L_{B12}$ |
| 5563 | $L_{A763}$ | $L_{B12}$ |
| 5564 | $L_{A764}$ | $L_{B12}$ |
| 5565 | $L_{A765}$ | $L_{B12}$ |
| 5566 | $L_{A766}$ | $L_{B12}$ |
| 5567 | $L_{A767}$ | $L_{B12}$ |
| 5568 | $L_{A768}$ | $L_{B12}$ |
| 5569 | $L_{A769}$ | $L_{B12}$ |
| 5570 | $L_{A770}$ | $L_{B12}$ |
| 5571 | $L_{A771}$ | $L_{B12}$ |
| 5572 | $L_{A772}$ | $L_{B12}$ |
| 5573 | $L_{A773}$ | $L_{B12}$ |
| 5574 | $L_{A774}$ | $L_{B12}$ |
| 5575 | $L_{A775}$ | $L_{B12}$ |
| 5576 | $L_{A776}$ | $L_{B12}$ |
| 5577 | $L_{A777}$ | $L_{B12}$ |
| 5578 | $L_{A778}$ | $L_{B12}$ |
| 5579 | $L_{A779}$ | $L_{B12}$ |
| 5580 | $L_{A780}$ | $L_{B12}$ |
| 5581 | $L_{A781}$ | $L_{B12}$ |
| 5582 | $L_{A782}$ | $L_{B12}$ |
| 5583 | $L_{A783}$ | $L_{B12}$ |
| 5584 | $L_{A784}$ | $L_{B12}$ |
| 5585 | $L_{A785}$ | $L_{B12}$ |
| 5586 | $L_{A786}$ | $L_{B12}$ |
| 5587 | $L_{A787}$ | $L_{B12}$ |
| 5588 | $L_{A788}$ | $L_{B12}$ |
| 5589 | $L_{A789}$ | $L_{B12}$ |
| 5590 | $L_{A790}$ | $L_{B12}$ |
| 5591 | $L_{A791}$ | $L_{B12}$ |
| 5592 | $L_{A792}$ | $L_{B12}$ |
| 5593 | $L_{A793}$ | $L_{B12}$ |
| 5594 | $L_{A794}$ | $L_{B12}$ |
| 5595 | $L_{A795}$ | $L_{B12}$ |
| 5596 | $L_{A796}$ | $L_{B12}$ |
| 5597 | $L_{A797}$ | $L_{B12}$ |
| 5598 | $L_{A798}$ | $L_{B12}$ |
| 5599 | $L_{A799}$ | $L_{B12}$ |
| 5600 | $L_{A800}$ | $L_{B12}$ |
| 5601 | $L_{A801}$ | $L_{B12}$ |
| 5602 | $L_{A802}$ | $L_{B12}$ |
| 5603 | $L_{A803}$ | $L_{B12}$ |
| 5604 | $L_{A804}$ | $L_{B12}$ |
| 5605 | $L_{A805}$ | $L_{B12}$ |
| 5606 | $L_{A806}$ | $L_{B12}$ |
| 5607 | $L_{A807}$ | $L_{B12}$ |
| 5608 | $L_{A808}$ | $L_{B12}$ |
| 5609 | $L_{A809}$ | $L_{B12}$ |
| 5610 | $L_{A810}$ | $L_{B12}$ |
| 5611 | $L_{A811}$ | $L_{B12}$ |
| 5612 | $L_{A812}$ | $L_{B12}$ |
| 5613 | $L_{A813}$ | $L_{B12}$ |
| 5614 | $L_{A814}$ | $L_{B12}$ |
| 5615 | $L_{A815}$ | $L_{B12}$ |
| 5616 | $L_{A816}$ | $L_{B12}$ |
| 5617 | $L_{A817}$ | $L_{B12}$ |
| 5618 | $L_{A818}$ | $L_{B12}$ |
| 5619 | $L_{A819}$ | $L_{B12}$ |
| 5620 | $L_{A820}$ | $L_{B12}$ |
| 5621 | $L_{A821}$ | $L_{B12}$ |
| 5622 | $L_{A822}$ | $L_{B12}$ |
| 5623 | $L_{A823}$ | $L_{B12}$ |
| 5624 | $L_{A824}$ | $L_{B12}$ |
| 5625 | $L_{A825}$ | $L_{B12}$ |

TABLE 2-continued

| Compound Number | $L_A$ | $L_B$ |
|---|---|---|
| 5626 | $L_{A826}$ | $L_{B12}$ |
| 5627 | $L_{A827}$ | $L_{B12}$ |
| 5628 | $L_{A828}$ | $L_{B12}$ |
| 5629 | $L_{A829}$ | $L_{B12}$ |
| 5630 | $L_{A830}$ | $L_{B12}$ |
| 5631 | $L_{A831}$ | $L_{B12}$ |
| 5632 | $L_{A832}$ | $L_{B12}$ |
| 5633 | $L_{A833}$ | $L_{B12}$ |
| 5634 | $L_{A834}$ | $L_{B12}$ |
| 5635 | $L_{A835}$ | $L_{B12}$ |
| 5636 | $L_{A836}$ | $L_{B12}$ |
| 5637 | $L_{A837}$ | $L_{B12}$ |
| 5638 | $L_{A838}$ | $L_{B12}$ |
| 5639 | $L_{A839}$ | $L_{B12}$ |
| 5640 | $L_{A840}$ | $L_{B12}$ |
| 5641 | $L_{A841}$ | $L_{B12}$ |
| 5642 | $L_{A842}$ | $L_{B12}$ |
| 5643 | $L_{A843}$ | $L_{B12}$ |
| 5644 | $L_{A844}$ | $L_{B12}$ |
| 5645 | $L_{A845}$ | $L_{B12}$ |
| 5646 | $L_{A846}$ | $L_{B12}$ |
| 5647 | $L_{A847}$ | $L_{B12}$ |
| 5648 | $L_{A848}$ | $L_{B12}$ |
| 5649 | $L_{A849}$ | $L_{B12}$ |
| 5650 | $L_{A850}$ | $L_{B12}$ |
| 5651 | $L_{A851}$ | $L_{B12}$ |
| 5652 | $L_{A852}$ | $L_{B12}$ |
| 5653 | $L_{A853}$ | $L_{B12}$ |
| 5654 | $L_{A854}$ | $L_{B12}$ |
| 5655 | $L_{A855}$ | $L_{B12}$ |
| 5656 | $L_{A856}$ | $L_{B12}$ |
| 5657 | $L_{A857}$ | $L_{B12}$ |
| 5658 | $L_{A858}$ | $L_{B12}$ |
| 5659 | $L_{A859}$ | $L_{B12}$ |
| 5660 | $L_{A860}$ | $L_{B12}$ |
| 5661 | $L_{A861}$ | $L_{B12}$ |
| 5662 | $L_{A862}$ | $L_{B12}$ |
| 5663 | $L_{A863}$ | $L_{B12}$ |
| 5664 | $L_{A864}$ | $L_{B12}$ |
| 5665 | $L_{A865}$ | $L_{B12}$ |
| 5666 | $L_{A866}$ | $L_{B12}$ |
| 5667 | $L_{A867}$ | $L_{B12}$ |
| 5668 | $L_{A868}$ | $L_{B12}$ |
| 5669 | $L_{A869}$ | $L_{B12}$ |
| 5670 | $L_{A870}$ | $L_{B12}$ |
| 5671 | $L_{A871}$ | $L_{B12}$ |
| 5672 | $L_{A872}$ | $L_{B12}$ |
| 5673 | $L_{A873}$ | $L_{B12}$ |
| 5674 | $L_{A874}$ | $L_{B12}$ |
| 5675 | $L_{A875}$ | $L_{B12}$ |
| 5676 | $L_{A876}$ | $L_{B12}$ |
| 5677 | $L_{A877}$ | $L_{B12}$ |
| 5678 | $L_{A878}$ | $L_{B12}$ |
| 5679 | $L_{A879}$ | $L_{B12}$ |
| 5680 | $L_{A880}$ | $L_{B12}$ |
| 5681 | $L_{A881}$ | $L_{B12}$ |
| 5682 | $L_{A882}$ | $L_{B12}$ |
| 5683 | $L_{A883}$ | $L_{B12}$ |
| 5684 | $L_{A884}$ | $L_{B12}$ |
| 5685 | $L_{A885}$ | $L_{B12}$ |
| 5686 | $L_{A886}$ | $L_{B12}$ |
| 5687 | $L_{A887}$ | $L_{B12}$ |
| 5688 | $L_{A888}$ | $L_{B12}$ |
| 5689 | $L_{A889}$ | $L_{B12}$ |
| 5690 | $L_{A890}$ | $L_{B12}$ |
| 5691 | $L_{A891}$ | $L_{B12}$ |
| 5692 | $L_{A892}$ | $L_{B12}$ |
| 5693 | $L_{A893}$ | $L_{B12}$ |
| 5694 | $L_{A894}$ | $L_{B12}$ |
| 5695 | $L_{A895}$ | $L_{B12}$ |
| 5696 | $L_{A896}$ | $L_{B12}$ |
| 5697 | $L_{A897}$ | $L_{B12}$ |
| 5698 | $L_{A898}$ | $L_{B12}$ |
| 5699 | $L_{A899}$ | $L_{B12}$ |
| 5700 | $L_{A900}$ | $L_{B12}$ |
| 5701 | $L_{A901}$ | $L_{B12}$ |
| 5702 | $L_{A902}$ | $L_{B12}$ |

TABLE 2-continued

| Compound Number | $L_A$ | $L_B$ |
|---|---|---|
| 5703 | $L_{A903}$ | $L_{B12}$ |
| 5704 | $L_{A904}$ | $L_{B12}$ |
| 5705 | $L_{A905}$ | $L_{B12}$ |
| 5706 | $L_{A906}$ | $L_{B12}$ |
| 5707 | $L_{A907}$ | $L_{B12}$ |
| 5708 | $L_{A908}$ | $L_{B12}$ |
| 5709 | $L_{A909}$ | $L_{B12}$ |
| 5710 | $L_{A910}$ | $L_{B12}$ |
| 5711 | $L_{A911}$ | $L_{B12}$ |
| 5712 | $L_{A912}$ | $L_{B12}$ |
| 5713 | $L_{A913}$ | $L_{B12}$ |
| 5714 | $L_{A914}$ | $L_{B12}$ |
| 5715 | $L_{A915}$ | $L_{B12}$ |
| 5716 | $L_{A916}$ | $L_{B12}$ |
| 5717 | $L_{A917}$ | $L_{B12}$ |
| 5718 | $L_{A918}$ | $L_{B12}$ |
| 5719 | $L_{A919}$ | $L_{B12}$ |
| 5720 | $L_{A920}$ | $L_{B12}$ |
| 5721 | $L_{A921}$ | $L_{B12}$ |
| 5722 | $L_{A922}$ | $L_{B12}$ |
| 5723 | $L_{A923}$ | $L_{B12}$ |
| 5724 | $L_{A924}$ | $L_{B12}$ |
| 5725 | $L_{A925}$ | $L_{B12}$ |
| 5726 | $L_{A926}$ | $L_{B12}$ |
| 5727 | $L_{A927}$ | $L_{B12}$ |
| 5728 | $L_{A928}$ | $L_{B12}$ |
| 5729 | $L_{A929}$ | $L_{B12}$ |
| 5730 | $L_{A930}$ | $L_{B12}$ |
| 5731 | $L_{A931}$ | $L_{B12}$ |
| 5732 | $L_{A932}$ | $L_{B12}$ |
| 5733 | $L_{A933}$ | $L_{B12}$ |
| 5734 | $L_{A934}$ | $L_{B12}$ |
| 5735 | $L_{A935}$ | $L_{B12}$ |
| 5736 | $L_{A936}$ | $L_{B12}$ |
| 5737 | $L_{A937}$ | $L_{B12}$ |
| 5738 | $L_{A938}$ | $L_{B12}$ |
| 5739 | $L_{A939}$ | $L_{B12}$ |
| 5740 | $L_{A940}$ | $L_{B12}$ |
| 5741 | $L_{A941}$ | $L_{B12}$ |
| 5742 | $L_{A942}$ | $L_{B12}$ |
| 5743 | $L_{A943}$ | $L_{B12}$ |
| 5744 | $L_{A944}$ | $L_{B12}$ |
| 5745 | $L_{A945}$ | $L_{B12}$ |
| 5746 | $L_{A946}$ | $L_{B12}$ |
| 5747 | $L_{A947}$ | $L_{B12}$ |
| 5748 | $L_{A948}$ | $L_{B12}$ |
| 5749 | $L_{A949}$ | $L_{B12}$ |
| 5750 | $L_{A950}$ | $L_{B12}$ |
| 5751 | $L_{A951}$ | $L_{B12}$ |
| 5752 | $L_{A952}$ | $L_{B12}$ |
| 5753 | $L_{A953}$ | $L_{B12}$ |
| 5754 | $L_{A954}$ | $L_{B12}$ |
| 5755 | $L_{A955}$ | $L_{B12}$ |
| 5756 | $L_{A956}$ | $L_{B12}$ |
| 5757 | $L_{A957}$ | $L_{B12}$ |
| 5758 | $L_{A958}$ | $L_{B12}$ |
| 5759 | $L_{A959}$ | $L_{B12}$ |
| 5760 | $L_{A960}$ | $L_{B12}$ |

In some embodiments, the compound has formula VI:

$$(L_A)_2Ir(L_B)_1 \quad (VI);$$

and is selected from the group consisting of compound 5761 to compound 7680 listed in TABLE 3.

TABLE 3

| Compound Number | $L_A$ | $L_B$ |
|---|---|---|
| 5761 | $L_{A1}$ | $L_{B42}$ |
| 5762 | $L_{A2}$ | $L_{B42}$ |
| 5763 | $L_{A3}$ | $L_{B42}$ |
| 5764 | $L_{A4}$ | $L_{B42}$ |
| 5765 | $L_{A5}$ | $L_{B42}$ |

TABLE 3-continued

| Compound Number | $L_A$ | $L_B$ |
|---|---|---|
| 5766 | $L_{A6}$ | $L_{B42}$ |
| 5767 | $L_{A7}$ | $L_{B42}$ |
| 5768 | $L_{A8}$ | $L_{B42}$ |
| 5769 | $L_{A9}$ | $L_{B42}$ |
| 5770 | $L_{A10}$ | $L_{B42}$ |
| 5771 | $L_{A11}$ | $L_{B42}$ |
| 5772 | $L_{A12}$ | $L_{B42}$ |
| 5773 | $L_{A13}$ | $L_{B42}$ |
| 5774 | $L_{A14}$ | $L_{B42}$ |
| 5775 | $L_{A15}$ | $L_{B42}$ |
| 5776 | $L_{A16}$ | $L_{B42}$ |
| 5777 | $L_{A17}$ | $L_{B42}$ |
| 5778 | $L_{A18}$ | $L_{B42}$ |
| 5779 | $L_{A19}$ | $L_{B42}$ |
| 5780 | $L_{A20}$ | $L_{B42}$ |
| 5781 | $L_{A21}$ | $L_{B42}$ |
| 5782 | $L_{A22}$ | $L_{B42}$ |
| 5783 | $L_{A23}$ | $L_{B42}$ |
| 5784 | $L_{A24}$ | $L_{B42}$ |
| 5785 | $L_{A25}$ | $L_{B42}$ |
| 5786 | $L_{A26}$ | $L_{B42}$ |
| 5787 | $L_{A27}$ | $L_{B42}$ |
| 5788 | $L_{A28}$ | $L_{B42}$ |
| 5789 | $L_{A29}$ | $L_{B42}$ |
| 5790 | $L_{A30}$ | $L_{B42}$ |
| 5791 | $L_{A31}$ | $L_{B42}$ |
| 5792 | $L_{A32}$ | $L_{B42}$ |
| 5793 | $L_{A33}$ | $L_{B42}$ |
| 5794 | $L_{A34}$ | $L_{B42}$ |
| 5795 | $L_{A35}$ | $L_{B42}$ |
| 5796 | $L_{A36}$ | $L_{B42}$ |
| 5797 | $L_{A37}$ | $L_{B42}$ |
| 5798 | $L_{A38}$ | $L_{B42}$ |
| 5799 | $L_{A39}$ | $L_{B42}$ |
| 5800 | $L_{A40}$ | $L_{B42}$ |
| 5801 | $L_{A41}$ | $L_{B42}$ |
| 5802 | $L_{A42}$ | $L_{B42}$ |
| 5803 | $L_{A43}$ | $L_{B42}$ |
| 5804 | $L_{A44}$ | $L_{B42}$ |
| 5805 | $L_{A45}$ | $L_{B42}$ |
| 5806 | $L_{A46}$ | $L_{B42}$ |
| 5807 | $L_{A47}$ | $L_{B42}$ |
| 5808 | $L_{A48}$ | $L_{B42}$ |
| 5809 | $L_{A49}$ | $L_{B42}$ |
| 5810 | $L_{A50}$ | $L_{B42}$ |
| 5811 | $L_{A51}$ | $L_{B42}$ |
| 5812 | $L_{A52}$ | $L_{B42}$ |
| 5813 | $L_{A53}$ | $L_{B42}$ |
| 5814 | $L_{A54}$ | $L_{B42}$ |
| 5815 | $L_{A55}$ | $L_{B42}$ |
| 5816 | $L_{A56}$ | $L_{B42}$ |
| 5817 | $L_{A57}$ | $L_{B42}$ |
| 5818 | $L_{A58}$ | $L_{B42}$ |
| 5819 | $L_{A59}$ | $L_{B42}$ |
| 5820 | $L_{A60}$ | $L_{B42}$ |
| 5821 | $L_{A61}$ | $L_{B42}$ |
| 5822 | $L_{A62}$ | $L_{B42}$ |
| 5823 | $L_{A63}$ | $L_{B42}$ |
| 5824 | $L_{A64}$ | $L_{B42}$ |
| 5825 | $L_{A65}$ | $L_{B42}$ |
| 5826 | $L_{A66}$ | $L_{B42}$ |
| 5827 | $L_{A67}$ | $L_{B42}$ |
| 5828 | $L_{A68}$ | $L_{B42}$ |
| 5829 | $L_{A69}$ | $L_{B42}$ |
| 5830 | $L_{A70}$ | $L_{B42}$ |
| 5831 | $L_{A71}$ | $L_{B42}$ |
| 5832 | $L_{A72}$ | $L_{B42}$ |
| 5833 | $L_{A73}$ | $L_{B42}$ |
| 5834 | $L_{A74}$ | $L_{B42}$ |
| 5835 | $L_{A75}$ | $L_{B42}$ |
| 5836 | $L_{A76}$ | $L_{B42}$ |
| 5837 | $L_{A77}$ | $L_{B42}$ |
| 5838 | $L_{A78}$ | $L_{B42}$ |
| 5839 | $L_{A79}$ | $L_{B42}$ |
| 5840 | $L_{A80}$ | $L_{B42}$ |
| 5841 | $L_{A81}$ | $L_{B42}$ |
| 5842 | $L_{A82}$ | $L_{B42}$ |

TABLE 3-continued

| Compound Number | $L_A$ | $L_B$ |
|---|---|---|
| 5843 | $L_{A83}$ | $L_{B42}$ |
| 5844 | $L_{A84}$ | $L_{B42}$ |
| 5845 | $L_{A85}$ | $L_{B42}$ |
| 5846 | $L_{A86}$ | $L_{B42}$ |
| 5847 | $L_{A87}$ | $L_{B42}$ |
| 5848 | $L_{A88}$ | $L_{B42}$ |
| 5849 | $L_{A89}$ | $L_{B42}$ |
| 5850 | $L_{A90}$ | $L_{B42}$ |
| 5851 | $L_{A91}$ | $L_{B42}$ |
| 5852 | $L_{A92}$ | $L_{B42}$ |
| 5853 | $L_{A93}$ | $L_{B42}$ |
| 5854 | $L_{A94}$ | $L_{B42}$ |
| 5855 | $L_{A95}$ | $L_{B42}$ |
| 5856 | $L_{A96}$ | $L_{B42}$ |
| 5857 | $L_{A97}$ | $L_{B42}$ |
| 5858 | $L_{A98}$ | $L_{B42}$ |
| 5859 | $L_{A99}$ | $L_{B42}$ |
| 5860 | $L_{A100}$ | $L_{B42}$ |
| 5861 | $L_{A101}$ | $L_{B42}$ |
| 5862 | $L_{A102}$ | $L_{B42}$ |
| 5863 | $L_{A103}$ | $L_{B42}$ |
| 5864 | $L_{A104}$ | $L_{B42}$ |
| 5865 | $L_{A105}$ | $L_{B42}$ |
| 5866 | $L_{A106}$ | $L_{B42}$ |
| 5867 | $L_{A107}$ | $L_{B42}$ |
| 5868 | $L_{A108}$ | $L_{B42}$ |
| 5869 | $L_{A109}$ | $L_{B42}$ |
| 5870 | $L_{A110}$ | $L_{B42}$ |
| 5871 | $L_{A111}$ | $L_{B42}$ |
| 5872 | $L_{A112}$ | $L_{B42}$ |
| 5873 | $L_{A113}$ | $L_{B42}$ |
| 5874 | $L_{A114}$ | $L_{B42}$ |
| 5875 | $L_{A115}$ | $L_{B42}$ |
| 5876 | $L_{A116}$ | $L_{B42}$ |
| 5877 | $L_{A117}$ | $L_{B42}$ |
| 5878 | $L_{A118}$ | $L_{B42}$ |
| 5879 | $L_{A119}$ | $L_{B42}$ |
| 5880 | $L_{A120}$ | $L_{B42}$ |
| 5881 | $L_{A121}$ | $L_{B42}$ |
| 5882 | $L_{A122}$ | $L_{B42}$ |
| 5883 | $L_{A123}$ | $L_{B42}$ |
| 5884 | $L_{A124}$ | $L_{B42}$ |
| 5885 | $L_{A125}$ | $L_{B42}$ |
| 5886 | $L_{A126}$ | $L_{B42}$ |
| 5887 | $L_{A127}$ | $L_{B42}$ |
| 5888 | $L_{A128}$ | $L_{B42}$ |
| 5889 | $L_{A129}$ | $L_{B42}$ |
| 5890 | $L_{A130}$ | $L_{B42}$ |
| 5891 | $L_{A131}$ | $L_{B42}$ |
| 5892 | $L_{A132}$ | $L_{B42}$ |
| 5893 | $L_{A133}$ | $L_{B42}$ |
| 5894 | $L_{A134}$ | $L_{B42}$ |
| 5895 | $L_{A135}$ | $L_{B42}$ |
| 5896 | $L_{A136}$ | $L_{B42}$ |
| 5897 | $L_{A137}$ | $L_{B42}$ |
| 5898 | $L_{A138}$ | $L_{B42}$ |
| 5899 | $L_{A139}$ | $L_{B42}$ |
| 5900 | $L_{A140}$ | $L_{B42}$ |
| 5901 | $L_{A141}$ | $L_{B42}$ |
| 5902 | $L_{A142}$ | $L_{B42}$ |
| 5903 | $L_{A143}$ | $L_{B42}$ |
| 5904 | $L_{A144}$ | $L_{B42}$ |
| 5905 | $L_{A145}$ | $L_{B42}$ |
| 5906 | $L_{A146}$ | $L_{B42}$ |
| 5907 | $L_{A147}$ | $L_{B42}$ |
| 5908 | $L_{A148}$ | $L_{B42}$ |
| 5909 | $L_{A149}$ | $L_{B42}$ |
| 5910 | $L_{A150}$ | $L_{B42}$ |
| 5911 | $L_{A151}$ | $L_{B42}$ |
| 5912 | $L_{A152}$ | $L_{B42}$ |
| 5913 | $L_{A153}$ | $L_{B42}$ |
| 5914 | $L_{A154}$ | $L_{B42}$ |
| 5915 | $L_{A155}$ | $L_{B42}$ |
| 5916 | $L_{A156}$ | $L_{B42}$ |
| 5917 | $L_{A157}$ | $L_{B42}$ |
| 5918 | $L_{A158}$ | $L_{B42}$ |
| 5919 | $L_{A159}$ | $L_{B42}$ |

TABLE 3-continued

| Compound Number | $L_A$ | $L_B$ |
|---|---|---|
| 5920 | $L_{A160}$ | $L_{B42}$ |
| 5921 | $L_{A161}$ | $L_{B42}$ |
| 5922 | $L_{A162}$ | $L_{B42}$ |
| 5923 | $L_{A163}$ | $L_{B42}$ |
| 5924 | $L_{A164}$ | $L_{B42}$ |
| 5925 | $L_{A165}$ | $L_{B42}$ |
| 5926 | $L_{A166}$ | $L_{B42}$ |
| 5927 | $L_{A167}$ | $L_{B42}$ |
| 5928 | $L_{A168}$ | $L_{B42}$ |
| 5929 | $L_{A169}$ | $L_{B42}$ |
| 5930 | $L_{A170}$ | $L_{B42}$ |
| 5931 | $L_{A171}$ | $L_{B42}$ |
| 5932 | $L_{A172}$ | $L_{B42}$ |
| 5933 | $L_{A173}$ | $L_{B42}$ |
| 5934 | $L_{A174}$ | $L_{B42}$ |
| 5935 | $L_{A175}$ | $L_{B42}$ |
| 5936 | $L_{A176}$ | $L_{B42}$ |
| 5937 | $L_{A177}$ | $L_{B42}$ |
| 5938 | $L_{A178}$ | $L_{B42}$ |
| 5939 | $L_{A179}$ | $L_{B42}$ |
| 5940 | $L_{A180}$ | $L_{B42}$ |
| 5941 | $L_{A181}$ | $L_{B42}$ |
| 5942 | $L_{A182}$ | $L_{B42}$ |
| 5943 | $L_{A183}$ | $L_{B42}$ |
| 5944 | $L_{A184}$ | $L_{B42}$ |
| 5945 | $L_{A185}$ | $L_{B42}$ |
| 5946 | $L_{A186}$ | $L_{B42}$ |
| 5947 | $L_{A187}$ | $L_{B42}$ |
| 5948 | $L_{A188}$ | $L_{B42}$ |
| 5949 | $L_{A189}$ | $L_{B42}$ |
| 5950 | $L_{A190}$ | $L_{B42}$ |
| 5951 | $L_{A191}$ | $L_{B42}$ |
| 5952 | $L_{A192}$ | $L_{B42}$ |
| 5953 | $L_{A193}$ | $L_{B42}$ |
| 5954 | $L_{A194}$ | $L_{B42}$ |
| 5955 | $L_{A195}$ | $L_{B42}$ |
| 5956 | $L_{A196}$ | $L_{B42}$ |
| 5957 | $L_{A197}$ | $L_{B42}$ |
| 5958 | $L_{A198}$ | $L_{B42}$ |
| 5959 | $L_{A199}$ | $L_{B42}$ |
| 5960 | $L_{A200}$ | $L_{B42}$ |
| 5961 | $L_{A201}$ | $L_{B42}$ |
| 5962 | $L_{A202}$ | $L_{B42}$ |
| 5963 | $L_{A203}$ | $L_{B42}$ |
| 5964 | $L_{A204}$ | $L_{B42}$ |
| 5965 | $L_{A205}$ | $L_{B42}$ |
| 5966 | $L_{A206}$ | $L_{B42}$ |
| 5967 | $L_{A207}$ | $L_{B42}$ |
| 5968 | $L_{A208}$ | $L_{B42}$ |
| 5969 | $L_{A209}$ | $L_{B42}$ |
| 5970 | $L_{A210}$ | $L_{B42}$ |
| 5971 | $L_{A211}$ | $L_{B42}$ |
| 5972 | $L_{A212}$ | $L_{B42}$ |
| 5973 | $L_{A213}$ | $L_{B42}$ |
| 5974 | $L_{A214}$ | $L_{B42}$ |
| 5975 | $L_{A215}$ | $L_{B42}$ |
| 5976 | $L_{A216}$ | $L_{B42}$ |
| 5977 | $L_{A217}$ | $L_{B42}$ |
| 5978 | $L_{A218}$ | $L_{B42}$ |
| 5979 | $L_{A219}$ | $L_{B42}$ |
| 5980 | $L_{A220}$ | $L_{B42}$ |
| 5981 | $L_{A221}$ | $L_{B42}$ |
| 5982 | $L_{A222}$ | $L_{B42}$ |
| 5983 | $L_{A223}$ | $L_{B42}$ |
| 5984 | $L_{A224}$ | $L_{B42}$ |
| 5985 | $L_{A225}$ | $L_{B42}$ |
| 5986 | $L_{A226}$ | $L_{B42}$ |
| 5987 | $L_{A227}$ | $L_{B42}$ |
| 5988 | $L_{A228}$ | $L_{B42}$ |
| 5989 | $L_{A229}$ | $L_{B42}$ |
| 5990 | $L_{A230}$ | $L_{B42}$ |
| 5991 | $L_{A231}$ | $L_{B42}$ |
| 5992 | $L_{A232}$ | $L_{B42}$ |
| 5993 | $L_{A233}$ | $L_{B42}$ |
| 5994 | $L_{A234}$ | $L_{B42}$ |
| 5995 | $L_{A235}$ | $L_{B42}$ |
| 5996 | $L_{A236}$ | $L_{B42}$ |

TABLE 3-continued

| Compound Number | $L_A$ | $L_B$ |
|---|---|---|
| 5997 | $L_{A237}$ | $L_{B42}$ |
| 5998 | $L_{A238}$ | $L_{B42}$ |
| 5999 | $L_{A239}$ | $L_{B42}$ |
| 6000 | $L_{A240}$ | $L_{B42}$ |
| 6001 | $L_{A241}$ | $L_{B42}$ |
| 6002 | $L_{A242}$ | $L_{B42}$ |
| 6003 | $L_{A243}$ | $L_{B42}$ |
| 6004 | $L_{A244}$ | $L_{B42}$ |
| 6005 | $L_{A245}$ | $L_{B42}$ |
| 6006 | $L_{A246}$ | $L_{B42}$ |
| 6007 | $L_{A247}$ | $L_{B42}$ |
| 6008 | $L_{A248}$ | $L_{B42}$ |
| 6009 | $L_{A249}$ | $L_{B42}$ |
| 6010 | $L_{A250}$ | $L_{B42}$ |
| 6011 | $L_{A251}$ | $L_{B42}$ |
| 6012 | $L_{A252}$ | $L_{B42}$ |
| 6013 | $L_{A253}$ | $L_{B42}$ |
| 6014 | $L_{A254}$ | $L_{B42}$ |
| 6015 | $L_{A255}$ | $L_{B42}$ |
| 6016 | $L_{A256}$ | $L_{B42}$ |
| 6017 | $L_{A257}$ | $L_{B42}$ |
| 6018 | $L_{A258}$ | $L_{B42}$ |
| 6019 | $L_{A259}$ | $L_{B42}$ |
| 6020 | $L_{A260}$ | $L_{B42}$ |
| 6021 | $L_{A261}$ | $L_{B42}$ |
| 6022 | $L_{A262}$ | $L_{B42}$ |
| 6023 | $L_{A263}$ | $L_{B42}$ |
| 6024 | $L_{A264}$ | $L_{B42}$ |
| 6025 | $L_{A265}$ | $L_{B42}$ |
| 6026 | $L_{A266}$ | $L_{B42}$ |
| 6027 | $L_{A267}$ | $L_{B42}$ |
| 6028 | $L_{A268}$ | $L_{B42}$ |
| 6029 | $L_{A269}$ | $L_{B42}$ |
| 6030 | $L_{A270}$ | $L_{B42}$ |
| 6031 | $L_{A271}$ | $L_{B42}$ |
| 6032 | $L_{A272}$ | $L_{B42}$ |
| 6033 | $L_{A273}$ | $L_{B42}$ |
| 6034 | $L_{A274}$ | $L_{B42}$ |
| 6035 | $L_{A275}$ | $L_{B42}$ |
| 6036 | $L_{A276}$ | $L_{B42}$ |
| 6037 | $L_{A277}$ | $L_{B42}$ |
| 6038 | $L_{A278}$ | $L_{B42}$ |
| 6039 | $L_{A279}$ | $L_{B42}$ |
| 6040 | $L_{A280}$ | $L_{B42}$ |
| 6041 | $L_{A281}$ | $L_{B42}$ |
| 6042 | $L_{A282}$ | $L_{B42}$ |
| 6043 | $L_{A283}$ | $L_{B42}$ |
| 6044 | $L_{A284}$ | $L_{B42}$ |
| 6045 | $L_{A285}$ | $L_{B42}$ |
| 6046 | $L_{A286}$ | $L_{B42}$ |
| 6047 | $L_{A287}$ | $L_{B42}$ |
| 6048 | $L_{A288}$ | $L_{B42}$ |
| 6049 | $L_{A289}$ | $L_{B42}$ |
| 6050 | $L_{A290}$ | $L_{B42}$ |
| 6051 | $L_{A291}$ | $L_{B42}$ |
| 6052 | $L_{A292}$ | $L_{B42}$ |
| 6053 | $L_{A293}$ | $L_{B42}$ |
| 6054 | $L_{A294}$ | $L_{B42}$ |
| 6055 | $L_{A295}$ | $L_{B42}$ |
| 6056 | $L_{A296}$ | $L_{B42}$ |
| 6057 | $L_{A297}$ | $L_{B42}$ |
| 6058 | $L_{A298}$ | $L_{B42}$ |
| 6059 | $L_{A299}$ | $L_{B42}$ |
| 6060 | $L_{A300}$ | $L_{B42}$ |
| 6061 | $L_{A301}$ | $L_{B42}$ |
| 6062 | $L_{A302}$ | $L_{B42}$ |
| 6063 | $L_{A303}$ | $L_{B42}$ |
| 6064 | $L_{A304}$ | $L_{B42}$ |
| 6065 | $L_{A305}$ | $L_{B42}$ |
| 6066 | $L_{A306}$ | $L_{B42}$ |
| 6067 | $L_{A307}$ | $L_{B42}$ |
| 6068 | $L_{A308}$ | $L_{B42}$ |
| 6069 | $L_{A309}$ | $L_{B42}$ |
| 6070 | $L_{A310}$ | $L_{B42}$ |
| 6071 | $L_{A311}$ | $L_{B42}$ |
| 6072 | $L_{A312}$ | $L_{B42}$ |
| 6073 | $L_{A313}$ | $L_{B42}$ |
| 6074 | $L_{A314}$ | $L_{B42}$ |
| 6075 | $L_{A315}$ | $L_{B42}$ |
| 6076 | $L_{A316}$ | $L_{B42}$ |
| 6077 | $L_{A317}$ | $L_{B42}$ |
| 6078 | $L_{A318}$ | $L_{B42}$ |
| 6079 | $L_{A319}$ | $L_{B42}$ |
| 6080 | $L_{A320}$ | $L_{B42}$ |
| 6081 | $L_{A321}$ | $L_{B42}$ |
| 6082 | $L_{A322}$ | $L_{B42}$ |
| 6083 | $L_{A323}$ | $L_{B42}$ |
| 6084 | $L_{A324}$ | $L_{B42}$ |
| 6085 | $L_{A325}$ | $L_{B42}$ |
| 6086 | $L_{A326}$ | $L_{B42}$ |
| 6087 | $L_{A327}$ | $L_{B42}$ |
| 6088 | $L_{A328}$ | $L_{B42}$ |
| 6089 | $L_{A329}$ | $L_{B42}$ |
| 6090 | $L_{A330}$ | $L_{B42}$ |
| 6091 | $L_{A331}$ | $L_{B42}$ |
| 6092 | $L_{A332}$ | $L_{B42}$ |
| 6093 | $L_{A333}$ | $L_{B42}$ |
| 6094 | $L_{A334}$ | $L_{B42}$ |
| 6095 | $L_{A335}$ | $L_{B42}$ |
| 6096 | $L_{A336}$ | $L_{B42}$ |
| 6097 | $L_{A337}$ | $L_{B42}$ |
| 6098 | $L_{A338}$ | $L_{B42}$ |
| 6099 | $L_{A339}$ | $L_{B42}$ |
| 6100 | $L_{A340}$ | $L_{B42}$ |
| 6101 | $L_{A341}$ | $L_{B42}$ |
| 6102 | $L_{A342}$ | $L_{B42}$ |
| 6103 | $L_{A343}$ | $L_{B42}$ |
| 6104 | $L_{A344}$ | $L_{B42}$ |
| 6105 | $L_{A345}$ | $L_{B42}$ |
| 6106 | $L_{A346}$ | $L_{B42}$ |
| 6107 | $L_{A347}$ | $L_{B42}$ |
| 6108 | $L_{A348}$ | $L_{B42}$ |
| 6109 | $L_{A349}$ | $L_{B42}$ |
| 6110 | $L_{A350}$ | $L_{B42}$ |
| 6111 | $L_{A351}$ | $L_{B42}$ |
| 6112 | $L_{A352}$ | $L_{B42}$ |
| 6113 | $L_{A353}$ | $L_{B42}$ |
| 6114 | $L_{A354}$ | $L_{B42}$ |
| 6115 | $L_{A355}$ | $L_{B42}$ |
| 6116 | $L_{A356}$ | $L_{B42}$ |
| 6117 | $L_{A357}$ | $L_{B42}$ |
| 6118 | $L_{A358}$ | $L_{B42}$ |
| 6119 | $L_{A359}$ | $L_{B42}$ |
| 6120 | $L_{A360}$ | $L_{B42}$ |
| 6121 | $L_{A361}$ | $L_{B42}$ |
| 6122 | $L_{A362}$ | $L_{B42}$ |
| 6123 | $L_{A363}$ | $L_{B42}$ |
| 6124 | $L_{A364}$ | $L_{B42}$ |
| 6125 | $L_{A365}$ | $L_{B42}$ |
| 6126 | $L_{A366}$ | $L_{B42}$ |
| 6127 | $L_{A367}$ | $L_{B42}$ |
| 6128 | $L_{A368}$ | $L_{B42}$ |
| 6129 | $L_{A369}$ | $L_{B42}$ |
| 6130 | $L_{A370}$ | $L_{B42}$ |
| 6131 | $L_{A371}$ | $L_{B42}$ |
| 6132 | $L_{A372}$ | $L_{B42}$ |
| 6133 | $L_{A373}$ | $L_{B42}$ |
| 6134 | $L_{A374}$ | $L_{B42}$ |
| 6135 | $L_{A375}$ | $L_{B42}$ |
| 6136 | $L_{A376}$ | $L_{B42}$ |
| 6137 | $L_{A377}$ | $L_{B42}$ |
| 6138 | $L_{A378}$ | $L_{B42}$ |
| 6139 | $L_{A379}$ | $L_{B42}$ |
| 6140 | $L_{A380}$ | $L_{B42}$ |
| 6141 | $L_{A381}$ | $L_{B42}$ |
| 6142 | $L_{A382}$ | $L_{B42}$ |
| 6143 | $L_{A383}$ | $L_{B42}$ |
| 6144 | $L_{A384}$ | $L_{B42}$ |
| 6145 | $L_{A385}$ | $L_{B42}$ |
| 6146 | $L_{A386}$ | $L_{B42}$ |
| 6147 | $L_{A387}$ | $L_{B42}$ |
| 6148 | $L_{A388}$ | $L_{B42}$ |
| 6149 | $L_{A389}$ | $L_{B42}$ |
| 6150 | $L_{A390}$ | $L_{B42}$ |

TABLE 3-continued

| Compound Number | $L_A$ | $L_B$ |
|---|---|---|
| 6151 | $L_{A391}$ | $L_{B42}$ |
| 6152 | $L_{A392}$ | $L_{B42}$ |
| 6153 | $L_{A393}$ | $L_{B42}$ |
| 6154 | $L_{A394}$ | $L_{B42}$ |
| 6155 | $L_{A395}$ | $L_{B42}$ |
| 6156 | $L_{A396}$ | $L_{B42}$ |
| 6157 | $L_{A397}$ | $L_{B42}$ |
| 6158 | $L_{A398}$ | $L_{B42}$ |
| 6159 | $L_{A399}$ | $L_{B42}$ |
| 6160 | $L_{A400}$ | $L_{B42}$ |
| 6161 | $L_{A401}$ | $L_{B42}$ |
| 6162 | $L_{A402}$ | $L_{B42}$ |
| 6163 | $L_{A403}$ | $L_{B42}$ |
| 6164 | $L_{A404}$ | $L_{B42}$ |
| 6165 | $L_{A405}$ | $L_{B42}$ |
| 6166 | $L_{A406}$ | $L_{B42}$ |
| 6167 | $L_{A407}$ | $L_{B42}$ |
| 6168 | $L_{A408}$ | $L_{B42}$ |
| 6169 | $L_{A409}$ | $L_{B42}$ |
| 6170 | $L_{A410}$ | $L_{B42}$ |
| 6171 | $L_{A411}$ | $L_{B42}$ |
| 6172 | $L_{A412}$ | $L_{B42}$ |
| 6173 | $L_{A413}$ | $L_{B42}$ |
| 6174 | $L_{A414}$ | $L_{B42}$ |
| 6175 | $L_{A415}$ | $L_{B42}$ |
| 6176 | $L_{A416}$ | $L_{B42}$ |
| 6177 | $L_{A417}$ | $L_{B42}$ |
| 6178 | $L_{A418}$ | $L_{B42}$ |
| 6179 | $L_{A419}$ | $L_{B42}$ |
| 6180 | $L_{A420}$ | $L_{B42}$ |
| 6181 | $L_{A421}$ | $L_{B42}$ |
| 6182 | $L_{A422}$ | $L_{B42}$ |
| 6183 | $L_{A423}$ | $L_{B42}$ |
| 6184 | $L_{A424}$ | $L_{B42}$ |
| 6185 | $L_{A425}$ | $L_{B42}$ |
| 6186 | $L_{A426}$ | $L_{B42}$ |
| 6187 | $L_{A427}$ | $L_{B42}$ |
| 6188 | $L_{A428}$ | $L_{B42}$ |
| 6189 | $L_{A429}$ | $L_{B42}$ |
| 6190 | $L_{A430}$ | $L_{B42}$ |
| 6191 | $L_{A431}$ | $L_{B42}$ |
| 6192 | $L_{A432}$ | $L_{B42}$ |
| 6193 | $L_{A433}$ | $L_{B42}$ |
| 6194 | $L_{A434}$ | $L_{B42}$ |
| 6195 | $L_{A435}$ | $L_{B42}$ |
| 6196 | $L_{A436}$ | $L_{B42}$ |
| 6197 | $L_{A437}$ | $L_{B42}$ |
| 6198 | $L_{A438}$ | $L_{B42}$ |
| 6199 | $L_{A439}$ | $L_{B42}$ |
| 6200 | $L_{A440}$ | $L_{B42}$ |
| 6201 | $L_{A441}$ | $L_{B42}$ |
| 6202 | $L_{A442}$ | $L_{B42}$ |
| 6203 | $L_{A443}$ | $L_{B42}$ |
| 6204 | $L_{A444}$ | $L_{B42}$ |
| 6205 | $L_{A445}$ | $L_{B42}$ |
| 6206 | $L_{A446}$ | $L_{B42}$ |
| 6207 | $L_{A447}$ | $L_{B42}$ |
| 6208 | $L_{A448}$ | $L_{B42}$ |
| 6209 | $L_{A449}$ | $L_{B42}$ |
| 6210 | $L_{A450}$ | $L_{B42}$ |
| 6211 | $L_{A451}$ | $L_{B42}$ |
| 6212 | $L_{A452}$ | $L_{B42}$ |
| 6213 | $L_{A453}$ | $L_{B42}$ |
| 6214 | $L_{A454}$ | $L_{B42}$ |
| 6215 | $L_{A455}$ | $L_{B42}$ |
| 6216 | $L_{A456}$ | $L_{B42}$ |
| 6217 | $L_{A457}$ | $L_{B42}$ |
| 6218 | $L_{A458}$ | $L_{B42}$ |
| 6219 | $L_{A459}$ | $L_{B42}$ |
| 6220 | $L_{A460}$ | $L_{B42}$ |
| 6221 | $L_{A461}$ | $L_{B42}$ |
| 6222 | $L_{A462}$ | $L_{B42}$ |
| 6223 | $L_{A463}$ | $L_{B42}$ |
| 6224 | $L_{A464}$ | $L_{B42}$ |
| 6225 | $L_{A465}$ | $L_{B42}$ |
| 6226 | $L_{A466}$ | $L_{B42}$ |
| 6227 | $L_{A467}$ | $L_{B42}$ |

TABLE 3-continued

| Compound Number | $L_A$ | $L_B$ |
|---|---|---|
| 6228 | $L_{A468}$ | $L_{B42}$ |
| 6229 | $L_{A469}$ | $L_{B42}$ |
| 6230 | $L_{A470}$ | $L_{B42}$ |
| 6231 | $L_{A471}$ | $L_{B42}$ |
| 6232 | $L_{A472}$ | $L_{B42}$ |
| 6233 | $L_{A473}$ | $L_{B42}$ |
| 6234 | $L_{A474}$ | $L_{B42}$ |
| 6235 | $L_{A475}$ | $L_{B42}$ |
| 6236 | $L_{A476}$ | $L_{B42}$ |
| 6237 | $L_{A477}$ | $L_{B42}$ |
| 6238 | $L_{A478}$ | $L_{B42}$ |
| 6239 | $L_{A479}$ | $L_{B42}$ |
| 6240 | $L_{A480}$ | $L_{B42}$ |
| 6241 | $L_{A481}$ | $L_{B42}$ |
| 6242 | $L_{A482}$ | $L_{B42}$ |
| 6243 | $L_{A483}$ | $L_{B42}$ |
| 6244 | $L_{A484}$ | $L_{B42}$ |
| 6245 | $L_{A485}$ | $L_{B42}$ |
| 6246 | $L_{A486}$ | $L_{B42}$ |
| 6247 | $L_{A487}$ | $L_{B42}$ |
| 6248 | $L_{A488}$ | $L_{B42}$ |
| 6249 | $L_{A489}$ | $L_{B42}$ |
| 6250 | $L_{A490}$ | $L_{B42}$ |
| 6251 | $L_{A491}$ | $L_{B42}$ |
| 6252 | $L_{A492}$ | $L_{B42}$ |
| 6253 | $L_{A493}$ | $L_{B42}$ |
| 6254 | $L_{A494}$ | $L_{B42}$ |
| 6255 | $L_{A495}$ | $L_{B42}$ |
| 6256 | $L_{A496}$ | $L_{B42}$ |
| 6257 | $L_{A497}$ | $L_{B42}$ |
| 6258 | $L_{A498}$ | $L_{B42}$ |
| 6259 | $L_{A499}$ | $L_{B42}$ |
| 6260 | $L_{A500}$ | $L_{B42}$ |
| 6261 | $L_{A501}$ | $L_{B42}$ |
| 6262 | $L_{A502}$ | $L_{B42}$ |
| 6263 | $L_{A503}$ | $L_{B42}$ |
| 6264 | $L_{A504}$ | $L_{B42}$ |
| 6265 | $L_{A505}$ | $L_{B42}$ |
| 6266 | $L_{A506}$ | $L_{B42}$ |
| 6267 | $L_{A507}$ | $L_{B42}$ |
| 6268 | $L_{A508}$ | $L_{B42}$ |
| 6269 | $L_{A509}$ | $L_{B42}$ |
| 6270 | $L_{A510}$ | $L_{B42}$ |
| 6271 | $L_{A511}$ | $L_{B42}$ |
| 6272 | $L_{A512}$ | $L_{B42}$ |
| 6273 | $L_{A513}$ | $L_{B42}$ |
| 6274 | $L_{A514}$ | $L_{B42}$ |
| 6275 | $L_{A515}$ | $L_{B42}$ |
| 6276 | $L_{A516}$ | $L_{B42}$ |
| 6277 | $L_{A517}$ | $L_{B42}$ |
| 6278 | $L_{A518}$ | $L_{B42}$ |
| 6279 | $L_{A519}$ | $L_{B42}$ |
| 6280 | $L_{A520}$ | $L_{B42}$ |
| 6281 | $L_{A521}$ | $L_{B42}$ |
| 6282 | $L_{A522}$ | $L_{B42}$ |
| 6283 | $L_{A523}$ | $L_{B42}$ |
| 6284 | $L_{A524}$ | $L_{B42}$ |
| 6285 | $L_{A525}$ | $L_{B42}$ |
| 6286 | $L_{A526}$ | $L_{B42}$ |
| 6287 | $L_{A527}$ | $L_{B42}$ |
| 6288 | $L_{A528}$ | $L_{B42}$ |
| 6289 | $L_{A529}$ | $L_{B42}$ |
| 6290 | $L_{A530}$ | $L_{B42}$ |
| 6291 | $L_{A531}$ | $L_{B42}$ |
| 6292 | $L_{A532}$ | $L_{B42}$ |
| 6293 | $L_{A533}$ | $L_{B42}$ |
| 6294 | $L_{A534}$ | $L_{B42}$ |
| 6295 | $L_{A535}$ | $L_{B42}$ |
| 6296 | $L_{A536}$ | $L_{B42}$ |
| 6297 | $L_{A537}$ | $L_{B42}$ |
| 6298 | $L_{A538}$ | $L_{B42}$ |
| 6299 | $L_{A539}$ | $L_{B42}$ |
| 6300 | $L_{A540}$ | $L_{B42}$ |
| 6301 | $L_{A541}$ | $L_{B42}$ |
| 6302 | $L_{A542}$ | $L_{B42}$ |
| 6303 | $L_{A543}$ | $L_{B42}$ |
| 6304 | $L_{A544}$ | $L_{B42}$ |

TABLE 3-continued

| Compound Number | $L_A$ | $L_B$ |
|---|---|---|
| 6305 | $L_{A545}$ | $L_{B42}$ |
| 6306 | $L_{A546}$ | $L_{B42}$ |
| 6307 | $L_{A547}$ | $L_{B42}$ |
| 6308 | $L_{A548}$ | $L_{B42}$ |
| 6309 | $L_{A549}$ | $L_{B42}$ |
| 6310 | $L_{A550}$ | $L_{B42}$ |
| 6311 | $L_{A551}$ | $L_{B42}$ |
| 6312 | $L_{A552}$ | $L_{B42}$ |
| 6313 | $L_{A553}$ | $L_{B42}$ |
| 6314 | $L_{A554}$ | $L_{B42}$ |
| 6315 | $L_{A555}$ | $L_{B42}$ |
| 6316 | $L_{A556}$ | $L_{B42}$ |
| 6317 | $L_{A557}$ | $L_{B42}$ |
| 6318 | $L_{A558}$ | $L_{B42}$ |
| 6319 | $L_{A559}$ | $L_{B42}$ |
| 6320 | $L_{A560}$ | $L_{B42}$ |
| 6321 | $L_{A561}$ | $L_{B42}$ |
| 6322 | $L_{A562}$ | $L_{B42}$ |
| 6323 | $L_{A563}$ | $L_{B42}$ |
| 6324 | $L_{A564}$ | $L_{B42}$ |
| 6325 | $L_{A565}$ | $L_{B42}$ |
| 6326 | $L_{A566}$ | $L_{B42}$ |
| 6327 | $L_{A567}$ | $L_{B42}$ |
| 6328 | $L_{A568}$ | $L_{B42}$ |
| 6329 | $L_{A569}$ | $L_{B42}$ |
| 6330 | $L_{A570}$ | $L_{B42}$ |
| 6331 | $L_{A571}$ | $L_{B42}$ |
| 6332 | $L_{A572}$ | $L_{B42}$ |
| 6333 | $L_{A573}$ | $L_{B42}$ |
| 6334 | $L_{A574}$ | $L_{B42}$ |
| 6335 | $L_{A575}$ | $L_{B42}$ |
| 6336 | $L_{A576}$ | $L_{B42}$ |
| 6337 | $L_{A577}$ | $L_{B42}$ |
| 6338 | $L_{A578}$ | $L_{B42}$ |
| 6339 | $L_{A579}$ | $L_{B42}$ |
| 6340 | $L_{A580}$ | $L_{B42}$ |
| 6341 | $L_{A581}$ | $L_{B42}$ |
| 6342 | $L_{A582}$ | $L_{B42}$ |
| 6343 | $L_{A583}$ | $L_{B42}$ |
| 6344 | $L_{A584}$ | $L_{B42}$ |
| 6345 | $L_{A585}$ | $L_{B42}$ |
| 6346 | $L_{A586}$ | $L_{B42}$ |
| 6347 | $L_{A587}$ | $L_{B42}$ |
| 6348 | $L_{A588}$ | $L_{B42}$ |
| 6349 | $L_{A589}$ | $L_{B42}$ |
| 6350 | $L_{A590}$ | $L_{B42}$ |
| 6351 | $L_{A591}$ | $L_{B42}$ |
| 6352 | $L_{A592}$ | $L_{B42}$ |
| 6353 | $L_{A593}$ | $L_{B42}$ |
| 6354 | $L_{A594}$ | $L_{B42}$ |
| 6355 | $L_{A595}$ | $L_{B42}$ |
| 6356 | $L_{A596}$ | $L_{B42}$ |
| 6357 | $L_{A597}$ | $L_{B42}$ |
| 6358 | $L_{A598}$ | $L_{B42}$ |
| 6359 | $L_{A599}$ | $L_{B42}$ |
| 6360 | $L_{A600}$ | $L_{B42}$ |
| 6361 | $L_{A601}$ | $L_{B42}$ |
| 6362 | $L_{A602}$ | $L_{B42}$ |
| 6363 | $L_{A603}$ | $L_{B42}$ |
| 6364 | $L_{A604}$ | $L_{B42}$ |
| 6365 | $L_{A605}$ | $L_{B42}$ |
| 6366 | $L_{A606}$ | $L_{B42}$ |
| 6367 | $L_{A607}$ | $L_{B42}$ |
| 6368 | $L_{A608}$ | $L_{B42}$ |
| 6369 | $L_{A609}$ | $L_{B42}$ |
| 6370 | $L_{A610}$ | $L_{B42}$ |
| 6371 | $L_{A611}$ | $L_{B42}$ |
| 6372 | $L_{A612}$ | $L_{B42}$ |
| 6373 | $L_{A613}$ | $L_{B42}$ |
| 6374 | $L_{A614}$ | $L_{B42}$ |
| 6375 | $L_{A615}$ | $L_{B42}$ |
| 6376 | $L_{A616}$ | $L_{B42}$ |
| 6377 | $L_{A617}$ | $L_{B42}$ |
| 6378 | $L_{A618}$ | $L_{B42}$ |
| 6379 | $L_{A619}$ | $L_{B42}$ |
| 6380 | $L_{A620}$ | $L_{B42}$ |
| 6381 | $L_{A621}$ | $L_{B42}$ |

TABLE 3-continued

| Compound Number | $L_A$ | $L_B$ |
|---|---|---|
| 6382 | $L_{A622}$ | $L_{B42}$ |
| 6383 | $L_{A623}$ | $L_{B42}$ |
| 6384 | $L_{A624}$ | $L_{B42}$ |
| 6385 | $L_{A625}$ | $L_{B42}$ |
| 6386 | $L_{A626}$ | $L_{B42}$ |
| 6387 | $L_{A627}$ | $L_{B42}$ |
| 6388 | $L_{A628}$ | $L_{B42}$ |
| 6389 | $L_{A629}$ | $L_{B42}$ |
| 6390 | $L_{A630}$ | $L_{B42}$ |
| 6391 | $L_{A631}$ | $L_{B42}$ |
| 6392 | $L_{A632}$ | $L_{B42}$ |
| 6393 | $L_{A633}$ | $L_{B42}$ |
| 6394 | $L_{A634}$ | $L_{B42}$ |
| 6395 | $L_{A635}$ | $L_{B42}$ |
| 6396 | $L_{A636}$ | $L_{B42}$ |
| 6397 | $L_{A637}$ | $L_{B42}$ |
| 6398 | $L_{A638}$ | $L_{B42}$ |
| 6399 | $L_{A639}$ | $L_{B42}$ |
| 6400 | $L_{A640}$ | $L_{B42}$ |
| 6401 | $L_{A641}$ | $L_{B42}$ |
| 6402 | $L_{A642}$ | $L_{B42}$ |
| 6403 | $L_{A643}$ | $L_{B42}$ |
| 6404 | $L_{A644}$ | $L_{B42}$ |
| 6405 | $L_{A645}$ | $L_{B42}$ |
| 6406 | $L_{A646}$ | $L_{B42}$ |
| 6407 | $L_{A647}$ | $L_{B42}$ |
| 6408 | $L_{A648}$ | $L_{B42}$ |
| 6409 | $L_{A649}$ | $L_{B42}$ |
| 6410 | $L_{A650}$ | $L_{B42}$ |
| 6411 | $L_{A651}$ | $L_{B42}$ |
| 6412 | $L_{A652}$ | $L_{B42}$ |
| 6413 | $L_{A653}$ | $L_{B42}$ |
| 6414 | $L_{A654}$ | $L_{B42}$ |
| 6415 | $L_{A655}$ | $L_{B42}$ |
| 6416 | $L_{A656}$ | $L_{B42}$ |
| 6417 | $L_{A657}$ | $L_{B42}$ |
| 6418 | $L_{A658}$ | $L_{B42}$ |
| 6419 | $L_{A659}$ | $L_{B42}$ |
| 6420 | $L_{A660}$ | $L_{B42}$ |
| 6421 | $L_{A661}$ | $L_{B42}$ |
| 6422 | $L_{A662}$ | $L_{B42}$ |
| 6423 | $L_{A663}$ | $L_{B42}$ |
| 6424 | $L_{A664}$ | $L_{B42}$ |
| 6425 | $L_{A665}$ | $L_{B42}$ |
| 6426 | $L_{A666}$ | $L_{B42}$ |
| 6427 | $L_{A667}$ | $L_{B42}$ |
| 6428 | $L_{A668}$ | $L_{B42}$ |
| 6429 | $L_{A669}$ | $L_{B42}$ |
| 6430 | $L_{A670}$ | $L_{B42}$ |
| 6431 | $L_{A671}$ | $L_{B42}$ |
| 6432 | $L_{A672}$ | $L_{B42}$ |
| 6433 | $L_{A673}$ | $L_{B42}$ |
| 6434 | $L_{A674}$ | $L_{B42}$ |
| 6435 | $L_{A675}$ | $L_{B42}$ |
| 6436 | $L_{A676}$ | $L_{B42}$ |
| 6437 | $L_{A677}$ | $L_{B42}$ |
| 6438 | $L_{A678}$ | $L_{B42}$ |
| 6439 | $L_{A679}$ | $L_{B42}$ |
| 6440 | $L_{A680}$ | $L_{B42}$ |
| 6441 | $L_{A681}$ | $L_{B42}$ |
| 6442 | $L_{A682}$ | $L_{B42}$ |
| 6443 | $L_{A683}$ | $L_{B42}$ |
| 6444 | $L_{A684}$ | $L_{B42}$ |
| 6445 | $L_{A685}$ | $L_{B42}$ |
| 6446 | $L_{A686}$ | $L_{B42}$ |
| 6447 | $L_{A687}$ | $L_{B42}$ |
| 6448 | $L_{A688}$ | $L_{B42}$ |
| 6449 | $L_{A689}$ | $L_{B42}$ |
| 6450 | $L_{A690}$ | $L_{B42}$ |
| 6451 | $L_{A691}$ | $L_{B42}$ |
| 6452 | $L_{A692}$ | $L_{B42}$ |
| 6453 | $L_{A693}$ | $L_{B42}$ |
| 6454 | $L_{A694}$ | $L_{B42}$ |
| 6455 | $L_{A695}$ | $L_{B42}$ |
| 6456 | $L_{A696}$ | $L_{B42}$ |
| 6457 | $L_{A697}$ | $L_{B42}$ |
| 6458 | $L_{A698}$ | $L_{B42}$ |

TABLE 3-continued

| Compound Number | $L_A$ | $L_B$ |
|---|---|---|
| 6459 | $L_{A699}$ | $L_{B42}$ |
| 6460 | $L_{A700}$ | $L_{B42}$ |
| 6461 | $L_{A701}$ | $L_{B42}$ |
| 6462 | $L_{A702}$ | $L_{B42}$ |
| 6463 | $L_{A703}$ | $L_{B42}$ |
| 6464 | $L_{A704}$ | $L_{B42}$ |
| 6465 | $L_{A705}$ | $L_{B42}$ |
| 6466 | $L_{A706}$ | $L_{B42}$ |
| 6467 | $L_{A707}$ | $L_{B42}$ |
| 6468 | $L_{A708}$ | $L_{B42}$ |
| 6469 | $L_{A709}$ | $L_{B42}$ |
| 6470 | $L_{A710}$ | $L_{B42}$ |
| 6471 | $L_{A711}$ | $L_{B42}$ |
| 6472 | $L_{A712}$ | $L_{B42}$ |
| 6473 | $L_{A713}$ | $L_{B42}$ |
| 6474 | $L_{A714}$ | $L_{B42}$ |
| 6475 | $L_{A715}$ | $L_{B42}$ |
| 6476 | $L_{A716}$ | $L_{B42}$ |
| 6477 | $L_{A717}$ | $L_{B42}$ |
| 6478 | $L_{A718}$ | $L_{B42}$ |
| 6479 | $L_{A719}$ | $L_{B42}$ |
| 6480 | $L_{A720}$ | $L_{B42}$ |
| 6481 | $L_{A721}$ | $L_{B42}$ |
| 6482 | $L_{A722}$ | $L_{B42}$ |
| 6483 | $L_{A723}$ | $L_{B42}$ |
| 6484 | $L_{A724}$ | $L_{B42}$ |
| 6485 | $L_{A725}$ | $L_{B42}$ |
| 6486 | $L_{A726}$ | $L_{B42}$ |
| 6487 | $L_{A727}$ | $L_{B42}$ |
| 6488 | $L_{A728}$ | $L_{B42}$ |
| 6489 | $L_{A729}$ | $L_{B42}$ |
| 6490 | $L_{A730}$ | $L_{B42}$ |
| 6491 | $L_{A731}$ | $L_{B42}$ |
| 6492 | $L_{A732}$ | $L_{B42}$ |
| 6493 | $L_{A733}$ | $L_{B42}$ |
| 6494 | $L_{A734}$ | $L_{B42}$ |
| 6495 | $L_{A735}$ | $L_{B42}$ |
| 6496 | $L_{A736}$ | $L_{B42}$ |
| 6497 | $L_{A737}$ | $L_{B42}$ |
| 6498 | $L_{A738}$ | $L_{B42}$ |
| 6499 | $L_{A739}$ | $L_{B42}$ |
| 6500 | $L_{A740}$ | $L_{B42}$ |
| 6501 | $L_{A741}$ | $L_{B42}$ |
| 6502 | $L_{A742}$ | $L_{B42}$ |
| 6503 | $L_{A743}$ | $L_{B42}$ |
| 6504 | $L_{A744}$ | $L_{B42}$ |
| 6505 | $L_{A745}$ | $L_{B42}$ |
| 6506 | $L_{A746}$ | $L_{B42}$ |
| 6507 | $L_{A747}$ | $L_{B42}$ |
| 6508 | $L_{A748}$ | $L_{B42}$ |
| 6509 | $L_{A749}$ | $L_{B42}$ |
| 6510 | $L_{A750}$ | $L_{B42}$ |
| 6511 | $L_{A751}$ | $L_{B42}$ |
| 6512 | $L_{A752}$ | $L_{B42}$ |
| 6513 | $L_{A753}$ | $L_{B42}$ |
| 6514 | $L_{A754}$ | $L_{B42}$ |
| 6515 | $L_{A755}$ | $L_{B42}$ |
| 6516 | $L_{A756}$ | $L_{B42}$ |
| 6517 | $L_{A757}$ | $L_{B42}$ |
| 6518 | $L_{A758}$ | $L_{B42}$ |
| 6519 | $L_{A759}$ | $L_{B42}$ |
| 6520 | $L_{A760}$ | $L_{B42}$ |
| 6521 | $L_{A761}$ | $L_{B42}$ |
| 6522 | $L_{A762}$ | $L_{B42}$ |
| 6523 | $L_{A763}$ | $L_{B42}$ |
| 6524 | $L_{A764}$ | $L_{B42}$ |
| 6525 | $L_{A765}$ | $L_{B42}$ |
| 6526 | $L_{A766}$ | $L_{B42}$ |
| 6527 | $L_{A767}$ | $L_{B42}$ |
| 6528 | $L_{A768}$ | $L_{B42}$ |
| 6529 | $L_{A769}$ | $L_{B42}$ |
| 6530 | $L_{A770}$ | $L_{B42}$ |
| 6531 | $L_{A771}$ | $L_{B42}$ |
| 6532 | $L_{A772}$ | $L_{B42}$ |
| 6533 | $L_{A773}$ | $L_{B42}$ |
| 6534 | $L_{A774}$ | $L_{B42}$ |
| 6535 | $L_{A775}$ | $L_{B42}$ |
| 6536 | $L_{A776}$ | $L_{B42}$ |
| 6537 | $L_{A777}$ | $L_{B42}$ |
| 6538 | $L_{A778}$ | $L_{B42}$ |
| 6539 | $L_{A779}$ | $L_{B42}$ |
| 6540 | $L_{A780}$ | $L_{B42}$ |
| 6541 | $L_{A781}$ | $L_{B42}$ |
| 6542 | $L_{A782}$ | $L_{B42}$ |
| 6543 | $L_{A783}$ | $L_{B42}$ |
| 6544 | $L_{A784}$ | $L_{B42}$ |
| 6545 | $L_{A785}$ | $L_{B42}$ |
| 6546 | $L_{A786}$ | $L_{B42}$ |
| 6547 | $L_{A787}$ | $L_{B42}$ |
| 6548 | $L_{A788}$ | $L_{B42}$ |
| 6549 | $L_{A789}$ | $L_{B42}$ |
| 6550 | $L_{A790}$ | $L_{B42}$ |
| 6551 | $L_{A791}$ | $L_{B42}$ |
| 6552 | $L_{A792}$ | $L_{B42}$ |
| 6553 | $L_{A793}$ | $L_{B42}$ |
| 6554 | $L_{A794}$ | $L_{B42}$ |
| 6555 | $L_{A795}$ | $L_{B42}$ |
| 6556 | $L_{A796}$ | $L_{B42}$ |
| 6557 | $L_{A797}$ | $L_{B42}$ |
| 6558 | $L_{A798}$ | $L_{B42}$ |
| 6559 | $L_{A799}$ | $L_{B42}$ |
| 6560 | $L_{A800}$ | $L_{B42}$ |
| 6561 | $L_{A801}$ | $L_{B42}$ |
| 6562 | $L_{A802}$ | $L_{B42}$ |
| 6563 | $L_{A803}$ | $L_{B42}$ |
| 6564 | $L_{A804}$ | $L_{B42}$ |
| 6565 | $L_{A805}$ | $L_{B42}$ |
| 6566 | $L_{A806}$ | $L_{B42}$ |
| 6567 | $L_{A807}$ | $L_{B42}$ |
| 6568 | $L_{A808}$ | $L_{B42}$ |
| 6569 | $L_{A809}$ | $L_{B42}$ |
| 6570 | $L_{A810}$ | $L_{B42}$ |
| 6571 | $L_{A811}$ | $L_{B42}$ |
| 6572 | $L_{A812}$ | $L_{B42}$ |
| 6573 | $L_{A813}$ | $L_{B42}$ |
| 6574 | $L_{A814}$ | $L_{B42}$ |
| 6575 | $L_{A815}$ | $L_{B42}$ |
| 6576 | $L_{A816}$ | $L_{B42}$ |
| 6577 | $L_{A817}$ | $L_{B42}$ |
| 6578 | $L_{A818}$ | $L_{B42}$ |
| 6579 | $L_{A819}$ | $L_{B42}$ |
| 6580 | $L_{A820}$ | $L_{B42}$ |
| 6581 | $L_{A821}$ | $L_{B42}$ |
| 6582 | $L_{A822}$ | $L_{B42}$ |
| 6583 | $L_{A823}$ | $L_{B42}$ |
| 6584 | $L_{A824}$ | $L_{B42}$ |
| 6585 | $L_{A825}$ | $L_{B42}$ |
| 6586 | $L_{A826}$ | $L_{B42}$ |
| 6587 | $L_{A827}$ | $L_{B42}$ |
| 6588 | $L_{A828}$ | $L_{B42}$ |
| 6589 | $L_{A829}$ | $L_{B42}$ |
| 6590 | $L_{A830}$ | $L_{B42}$ |
| 6591 | $L_{A831}$ | $L_{B42}$ |
| 6592 | $L_{A832}$ | $L_{B42}$ |
| 6593 | $L_{A833}$ | $L_{B42}$ |
| 6594 | $L_{A834}$ | $L_{B42}$ |
| 6595 | $L_{A835}$ | $L_{B42}$ |
| 6596 | $L_{A836}$ | $L_{B42}$ |
| 6597 | $L_{A837}$ | $L_{B42}$ |
| 6598 | $L_{A838}$ | $L_{B42}$ |
| 6599 | $L_{A839}$ | $L_{B42}$ |
| 6600 | $L_{A840}$ | $L_{B42}$ |
| 6601 | $L_{A841}$ | $L_{B42}$ |
| 6602 | $L_{A842}$ | $L_{B42}$ |
| 6603 | $L_{A843}$ | $L_{B42}$ |
| 6604 | $L_{A844}$ | $L_{B42}$ |
| 6605 | $L_{A845}$ | $L_{B42}$ |
| 6606 | $L_{A846}$ | $L_{B42}$ |
| 6607 | $L_{A847}$ | $L_{B42}$ |
| 6608 | $L_{A848}$ | $L_{B42}$ |
| 6609 | $L_{A849}$ | $L_{B42}$ |
| 6610 | $L_{A850}$ | $L_{B42}$ |
| 6611 | $L_{A851}$ | $L_{B42}$ |
| 6612 | $L_{A852}$ | $L_{B42}$ |

TABLE 3-continued

| Compound Number | $L_A$ | $L_B$ |
|---|---|---|
| 6613 | $L_{A853}$ | $L_{B42}$ |
| 6614 | $L_{A854}$ | $L_{B42}$ |
| 6615 | $L_{A855}$ | $L_{B42}$ |
| 6616 | $L_{A856}$ | $L_{B42}$ |
| 6617 | $L_{A857}$ | $L_{B42}$ |
| 6618 | $L_{A858}$ | $L_{B42}$ |
| 6619 | $L_{A859}$ | $L_{B42}$ |
| 6620 | $L_{A860}$ | $L_{B42}$ |
| 6621 | $L_{A861}$ | $L_{B42}$ |
| 6622 | $L_{A862}$ | $L_{B42}$ |
| 6623 | $L_{A863}$ | $L_{B42}$ |
| 6624 | $L_{A864}$ | $L_{B42}$ |
| 6625 | $L_{A865}$ | $L_{B42}$ |
| 6626 | $L_{A866}$ | $L_{B42}$ |
| 6627 | $L_{A867}$ | $L_{B42}$ |
| 6628 | $L_{A868}$ | $L_{B42}$ |
| 6629 | $L_{A869}$ | $L_{B42}$ |
| 6630 | $L_{A870}$ | $L_{B42}$ |
| 6631 | $L_{A871}$ | $L_{B42}$ |
| 6632 | $L_{A872}$ | $L_{B42}$ |
| 6633 | $L_{A873}$ | $L_{B42}$ |
| 6634 | $L_{A874}$ | $L_{B42}$ |
| 6635 | $L_{A875}$ | $L_{B42}$ |
| 6636 | $L_{A876}$ | $L_{B42}$ |
| 6637 | $L_{A877}$ | $L_{B42}$ |
| 6638 | $L_{A878}$ | $L_{B42}$ |
| 6639 | $L_{A879}$ | $L_{B42}$ |
| 6640 | $L_{A880}$ | $L_{B42}$ |
| 6641 | $L_{A881}$ | $L_{B42}$ |
| 6642 | $L_{A882}$ | $L_{B42}$ |
| 6643 | $L_{A883}$ | $L_{B42}$ |
| 6644 | $L_{A884}$ | $L_{B42}$ |
| 6645 | $L_{A885}$ | $L_{B42}$ |
| 6646 | $L_{A886}$ | $L_{B42}$ |
| 6647 | $L_{A887}$ | $L_{B42}$ |
| 6648 | $L_{A888}$ | $L_{B42}$ |
| 6649 | $L_{A889}$ | $L_{B42}$ |
| 6650 | $L_{A890}$ | $L_{B42}$ |
| 6651 | $L_{A891}$ | $L_{B42}$ |
| 6652 | $L_{A892}$ | $L_{B42}$ |
| 6653 | $L_{A893}$ | $L_{B42}$ |
| 6654 | $L_{A894}$ | $L_{B42}$ |
| 6655 | $L_{A895}$ | $L_{B42}$ |
| 6656 | $L_{A896}$ | $L_{B42}$ |
| 6657 | $L_{A897}$ | $L_{B42}$ |
| 6658 | $L_{A898}$ | $L_{B42}$ |
| 6659 | $L_{A899}$ | $L_{B42}$ |
| 6660 | $L_{A900}$ | $L_{B42}$ |
| 6661 | $L_{A901}$ | $L_{B42}$ |
| 6662 | $L_{A902}$ | $L_{B42}$ |
| 6663 | $L_{A903}$ | $L_{B42}$ |
| 6664 | $L_{A904}$ | $L_{B42}$ |
| 6665 | $L_{A905}$ | $L_{B42}$ |
| 6666 | $L_{A906}$ | $L_{B42}$ |
| 6667 | $L_{A907}$ | $L_{B42}$ |
| 6668 | $L_{A908}$ | $L_{B42}$ |
| 6669 | $L_{A909}$ | $L_{B42}$ |
| 6670 | $L_{A910}$ | $L_{B42}$ |
| 6671 | $L_{A911}$ | $L_{B42}$ |
| 6672 | $L_{A912}$ | $L_{B42}$ |
| 6673 | $L_{A913}$ | $L_{B42}$ |
| 6674 | $L_{A914}$ | $L_{B42}$ |
| 6675 | $L_{A915}$ | $L_{B42}$ |
| 6676 | $L_{A916}$ | $L_{B42}$ |
| 6677 | $L_{A917}$ | $L_{B42}$ |
| 6678 | $L_{A918}$ | $L_{B42}$ |
| 6679 | $L_{A919}$ | $L_{B42}$ |
| 6680 | $L_{A920}$ | $L_{B42}$ |
| 6681 | $L_{A921}$ | $L_{B42}$ |
| 6682 | $L_{A922}$ | $L_{B42}$ |
| 6683 | $L_{A923}$ | $L_{B42}$ |
| 6684 | $L_{A924}$ | $L_{B42}$ |
| 6685 | $L_{A925}$ | $L_{B42}$ |
| 6686 | $L_{A926}$ | $L_{B42}$ |
| 6687 | $L_{A927}$ | $L_{B42}$ |
| 6688 | $L_{A928}$ | $L_{B42}$ |
| 6689 | $L_{A929}$ | $L_{B42}$ |

TABLE 3-continued

| Compound Number | $L_A$ | $L_B$ |
|---|---|---|
| 6690 | $L_{A930}$ | $L_{B42}$ |
| 6691 | $L_{A931}$ | $L_{B42}$ |
| 6692 | $L_{A932}$ | $L_{B42}$ |
| 6693 | $L_{A933}$ | $L_{B42}$ |
| 6694 | $L_{A934}$ | $L_{B42}$ |
| 6695 | $L_{A935}$ | $L_{B42}$ |
| 6696 | $L_{A936}$ | $L_{B42}$ |
| 6697 | $L_{A937}$ | $L_{B42}$ |
| 6698 | $L_{A938}$ | $L_{B42}$ |
| 6699 | $L_{A939}$ | $L_{B42}$ |
| 6700 | $L_{A940}$ | $L_{B42}$ |
| 6701 | $L_{A941}$ | $L_{B42}$ |
| 6702 | $L_{A942}$ | $L_{B42}$ |
| 6703 | $L_{A943}$ | $L_{B42}$ |
| 6704 | $L_{A944}$ | $L_{B42}$ |
| 6705 | $L_{A945}$ | $L_{B42}$ |
| 6706 | $L_{A946}$ | $L_{B42}$ |
| 6707 | $L_{A947}$ | $L_{B42}$ |
| 6708 | $L_{A948}$ | $L_{B42}$ |
| 6709 | $L_{A949}$ | $L_{B42}$ |
| 6710 | $L_{A950}$ | $L_{B42}$ |
| 6711 | $L_{A951}$ | $L_{B42}$ |
| 6712 | $L_{A952}$ | $L_{B42}$ |
| 6713 | $L_{A953}$ | $L_{B42}$ |
| 6714 | $L_{A954}$ | $L_{B42}$ |
| 6715 | $L_{A955}$ | $L_{B42}$ |
| 6716 | $L_{A956}$ | $L_{B42}$ |
| 6717 | $L_{A957}$ | $L_{B42}$ |
| 6718 | $L_{A958}$ | $L_{B42}$ |
| 6719 | $L_{A959}$ | $L_{B42}$ |
| 6720 | $L_{A960}$ | $L_{B42}$ |
| 6721 | $L_{A1}$ | $L_{B43}$ |
| 6722 | $L_{A2}$ | $L_{B43}$ |
| 6723 | $L_{A3}$ | $L_{B43}$ |
| 6724 | $L_{A4}$ | $L_{B43}$ |
| 6725 | $L_{A5}$ | $L_{B43}$ |
| 6726 | $L_{A6}$ | $L_{B43}$ |
| 6727 | $L_{A7}$ | $L_{B43}$ |
| 6728 | $L_{A8}$ | $L_{B43}$ |
| 6729 | $L_{A9}$ | $L_{B43}$ |
| 6730 | $L_{A10}$ | $L_{B43}$ |
| 6731 | $L_{A11}$ | $L_{B43}$ |
| 6732 | $L_{A12}$ | $L_{B43}$ |
| 6733 | $L_{A13}$ | $L_{B43}$ |
| 6734 | $L_{A14}$ | $L_{B43}$ |
| 6735 | $L_{A15}$ | $L_{B43}$ |
| 6736 | $L_{A16}$ | $L_{B43}$ |
| 6737 | $L_{A17}$ | $L_{B43}$ |
| 6738 | $L_{A18}$ | $L_{B43}$ |
| 6739 | $L_{A19}$ | $L_{B43}$ |
| 6740 | $L_{A20}$ | $L_{B43}$ |
| 6741 | $L_{A21}$ | $L_{B43}$ |
| 6742 | $L_{A22}$ | $L_{B43}$ |
| 6743 | $L_{A23}$ | $L_{B43}$ |
| 6744 | $L_{A24}$ | $L_{B43}$ |
| 6745 | $L_{A25}$ | $L_{B43}$ |
| 6746 | $L_{A26}$ | $L_{B43}$ |
| 6747 | $L_{A27}$ | $L_{B43}$ |
| 6748 | $L_{A28}$ | $L_{B43}$ |
| 6749 | $L_{A29}$ | $L_{B43}$ |
| 6750 | $L_{A30}$ | $L_{B43}$ |
| 6751 | $L_{A31}$ | $L_{B43}$ |
| 6752 | $L_{A32}$ | $L_{B43}$ |
| 6753 | $L_{A33}$ | $L_{B43}$ |
| 6754 | $L_{A34}$ | $L_{B43}$ |
| 6755 | $L_{A35}$ | $L_{B43}$ |
| 6756 | $L_{A36}$ | $L_{B43}$ |
| 6757 | $L_{A37}$ | $L_{B43}$ |
| 6758 | $L_{A38}$ | $L_{B43}$ |
| 6759 | $L_{A39}$ | $L_{B43}$ |
| 6760 | $L_{A40}$ | $L_{B43}$ |
| 6761 | $L_{A41}$ | $L_{B43}$ |
| 6762 | $L_{A42}$ | $L_{B43}$ |
| 6763 | $L_{A43}$ | $L_{B43}$ |
| 6764 | $L_{A44}$ | $L_{B43}$ |
| 6765 | $L_{A45}$ | $L_{B43}$ |
| 6766 | $L_{A46}$ | $L_{B43}$ |

TABLE 3-continued

| Compound Number | $L_A$ | $L_B$ |
|---|---|---|
| 6767 | $L_{A47}$ | $L_{B43}$ |
| 6768 | $L_{A48}$ | $L_{B43}$ |
| 6769 | $L_{A49}$ | $L_{B43}$ |
| 6770 | $L_{A50}$ | $L_{B43}$ |
| 6771 | $L_{A51}$ | $L_{B43}$ |
| 6772 | $L_{A52}$ | $L_{B43}$ |
| 6773 | $L_{A53}$ | $L_{B43}$ |
| 6774 | $L_{A54}$ | $L_{B43}$ |
| 6775 | $L_{A55}$ | $L_{B43}$ |
| 6776 | $L_{A56}$ | $L_{B43}$ |
| 6777 | $L_{A57}$ | $L_{B43}$ |
| 6778 | $L_{A58}$ | $L_{B43}$ |
| 6779 | $L_{A59}$ | $L_{B43}$ |
| 6780 | $L_{A60}$ | $L_{B43}$ |
| 6781 | $L_{A61}$ | $L_{B43}$ |
| 6782 | $L_{A62}$ | $L_{B43}$ |
| 6783 | $L_{A63}$ | $L_{B43}$ |
| 6784 | $L_{A64}$ | $L_{B43}$ |
| 6785 | $L_{A65}$ | $L_{B43}$ |
| 6786 | $L_{A66}$ | $L_{B43}$ |
| 6787 | $L_{A67}$ | $L_{B43}$ |
| 6788 | $L_{A68}$ | $L_{B43}$ |
| 6789 | $L_{A69}$ | $L_{B43}$ |
| 6790 | $L_{A70}$ | $L_{B43}$ |
| 6791 | $L_{A71}$ | $L_{B43}$ |
| 6792 | $L_{A72}$ | $L_{B43}$ |
| 6793 | $L_{A73}$ | $L_{B43}$ |
| 6794 | $L_{A74}$ | $L_{B43}$ |
| 6795 | $L_{A75}$ | $L_{B43}$ |
| 6796 | $L_{A76}$ | $L_{B43}$ |
| 6797 | $L_{A77}$ | $L_{B43}$ |
| 6798 | $L_{A78}$ | $L_{B43}$ |
| 6799 | $L_{A79}$ | $L_{B43}$ |
| 6800 | $L_{A80}$ | $L_{B43}$ |
| 6801 | $L_{A81}$ | $L_{B43}$ |
| 6802 | $L_{A82}$ | $L_{B43}$ |
| 6803 | $L_{A83}$ | $L_{B43}$ |
| 6804 | $L_{A84}$ | $L_{B43}$ |
| 6805 | $L_{A85}$ | $L_{B43}$ |
| 6806 | $L_{A86}$ | $L_{B43}$ |
| 6807 | $L_{A87}$ | $L_{B43}$ |
| 6808 | $L_{A88}$ | $L_{B43}$ |
| 6809 | $L_{A89}$ | $L_{B43}$ |
| 6810 | $L_{A90}$ | $L_{B43}$ |
| 6811 | $L_{A91}$ | $L_{B43}$ |
| 6812 | $L_{A92}$ | $L_{B43}$ |
| 6813 | $L_{A93}$ | $L_{B43}$ |
| 6814 | $L_{A94}$ | $L_{B43}$ |
| 6815 | $L_{A95}$ | $L_{B43}$ |
| 6816 | $L_{A96}$ | $L_{B43}$ |
| 6817 | $L_{A97}$ | $L_{B43}$ |
| 6818 | $L_{A98}$ | $L_{B43}$ |
| 6819 | $L_{A99}$ | $L_{B43}$ |
| 6820 | $L_{A100}$ | $L_{B43}$ |
| 6821 | $L_{A101}$ | $L_{B43}$ |
| 6822 | $L_{A102}$ | $L_{B43}$ |
| 6823 | $L_{A103}$ | $L_{B43}$ |
| 6824 | $L_{A104}$ | $L_{B43}$ |
| 6825 | $L_{A105}$ | $L_{B43}$ |
| 6826 | $L_{A106}$ | $L_{B43}$ |
| 6827 | $L_{A107}$ | $L_{B43}$ |
| 6828 | $L_{A108}$ | $L_{B43}$ |
| 6829 | $L_{A109}$ | $L_{B43}$ |
| 6830 | $L_{A110}$ | $L_{B43}$ |
| 6831 | $L_{A111}$ | $L_{B43}$ |
| 6832 | $L_{A112}$ | $L_{B43}$ |
| 6833 | $L_{A113}$ | $L_{B43}$ |
| 6834 | $L_{A114}$ | $L_{B43}$ |
| 6835 | $L_{A115}$ | $L_{B43}$ |
| 6836 | $L_{A116}$ | $L_{B43}$ |
| 6837 | $L_{A117}$ | $L_{B43}$ |
| 6838 | $L_{A118}$ | $L_{B43}$ |
| 6839 | $L_{A119}$ | $L_{B43}$ |
| 6840 | $L_{A120}$ | $L_{B43}$ |
| 6841 | $L_{A121}$ | $L_{B43}$ |
| 6842 | $L_{A122}$ | $L_{B43}$ |
| 6843 | $L_{A123}$ | $L_{B43}$ |
| 6844 | $L_{A124}$ | $L_{B43}$ |
| 6845 | $L_{A125}$ | $L_{B43}$ |
| 6846 | $L_{A126}$ | $L_{B43}$ |
| 6847 | $L_{A127}$ | $L_{B43}$ |
| 6848 | $L_{A128}$ | $L_{B43}$ |
| 6849 | $L_{A129}$ | $L_{B43}$ |
| 6850 | $L_{A130}$ | $L_{B43}$ |
| 6851 | $L_{A131}$ | $L_{B43}$ |
| 6852 | $L_{A132}$ | $L_{B43}$ |
| 6853 | $L_{A133}$ | $L_{B43}$ |
| 6854 | $L_{A134}$ | $L_{B43}$ |
| 6855 | $L_{A135}$ | $L_{B43}$ |
| 6856 | $L_{A136}$ | $L_{B43}$ |
| 6857 | $L_{A137}$ | $L_{B43}$ |
| 6858 | $L_{A138}$ | $L_{B43}$ |
| 6859 | $L_{A139}$ | $L_{B43}$ |
| 6860 | $L_{A140}$ | $L_{B43}$ |
| 6861 | $L_{A141}$ | $L_{B43}$ |
| 6862 | $L_{A142}$ | $L_{B43}$ |
| 6863 | $L_{A143}$ | $L_{B43}$ |
| 6864 | $L_{A144}$ | $L_{B43}$ |
| 6865 | $L_{A145}$ | $L_{B43}$ |
| 6866 | $L_{A146}$ | $L_{B43}$ |
| 6867 | $L_{A147}$ | $L_{B43}$ |
| 6868 | $L_{A148}$ | $L_{B43}$ |
| 6869 | $L_{A149}$ | $L_{B43}$ |
| 6870 | $L_{A150}$ | $L_{B43}$ |
| 6871 | $L_{A151}$ | $L_{B43}$ |
| 6872 | $L_{A152}$ | $L_{B43}$ |
| 6873 | $L_{A153}$ | $L_{B43}$ |
| 6874 | $L_{A154}$ | $L_{B43}$ |
| 6875 | $L_{A155}$ | $L_{B43}$ |
| 6876 | $L_{A156}$ | $L_{B43}$ |
| 6877 | $L_{A157}$ | $L_{B43}$ |
| 6878 | $L_{A158}$ | $L_{B43}$ |
| 6879 | $L_{A159}$ | $L_{B43}$ |
| 6880 | $L_{A160}$ | $L_{B43}$ |
| 6881 | $L_{A161}$ | $L_{B43}$ |
| 6882 | $L_{A162}$ | $L_{B43}$ |
| 6883 | $L_{A163}$ | $L_{B43}$ |
| 6884 | $L_{A164}$ | $L_{B43}$ |
| 6885 | $L_{A165}$ | $L_{B43}$ |
| 6886 | $L_{A166}$ | $L_{B43}$ |
| 6887 | $L_{A167}$ | $L_{B43}$ |
| 6888 | $L_{A168}$ | $L_{B43}$ |
| 6889 | $L_{A169}$ | $L_{B43}$ |
| 6890 | $L_{A170}$ | $L_{B43}$ |
| 6891 | $L_{A171}$ | $L_{B43}$ |
| 6892 | $L_{A172}$ | $L_{B43}$ |
| 6893 | $L_{A173}$ | $L_{B43}$ |
| 6894 | $L_{A174}$ | $L_{B43}$ |
| 6895 | $L_{A175}$ | $L_{B43}$ |
| 6896 | $L_{A176}$ | $L_{B43}$ |
| 6897 | $L_{A177}$ | $L_{B43}$ |
| 6898 | $L_{A178}$ | $L_{B43}$ |
| 6899 | $L_{A179}$ | $L_{B43}$ |
| 6900 | $L_{A180}$ | $L_{B43}$ |
| 6901 | $L_{A181}$ | $L_{B43}$ |
| 6902 | $L_{A182}$ | $L_{B43}$ |
| 6903 | $L_{A183}$ | $L_{B43}$ |
| 6904 | $L_{A184}$ | $L_{B43}$ |
| 6905 | $L_{A185}$ | $L_{B43}$ |
| 6906 | $L_{A186}$ | $L_{B43}$ |
| 6907 | $L_{A187}$ | $L_{B43}$ |
| 6908 | $L_{A188}$ | $L_{B43}$ |
| 6909 | $L_{A189}$ | $L_{B43}$ |
| 6910 | $L_{A190}$ | $L_{B43}$ |
| 6911 | $L_{A191}$ | $L_{B43}$ |
| 6912 | $L_{A192}$ | $L_{B43}$ |
| 6913 | $L_{A193}$ | $L_{B43}$ |
| 6914 | $L_{A194}$ | $L_{B43}$ |
| 6915 | $L_{A195}$ | $L_{B43}$ |
| 6916 | $L_{A196}$ | $L_{B43}$ |
| 6917 | $L_{A197}$ | $L_{B43}$ |
| 6918 | $L_{A198}$ | $L_{B43}$ |
| 6919 | $L_{A199}$ | $L_{B43}$ |
| 6920 | $L_{A200}$ | $L_{B43}$ |

TABLE 3-continued

| Compound Number | $L_A$ | $L_B$ |
|---|---|---|
| 6921 | $L_{A201}$ | $L_{B43}$ |
| 6922 | $L_{A202}$ | $L_{B43}$ |
| 6923 | $L_{A203}$ | $L_{B43}$ |
| 6924 | $L_{A204}$ | $L_{B43}$ |
| 6925 | $L_{A205}$ | $L_{B43}$ |
| 6926 | $L_{A206}$ | $L_{B43}$ |
| 6927 | $L_{A207}$ | $L_{B43}$ |
| 6928 | $L_{A208}$ | $L_{B43}$ |
| 6929 | $L_{A209}$ | $L_{B43}$ |
| 6930 | $L_{A210}$ | $L_{B43}$ |
| 6931 | $L_{A211}$ | $L_{B43}$ |
| 6932 | $L_{A212}$ | $L_{B43}$ |
| 6933 | $L_{A213}$ | $L_{B43}$ |
| 6934 | $L_{A214}$ | $L_{B43}$ |
| 6935 | $L_{A215}$ | $L_{B43}$ |
| 6936 | $L_{A216}$ | $L_{B43}$ |
| 6937 | $L_{A217}$ | $L_{B43}$ |
| 6938 | $L_{A218}$ | $L_{B43}$ |
| 6939 | $L_{A219}$ | $L_{B43}$ |
| 6940 | $L_{A220}$ | $L_{B43}$ |
| 6941 | $L_{A221}$ | $L_{B43}$ |
| 6942 | $L_{A222}$ | $L_{B43}$ |
| 6943 | $L_{A223}$ | $L_{B43}$ |
| 6944 | $L_{A224}$ | $L_{B43}$ |
| 6945 | $L_{A225}$ | $L_{B43}$ |
| 6946 | $L_{A226}$ | $L_{B43}$ |
| 6947 | $L_{A227}$ | $L_{B43}$ |
| 6948 | $L_{A228}$ | $L_{B43}$ |
| 6949 | $L_{A229}$ | $L_{B43}$ |
| 6950 | $L_{A230}$ | $L_{B43}$ |
| 6951 | $L_{A231}$ | $L_{B43}$ |
| 6952 | $L_{A232}$ | $L_{B43}$ |
| 6953 | $L_{A233}$ | $L_{B43}$ |
| 6954 | $L_{A234}$ | $L_{B43}$ |
| 6955 | $L_{A235}$ | $L_{B43}$ |
| 6956 | $L_{A236}$ | $L_{B43}$ |
| 6957 | $L_{A237}$ | $L_{B43}$ |
| 6958 | $L_{A238}$ | $L_{B43}$ |
| 6959 | $L_{A239}$ | $L_{B43}$ |
| 6960 | $L_{A240}$ | $L_{B43}$ |
| 6961 | $L_{A241}$ | $L_{B43}$ |
| 6962 | $L_{A242}$ | $L_{B43}$ |
| 6963 | $L_{A243}$ | $L_{B43}$ |
| 6964 | $L_{A244}$ | $L_{B43}$ |
| 6965 | $L_{A245}$ | $L_{B43}$ |
| 6966 | $L_{A246}$ | $L_{B43}$ |
| 6967 | $L_{A247}$ | $L_{B43}$ |
| 6968 | $L_{A248}$ | $L_{B43}$ |
| 6969 | $L_{A249}$ | $L_{B43}$ |
| 6970 | $L_{A250}$ | $L_{B43}$ |
| 6971 | $L_{A251}$ | $L_{B43}$ |
| 6972 | $L_{A252}$ | $L_{B43}$ |
| 6973 | $L_{A253}$ | $L_{B43}$ |
| 6974 | $L_{A254}$ | $L_{B43}$ |
| 6975 | $L_{A255}$ | $L_{B43}$ |
| 6976 | $L_{A256}$ | $L_{B43}$ |
| 6977 | $L_{A257}$ | $L_{B43}$ |
| 6978 | $L_{A258}$ | $L_{B43}$ |
| 6979 | $L_{A259}$ | $L_{B43}$ |
| 6980 | $L_{A260}$ | $L_{B43}$ |
| 6981 | $L_{A261}$ | $L_{B43}$ |
| 6982 | $L_{A262}$ | $L_{B43}$ |
| 6983 | $L_{A263}$ | $L_{B43}$ |
| 6984 | $L_{A264}$ | $L_{B43}$ |
| 6985 | $L_{A265}$ | $L_{B43}$ |
| 6986 | $L_{A266}$ | $L_{B43}$ |
| 6987 | $L_{A267}$ | $L_{B43}$ |
| 6988 | $L_{A268}$ | $L_{B43}$ |
| 6989 | $L_{A269}$ | $L_{B43}$ |
| 6990 | $L_{A270}$ | $L_{B43}$ |
| 6991 | $L_{A271}$ | $L_{B43}$ |
| 6992 | $L_{A272}$ | $L_{B43}$ |
| 6993 | $L_{A273}$ | $L_{B43}$ |
| 6994 | $L_{A274}$ | $L_{B43}$ |
| 6995 | $L_{A275}$ | $L_{B43}$ |
| 6996 | $L_{A276}$ | $L_{B43}$ |
| 6997 | $L_{A277}$ | $L_{B43}$ |
| 6998 | $L_{A278}$ | $L_{B43}$ |
| 6999 | $L_{A279}$ | $L_{B43}$ |
| 7000 | $L_{A280}$ | $L_{B43}$ |
| 7001 | $L_{A281}$ | $L_{B43}$ |
| 7002 | $L_{A282}$ | $L_{B43}$ |
| 7003 | $L_{A283}$ | $L_{B43}$ |
| 7004 | $L_{A284}$ | $L_{B43}$ |
| 7005 | $L_{A285}$ | $L_{B43}$ |
| 7006 | $L_{A286}$ | $L_{B43}$ |
| 7007 | $L_{A287}$ | $L_{B43}$ |
| 7008 | $L_{A288}$ | $L_{B43}$ |
| 7009 | $L_{A289}$ | $L_{B43}$ |
| 7010 | $L_{A290}$ | $L_{B43}$ |
| 7011 | $L_{A291}$ | $L_{B43}$ |
| 7012 | $L_{A292}$ | $L_{B43}$ |
| 7013 | $L_{A293}$ | $L_{B43}$ |
| 7014 | $L_{A294}$ | $L_{B43}$ |
| 7015 | $L_{A295}$ | $L_{B43}$ |
| 7016 | $L_{A296}$ | $L_{B43}$ |
| 7017 | $L_{A297}$ | $L_{B43}$ |
| 7018 | $L_{A298}$ | $L_{B43}$ |
| 7019 | $L_{A299}$ | $L_{B43}$ |
| 7020 | $L_{A300}$ | $L_{B43}$ |
| 7021 | $L_{A301}$ | $L_{B43}$ |
| 7022 | $L_{A302}$ | $L_{B43}$ |
| 7023 | $L_{A303}$ | $L_{B43}$ |
| 7024 | $L_{A304}$ | $L_{B43}$ |
| 7025 | $L_{A305}$ | $L_{B43}$ |
| 7026 | $L_{A306}$ | $L_{B43}$ |
| 7027 | $L_{A307}$ | $L_{B43}$ |
| 7028 | $L_{A308}$ | $L_{B43}$ |
| 7029 | $L_{A309}$ | $L_{B43}$ |
| 7030 | $L_{A310}$ | $L_{B43}$ |
| 7031 | $L_{A311}$ | $L_{B43}$ |
| 7032 | $L_{A312}$ | $L_{B43}$ |
| 7033 | $L_{A313}$ | $L_{B43}$ |
| 7034 | $L_{A314}$ | $L_{B43}$ |
| 7035 | $L_{A315}$ | $L_{B43}$ |
| 7036 | $L_{A316}$ | $L_{B43}$ |
| 7037 | $L_{A317}$ | $L_{B43}$ |
| 7038 | $L_{A318}$ | $L_{B43}$ |
| 7039 | $L_{A319}$ | $L_{B43}$ |
| 7040 | $L_{A320}$ | $L_{B43}$ |
| 7041 | $L_{A321}$ | $L_{B43}$ |
| 7042 | $L_{A322}$ | $L_{B43}$ |
| 7043 | $L_{A323}$ | $L_{B43}$ |
| 7044 | $L_{A324}$ | $L_{B43}$ |
| 7045 | $L_{A325}$ | $L_{B43}$ |
| 7046 | $L_{A326}$ | $L_{B43}$ |
| 7047 | $L_{A327}$ | $L_{B43}$ |
| 7048 | $L_{A328}$ | $L_{B43}$ |
| 7049 | $L_{A329}$ | $L_{B43}$ |
| 7050 | $L_{A330}$ | $L_{B43}$ |
| 7051 | $L_{A331}$ | $L_{B43}$ |
| 7052 | $L_{A332}$ | $L_{B43}$ |
| 7053 | $L_{A333}$ | $L_{B43}$ |
| 7054 | $L_{A334}$ | $L_{B43}$ |
| 7055 | $L_{A335}$ | $L_{B43}$ |
| 7056 | $L_{A336}$ | $L_{B43}$ |
| 7057 | $L_{A337}$ | $L_{B43}$ |
| 7058 | $L_{A338}$ | $L_{B43}$ |
| 7059 | $L_{A339}$ | $L_{B43}$ |
| 7060 | $L_{A340}$ | $L_{B43}$ |
| 7061 | $L_{A341}$ | $L_{B43}$ |
| 7062 | $L_{A342}$ | $L_{B43}$ |
| 7063 | $L_{A343}$ | $L_{B43}$ |
| 7064 | $L_{A344}$ | $L_{B43}$ |
| 7065 | $L_{A345}$ | $L_{B43}$ |
| 7066 | $L_{A346}$ | $L_{B43}$ |
| 7067 | $L_{A347}$ | $L_{B43}$ |
| 7068 | $L_{A348}$ | $L_{B43}$ |
| 7069 | $L_{A349}$ | $L_{B43}$ |
| 7070 | $L_{A350}$ | $L_{B43}$ |
| 7071 | $L_{A351}$ | $L_{B43}$ |
| 7072 | $L_{A352}$ | $L_{B43}$ |
| 7073 | $L_{A353}$ | $L_{B43}$ |
| 7074 | $L_{A354}$ | $L_{B43}$ |

TABLE 3-continued

| Compound Number | $L_A$ | $L_B$ |
|---|---|---|
| 7075 | $L_{A355}$ | $L_{B43}$ |
| 7076 | $L_{A356}$ | $L_{B43}$ |
| 7077 | $L_{A357}$ | $L_{B43}$ |
| 7078 | $L_{A358}$ | $L_{B43}$ |
| 7079 | $L_{A359}$ | $L_{B43}$ |
| 7080 | $L_{A360}$ | $L_{B43}$ |
| 7081 | $L_{A361}$ | $L_{B43}$ |
| 7082 | $L_{A362}$ | $L_{B43}$ |
| 7083 | $L_{A363}$ | $L_{B43}$ |
| 7084 | $L_{A364}$ | $L_{B43}$ |
| 7085 | $L_{A365}$ | $L_{B43}$ |
| 7086 | $L_{A366}$ | $L_{B43}$ |
| 7087 | $L_{A367}$ | $L_{B43}$ |
| 7088 | $L_{A368}$ | $L_{B43}$ |
| 7089 | $L_{A369}$ | $L_{B43}$ |
| 7090 | $L_{A370}$ | $L_{B43}$ |
| 7091 | $L_{A371}$ | $L_{B43}$ |
| 7092 | $L_{A372}$ | $L_{B43}$ |
| 7093 | $L_{A373}$ | $L_{B43}$ |
| 7094 | $L_{A374}$ | $L_{B43}$ |
| 7095 | $L_{A375}$ | $L_{B43}$ |
| 7096 | $L_{A376}$ | $L_{B43}$ |
| 7097 | $L_{A377}$ | $L_{B43}$ |
| 7098 | $L_{A378}$ | $L_{B43}$ |
| 7099 | $L_{A379}$ | $L_{B43}$ |
| 7100 | $L_{A380}$ | $L_{B43}$ |
| 7101 | $L_{A381}$ | $L_{B43}$ |
| 7102 | $L_{A382}$ | $L_{B43}$ |
| 7103 | $L_{A383}$ | $L_{B43}$ |
| 7104 | $L_{A384}$ | $L_{B43}$ |
| 7105 | $L_{A385}$ | $L_{B43}$ |
| 7106 | $L_{A386}$ | $L_{B43}$ |
| 7107 | $L_{A387}$ | $L_{B43}$ |
| 7108 | $L_{A388}$ | $L_{B43}$ |
| 7109 | $L_{A389}$ | $L_{B43}$ |
| 7110 | $L_{A390}$ | $L_{B43}$ |
| 7111 | $L_{A391}$ | $L_{B43}$ |
| 7112 | $L_{A392}$ | $L_{B43}$ |
| 7113 | $L_{A393}$ | $L_{B43}$ |
| 7114 | $L_{A394}$ | $L_{B43}$ |
| 7115 | $L_{A395}$ | $L_{B43}$ |
| 7116 | $L_{A396}$ | $L_{B43}$ |
| 7117 | $L_{A397}$ | $L_{B43}$ |
| 7118 | $L_{A398}$ | $L_{B43}$ |
| 7119 | $L_{A399}$ | $L_{B43}$ |
| 7120 | $L_{A400}$ | $L_{B43}$ |
| 7121 | $L_{A401}$ | $L_{B43}$ |
| 7122 | $L_{A402}$ | $L_{B43}$ |
| 7123 | $L_{A403}$ | $L_{B43}$ |
| 7124 | $L_{A404}$ | $L_{B43}$ |
| 7125 | $L_{A405}$ | $L_{B43}$ |
| 7126 | $L_{A406}$ | $L_{B43}$ |
| 7127 | $L_{A407}$ | $L_{B43}$ |
| 7128 | $L_{A408}$ | $L_{B43}$ |
| 7129 | $L_{A409}$ | $L_{B43}$ |
| 7130 | $L_{A410}$ | $L_{B43}$ |
| 7131 | $L_{A411}$ | $L_{B43}$ |
| 7132 | $L_{A412}$ | $L_{B43}$ |
| 7133 | $L_{A413}$ | $L_{B43}$ |
| 7134 | $L_{A414}$ | $L_{B43}$ |
| 7135 | $L_{A415}$ | $L_{B43}$ |
| 7136 | $L_{A416}$ | $L_{B43}$ |
| 7137 | $L_{A417}$ | $L_{B43}$ |
| 7138 | $L_{A418}$ | $L_{B43}$ |
| 7139 | $L_{A419}$ | $L_{B43}$ |
| 7140 | $L_{A420}$ | $L_{B43}$ |
| 7141 | $L_{A421}$ | $L_{B43}$ |
| 7142 | $L_{A422}$ | $L_{B43}$ |
| 7143 | $L_{A423}$ | $L_{B43}$ |
| 7144 | $L_{A424}$ | $L_{B43}$ |
| 7145 | $L_{A425}$ | $L_{B43}$ |
| 7146 | $L_{A426}$ | $L_{B43}$ |
| 7147 | $L_{A427}$ | $L_{B43}$ |
| 7148 | $L_{A428}$ | $L_{B43}$ |
| 7149 | $L_{A429}$ | $L_{B43}$ |
| 7150 | $L_{A430}$ | $L_{B43}$ |
| 7151 | $L_{A431}$ | $L_{B43}$ |

TABLE 3-continued

| Compound Number | $L_A$ | $L_B$ |
|---|---|---|
| 7152 | $L_{A432}$ | $L_{B43}$ |
| 7153 | $L_{A433}$ | $L_{B43}$ |
| 7154 | $L_{A434}$ | $L_{B43}$ |
| 7155 | $L_{A435}$ | $L_{B43}$ |
| 7156 | $L_{A436}$ | $L_{B43}$ |
| 7157 | $L_{A437}$ | $L_{B43}$ |
| 7158 | $L_{A438}$ | $L_{B43}$ |
| 7159 | $L_{A439}$ | $L_{B43}$ |
| 7160 | $L_{A440}$ | $L_{B43}$ |
| 7161 | $L_{A441}$ | $L_{B43}$ |
| 7162 | $L_{A442}$ | $L_{B43}$ |
| 7163 | $L_{A443}$ | $L_{B43}$ |
| 7164 | $L_{A444}$ | $L_{B43}$ |
| 7165 | $L_{A445}$ | $L_{B43}$ |
| 7166 | $L_{A446}$ | $L_{B43}$ |
| 7167 | $L_{A447}$ | $L_{B43}$ |
| 7168 | $L_{A448}$ | $L_{B43}$ |
| 7169 | $L_{A449}$ | $L_{B43}$ |
| 7170 | $L_{A450}$ | $L_{B43}$ |
| 7171 | $L_{A451}$ | $L_{B43}$ |
| 7172 | $L_{A452}$ | $L_{B43}$ |
| 7173 | $L_{A453}$ | $L_{B43}$ |
| 7174 | $L_{A454}$ | $L_{B43}$ |
| 7175 | $L_{A455}$ | $L_{B43}$ |
| 7176 | $L_{A456}$ | $L_{B43}$ |
| 7177 | $L_{A457}$ | $L_{B43}$ |
| 7178 | $L_{A458}$ | $L_{B43}$ |
| 7179 | $L_{A459}$ | $L_{B43}$ |
| 7180 | $L_{A460}$ | $L_{B43}$ |
| 7181 | $L_{A461}$ | $L_{B43}$ |
| 7182 | $L_{A462}$ | $L_{B43}$ |
| 7183 | $L_{A463}$ | $L_{B43}$ |
| 7184 | $L_{A464}$ | $L_{B43}$ |
| 7185 | $L_{A465}$ | $L_{B43}$ |
| 7186 | $L_{A466}$ | $L_{B43}$ |
| 7187 | $L_{A467}$ | $L_{B43}$ |
| 7188 | $L_{A468}$ | $L_{B43}$ |
| 7189 | $L_{A469}$ | $L_{B43}$ |
| 7190 | $L_{A470}$ | $L_{B43}$ |
| 7191 | $L_{A471}$ | $L_{B43}$ |
| 7192 | $L_{A472}$ | $L_{B43}$ |
| 7193 | $L_{A473}$ | $L_{B43}$ |
| 7194 | $L_{A474}$ | $L_{B43}$ |
| 7195 | $L_{A475}$ | $L_{B43}$ |
| 7196 | $L_{A476}$ | $L_{B43}$ |
| 7197 | $L_{A477}$ | $L_{B43}$ |
| 7198 | $L_{A478}$ | $L_{B43}$ |
| 7199 | $L_{A479}$ | $L_{B43}$ |
| 7200 | $L_{A480}$ | $L_{B43}$ |
| 7201 | $L_{A481}$ | $L_{B43}$ |
| 7202 | $L_{A482}$ | $L_{B43}$ |
| 7203 | $L_{A483}$ | $L_{B43}$ |
| 7204 | $L_{A484}$ | $L_{B43}$ |
| 7205 | $L_{A485}$ | $L_{B43}$ |
| 7206 | $L_{A486}$ | $L_{B43}$ |
| 7207 | $L_{A487}$ | $L_{B43}$ |
| 7208 | $L_{A488}$ | $L_{B43}$ |
| 7209 | $L_{A489}$ | $L_{B43}$ |
| 7210 | $L_{A490}$ | $L_{B43}$ |
| 7211 | $L_{A491}$ | $L_{B43}$ |
| 7212 | $L_{A492}$ | $L_{B43}$ |
| 7213 | $L_{A493}$ | $L_{B43}$ |
| 7214 | $L_{A494}$ | $L_{B43}$ |
| 7215 | $L_{A495}$ | $L_{B43}$ |
| 7216 | $L_{A496}$ | $L_{B43}$ |
| 7217 | $L_{A497}$ | $L_{B43}$ |
| 7218 | $L_{A498}$ | $L_{B43}$ |
| 7219 | $L_{A499}$ | $L_{B43}$ |
| 7220 | $L_{A500}$ | $L_{B43}$ |
| 7221 | $L_{A501}$ | $L_{B43}$ |
| 7222 | $L_{A502}$ | $L_{B43}$ |
| 7223 | $L_{A503}$ | $L_{B43}$ |
| 7224 | $L_{A504}$ | $L_{B43}$ |
| 7225 | $L_{A505}$ | $L_{B43}$ |
| 7226 | $L_{A506}$ | $L_{B43}$ |
| 7227 | $L_{A507}$ | $L_{B43}$ |
| 7228 | $L_{A508}$ | $L_{B43}$ |

TABLE 3-continued

| Compound Number | $L_A$ | $L_B$ |
|---|---|---|
| 7229 | $L_{A509}$ | $L_{B43}$ |
| 7230 | $L_{A510}$ | $L_{B43}$ |
| 7231 | $L_{A511}$ | $L_{B43}$ |
| 7232 | $L_{A512}$ | $L_{B43}$ |
| 7233 | $L_{A513}$ | $L_{B43}$ |
| 7234 | $L_{A514}$ | $L_{B43}$ |
| 7235 | $L_{A515}$ | $L_{B43}$ |
| 7236 | $L_{A516}$ | $L_{B43}$ |
| 7237 | $L_{A517}$ | $L_{B43}$ |
| 7238 | $L_{A518}$ | $L_{B43}$ |
| 7239 | $L_{A519}$ | $L_{B43}$ |
| 7240 | $L_{A520}$ | $L_{B43}$ |
| 7241 | $L_{A521}$ | $L_{B43}$ |
| 7242 | $L_{A522}$ | $L_{B43}$ |
| 7243 | $L_{A523}$ | $L_{B43}$ |
| 7244 | $L_{A524}$ | $L_{B43}$ |
| 7245 | $L_{A525}$ | $L_{B43}$ |
| 7246 | $L_{A526}$ | $L_{B43}$ |
| 7247 | $L_{A527}$ | $L_{B43}$ |
| 7248 | $L_{A528}$ | $L_{B43}$ |
| 7249 | $L_{A529}$ | $L_{B43}$ |
| 7250 | $L_{A530}$ | $L_{B43}$ |
| 7251 | $L_{A531}$ | $L_{B43}$ |
| 7252 | $L_{A532}$ | $L_{B43}$ |
| 7253 | $L_{A533}$ | $L_{B43}$ |
| 7254 | $L_{A534}$ | $L_{B43}$ |
| 7255 | $L_{A535}$ | $L_{B43}$ |
| 7256 | $L_{A536}$ | $L_{B43}$ |
| 7257 | $L_{A537}$ | $L_{B43}$ |
| 7258 | $L_{A538}$ | $L_{B43}$ |
| 7259 | $L_{A539}$ | $L_{B43}$ |
| 7260 | $L_{A540}$ | $L_{B43}$ |
| 7261 | $L_{A541}$ | $L_{B43}$ |
| 7262 | $L_{A542}$ | $L_{B43}$ |
| 7263 | $L_{A543}$ | $L_{B43}$ |
| 7264 | $L_{A544}$ | $L_{B43}$ |
| 7265 | $L_{A545}$ | $L_{B43}$ |
| 7266 | $L_{A546}$ | $L_{B43}$ |
| 7267 | $L_{A547}$ | $L_{B43}$ |
| 7268 | $L_{A548}$ | $L_{B43}$ |
| 7269 | $L_{A549}$ | $L_{B43}$ |
| 7270 | $L_{A550}$ | $L_{B43}$ |
| 7271 | $L_{A551}$ | $L_{B43}$ |
| 7272 | $L_{A552}$ | $L_{B43}$ |
| 7273 | $L_{A553}$ | $L_{B43}$ |
| 7274 | $L_{A554}$ | $L_{B43}$ |
| 7275 | $L_{A555}$ | $L_{B43}$ |
| 7276 | $L_{A556}$ | $L_{B43}$ |
| 7277 | $L_{A557}$ | $L_{B43}$ |
| 7278 | $L_{A558}$ | $L_{B43}$ |
| 7279 | $L_{A559}$ | $L_{B43}$ |
| 7280 | $L_{A560}$ | $L_{B43}$ |
| 7281 | $L_{A561}$ | $L_{B43}$ |
| 7282 | $L_{A562}$ | $L_{B43}$ |
| 7283 | $L_{A563}$ | $L_{B43}$ |
| 7284 | $L_{A564}$ | $L_{B43}$ |
| 7285 | $L_{A565}$ | $L_{B43}$ |
| 7286 | $L_{A566}$ | $L_{B43}$ |
| 7287 | $L_{A567}$ | $L_{B43}$ |
| 7288 | $L_{A568}$ | $L_{B43}$ |
| 7289 | $L_{A569}$ | $L_{B43}$ |
| 7290 | $L_{A570}$ | $L_{B43}$ |
| 7291 | $L_{A571}$ | $L_{B43}$ |
| 7292 | $L_{A572}$ | $L_{B43}$ |
| 7293 | $L_{A573}$ | $L_{B43}$ |
| 7294 | $L_{A574}$ | $L_{B43}$ |
| 7295 | $L_{A575}$ | $L_{B43}$ |
| 7296 | $L_{A576}$ | $L_{B43}$ |
| 7297 | $L_{A577}$ | $L_{B43}$ |
| 7298 | $L_{A578}$ | $L_{B43}$ |
| 7299 | $L_{A579}$ | $L_{B43}$ |
| 7300 | $L_{A580}$ | $L_{B43}$ |
| 7301 | $L_{A581}$ | $L_{B43}$ |
| 7302 | $L_{A582}$ | $L_{B43}$ |
| 7303 | $L_{A583}$ | $L_{B43}$ |
| 7304 | $L_{A584}$ | $L_{B43}$ |
| 7305 | $L_{A585}$ | $L_{B43}$ |
| 7306 | $L_{A586}$ | $L_{B43}$ |
| 7307 | $L_{A587}$ | $L_{B43}$ |
| 7308 | $L_{A588}$ | $L_{B43}$ |
| 7309 | $L_{A589}$ | $L_{B43}$ |
| 7310 | $L_{A590}$ | $L_{B43}$ |
| 7311 | $L_{A591}$ | $L_{B43}$ |
| 7312 | $L_{A592}$ | $L_{B43}$ |
| 7313 | $L_{A593}$ | $L_{B43}$ |
| 7314 | $L_{A594}$ | $L_{B43}$ |
| 7315 | $L_{A595}$ | $L_{B43}$ |
| 7316 | $L_{A596}$ | $L_{B43}$ |
| 7317 | $L_{A597}$ | $L_{B43}$ |
| 7318 | $L_{A598}$ | $L_{B43}$ |
| 7319 | $L_{A599}$ | $L_{B43}$ |
| 7320 | $L_{A600}$ | $L_{B43}$ |
| 7321 | $L_{A601}$ | $L_{B43}$ |
| 7322 | $L_{A602}$ | $L_{B43}$ |
| 7323 | $L_{A603}$ | $L_{B43}$ |
| 7324 | $L_{A604}$ | $L_{B43}$ |
| 7325 | $L_{A605}$ | $L_{B43}$ |
| 7326 | $L_{A606}$ | $L_{B43}$ |
| 7327 | $L_{A607}$ | $L_{B43}$ |
| 7328 | $L_{A608}$ | $L_{B43}$ |
| 7329 | $L_{A609}$ | $L_{B43}$ |
| 7330 | $L_{A610}$ | $L_{B43}$ |
| 7331 | $L_{A611}$ | $L_{B43}$ |
| 7332 | $L_{A612}$ | $L_{B43}$ |
| 7333 | $L_{A613}$ | $L_{B43}$ |
| 7334 | $L_{A614}$ | $L_{B43}$ |
| 7335 | $L_{A615}$ | $L_{B43}$ |
| 7336 | $L_{A616}$ | $L_{B43}$ |
| 7337 | $L_{A617}$ | $L_{B43}$ |
| 7338 | $L_{A618}$ | $L_{B43}$ |
| 7339 | $L_{A619}$ | $L_{B43}$ |
| 7340 | $L_{A620}$ | $L_{B43}$ |
| 7341 | $L_{A621}$ | $L_{B43}$ |
| 7342 | $L_{A622}$ | $L_{B43}$ |
| 7343 | $L_{A623}$ | $L_{B43}$ |
| 7344 | $L_{A624}$ | $L_{B43}$ |
| 7345 | $L_{A625}$ | $L_{B43}$ |
| 7346 | $L_{A626}$ | $L_{B43}$ |
| 7347 | $L_{A627}$ | $L_{B43}$ |
| 7348 | $L_{A628}$ | $L_{B43}$ |
| 7349 | $L_{A629}$ | $L_{B43}$ |
| 7350 | $L_{A630}$ | $L_{B43}$ |
| 7351 | $L_{A631}$ | $L_{B43}$ |
| 7352 | $L_{A632}$ | $L_{B43}$ |
| 7353 | $L_{A633}$ | $L_{B43}$ |
| 7354 | $L_{A634}$ | $L_{B43}$ |
| 7355 | $L_{A635}$ | $L_{B43}$ |
| 7356 | $L_{A636}$ | $L_{B43}$ |
| 7357 | $L_{A637}$ | $L_{B43}$ |
| 7358 | $L_{A638}$ | $L_{B43}$ |
| 7359 | $L_{A639}$ | $L_{B43}$ |
| 7360 | $L_{A640}$ | $L_{B43}$ |
| 7361 | $L_{A641}$ | $L_{B43}$ |
| 7362 | $L_{A642}$ | $L_{B43}$ |
| 7363 | $L_{A643}$ | $L_{B43}$ |
| 7364 | $L_{A644}$ | $L_{B43}$ |
| 7365 | $L_{A645}$ | $L_{B43}$ |
| 7366 | $L_{A646}$ | $L_{B43}$ |
| 7367 | $L_{A647}$ | $L_{B43}$ |
| 7368 | $L_{A648}$ | $L_{B43}$ |
| 7369 | $L_{A649}$ | $L_{B43}$ |
| 7370 | $L_{A650}$ | $L_{B43}$ |
| 7371 | $L_{A651}$ | $L_{B43}$ |
| 7372 | $L_{A652}$ | $L_{B43}$ |
| 7373 | $L_{A653}$ | $L_{B43}$ |
| 7374 | $L_{A654}$ | $L_{B43}$ |
| 7375 | $L_{A655}$ | $L_{B43}$ |
| 7376 | $L_{A656}$ | $L_{B43}$ |
| 7377 | $L_{A657}$ | $L_{B43}$ |
| 7378 | $L_{A658}$ | $L_{B43}$ |
| 7379 | $L_{A659}$ | $L_{B43}$ |
| 7380 | $L_{A660}$ | $L_{B43}$ |
| 7381 | $L_{A661}$ | $L_{B43}$ |
| 7382 | $L_{A662}$ | $L_{B43}$ |

TABLE 3-continued

| Compound Number | $L_A$ | $L_B$ |
|---|---|---|
| 7383 | $L_{A663}$ | $L_{B43}$ |
| 7384 | $L_{A664}$ | $L_{B43}$ |
| 7385 | $L_{A665}$ | $L_{B43}$ |
| 7386 | $L_{A666}$ | $L_{B43}$ |
| 7387 | $L_{A667}$ | $L_{B43}$ |
| 7388 | $L_{A668}$ | $L_{B43}$ |
| 7389 | $L_{A669}$ | $L_{B43}$ |
| 7390 | $L_{A670}$ | $L_{B43}$ |
| 7391 | $L_{A671}$ | $L_{B43}$ |
| 7392 | $L_{A672}$ | $L_{B43}$ |
| 7393 | $L_{A673}$ | $L_{B43}$ |
| 7394 | $L_{A674}$ | $L_{B43}$ |
| 7395 | $L_{A675}$ | $L_{B43}$ |
| 7396 | $L_{A676}$ | $L_{B43}$ |
| 7397 | $L_{A677}$ | $L_{B43}$ |
| 7398 | $L_{A678}$ | $L_{B43}$ |
| 7399 | $L_{A679}$ | $L_{B43}$ |
| 7400 | $L_{A680}$ | $L_{B43}$ |
| 7401 | $L_{A681}$ | $L_{B43}$ |
| 7402 | $L_{A682}$ | $L_{B43}$ |
| 7403 | $L_{A683}$ | $L_{B43}$ |
| 7404 | $L_{A684}$ | $L_{B43}$ |
| 7405 | $L_{A685}$ | $L_{B43}$ |
| 7406 | $L_{A686}$ | $L_{B43}$ |
| 7407 | $L_{A687}$ | $L_{B43}$ |
| 7408 | $L_{A688}$ | $L_{B43}$ |
| 7409 | $L_{A689}$ | $L_{B43}$ |
| 7410 | $L_{A690}$ | $L_{B43}$ |
| 7411 | $L_{A691}$ | $L_{B43}$ |
| 7412 | $L_{A692}$ | $L_{B43}$ |
| 7413 | $L_{A693}$ | $L_{B43}$ |
| 7414 | $L_{A694}$ | $L_{B43}$ |
| 7415 | $L_{A695}$ | $L_{B43}$ |
| 7416 | $L_{A696}$ | $L_{B43}$ |
| 7417 | $L_{A697}$ | $L_{B43}$ |
| 7418 | $L_{A698}$ | $L_{B43}$ |
| 7419 | $L_{A699}$ | $L_{B43}$ |
| 7420 | $L_{A700}$ | $L_{B43}$ |
| 7421 | $L_{A701}$ | $L_{B43}$ |
| 7422 | $L_{A702}$ | $L_{B43}$ |
| 7423 | $L_{A703}$ | $L_{B43}$ |
| 7424 | $L_{A704}$ | $L_{B43}$ |
| 7425 | $L_{A705}$ | $L_{B43}$ |
| 7426 | $L_{A706}$ | $L_{B43}$ |
| 7427 | $L_{A707}$ | $L_{B43}$ |
| 7428 | $L_{A708}$ | $L_{B43}$ |
| 7429 | $L_{A709}$ | $L_{B43}$ |
| 7430 | $L_{A710}$ | $L_{B43}$ |
| 7431 | $L_{A711}$ | $L_{B43}$ |
| 7432 | $L_{A712}$ | $L_{B43}$ |
| 7433 | $L_{A713}$ | $L_{B43}$ |
| 7434 | $L_{A714}$ | $L_{B43}$ |
| 7435 | $L_{A715}$ | $L_{B43}$ |
| 7436 | $L_{A716}$ | $L_{B43}$ |
| 7437 | $L_{A717}$ | $L_{B43}$ |
| 7438 | $L_{A718}$ | $L_{B43}$ |
| 7439 | $L_{A719}$ | $L_{B43}$ |
| 7440 | $L_{A720}$ | $L_{B43}$ |
| 7441 | $L_{A721}$ | $L_{B43}$ |
| 7442 | $L_{A722}$ | $L_{B43}$ |
| 7443 | $L_{A723}$ | $L_{B43}$ |
| 7444 | $L_{A724}$ | $L_{B43}$ |
| 7445 | $L_{A725}$ | $L_{B43}$ |
| 7446 | $L_{A726}$ | $L_{B43}$ |
| 7447 | $L_{A727}$ | $L_{B43}$ |
| 7448 | $L_{A728}$ | $L_{B43}$ |
| 7449 | $L_{A729}$ | $L_{B43}$ |
| 7450 | $L_{A730}$ | $L_{B43}$ |
| 7451 | $L_{A731}$ | $L_{B43}$ |
| 7452 | $L_{A732}$ | $L_{B43}$ |
| 7453 | $L_{A733}$ | $L_{B43}$ |
| 7454 | $L_{A734}$ | $L_{B43}$ |
| 7455 | $L_{A735}$ | $L_{B43}$ |
| 7456 | $L_{A736}$ | $L_{B43}$ |
| 7457 | $L_{A737}$ | $L_{B43}$ |
| 7458 | $L_{A738}$ | $L_{B43}$ |
| 7459 | $L_{A739}$ | $L_{B43}$ |

TABLE 3-continued

| Compound Number | $L_A$ | $L_B$ |
|---|---|---|
| 7460 | $L_{A740}$ | $L_{B43}$ |
| 7461 | $L_{A741}$ | $L_{B43}$ |
| 7462 | $L_{A742}$ | $L_{B43}$ |
| 7463 | $L_{A743}$ | $L_{B43}$ |
| 7464 | $L_{A744}$ | $L_{B43}$ |
| 7465 | $L_{A745}$ | $L_{B43}$ |
| 7466 | $L_{A746}$ | $L_{B43}$ |
| 7467 | $L_{A747}$ | $L_{B43}$ |
| 7468 | $L_{A748}$ | $L_{B43}$ |
| 7469 | $L_{A749}$ | $L_{B43}$ |
| 7470 | $L_{A750}$ | $L_{B43}$ |
| 7471 | $L_{A751}$ | $L_{B43}$ |
| 7472 | $L_{A752}$ | $L_{B43}$ |
| 7473 | $L_{A753}$ | $L_{B43}$ |
| 7474 | $L_{A754}$ | $L_{B43}$ |
| 7475 | $L_{A755}$ | $L_{B43}$ |
| 7476 | $L_{A756}$ | $L_{B43}$ |
| 7477 | $L_{A757}$ | $L_{B43}$ |
| 7478 | $L_{A758}$ | $L_{B43}$ |
| 7479 | $L_{A759}$ | $L_{B43}$ |
| 7480 | $L_{A760}$ | $L_{B43}$ |
| 7481 | $L_{A761}$ | $L_{B43}$ |
| 7482 | $L_{A762}$ | $L_{B43}$ |
| 7483 | $L_{A763}$ | $L_{B43}$ |
| 7484 | $L_{A764}$ | $L_{B43}$ |
| 7485 | $L_{A765}$ | $L_{B43}$ |
| 7486 | $L_{A766}$ | $L_{B43}$ |
| 7487 | $L_{A767}$ | $L_{B43}$ |
| 7488 | $L_{A768}$ | $L_{B43}$ |
| 7489 | $L_{A769}$ | $L_{B43}$ |
| 7490 | $L_{A770}$ | $L_{B43}$ |
| 7491 | $L_{A771}$ | $L_{B43}$ |
| 7492 | $L_{A772}$ | $L_{B43}$ |
| 7493 | $L_{A773}$ | $L_{B43}$ |
| 7494 | $L_{A774}$ | $L_{B43}$ |
| 7495 | $L_{A775}$ | $L_{B43}$ |
| 7496 | $L_{A776}$ | $L_{B43}$ |
| 7497 | $L_{A777}$ | $L_{B43}$ |
| 7498 | $L_{A778}$ | $L_{B43}$ |
| 7499 | $L_{A779}$ | $L_{B43}$ |
| 7500 | $L_{A780}$ | $L_{B43}$ |
| 7501 | $L_{A781}$ | $L_{B43}$ |
| 7502 | $L_{A782}$ | $L_{B43}$ |
| 7503 | $L_{A783}$ | $L_{B43}$ |
| 7504 | $L_{A784}$ | $L_{B43}$ |
| 7505 | $L_{A785}$ | $L_{B43}$ |
| 7506 | $L_{A786}$ | $L_{B43}$ |
| 7507 | $L_{A787}$ | $L_{B43}$ |
| 7508 | $L_{A788}$ | $L_{B43}$ |
| 7509 | $L_{A789}$ | $L_{B43}$ |
| 7510 | $L_{A790}$ | $L_{B43}$ |
| 7511 | $L_{A791}$ | $L_{B43}$ |
| 7512 | $L_{A792}$ | $L_{B43}$ |
| 7513 | $L_{A793}$ | $L_{B43}$ |
| 7514 | $L_{A794}$ | $L_{B43}$ |
| 7515 | $L_{A795}$ | $L_{B43}$ |
| 7516 | $L_{A796}$ | $L_{B43}$ |
| 7517 | $L_{A797}$ | $L_{B43}$ |
| 7518 | $L_{A798}$ | $L_{B43}$ |
| 7519 | $L_{A799}$ | $L_{B43}$ |
| 7520 | $L_{A800}$ | $L_{B43}$ |
| 7521 | $L_{A801}$ | $L_{B43}$ |
| 7522 | $L_{A802}$ | $L_{B43}$ |
| 7523 | $L_{A803}$ | $L_{B43}$ |
| 7524 | $L_{A804}$ | $L_{B43}$ |
| 7525 | $L_{A805}$ | $L_{B43}$ |
| 7526 | $L_{A806}$ | $L_{B43}$ |
| 7527 | $L_{A807}$ | $L_{B43}$ |
| 7528 | $L_{A808}$ | $L_{B43}$ |
| 7529 | $L_{A809}$ | $L_{B43}$ |
| 7530 | $L_{A810}$ | $L_{B43}$ |
| 7531 | $L_{A811}$ | $L_{B43}$ |
| 7532 | $L_{A812}$ | $L_{B43}$ |
| 7533 | $L_{A813}$ | $L_{B43}$ |
| 7534 | $L_{A814}$ | $L_{B43}$ |
| 7535 | $L_{A815}$ | $L_{B43}$ |
| 7536 | $L_{A816}$ | $L_{B43}$ |

TABLE 3-continued

| Compound Number | $L_A$ | $L_B$ |
|---|---|---|
| 7537 | $L_{A817}$ | $L_{B43}$ |
| 7538 | $L_{A818}$ | $L_{B43}$ |
| 7539 | $L_{A819}$ | $L_{B43}$ |
| 7540 | $L_{A820}$ | $L_{B43}$ |
| 7541 | $L_{A821}$ | $L_{B43}$ |
| 7542 | $L_{A822}$ | $L_{B43}$ |
| 7543 | $L_{A823}$ | $L_{B43}$ |
| 7544 | $L_{A824}$ | $L_{B43}$ |
| 7545 | $L_{A825}$ | $L_{B43}$ |
| 7546 | $L_{A826}$ | $L_{B43}$ |
| 7547 | $L_{A827}$ | $L_{B43}$ |
| 7548 | $L_{A828}$ | $L_{B43}$ |
| 7549 | $L_{A829}$ | $L_{B43}$ |
| 7550 | $L_{A830}$ | $L_{B43}$ |
| 7551 | $L_{A831}$ | $L_{B43}$ |
| 7552 | $L_{A832}$ | $L_{B43}$ |
| 7553 | $L_{A833}$ | $L_{B43}$ |
| 7554 | $L_{A834}$ | $L_{B43}$ |
| 7555 | $L_{A835}$ | $L_{B43}$ |
| 7556 | $L_{A836}$ | $L_{B43}$ |
| 7557 | $L_{A837}$ | $L_{B43}$ |
| 7558 | $L_{A838}$ | $L_{B43}$ |
| 7559 | $L_{A839}$ | $L_{B43}$ |
| 7560 | $L_{A840}$ | $L_{B43}$ |
| 7561 | $L_{A841}$ | $L_{B43}$ |
| 7562 | $L_{A842}$ | $L_{B43}$ |
| 7563 | $L_{A843}$ | $L_{B43}$ |
| 7564 | $L_{A844}$ | $L_{B43}$ |
| 7565 | $L_{A845}$ | $L_{B43}$ |
| 7566 | $L_{A846}$ | $L_{B43}$ |
| 7567 | $L_{A847}$ | $L_{B43}$ |
| 7568 | $L_{A848}$ | $L_{B43}$ |
| 7569 | $L_{A849}$ | $L_{B43}$ |
| 7570 | $L_{A850}$ | $L_{B43}$ |
| 7571 | $L_{A851}$ | $L_{B43}$ |
| 7572 | $L_{A852}$ | $L_{B43}$ |
| 7573 | $L_{A853}$ | $L_{B43}$ |
| 7574 | $L_{A854}$ | $L_{B43}$ |
| 7575 | $L_{A855}$ | $L_{B43}$ |
| 7576 | $L_{A856}$ | $L_{B43}$ |
| 7577 | $L_{A857}$ | $L_{B43}$ |
| 7578 | $L_{A858}$ | $L_{B43}$ |
| 7579 | $L_{A859}$ | $L_{B43}$ |
| 7580 | $L_{A860}$ | $L_{B43}$ |
| 7581 | $L_{A861}$ | $L_{B43}$ |
| 7582 | $L_{A862}$ | $L_{B43}$ |
| 7583 | $L_{A863}$ | $L_{B43}$ |
| 7584 | $L_{A864}$ | $L_{B43}$ |
| 7585 | $L_{A865}$ | $L_{B43}$ |
| 7586 | $L_{A866}$ | $L_{B43}$ |
| 7587 | $L_{A867}$ | $L_{B43}$ |
| 7588 | $L_{A868}$ | $L_{B43}$ |
| 7589 | $L_{A869}$ | $L_{B43}$ |
| 7590 | $L_{A870}$ | $L_{B43}$ |
| 7591 | $L_{A871}$ | $L_{B43}$ |
| 7592 | $L_{A872}$ | $L_{B43}$ |
| 7593 | $L_{A873}$ | $L_{B43}$ |
| 7594 | $L_{A874}$ | $L_{B43}$ |
| 7595 | $L_{A875}$ | $L_{B43}$ |
| 7596 | $L_{A876}$ | $L_{B43}$ |
| 7597 | $L_{A877}$ | $L_{B43}$ |
| 7598 | $L_{A878}$ | $L_{B43}$ |
| 7599 | $L_{A879}$ | $L_{B43}$ |
| 7600 | $L_{A880}$ | $L_{B43}$ |
| 7601 | $L_{A881}$ | $L_{B43}$ |
| 7602 | $L_{A882}$ | $L_{B43}$ |
| 7603 | $L_{A883}$ | $L_{B43}$ |
| 7604 | $L_{A884}$ | $L_{B43}$ |
| 7605 | $L_{A885}$ | $L_{B43}$ |
| 7606 | $L_{A886}$ | $L_{B43}$ |
| 7607 | $L_{A887}$ | $L_{B43}$ |
| 7608 | $L_{A888}$ | $L_{B43}$ |
| 7609 | $L_{A889}$ | $L_{B43}$ |
| 7610 | $L_{A890}$ | $L_{B43}$ |
| 7611 | $L_{A891}$ | $L_{B43}$ |
| 7612 | $L_{A892}$ | $L_{B43}$ |
| 7613 | $L_{A893}$ | $L_{B43}$ |

TABLE 3-continued

| Compound Number | $L_A$ | $L_B$ |
|---|---|---|
| 7614 | $L_{A894}$ | $L_{B43}$ |
| 7615 | $L_{A895}$ | $L_{B43}$ |
| 7616 | $L_{A896}$ | $L_{B43}$ |
| 7617 | $L_{A897}$ | $L_{B43}$ |
| 7618 | $L_{A898}$ | $L_{B43}$ |
| 7619 | $L_{A899}$ | $L_{B43}$ |
| 7620 | $L_{A900}$ | $L_{B43}$ |
| 7621 | $L_{A901}$ | $L_{B43}$ |
| 7622 | $L_{A902}$ | $L_{B43}$ |
| 7623 | $L_{A903}$ | $L_{B43}$ |
| 7624 | $L_{A904}$ | $L_{B43}$ |
| 7625 | $L_{A905}$ | $L_{B43}$ |
| 7626 | $L_{A906}$ | $L_{B43}$ |
| 7627 | $L_{A907}$ | $L_{B43}$ |
| 7628 | $L_{A908}$ | $L_{B43}$ |
| 7629 | $L_{A909}$ | $L_{B43}$ |
| 7630 | $L_{A910}$ | $L_{B43}$ |
| 7631 | $L_{A911}$ | $L_{B43}$ |
| 7632 | $L_{A912}$ | $L_{B43}$ |
| 7633 | $L_{A913}$ | $L_{B43}$ |
| 7634 | $L_{A914}$ | $L_{B43}$ |
| 7635 | $L_{A915}$ | $L_{B43}$ |
| 7636 | $L_{A916}$ | $L_{B43}$ |
| 7637 | $L_{A917}$ | $L_{B43}$ |
| 7638 | $L_{A918}$ | $L_{B43}$ |
| 7639 | $L_{A919}$ | $L_{B43}$ |
| 7640 | $L_{A920}$ | $L_{B43}$ |
| 7641 | $L_{A921}$ | $L_{B43}$ |
| 7642 | $L_{A922}$ | $L_{B43}$ |
| 7643 | $L_{A923}$ | $L_{B43}$ |
| 7644 | $L_{A924}$ | $L_{B43}$ |
| 7645 | $L_{A925}$ | $L_{B43}$ |
| 7646 | $L_{A926}$ | $L_{B43}$ |
| 7647 | $L_{A927}$ | $L_{B43}$ |
| 7648 | $L_{A928}$ | $L_{B43}$ |
| 7649 | $L_{A929}$ | $L_{B43}$ |
| 7650 | $L_{A930}$ | $L_{B43}$ |
| 7651 | $L_{A931}$ | $L_{B43}$ |
| 7652 | $L_{A932}$ | $L_{B43}$ |
| 7653 | $L_{A933}$ | $L_{B43}$ |
| 7654 | $L_{A934}$ | $L_{B43}$ |
| 7655 | $L_{A935}$ | $L_{B43}$ |
| 7656 | $L_{A936}$ | $L_{B43}$ |
| 7657 | $L_{A937}$ | $L_{B43}$ |
| 7658 | $L_{A938}$ | $L_{B43}$ |
| 7659 | $L_{A939}$ | $L_{B43}$ |
| 7660 | $L_{A940}$ | $L_{B43}$ |
| 7661 | $L_{A941}$ | $L_{B43}$ |
| 7662 | $L_{A942}$ | $L_{B43}$ |
| 7663 | $L_{A943}$ | $L_{B43}$ |
| 7664 | $L_{A944}$ | $L_{B43}$ |
| 7665 | $L_{A945}$ | $L_{B43}$ |
| 7666 | $L_{A946}$ | $L_{B43}$ |
| 7667 | $L_{A947}$ | $L_{B43}$ |
| 7668 | $L_{A948}$ | $L_{B43}$ |
| 7669 | $L_{A949}$ | $L_{B43}$ |
| 7670 | $L_{A950}$ | $L_{B43}$ |
| 7671 | $L_{A951}$ | $L_{B43}$ |
| 7672 | $L_{A952}$ | $L_{B43}$ |
| 7673 | $L_{A953}$ | $L_{B43}$ |
| 7674 | $L_{A954}$ | $L_{B43}$ |
| 7675 | $L_{A955}$ | $L_{B43}$ |
| 7676 | $L_{A956}$ | $L_{B43}$ |
| 7677 | $L_{A957}$ | $L_{B43}$ |
| 7678 | $L_{A958}$ | $L_{B43}$ |
| 7679 | $L_{A959}$ | $L_{B43}$ |
| 7680 | $L_{A960}$ | $L_{B43}$ |

In some embodiments, the compound is selected from the group consisting of:

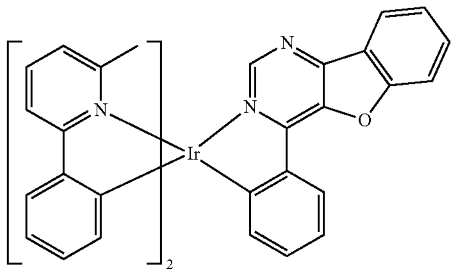

and

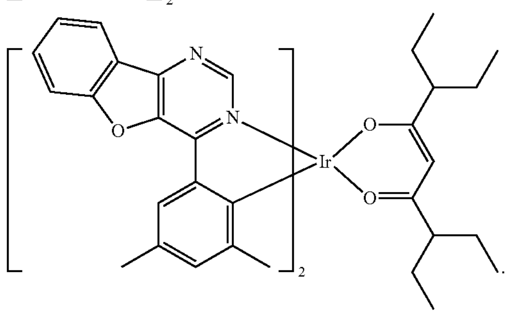

In some embodiments, a first organic light emitting device is provided. The first organic light emitting device comprises:

an anode;

a cathode; and an organic layer, disposed between the anode and the cathode, comprising a compound comprising a ligand $L_A$ of formula I:

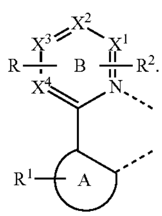

(I)

In the ligand $L_A$ of formula I, ring A is a 5-membered or 6-membered carbocyclic or heterocyclic ring; R is fused to ring B and has formula II:

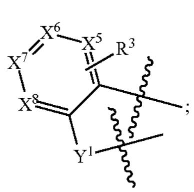

(II)

the wave lines indicate bonds to ring B; $R^1$ and $R^3$ each independently represent mono, di, tri, or tetra substitution, or no substitution; $R^2$ represents mono or di substitution, or no substitution; $X^1$, $X^2$, $X^3$, $X^4$, $X^5$, $X^6$, $X^7$, and $X^8$ are each independently carbon or nitrogen; at least one of $X^1$, $X^2$, $X^3$, $X^4$, $X^5$, $X^6$, $X^7$, and $X^8$ is nitrogen; $Y^1$ is selected from the group consisting of BR', NR', PR', O, S, Se, C═O, S═O, $SO_2$, SiR'R", and GeR'R"; $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, or wherein any two adjacent substituents are optionally joined to form a ring, Which can be further substituted; $L_A$ is coordinated to a metal M; $L_A$ is optionally linked with other ligands to comprise a tridentate, tetradentate, pentadentate, or hexadentate ligand; and M is optionally coordinated to other ligands.

In some embodiments, the first organic light emitting device comprises an organic layer comprising a compound of formula I-A. In some embodiments, the first organic light emitting device comprises an organic layer comprising a compound of formula III. In some embodiments, the first organic light emitting device comprises an organic layer comprising a compound of formula III-A, In some embodiments, the first organic light emitting device comprises an organic layer comprising a compound of formula IV. In some embodiments, the first organic light emitting device comprises an organic layer comprising a compound of formula V. In some embodiments, the first organic light emitting device comprises an organic layer comprising a compound of formula VI.

In some embodiments, the organic layer of the device is an emissive layer and the compound comprising a ligand $L_A$ of formula I is an emitting dopant. In some embodiments, the compound of formula I-A is an emitting dopant. In some embodiments, the compound of formula III is an emitting dopant. In some embodiments, the compound of formula III-A is an emitting dopant. In some embodiments, the compound of formula IV is an emitting dopant. In some embodiments, the compound of formula V is an emitting dopant. In some embodiments, the compound of formula VI is an emitting dopant.

In some embodiments, the compound comprising a ligand $L_A$ of formula I is a phosphorescent emitting dopant. In some embodiments, the compound of formula I-A is a phosphorescent emitting dopant, in some embodiments, the compound of formula. III is a phosphorescent emitting dopant. In some embodiments, the compound of formula III-A is a phosphorescent emitting dopant. In some embodiments, the compound Of formula IV is a phosphorescent emitting dopant. In some embodiments, the compound of formula V is a phosphorescent emitting dopant. In some embodiments, the compound of formula VI is a phosphorescent emitting dopant.

In some embodiments, the organic layer of the device is an emissive layer and the compound comprising a ligand $L_A$ of formula I is a non-emissive dopant, in some embodiments, the compound of formula I-A is a non-emissive dopant. In some embodiments, the compound of formula III is a non-emissive dopant. In some embodiments, the compound of formula III-A is a non-emissive dopant. In some embodiments, the compound of formula IV is a non-emissive dopant. In some embodiments, the compound of formula V is a non-emissive dopant. In some embodiments, the compound of formula VI is a non-emissive dopant.

In some embodiments, the device is a consumer product. In some embodiments, the device is an organic light-emitting device. In some embodiments, the device comprises a lighting panel.

In some embodiments, the organic layer further comprises a host.

In some embodiments, the host comprises a triphenylene-containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, $C_nH_{2n}{-}Ar_1$, or no substitution;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments, the host comprises at least one chemical group selected from the group consisting of carbazole, dibenzothiophene, dibenzofuran, dibenzoselenophene, azacarbazole, aza-dibenzothiophene, aza-dibenzofuran, and aza-dibenzoselenophene. In some embodiments, the host is a metal complex.

In some embodiments, the host is selected from the group consisting of:

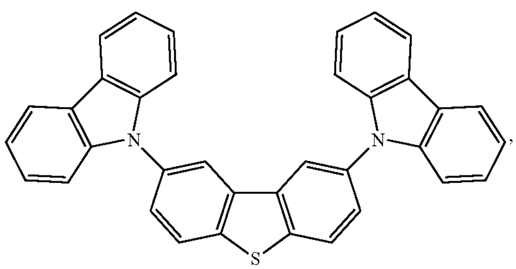

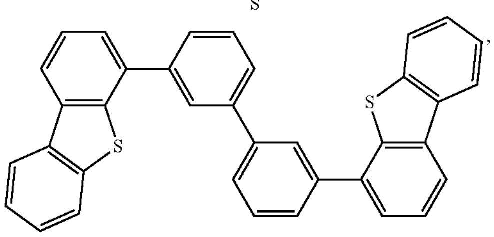

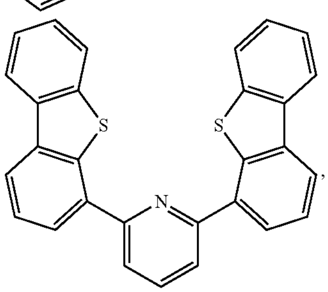

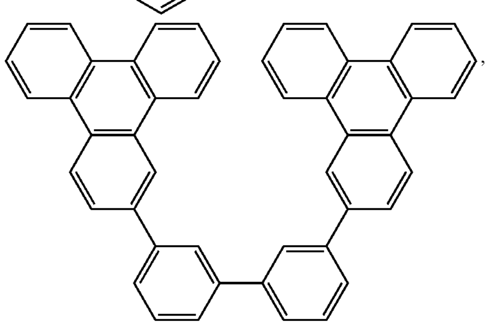

-continued

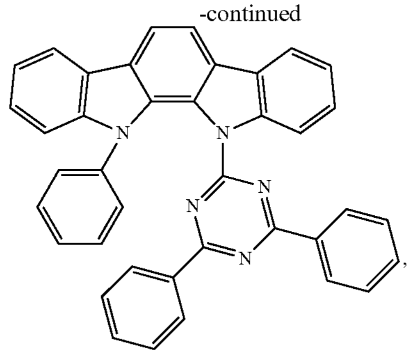

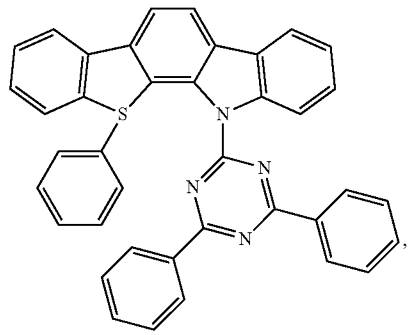

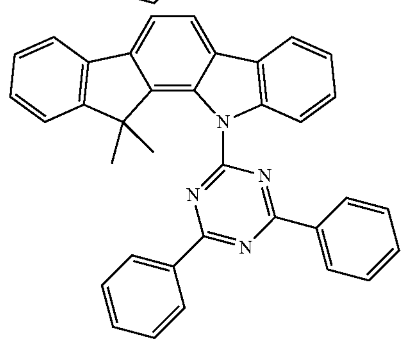

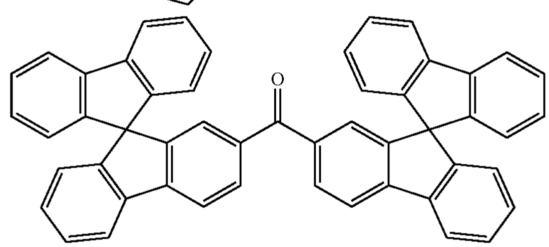

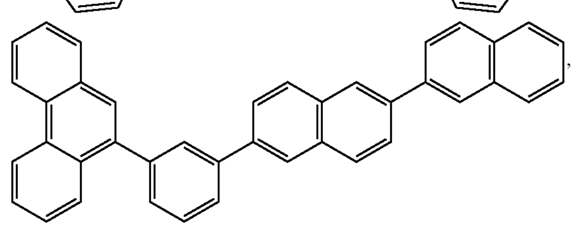

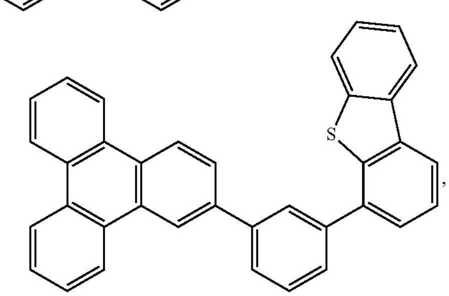

-continued

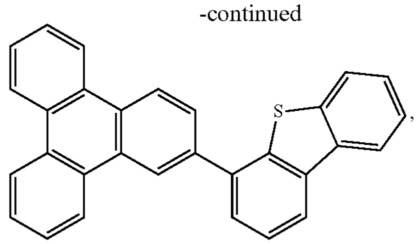

and combinations thereof.

In some embodiments, the compounds described herein are provided in a formulation with other materials present in the device. For example, the compounds of the invention may be provided in a formulation in conjunction with a wide variety of hosts, transport layers, blocking layers, injection layers, electrodes, or other layers.

In some embodiments, a formulation comprising a compound comprising a ligand $L_A$ of formula I:

(I)

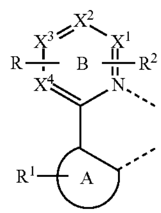

is provided. In the ligand $L_A$ of formula I, ring A is a 5-membered or 6-membered carbocyclic or heterocyclic ring; R is fused to ring B and has formula II:

(II)

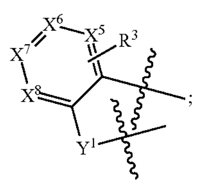

the wave lines indicate bonds to ring B; $R^1$ and $R^3$ each independently represent mono, di, tri, or tetra substitution, or no substitution; $R^2$ represents mono or di substitution, or no substitution; $X^1$, $X^2$, $X^3$, $X^4$, $X^5$, $X^6$, $X^7$, and $X^8$ are each independently carbon or nitrogen; at least one of $X^1$, $X^2$, $X^3$, $X^4$, $X^5$, $X^6$, $X^7$, and $X^8$ is nitrogen; $Y^1$ is selected from the group consisting of BR', NR', PR', O, S, Se, C=O, S=O, $SO_2$, CR'R", SiR'R", and GeR'R"; $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, or wherein any two adjacent substituents are optionally joined to form a ring, which can be further substituted; $L_A$ is coordinated to metal M; $L_A$ is optionally linked with other ligands to comprise a tridentate, tetradentate, pentadentate, or hexadentate ligand; and M is optionally coordinated to other ligands.

In some embodiments, the formulation comprises a compound of formula I-A. In some embodiments, the formulation comprises a compound of formula III. In some embodiments, the formulation comprises a compound of formula III-A. In some embodiments, the formulation comprises a compound of formula IV. In some embodiments, the formulation comprises a compound of formula V. In some embodiments, the formulation comprises a compound of formula VI.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and cross-linkable compounds.

Examples of aromatic amine derivatives used in HIL or HTL include, but are not limited to the following general structures:

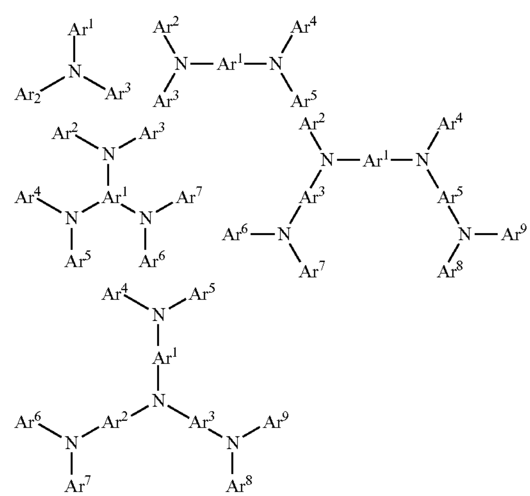

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, $Ar^1$ to $Ar^9$ is independently selected from the group consisting of:

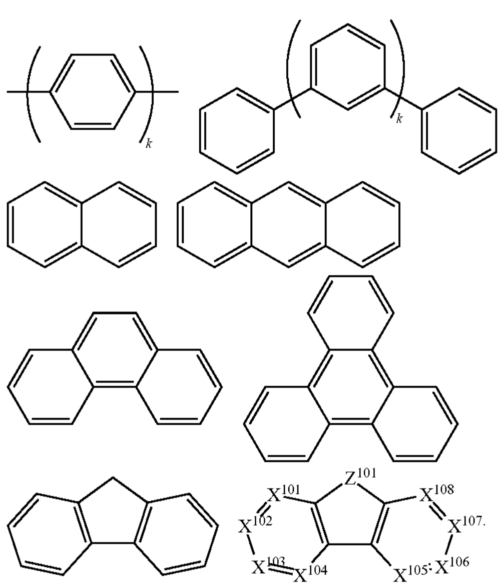

k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

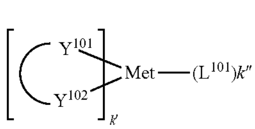

Met is a metal; ($Y^{101}$-$Y^{102}$) is a bidentate ligand, and $Y^{102}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, ($Y^{101}$-$Y^{102}$) is a 2-phenylpyridine derivative.

In some embodiments, ($Y^{101}$-$Y^{102}$) is a carbene ligand.

In some embodiments, Met is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

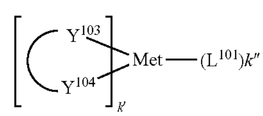

Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, the metal complexes are:

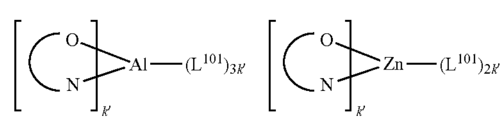

(O—N) is a bidentate ligand, having metal coordinated to atoms O and N.

In some embodiments, Met is selected from Ir and Pt.

In a further aspect, ($Y^{103}$-$Y^{104}$) is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group.

Wherein each group is further substituted by a substituent selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, the host compound contains at least one of the following groups in the molecule:

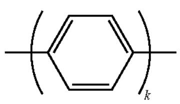
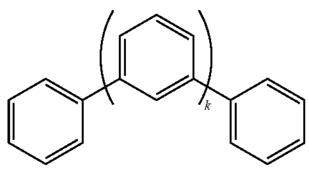
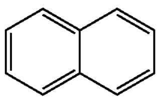
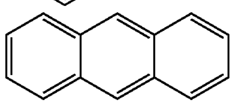
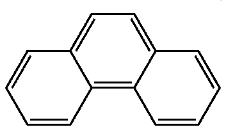
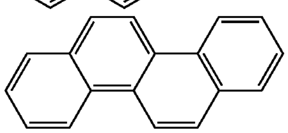
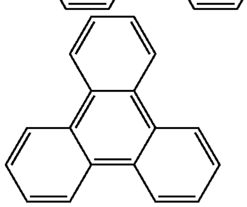
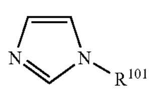
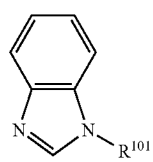
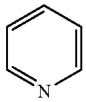
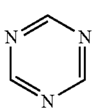
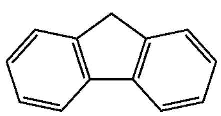
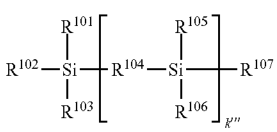
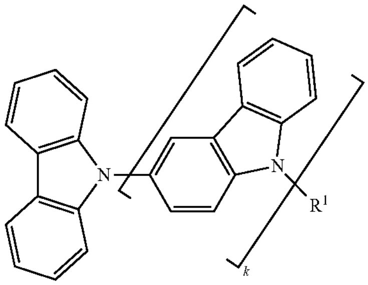

-continued

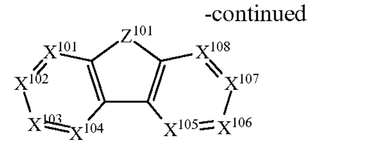
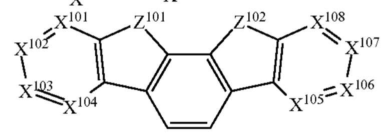
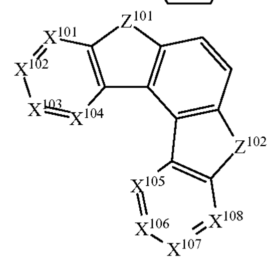
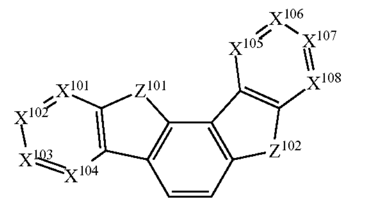
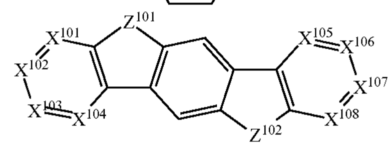
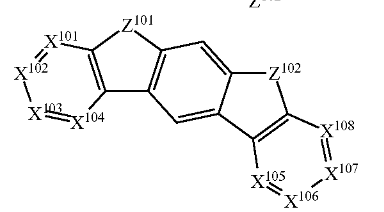

$R^{101}$ to $R^{107}$ is independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

k is an integer from 1 to 20; k''' is an integer from 0 to 20.

$X^{101}$ to $X^{108}$ is selected from C (including CH) or N.

$Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In some embodiments, compound used in HBL contains the same molecule or the same functional groups used as host described above.

In some embodiments, compound used in HBL contains at least one of the following groups in the molecule:

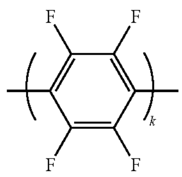
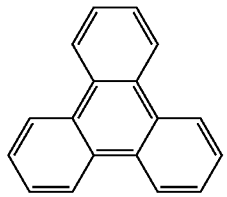
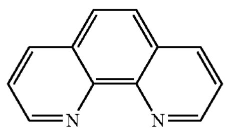
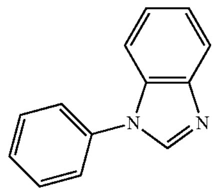
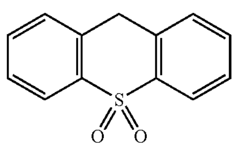
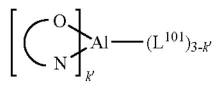

k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In some embodiments, compound used in ETL contains at least one of the following groups in the molecule:

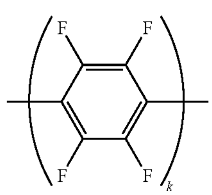
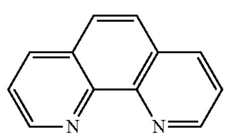
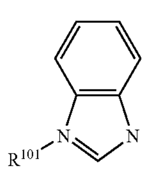
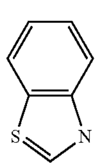
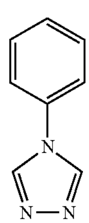
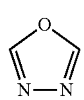
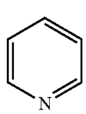
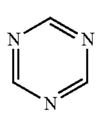
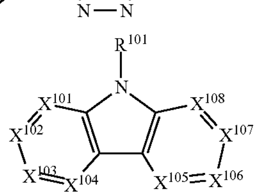
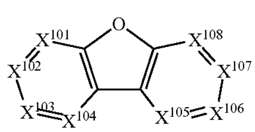
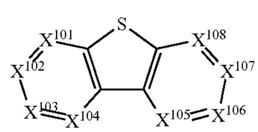

-continued

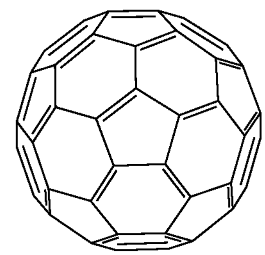
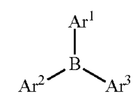

$R^{101}$ is selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 1 to 20.

$X^{101}$ to $X^{108}$ is selected from C (including CH) or N.

In some embodiments, the metal complexes used in ETL contains, but are not limited to the following general formula:

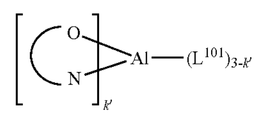
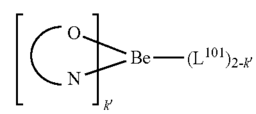
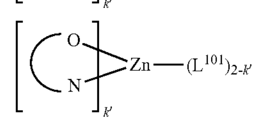
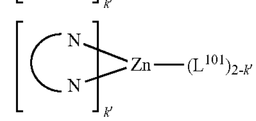

(O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in TABLE 4 below. TABLE 4 lists non-limiting classes of materials, non-limiting examples of compounds for each class, and references that disclose the materials.

TABLE 4
| MATERIAL | EXAMPLES OF MATERIAL | PUBLICATIONS |
|---|---|---|
| | Hole injection materials | |
| Phthalocyanine and porphyrin compounds | 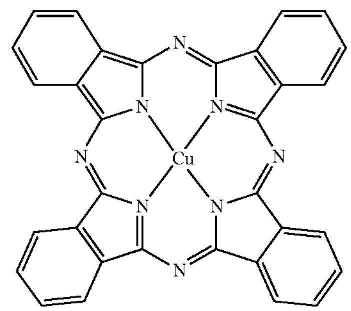 | Appl. Phys. Lett. 69, 2160 (1996) |
| Starburst triarylamines | 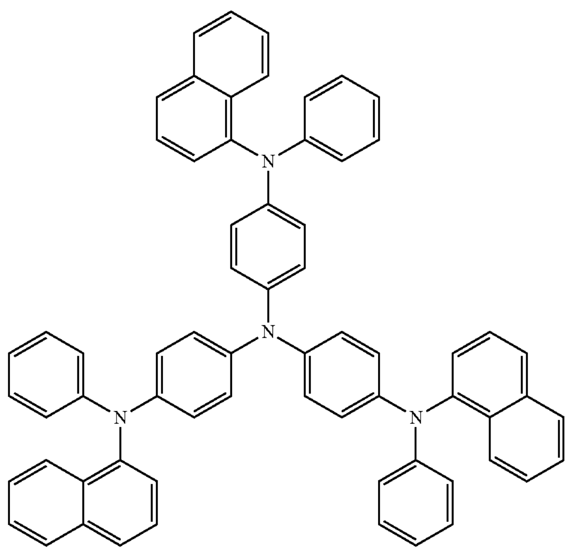 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-\!\!\left[CH_xF_y\right]_n\!\!-$ | Appl. Phys. Lett. 78, 673 (2001) |
| Conducting polymers (e.g., PEDOT:PSS, polyaniline, polythiophene) | 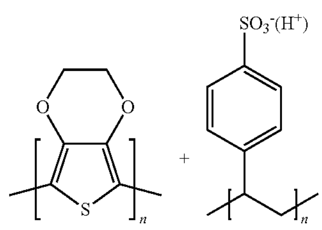 | Synth. Met. 87, 171 (1997) WO2007002683 |
| Phosphonic acid and silane SAMs | 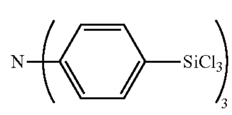 | US20030162053 |

TABLE 4-continued

| MATERIAL | EXAMPLES OF MATERIAL | PUBLICATIONS |
| --- | --- | --- |
| Triarylamine or polythiophene polymers with conductivity dopants | 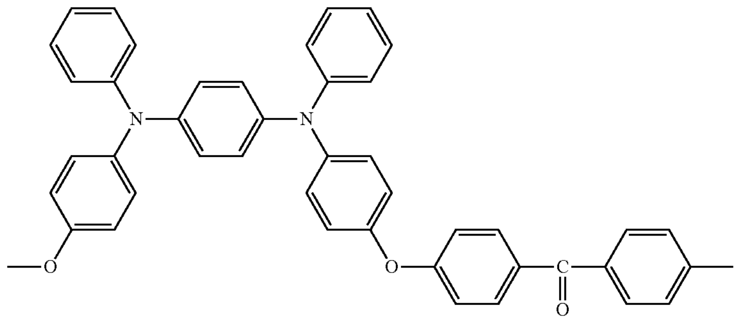 and<br>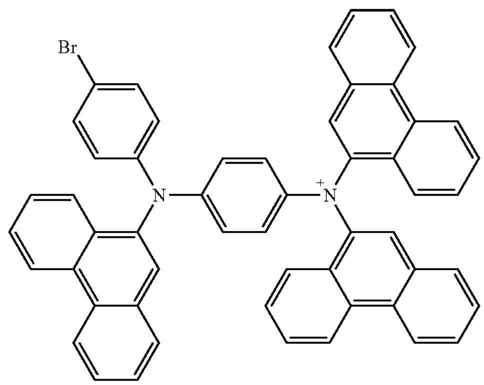 [SMILES: Brc1ccc(N(c2ccc(N(c3cc4ccccc4c4ccccc34)c3cc4ccccc4c4ccccc34)cc2)c2cc3ccccc3c3ccccc23)cc1]<br>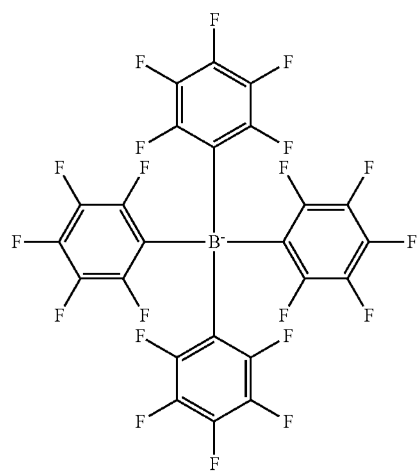 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | EP1725079A1 |
| Organic compounds with conductive inorganic compounds, such as molybdenum and tungsten oxides | 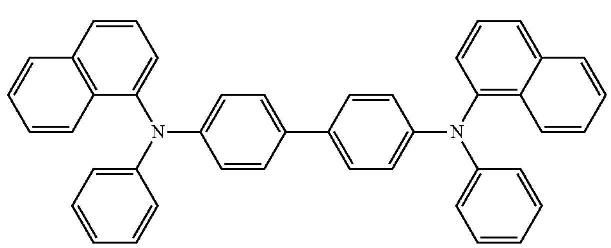 + $MoO_x$ | US20050123751<br>SID Symposium Digest, 37, 923 (2006)<br>WO2009018009 |
| n-type semiconducting organic complexes | | US20020158242 |
| Metal organometallic complexes | | US20060240279 |
| Cross-linkable compounds | | US20080220265 |

TABLE 4-continued
| MATERIAL | EXAMPLES OF MATERIAL | PUBLICATIONS |
|---|---|---|
| Polythiophene based polymers and copolymers | 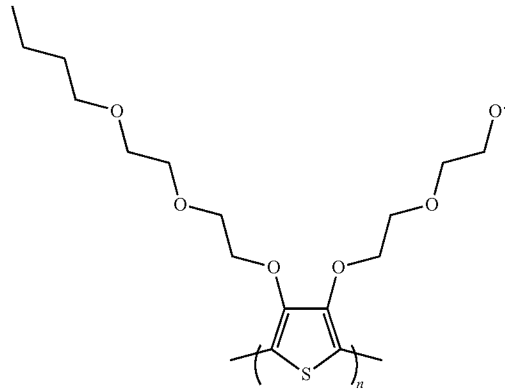 | WO 2011075644 EP2350216 |
| | Hole transporting materials | |
| Triarylamines (e.g., TPD, α-NPD) | 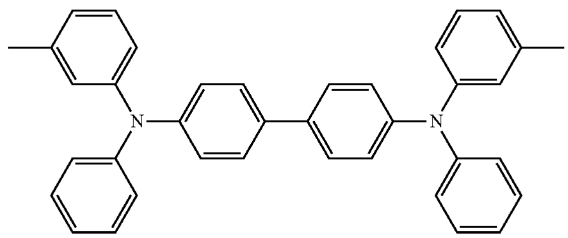 | Appl. Phys. Lett. 51, 913 (1987) |
| | 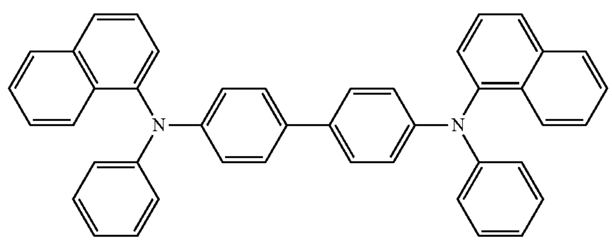 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 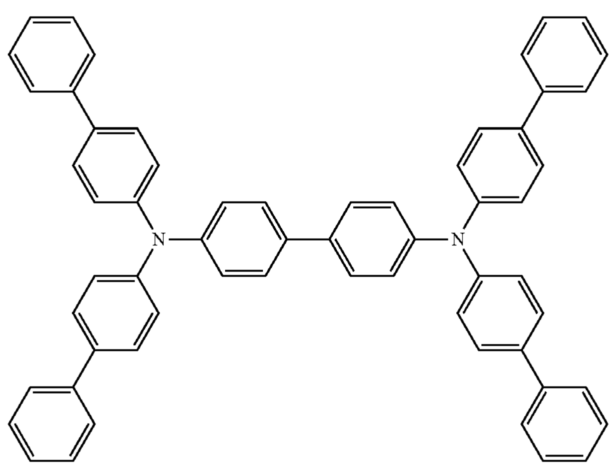 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |

TABLE 4-continued
| MATERIAL | EXAMPLES OF MATERIAL | PUBLICATIONS |
| --- | --- | --- |
| | 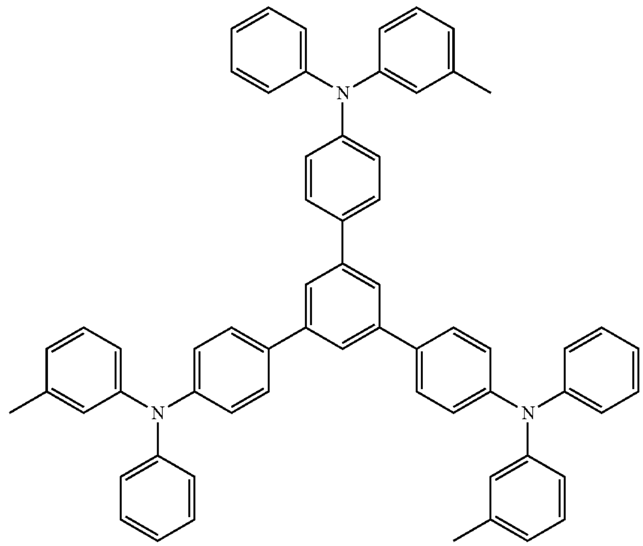 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 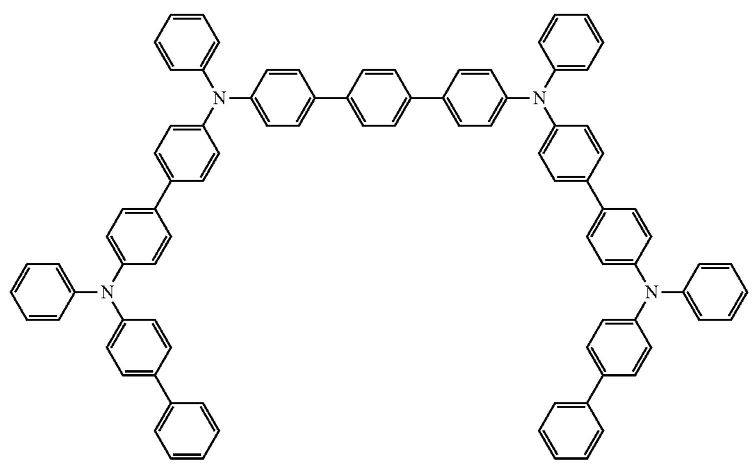 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
| | 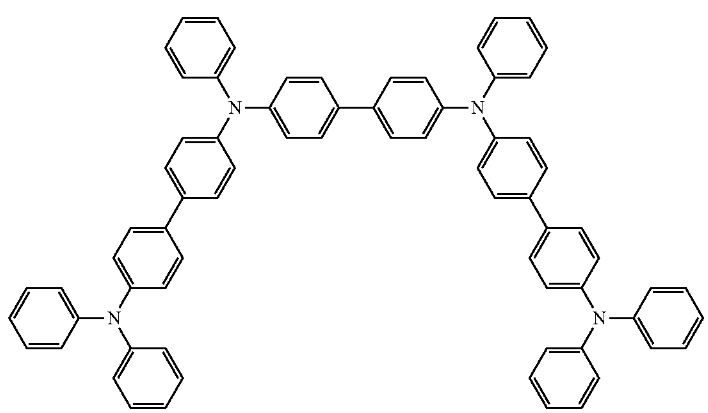 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triarylamine on spirofluorene core | 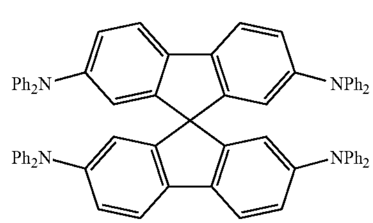 | Synth. Met. 91, 209 (1997) |

TABLE 4-continued
| MATERIAL | EXAMPLES OF MATERIAL | PUBLICATIONS |
|---|---|---|
| Arylamine carbazole compounds | 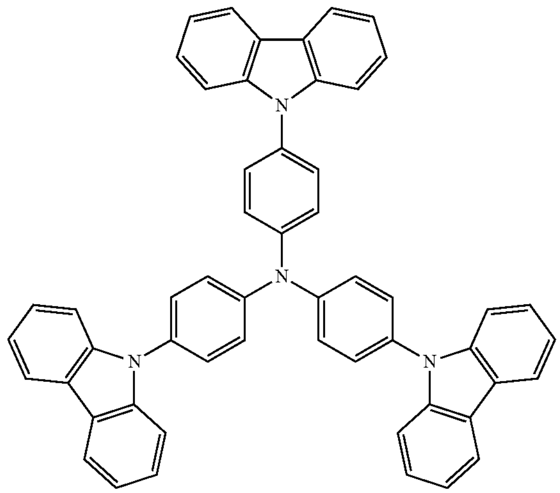 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |
| Triarylamine with (di)benzothiophene/ (di)benzofuran | 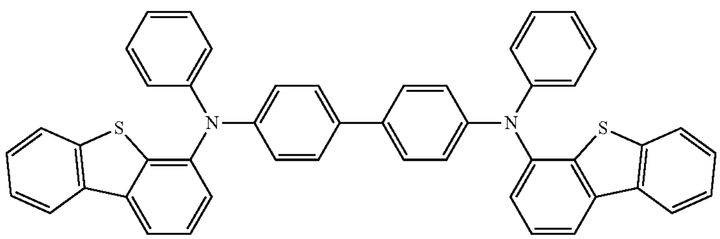 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 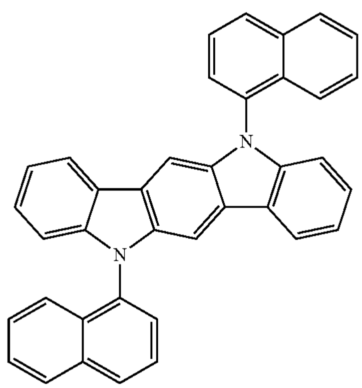 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 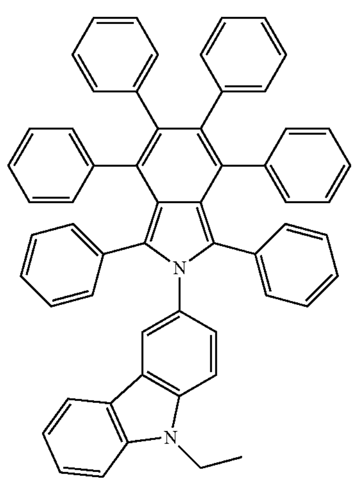 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |

TABLE 4-continued
| MATERIAL | EXAMPLES OF MATERIAL | PUBLICATIONS |
|---|---|---|
| Metal carbene complexes | 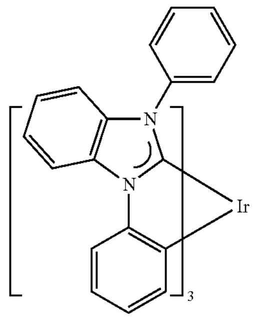 | US20080018221 |
| | Phosphorescent OLED host materials<br>Red hosts | |
| Arylcarbazoles | 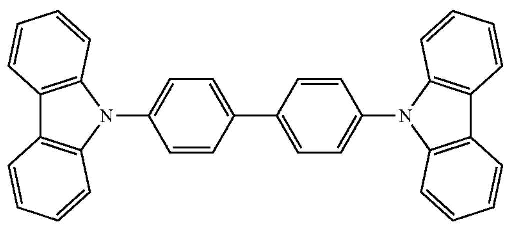 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., $Alq_3$, BAlq) | 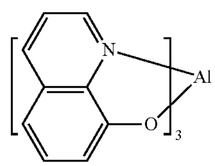 | Nature 395, 151 (1998) |
| | 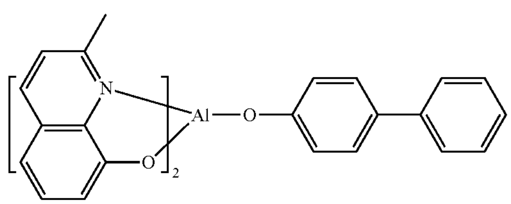 | US20060202194 |
| | 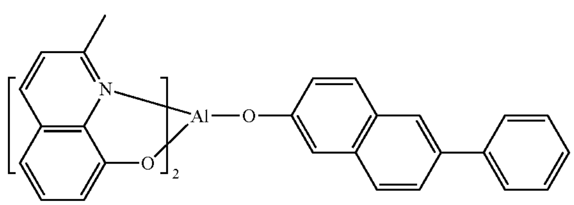 | WO2005014551 |
| | 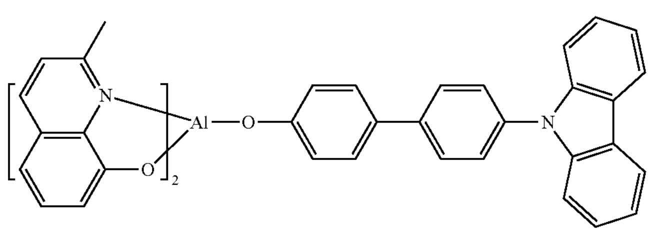 | WO2006072002 |

TABLE 4-continued
| MATERIAL | EXAMPLES OF MATERIAL | PUBLICATIONS |
|---|---|---|
| Metal phenoxybenzothiazole compounds | 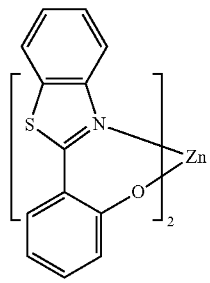 | Appl. Phys. Lett. 90, 123509 (2007) |
| Conjugated oligomers and polymers (e.g., polyfluorene) | 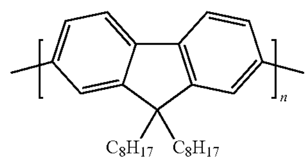 | Org. Electron. 1, 15 (2000) |
| Aromatic fused rings | 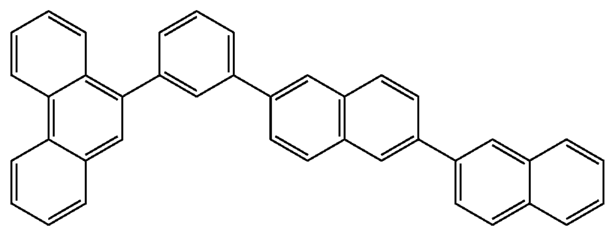 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |
| Zinc complexes | 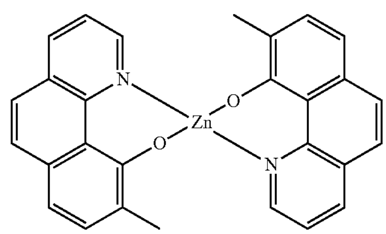 | WO2010056066 |
| Chrysene based compounds | 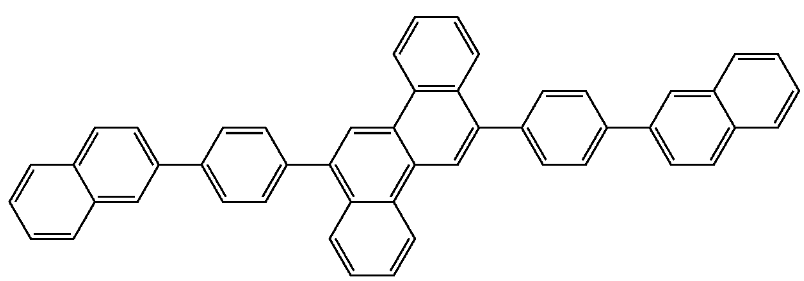 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| | Green hosts | |
| Arylcarbazoles | 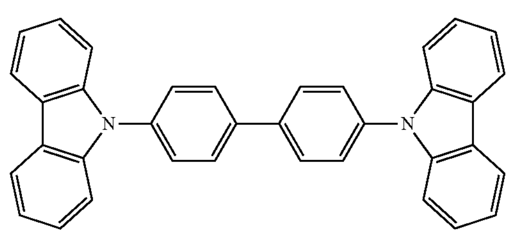 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |

TABLE 4-continued
| MATERIAL | EXAMPLES OF MATERIAL | PUBLICATIONS |
|---|---|---|
| | 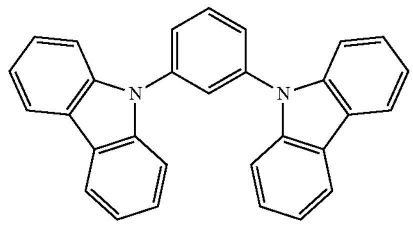 [SMILES: c1cc(-n2c3ccccc3c3ccccc32)cc(-n2c3ccccc3c3ccccc32)c1] | US20030175553 |
| | 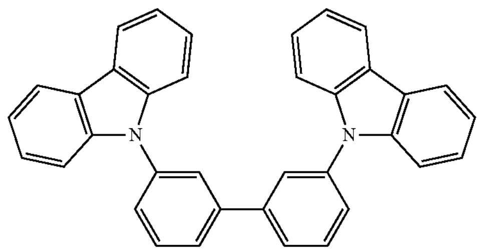 [SMILES: c1cc(-c2cccc(-n3c4ccccc4c4ccccc43)c2)cc(-n2c3ccccc3c3ccccc32)c1] | WO2001039234 |
| Aryltriphenylene compounds | 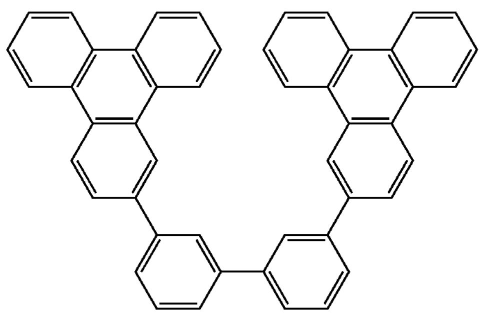 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 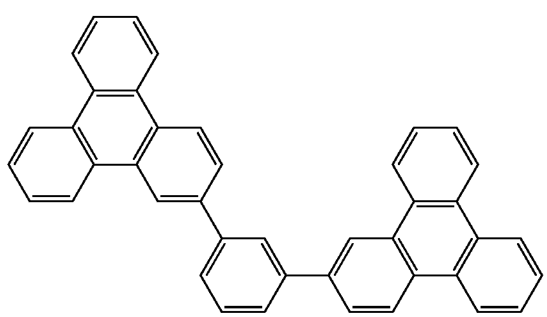 [SMILES: c1cc(-c2ccc3c4ccccc4c4ccccc4c3c2)cc(-c2ccc3c4ccccc4c4ccccc4c3c2)c1] | US20060280965 |
| | 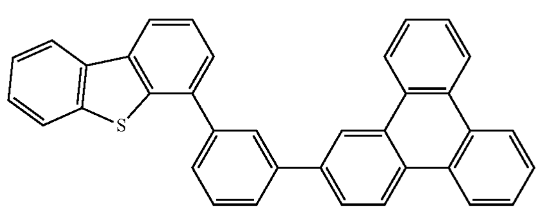 [SMILES: c1cc(-c2ccc3c4ccccc4c4ccccc4c3c2)cc(-c2cccc3c2sc2ccccc23)c1] | WO2009021126 |

TABLE 4-continued
| MATERIAL | EXAMPLES OF MATERIAL | PUBLICATIONS |
| --- | --- | --- |
| Poly-fused heteroaryl compounds | 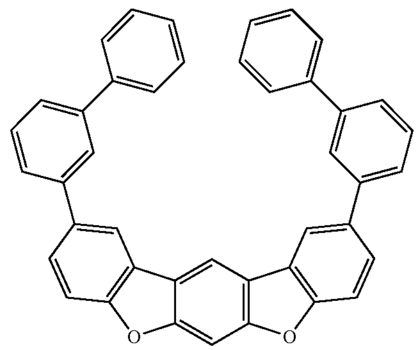 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 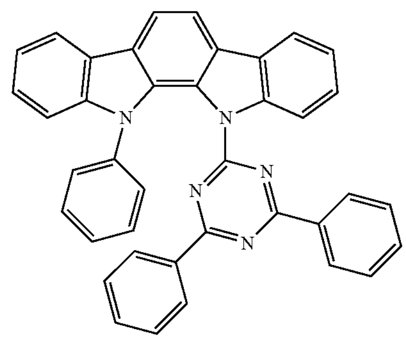 [SMILES: c1ccc(-c2nc(-c3ccccc3)nc(-n3c4ccccc4c4ccc5c6ccccc6n(-c6ccccc6)c5c43)n2)cc1] | WO2008056746 |
| | 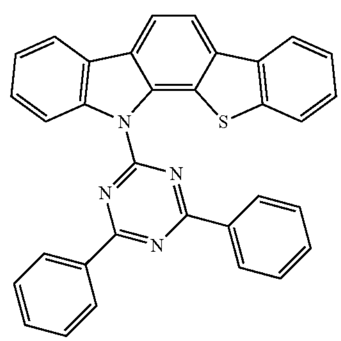 [SMILES: c1ccc(-c2nc(-c3ccccc3)nc(-n3c4ccccc4c4ccc5c6ccccc6sc5c43)n2)cc1] | WO2010107244 |
| Aza-carbazole/ DBT/DBF | 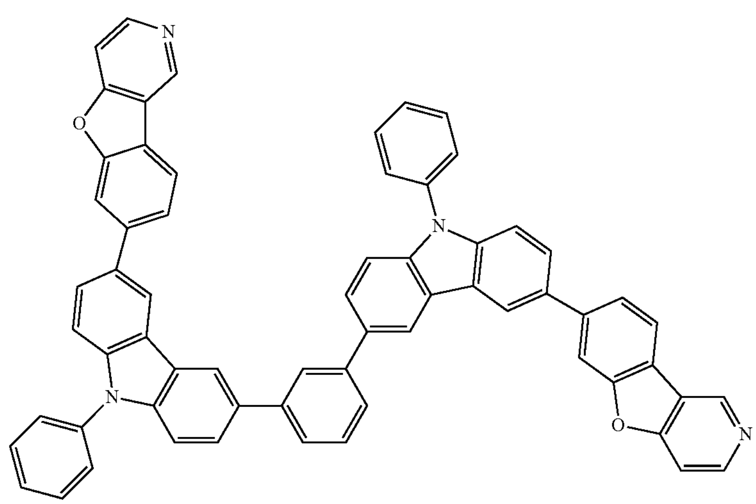 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |

TABLE 4-continued
| MATERIAL | EXAMPLES OF MATERIAL | PUBLICATIONS |
|---|---|---|
| | 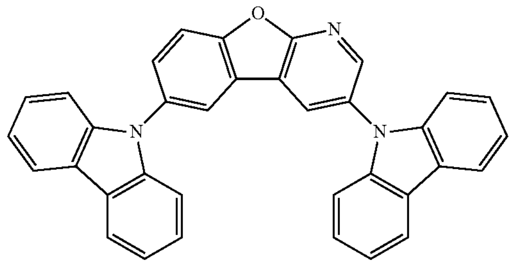 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 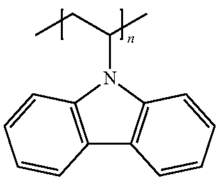 | Appl. Phys. Lett. 77, 2280 (2000) |
| Spirofluorene compounds | 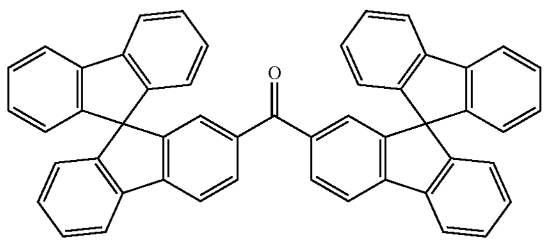 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |
| Metal phenoxybenzooxazole compounds | 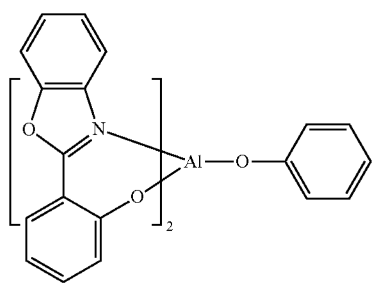 | WO2005089025 |
| | 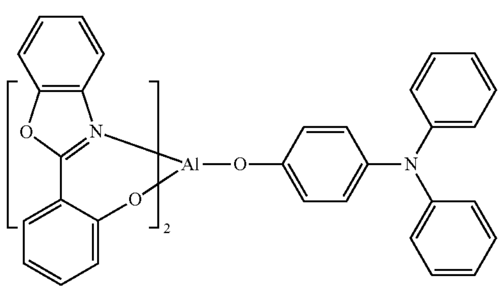 | WO2006132173 |
| | 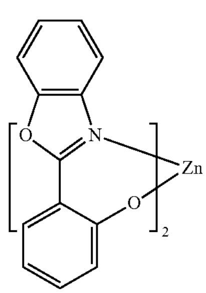 | JP200511610 |

TABLE 4-continued
| MATERIAL | EXAMPLES OF MATERIAL | PUBLICATIONS |
|---|---|---|
| Spirofluorene-carbazole compounds | 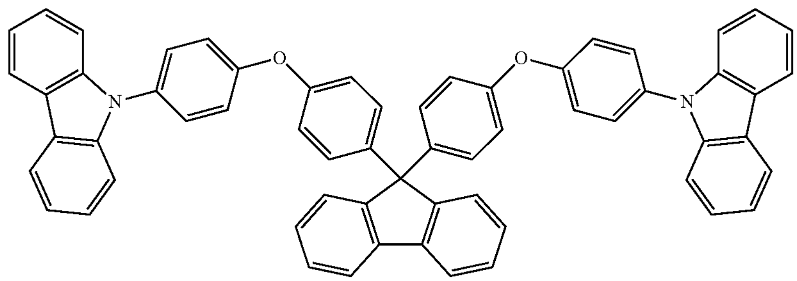 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 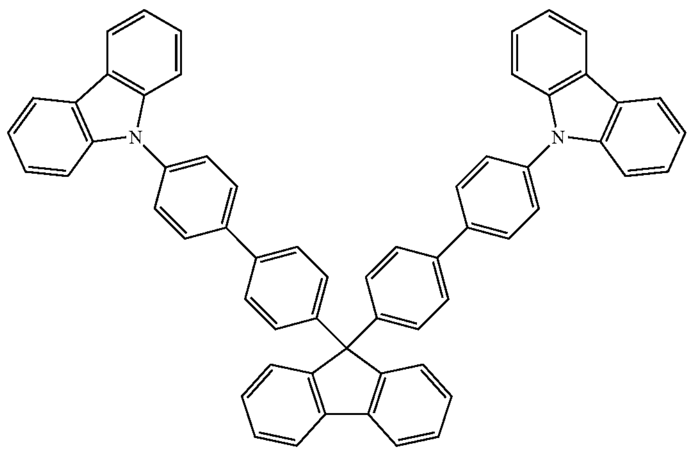 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocarbazoles | 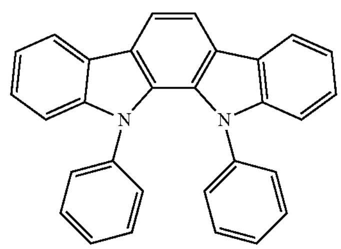 [SMILES: c1ccc(-n2c3ccccc3c3ccc4c5ccccc5n(-c5ccccc5)c4c32)cc1] | WO2007063796 |
| | 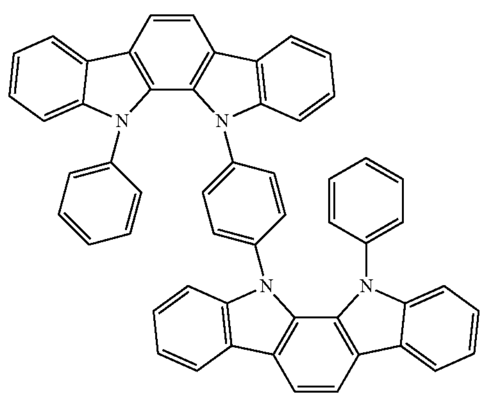 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 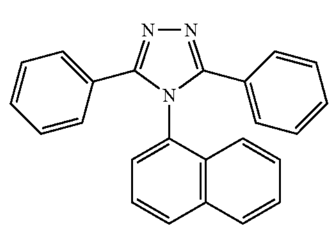 [SMILES: c1ccc(-c2nnc(-c3ccccc3)n2-c2cccc3ccccc23)cc1] | J. Appl. Phys. 90, 5048 (2001) |

TABLE 4-continued
| MATERIAL | EXAMPLES OF MATERIAL | PUBLICATIONS |
|---|---|---|
| | 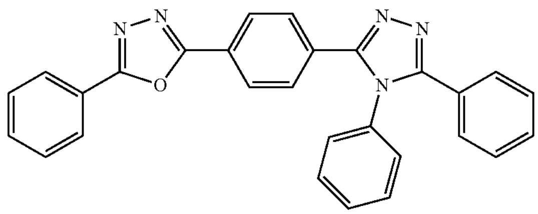 [SMILES: c1ccc(-c2nnc(-c3ccc(-c4nnc(-c5ccccc5)n4-c4ccccc4)cc3)o2)cc1] | WO2004107822 |
| Tetraphenylene complexes | 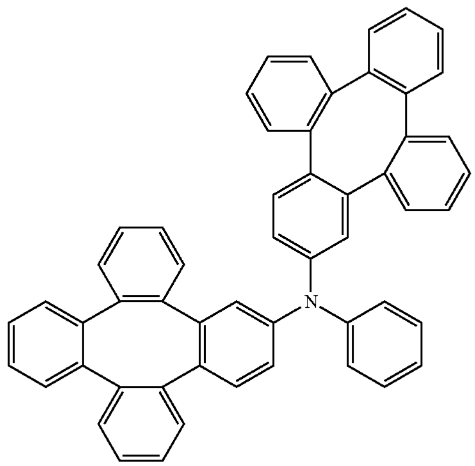 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |
| Metal phenoxypyridine compounds | 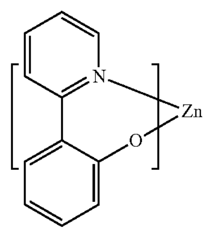 | WO2005030900 |
| Metal coordination complexes (e.g., Zn, Al with N^N ligands) | 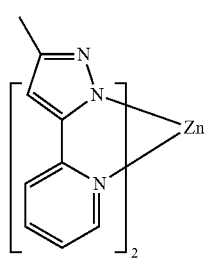 | US20040137268, US20040137267 |
| | Blue hosts | |
| Arylcarbazoles | 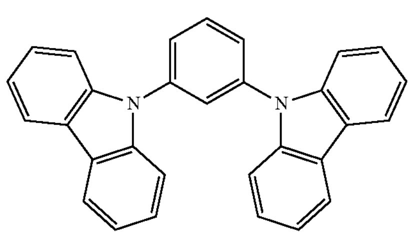 [SMILES: c1cc(-n2c3ccccc3c3ccccc32)cc(-n2c3ccccc3c3ccccc32)c1] | Appl. Phys. Lett, 82, 2422 (2003) |

TABLE 4-continued
| MATERIAL | EXAMPLES OF MATERIAL | PUBLICATIONS |
|---|---|---|
| | 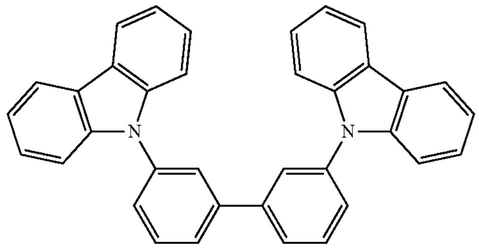 [SMILES: c1cc(-c2cccc(-n3c4ccccc4c4ccccc43)c2)cc(-n2c3ccccc3c3ccccc32)c1] | US20070190359 |
| Dibenzothiophene/ Dibenzofuran-carbazole compounds | 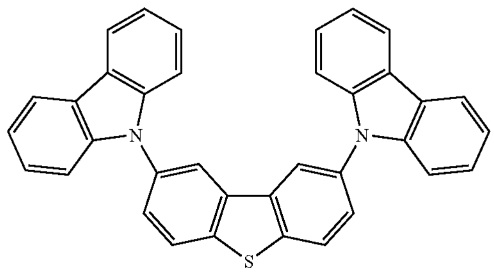 [SMILES: c1ccc2c(c1)c1ccccc1n2-c1ccc2sc3ccc(-n4c5ccccc5c5ccccc54)cc3c2c1] | WO2006114966, US20090167162 |
| | 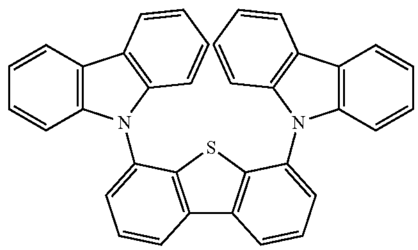 [SMILES: c1cc(-n2c3ccccc3c3ccccc32)c2sc3c(-n4c5ccccc5c5ccccc54)cccc3c2c1] | US20090167162 |
| | 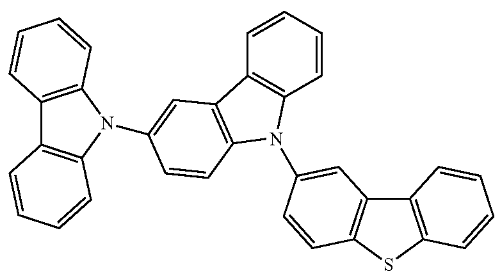 [SMILES: c1ccc2c(c1)sc1ccc(-n3c4ccccc4c4cc(-n5c6ccccc6c6ccccc65)ccc43)cc12] | WO2009086028 |
| | 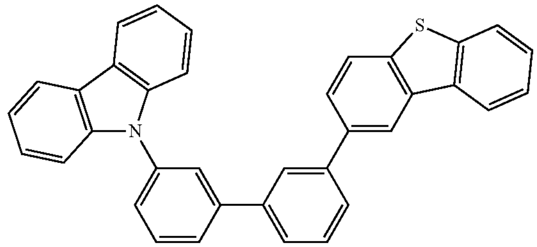 [SMILES: c1cc(-c2cccc(-n3c4ccccc4c4ccccc43)c2)cc(-c2ccc3sc4ccccc4c3c2)c1] | US20090030202, US20090017330 |
| | 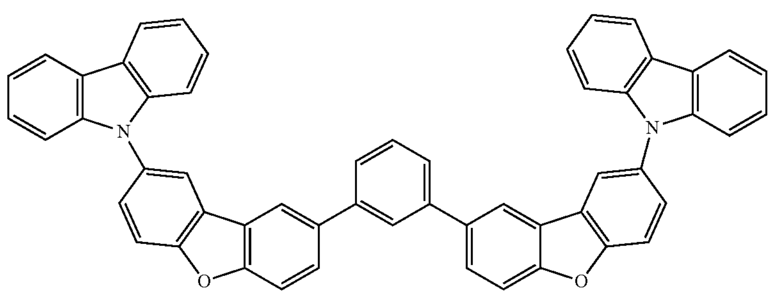 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |

TABLE 4-continued
| MATERIAL | EXAMPLES OF MATERIAL | PUBLICATIONS |
|---|---|---|
| Silicon aryl compounds | 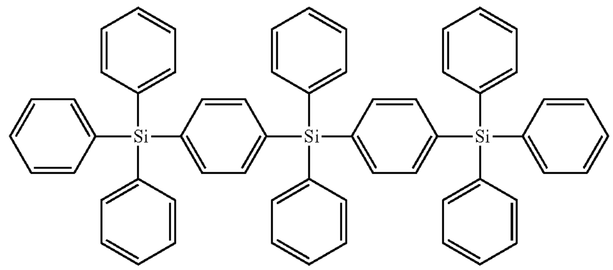 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 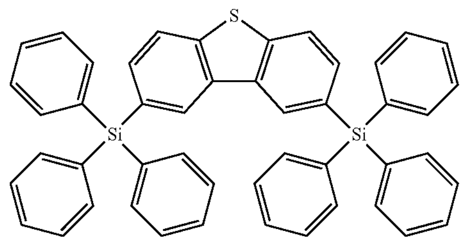 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |
| Silicon/Germanium aryl compounds | 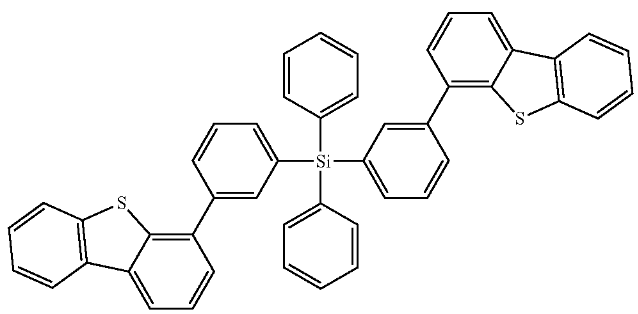 [SMILES: c1ccc([Si](c2ccccc2)(c2cccc(-c3cccc4c3sc3ccccc34)c2)c2cccc(-c3cccc4c3sc3ccccc34)c2)cc1] | EP2034538A |
| Aryl benzoyl ester | 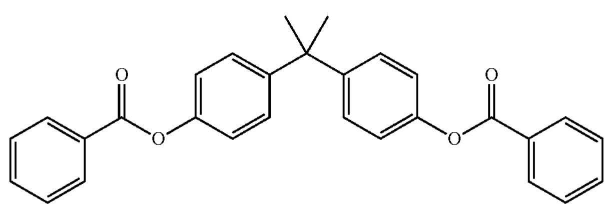 [SMILES: CC(C)(c1ccc(OC(=O)c2ccccc2)cc1)c1ccc(OC(=O)c2ccccc2)cc1] | WO2006100298 |
| Carbazole linked by non-conjugated groups | 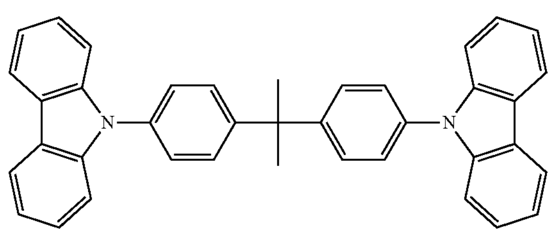 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 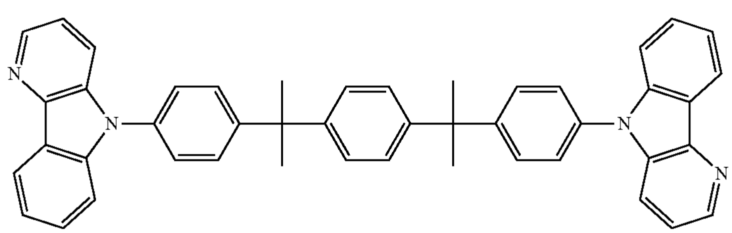 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |

TABLE 4-continued
| MATERIAL | EXAMPLES OF MATERIAL | PUBLICATIONS |
|---|---|---|
| High triplet metal organometallic complex | 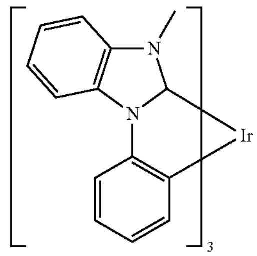 | U.S. Pat. No. 7,154,114 |
| | Phosphorescent dopants<br>Red dopants | |
| Heavy metal porphyrins (e.g., PtOEP) | 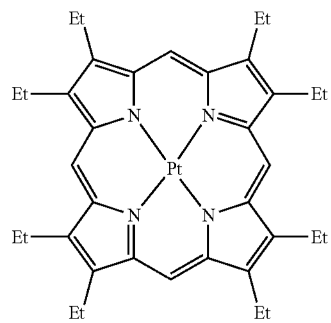 | Nature 395, 151 (1998) |
| Iridium(III) organometallic complexes | 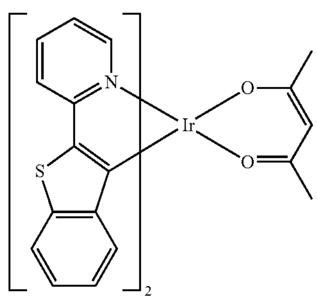 | Appl. Phys. Lett. 78, 1622 (2001) |
| | 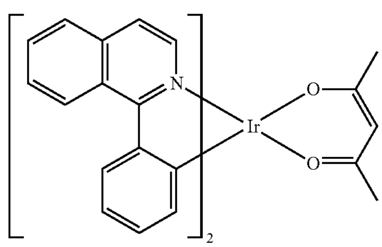 | US2006835469 |
| | 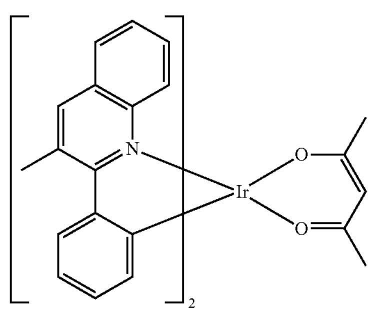 | US2006835469 |

TABLE 4-continued
| MATERIAL | EXAMPLES OF MATERIAL | PUBLICATIONS |
|---|---|---|
| | 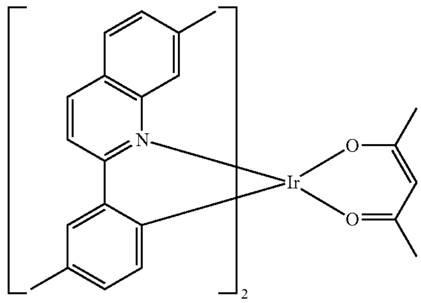 | US20060202194 |
| | 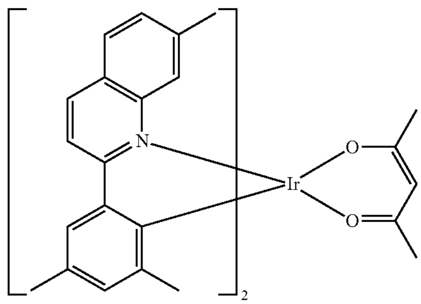 | US20060202194 |
| | 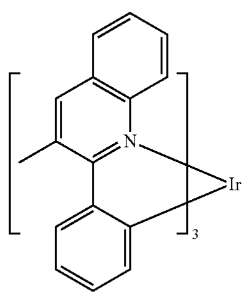 | US20070087321 |
| | 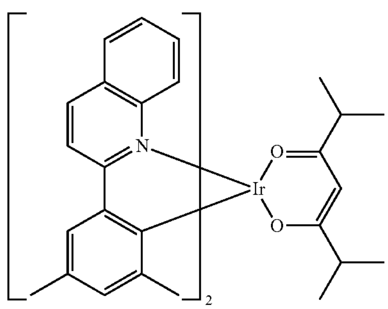 | US20080261076 US20100090591 |
| | 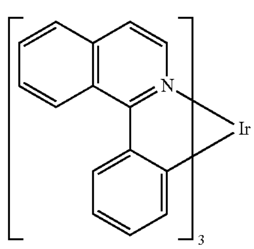 | US20070087321 |

TABLE 4-continued
| MATERIAL | EXAMPLES OF MATERIAL | PUBLICATIONS |
|---|---|---|
| | 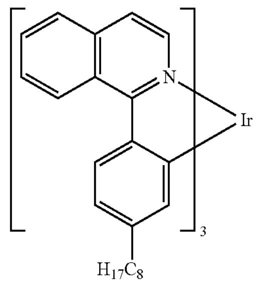 | Adv. Mater. 19, 739 (2007) |
| | 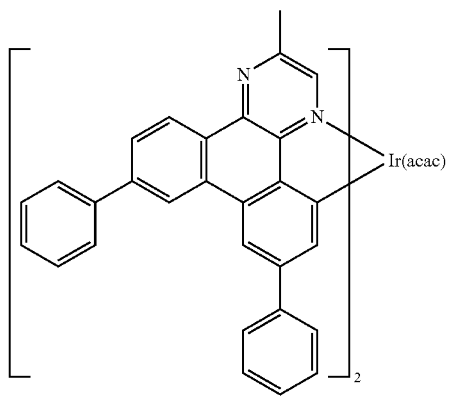 | WO2009100991 |
| | 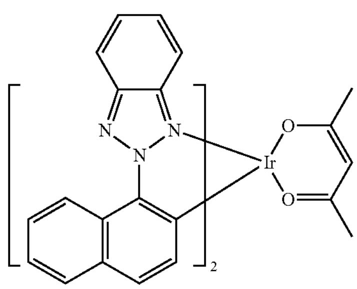 | WO2008101842 |
| | 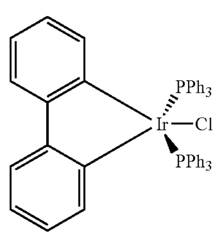 | U.S. Pat. No. 7,232,618 |
| Platinum(II) organometallic complexes | 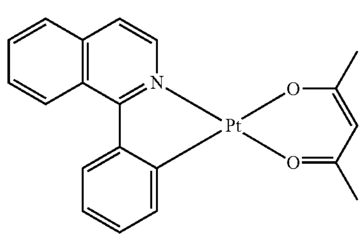 | WO2003040257 |

TABLE 4-continued
| MATERIAL | EXAMPLES OF MATERIAL | PUBLICATIONS |
|---|---|---|
| | 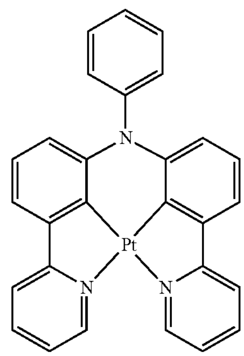 | US20070103060 |
| Osmium(III) complexes | 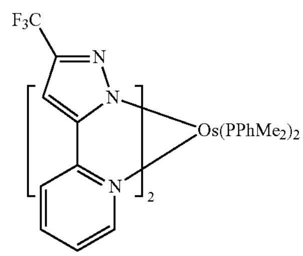 | Chem. Mater. 17, 3532 (2005) |
| Ruthenium(II) complexes | 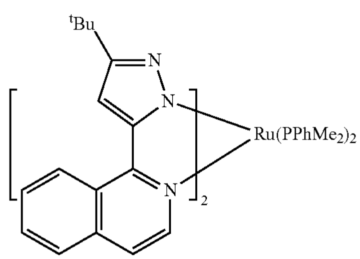 | Adv. Mater. 17, 1059 (2005) |
| Rhenium (I), (II), and (III) complexes | | US20050244673 |
| | Green dopants | |
| Iridium(III) organometallic complexes | 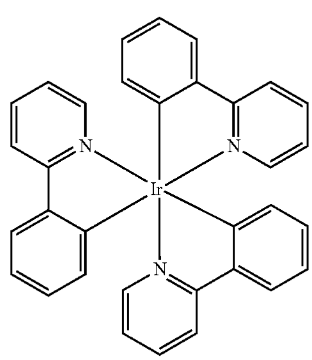 and its derivatives | Inorg. Chem. 40, 1704 (2001) |

TABLE 4-continued
| MATERIAL | EXAMPLES OF MATERIAL | PUBLICATIONS |
| --- | --- | --- |
| | 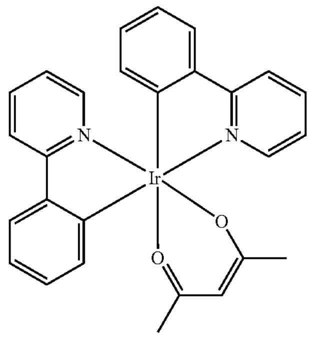 | US20020034656 |
| | 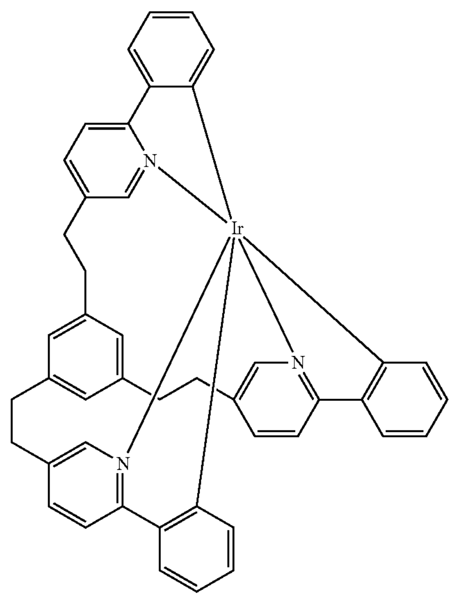 | U.S. Pat. No. 7,332,232 |
| | | US20090108737 |
| | 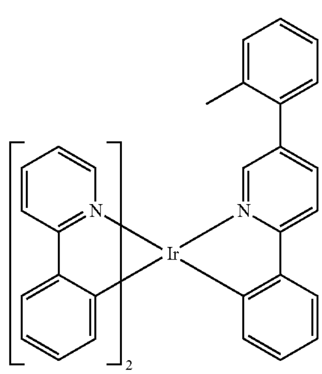 | WO2010028151 |

TABLE 4-continued
| MATERIAL | EXAMPLES OF MATERIAL | PUBLICATIONS |
|---|---|---|
| | 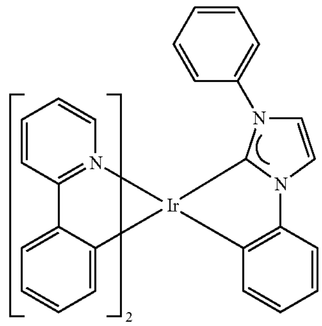 | EP1841834B |
| | 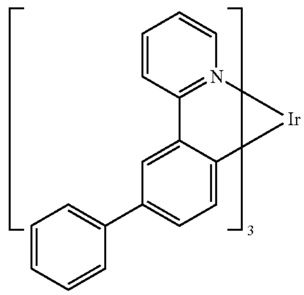 | US20060127696 |
| | 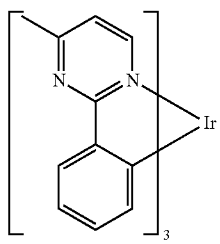 | US20090039776 |
| | 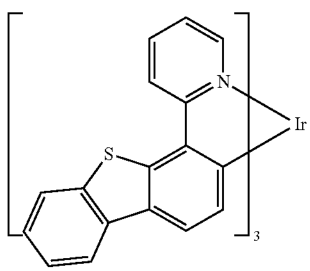 | U.S. Pat. No. 6,921,915 |
| | 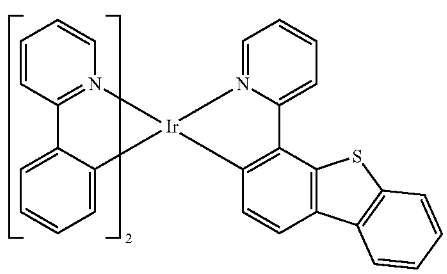 | US20100244004 |

TABLE 4-continued
| MATERIAL | EXAMPLES OF MATERIAL | PUBLICATIONS |
|---|---|---|
| | 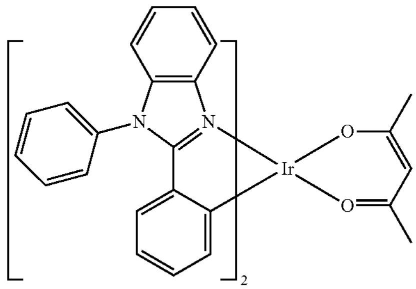 | U.S. Pat. No. 6,687,266 |
| | 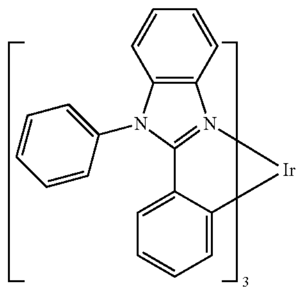 | Chem. Mater. 16, 2480 (2004) |
| | 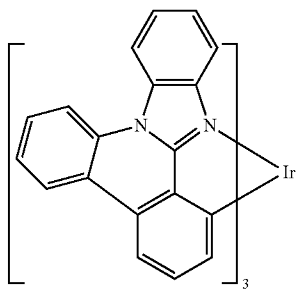 | US20070190359 |
| | 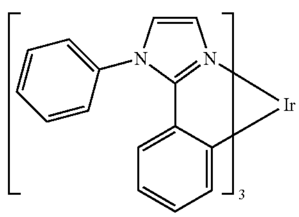 | US 20060008670 JP2007123392 |
| | 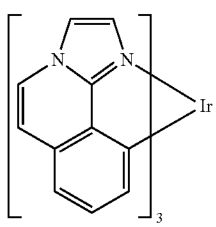 | WO2010086089, WO2011044988 |
| | 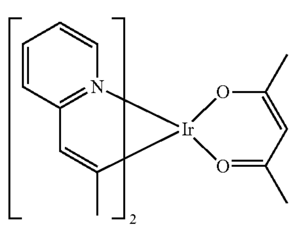 | Adv. Mater. 16, 2003 (2004) |

TABLE 4-continued
| MATERIAL | EXAMPLES OF MATERIAL | PUBLICATIONS |
| --- | --- | --- |
| | 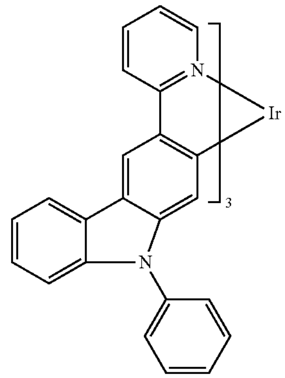 | Angew. Chem. Int. Ed. 2006, 45, 7800 |
| | 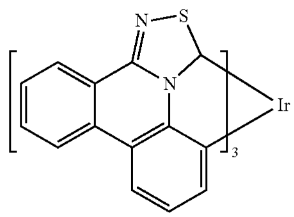 | WO2009050290 |
| | 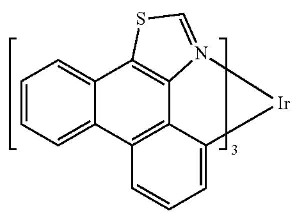 | US20090165846 |
| | 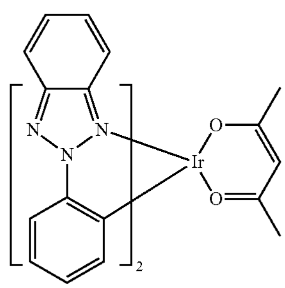 | US20080015355 |
| | 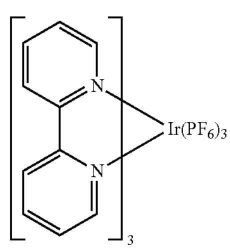 | US20010015432 |
| | 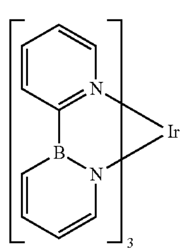 | US20100295032 |

TABLE 4-continued
| MATERIAL | EXAMPLES OF MATERIAL | PUBLICATIONS |
|---|---|---|
| Monomer for polymeric metal organometallic compounds | 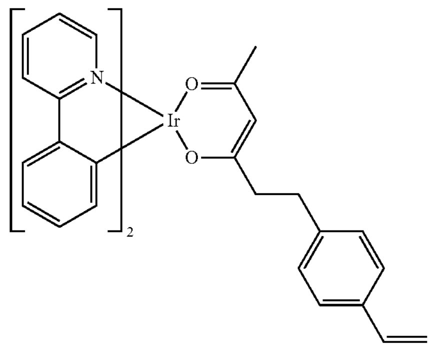 | U.S. Pat. No. 7,250,226, U.S. Pat. No. 7,396,598 |
| Pt(II) organometallic complexes, including polydentated ligands | 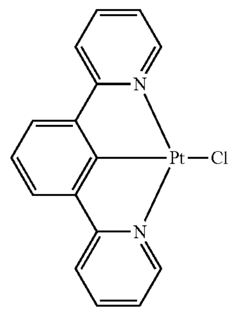 | Appl. Phys. Lett. 86, 153505 (2005) |
| | 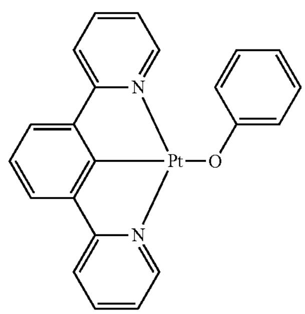 | Appl. Phys. Lett. 86, 153505 (2005) |
| | 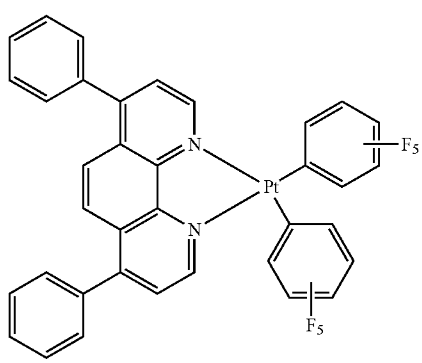 | Chem. Lett. 34, 592 (2005) |
| | 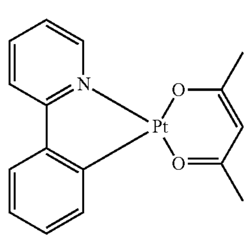 | WO2002015645 |

TABLE 4-continued
| MATERIAL | EXAMPLES OF MATERIAL | PUBLICATIONS |
|---|---|---|
| | 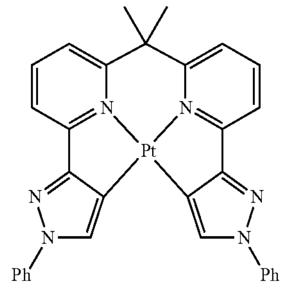 | US20060263635 |
| | 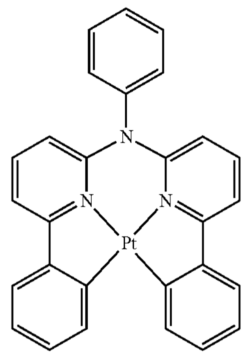 | US20060182992<br>US20070103060 |
| Cu complexes | 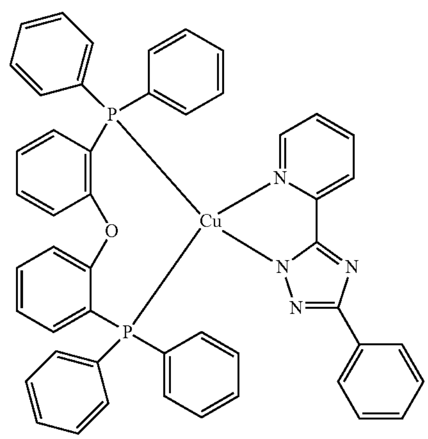 | WO2009000673 |
| | 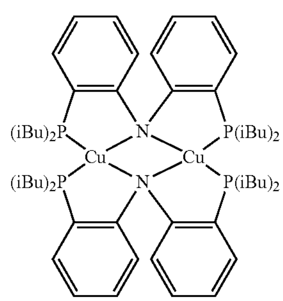 | US20070111026 |

TABLE 4-continued
| MATERIAL | EXAMPLES OF MATERIAL | PUBLICATIONS |
|---|---|---|
| Gold complexes | 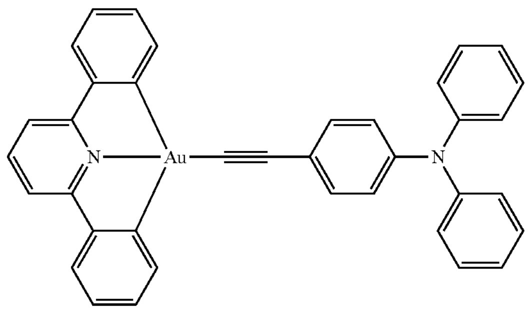 | Chem. Commun. 2906 (2005) |
| Rhenium(III) complexes | 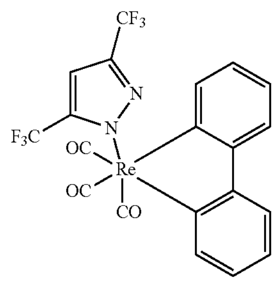 | Inorg. Chem. 42, 1248 (2003) |
| Osmium(II) complexes | 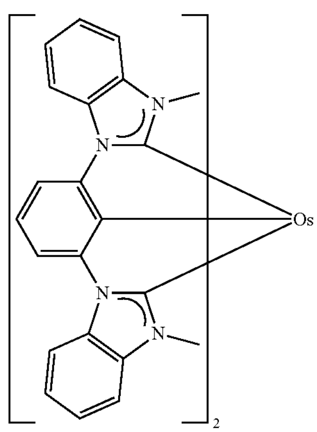 | U.S. Pat. No. 7,279,704 |
| Deuterated organometallic complexes | 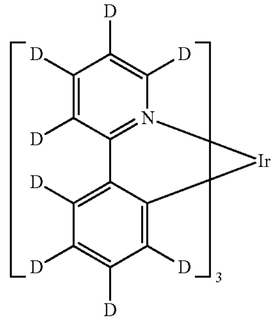 | US20030138657 |

TABLE 4-continued
| MATERIAL | EXAMPLES OF MATERIAL | PUBLICATIONS |
|---|---|---|
| Organometallic complexes with two or more metal centers | | US20030152802 |
| | 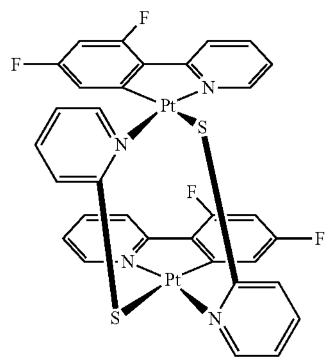 | U.S. Pat. No. 7,090,928 |
| | Blue dopants | |
| Iridium(III) organometallic complexes | 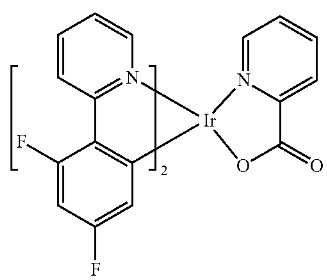 | WO2002002714 |
| | 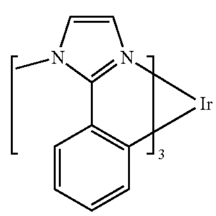 | WO2006009024 |
| | 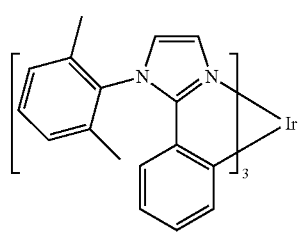 | US20060251923 US20110057559 US20110204333 |
| | 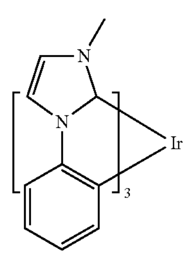 | U.S. Pat. No. 7,393,599, WO2006056418, US20050260441, WO2005019373 |
| | | U.S. Pat. No. 7,534,505 |

TABLE 4-continued
| MATERIAL | EXAMPLES OF MATERIAL | PUBLICATIONS |
| --- | --- | --- |
| | 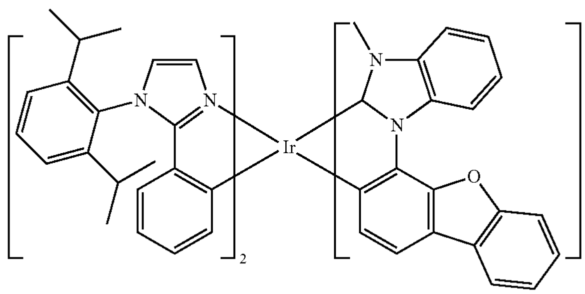 | WO2011051404 |
| | 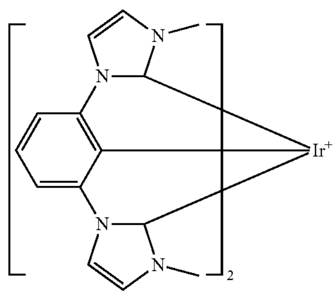 | U.S. Pat. No. 7,445,855 |
| | 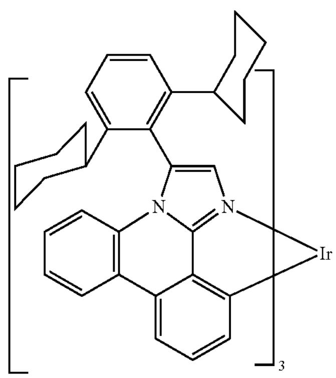 | US20070190359, US20080297033 US20100148663 |
| | 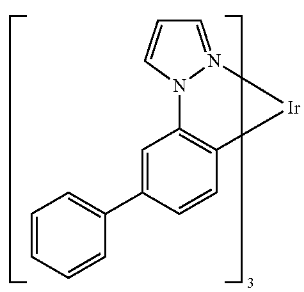 | U.S. Pat. No. 7,338,722 |
| | 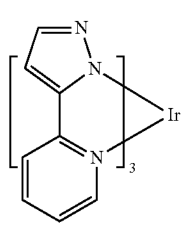 | US20020134984 |

TABLE 4-continued
| MATERIAL | EXAMPLES OF MATERIAL | PUBLICATIONS |
| --- | --- | --- |
| | 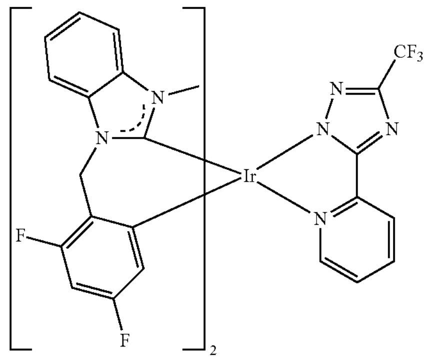 | Angew. Chem. Int. Ed. 47, 4542 (2008) |
| | 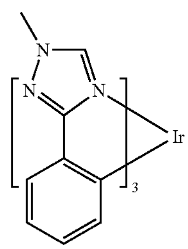 | Chem. Mater. 18, 5119 (2006) |
| | 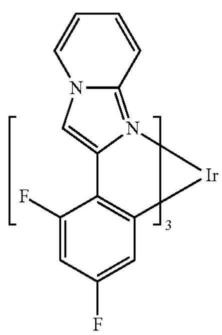 | Inorg. Chem. 46, 4308 (2007) |
| | 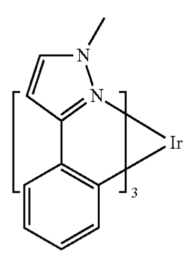 | WO2005123873 |
| | 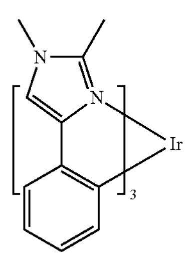 | WO2005123873 |

TABLE 4-continued
| MATERIAL | EXAMPLES OF MATERIAL | PUBLICATIONS |
|---|---|---|
| | 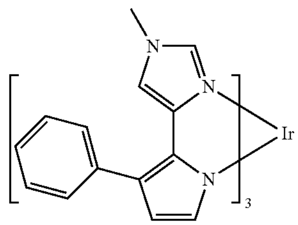 | WO2007004380 |
| | 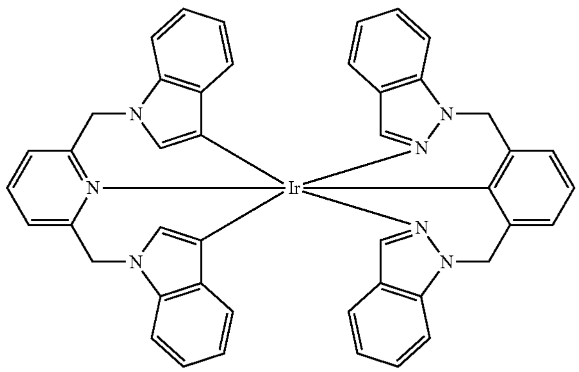 | WO2006082742 |
| Osmium(II) complexes | 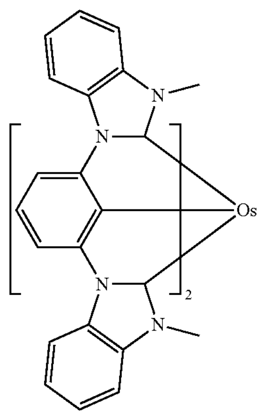 | U.S. Pat. No. 7,279,704 |
| | 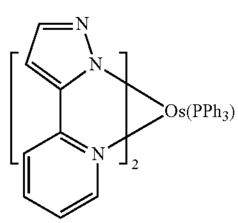 | Organometallics 23, 3745 (2004) |
| Gold complexes | 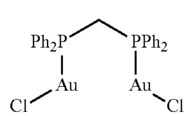 | Appl. Phys. Lett. 74, 1361 (1999) |
| Platinum(II) complexes | 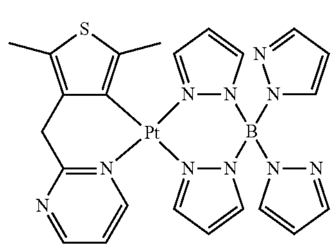 | WO2006098120, WO2006103874 |

TABLE 4-continued

| MATERIAL | EXAMPLES OF MATERIAL | PUBLICATIONS |
|---|---|---|
| Pt tetradentate complexes with at least one metal-carbene bond | 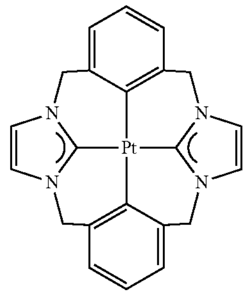 | U.S. Pat. No. 7,655,323 |
| | Exciton/hole blocking layer materials | |
| Bathocuprine compounds (e.g., BCP, BPhen) | 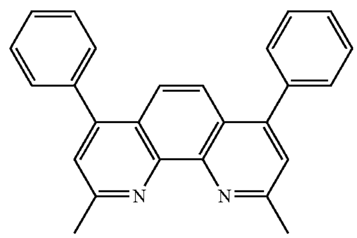 [SMILES: Cc1cc(-c2ccccc2)c2ccc3c(-c4ccccc4)cc(C)nc3c2n1] | Appl. Phys. Lett. 75, 4 (1999) |
| | 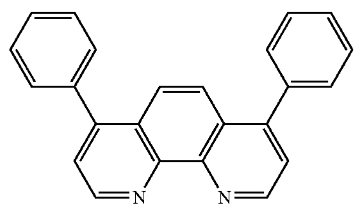 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 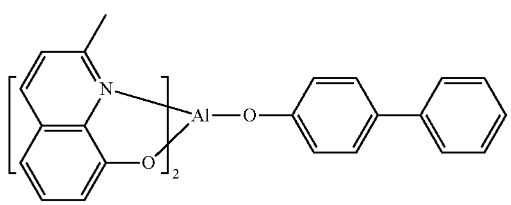 | Appl. Phys. Lett. 81, 162 (2002) |
| 5-member ring electron deficient heterocycles such as triazole, oxadiazole, imidazole, benzoimidazole | 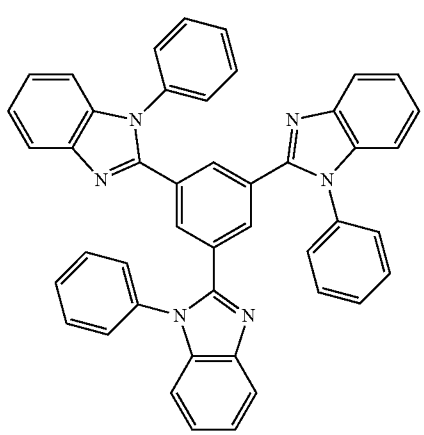 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE 4-continued
| MATERIAL | EXAMPLES OF MATERIAL | PUBLICATIONS |
|---|---|---|
| Triphenylene compounds | 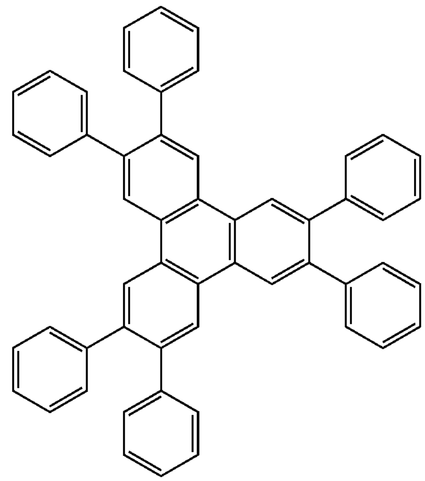 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 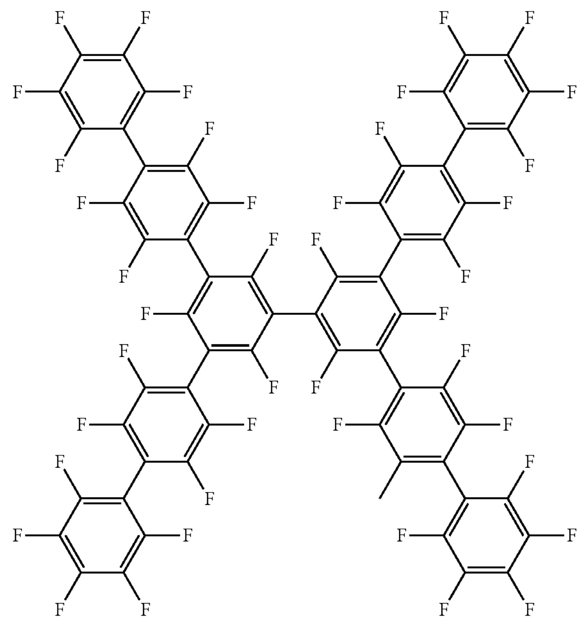 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 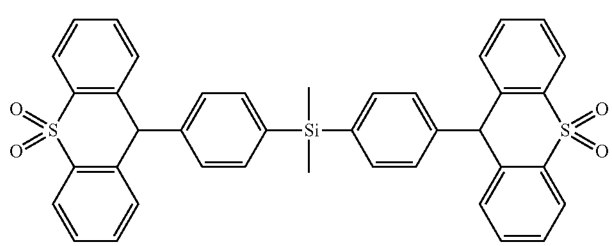 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Silylated five-membered nitrogen, oxygen, sulfur or phosphorus dibenzoheterocycles | 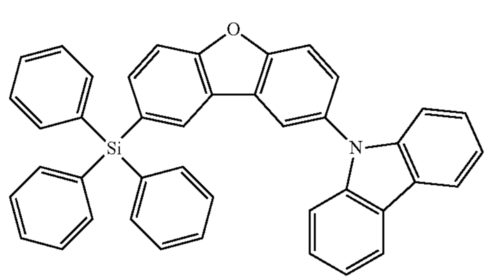 [SMILES: c1ccc([Si](c2ccccc2)(c2ccccc2)c2ccc3oc4ccc(-n5c6ccccc6c6ccccc65)cc4c3c2)cc1] | WO2010079051 |

TABLE 4-continued
| MATERIAL | EXAMPLES OF MATERIAL | PUBLICATIONS |
|---|---|---|
| Aza-carbazoles | 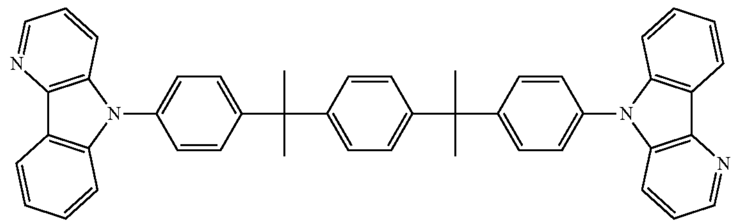 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| | Electron transporting materials | |
| Anthracene-benzoimidazole compounds | 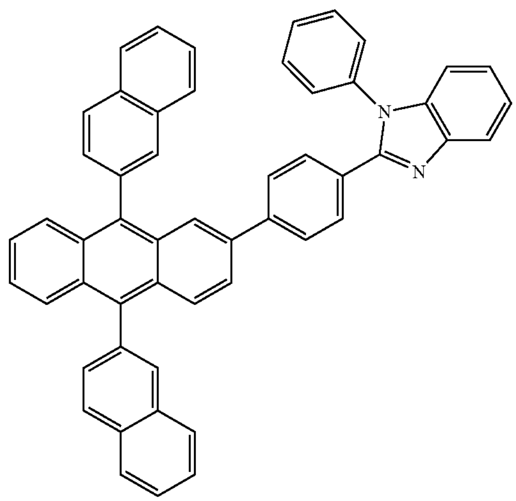 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | | US20090179554 |
| Aza triphenylene derivatives | 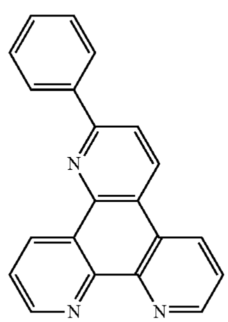 [SMILES: c1ccc(-c2ccc3c4cccnc4c4ncccc4c3n2)cc1] | US20090115316 |
| Anthracene-benzothiazole compounds | 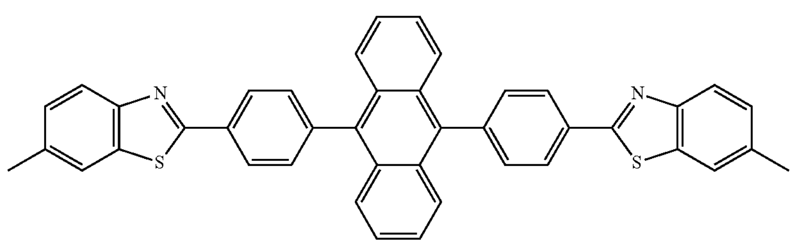 | Appl. Phys. Lett. 89, 063504 (2006) |
| Metal 8-hydroxyquinolates (e.g., $Alq_3$, $Zrq_4$) | 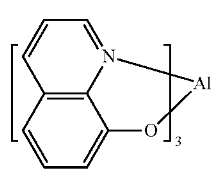 | Appl. Phys. Lett. 51, 913 (1987) U.S. Pat. No. 7,230,107 |

TABLE 4-continued
| MATERIAL | EXAMPLES OF MATERIAL | PUBLICATIONS |
|---|---|---|
| Metal hydroxy-benzoquinolates | 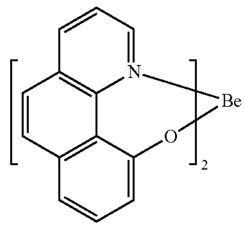 | Chem. Lett. 5, 905 (1993) |
| Bathocuprine compounds such as BCP, BPhen, etc | 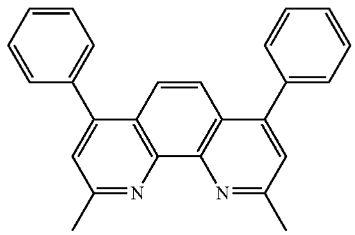 [SMILES: Cc1cc(-c2ccccc2)c2ccc3c(-c4ccccc4)cc(C)nc3c2n1] | Appl. Phys. Lett. 91, 263503 (2007) |
| | 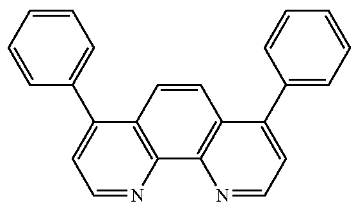 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g., triazole, oxadiazole, imidazole, benzoimidazole) | 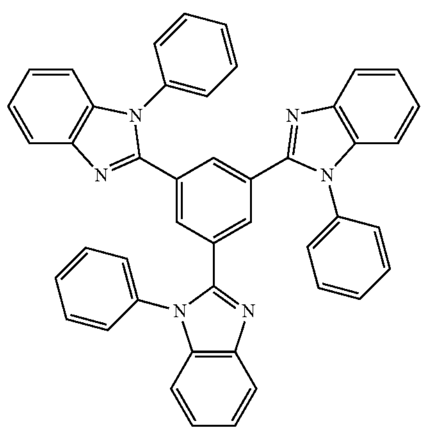 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 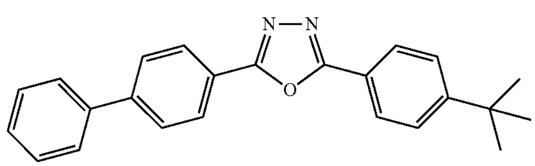 [SMILES: CC(C)(C)c1ccc(-c2nnc(-c3ccc(-c4ccccc4)cc3)o2)cc1] | Appl. Phys. Lett. 55, 1489 (1989) |
| | 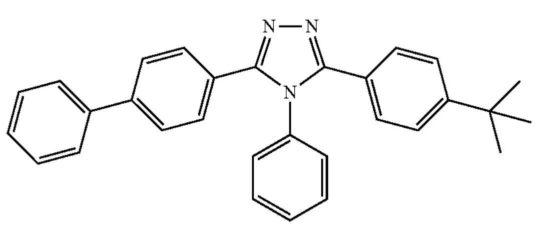 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |

TABLE 4-continued
| MATERIAL | EXAMPLES OF MATERIAL | PUBLICATIONS |
|---|---|---|
| Silole compounds | 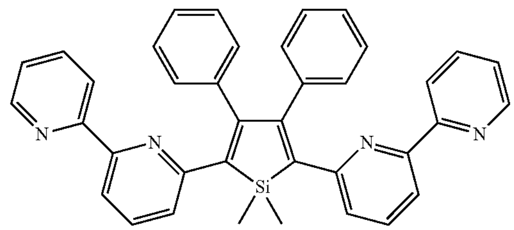 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 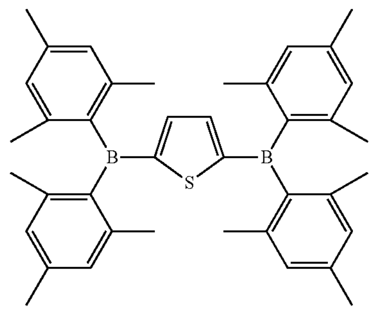 | J. Am. Chem. Soc. 120, 9714 (1998) |
| Fluorinated aromatic compounds | 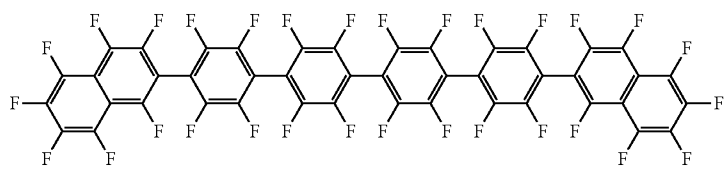 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |
| Fullerene (e.g., C60) | 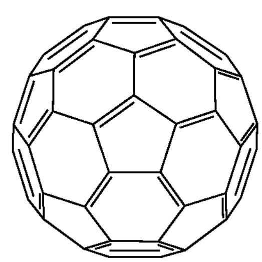 [SMILES: c1cc2c3ccc4c5ccc6c7ccc8c9ccc%10c1c1c2c2c3c4c3c5c6c4c7c8c5c9c%10c1c1c2c3c4c51] | US20090101870 |
| Triazine complexes | 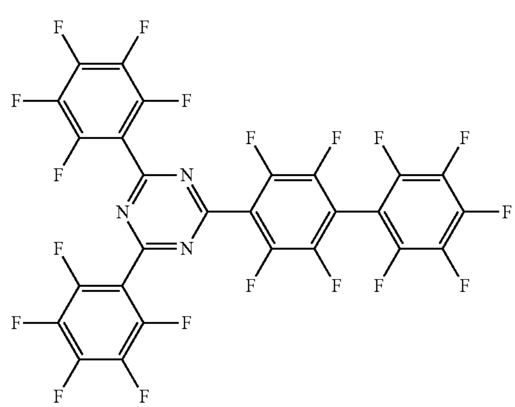 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |

TABLE 4-continued

| MATERIAL | EXAMPLES OF MATERIAL | PUBLICATIONS |
| --- | --- | --- |
| Zn (N^N) complexes | 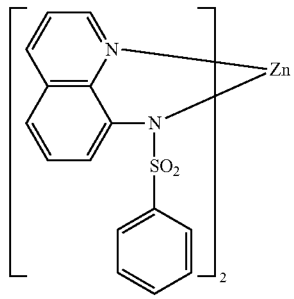 | U.S. Pat. No. 6,528,187 |

EXPERIMENTAL

All reactions were carried out under nitrogen unless specified otherwise. All solvents for reactions are anhydrous and used as received from commercial sources.

Example 1

Synthesis of Compound 2881

Synthesis of 4-phenylbenzofuro[3,2-d]pyrimidine

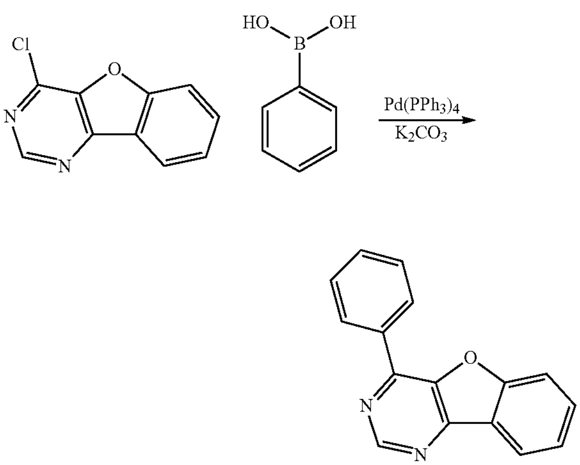

4-chlorobenzofuro[3,2-d]pyrimidine (3.50 g, 17.1 mmol), phenylboronic acid (2.61 g, 21.4 mmol), and $K_2CO_3$ (4.73 g, 34.2 mmol) were dissolved in toluene (95 mL) and water (19 mL), and the reaction mixture degassed by bubbling nitrogen for 15 minutes. $Pd(PPh_3)_4$ (0.99 g, 0.86 mmol) was then added and the mixture was heated to reflux overnight. Upon completion of the reaction, it was cooled to room temperature, extracted with toluene, and washed with water. The crude product was purified via column chromatography starting with heptanes/ethyl acetate (90/10 and slowly increasing to 75/25). The mobile phase was changed to heptanes/ethyl acetate/dichloromethane (65/25/10). The collected fractions were triturated from methanol to afford 4-phenylbenzofuro[3,2-d]pyrimidine (3.2 g, 76% yield).

Synthesis of Compound 2881

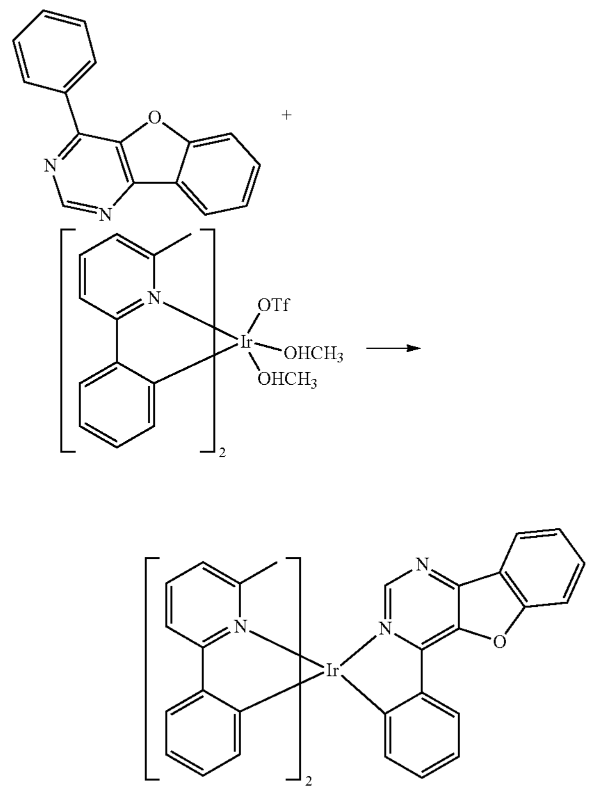

The Iridium intermediate (2.01 g, 2.71 mmol) and 4-phenylbenzofuro[3,2-d]pyrimidine (2.00 g, 8.12 mmol) were diluted with ethanol (27 mL) and heated to reflux for 36 hours. Upon complete consumption of the Timer as shown by high performance liquid chromatography (HPLC), the reaction mixture was cooled to room temperature. The solid was filtered through a pad of Celite and washed with methanol. The collection flask was then changed and the solid on the Celite was washed with dichloromethane. The crude product was purified via column chromatography using heptanes/ethyl acetate (80/20) followed by dichloromethane/ethyl acetate (60/40). The collected fractions were recrystallized 3 times from dichloromethane/methanol to afford Compound 2881 (1.2 g, 57% yield).

Example 2

Synthesis of Compound 6857

Synthesis of 4-(3,5-dimethylphenyl)benzofuro[3,2-d]pyrimidine

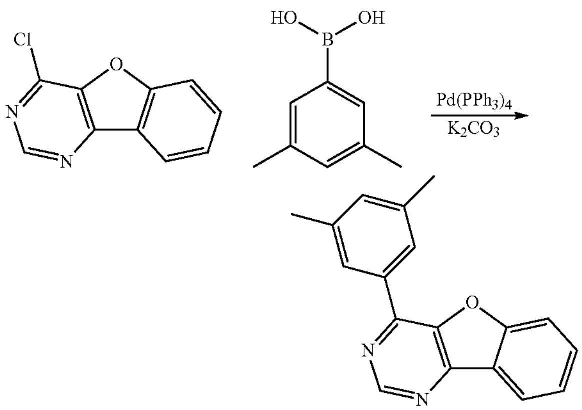

4-chlorobenzofuro[: 3,2-d]pyrimidine (4.75 g, 23.2 mmol), (3,5-dimethylphenyl)boronic acid (4.35 g, 29.0 mmol), and $K_2CO_3$ (6.42 g, 46.4 mmol) were dissolved in toluene (130 mL) and water (26 mL). $Pd(PPh_3)_4$ (1.34 g, 1.16 mmol) was added and the mixture was degassed by bubbling nitrogen. The mixture was heated to 80° C. overnight. Upon completion of the reaction as determined by gas chromatography mass spectroscopy (GCMS), the mixture was cooled to room temperature, extracted with toluene, and washed with water. The crude material was coated on Celite and purified via column chromatography by using heptanes/ethyl acetate (80/20). The product was recrystallized from heptanes to afford 4-(3,5-dimethylphenyl)benzofuro[3,2-d]pyrimidine as white crystals (4.4 g, 69% yield).

Synthesis of Ir(III) Dimer.

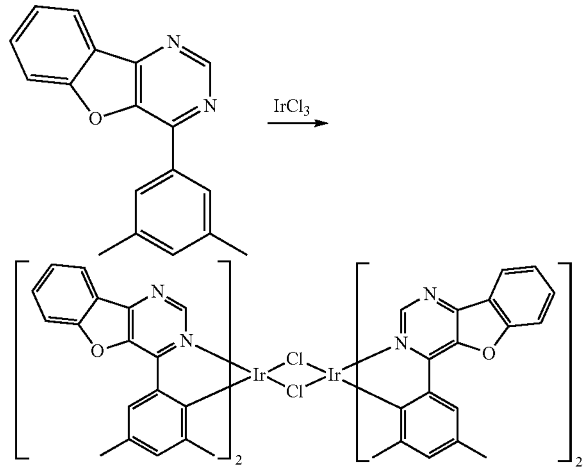

4-(3,5-dimethylphenyl)benzofuro[3,2-d]pyrimidine (2.00 g, 7.29 mmol) was solubilized in ethoxyethanol (23 mL) and water (8 mL) and degassed by bubbling nitrogen for 15 minutes. Iridium chloride (0.90 g, 2.43 mmol) was added to the slurry (ligand is poorly soluble) and the reaction was heated to 105° C. under nitrogen for 24 hours. After cooling to room temperature, the solid was filtered, washed with methanol, and dried to give the Ir(III) Dimer (2.4 g, 128% yield) as an orange powder. The crude dimer contained free ligand, which gave higher than theoretical yield. The Ir(III) Dimer was used without further purification.

Synthesis of Compound 6857

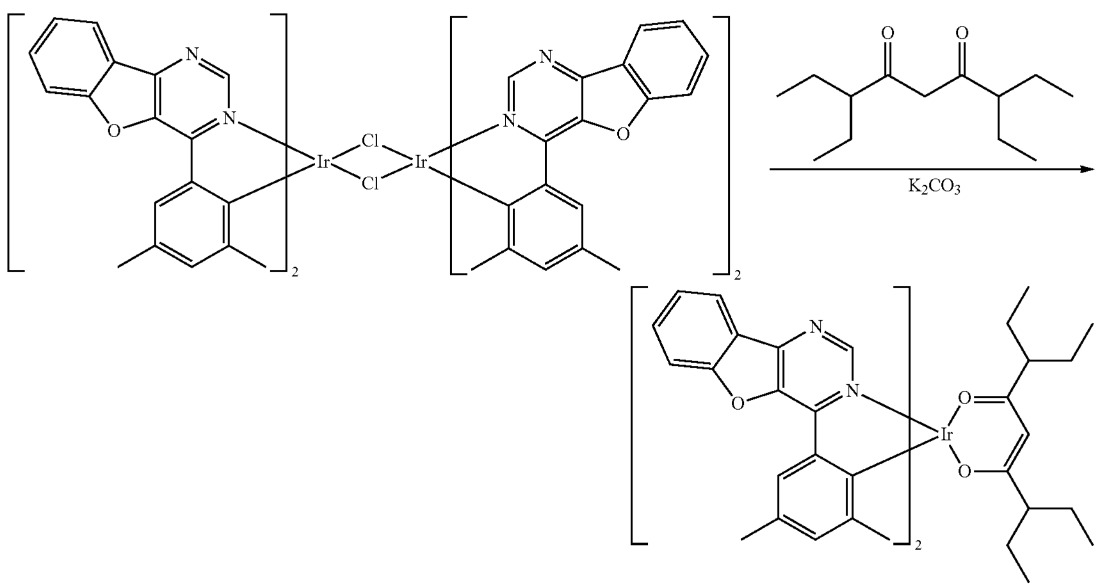

Ir(III) dimer (2.4 g, 1.24 mmol) and 3,7-diethylnonane-4,6-dione (2.63 g, 12.4 mmol) were added to a round-bottom flask. The mixture was diluted with ethoxyethanol (40 mL), degassed by bubbling nitrogen, and $K_2CO_3$ (1.71 g, 12.4 mmol) was added. The mixture was stirred at room temperature for 1 hour and then heated at 90° C. overnight. The reaction mixture was diluted in dichloromethane and filtered through a pad of Celite. The crude product was then purified via column chromatography by using heptanes/dichloromethane (90/10). The red solid was recrystallized from a mixture of dichlormethane and heptanes to afford Compound 6857 (0.40 g, 17% yield).

Device Examples

All example devices were fabricated by high vacuum (<$10^{-7}$ Torr) thermal evaporation. The anode electrode is 1200 Å of indium tin oxide (ITO). The cathode consisted of 10 Å of LiF followed by 1,000 Å of Al. All devices are encapsulated with a glass lid sealed with an epoxy resin in a nitrogen glove box (<1 ppm of $H_2O$ and $O_2$) immediately after fabrication, and a moisture getter was incorporated inside the package.

The organic stack of the device examples consisted of sequentially, from the ITO surface, 100 Å of LG101 (purchased from LG Chem) as the hole injection layer (HIL), 400 Å of 4,4'-bis[N-(1-naphthyl)-N-phenylamino]biphenyl (NPD) as the hole transporting layer (HTL), 400 Å of the invention compound doped in BAlq as a host with as the emissive layer (EML), 100 Å of BAlq as a blocking layer (BL), and 450 Å of $Alq_3$ (tris-8-hydroxyquinoline aluminum) as the ETL.

The device results and data are summarized in Tables 5 and 6 from those devices. As used herein, NPD, Alq, BAlq have the following structures:

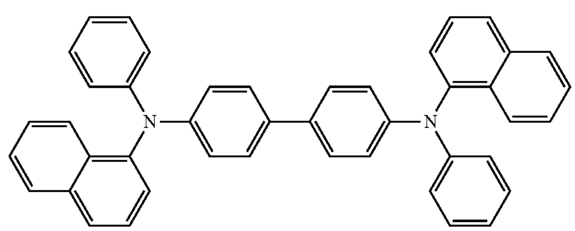

NPD

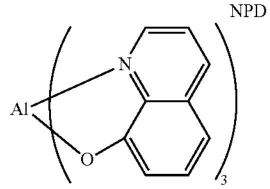

$Alq_3$

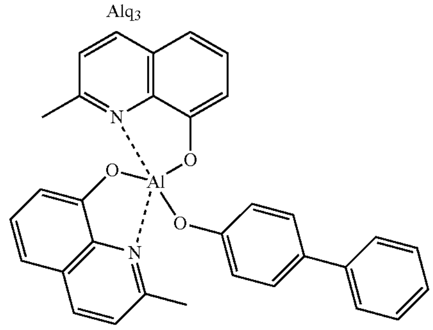

BAlq

TABLE 5

Device structures of inventive compounds

| Example | HIL | HTL | EML (400 Å, doping %) | | BL | ETL |
|---|---|---|---|---|---|---|
| Example 1 | LG101 100 Å | NPD 400 Å | BAlq | Compound 2881 8% | BAlq 100 Å | Alq 450 Å |
| Example 2 | LG101 100 Å | NPD 400 Å | BAlq | Compound 6857 8% | BAlq 100 Å | Alq 450 Å |

TABLE 6

VTE device results

| | 1931 CIE | | | | At 1,000 nits | | |
|---|---|---|---|---|---|---|---|
| | CIE x | CIE y | λ max [nm] | FWHM [nm] | Voltage [V] | LE [cd/A] | EQE [%] |
| Example 1 | 0.65 | 0.35 | 620 | 78 | 8.2 | 18 | 15 |
| Example 2 | 0.68 | 0.32 | 632 | 62 | 8.8 | 12 | 14 |

Table 6 summarizes the performance of the devices. The driving voltage (V), luminous efficiency (LE), external quantum efficiency (EQE), and power efficiency (PE) were measured at 1000 nits. Both examples showed red emission. Device example 1 showed a sRGB red color with a CIE of (0.65, 0.35) and good EQE of 15%. Device Example 2 showed very deep red color with a CIE of (0.68, 0.32) and good EQE of 14%. They can be used as red emitters in display and lighting applications. Compounds disclosed in WO2010118029 with only one nitrogen in the top part of the ligand can only emit the color in the green to yellow range, they cannot achieve the desired red color described here. Therefore, those compounds were not useful as red emitters.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A compound comprising a ligand $L_A$ of formula I:

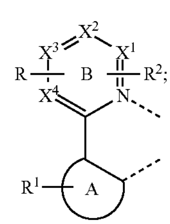

(I)

wherein ring A is a 5-membered or 6-membered carbocyclic or heterocyclic ring;

wherein R is fused to ring B and has the formula II:

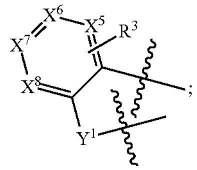

(II)

wherein the wave lines indicate bonds to ring B;

wherein $R^1$ and $R^3$ each independently represent mono, di, tri, or tetra substitution, or no substitution;

wherein $R^2$ represents mono or di substitution, or no substitution;

wherein $X^1$, $X^2$, $X^3$, $X^4$, $X^5$, $X^6$, $X^7$, and $X^8$ are each independently carbon or nitrogen;

wherein at least one of $X^1$, $X^2$, $X^3$, $X^4$, $X^5$, $X^6$, $X^7$, and $X^8$ is nitrogen;

wherein $Y^1$ is selected from the group consisting of BR', NR', PR', O, S, Se, C═O, S═O, $SO_2$, CR'R", SiR'R", and GeR'R";

wherein $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, or wherein any two adjacent substituents are optionally joined to form a ring, which can be further substituted;

wherein $L_A$ is coordinated to a metal M;

wherein $L_A$ is optionally linked with other ligands to comprise a tridentate, tetradentate, pentadentate, or hexadentate ligand; and wherein M is optionally coordinated to other ligands.

2. The compound of claim 1, wherein M is selected from the group consisting of Ir, Rh, Re, Ru, Os, Pt, Au, and Cu.

3. The compound of claim 1, wherein M is Ir.

4. The compound of claim 1, wherein $Y^1$ is selected from the group consisting of NR', O, S, and CR'R".

5. The compound of claim 1, wherein $Y^1$ is O.

6. The compound of claim 1, wherein one of $X^1$, $X^2$, $X^3$, $X^4$, $X^5$, $X^6$, $X^7$, and $X^8$ is nitrogen.

7. The compound of claim 1, wherein two of $X^1$, $X^2$, $X^3$, $X^4$, $X^5$, $X^6$, $X^7$, and $X^8$ are nitrogen.

8. The compound of claim 1, wherein one of $X^1$, $X^2$, $X^3$, and $X^4$ is nitrogen; and one of $X^5$, $X^6$, $X^7$, and $X^8$ is nitrogen.

9. The compound of claim 1, wherein one of $X^1$, $X^2$, $X^3$, $X^4$ is nitrogen; and $X^5$, $X^6$, $X^7$, and $X^8$ are carbon.

10. The compound of claim 1, wherein $X^2$ is nitrogen; and $X^1$, $X^3$, $X^4$, $X^5$, $X^6$, $X^7$, and $X^8$ are carbon.

11. The compound of claim 1, wherein ring A is phenyl.

12. The compound of claim 1, wherein $L_A$ is selected from the group consisting of:

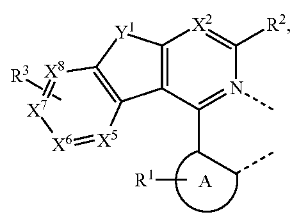

-continued

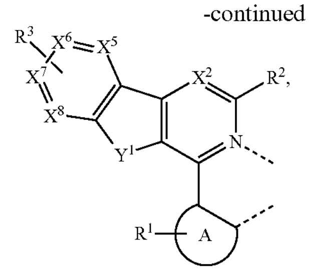

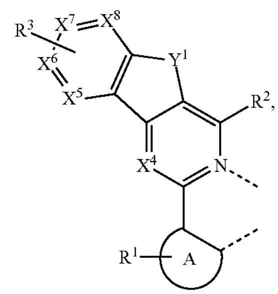

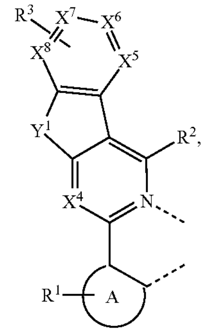

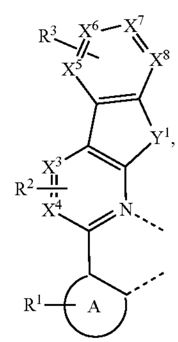

and

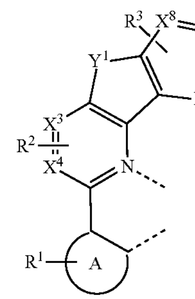

.

13. The compound of claim 1, wherein the compound has formula III-A:

$$(L_A)_n Ir(L_B)_{3-n} \qquad \text{(III-A)};$$

wherein $L_B$ is a bidentate ligand; and n is 1, 2, or 3.

14. The compound of claim 13, wherein $L_A$ is selected from the group consisting of $L_{A1}$ to $L_{A960}$ as shown below:

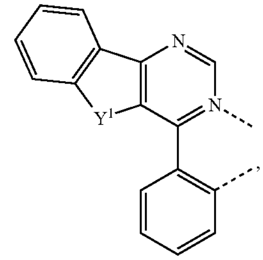

$Y_1$ = O, $L_{A1}$
$Y_1$ = S, $L_{A2}$
$Y_1$ = $NCH_3$, $L_{A3}$
$Y_1$ = $C(CH_3)_2$, $L_{A4}$

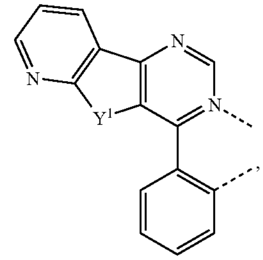

$Y_1$ = O, $L_{A5}$
$Y_1$ = S, $L_{A6}$
$Y_1$ = $NCH_3$, $L_{A7}$
$Y_1$ = $C(CH_3)_2$, $L_{A8}$

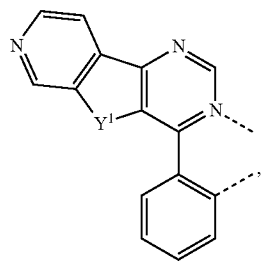

$Y_1$ = O, $L_{A9}$
$Y_1$ = S, $L_{A10}$
$Y_1$ = $NCH_3$, $L_{A11}$
$Y_1$ = $C(CH_3)_2$, $L_{A12}$

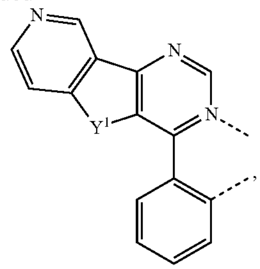

$Y_1$ = O, $L_{A13}$
$Y_1$ = S, $L_{A14}$
$Y_1$ = $NCH_3$, $L_{A15}$
$Y_1$ = $C(CH_3)_2$, $L_{A16}$

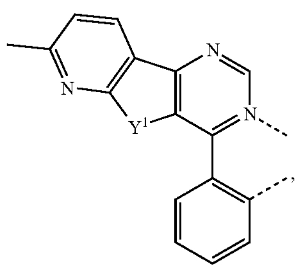

$Y_1$ = O, $L_{A17}$
$Y_1$ = S, $L_{A18}$
$Y_1$ = $NCH_3$, $L_{A19}$
$Y_1$ = $C(CH_3)_2$, $L_{A20}$

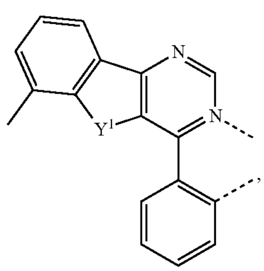

$Y_1$ = O, $L_{A21}$
$Y_1$ = S, $L_{A22}$
$Y_1$ = $NCH_3$, $L_{A23}$
$Y_1$ = $C(CH_3)_2$, $L_{A24}$

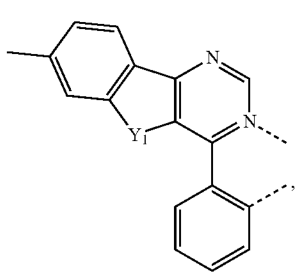

Y1 = O, $L_{A25}$
Y1 = S, $L_{A26}$
Y1 = $NCH_3$, $L_{A27}$
Y1 = $C(CH_3)_2$, $L_{A28}$

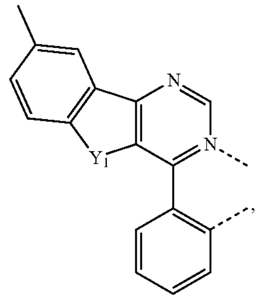

Y1 = O, $L_{A29}$
Y1 = S, $L_{A30}$
Y1 = $NCH_3$, $L_{A31}$
Y1 = $C(CH_3)_2$, $L_{A32}$

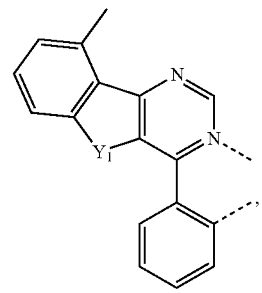

Y1 = O, $L_{A33}$
Y1 = S, $L_{A34}$
Y1 = $NCH_3$, $L_{A35}$
Y1 = $C(CH_3)_2$, $L_{A36}$

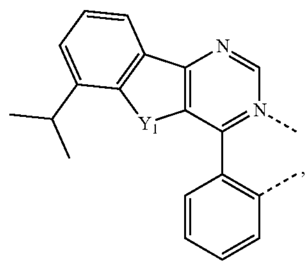

Y1 = O, $L_{A37}$
Y1 = S, $L_{A38}$
Y1 = $NCH_3$, $L_{A39}$
Y1 = $C(CH_3)_2$, $L_{A40}$

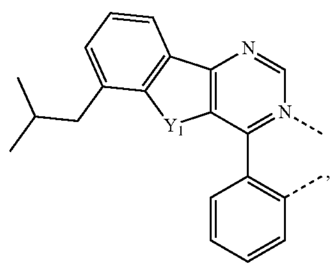

Y1 = O, $L_{A41}$
Y1 = S, $L_{A42}$
Y1 = $NCH_3$, $L_{A43}$
Y1 = $C(CH_3)_2$, $L_{A44}$

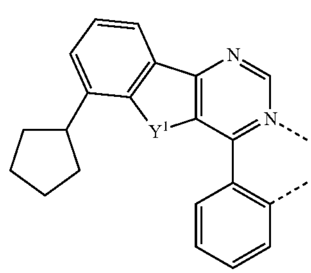

$Y_1$ = O, $L_{A45}$
$Y_1$ = S, $L_{A46}$
$Y_1$ = $NCH_3$, $L_{A47}$
$Y_1$ = $C(CH_3)_2$, $L_{A48}$

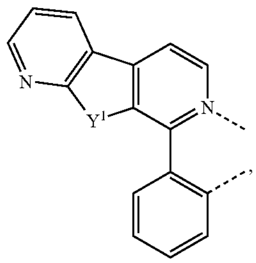

$Y_1 = O, L_{A49}$
$Y_1 = S, L_{A50}$
$Y_1 = NCH_3, L_{A51}$
$Y_1 = C(CH_3)_2, L_{A52}$

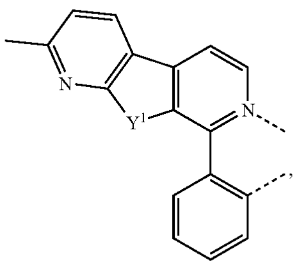

$Y_1 = O, L_{A53}$
$Y_1 = S, L_{A54}$
$Y_1 = NCH_3, L_{A55}$
$Y_1 = C(CH_3)_2, L_{A56}$

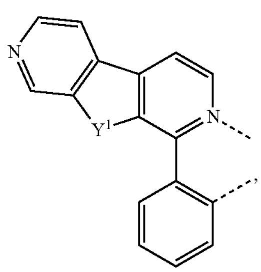

$Y_1 = O, L_{A57}$
$Y_1 = S, L_{A58}$
$Y_1 = NCH_3, L_{A59}$
$Y_1 = C(CH_3)_2, L_{A60}$

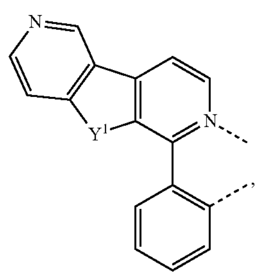

$Y_1 = O, L_{A61}$
$Y_1 = S, L_{A62}$
$Y_1 = NCH_3, L_{A63}$
$Y_1 = C(CH_3)_2, L_{A64}$

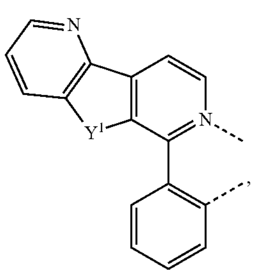

$Y_1 = O, L_{A65}$
$Y_1 = S, L_{A66}$
$Y_1 = NCH_3, L_{A67}$
$Y_1 = C(CH_3)_2, L_{A68}$

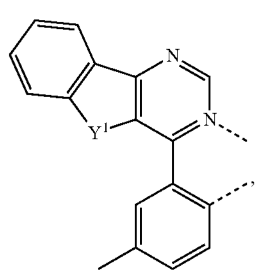

$Y_1 = O, L_{A69}$
$Y_1 = S, L_{A70}$
$Y_1 = NCH_3, L_{A71}$
$Y_1 = C(CH_3)_2, L_{A72}$

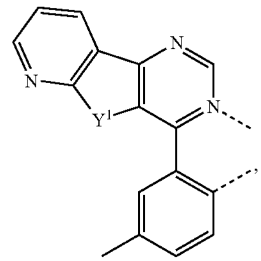

$Y_1 = O, L_{A73}$
$Y_1 = S, L_{A74}$
$Y_1 = NCH_3, L_{A75}$
$Y_1 = C(CH_3)_2, L_{A76}$

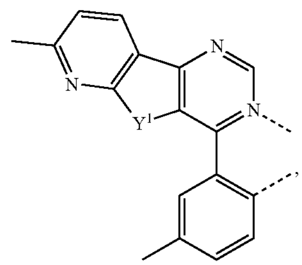

$Y_1 = O, L_{A77}$
$Y_1 = S, L_{A78}$
$Y_1 = NCH_3, L_{A79}$
$Y_1 = C(CH_3)_2, L_{A80}$

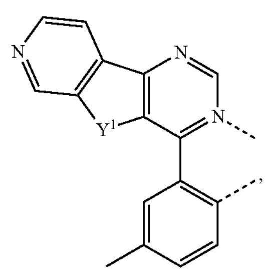

$Y_1 = O, L_{A81}$
$Y_1 = S, L_{A82}$
$Y_1 = NCH_3, L_{A83}$
$Y_1 = C(CH_3)_2, L_{A84}$

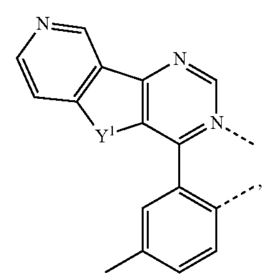

$Y_1 = O, L_{A85}$
$Y_1 = S, L_{A86}$
$Y_1 = NCH_3, L_{A87}$
$Y_1 = C(CH_3)_2, L_{A88}$

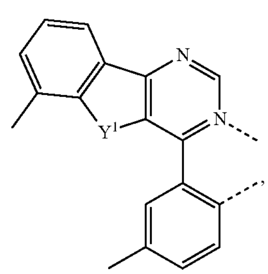

$Y_1 = O, L_{A89}$
$Y_1 = S, L_{A90}$
$Y_1 = NCH_3, L_{A91}$
$Y_1 = C(CH_3)_2, L_{A92}$

-continued

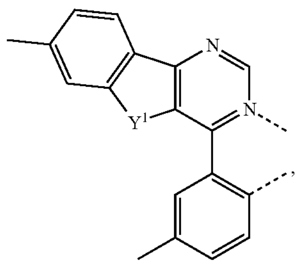

$Y_1$ = O, $L_{A93}$
$Y_1$ = S, $L_{A94}$
$Y_1$ = $NCH_3$, $L_{A95}$
$Y_1$ = $C(CH_3)_2$, $L_{A96}$

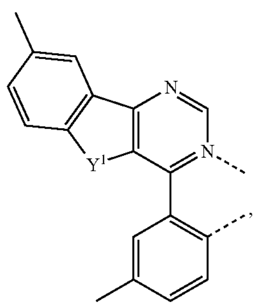

$Y_1$ = O, $L_{A97}$
$Y_1$ = S, $L_{A98}$
$Y_1$ = $NCH_3$, $L_{A99}$
$Y_1$ = $C(CH_3)_2$, $L_{A100}$

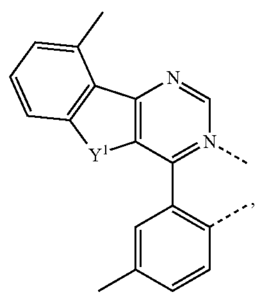

$Y_1$ = O, $L_{A101}$
$Y_1$ = S, $L_{A102}$
$Y_1$ = $NCH_3$, $L_{A103}$
$Y_1$ = $C(CH_3)_2$, $L_{A104}$

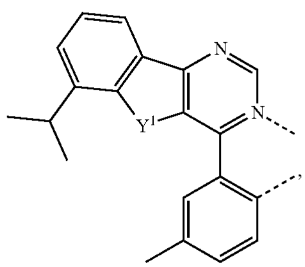

$Y_1$ = O, $L_{A105}$
$Y_1$ = S, $L_{A106}$
$Y_1$ = $NCH_3$, $L_{A107}$
$Y_1$ = $C(CH_3)_2$, $L_{A108}$

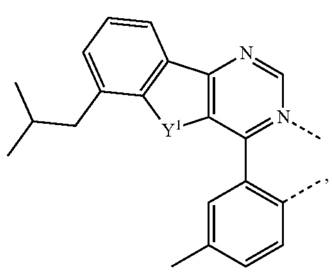

$Y_1$ = O, $L_{A109}$
$Y_1$ = S, $L_{A110}$
$Y_1$ = $NCH_3$, $L_{A111}$
$Y_1$ = $C(CH_3)_2$, $L_{A112}$

-continued

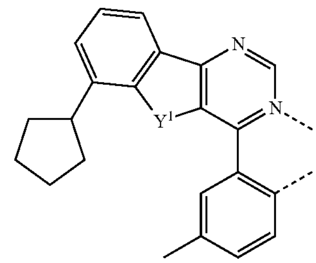

$Y_1$ = O, $L_{A113}$
$Y_1$ = S, $L_{A114}$
$Y_1$ = $NCH_3$, $L_{A115}$
$Y_1$ = $C(CH_3)_2$, $L_{A116}$

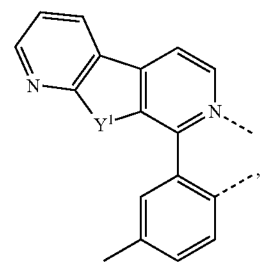

$Y_1$ = O, $L_{A117}$
$Y_1$ = S, $L_{A118}$
$Y_1$ = $NCH_3$, $L_{A119}$
$Y_1$ = $C(CH_3)_2$, $L_{A120}$

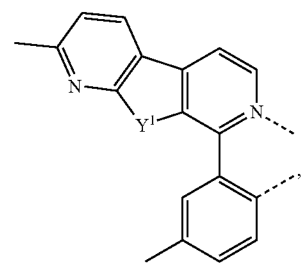

$Y_1$ = O, $L_{A121}$
$Y_1$ = S, $L_{A122}$
$Y_1$ = $NCH_3$, $L_{A123}$
$Y_1$ = $C(CH_3)_2$, $L_{A124}$

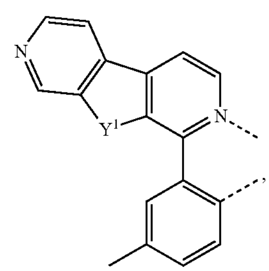

$Y_1$ = O, $L_{A125}$
$Y_1$ = S, $L_{A126}$
$Y_1$ = $NCH_3$, $L_{A127}$
$Y_1$ = $C(CH_3)_2$, $L_{A128}$

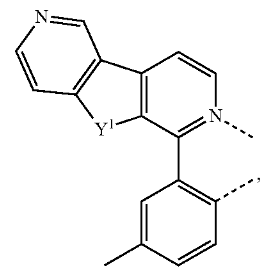

$Y_1$ = O, $L_{A129}$
$Y_1$ = S, $L_{A130}$
$Y_1$ = $NCH_3$, $L_{A131}$
$Y_1$ = $C(CH_3)_2$, $L_{A132}$

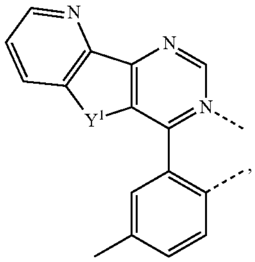

$Y_1$ = O, $L_{A133}$
$Y_1$ = S, $L_{A134}$
$Y_1$ = $NCH_3$, $L_{A135}$
$Y_1$ = $C(CH_3)_2$, $L_{A136}$

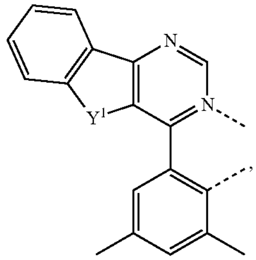

$Y_1$ = O, $L_{A137}$
$Y_1$ = S, $L_{A138}$
$Y_1$ = $NCH_3$, $L_{A139}$
$Y_1$ = $C(CH_3)_2$, $L_{A140}$

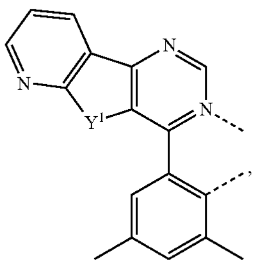

$Y_1$ = O, $L_{A141}$
$Y_1$ = S, $L_{A142}$
$Y_1$ = $NCH_3$, $L_{A143}$
$Y_1$ = $C(CH_3)_2$, $L_{A144}$

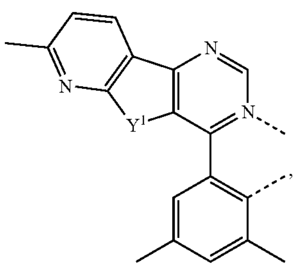

$Y_1$ = O, $L_{A145}$
$Y_1$ = S, $L_{A146}$
$Y_1$ = $NCH_3$, $L_{A147}$
$Y_1$ = $C(CH_3)_2$, $L_{A148}$

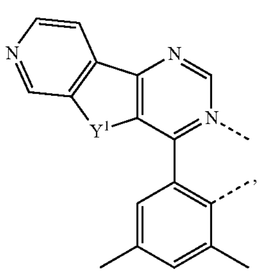

$Y_1$ = O, $L_{A149}$
$Y_1$ = S, $L_{A150}$
$Y_1$ = $NCH_3$, $L_{A151}$
$Y_1$ = $C(CH_3)_2$, $L_{A152}$

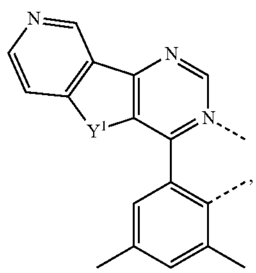

$Y_1$ = O, $L_{A153}$
$Y_1$ = S, $L_{A154}$
$Y_1$ = $NCH_3$, $L_{A155}$
$Y_1$ = $C(CH_3)_2$, $L_{A156}$

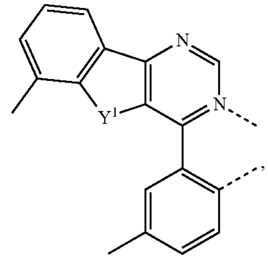

$Y_1$ = O, $L_{A157}$
$Y_1$ = S, $L_{A158}$
$Y_1$ = $NCH_3$, $L_{A159}$
$Y_1$ = $C(CH_3)_2$, $L_{A160}$

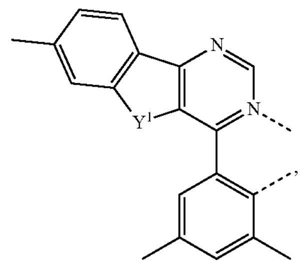

$Y_1$ = O, $L_{A161}$
$Y_1$ = S, $L_{A162}$
$Y_1$ = $NCH_3$, $L_{A163}$
$Y_1$ = $C(CH_3)_2$, $L_{A164}$

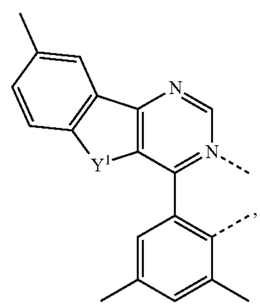

$Y_1$ = O, $L_{A165}$
$Y_1$ = S, $L_{A166}$
$Y_1$ = $NCH_3$, $L_{A167}$
$Y_1$ = $C(CH_3)_2$, $L_{A168}$

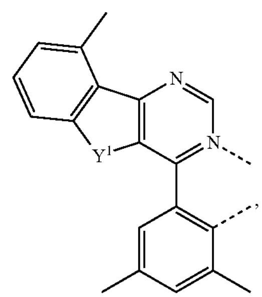

$Y_1$ = O, $L_{A169}$
$Y_1$ = S, $L_{A170}$
$Y_1$ = $NCH_3$, $L_{A171}$
$Y_1$ = $C(CH_3)_2$, $L_{A172}$

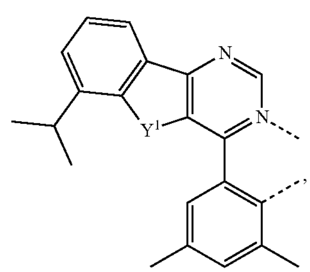

$Y_1$ = O, $L_{A173}$
$Y_1$ = S, $L_{A174}$
$Y_1$ = $NCH_3$, $L_{A175}$
$Y_1$ = $C(CH_3)_2$, $L_{A176}$

-continued

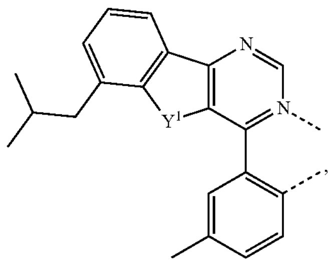

$Y_1 = O, L_{A177}$
$Y_1 = S, L_{A178}$
$Y_1 = NCH_3, L_{A179}$
$Y_1 = C(CH_3)_2, L_{A180}$

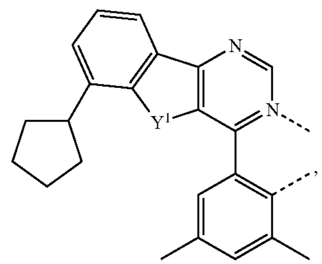

$Y_1 = O, L_{A181}$
$Y_1 = S, L_{A182}$
$Y_1 = NCH_3, L_{A183}$
$Y_1 = C(CH_3)_2, L_{A184}$

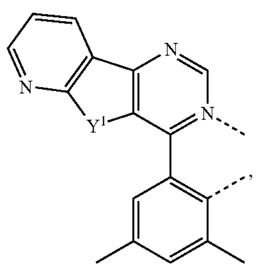

$Y_1 = O, L_{A185}$
$Y_1 = S, L_{A186}$
$Y_1 = NCH_3, L_{A187}$
$Y_1 = C(CH_3)_2, L_{A188}$

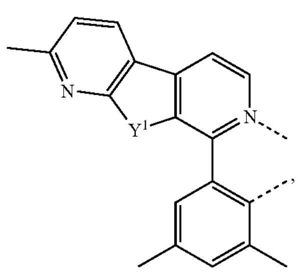

$Y_1 = O, L_{A189}$
$Y_1 = S, L_{A190}$
$Y_1 = NCH_3, L_{A191}$
$Y_1 = C(CH_3)_2, L_{A192}$

-continued

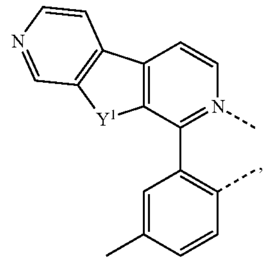

$Y_1 = O, L_{A193}$
$Y_1 = S, L_{A194}$
$Y_1 = NCH_3, L_{A195}$
$Y_1 = C(CH_3)_2, L_{A196}$

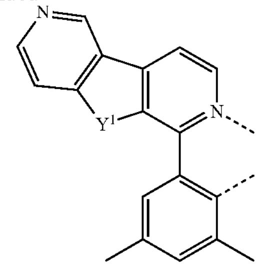

$Y_1 = O, L_{A197}$
$Y_1 = S, L_{A198}$
$Y_1 = NCH_3, L_{A199}$
$Y_1 = C(CH_3)_2, L_{A200}$

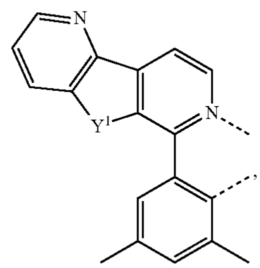

$Y_1 = O, L_{A201}$
$Y_1 = S, L_{A202}$
$Y_1 = NCH_3, L_{A203}$
$Y_1 = C(CH_3)_2, L_{A204}$

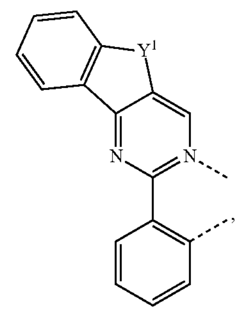

$Y_1 = O, L_{A205}$
$Y_1 = S, L_{A206}$
$Y_1 = NCH_3, L_{A207}$
$Y_1 = C(CH_3)_2, L_{A208}$

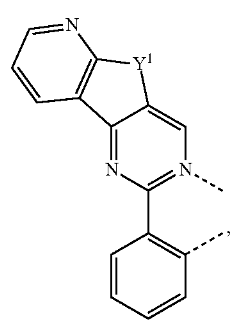

$Y_1 = O, L_{A209}$
$Y_1 = S, L_{A210}$
$Y_1 = NCH_3, L_{A211}$
$Y_1 = C(CH_3)_2, L_{A212}$

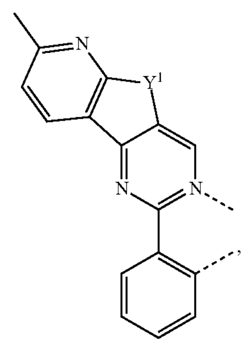

$Y_1 = O, L_{A213}$
$Y_1 = S, L_{A214}$
$Y_1 = NCH_3, L_{A215}$
$Y_1 = C(CH_3)_2, L_{A216}$

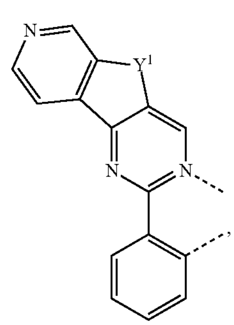

$Y_1 = O, L_{A217}$
$Y_1 = S, L_{A218}$
$Y_1 = NCH_3, L_{A219}$
$Y_1 = C(CH_3)_2, L_{A220}$

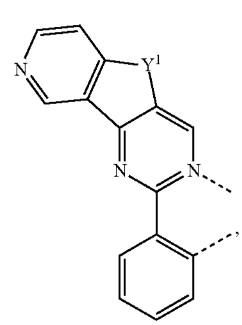

$Y_1 = O, L_{A221}$
$Y_1 = S, L_{A222}$
$Y_1 = NCH_3, L_{A223}$
$Y_1 = C(CH_3)_2, L_{A224}$

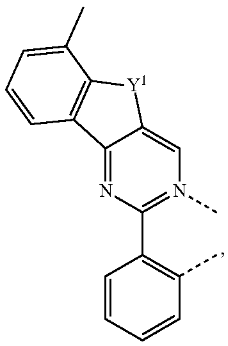

$Y_1$ = O, $L_{A225}$
$Y_1$ = S, $L_{A226}$
$Y_1$ = $NCH_3$, $L_{A227}$
$Y_1$ = $C(CH_3)_2$, $L_{A228}$

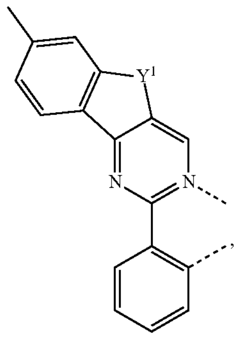

$Y_1$ = O, $L_{A229}$
$Y_1$ = S, $L_{A230}$
$Y_1$ = $NCH_3$, $L_{A231}$
$Y_1$ = $C(CH_3)_2$, $L_{A232}$

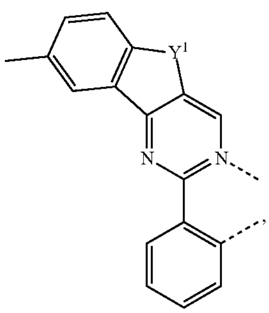

$Y_1$ = O, $L_{A233}$
$Y_1$ = S, $L_{A234}$
$Y_1$ = $NCH_3$, $L_{A235}$
$Y_1$ = $C(CH_3)_2$, $L_{A236}$

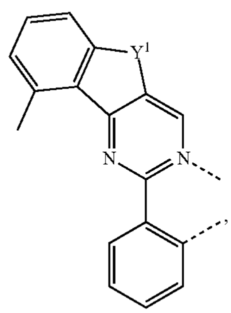

$Y_1$ = O, $L_{A237}$
$Y_1$ = S, $L_{A238}$
$Y_1$ = $NCH_3$, $L_{A239}$
$Y_1$ = $C(CH_3)_2$, $L_{A240}$

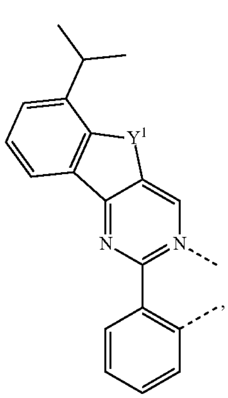

$Y_1$ = O, $L_{A241}$
$Y_1$ = S, $L_{A242}$
$Y_1$ = $NCH_3$, $L_{A243}$
$Y_1$ = $C(CH_3)_2$, $L_{A244}$

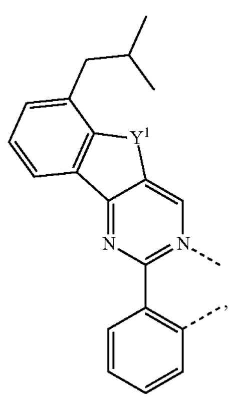

$Y_1$ = O, $L_{A245}$
$Y_1$ = S, $L_{A246}$
$Y_1$ = $NCH_3$, $L_{A247}$
$Y_1$ = $C(CH_3)_2$, $L_{A248}$

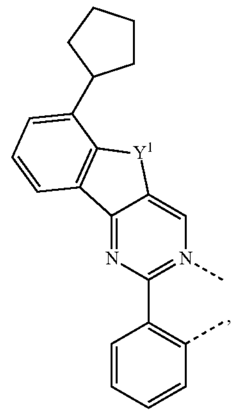

$Y_1$ = O, $L_{A249}$
$Y_1$ = S, $L_{A250}$
$Y_1$ = $NCH_3$, $L_{A251}$
$Y_1$ = $C(CH_3)_2$, $L_{A252}$

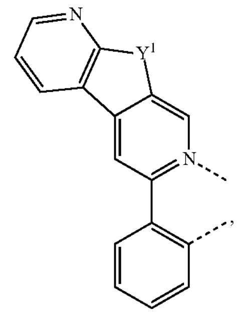

$Y_1$ = O, $L_{A253}$
$Y_1$ = S, $L_{A254}$
$Y_1$ = $NCH_3$, $L_{A255}$
$Y_1$ = $C(CH_3)_2$, $L_{A256}$

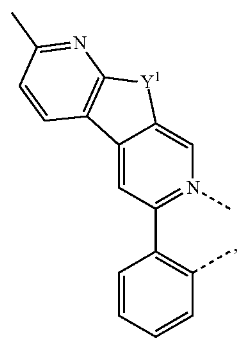

$Y_1$ = O, $L_{A257}$
$Y_1$ = S, $L_{A258}$
$Y_1$ = $NCH_3$, $L_{A259}$
$Y_1$ = $C(CH_3)_2$, $L_{A260}$

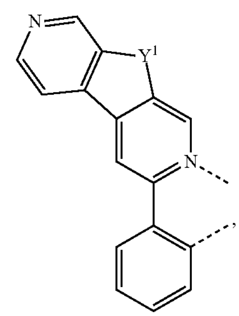

$Y_1$ = O, $L_{A261}$
$Y_1$ = S, $L_{A262}$
$Y_1$ = $NCH_3$, $L_{A263}$
$Y_1$ = $C(CH_3)_2$, $L_{A264}$

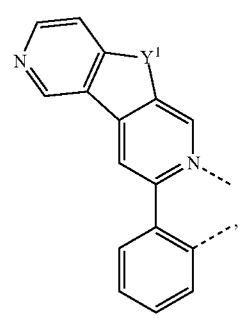

$Y_1$ = O, $L_{A265}$
$Y_1$ = S, $L_{A266}$
$Y_1$ = $NCH_3$, $L_{A267}$
$Y_1$ = $C(CH_3)_2$, $L_{A268}$

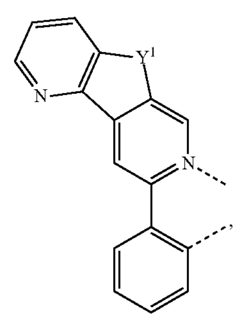

$Y_1$ = O, $L_{A269}$
$Y_1$ = S, $L_{A270}$
$Y_1$ = $NCH_3$, $L_{A271}$
$Y_1$ = $C(CH_3)_2$, $L_{A272}$

-continued

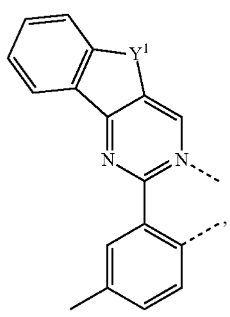

$Y_1 = O, L_{A273}$
$Y_1 = S, L_{A274}$
$Y_1 = NCH_3, L_{A275}$
$Y_1 = C(CH_3)_2, L_{A276}$

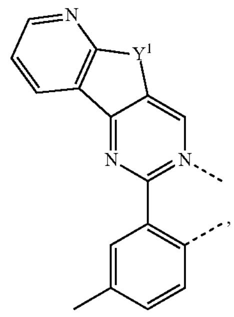

$Y_1 = O, L_{A277}$
$Y_1 = S, L_{A278}$
$Y_1 = NCH_3, L_{A279}$
$Y_1 = C(CH_3)_2, L_{A280}$

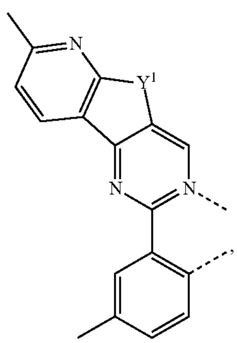

$Y_1 = O, L_{A281}$
$Y_1 = S, L_{A282}$
$Y_1 = NCH_3, L_{A283}$
$Y_1 = C(CH_3)_2, L_{A284}$

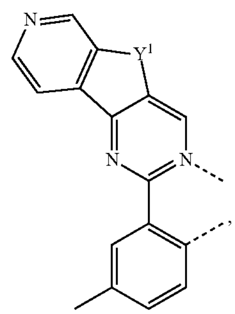

$Y_1 = O, L_{A285}$
$Y_1 = S, L_{A286}$
$Y_1 = NCH_3, L_{A287}$
$Y_1 = C(CH_3)_2, L_{A288}$

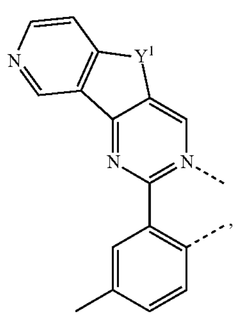

$Y_1 = O, L_{A289}$
$Y_1 = S, L_{A290}$
$Y_1 = NCH_3, L_{A291}$
$Y_1 = C(CH_3)_2, L_{A292}$

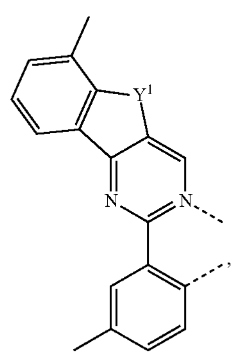

$Y_1 = O, L_{A293}$
$Y_1 = S, L_{A294}$
$Y_1 = NCH_3, L_{A295}$
$Y_1 = C(CH_3)_2, L_{A296}$

-continued

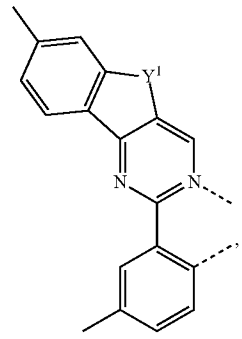

$Y_1 = O, L_{A297}$
$Y_1 = S, L_{A298}$
$Y_1 = NCH_3, L_{A299}$
$Y_1 = C(CH_3)_2, L_{A300}$

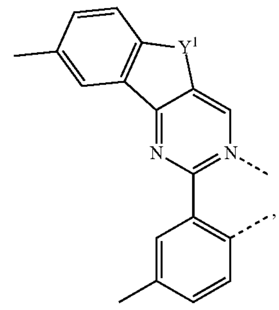

$Y_1 = O, L_{A301}$
$Y_1 = S, L_{A302}$
$Y_1 = NCH_3, L_{A303}$
$Y_1 = C(CH_3)_2, L_{A304}$

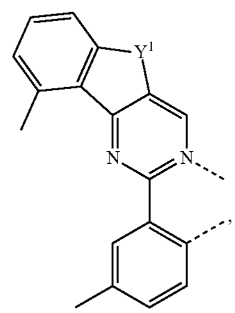

$Y_1 = O, L_{A305}$
$Y_1 = S, L_{A306}$
$Y_1 = NCH_3, L_{A307}$
$Y_1 = C(CH_3)_2, L_{A308}$

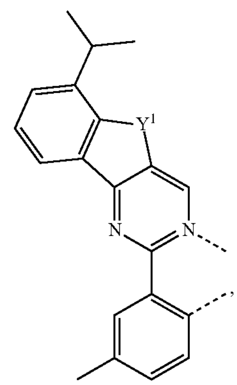

$Y_1 = O, L_{A309}$
$Y_1 = S, L_{A310}$
$Y_1 = NCH_3, L_{A311}$
$Y_1 = C(CH_3)_2, L_{A312}$

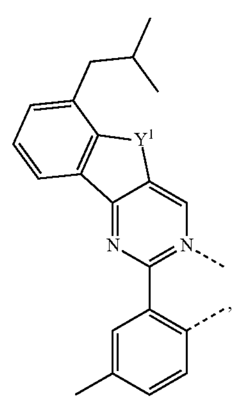

$Y_1 = O, L_{A313}$
$Y_1 = S, L_{A314}$
$Y_1 = NCH_3, L_{A315}$
$Y_1 = C(CH_3)_2, L_{A316}$

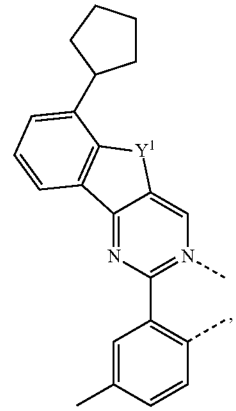

$Y_1 = O, L_{A317}$
$Y_1 = S, L_{A318}$
$Y_1 = NCH_3, L_{A319}$
$Y_1 = C(CH_3)_2, L_{A320}$

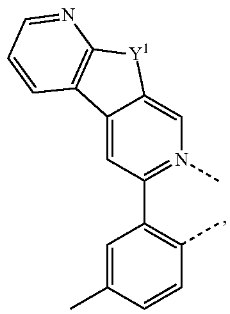

$Y_1$ = O, $L_{A321}$
$Y_1$ = S, $L_{A322}$
$Y_1$ = $NCH_3$, $L_{A323}$
$Y_1$ = $C(CH_3)_2$, $L_{A324}$

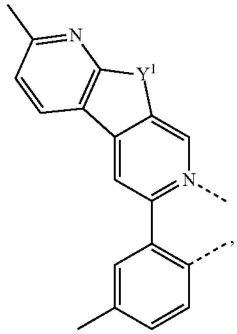

$Y_1$ = O, $L_{A325}$
$Y_1$ = S, $L_{A326}$
$Y_1$ = $NCH_3$, $L_{A327}$
$Y_1$ = $C(CH_3)_2$, $L_{A328}$

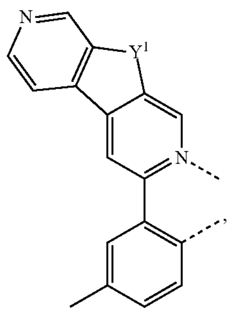

$Y_1$ = O, $L_{A329}$
$Y_1$ = S, $L_{A330}$
$Y_1$ = $NCH_3$, $L_{A331}$
$Y_1$ = $C(CH_3)_2$, $L_{A332}$

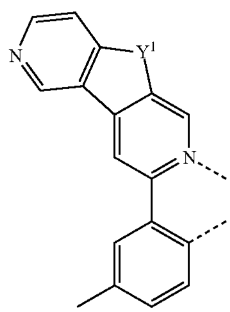

$Y_1$ = O, $L_{A333}$
$Y_1$ = S, $L_{A334}$
$Y_1$ = $NCH_3$, $L_{A335}$
$Y_1$ = $C(CH_3)_2$, $L_{A336}$

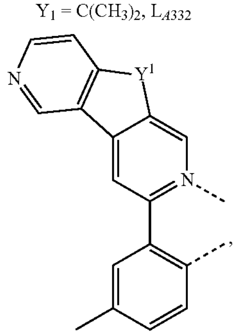

$Y_1$ = O, $L_{A337}$
$Y_1$ = S, $L_{A338}$
$Y_1$ = $NCH_3$, $L_{A339}$
$Y_1$ = $C(CH_3)_2$, $L_{A340}$

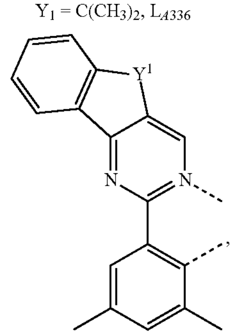

$Y_1$ = O, $L_{A341}$
$Y_1$ = S, $L_{A342}$
$Y_1$ = $NCH_3$, $L_{A343}$
$Y_1$ = $C(CH_3)_2$, $L_{A344}$

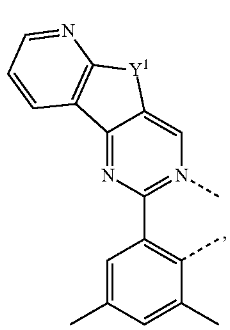

$Y_1$ = O, $L_{A345}$
$Y_1$ = S, $L_{A346}$
$Y_1$ = $NCH_3$, $L_{A347}$
$Y_1$ = $C(CH_3)_2$, $L_{A348}$

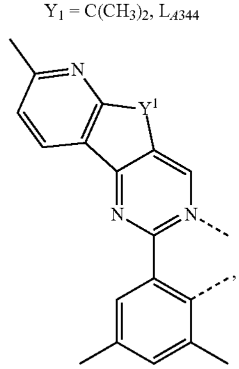

$Y_1$ = O, $L_{A349}$
$Y_1$ = S, $L_{A350}$
$Y_1$ = $NCH_3$, $L_{A351}$
$Y_1$ = $C(CH_3)_2$, $L_{A352}$

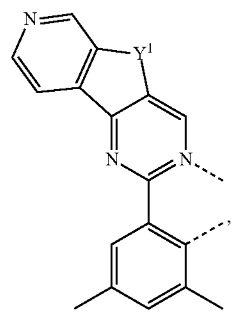

$Y_1$ = O, $L_{A353}$
$Y_1$ = S, $L_{A354}$
$Y_1$ = $NCH_3$, $L_{A355}$
$Y_1$ = $C(CH_3)_2$, $L_{A356}$

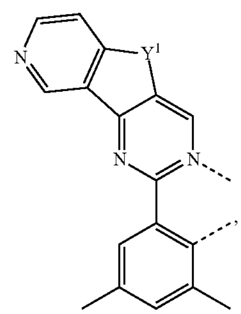

$Y_1$ = O, $L_{A357}$
$Y_1$ = S, $L_{A358}$
$Y_1$ = $NCH_3$, $L_{A359}$
$Y_1$ = $C(CH_3)_2$, $L_{A360}$

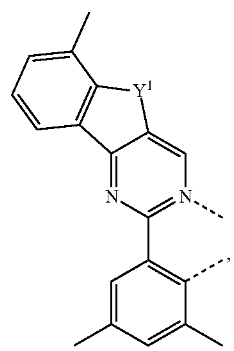

$Y_1$ = O, $L_{A361}$
$Y_1$ = S, $L_{A362}$
$Y_1$ = $NCH_3$, $L_{A363}$
$Y_1$ = $C(CH_3)_2$, $L_{A364}$

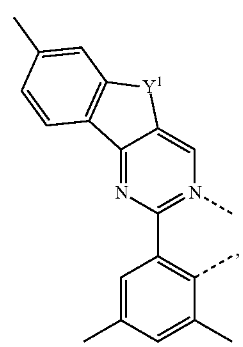

$Y_1$ = O, $L_{A365}$
$Y_1$ = S, $L_{A366}$
$Y_1$ = $NCH_3$, $L_{A367}$
$Y_1$ = $C(CH_3)_2$, $L_{A368}$

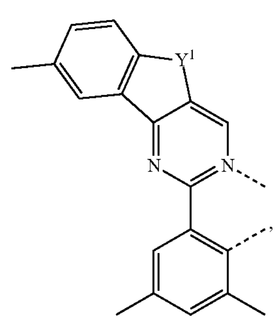

$Y_1$ = O, $L_{A369}$
$Y_1$ = S, $L_{A370}$
$Y_1$ = $NCH_3$, $L_{A371}$
$Y_1$ = $C(CH_3)_2$, $L_{A372}$

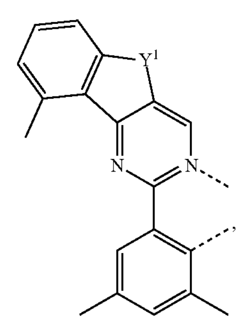

$Y_1$ = O, $L_{A373}$
$Y_1$ = S, $L_{A374}$
$Y_1$ = $NCH_3$, $L_{A375}$
$Y_1$ = $C(CH_3)_2$, $L_{A376}$

-continued

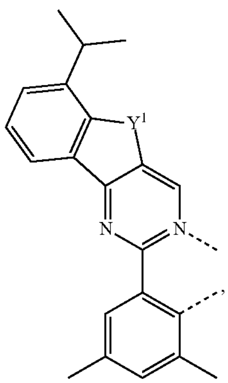

$Y_1 = O$, $L_{A377}$
$Y_1 = S$, $L_{A378}$
$Y_1 = NCH_3$, $L_{A379}$
$Y_1 = C(CH_3)_2$, $L_{A380}$

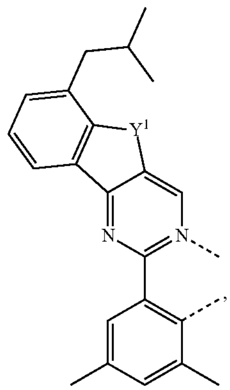

$Y_1 = O$, $L_{A381}$
$Y_1 = S$, $L_{A382}$
$Y_1 = NCH_3$, $L_{A383}$
$Y_1 = C(CH_3)_2$, $L_{A384}$

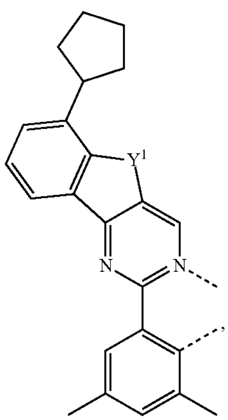

$Y_1 = O$, $L_{A385}$
$Y_1 = S$, $L_{A386}$
$Y_1 = NCH_3$, $L_{A387}$
$Y_1 = C(CH_3)_2$, $L_{A388}$

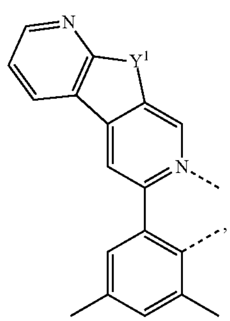

$Y_1 = O$, $L_{A389}$
$Y_1 = S$, $L_{A390}$
$Y_1 = NCH_3$, $L_{A391}$
$Y_1 = C(CH_3)_2$, $L_{A392}$

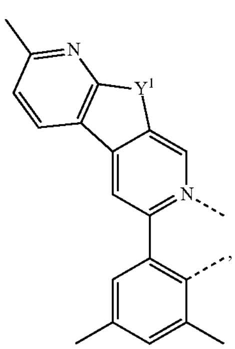

$Y_1 = O$, $L_{A393}$
$Y_1 = S$, $L_{A394}$
$Y_1 = NCH_3$, $L_{A395}$
$Y_1 = C(CH_3)_2$, $L_{A396}$

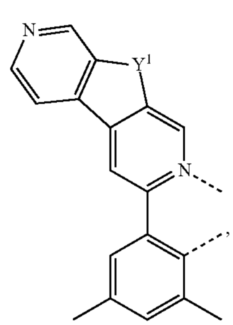

$Y_1 = O$, $L_{A397}$
$Y_1 = S$, $L_{A398}$
$Y_1 = NCH_3$, $L_{A399}$
$Y_1 = C(CH_3)_2$, $L_{A400}$

-continued

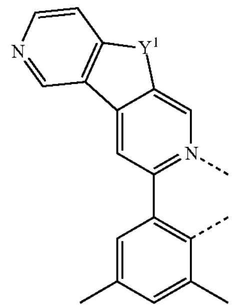

$Y_1 = O$, $L_{A401}$
$Y_1 = S$, $L_{A402}$
$Y_1 = NCH_3$, $L_{A403}$
$Y_1 = C(CH_3)_2$, $L_{A404}$

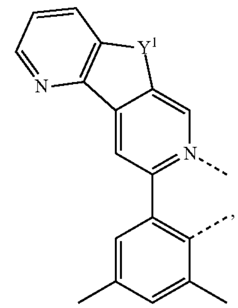

$Y_1 = O$, $L_{A405}$
$Y_1 = S$, $L_{A406}$
$Y_1 = NCH_3$, $L_{A407}$
$Y_1 = C(CH_3)_2$, $L_{A408}$

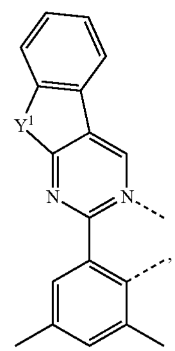

$Y_1 = O$, $L_{A409}$
$Y_1 = S$, $L_{A410}$
$Y_1 = NCH_3$, $L_{A411}$
$Y_1 = C(CH_3)_2$, $L_{A412}$

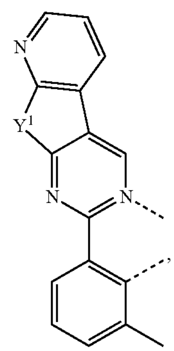

$Y_1 = O$, $L_{A413}$
$Y_1 = S$, $L_{A414}$
$Y_1 = NCH_3$, $L_{A415}$
$Y_1 = C(CH_3)_2$, $L_{A416}$

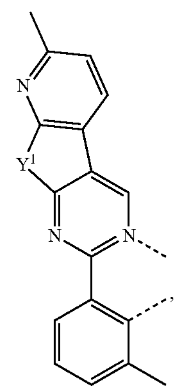

$Y_1 = O$, $L_{A417}$
$Y_1 = S$, $L_{A418}$
$Y_1 = NCH_3$, $L_{A419}$
$Y_1 = C(CH_3)_2$, $L_{A420}$

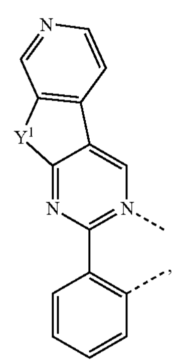

$Y_1 = O$, $L_{A421}$
$Y_1 = S$, $L_{A422}$
$Y_1 = NCH_3$, $L_{A423}$
$Y_1 = C(CH_3)_2$, $L_{A424}$

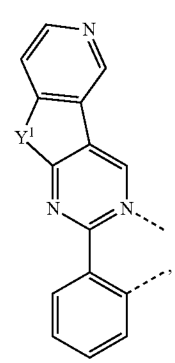

$Y_1 = O$, $L_{A425}$
$Y_1 = S$, $L_{A426}$
$Y_1 = NCH_3$, $L_{A427}$
$Y_1 = C(CH_3)_2$, $L_{A428}$

-continued

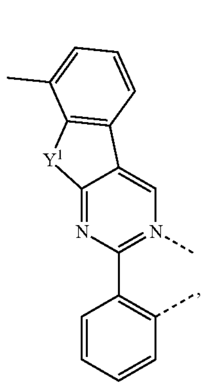

$Y_1 = O$, $L_{A429}$
$Y_1 = S$, $L_{A430}$
$Y_1 = NCH_3$, $L_{A431}$
$Y_1 = C(CH_3)_2$, $L_{A432}$

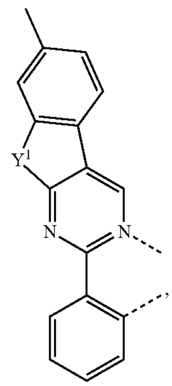

$Y_1 = O$, $L_{A433}$
$Y_1 = S$, $L_{A434}$
$Y_1 = NCH_3$, $L_{A435}$
$Y_1 = C(CH_3)_2$, $L_{A436}$

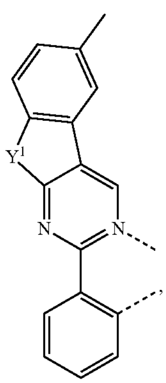

$Y_1 = O$, $L_{A437}$
$Y_1 = S$, $L_{A438}$
$Y_1 = NCH_3$, $L_{A439}$
$Y_1 = C(CH_3)_2$, $L_{A440}$

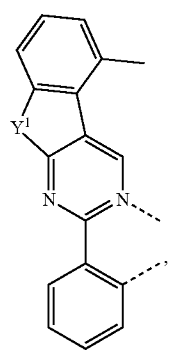

$Y_1 = O$, $L_{A441}$
$Y_1 = S$, $L_{A442}$
$Y_1 = NCH_3$, $L_{A443}$
$Y_1 = C(CH_3)_2$, $L_{A444}$

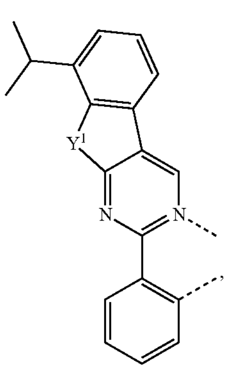

$Y_1 = O$, $L_{A445}$
$Y_1 = S$, $L_{A446}$
$Y_1 = NCH_3$, $L_{A447}$
$Y_1 = C(CH_3)_2$, $L_{A448}$

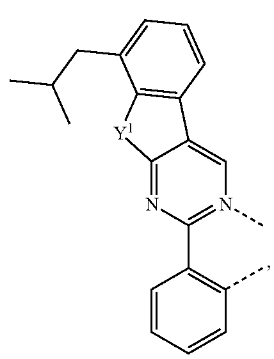

$Y_1 = O$, $L_{A449}$
$Y_1 = S$, $L_{A450}$
$Y_1 = NCH_3$, $L_{A451}$
$Y_1 = C(CH_3)_2$, $L_{A452}$

-continued

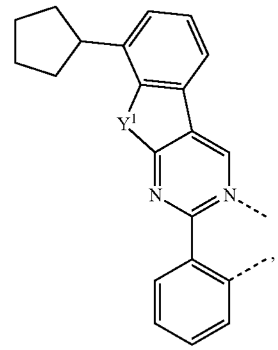

$Y_1 = O$, $L_{A453}$
$Y_1 = S$, $L_{A454}$
$Y_1 = NCH_3$, $L_{A455}$
$Y_1 = C(CH_3)_2$, $L_{A456}$

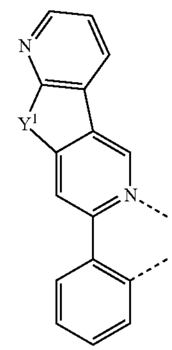

$Y_1 = O$, $L_{A457}$
$Y_1 = S$, $L_{A458}$
$Y_1 = NCH_3$, $L_{A459}$
$Y_1 = C(CH_3)_2$, $L_{A460}$

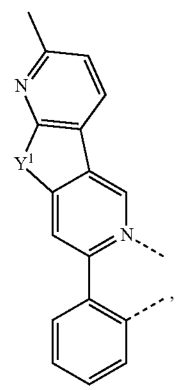

$Y_1 = O$, $L_{A461}$
$Y_1 = S$, $L_{A462}$
$Y_1 = NCH_3$, $L_{A463}$
$Y_1 = C(CH_3)_2$, $L_{A464}$

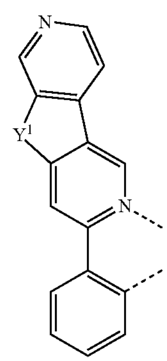

$Y_1 = O$, $L_{A465}$
$Y_1 = S$, $L_{A466}$
$Y_1 = NCH_3$, $L_{A467}$
$Y_1 = C(CH_3)_2$, $L_{A468}$

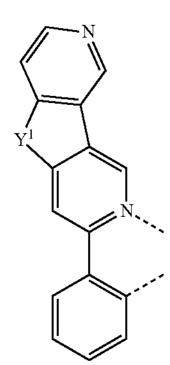

$Y_1 = O$, $L_{A469}$
$Y_1 = S$, $L_{A470}$
$Y_1 = NCH_3$, $L_{A471}$
$Y_1 = C(CH_3)_2$, $L_{A472}$

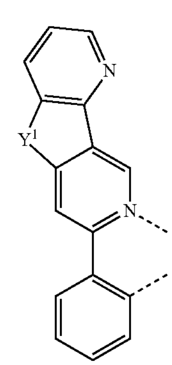

$Y_1 = O$, $L_{A473}$
$Y_1 = S$, $L_{A474}$
$Y_1 = NCH_3$, $L_{A475}$
$Y_1 = C(CH_3)_2$, $L_{A476}$

-continued

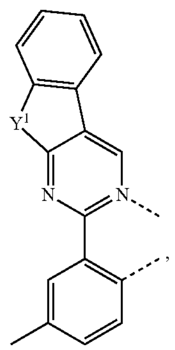

$Y_1$ = O, $L_{A477}$
$Y_1$ = S, $L_{A478}$
$Y_1$ = $NCH_3$, $L_{A479}$
$Y_1$ = $C(CH_3)_2$, $L_{A480}$

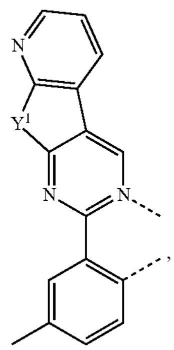

$Y_1$ = O, $L_{A481}$
$Y_1$ = S, $L_{A482}$
$Y_1$ = $NCH_3$, $L_{A483}$
$Y_1$ = $C(CH_3)_2$, $L_{A484}$

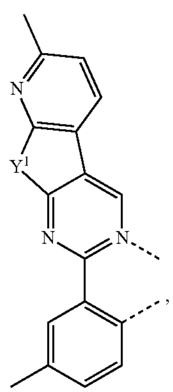

$Y_1$ = O, $L_{A485}$
$Y_1$ = S, $L_{A486}$
$Y_1$ = $NCH_3$, $L_{A487}$
$Y_1$ = $C(CH_3)_2$, $L_{A488}$

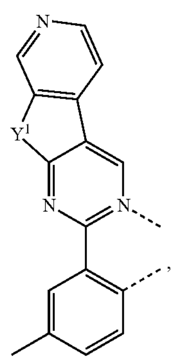

$Y_1$ = O, $L_{A489}$
$Y_1$ = S, $L_{A490}$
$Y_1$ = $NCH_3$, $L_{A491}$
$Y_1$ = $C(CH_3)_2$, $L_{A492}$

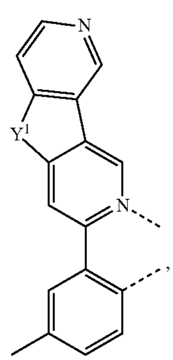

$Y_1$ = O, $L_{A493}$
$Y_1$ = S, $L_{A494}$
$Y_1$ = $NCH_3$, $L_{A495}$
$Y_1$ = $C(CH_3)_2$, $L_{A496}$

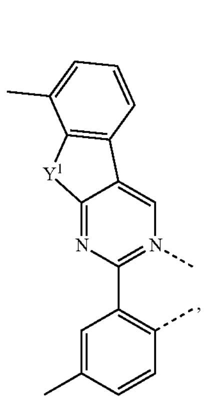

$Y_1$ = O, $L_{A497}$
$Y_1$ = S, $L_{A498}$
$Y_1$ = $NCH_3$, $L_{A499}$
$Y_1$ = $C(CH_3)_2$, $L_{A500}$

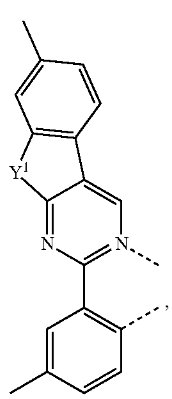

$Y_1$ = O, $L_{A501}$
$Y_1$ = S, $L_{A502}$
$Y_1$ = $NCH_3$, $L_{A503}$
$Y_1$ = $C(CH_3)_2$, $L_{A504}$

-continued

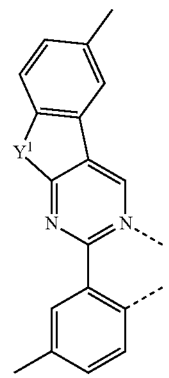

$Y_1$ = O, $L_{A505}$
$Y_1$ = S, $L_{A506}$
$Y_1$ = $NCH_3$, $L_{A507}$
$Y_1$ = $C(CH_3)_2$, $L_{A508}$

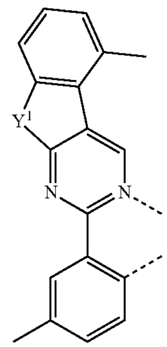

$Y_1$ = O, $L_{A509}$
$Y_1$ = S, $L_{A510}$
$Y_1$ = $NCH_3$, $L_{A511}$
$Y_1$ = $C(CH_3)_2$, $L_{A512}$

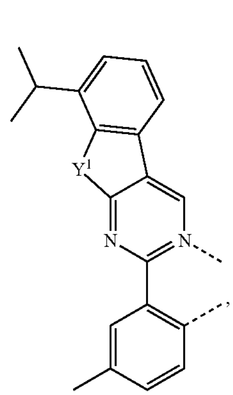

$Y_1$ = O, $L_{A513}$
$Y_1$ = S, $L_{A514}$
$Y_1$ = $NCH_3$, $L_{A515}$
$Y_1$ = $C(CH_3)_2$, $L_{A516}$

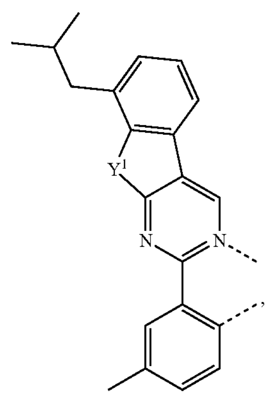

$Y_1$ = O, $L_{A517}$
$Y_1$ = S, $L_{A518}$
$Y_1$ = $NCH_3$, $L_{A519}$
$Y_1$ = $C(CH_3)_2$, $L_{A520}$

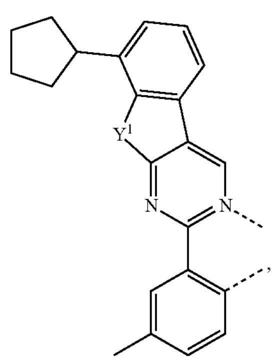

$Y_1$ = O, $L_{A521}$
$Y_1$ = S, $L_{A522}$
$Y_1$ = $NCH_3$, $L_{A523}$
$Y_1$ = $C(CH_3)_2$, $L_{A524}$

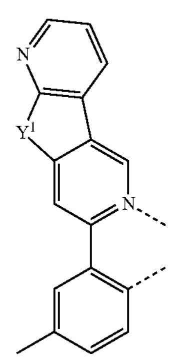

$Y_1$ = O, $L_{A525}$
$Y_1$ = S, $L_{A526}$
$Y_1$ = $NCH_3$, $L_{A527}$
$Y_1$ = $C(CH_3)_2$, $L_{A528}$

-continued

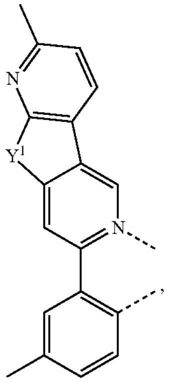

$Y_1 = O, L_{A529}$
$Y_1 = S, L_{A530}$
$Y_1 = NCH_3, L_{A531}$
$Y_1 = C(CH_3)_2, L_{A532}$

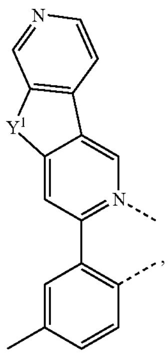

$Y_1 = O, L_{A533}$
$Y_1 = S, L_{A534}$
$Y_1 = NCH_3, L_{A535}$
$Y_1 = C(CH_3)_2, L_{A536}$

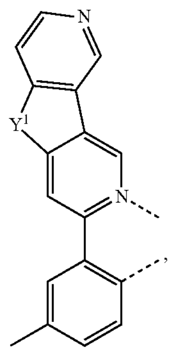

$Y_1 = O, L_{A537}$
$Y_1 = S, L_{A538}$
$Y_1 = NCH_3, L_{A539}$
$Y_1 = C(CH_3)_2, L_{A540}$

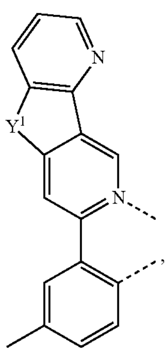

$Y_1 = O, L_{A541}$
$Y_1 = S, L_{A542}$
$Y_1 = NCH_3, L_{A543}$
$Y_1 = C(CH_3)_2, L_{A544}$

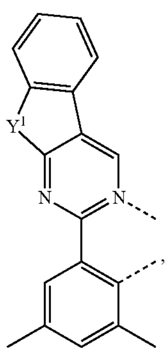

$Y_1 = O, L_{A545}$
$Y_1 = S, L_{A546}$
$Y_1 = NCH_3, L_{A547}$
$Y_1 = C(CH_3)_2, L_{A548}$

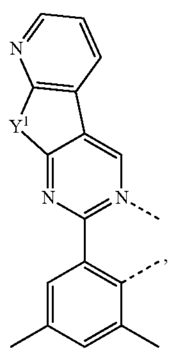

$Y_1 = O, L_{A549}$
$Y_1 = S, L_{A550}$
$Y_1 = NCH_3, L_{A551}$
$Y_1 = C(CH_3)_2, L_{A552}$

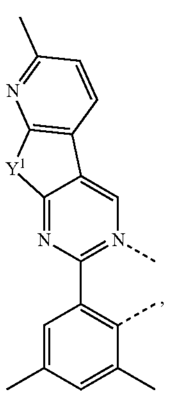

$Y_1 = O, L_{A553}$
$Y_1 = S, L_{A554}$
$Y_1 = NCH_3, L_{A555}$
$Y_1 = C(CH_3)_2, L_{A556}$

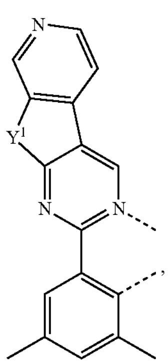

$Y_1 = O, L_{A557}$
$Y_1 = S, L_{A558}$
$Y_1 = NCH_3, L_{A559}$
$Y_1 = C(CH_3)_2, L_{A560}$

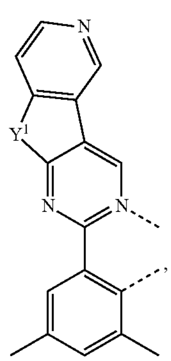

$Y_1 = O, L_{A561}$
$Y_1 = S, L_{A562}$
$Y_1 = NCH_3, L_{A563}$
$Y_1 = C(CH_3)_2, L_{A564}$

-continued

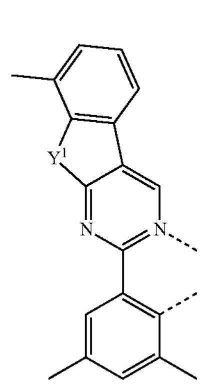

$Y_1 = O, L_{A565}$
$Y_1 = S, L_{A566}$
$Y_1 = NCH_3, L_{A567}$
$Y_1 = C(CH_3)_2, L_{A568}$

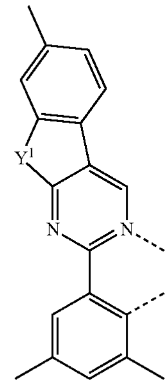

$Y_1 = O, L_{A569}$
$Y_1 = S, L_{A570}$
$Y_1 = NCH_3, L_{A571}$
$Y_1 = C(CH_3)_2, L_{A572}$

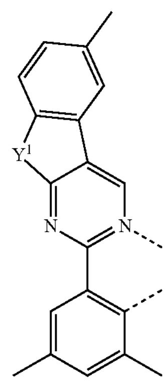

$Y_1 = O, L_{A573}$
$Y_1 = S, L_{A574}$
$Y_1 = NCH_3, L_{A575}$
$Y_1 = C(CH_3)_2, L_{A576}$

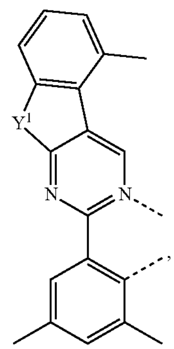

$Y_1 = O, L_{A577}$
$Y_1 = S, L_{A578}$
$Y_1 = NCH_3, L_{A579}$
$Y_1 = C(CH_3)_2, L_{A580}$

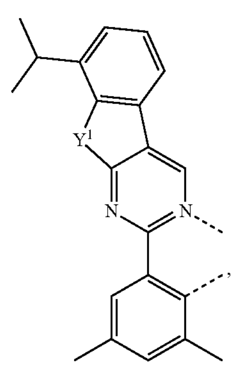

$Y_1 = O, L_{A581}$
$Y_1 = S, L_{A582}$
$Y_1 = NCH_3, L_{A583}$
$Y_1 = C(CH_3)_2, L_{A584}$

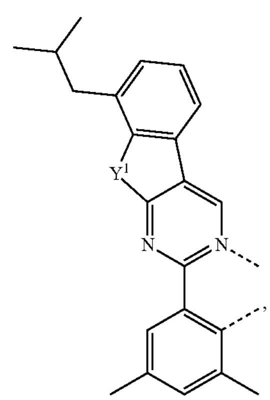

$Y_1 = O, L_{A585}$
$Y_1 = S, L_{A586}$
$Y_1 = NCH_3, L_{A587}$
$Y_1 = C(CH_3)_2, L_{A588}$

-continued

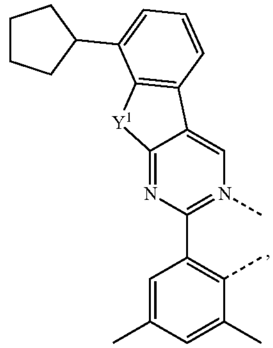

$Y_1$ = O, $L_{A589}$
$Y_1$ = S, $L_{A590}$
$Y_1$ = $NCH_3$, $L_{A591}$
$Y_1$ = $C(CH_3)_2$, $L_{A592}$

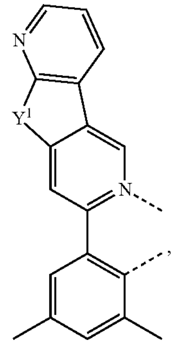

$Y_1$ = O, $L_{A593}$
$Y_1$ = S, $L_{A594}$
$Y_1$ = $NCH_3$, $L_{A595}$
$Y_1$ = $C(CH_3)_2$, $L_{A596}$

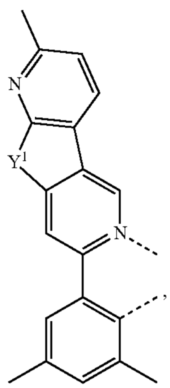

$Y_1$ = O, $L_{A597}$
$Y_1$ = S, $L_{A598}$
$Y_1$ = $NCH_3$, $L_{A599}$
$Y_1$ = $C(CH_3)_2$, $L_{A600}$

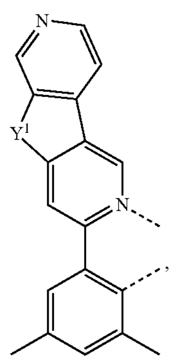

$Y_1$ = O, $L_{A601}$
$Y_1$ = S, $L_{A602}$
$Y_1$ = $NCH_3$, $L_{A603}$
$Y_1$ = $C(CH_3)_2$, $L_{A604}$

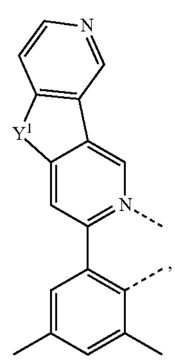

$Y_1$ = O, $L_{A605}$
$Y_1$ = S, $L_{A606}$
$Y_1$ = $NCH_3$, $L_{A607}$
$Y_1$ = $C(CH_3)_2$, $L_{A608}$

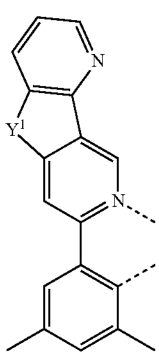

$Y_1$ = O, $L_{A609}$
$Y_1$ = S, $L_{A610}$
$Y_1$ = $NCH_3$, $L_{A611}$
$Y_1$ = $C(CH_3)_2$, $L_{A612}$,

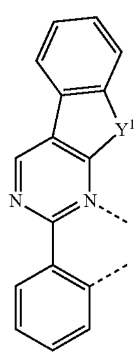

$Y_1$ = O, $L_{A613}$
$Y_1$ = S, $L_{A614}$
$Y_1$ = $NCH_3$, $L_{A615}$
$Y_1$ = $C(CH_3)_2$, $L_{A616}$,

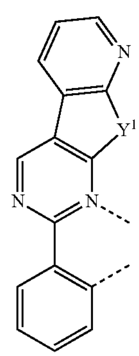

$Y_1$ = O, $L_{A617}$
$Y_1$ = S, $L_{A618}$
$Y_1$ = $NCH_3$, $L_{A619}$
$Y_1$ = $C(CH_3)_2$, $L_{A620}$,

-continued

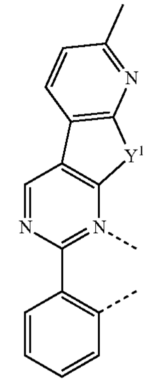

$Y_1$ = O, $L_{A621}$
$Y_1$ = S, $L_{A622}$
$Y_1$ = $NCH_3$, $L_{A623}$
$Y_1$ = $C(CH_3)_2$, $L_{A624}$,

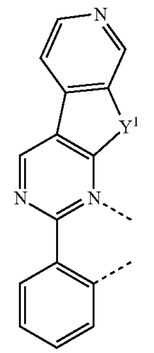

$Y_1$ = O, $L_{A625}$
$Y_1$ = S, $L_{A626}$
$Y_1$ = $NCH_3$, $L_{A627}$
$Y_1$ = $C(CH_3)_2$, $L_{A628}$,

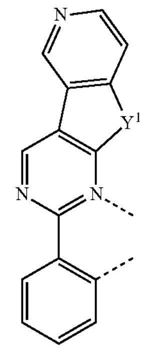

$Y_1$ = O, $L_{A629}$
$Y_1$ = S, $L_{A630}$
$Y_1$ = $NCH_3$, $L_{A631}$
$Y_1$ = $C(CH_3)_2$, $L_{A632}$,

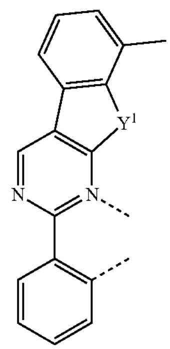

$Y_1$ = O, $L_{A633}$
$Y_1$ = S, $L_{A634}$
$Y_1$ = $NCH_3$, $L_{A635}$
$Y_1$ = $C(CH_3)_2$, $L_{A636}$,

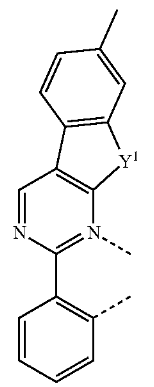

$Y_1$ = O, $L_{A637}$
$Y_1$ = S, $L_{A638}$
$Y_1$ = $NCH_3$, $L_{A639}$
$Y_1$ = $C(CH_3)_2$, $L_{A640}$,

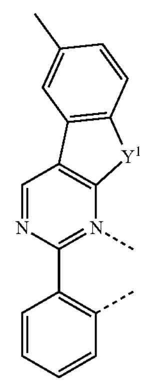

$Y_1$ = O, $L_{A641}$
$Y_1$ = S, $L_{A642}$
$Y_1$ = $NCH_3$, $L_{A643}$
$Y_1$ = $C(CH_3)_2$, $L_{A644}$,

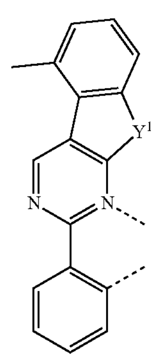

$Y_1$ = O, $L_{A645}$
$Y_1$ = S, $L_{A646}$
$Y_1$ = $NCH_3$, $L_{A647}$
$Y_1$ = $C(CH_3)_2$, $L_{A648}$,

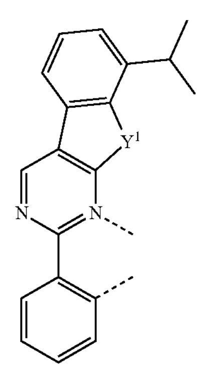

$Y_1$ = O, $L_{A649}$
$Y_1$ = S, $L_{A650}$
$Y_1$ = $NCH_3$, $L_{A651}$
$Y_1$ = $C(CH_3)_2$, $L_{A652}$ ,

-continued

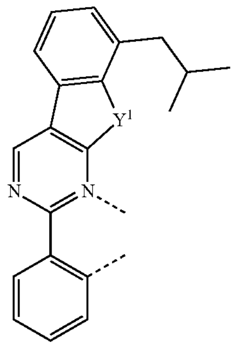

$Y_1$ = O, $L_{A653}$
$Y_1$ = S, $L_{A654}$
$Y_1$ = $NCH_3$, $L_{A655}$
$Y_1$ = $C(CH_3)_2$, $L_{A656}$ ,

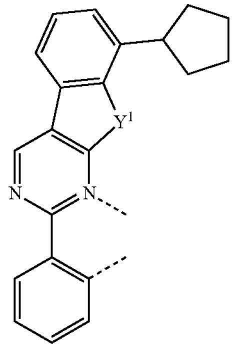

$Y_1$ = O, $L_{A657}$
$Y_1$ = S, $L_{A654}$
$Y_1$ = $NCH_3$, $L_{A659}$
$Y_1$ = $C(CH_3)_2$, $L_{A660}$ ,

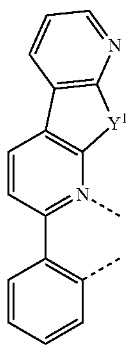

$Y_1$ = O, $L_{A661}$
$Y_1$ = S, $L_{A662}$
$Y_1$ = $NCH_3$, $L_{A663}$
$Y_1$ = $C(CH_3)_2$, $L_{A664}$,

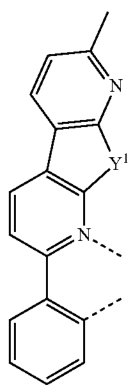

$Y_1$ = O, $L_{A665}$
$Y_1$ = S, $L_{A666}$
$Y_1$ = $NCH_3$, $L_{A667}$
$Y_1$ = $C(CH_3)_2$, $L_{A668}$,

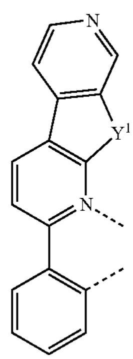

$Y_1$ = O, $L_{A669}$
$Y_1$ = S, $L_{A670}$
$Y_1$ = $NCH_3$, $L_{A671}$
$Y_1$ = $C(CH_3)_2$, $L_{A672}$,

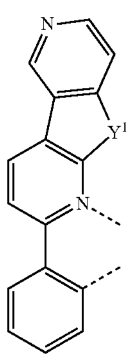

$Y_1$ = O, $L_{A673}$
$Y_1$ = S, $L_{A674}$
$Y_1$ = $NCH_3$, $L_{A675}$
$Y_1$ = $C(CH_3)_2$, $L_{A676}$,

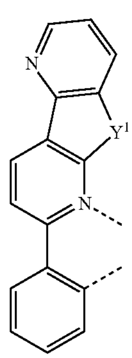

$Y_1$ = O, $L_{A677}$
$Y_1$ = S, $L_{A678}$
$Y_1$ = $NCH_3$, $L_{A679}$
$Y_1$ = $C(CH_3)_2$, $L_{A680}$,

-continued

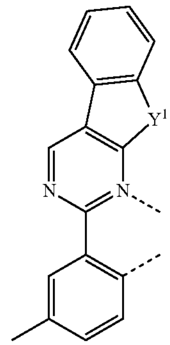

$Y_1$ = O, $L_{A681}$
$Y_1$ = S, $L_{A682}$
$Y_1$ = $NCH_3$, $L_{A683}$
$Y_1$ = $C(CH_3)_2$, $L_{A684}$ ,

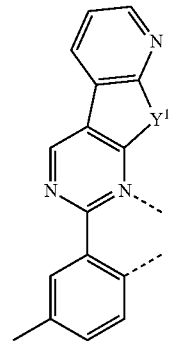

$Y_1$ = O, $L_{A685}$
$Y_1$ = S, $L_{A686}$
$Y_1$ = $NCH_3$, $L_{A687}$
$Y_1$ = $C(CH_3)_2$, $L_{A688}$ ,

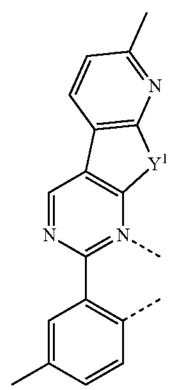

$Y_1$ = O, $L_{A689}$
$Y_1$ = S, $L_{A690}$
$Y_1$ = $NCH_3$, $L_{A691}$
$Y_1$ = $C(CH_3)_2$, $L_{A692}$ ,

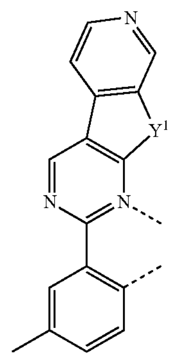

$Y_1$ = O, $L_{A693}$
$Y_1$ = S, $L_{A694}$
$Y_1$ = $NCH_3$, $L_{A695}$
$Y_1$ = $C(CH_3)_2$, $L_{A696}$ ,

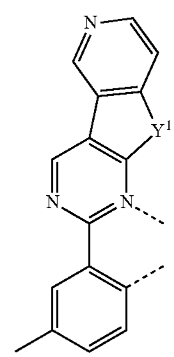

$Y_1$ = O, $L_{A697}$
$Y_1$ = S, $L_{A698}$
$Y_1$ = $NCH_3$, $L_{A699}$
$Y_1$ = $C(CH_3)_2$, $L_{A700}$ ,

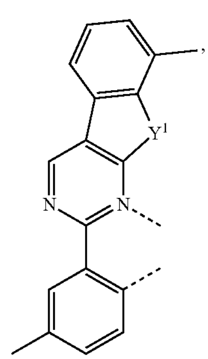

$Y_1$ = O, $L_{A701}$
$Y_1$ = S, $L_{A702}$
$Y_1$ = $NCH_3$, $L_{A703}$
$Y_1$ = $C(CH_3)_2$, $L_{A704}$

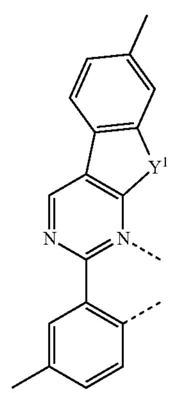

$Y_1$ = O, $L_{A705}$
$Y_1$ = S, $L_{A706}$
$Y_1$ = $NCH_3$, $L_{A707}$
$Y_1$ = $C(CH_3)_2$, $L_{A708}$ ,

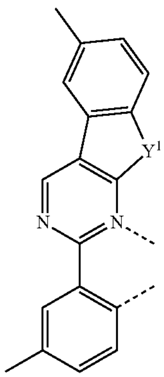

$Y_1$ = O, $L_{A709}$
$Y_1$ = S, $L_{A710}$
$Y_1$ = $NCH_3$, $L_{A711}$
$Y_1$ = $C(CH_3)_2$, $L_{A712}$,

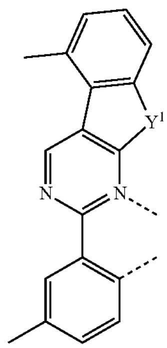

$Y_1$ = O, $L_{A713}$
$Y_1$ = S, $L_{A714}$
$Y_1$ = $NCH_3$, $L_{A715}$
$Y_1$ = $C(CH_3)_2$, $L_{A716}$,

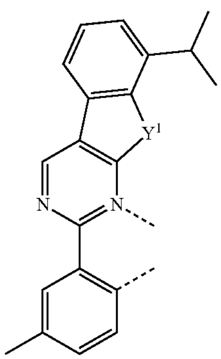

$Y_1$ = O, $L_{A717}$
$Y_1$ = S, $L_{A718}$
$Y_1$ = $NCH_3$, $L_{A719}$
$Y_1$ = $C(CH_3)_2$, $L_{A720}$ ,

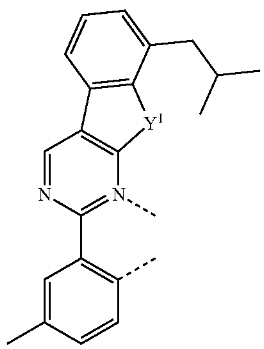

$Y_1$ = O, $L_{A721}$
$Y_1$ = S, $L_{A722}$
$Y_1$ = $NCH_3$, $L_{A723}$
$Y_1$ = $C(CH_3)_2$, $L_{A724}$ ,

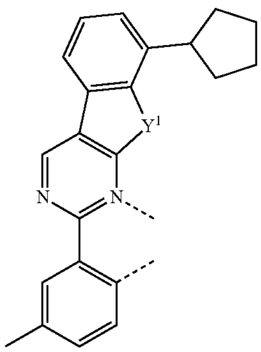

$Y_1$ = O, $L_{A725}$
$Y_1$ = S, $L_{A726}$
$Y_1$ = $NCH_3$, $L_{A727}$
$Y_1$ = $C(CH_3)_2$, $L_{A728}$ ,

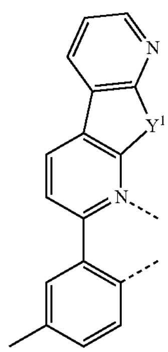

$Y_1$ = O, $L_{A729}$
$Y_1$ = S, $L_{A730}$
$Y_1$ = $NCH_3$, $L_{A731}$
$Y_1$ = $C(CH_3)_2$, $L_{A732}$,

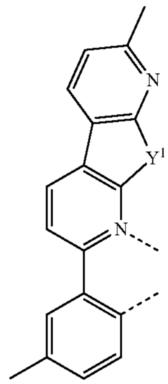

$Y_1$ = O, $L_{A733}$
$Y_1$ = S, $L_{A734}$
$Y_1$ = $NCH_3$, $L_{A735}$
$Y_1$ = $C(CH_3)_2$, $L_{A736}$,

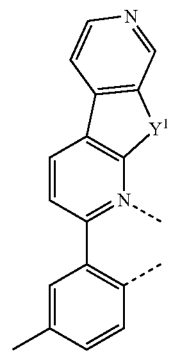

$Y_1$ = O, $L_{A737}$
$Y_1$ = S, $L_{A738}$
$Y_1$ = $NCH_3$, $L_{A739}$
$Y_1$ = $C(CH_3)_2$, $L_{A740}$,

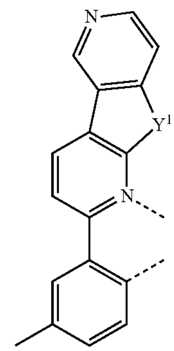

$Y_1$ = O, $L_{A741}$
$Y_1$ = S, $L_{A742}$
$Y_1$ = $NCH_3$, $L_{A743}$
$Y_1$ = $C(CH_3)_2$, $L_{A744}$,

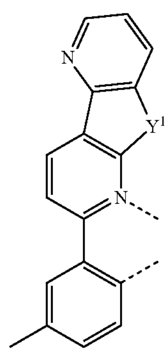

$Y_1$ = O, $L_{A745}$
$Y_1$ = S, $L_{A746}$
$Y_1$ = $NCH_3$, $L_{A747}$
$Y_1$ = $C(CH_3)_2$, $L_{A748}$,

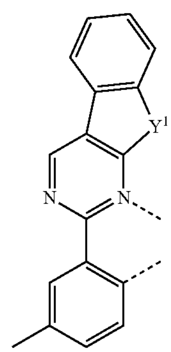

$Y_1$ = O, $L_{A749}$
$Y_1$ = S, $L_{A750}$
$Y_1$ = $NCH_3$, $L_{A751}$
$Y_1$ = $C(CH_3)_2$, $L_{A752}$,

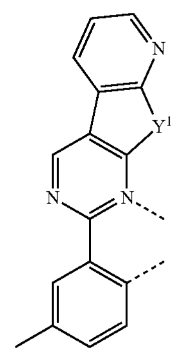

$Y_1$ = O, $L_{A753}$
$Y_1$ = S, $L_{A754}$
$Y_1$ = $NCH_3$, $L_{A755}$
$Y_1$ = $C(CH_3)_2$, $L_{A756}$,

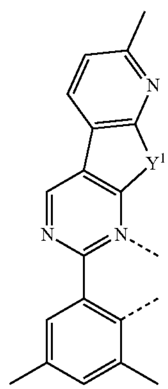

$Y_1$ = O, $L_{A757}$
$Y_1$ = S, $L_{A758}$
$Y_1$ = $NCH_3$, $L_{A759}$
$Y_1$ = $C(CH_3)_2$, $L_{A760}$,

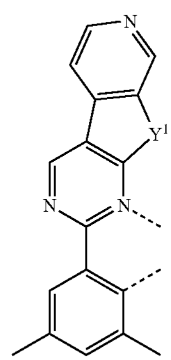

$Y_1$ = O, $L_{A761}$
$Y_1$ = S, $L_{A762}$
$Y_1$ = $NCH_3$, $L_{A763}$
$Y_1$ = $C(CH_3)_2$, $L_{A764}$,

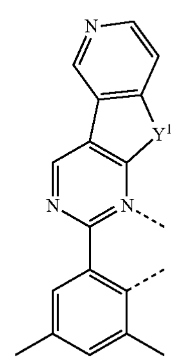

$Y_1$ = O, $L_{A765}$
$Y_1$ = S, $L_{A766}$
$Y_1$ = $NCH_3$, $L_{A767}$
$Y_1$ = $C(CH_3)_2$, $L_{A768}$,

-continued

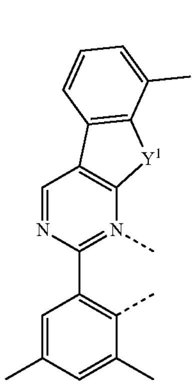

$Y_1$ = O, $L_{A769}$
$Y_1$ = S, $L_{A770}$
$Y_1$ = $NCH_3$, $L_{A771}$
$Y_1$ = $C(CH_3)_2$, $L_{A772}$ ,

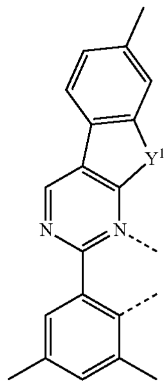

$Y_1$ = O, $L_{A773}$
$Y_1$ = S, $L_{A774}$
$Y_1$ = $NCH_3$, $L_{A775}$
$Y_1$ = $C(CH_3)_2$, $L_{A776}$,

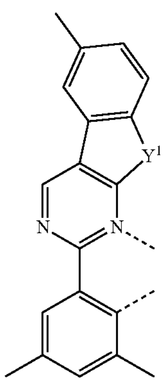

$Y_1$ = O, $L_{A777}$
$Y_1$ = S, $L_{A778}$
$Y_1$ = $NCH_3$, $L_{A779}$
$Y_1$ = $C(CH_3)_2$, $L_{A780}$,

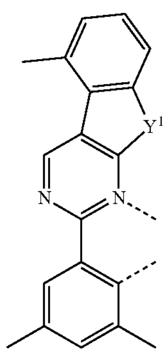

$Y_1$ = O, $L_{A781}$
$Y_1$ = S, $L_{A782}$
$Y_1$ = $NCH_3$, $L_{A783}$
$Y_1$ = $C(CH_3)_2$, $L_{A784}$,

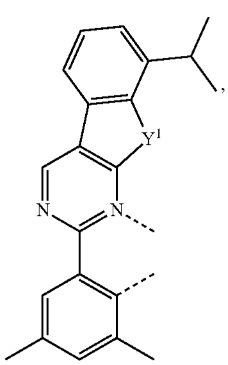

$Y_1$ = O, $L_{A785}$
$Y_1$ = S, $L_{A786}$
$Y_1$ = $NCH_3$, $L_{A787}$
$Y_1$ = $C(CH_3)_2$, $L_{A788}$

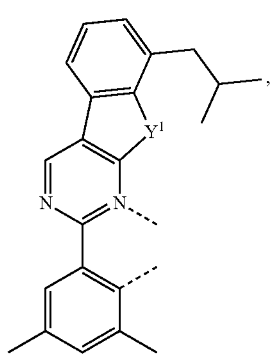

$Y_1$ = O, $L_{A789}$
$Y_1$ = S, $L_{A790}$
$Y_1$ = $NCH_3$, $L_{A791}$
$Y_1$ = $C(CH_3)_2$, $L_{A792}$

-continued

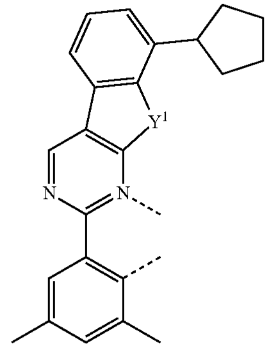

$Y_1$ = O, $L_{A793}$
$Y_1$ = S, $L_{A794}$
$Y_1$ = $NCH_3$, $L_{A795}$
$Y_1$ = $C(CH_3)_2$, $L_{A796}$ ,

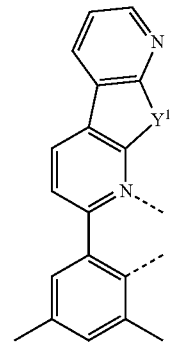

$Y_1$ = O, $L_{A797}$
$Y_1$ = S, $L_{A798}$
$Y_1$ = $NCH_3$, $L_{A799}$
$Y_1$ = $C(CH_3)_2$, $L_{A800}$,

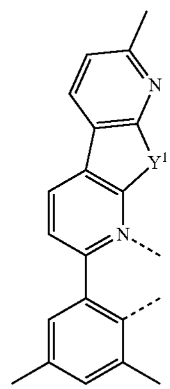

$Y_1$ = O, $L_{A801}$
$Y_1$ = S, $L_{A802}$
$Y_1$ = $NCH_3$, $L_{A803}$
$Y_1$ = $C(CH_3)_2$, $L_{A804}$ ,

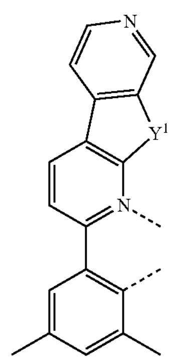

$Y_1$ = O, $L_{A805}$
$Y_1$ = S, $L_{A806}$
$Y_1$ = $NCH_3$, $L_{A807}$
$Y_1$ = $C(CH_3)_2$, $L_{A808}$,

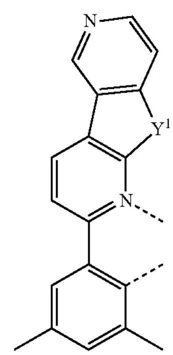

$Y_1$ = O, $L_{A809}$
$Y_1$ = S, $L_{A810}$
$Y_1$ = $NCH_3$, $L_{A811}$
$Y_1$ = $C(CH_3)_2$, $L_{A812}$,

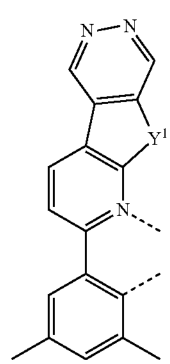

$Y_1$ = O, $L_{A813}$
$Y_1$ = S, $L_{A814}$
$Y_1$ = $NCH_3$, $L_{A815}$
$Y_1$ = $C(CH_3)_2$, $L_{A816}$,

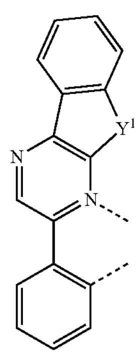

$Y_1$ = O, $L_{A817}$
$Y_1$ = S, $L_{A818}$
$Y_1$ = $NCH_3$, $L_{A819}$
$Y_1$ = $C(CH_3)_2$, $L_{A820}$,

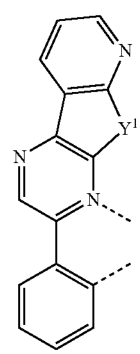

$Y_1$ = O, $L_{A821}$
$Y_1$ = S, $L_{A822}$
$Y_1$ = $NCH_3$, $L_{A823}$
$Y_1$ = $C(CH_3)_2$, $L_{A824}$,

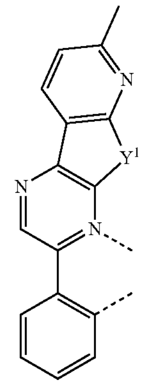

$Y_1 = O$, $L_{A825}$
$Y_1 = S$, $L_{A826}$
$Y_1 = NCH_3$, $L_{A827}$
$Y_1 = C(CH_3)_2$, $L_{A828}$,

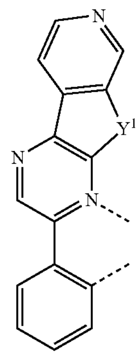

$Y_1 = O$, $L_{A829}$
$Y_1 = S$, $L_{A830}$
$Y_1 = NCH_3$, $L_{A831}$
$Y_1 = C(CH_3)_2$, $L_{A832}$,

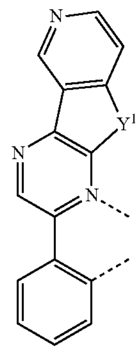

$Y_1 = O$, $L_{A833}$
$Y_1 = S$, $L_{A834}$
$Y_1 = NCH_3$, $L_{A835}$
$Y_1 = C(CH_3)_2$, $L_{A836}$,

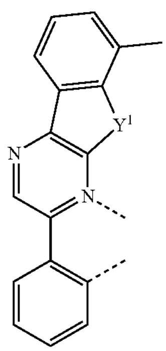

$Y_1 = O$, $L_{A837}$
$Y_1 = S$, $L_{A838}$
$Y_1 = NCH_3$, $L_{A839}$
$Y_1 = C(CH_3)_2$, $L_{A840}$,

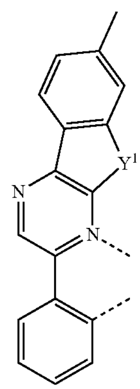

$Y_1 = O$, $L_{A841}$
$Y_1 = S$, $L_{A842}$
$Y_1 = NCH_3$, $L_{A843}$
$Y_1 = C(CH_3)_2$, $L_{A844}$,

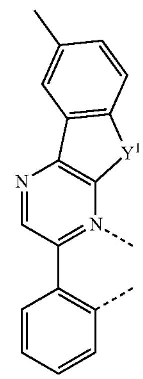

$Y_1 = O$, $L_{A845}$
$Y_1 = S$, $L_{A846}$
$Y_1 = NCH_3$, $L_{A847}$
$Y_1 = C(CH_3)_2$, $L_{A848}$,

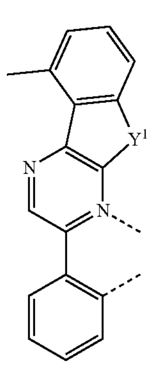

$Y_1 = O$, $L_{A849}$
$Y_1 = S$, $L_{A850}$
$Y_1 = NCH_3$, $L_{A851}$
$Y_1 = C(CH_3)_2$, $L_{A852}$,

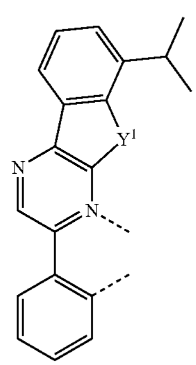

$Y_1 = O$, $L_{A853}$
$Y_1 = S$, $L_{A854}$
$Y_1 = NCH_3$, $L_{A855}$
$Y_1 = C(CH_3)_2$, $L_{A856}$ ,

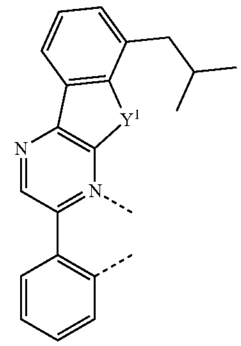

$Y_1 = O$, $L_{A857}$
$Y_1 = S$, $L_{A858}$
$Y_1 = NCH_3$, $L_{A859}$
$Y_1 = C(CH_3)_2$, $L_{A860}$ ,

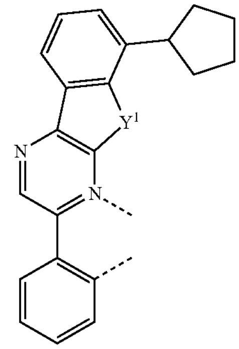

$Y_1 = O$, $L_{A861}$
$Y_1 = S$, $L_{A862}$
$Y_1 = NCH_3$, $L_{A863}$
$Y_1 = C(CH_3)_2$, $L_{A864}$ ,

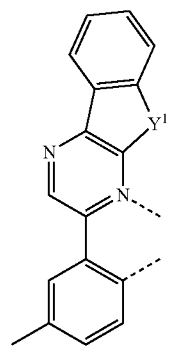

$Y_1 = O$, $L_{A865}$
$Y_1 = S$, $L_{A866}$
$Y_1 = NCH_3$, $L_{A867}$
$Y_1 = C(CH_3)_2$, $L_{A868}$,

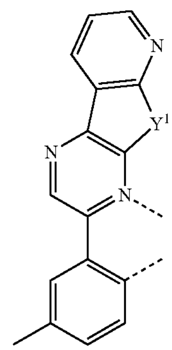

$Y_1 = O$, $L_{A869}$
$Y_1 = S$, $L_{A870}$
$Y_1 = NCH_3$, $L_{A871}$
$Y_1 = C(CH_3)_2$, $L_{A872}$,

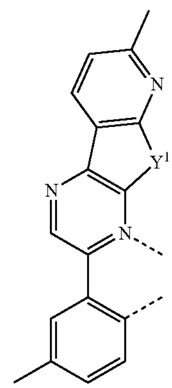

$Y_1 = O$, $L_{A873}$
$Y_1 = S$, $L_{A874}$
$Y_1 = NCH_3$, $L_{A875}$
$Y_1 = C(CH_3)_2$, $L_{A876}$,

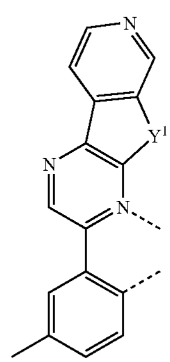

$Y_1 = O$, $L_{A877}$
$Y_1 = S$, $L_{A878}$
$Y_1 = NCH_3$, $L_{A879}$
$Y_1 = C(CH_3)_2$, $L_{A880}$,

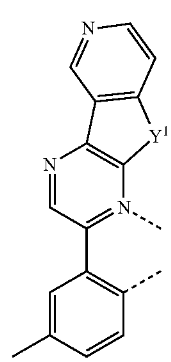

$Y_1 = O$, $L_{A881}$
$Y_1 = S$, $L_{A882}$
$Y_1 = NCH_3$, $L_{A883}$
$Y_1 = C(CH_3)_2$, $L_{A884}$,

-continued

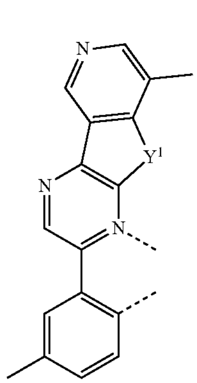

$Y_1$ = O, $L_{A885}$
$Y_1$ = S, $L_{A886}$
$Y_1$ = $NCH_3$, $L_{A887}$
$Y_1$ = $C(CH_3)_2$, $L_{A888}$ ,

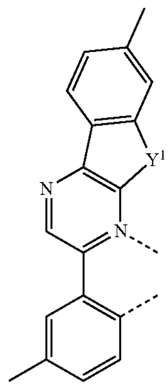

$Y_1$ = O, $L_{A889}$
$Y_1$ = S, $L_{A890}$
$Y_1$ = $NCH_3$, $L_{A891}$
$Y_1$ = $C(CH_3)_2$, $L_{A892}$,

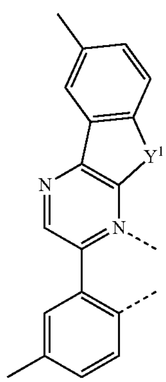

$Y_1$ = O, $L_{A893}$
$Y_1$ = S, $L_{A894}$
$Y_1$ = $NCH_3$, $L_{A895}$
$Y_1$ = $C(CH_3)_2$, $L_{A896}$,

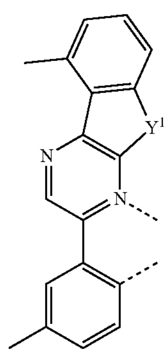

$Y_1$ = O, $L_{A897}$
$Y_1$ = S, $L_{A898}$
$Y_1$ = $NCH_3$, $L_{A899}$
$Y_1$ = $C(CH_3)_2$, $L_{A900}$,

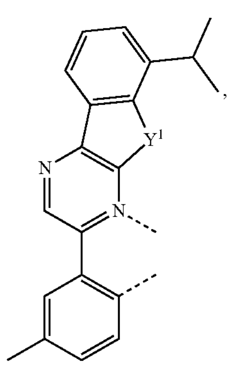

$Y_1$ = O, $L_{A901}$
$Y_1$ = S, $L_{A902}$
$Y_1$ = $NCH_3$, $L_{A903}$
$Y_1$ = $C(CH_3)_2$, $L_{A904}$

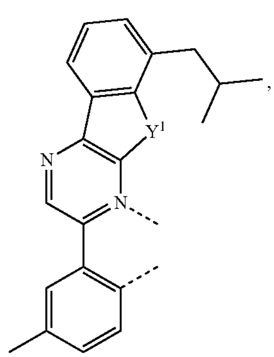

$Y_1$ = O, $L_{A905}$
$Y_1$ = S, $L_{A906}$
$Y_1$ = $NCH_3$, $L_{A907}$
$Y_1$ = $C(CH_3)_2$, $L_{A908}$

-continued

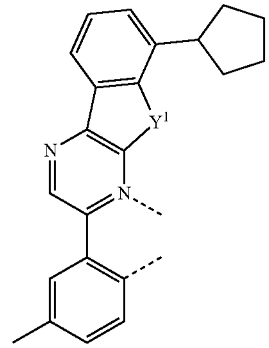

$Y_1$ = O, $L_{A909}$
$Y_1$ = S, $L_{A910}$
$Y_1$ = $NCH_3$, $L_{A911}$
$Y_1$ = $C(CH_3)_2$, $L_{A912}$ ,

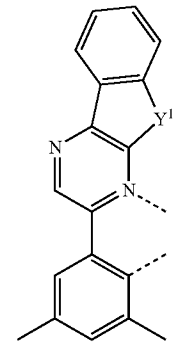

$Y_1$ = O, $L_{A913}$
$Y_1$ = S, $L_{A914}$
$Y_1$ = $NCH_3$, $L_{A915}$
$Y_1$ = $C(CH_3)_2$, $L_{A916}$,

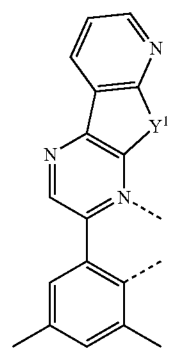

$Y_1$ = O, $L_{A917}$
$Y_1$ = S, $L_{A918}$
$Y_1$ = $NCH_3$, $L_{A919}$
$Y_1$ = $C(CH_3)_2$, $L_{A920}$,

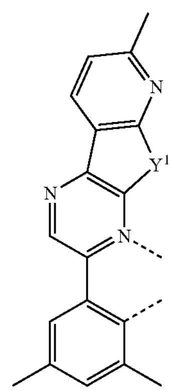

$Y_1$ = O, $L_{A921}$
$Y_1$ = S, $L_{A922}$
$Y_1$ = $NCH_3$, $L_{A923}$
$Y_1$ = $C(CH_3)_2$, $L_{A924}$,

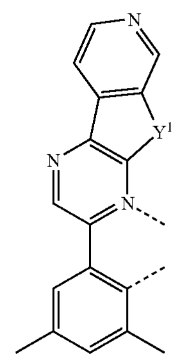

$Y_1$ = O, $L_{A925}$
$Y_1$ = S, $L_{A926}$
$Y_1$ = $NCH_3$, $L_{A927}$
$Y_1$ = $C(CH_3)_2$, $L_{A928}$,

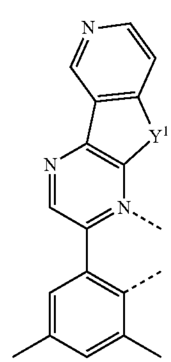

$Y_1$ = O, $L_{A929}$
$Y_1$ = S, $L_{A930}$
$Y_1$ = $NCH_3$, $L_{A931}$
$Y_1$ = $C(CH_3)_2$, $L_{A932}$,

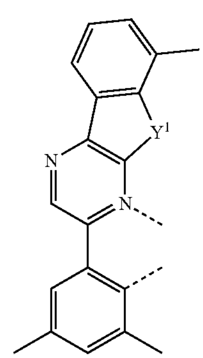

$Y_1$ = O, $L_{A933}$
$Y_1$ = S, $L_{A934}$
$Y_1$ = $NCH_3$, $L_{A935}$
$Y_1$ = $C(CH_3)_2$, $L_{A936}$ ,

-continued
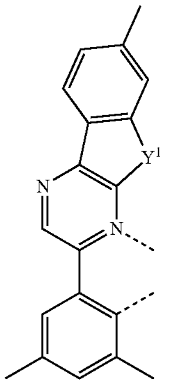
$Y_1 = O, L_{A937}$
$Y_1 = S, L_{A938}$
$Y_1 = NCH_3, L_{A939}$
$Y_1 = C(CH_3)_2, L_{A940}$,
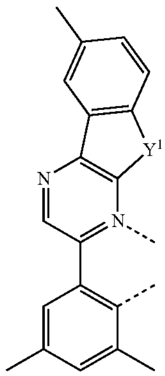
$Y_1 = O, L_{A941}$
$Y_1 = S, L_{A942}$
$Y_1 = NCH_3, L_{A943}$
$Y_1 = C(CH_3)_2, L_{A944}$,
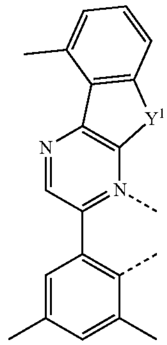
$Y_1 = O, L_{A945}$
$Y_1 = S, L_{A946}$
$Y_1 = NCH_3, L_{A947}$
$Y_1 = C(CH_3)_2, L_{A948}$,
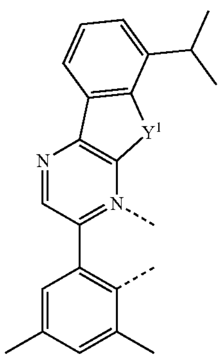
$Y_1 = O, L_{A949}$
$Y_1 = S, L_{A950}$
$Y_1 = NCH_3, L_{A951}$
$Y_1 = C(CH_3)_2, L_{A952}$ ,
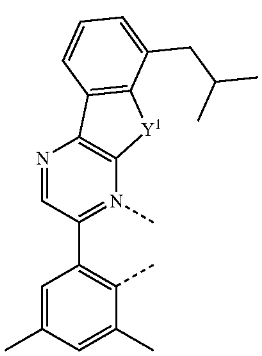
$Y_1 = O, L_{A953}$
$Y_1 = S, L_{A954}$
$Y_1 = NCH_3, L_{A955}$
$Y_1 = C(CH_3)_2, L_{A956}$ , and
-continued
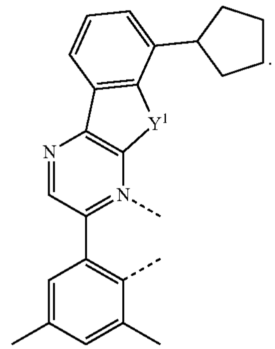
$Y_1 = O, L_{A957}$
$Y_1 = S, L_{A958}$
$Y_1 = NCH_3, L_{A959}$
$Y_1 = C(CH_3)_2, L_{A960}$
15. The compound of claim 14, wherein $L_B$ is selected from the group consisting of:
$L_{B1}$
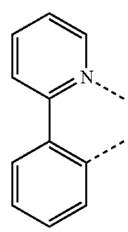
$L_{B2}$
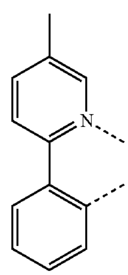
$L_{B3}$
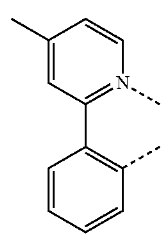
$L_{B4}$
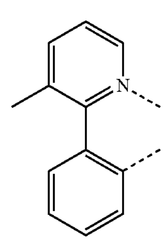

-continued
$L_{B5}$
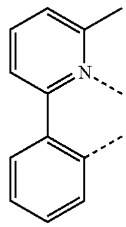
$L_{B6}$
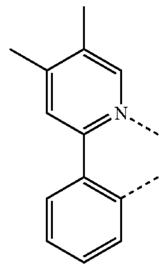
$L_{B7}$
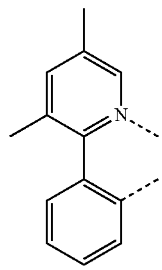
$L_{B8}$
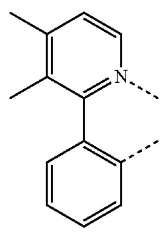
$L_{B9}$
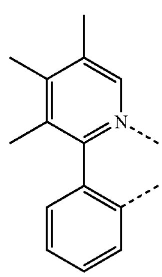
$L_{B10}$
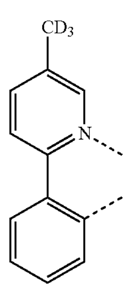
-continued
$L_{B11}$
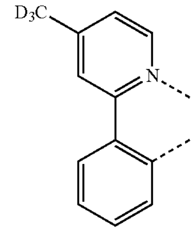
$L_{B12}$
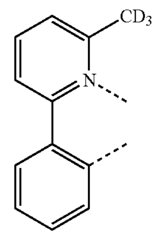
$L_{B13}$
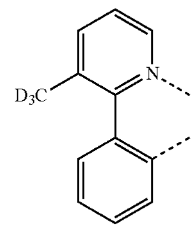
$L_{B14}$
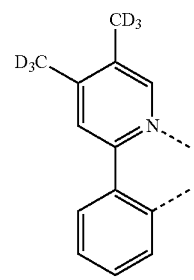
$L_{B15}$
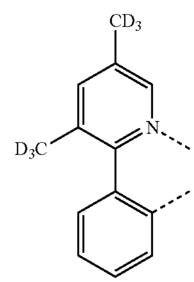
$L_{B16}$
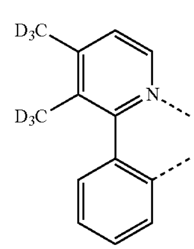

-continued
$L_{B17}$
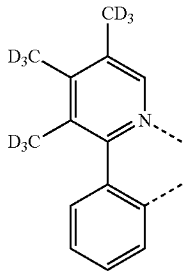
$L_{B18}$
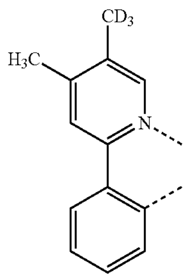
$L_{B19}$
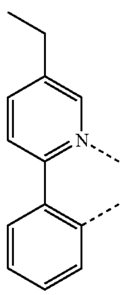
$L_{B20}$
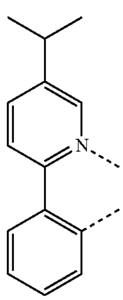
$L_{B21}$
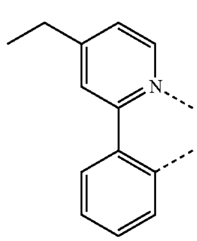
-continued
$L_{B22}$
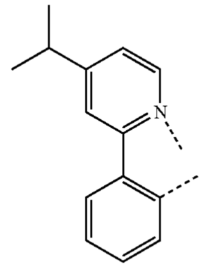
$L_{B23}$
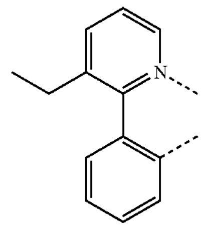
$L_{B24}$
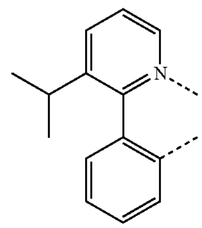
$L_{B25}$
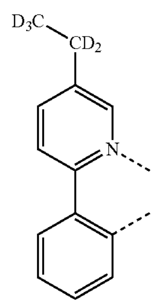
$L_{B26}$
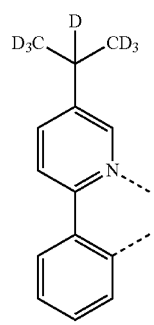
$L_{B27}$
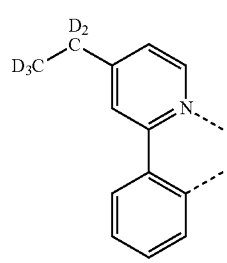

-continued
$L_{B28}$
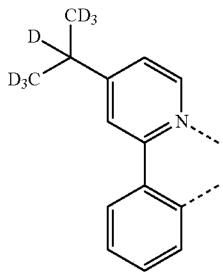
$L_{B30}$
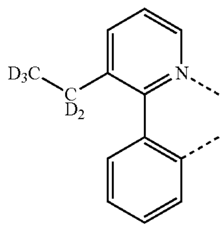
$L_{B31}$
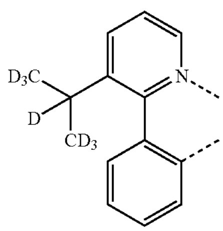
$L_{B32}$
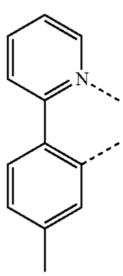
$L_{B33}$
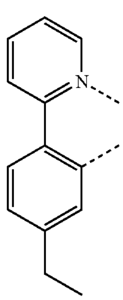
$L_{B34}$
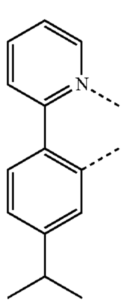
-continued
$L_{B35}$
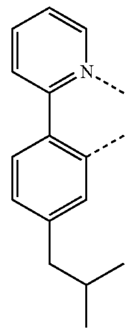
$L_{B36}$
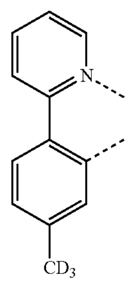
$L_{B37}$
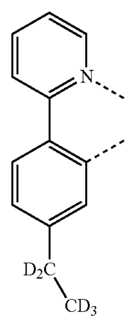
$L_{B38}$
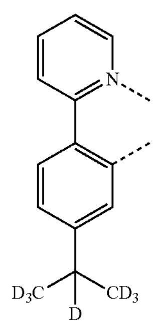
$L_{B39}$
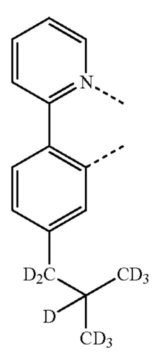

-continued $L_{B40}$

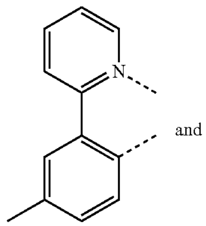

and $L_{B41}$

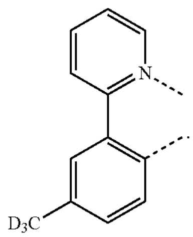

16. The compound of claim 15, wherein the compound has formula V:

$$(L_A)_1Ir(L_B)_2 \quad (V);$$

and the compound is selected from the group consisting of compound 961 to compound 5760 listed in the table below, where $L_A$ and $L_B$ each compound are identified:

| Compound Number | $L_A$ | $L_B$ |
|---|---|---|
| 961 | $L_{A1}$ | $L_{B1}$ |
| 962 | $L_{A2}$ | $L_{B1}$ |
| 963 | $L_{A3}$ | $L_{B1}$ |
| 964 | $L_{A4}$ | $L_{B1}$ |
| 965 | $L_{A5}$ | $L_{B1}$ |
| 966 | $L_{A6}$ | $L_{B1}$ |
| 967 | $L_{A7}$ | $L_{B1}$ |
| 968 | $L_{A8}$ | $L_{B1}$ |
| 969 | $L_{A9}$ | $L_{B1}$ |
| 970 | $L_{A10}$ | $L_{B1}$ |
| 971 | $L_{A11}$ | $L_{B1}$ |
| 972 | $L_{A12}$ | $L_{B1}$ |
| 973 | $L_{A13}$ | $L_{B1}$ |
| 974 | $L_{A14}$ | $L_{B1}$ |
| 975 | $L_{A15}$ | $L_{B1}$ |
| 976 | $L_{A16}$ | $L_{B1}$ |
| 977 | $L_{A17}$ | $L_{B1}$ |
| 978 | $L_{A18}$ | $L_{B1}$ |
| 979 | $L_{A19}$ | $L_{B1}$ |
| 980 | $L_{A20}$ | $L_{B1}$ |
| 981 | $L_{A21}$ | $L_{B1}$ |
| 982 | $L_{A22}$ | $L_{B1}$ |
| 983 | $L_{A23}$ | $L_{B1}$ |
| 984 | $L_{A24}$ | $L_{B1}$ |
| 985 | $L_{A25}$ | $L_{B1}$ |
| 986 | $L_{A26}$ | $L_{B1}$ |
| 987 | $L_{A27}$ | $L_{B1}$ |
| 988 | $L_{A28}$ | $L_{B1}$ |
| 989 | $L_{A29}$ | $L_{B1}$ |
| 990 | $L_{A30}$ | $L_{B1}$ |
| 991 | $L_{A31}$ | $L_{B1}$ |
| 992 | $L_{A32}$ | $L_{B1}$ |
| 993 | $L_{A33}$ | $L_{B1}$ |
| 994 | $L_{A34}$ | $L_{B1}$ |
| 995 | $L_{A35}$ | $L_{B1}$ |
| 996 | $L_{A36}$ | $L_{B1}$ |
| 997 | $L_{A37}$ | $L_{B1}$ |
| 998 | $L_{A38}$ | $L_{B1}$ |
| 999 | $L_{A39}$ | $L_{B1}$ |
| 1000 | $L_{A40}$ | $L_{B1}$ |
| 1001 | $L_{A41}$ | $L_{B1}$ |
| 1002 | $L_{A42}$ | $L_{B1}$ |
| 1003 | $L_{A43}$ | $L_{B1}$ |
| 1004 | $L_{A44}$ | $L_{B1}$ |
| 1005 | $L_{A45}$ | $L_{B1}$ |
| 1006 | $L_{A46}$ | $L_{B1}$ |
| 1007 | $L_{A47}$ | $L_{B1}$ |
| 1008 | $L_{A48}$ | $L_{B1}$ |
| 1009 | $L_{A49}$ | $L_{B1}$ |
| 1010 | $L_{A50}$ | $L_{B1}$ |
| 1011 | $L_{A51}$ | $L_{B1}$ |
| 1012 | $L_{A52}$ | $L_{B1}$ |
| 1013 | $L_{A53}$ | $L_{B1}$ |
| 1014 | $L_{A54}$ | $L_{B1}$ |
| 1015 | $L_{A55}$ | $L_{B1}$ |
| 1016 | $L_{A56}$ | $L_{B1}$ |
| 1017 | $L_{A57}$ | $L_{B1}$ |
| 1018 | $L_{A58}$ | $L_{B1}$ |
| 1019 | $L_{A59}$ | $L_{B1}$ |
| 1020 | $L_{A60}$ | $L_{B1}$ |
| 1021 | $L_{A61}$ | $L_{B1}$ |
| 1022 | $L_{A62}$ | $L_{B1}$ |
| 1023 | $L_{A63}$ | $L_{B1}$ |
| 1024 | $L_{A64}$ | $L_{B1}$ |
| 1025 | $L_{A65}$ | $L_{B1}$ |
| 1026 | $L_{A66}$ | $L_{B1}$ |
| 1027 | $L_{A67}$ | $L_{B1}$ |
| 1028 | $L_{A68}$ | $L_{B1}$ |
| 1029 | $L_{A69}$ | $L_{B1}$ |
| 1030 | $L_{A70}$ | $L_{B1}$ |
| 1031 | $L_{A71}$ | $L_{B1}$ |
| 1032 | $L_{A72}$ | $L_{B1}$ |
| 1033 | $L_{A73}$ | $L_{B1}$ |
| 1034 | $L_{A74}$ | $L_{B1}$ |
| 1035 | $L_{A75}$ | $L_{B1}$ |
| 1036 | $L_{A76}$ | $L_{B1}$ |
| 1037 | $L_{A77}$ | $L_{B1}$ |
| 1038 | $L_{A78}$ | $L_{B1}$ |
| 1039 | $L_{A79}$ | $L_{B1}$ |
| 1040 | $L_{A80}$ | $L_{B1}$ |
| 1041 | $L_{A81}$ | $L_{B1}$ |
| 1042 | $L_{A82}$ | $L_{B1}$ |
| 1043 | $L_{A83}$ | $L_{B1}$ |
| 1044 | $L_{A84}$ | $L_{B1}$ |
| 1045 | $L_{A85}$ | $L_{B1}$ |
| 1046 | $L_{A86}$ | $L_{B1}$ |
| 1047 | $L_{A87}$ | $L_{B1}$ |
| 1048 | $L_{A88}$ | $L_{B1}$ |
| 1049 | $L_{A89}$ | $L_{B1}$ |
| 1050 | $L_{A90}$ | $L_{B1}$ |
| 1051 | $L_{A91}$ | $L_{B1}$ |
| 1052 | $L_{A92}$ | $L_{B1}$ |
| 1053 | $L_{A93}$ | $L_{B1}$ |
| 1054 | $L_{A94}$ | $L_{B1}$ |
| 1055 | $L_{A95}$ | $L_{B1}$ |
| 1056 | $L_{A96}$ | $L_{B1}$ |
| 1057 | $L_{A97}$ | $L_{B1}$ |
| 1058 | $L_{A98}$ | $L_{B1}$ |
| 1059 | $L_{A99}$ | $L_{B1}$ |
| 1060 | $L_{A100}$ | $L_{B1}$ |
| 1061 | $L_{A101}$ | $L_{B1}$ |
| 1062 | $L_{A102}$ | $L_{B1}$ |
| 1063 | $L_{A103}$ | $L_{B1}$ |
| 1064 | $L_{A104}$ | $L_{B1}$ |
| 1065 | $L_{A105}$ | $L_{B1}$ |
| 1066 | $L_{A106}$ | $L_{B1}$ |
| 1067 | $L_{A107}$ | $L_{B1}$ |
| 1068 | $L_{A108}$ | $L_{B1}$ |
| 1069 | $L_{A109}$ | $L_{B1}$ |
| 1070 | $L_{A110}$ | $L_{B1}$ |
| 1071 | $L_{A111}$ | $L_{B1}$ |
| 1072 | $L_{A112}$ | $L_{B1}$ |
| 1073 | $L_{A113}$ | $L_{B1}$ |
| 1074 | $L_{A114}$ | $L_{B1}$ |
| 1075 | $L_{A115}$ | $L_{B1}$ |
| 1076 | $L_{A116}$ | $L_{B1}$ |
| 1077 | $L_{A117}$ | $L_{B1}$ |

| Compound Number | $L_A$ | $L_B$ |
|---|---|---|
| 1078 | $L_{A118}$ | $L_{B1}$ |
| 1079 | $L_{A119}$ | $L_{B1}$ |
| 1080 | $L_{A120}$ | $L_{B1}$ |
| 1081 | $L_{A121}$ | $L_{B1}$ |
| 1082 | $L_{A122}$ | $L_{B1}$ |
| 1083 | $L_{A123}$ | $L_{B1}$ |
| 1084 | $L_{A124}$ | $L_{B1}$ |
| 1085 | $L_{A125}$ | $L_{B1}$ |
| 1086 | $L_{A126}$ | $L_{B1}$ |
| 1087 | $L_{A127}$ | $L_{B1}$ |
| 1088 | $L_{A128}$ | $L_{B1}$ |
| 1089 | $L_{A129}$ | $L_{B1}$ |
| 1090 | $L_{A130}$ | $L_{B1}$ |
| 1091 | $L_{A131}$ | $L_{B1}$ |
| 1092 | $L_{A132}$ | $L_{B1}$ |
| 1093 | $L_{A133}$ | $L_{B1}$ |
| 1094 | $L_{A134}$ | $L_{B1}$ |
| 1095 | $L_{A135}$ | $L_{B1}$ |
| 1096 | $L_{A136}$ | $L_{B1}$ |
| 1097 | $L_{A137}$ | $L_{B1}$ |
| 1098 | $L_{A138}$ | $L_{B1}$ |
| 1099 | $L_{A139}$ | $L_{B1}$ |
| 1100 | $L_{A140}$ | $L_{B1}$ |
| 1101 | $L_{A141}$ | $L_{B1}$ |
| 1102 | $L_{A142}$ | $L_{B1}$ |
| 1103 | $L_{A143}$ | $L_{B1}$ |
| 1104 | $L_{A144}$ | $L_{B1}$ |
| 1105 | $L_{A145}$ | $L_{B1}$ |
| 1106 | $L_{A146}$ | $L_{B1}$ |
| 1107 | $L_{A147}$ | $L_{B1}$ |
| 1108 | $L_{A148}$ | $L_{B1}$ |
| 1109 | $L_{A149}$ | $L_{B1}$ |
| 1110 | $L_{A150}$ | $L_{B1}$ |
| 1111 | $L_{A151}$ | $L_{B1}$ |
| 1112 | $L_{A152}$ | $L_{B1}$ |
| 1113 | $L_{A153}$ | $L_{B1}$ |
| 1114 | $L_{A154}$ | $L_{B1}$ |
| 1115 | $L_{A155}$ | $L_{B1}$ |
| 1116 | $L_{A156}$ | $L_{B1}$ |
| 1117 | $L_{A157}$ | $L_{B1}$ |
| 1118 | $L_{A158}$ | $L_{B1}$ |
| 1119 | $L_{A159}$ | $L_{B1}$ |
| 1120 | $L_{A160}$ | $L_{B1}$ |
| 1121 | $L_{A161}$ | $L_{B1}$ |
| 1122 | $L_{A162}$ | $L_{B1}$ |
| 1123 | $L_{A163}$ | $L_{B1}$ |
| 1124 | $L_{A164}$ | $L_{B1}$ |
| 1125 | $L_{A165}$ | $L_{B1}$ |
| 1126 | $L_{A166}$ | $L_{B1}$ |
| 1127 | $L_{A167}$ | $L_{B1}$ |
| 1128 | $L_{A168}$ | $L_{B1}$ |
| 1129 | $L_{A169}$ | $L_{B1}$ |
| 1130 | $L_{A170}$ | $L_{B1}$ |
| 1131 | $L_{A171}$ | $L_{B1}$ |
| 1132 | $L_{A172}$ | $L_{B1}$ |
| 1133 | $L_{A173}$ | $L_{B1}$ |
| 1134 | $L_{A174}$ | $L_{B1}$ |
| 1135 | $L_{A175}$ | $L_{B1}$ |
| 1136 | $L_{A176}$ | $L_{B1}$ |
| 1137 | $L_{A177}$ | $L_{B1}$ |
| 1138 | $L_{A178}$ | $L_{B1}$ |
| 1139 | $L_{A179}$ | $L_{B1}$ |
| 1140 | $L_{A180}$ | $L_{B1}$ |
| 1141 | $L_{A181}$ | $L_{B1}$ |
| 1142 | $L_{A182}$ | $L_{B1}$ |
| 1143 | $L_{A183}$ | $L_{B1}$ |
| 1144 | $L_{A184}$ | $L_{B1}$ |
| 1145 | $L_{A185}$ | $L_{B1}$ |
| 1146 | $L_{A186}$ | $L_{B1}$ |
| 1147 | $L_{A187}$ | $L_{B1}$ |
| 1148 | $L_{A188}$ | $L_{B1}$ |
| 1149 | $L_{A189}$ | $L_{B1}$ |
| 1150 | $L_{A190}$ | $L_{B1}$ |
| 1151 | $L_{A191}$ | $L_{B1}$ |
| 1152 | $L_{A192}$ | $L_{B1}$ |
| 1153 | $L_{A193}$ | $L_{B1}$ |

| Compound Number | $L_A$ | $L_B$ |
|---|---|---|
| 1154 | $L_{A194}$ | $L_{B1}$ |
| 1155 | $L_{A195}$ | $L_{B1}$ |
| 1156 | $L_{A196}$ | $L_{B1}$ |
| 1157 | $L_{A197}$ | $L_{B1}$ |
| 1158 | $L_{A198}$ | $L_{B1}$ |
| 1159 | $L_{A199}$ | $L_{B1}$ |
| 1160 | $L_{A200}$ | $L_{B1}$ |
| 1161 | $L_{A201}$ | $L_{B1}$ |
| 1162 | $L_{A202}$ | $L_{B1}$ |
| 1163 | $L_{A203}$ | $L_{B1}$ |
| 1164 | $L_{A204}$ | $L_{B1}$ |
| 1165 | $L_{A205}$ | $L_{B1}$ |
| 1166 | $L_{A206}$ | $L_{B1}$ |
| 1167 | $L_{A207}$ | $L_{B1}$ |
| 1168 | $L_{A208}$ | $L_{B1}$ |
| 1169 | $L_{A209}$ | $L_{B1}$ |
| 1170 | $L_{A210}$ | $L_{B1}$ |
| 1171 | $L_{A211}$ | $L_{B1}$ |
| 1172 | $L_{A212}$ | $L_{B1}$ |
| 1173 | $L_{A213}$ | $L_{B1}$ |
| 1174 | $L_{A214}$ | $L_{B1}$ |
| 1175 | $L_{A215}$ | $L_{B1}$ |
| 1176 | $L_{A216}$ | $L_{B1}$ |
| 1177 | $L_{A217}$ | $L_{B1}$ |
| 1178 | $L_{A218}$ | $L_{B1}$ |
| 1179 | $L_{A219}$ | $L_{B1}$ |
| 1180 | $L_{A220}$ | $L_{B1}$ |
| 1181 | $L_{A221}$ | $L_{B1}$ |
| 1182 | $L_{A222}$ | $L_{B1}$ |
| 1183 | $L_{A223}$ | $L_{B1}$ |
| 1184 | $L_{A224}$ | $L_{B1}$ |
| 1185 | $L_{A225}$ | $L_{B1}$ |
| 1186 | $L_{A226}$ | $L_{B1}$ |
| 1187 | $L_{A227}$ | $L_{B1}$ |
| 1188 | $L_{A228}$ | $L_{B1}$ |
| 1189 | $L_{A229}$ | $L_{B1}$ |
| 1190 | $L_{A230}$ | $L_{B1}$ |
| 1191 | $L_{A231}$ | $L_{B1}$ |
| 1192 | $L_{A232}$ | $L_{B1}$ |
| 1193 | $L_{A233}$ | $L_{B1}$ |
| 1194 | $L_{A234}$ | $L_{B1}$ |
| 1195 | $L_{A235}$ | $L_{B1}$ |
| 1196 | $L_{A236}$ | $L_{B1}$ |
| 1197 | $L_{A237}$ | $L_{B1}$ |
| 1198 | $L_{A238}$ | $L_{B1}$ |
| 1199 | $L_{A239}$ | $L_{B1}$ |
| 1200 | $L_{A240}$ | $L_{B1}$ |
| 1201 | $L_{A241}$ | $L_{B1}$ |
| 1202 | $L_{A242}$ | $L_{B1}$ |
| 1203 | $L_{A243}$ | $L_{B1}$ |
| 1204 | $L_{A244}$ | $L_{B1}$ |
| 1205 | $L_{A245}$ | $L_{B1}$ |
| 1206 | $L_{A246}$ | $L_{B1}$ |
| 1207 | $L_{A247}$ | $L_{B1}$ |
| 1208 | $L_{A248}$ | $L_{B1}$ |
| 1209 | $L_{A249}$ | $L_{B1}$ |
| 1210 | $L_{A250}$ | $L_{B1}$ |
| 1211 | $L_{A251}$ | $L_{B1}$ |
| 1212 | $L_{A252}$ | $L_{B1}$ |
| 1213 | $L_{A253}$ | $L_{B1}$ |
| 1214 | $L_{A254}$ | $L_{B1}$ |
| 1215 | $L_{A255}$ | $L_{B1}$ |
| 1216 | $L_{A256}$ | $L_{B1}$ |
| 1217 | $L_{A257}$ | $L_{B1}$ |
| 1218 | $L_{A258}$ | $L_{B1}$ |
| 1219 | $L_{A259}$ | $L_{B1}$ |
| 1220 | $L_{A260}$ | $L_{B1}$ |
| 1221 | $L_{A261}$ | $L_{B1}$ |
| 1222 | $L_{A262}$ | $L_{B1}$ |
| 1223 | $L_{A263}$ | $L_{B1}$ |
| 1224 | $L_{A264}$ | $L_{B1}$ |
| 1225 | $L_{A265}$ | $L_{B1}$ |
| 1226 | $L_{A266}$ | $L_{B1}$ |
| 1227 | $L_{A267}$ | $L_{B1}$ |
| 1228 | $L_{A268}$ | $L_{B1}$ |
| 1229 | $L_{A269}$ | $L_{B1}$ |

-continued

| Compound Number | $L_A$ | $L_B$ |
|---|---|---|
| 1230 | $L_{A270}$ | $L_{B1}$ |
| 1231 | $L_{A271}$ | $L_{B1}$ |
| 1232 | $L_{A272}$ | $L_{B1}$ |
| 1233 | $L_{A273}$ | $L_{B1}$ |
| 1234 | $L_{A274}$ | $L_{B1}$ |
| 1235 | $L_{A275}$ | $L_{B1}$ |
| 1236 | $L_{A276}$ | $L_{B1}$ |
| 1237 | $L_{A277}$ | $L_{B1}$ |
| 1238 | $L_{A278}$ | $L_{B1}$ |
| 1239 | $L_{A279}$ | $L_{B1}$ |
| 1240 | $L_{A280}$ | $L_{B1}$ |
| 1241 | $L_{A281}$ | $L_{B1}$ |
| 1242 | $L_{A282}$ | $L_{B1}$ |
| 1243 | $L_{A283}$ | $L_{B1}$ |
| 1244 | $L_{A284}$ | $L_{B1}$ |
| 1245 | $L_{A285}$ | $L_{B1}$ |
| 1246 | $L_{A286}$ | $L_{B1}$ |
| 1247 | $L_{A287}$ | $L_{B1}$ |
| 1248 | $L_{A288}$ | $L_{B1}$ |
| 1249 | $L_{A289}$ | $L_{B1}$ |
| 1250 | $L_{A290}$ | $L_{B1}$ |
| 1251 | $L_{A291}$ | $L_{B1}$ |
| 1252 | $L_{A292}$ | $L_{B1}$ |
| 1253 | $L_{A293}$ | $L_{B1}$ |
| 1254 | $L_{A294}$ | $L_{B1}$ |
| 1255 | $L_{A295}$ | $L_{B1}$ |
| 1256 | $L_{A296}$ | $L_{B1}$ |
| 1257 | $L_{A297}$ | $L_{B1}$ |
| 1258 | $L_{A298}$ | $L_{B1}$ |
| 1259 | $L_{A299}$ | $L_{B1}$ |
| 1260 | $L_{A300}$ | $L_{B1}$ |
| 1261 | $L_{A301}$ | $L_{B1}$ |
| 1262 | $L_{A302}$ | $L_{B1}$ |
| 1263 | $L_{A303}$ | $L_{B1}$ |
| 1264 | $L_{A304}$ | $L_{B1}$ |
| 1265 | $L_{A305}$ | $L_{B1}$ |
| 1266 | $L_{A306}$ | $L_{B1}$ |
| 1267 | $L_{A307}$ | $L_{B1}$ |
| 1268 | $L_{A308}$ | $L_{B1}$ |
| 1269 | $L_{A309}$ | $L_{B1}$ |
| 1270 | $L_{A310}$ | $L_{B1}$ |
| 1271 | $L_{A311}$ | $L_{B1}$ |
| 1272 | $L_{A312}$ | $L_{B1}$ |
| 1273 | $L_{A313}$ | $L_{B1}$ |
| 1274 | $L_{A314}$ | $L_{B1}$ |
| 1275 | $L_{A315}$ | $L_{B1}$ |
| 1276 | $L_{A316}$ | $L_{B1}$ |
| 1277 | $L_{A317}$ | $L_{B1}$ |
| 1278 | $L_{A318}$ | $L_{B1}$ |
| 1279 | $L_{A319}$ | $L_{B1}$ |
| 1280 | $L_{A320}$ | $L_{B1}$ |
| 1281 | $L_{A321}$ | $L_{B1}$ |
| 1282 | $L_{A322}$ | $L_{B1}$ |
| 1283 | $L_{A323}$ | $L_{B1}$ |
| 1284 | $L_{A324}$ | $L_{B1}$ |
| 1285 | $L_{A325}$ | $L_{B1}$ |
| 1286 | $L_{A326}$ | $L_{B1}$ |
| 1287 | $L_{A327}$ | $L_{B1}$ |
| 1288 | $L_{A328}$ | $L_{B1}$ |
| 1289 | $L_{A329}$ | $L_{B1}$ |
| 1290 | $L_{A330}$ | $L_{B1}$ |
| 1291 | $L_{A331}$ | $L_{B1}$ |
| 1292 | $L_{A332}$ | $L_{B1}$ |
| 1293 | $L_{A333}$ | $L_{B1}$ |
| 1294 | $L_{A334}$ | $L_{B1}$ |
| 1295 | $L_{A335}$ | $L_{B1}$ |
| 1296 | $L_{A336}$ | $L_{B1}$ |
| 1297 | $L_{A337}$ | $L_{B1}$ |
| 1298 | $L_{A338}$ | $L_{B1}$ |
| 1299 | $L_{A339}$ | $L_{B1}$ |
| 1300 | $L_{A340}$ | $L_{B1}$ |
| 1301 | $L_{A341}$ | $L_{B1}$ |
| 1302 | $L_{A342}$ | $L_{B1}$ |
| 1303 | $L_{A343}$ | $L_{B1}$ |
| 1304 | $L_{A344}$ | $L_{B1}$ |
| 1305 | $L_{A345}$ | $L_{B1}$ |
| 1306 | $L_{A346}$ | $L_{B1}$ |
| 1307 | $L_{A347}$ | $L_{B1}$ |
| 1308 | $L_{A348}$ | $L_{B1}$ |
| 1309 | $L_{A349}$ | $L_{B1}$ |
| 1310 | $L_{A350}$ | $L_{B1}$ |
| 1311 | $L_{A351}$ | $L_{B1}$ |
| 1312 | $L_{A352}$ | $L_{B1}$ |
| 1313 | $L_{A353}$ | $L_{B1}$ |
| 1314 | $L_{A354}$ | $L_{B1}$ |
| 1315 | $L_{A355}$ | $L_{B1}$ |
| 1316 | $L_{A356}$ | $L_{B1}$ |
| 1317 | $L_{A357}$ | $L_{B1}$ |
| 1318 | $L_{A358}$ | $L_{B1}$ |
| 1319 | $L_{A359}$ | $L_{B1}$ |
| 1320 | $L_{A360}$ | $L_{B1}$ |
| 1321 | $L_{A361}$ | $L_{B1}$ |
| 1322 | $L_{A362}$ | $L_{B1}$ |
| 1323 | $L_{A363}$ | $L_{B1}$ |
| 1324 | $L_{A364}$ | $L_{B1}$ |
| 1325 | $L_{A365}$ | $L_{B1}$ |
| 1326 | $L_{A366}$ | $L_{B1}$ |
| 1327 | $L_{A367}$ | $L_{B1}$ |
| 1328 | $L_{A368}$ | $L_{B1}$ |
| 1329 | $L_{A369}$ | $L_{B1}$ |
| 1330 | $L_{A370}$ | $L_{B1}$ |
| 1331 | $L_{A371}$ | $L_{B1}$ |
| 1332 | $L_{A372}$ | $L_{B1}$ |
| 1333 | $L_{A373}$ | $L_{B1}$ |
| 1334 | $L_{A374}$ | $L_{B1}$ |
| 1335 | $L_{A375}$ | $L_{B1}$ |
| 1336 | $L_{A376}$ | $L_{B1}$ |
| 1337 | $L_{A377}$ | $L_{B1}$ |
| 1338 | $L_{A378}$ | $L_{B1}$ |
| 1339 | $L_{A379}$ | $L_{B1}$ |
| 1340 | $L_{A380}$ | $L_{B1}$ |
| 1341 | $L_{A381}$ | $L_{B1}$ |
| 1342 | $L_{A382}$ | $L_{B1}$ |
| 1343 | $L_{A383}$ | $L_{B1}$ |
| 1344 | $L_{A384}$ | $L_{B1}$ |
| 1345 | $L_{A385}$ | $L_{B1}$ |
| 1346 | $L_{A386}$ | $L_{B1}$ |
| 1347 | $L_{A387}$ | $L_{B1}$ |
| 1348 | $L_{A388}$ | $L_{B1}$ |
| 1349 | $L_{A389}$ | $L_{B1}$ |
| 1350 | $L_{A390}$ | $L_{B1}$ |
| 1351 | $L_{A391}$ | $L_{B1}$ |
| 1352 | $L_{A392}$ | $L_{B1}$ |
| 1353 | $L_{A393}$ | $L_{B1}$ |
| 1354 | $L_{A394}$ | $L_{B1}$ |
| 1355 | $L_{A395}$ | $L_{B1}$ |
| 1356 | $L_{A396}$ | $L_{B1}$ |
| 1357 | $L_{A397}$ | $L_{B1}$ |
| 1358 | $L_{A398}$ | $L_{B1}$ |
| 1359 | $L_{A399}$ | $L_{B1}$ |
| 1360 | $L_{A400}$ | $L_{B1}$ |
| 1361 | $L_{A401}$ | $L_{B1}$ |
| 1362 | $L_{A402}$ | $L_{B1}$ |
| 1363 | $L_{A403}$ | $L_{B1}$ |
| 1364 | $L_{A404}$ | $L_{B1}$ |
| 1365 | $L_{A405}$ | $L_{B1}$ |
| 1366 | $L_{A406}$ | $L_{B1}$ |
| 1367 | $L_{A407}$ | $L_{B1}$ |
| 1368 | $L_{A408}$ | $L_{B1}$ |
| 1369 | $L_{A409}$ | $L_{B1}$ |
| 1370 | $L_{A410}$ | $L_{B1}$ |
| 1371 | $L_{A411}$ | $L_{B1}$ |
| 1372 | $L_{A412}$ | $L_{B1}$ |
| 1373 | $L_{A413}$ | $L_{B1}$ |
| 1374 | $L_{A414}$ | $L_{B1}$ |
| 1375 | $L_{A415}$ | $L_{B1}$ |
| 1376 | $L_{A416}$ | $L_{B1}$ |
| 1377 | $L_{A417}$ | $L_{B1}$ |
| 1378 | $L_{A418}$ | $L_{B1}$ |
| 1379 | $L_{A419}$ | $L_{B1}$ |
| 1380 | $L_{A420}$ | $L_{B1}$ |
| 1381 | $L_{A421}$ | $L_{B1}$ |

-continued

| Compound Number | $L_A$ | $L_B$ |
|---|---|---|
| 1382 | $L_{A422}$ | $L_{B1}$ |
| 1383 | $L_{A423}$ | $L_{B1}$ |
| 1384 | $L_{A424}$ | $L_{B1}$ |
| 1385 | $L_{A425}$ | $L_{B1}$ |
| 1386 | $L_{A426}$ | $L_{B1}$ |
| 1387 | $L_{A427}$ | $L_{B1}$ |
| 1388 | $L_{A428}$ | $L_{B1}$ |
| 1389 | $L_{A429}$ | $L_{B1}$ |
| 1390 | $L_{A430}$ | $L_{B1}$ |
| 1391 | $L_{A431}$ | $L_{B1}$ |
| 1392 | $L_{A432}$ | $L_{B1}$ |
| 1393 | $L_{A433}$ | $L_{B1}$ |
| 1394 | $L_{A434}$ | $L_{B1}$ |
| 1395 | $L_{A435}$ | $L_{B1}$ |
| 1396 | $L_{A436}$ | $L_{B1}$ |
| 1397 | $L_{A437}$ | $L_{B1}$ |
| 1398 | $L_{A438}$ | $L_{B1}$ |
| 1399 | $L_{A439}$ | $L_{B1}$ |
| 1400 | $L_{A440}$ | $L_{B1}$ |
| 1401 | $L_{A441}$ | $L_{B1}$ |
| 1402 | $L_{A442}$ | $L_{B1}$ |
| 1403 | $L_{A443}$ | $L_{B1}$ |
| 1404 | $L_{A444}$ | $L_{B1}$ |
| 1405 | $L_{A445}$ | $L_{B1}$ |
| 1406 | $L_{A446}$ | $L_{B1}$ |
| 1407 | $L_{A447}$ | $L_{B1}$ |
| 1408 | $L_{A448}$ | $L_{B1}$ |
| 1409 | $L_{A449}$ | $L_{B1}$ |
| 1410 | $L_{A450}$ | $L_{B1}$ |
| 1411 | $L_{A451}$ | $L_{B1}$ |
| 1412 | $L_{A452}$ | $L_{B1}$ |
| 1413 | $L_{A453}$ | $L_{B1}$ |
| 1414 | $L_{A454}$ | $L_{B1}$ |
| 1415 | $L_{A455}$ | $L_{B1}$ |
| 1416 | $L_{A456}$ | $L_{B1}$ |
| 1417 | $L_{A457}$ | $L_{B1}$ |
| 1418 | $L_{A458}$ | $L_{B1}$ |
| 1419 | $L_{A459}$ | $L_{B1}$ |
| 1420 | $L_{A460}$ | $L_{B1}$ |
| 1421 | $L_{A461}$ | $L_{B1}$ |
| 1422 | $L_{A462}$ | $L_{B1}$ |
| 1423 | $L_{A463}$ | $L_{B1}$ |
| 1424 | $L_{A464}$ | $L_{B1}$ |
| 1425 | $L_{A465}$ | $L_{B1}$ |
| 1426 | $L_{A466}$ | $L_{B1}$ |
| 1427 | $L_{A467}$ | $L_{B1}$ |
| 1428 | $L_{A468}$ | $L_{B1}$ |
| 1429 | $L_{A469}$ | $L_{B1}$ |
| 1430 | $L_{A470}$ | $L_{B1}$ |
| 1431 | $L_{A471}$ | $L_{B1}$ |
| 1432 | $L_{A472}$ | $L_{B1}$ |
| 1433 | $L_{A473}$ | $L_{B1}$ |
| 1434 | $L_{A474}$ | $L_{B1}$ |
| 1435 | $L_{A475}$ | $L_{B1}$ |
| 1436 | $L_{A476}$ | $L_{B1}$ |
| 1437 | $L_{A477}$ | $L_{B1}$ |
| 1438 | $L_{A478}$ | $L_{B1}$ |
| 1439 | $L_{A479}$ | $L_{B1}$ |
| 1440 | $L_{A480}$ | $L_{B1}$ |
| 1441 | $L_{A481}$ | $L_{B1}$ |
| 1442 | $L_{A482}$ | $L_{B1}$ |
| 1443 | $L_{A483}$ | $L_{B1}$ |
| 1444 | $L_{A484}$ | $L_{B1}$ |
| 1445 | $L_{A485}$ | $L_{B1}$ |
| 1446 | $L_{A486}$ | $L_{B1}$ |
| 1447 | $L_{A487}$ | $L_{B1}$ |
| 1448 | $L_{A488}$ | $L_{B1}$ |
| 1449 | $L_{A489}$ | $L_{B1}$ |
| 1450 | $L_{A490}$ | $L_{B1}$ |
| 1451 | $L_{A491}$ | $L_{B1}$ |
| 1452 | $L_{A492}$ | $L_{B1}$ |
| 1453 | $L_{A493}$ | $L_{B1}$ |
| 1454 | $L_{A494}$ | $L_{B1}$ |
| 1455 | $L_{A495}$ | $L_{B1}$ |
| 1456 | $L_{A496}$ | $L_{B1}$ |
| 1457 | $L_{A497}$ | $L_{B1}$ |
| 1458 | $L_{A498}$ | $L_{B1}$ |
| 1459 | $L_{A499}$ | $L_{B1}$ |
| 1460 | $L_{A500}$ | $L_{B1}$ |
| 1461 | $L_{A501}$ | $L_{B1}$ |
| 1462 | $L_{A502}$ | $L_{B1}$ |
| 1463 | $L_{A503}$ | $L_{B1}$ |
| 1464 | $L_{A504}$ | $L_{B1}$ |
| 1465 | $L_{A505}$ | $L_{B1}$ |
| 1466 | $L_{A506}$ | $L_{B1}$ |
| 1467 | $L_{A507}$ | $L_{B1}$ |
| 1468 | $L_{A508}$ | $L_{B1}$ |
| 1469 | $L_{A509}$ | $L_{B1}$ |
| 1470 | $L_{A510}$ | $L_{B1}$ |
| 1471 | $L_{A511}$ | $L_{B1}$ |
| 1472 | $L_{A512}$ | $L_{B1}$ |
| 1473 | $L_{A513}$ | $L_{B1}$ |
| 1474 | $L_{A514}$ | $L_{B1}$ |
| 1475 | $L_{A515}$ | $L_{B1}$ |
| 1476 | $L_{A516}$ | $L_{B1}$ |
| 1477 | $L_{A517}$ | $L_{B1}$ |
| 1478 | $L_{A518}$ | $L_{B1}$ |
| 1479 | $L_{A519}$ | $L_{B1}$ |
| 1480 | $L_{A520}$ | $L_{B1}$ |
| 1481 | $L_{A521}$ | $L_{B1}$ |
| 1482 | $L_{A522}$ | $L_{B1}$ |
| 1483 | $L_{A523}$ | $L_{B1}$ |
| 1484 | $L_{A524}$ | $L_{B1}$ |
| 1485 | $L_{A525}$ | $L_{B1}$ |
| 1486 | $L_{A526}$ | $L_{B1}$ |
| 1487 | $L_{A527}$ | $L_{B1}$ |
| 1488 | $L_{A528}$ | $L_{B1}$ |
| 1489 | $L_{A529}$ | $L_{B1}$ |
| 1490 | $L_{A530}$ | $L_{B1}$ |
| 1491 | $L_{A531}$ | $L_{B1}$ |
| 1492 | $L_{A532}$ | $L_{B1}$ |
| 1493 | $L_{A533}$ | $L_{B1}$ |
| 1494 | $L_{A534}$ | $L_{B1}$ |
| 1495 | $L_{A535}$ | $L_{B1}$ |
| 1496 | $L_{A536}$ | $L_{B1}$ |
| 1497 | $L_{A537}$ | $L_{B1}$ |
| 1498 | $L_{A538}$ | $L_{B1}$ |
| 1499 | $L_{A539}$ | $L_{B1}$ |
| 1500 | $L_{A540}$ | $L_{B1}$ |
| 1501 | $L_{A541}$ | $L_{B1}$ |
| 1502 | $L_{A542}$ | $L_{B1}$ |
| 1503 | $L_{A543}$ | $L_{B1}$ |
| 1504 | $L_{A544}$ | $L_{B1}$ |
| 1505 | $L_{A545}$ | $L_{B1}$ |
| 1506 | $L_{A546}$ | $L_{B1}$ |
| 1507 | $L_{A547}$ | $L_{B1}$ |
| 1508 | $L_{A548}$ | $L_{B1}$ |
| 1509 | $L_{A549}$ | $L_{B1}$ |
| 1510 | $L_{A550}$ | $L_{B1}$ |
| 1511 | $L_{A551}$ | $L_{B1}$ |
| 1512 | $L_{A552}$ | $L_{B1}$ |
| 1513 | $L_{A553}$ | $L_{B1}$ |
| 1514 | $L_{A554}$ | $L_{B1}$ |
| 1515 | $L_{A555}$ | $L_{B1}$ |
| 1516 | $L_{A556}$ | $L_{B1}$ |
| 1517 | $L_{A557}$ | $L_{B1}$ |
| 1518 | $L_{A558}$ | $L_{B1}$ |
| 1519 | $L_{A559}$ | $L_{B1}$ |
| 1520 | $L_{A560}$ | $L_{B1}$ |
| 1521 | $L_{A561}$ | $L_{B1}$ |
| 1522 | $L_{A562}$ | $L_{B1}$ |
| 1523 | $L_{A563}$ | $L_{B1}$ |
| 1524 | $L_{A564}$ | $L_{B1}$ |
| 1525 | $L_{A565}$ | $L_{B1}$ |
| 1526 | $L_{A566}$ | $L_{B1}$ |
| 1527 | $L_{A567}$ | $L_{B1}$ |
| 1528 | $L_{A568}$ | $L_{B1}$ |
| 1529 | $L_{A569}$ | $L_{B1}$ |
| 1530 | $L_{A570}$ | $L_{B1}$ |
| 1531 | $L_{A571}$ | $L_{B1}$ |
| 1532 | $L_{A572}$ | $L_{B1}$ |
| 1533 | $L_{A573}$ | $L_{B1}$ |

-continued

| Compound Number | $L_A$ | $L_B$ |
|---|---|---|
| 1534 | $L_{A574}$ | $L_{B1}$ |
| 1535 | $L_{A575}$ | $L_{B1}$ |
| 1536 | $L_{A576}$ | $L_{B1}$ |
| 1537 | $L_{A577}$ | $L_{B1}$ |
| 1538 | $L_{A578}$ | $L_{B1}$ |
| 1539 | $L_{A579}$ | $L_{B1}$ |
| 1540 | $L_{A580}$ | $L_{B1}$ |
| 1541 | $L_{A581}$ | $L_{B1}$ |
| 1542 | $L_{A582}$ | $L_{B1}$ |
| 1543 | $L_{A583}$ | $L_{B1}$ |
| 1544 | $L_{A584}$ | $L_{B1}$ |
| 1545 | $L_{A585}$ | $L_{B1}$ |
| 1546 | $L_{A586}$ | $L_{B1}$ |
| 1547 | $L_{A587}$ | $L_{B1}$ |
| 1548 | $L_{A588}$ | $L_{B1}$ |
| 1549 | $L_{A589}$ | $L_{B1}$ |
| 1550 | $L_{A590}$ | $L_{B1}$ |
| 1551 | $L_{A591}$ | $L_{B1}$ |
| 1552 | $L_{A592}$ | $L_{B1}$ |
| 1553 | $L_{A593}$ | $L_{B1}$ |
| 1554 | $L_{A594}$ | $L_{B1}$ |
| 1555 | $L_{A595}$ | $L_{B1}$ |
| 1556 | $L_{A596}$ | $L_{B1}$ |
| 1557 | $L_{A597}$ | $L_{B1}$ |
| 1558 | $L_{A598}$ | $L_{B1}$ |
| 1559 | $L_{A599}$ | $L_{B1}$ |
| 1560 | $L_{A600}$ | $L_{B1}$ |
| 1561 | $L_{A601}$ | $L_{B1}$ |
| 1562 | $L_{A602}$ | $L_{B1}$ |
| 1563 | $L_{A603}$ | $L_{B1}$ |
| 1564 | $L_{A604}$ | $L_{B1}$ |
| 1565 | $L_{A605}$ | $L_{B1}$ |
| 1566 | $L_{A606}$ | $L_{B1}$ |
| 1567 | $L_{A607}$ | $L_{B1}$ |
| 1568 | $L_{A608}$ | $L_{B1}$ |
| 1569 | $L_{A609}$ | $L_{B1}$ |
| 1570 | $L_{A610}$ | $L_{B1}$ |
| 1571 | $L_{A611}$ | $L_{B1}$ |
| 1572 | $L_{A612}$ | $L_{B1}$ |
| 1573 | $L_{A613}$ | $L_{B1}$ |
| 1574 | $L_{A614}$ | $L_{B1}$ |
| 1575 | $L_{A615}$ | $L_{B1}$ |
| 1576 | $L_{A616}$ | $L_{B1}$ |
| 1577 | $L_{A617}$ | $L_{B1}$ |
| 1578 | $L_{A618}$ | $L_{B1}$ |
| 1579 | $L_{A619}$ | $L_{B1}$ |
| 1580 | $L_{A620}$ | $L_{B1}$ |
| 1581 | $L_{A621}$ | $L_{B1}$ |
| 1582 | $L_{A622}$ | $L_{B1}$ |
| 1583 | $L_{A623}$ | $L_{B1}$ |
| 1584 | $L_{A624}$ | $L_{B1}$ |
| 1585 | $L_{A625}$ | $L_{B1}$ |
| 1586 | $L_{A626}$ | $L_{B1}$ |
| 1587 | $L_{A627}$ | $L_{B1}$ |
| 1588 | $L_{A628}$ | $L_{B1}$ |
| 1589 | $L_{A629}$ | $L_{B1}$ |
| 1590 | $L_{A630}$ | $L_{B1}$ |
| 1591 | $L_{A631}$ | $L_{B1}$ |
| 1592 | $L_{A632}$ | $L_{B1}$ |
| 1593 | $L_{A633}$ | $L_{B1}$ |
| 1594 | $L_{A634}$ | $L_{B1}$ |
| 1595 | $L_{A635}$ | $L_{B1}$ |
| 1596 | $L_{A636}$ | $L_{B1}$ |
| 1597 | $L_{A637}$ | $L_{B1}$ |
| 1598 | $L_{A638}$ | $L_{B1}$ |
| 1599 | $L_{A639}$ | $L_{B1}$ |
| 1600 | $L_{A640}$ | $L_{B1}$ |
| 1601 | $L_{A641}$ | $L_{B1}$ |
| 1602 | $L_{A642}$ | $L_{B1}$ |
| 1603 | $L_{A643}$ | $L_{B1}$ |
| 1604 | $L_{A644}$ | $L_{B1}$ |
| 1605 | $L_{A645}$ | $L_{B1}$ |
| 1606 | $L_{A646}$ | $L_{B1}$ |
| 1607 | $L_{A647}$ | $L_{B1}$ |
| 1608 | $L_{A648}$ | $L_{B1}$ |
| 1609 | $L_{A649}$ | $L_{B1}$ |

-continued

| Compound Number | $L_A$ | $L_B$ |
|---|---|---|
| 1610 | $L_{A650}$ | $L_{B1}$ |
| 1611 | $L_{A651}$ | $L_{B1}$ |
| 1612 | $L_{A652}$ | $L_{B1}$ |
| 1613 | $L_{A653}$ | $L_{B1}$ |
| 1614 | $L_{A654}$ | $L_{B1}$ |
| 1615 | $L_{A655}$ | $L_{B1}$ |
| 1616 | $L_{A656}$ | $L_{B1}$ |
| 1617 | $L_{A657}$ | $L_{B1}$ |
| 1618 | $L_{A658}$ | $L_{B1}$ |
| 1619 | $L_{A659}$ | $L_{B1}$ |
| 1620 | $L_{A660}$ | $L_{B1}$ |
| 1621 | $L_{A661}$ | $L_{B1}$ |
| 1622 | $L_{A662}$ | $L_{B1}$ |
| 1623 | $L_{A663}$ | $L_{B1}$ |
| 1624 | $L_{A664}$ | $L_{B1}$ |
| 1625 | $L_{A665}$ | $L_{B1}$ |
| 1626 | $L_{A666}$ | $L_{B1}$ |
| 1627 | $L_{A667}$ | $L_{B1}$ |
| 1628 | $L_{A668}$ | $L_{B1}$ |
| 1629 | $L_{A669}$ | $L_{B1}$ |
| 1630 | $L_{A670}$ | $L_{B1}$ |
| 1631 | $L_{A671}$ | $L_{B1}$ |
| 1632 | $L_{A672}$ | $L_{B1}$ |
| 1633 | $L_{A673}$ | $L_{B1}$ |
| 1634 | $L_{A674}$ | $L_{B1}$ |
| 1635 | $L_{A675}$ | $L_{B1}$ |
| 1636 | $L_{A676}$ | $L_{B1}$ |
| 1637 | $L_{A677}$ | $L_{B1}$ |
| 1638 | $L_{A678}$ | $L_{B1}$ |
| 1639 | $L_{A679}$ | $L_{B1}$ |
| 1640 | $L_{A680}$ | $L_{B1}$ |
| 1641 | $L_{A681}$ | $L_{B1}$ |
| 1642 | $L_{A682}$ | $L_{B1}$ |
| 1643 | $L_{A683}$ | $L_{B1}$ |
| 1644 | $L_{A684}$ | $L_{B1}$ |
| 1645 | $L_{A685}$ | $L_{B1}$ |
| 1646 | $L_{A686}$ | $L_{B1}$ |
| 1647 | $L_{A687}$ | $L_{B1}$ |
| 1648 | $L_{A688}$ | $L_{B1}$ |
| 1649 | $L_{A689}$ | $L_{B1}$ |
| 1650 | $L_{A690}$ | $L_{B1}$ |
| 1651 | $L_{A691}$ | $L_{B1}$ |
| 1652 | $L_{A692}$ | $L_{B1}$ |
| 1653 | $L_{A693}$ | $L_{B1}$ |
| 1654 | $L_{A694}$ | $L_{B1}$ |
| 1655 | $L_{A695}$ | $L_{B1}$ |
| 1656 | $L_{A696}$ | $L_{B1}$ |
| 1657 | $L_{A697}$ | $L_{B1}$ |
| 1658 | $L_{A698}$ | $L_{B1}$ |
| 1659 | $L_{A699}$ | $L_{B1}$ |
| 1660 | $L_{A700}$ | $L_{B1}$ |
| 1661 | $L_{A701}$ | $L_{B1}$ |
| 1662 | $L_{A702}$ | $L_{B1}$ |
| 1663 | $L_{A703}$ | $L_{B1}$ |
| 1664 | $L_{A704}$ | $L_{B1}$ |
| 1665 | $L_{A705}$ | $L_{B1}$ |
| 1666 | $L_{A706}$ | $L_{B1}$ |
| 1667 | $L_{A707}$ | $L_{B1}$ |
| 1668 | $L_{A708}$ | $L_{B1}$ |
| 1669 | $L_{A709}$ | $L_{B1}$ |
| 1670 | $L_{A710}$ | $L_{B1}$ |
| 1671 | $L_{A711}$ | $L_{B1}$ |
| 1672 | $L_{A712}$ | $L_{B1}$ |
| 1673 | $L_{A713}$ | $L_{B1}$ |
| 1674 | $L_{A714}$ | $L_{B1}$ |
| 1675 | $L_{A715}$ | $L_{B1}$ |
| 1676 | $L_{A716}$ | $L_{B1}$ |
| 1677 | $L_{A717}$ | $L_{B1}$ |
| 1678 | $L_{A718}$ | $L_{B1}$ |
| 1679 | $L_{A719}$ | $L_{B1}$ |
| 1680 | $L_{A720}$ | $L_{B1}$ |
| 1681 | $L_{A721}$ | $L_{B1}$ |
| 1682 | $L_{A722}$ | $L_{B1}$ |
| 1683 | $L_{A723}$ | $L_{B1}$ |
| 1684 | $L_{A724}$ | $L_{B1}$ |
| 1685 | $L_{A725}$ | $L_{B1}$ |

| Compound Number | $L_A$ | $L_B$ |
|---|---|---|
| 1686 | $L_{A726}$ | $L_{B1}$ |
| 1687 | $L_{A727}$ | $L_{B1}$ |
| 1688 | $L_{A728}$ | $L_{B1}$ |
| 1689 | $L_{A729}$ | $L_{B1}$ |
| 1690 | $L_{A730}$ | $L_{B1}$ |
| 1691 | $L_{A731}$ | $L_{B1}$ |
| 1692 | $L_{A732}$ | $L_{B1}$ |
| 1693 | $L_{A733}$ | $L_{B1}$ |
| 1694 | $L_{A734}$ | $L_{B1}$ |
| 1695 | $L_{A735}$ | $L_{B1}$ |
| 1696 | $L_{A736}$ | $L_{B1}$ |
| 1697 | $L_{A737}$ | $L_{B1}$ |
| 1698 | $L_{A738}$ | $L_{B1}$ |
| 1699 | $L_{A739}$ | $L_{B1}$ |
| 1700 | $L_{A740}$ | $L_{B1}$ |
| 1701 | $L_{A741}$ | $L_{B1}$ |
| 1702 | $L_{A742}$ | $L_{B1}$ |
| 1703 | $L_{A743}$ | $L_{B1}$ |
| 1704 | $L_{A744}$ | $L_{B1}$ |
| 1705 | $L_{A745}$ | $L_{B1}$ |
| 1706 | $L_{A746}$ | $L_{B1}$ |
| 1707 | $L_{A747}$ | $L_{B1}$ |
| 1708 | $L_{A748}$ | $L_{B1}$ |
| 1709 | $L_{A749}$ | $L_{B1}$ |
| 1710 | $L_{A750}$ | $L_{B1}$ |
| 1711 | $L_{A751}$ | $L_{B1}$ |
| 1712 | $L_{A752}$ | $L_{B1}$ |
| 1713 | $L_{A753}$ | $L_{B1}$ |
| 1714 | $L_{A754}$ | $L_{B1}$ |
| 1715 | $L_{A755}$ | $L_{B1}$ |
| 1716 | $L_{A756}$ | $L_{B1}$ |
| 1717 | $L_{A757}$ | $L_{B1}$ |
| 1718 | $L_{A758}$ | $L_{B1}$ |
| 1719 | $L_{A759}$ | $L_{B1}$ |
| 1720 | $L_{A760}$ | $L_{B1}$ |
| 1721 | $L_{A761}$ | $L_{B1}$ |
| 1722 | $L_{A762}$ | $L_{B1}$ |
| 1723 | $L_{A763}$ | $L_{B1}$ |
| 1724 | $L_{A764}$ | $L_{B1}$ |
| 1725 | $L_{A765}$ | $L_{B1}$ |
| 1726 | $L_{A766}$ | $L_{B1}$ |
| 1727 | $L_{A767}$ | $L_{B1}$ |
| 1728 | $L_{A768}$ | $L_{B1}$ |
| 1729 | $L_{A769}$ | $L_{B1}$ |
| 1730 | $L_{A770}$ | $L_{B1}$ |
| 1731 | $L_{A771}$ | $L_{B1}$ |
| 1732 | $L_{A772}$ | $L_{B1}$ |
| 1733 | $L_{A773}$ | $L_{B1}$ |
| 1734 | $L_{A774}$ | $L_{B1}$ |
| 1735 | $L_{A775}$ | $L_{B1}$ |
| 1736 | $L_{A776}$ | $L_{B1}$ |
| 1737 | $L_{A777}$ | $L_{B1}$ |
| 1738 | $L_{A778}$ | $L_{B1}$ |
| 1739 | $L_{A779}$ | $L_{B1}$ |
| 1740 | $L_{A780}$ | $L_{B1}$ |
| 1741 | $L_{A781}$ | $L_{B1}$ |
| 1742 | $L_{A782}$ | $L_{B1}$ |
| 1743 | $L_{A783}$ | $L_{B1}$ |
| 1744 | $L_{A784}$ | $L_{B1}$ |
| 1745 | $L_{A785}$ | $L_{B1}$ |
| 1746 | $L_{A786}$ | $L_{B1}$ |
| 1747 | $L_{A787}$ | $L_{B1}$ |
| 1748 | $L_{A788}$ | $L_{B1}$ |
| 1749 | $L_{A789}$ | $L_{B1}$ |
| 1750 | $L_{A790}$ | $L_{B1}$ |
| 1751 | $L_{A791}$ | $L_{B1}$ |
| 1752 | $L_{A792}$ | $L_{B1}$ |
| 1753 | $L_{A793}$ | $L_{B1}$ |
| 1754 | $L_{A794}$ | $L_{B1}$ |
| 1755 | $L_{A795}$ | $L_{B1}$ |
| 1756 | $L_{A796}$ | $L_{B1}$ |
| 1757 | $L_{A797}$ | $L_{B1}$ |
| 1758 | $L_{A798}$ | $L_{B1}$ |
| 1759 | $L_{A799}$ | $L_{B1}$ |
| 1760 | $L_{A800}$ | $L_{B1}$ |
| 1761 | $L_{A801}$ | $L_{B1}$ |

| Compound Number | $L_A$ | $L_B$ |
|---|---|---|
| 1762 | $L_{A802}$ | $L_{B1}$ |
| 1763 | $L_{A803}$ | $L_{B1}$ |
| 1764 | $L_{A804}$ | $L_{B1}$ |
| 1765 | $L_{A805}$ | $L_{B1}$ |
| 1766 | $L_{A806}$ | $L_{B1}$ |
| 1767 | $L_{A807}$ | $L_{B1}$ |
| 1768 | $L_{A808}$ | $L_{B1}$ |
| 1769 | $L_{A809}$ | $L_{B1}$ |
| 1770 | $L_{A810}$ | $L_{B1}$ |
| 1771 | $L_{A811}$ | $L_{B1}$ |
| 1772 | $L_{A812}$ | $L_{B1}$ |
| 1773 | $L_{A813}$ | $L_{B1}$ |
| 1774 | $L_{A814}$ | $L_{B1}$ |
| 1775 | $L_{A815}$ | $L_{B1}$ |
| 1776 | $L_{A816}$ | $L_{B1}$ |
| 1777 | $L_{A817}$ | $L_{B1}$ |
| 1778 | $L_{A818}$ | $L_{B1}$ |
| 1779 | $L_{A819}$ | $L_{B1}$ |
| 1780 | $L_{A820}$ | $L_{B1}$ |
| 1781 | $L_{A821}$ | $L_{B1}$ |
| 1782 | $L_{A822}$ | $L_{B1}$ |
| 1783 | $L_{A823}$ | $L_{B1}$ |
| 1784 | $L_{A824}$ | $L_{B1}$ |
| 1785 | $L_{A825}$ | $L_{B1}$ |
| 1786 | $L_{A826}$ | $L_{B1}$ |
| 1787 | $L_{A827}$ | $L_{B1}$ |
| 1788 | $L_{A828}$ | $L_{B1}$ |
| 1789 | $L_{A829}$ | $L_{B1}$ |
| 1790 | $L_{A830}$ | $L_{B1}$ |
| 1791 | $L_{A831}$ | $L_{B1}$ |
| 1792 | $L_{A832}$ | $L_{B1}$ |
| 1793 | $L_{A833}$ | $L_{B1}$ |
| 1794 | $L_{A834}$ | $L_{B1}$ |
| 1795 | $L_{A835}$ | $L_{B1}$ |
| 1796 | $L_{A836}$ | $L_{B1}$ |
| 1797 | $L_{A837}$ | $L_{B1}$ |
| 1798 | $L_{A838}$ | $L_{B1}$ |
| 1799 | $L_{A839}$ | $L_{B1}$ |
| 1800 | $L_{A840}$ | $L_{B1}$ |
| 1801 | $L_{A841}$ | $L_{B1}$ |
| 1802 | $L_{A842}$ | $L_{B1}$ |
| 1803 | $L_{A843}$ | $L_{B1}$ |
| 1804 | $L_{A844}$ | $L_{B1}$ |
| 1805 | $L_{A845}$ | $L_{B1}$ |
| 1806 | $L_{A846}$ | $L_{B1}$ |
| 1807 | $L_{A847}$ | $L_{B1}$ |
| 1808 | $L_{A848}$ | $L_{B1}$ |
| 1809 | $L_{A849}$ | $L_{B1}$ |
| 1810 | $L_{A850}$ | $L_{B1}$ |
| 1811 | $L_{A851}$ | $L_{B1}$ |
| 1812 | $L_{A852}$ | $L_{B1}$ |
| 1813 | $L_{A853}$ | $L_{B1}$ |
| 1814 | $L_{A854}$ | $L_{B1}$ |
| 1815 | $L_{A855}$ | $L_{B1}$ |
| 1816 | $L_{A856}$ | $L_{B1}$ |
| 1817 | $L_{A857}$ | $L_{B1}$ |
| 1818 | $L_{A858}$ | $L_{B1}$ |
| 1819 | $L_{A859}$ | $L_{B1}$ |
| 1820 | $L_{A860}$ | $L_{B1}$ |
| 1821 | $L_{A861}$ | $L_{B1}$ |
| 1822 | $L_{A862}$ | $L_{B1}$ |
| 1823 | $L_{A863}$ | $L_{B1}$ |
| 1824 | $L_{A864}$ | $L_{B1}$ |
| 1825 | $L_{A865}$ | $L_{B1}$ |
| 1826 | $L_{A866}$ | $L_{B1}$ |
| 1827 | $L_{A867}$ | $L_{B1}$ |
| 1828 | $L_{A868}$ | $L_{B1}$ |
| 1829 | $L_{A869}$ | $L_{B1}$ |
| 1830 | $L_{A870}$ | $L_{B1}$ |
| 1831 | $L_{A871}$ | $L_{B1}$ |
| 1832 | $L_{A872}$ | $L_{B1}$ |
| 1833 | $L_{A873}$ | $L_{B1}$ |
| 1834 | $L_{A874}$ | $L_{B1}$ |
| 1835 | $L_{A875}$ | $L_{B1}$ |
| 1836 | $L_{A876}$ | $L_{B1}$ |
| 1837 | $L_{A877}$ | $L_{B1}$ |

-continued

| Compound Number | $L_A$ | $L_B$ |
|---|---|---|
| 1838 | $L_{A878}$ | $L_{B1}$ |
| 1839 | $L_{A879}$ | $L_{B1}$ |
| 1840 | $L_{A880}$ | $L_{B1}$ |
| 1841 | $L_{A881}$ | $L_{B1}$ |
| 1842 | $L_{A882}$ | $L_{B1}$ |
| 1843 | $L_{A883}$ | $L_{B1}$ |
| 1844 | $L_{A884}$ | $L_{B1}$ |
| 1845 | $L_{A885}$ | $L_{B1}$ |
| 1846 | $L_{A886}$ | $L_{B1}$ |
| 1847 | $L_{A887}$ | $L_{B1}$ |
| 1848 | $L_{A888}$ | $L_{B1}$ |
| 1849 | $L_{A889}$ | $L_{B1}$ |
| 1850 | $L_{A890}$ | $L_{B1}$ |
| 1851 | $L_{A891}$ | $L_{B1}$ |
| 1852 | $L_{A892}$ | $L_{B1}$ |
| 1853 | $L_{A893}$ | $L_{B1}$ |
| 1854 | $L_{A894}$ | $L_{B1}$ |
| 1855 | $L_{A895}$ | $L_{B1}$ |
| 1856 | $L_{A896}$ | $L_{B1}$ |
| 1857 | $L_{A897}$ | $L_{B1}$ |
| 1858 | $L_{A898}$ | $L_{B1}$ |
| 1859 | $L_{A899}$ | $L_{B1}$ |
| 1860 | $L_{A900}$ | $L_{B1}$ |
| 1861 | $L_{A901}$ | $L_{B1}$ |
| 1862 | $L_{A902}$ | $L_{B1}$ |
| 1863 | $L_{A903}$ | $L_{B1}$ |
| 1864 | $L_{A904}$ | $L_{B1}$ |
| 1865 | $L_{A905}$ | $L_{B1}$ |
| 1866 | $L_{A906}$ | $L_{B1}$ |
| 1867 | $L_{A907}$ | $L_{B1}$ |
| 1868 | $L_{A908}$ | $L_{B1}$ |
| 1869 | $L_{A909}$ | $L_{B1}$ |
| 1870 | $L_{A910}$ | $L_{B1}$ |
| 1871 | $L_{A911}$ | $L_{B1}$ |
| 1872 | $L_{A912}$ | $L_{B1}$ |
| 1873 | $L_{A913}$ | $L_{B1}$ |
| 1874 | $L_{A914}$ | $L_{B1}$ |
| 1875 | $L_{A915}$ | $L_{B1}$ |
| 1876 | $L_{A916}$ | $L_{B1}$ |
| 1877 | $L_{A917}$ | $L_{B1}$ |
| 1878 | $L_{A918}$ | $L_{B1}$ |
| 1879 | $L_{A919}$ | $L_{B1}$ |
| 1880 | $L_{A920}$ | $L_{B1}$ |
| 1881 | $L_{A921}$ | $L_{B1}$ |
| 1882 | $L_{A922}$ | $L_{B1}$ |
| 1883 | $L_{A923}$ | $L_{B1}$ |
| 1884 | $L_{A924}$ | $L_{B1}$ |
| 1885 | $L_{A925}$ | $L_{B1}$ |
| 1886 | $L_{A926}$ | $L_{B1}$ |
| 1887 | $L_{A927}$ | $L_{B1}$ |
| 1888 | $L_{A928}$ | $L_{B1}$ |
| 1889 | $L_{A929}$ | $L_{B1}$ |
| 1890 | $L_{A930}$ | $L_{B1}$ |
| 1891 | $L_{A931}$ | $L_{B1}$ |
| 1892 | $L_{A932}$ | $L_{B1}$ |
| 1893 | $L_{A933}$ | $L_{B1}$ |
| 1894 | $L_{A934}$ | $L_{B1}$ |
| 1895 | $L_{A935}$ | $L_{B1}$ |
| 1896 | $L_{A936}$ | $L_{B1}$ |
| 1897 | $L_{A937}$ | $L_{B1}$ |
| 1898 | $L_{A938}$ | $L_{B1}$ |
| 1899 | $L_{A939}$ | $L_{B1}$ |
| 1900 | $L_{A940}$ | $L_{B1}$ |
| 1901 | $L_{A941}$ | $L_{B1}$ |
| 1902 | $L_{A942}$ | $L_{B1}$ |
| 1903 | $L_{A943}$ | $L_{B1}$ |
| 1904 | $L_{A944}$ | $L_{B1}$ |
| 1905 | $L_{A945}$ | $L_{B1}$ |
| 1906 | $L_{A946}$ | $L_{B1}$ |
| 1907 | $L_{A947}$ | $L_{B1}$ |
| 1908 | $L_{A948}$ | $L_{B1}$ |
| 1909 | $L_{A949}$ | $L_{B1}$ |
| 1910 | $L_{A950}$ | $L_{B1}$ |
| 1911 | $L_{A951}$ | $L_{B1}$ |
| 1912 | $L_{A952}$ | $L_{B1}$ |
| 1913 | $L_{A953}$ | $L_{B1}$ |

-continued

| Compound Number | $L_A$ | $L_B$ |
|---|---|---|
| 1914 | $L_{A954}$ | $L_{B1}$ |
| 1915 | $L_{A955}$ | $L_{B1}$ |
| 1916 | $L_{A956}$ | $L_{B1}$ |
| 1917 | $L_{A957}$ | $L_{B1}$ |
| 1918 | $L_{A958}$ | $L_{B1}$ |
| 1919 | $L_{A959}$ | $L_{B1}$ |
| 1920 | $L_{A960}$ | $L_{B1}$ |
| 1921 | $L_{A1}$ | $L_{B2}$ |
| 1922 | $L_{A2}$ | $L_{B2}$ |
| 1923 | $L_{A3}$ | $L_{B2}$ |
| 1924 | $L_{A4}$ | $L_{B2}$ |
| 1925 | $L_{A5}$ | $L_{B2}$ |
| 1926 | $L_{A6}$ | $L_{B2}$ |
| 1927 | $L_{A7}$ | $L_{B2}$ |
| 1928 | $L_{A8}$ | $L_{B2}$ |
| 1929 | $L_{A9}$ | $L_{B2}$ |
| 1930 | $L_{A10}$ | $L_{B2}$ |
| 1931 | $L_{A11}$ | $L_{B2}$ |
| 1932 | $L_{A12}$ | $L_{B2}$ |
| 1933 | $L_{A13}$ | $L_{B2}$ |
| 1934 | $L_{A14}$ | $L_{B2}$ |
| 1935 | $L_{A15}$ | $L_{B2}$ |
| 1936 | $L_{A16}$ | $L_{B2}$ |
| 1937 | $L_{A17}$ | $L_{B2}$ |
| 1938 | $L_{A18}$ | $L_{B2}$ |
| 1939 | $L_{A19}$ | $L_{B2}$ |
| 1940 | $L_{A20}$ | $L_{B2}$ |
| 1941 | $L_{A21}$ | $L_{B2}$ |
| 1942 | $L_{A22}$ | $L_{B2}$ |
| 1943 | $L_{A23}$ | $L_{B2}$ |
| 1944 | $L_{A24}$ | $L_{B2}$ |
| 1945 | $L_{A25}$ | $L_{B2}$ |
| 1946 | $L_{A26}$ | $L_{B2}$ |
| 1947 | $L_{A27}$ | $L_{B2}$ |
| 1948 | $L_{A28}$ | $L_{B2}$ |
| 1949 | $L_{A29}$ | $L_{B2}$ |
| 1950 | $L_{A30}$ | $L_{B2}$ |
| 1951 | $L_{A31}$ | $L_{B2}$ |
| 1952 | $L_{A32}$ | $L_{B2}$ |
| 1953 | $L_{A33}$ | $L_{B2}$ |
| 1954 | $L_{A34}$ | $L_{B2}$ |
| 1955 | $L_{A35}$ | $L_{B2}$ |
| 1956 | $L_{A36}$ | $L_{B2}$ |
| 1957 | $L_{A37}$ | $L_{B2}$ |
| 1958 | $L_{A38}$ | $L_{B2}$ |
| 1959 | $L_{A39}$ | $L_{B2}$ |
| 1960 | $L_{A40}$ | $L_{B2}$ |
| 1961 | $L_{A41}$ | $L_{B2}$ |
| 1962 | $L_{A42}$ | $L_{B2}$ |
| 1963 | $L_{A43}$ | $L_{B2}$ |
| 1964 | $L_{A44}$ | $L_{B2}$ |
| 1965 | $L_{A45}$ | $L_{B2}$ |
| 1966 | $L_{A46}$ | $L_{B2}$ |
| 1967 | $L_{A47}$ | $L_{B2}$ |
| 1968 | $L_{A48}$ | $L_{B2}$ |
| 1969 | $L_{A49}$ | $L_{B2}$ |
| 1970 | $L_{A50}$ | $L_{B2}$ |
| 1971 | $L_{A51}$ | $L_{B2}$ |
| 1972 | $L_{A52}$ | $L_{B2}$ |
| 1973 | $L_{A53}$ | $L_{B2}$ |
| 1974 | $L_{A54}$ | $L_{B2}$ |
| 1975 | $L_{A55}$ | $L_{B2}$ |
| 1976 | $L_{A56}$ | $L_{B2}$ |
| 1977 | $L_{A57}$ | $L_{B2}$ |
| 1978 | $L_{A58}$ | $L_{B2}$ |
| 1979 | $L_{A59}$ | $L_{B2}$ |
| 1980 | $L_{A60}$ | $L_{B2}$ |
| 1981 | $L_{A61}$ | $L_{B2}$ |
| 1982 | $L_{A62}$ | $L_{B2}$ |
| 1983 | $L_{A63}$ | $L_{B2}$ |
| 1984 | $L_{A64}$ | $L_{B2}$ |
| 1985 | $L_{A65}$ | $L_{B2}$ |
| 1986 | $L_{A66}$ | $L_{B2}$ |
| 1987 | $L_{A67}$ | $L_{B2}$ |
| 1988 | $L_{A68}$ | $L_{B2}$ |
| 1989 | $L_{A69}$ | $L_{B2}$ |

-continued

| Compound Number | $L_A$ | $L_B$ |
|---|---|---|
| 1990 | $L_{A70}$ | $L_{B2}$ |
| 1991 | $L_{A71}$ | $L_{B2}$ |
| 1992 | $L_{A72}$ | $L_{B2}$ |
| 1993 | $L_{A73}$ | $L_{B2}$ |
| 1994 | $L_{A74}$ | $L_{B2}$ |
| 1995 | $L_{A75}$ | $L_{B2}$ |
| 1996 | $L_{A76}$ | $L_{B2}$ |
| 1997 | $L_{A77}$ | $L_{B2}$ |
| 1998 | $L_{A78}$ | $L_{B2}$ |
| 1999 | $L_{A79}$ | $L_{B2}$ |
| 2000 | $L_{A80}$ | $L_{B2}$ |
| 2001 | $L_{A81}$ | $L_{B2}$ |
| 2002 | $L_{A82}$ | $L_{B2}$ |
| 2003 | $L_{A83}$ | $L_{B2}$ |
| 2004 | $L_{A84}$ | $L_{B2}$ |
| 2005 | $L_{A85}$ | $L_{B2}$ |
| 2006 | $L_{A86}$ | $L_{B2}$ |
| 2007 | $L_{A87}$ | $L_{B2}$ |
| 2008 | $L_{A88}$ | $L_{B2}$ |
| 2009 | $L_{A89}$ | $L_{B2}$ |
| 2010 | $L_{A90}$ | $L_{B2}$ |
| 2011 | $L_{A91}$ | $L_{B2}$ |
| 2012 | $L_{A92}$ | $L_{B2}$ |
| 2013 | $L_{A93}$ | $L_{B2}$ |
| 2014 | $L_{A94}$ | $L_{B2}$ |
| 2015 | $L_{A95}$ | $L_{B2}$ |
| 2016 | $L_{A96}$ | $L_{B2}$ |
| 2017 | $L_{A97}$ | $L_{B2}$ |
| 2018 | $L_{A98}$ | $L_{B2}$ |
| 2019 | $L_{A99}$ | $L_{B2}$ |
| 2020 | $L_{A100}$ | $L_{B2}$ |
| 2021 | $L_{A101}$ | $L_{B2}$ |
| 2022 | $L_{A102}$ | $L_{B2}$ |
| 2023 | $L_{A103}$ | $L_{B2}$ |
| 2024 | $L_{A104}$ | $L_{B2}$ |
| 2025 | $L_{A105}$ | $L_{B2}$ |
| 2026 | $L_{A106}$ | $L_{B2}$ |
| 2027 | $L_{A107}$ | $L_{B2}$ |
| 2028 | $L_{A108}$ | $L_{B2}$ |
| 2029 | $L_{A109}$ | $L_{B2}$ |
| 2030 | $L_{A110}$ | $L_{B2}$ |
| 2031 | $L_{A111}$ | $L_{B2}$ |
| 2032 | $L_{A112}$ | $L_{B2}$ |
| 2033 | $L_{A113}$ | $L_{B2}$ |
| 2034 | $L_{A114}$ | $L_{B2}$ |
| 2035 | $L_{A115}$ | $L_{B2}$ |
| 2036 | $L_{A116}$ | $L_{B2}$ |
| 2037 | $L_{A117}$ | $L_{B2}$ |
| 2038 | $L_{A118}$ | $L_{B2}$ |
| 2039 | $L_{A119}$ | $L_{B2}$ |
| 2040 | $L_{A120}$ | $L_{B2}$ |
| 2041 | $L_{A121}$ | $L_{B2}$ |
| 2042 | $L_{A122}$ | $L_{B2}$ |
| 2043 | $L_{A123}$ | $L_{B2}$ |
| 2044 | $L_{A124}$ | $L_{B2}$ |
| 2045 | $L_{A125}$ | $L_{B2}$ |
| 2046 | $L_{A126}$ | $L_{B2}$ |
| 2047 | $L_{A127}$ | $L_{B2}$ |
| 2048 | $L_{A128}$ | $L_{B2}$ |
| 2049 | $L_{A129}$ | $L_{B2}$ |
| 2050 | $L_{A130}$ | $L_{B2}$ |
| 2051 | $L_{A131}$ | $L_{B2}$ |
| 2052 | $L_{A132}$ | $L_{B2}$ |
| 2053 | $L_{A133}$ | $L_{B2}$ |
| 2054 | $L_{A134}$ | $L_{B2}$ |
| 2055 | $L_{A135}$ | $L_{B2}$ |
| 2056 | $L_{A136}$ | $L_{B2}$ |
| 2057 | $L_{A137}$ | $L_{B2}$ |
| 2058 | $L_{A138}$ | $L_{B2}$ |
| 2059 | $L_{A139}$ | $L_{B2}$ |
| 2060 | $L_{A140}$ | $L_{B2}$ |
| 2061 | $L_{A141}$ | $L_{B2}$ |
| 2062 | $L_{A142}$ | $L_{B2}$ |
| 2063 | $L_{A143}$ | $L_{B2}$ |
| 2064 | $L_{A144}$ | $L_{B2}$ |
| 2065 | $L_{A145}$ | $L_{B2}$ |

-continued

| Compound Number | $L_A$ | $L_B$ |
|---|---|---|
| 2066 | $L_{A146}$ | $L_{B2}$ |
| 2067 | $L_{A147}$ | $L_{B2}$ |
| 2068 | $L_{A148}$ | $L_{B2}$ |
| 2069 | $L_{A149}$ | $L_{B2}$ |
| 2070 | $L_{A150}$ | $L_{B2}$ |
| 2071 | $L_{A151}$ | $L_{B2}$ |
| 2072 | $L_{A152}$ | $L_{B2}$ |
| 2073 | $L_{A153}$ | $L_{B2}$ |
| 2074 | $L_{A154}$ | $L_{B2}$ |
| 2075 | $L_{A155}$ | $L_{B2}$ |
| 2076 | $L_{A156}$ | $L_{B2}$ |
| 2077 | $L_{A157}$ | $L_{B2}$ |
| 2078 | $L_{A158}$ | $L_{B2}$ |
| 2079 | $L_{A159}$ | $L_{B2}$ |
| 2080 | $L_{A160}$ | $L_{B2}$ |
| 2081 | $L_{A161}$ | $L_{B2}$ |
| 2082 | $L_{A162}$ | $L_{B2}$ |
| 2083 | $L_{A163}$ | $L_{B2}$ |
| 2084 | $L_{A164}$ | $L_{B2}$ |
| 2085 | $L_{A165}$ | $L_{B2}$ |
| 2086 | $L_{A166}$ | $L_{B2}$ |
| 2087 | $L_{A167}$ | $L_{B2}$ |
| 2088 | $L_{A168}$ | $L_{B2}$ |
| 2089 | $L_{A169}$ | $L_{B2}$ |
| 2090 | $L_{A170}$ | $L_{B2}$ |
| 2091 | $L_{A171}$ | $L_{B2}$ |
| 2092 | $L_{A172}$ | $L_{B2}$ |
| 2093 | $L_{A173}$ | $L_{B2}$ |
| 2094 | $L_{A174}$ | $L_{B2}$ |
| 2095 | $L_{A175}$ | $L_{B2}$ |
| 2096 | $L_{A176}$ | $L_{B2}$ |
| 2097 | $L_{A177}$ | $L_{B2}$ |
| 2098 | $L_{A178}$ | $L_{B2}$ |
| 2099 | $L_{A179}$ | $L_{B2}$ |
| 2100 | $L_{A180}$ | $L_{B2}$ |
| 2101 | $L_{A181}$ | $L_{B2}$ |
| 2102 | $L_{A182}$ | $L_{B2}$ |
| 2103 | $L_{A183}$ | $L_{B2}$ |
| 2104 | $L_{A184}$ | $L_{B2}$ |
| 2105 | $L_{A185}$ | $L_{B2}$ |
| 2106 | $L_{A186}$ | $L_{B2}$ |
| 2107 | $L_{A187}$ | $L_{B2}$ |
| 2108 | $L_{A188}$ | $L_{B2}$ |
| 2109 | $L_{A189}$ | $L_{B2}$ |
| 2110 | $L_{A190}$ | $L_{B2}$ |
| 2111 | $L_{A191}$ | $L_{B2}$ |
| 2112 | $L_{A192}$ | $L_{B2}$ |
| 2113 | $L_{A193}$ | $L_{B2}$ |
| 2114 | $L_{A194}$ | $L_{B2}$ |
| 2115 | $L_{A195}$ | $L_{B2}$ |
| 2116 | $L_{A196}$ | $L_{B2}$ |
| 2117 | $L_{A197}$ | $L_{B2}$ |
| 2118 | $L_{A198}$ | $L_{B2}$ |
| 2119 | $L_{A199}$ | $L_{B2}$ |
| 2120 | $L_{A200}$ | $L_{B2}$ |
| 2121 | $L_{A201}$ | $L_{B2}$ |
| 2122 | $L_{A202}$ | $L_{B2}$ |
| 2123 | $L_{A203}$ | $L_{B2}$ |
| 2124 | $L_{A204}$ | $L_{B2}$ |
| 2125 | $L_{A205}$ | $L_{B2}$ |
| 2126 | $L_{A206}$ | $L_{B2}$ |
| 2127 | $L_{A207}$ | $L_{B2}$ |
| 2128 | $L_{A208}$ | $L_{B2}$ |
| 2129 | $L_{A209}$ | $L_{B2}$ |
| 2130 | $L_{A210}$ | $L_{B2}$ |
| 2131 | $L_{A211}$ | $L_{B2}$ |
| 2132 | $L_{A212}$ | $L_{B2}$ |
| 2133 | $L_{A213}$ | $L_{B2}$ |
| 2134 | $L_{A214}$ | $L_{B2}$ |
| 2135 | $L_{A215}$ | $L_{B2}$ |
| 2136 | $L_{A216}$ | $L_{B2}$ |
| 2137 | $L_{A217}$ | $L_{B2}$ |
| 2138 | $L_{A218}$ | $L_{B2}$ |
| 2139 | $L_{A219}$ | $L_{B2}$ |
| 2140 | $L_{A220}$ | $L_{B2}$ |
| 2141 | $L_{A221}$ | $L_{B2}$ |

-continued

| Compound Number | $L_A$ | $L_B$ |
|---|---|---|
| 2142 | $L_{A222}$ | $L_{B2}$ |
| 2143 | $L_{A223}$ | $L_{B2}$ |
| 2144 | $L_{A224}$ | $L_{B2}$ |
| 2145 | $L_{A225}$ | $L_{B2}$ |
| 2146 | $L_{A226}$ | $L_{B2}$ |
| 2147 | $L_{A227}$ | $L_{B2}$ |
| 2148 | $L_{A228}$ | $L_{B2}$ |
| 2149 | $L_{A229}$ | $L_{B2}$ |
| 2150 | $L_{A230}$ | $L_{B2}$ |
| 2151 | $L_{A231}$ | $L_{B2}$ |
| 2152 | $L_{A232}$ | $L_{B2}$ |
| 2153 | $L_{A233}$ | $L_{B2}$ |
| 2154 | $L_{A234}$ | $L_{B2}$ |
| 2155 | $L_{A235}$ | $L_{B2}$ |
| 2156 | $L_{A236}$ | $L_{B2}$ |
| 2157 | $L_{A237}$ | $L_{B2}$ |
| 2158 | $L_{A238}$ | $L_{B2}$ |
| 2159 | $L_{A239}$ | $L_{B2}$ |
| 2160 | $L_{A240}$ | $L_{B2}$ |
| 2161 | $L_{A241}$ | $L_{B2}$ |
| 2162 | $L_{A242}$ | $L_{B2}$ |
| 2163 | $L_{A243}$ | $L_{B2}$ |
| 2164 | $L_{A244}$ | $L_{B2}$ |
| 2165 | $L_{A245}$ | $L_{B2}$ |
| 2166 | $L_{A246}$ | $L_{B2}$ |
| 2167 | $L_{A247}$ | $L_{B2}$ |
| 2168 | $L_{A248}$ | $L_{B2}$ |
| 2169 | $L_{A249}$ | $L_{B2}$ |
| 2170 | $L_{A250}$ | $L_{B2}$ |
| 2171 | $L_{A251}$ | $L_{B2}$ |
| 2172 | $L_{A252}$ | $L_{B2}$ |
| 2173 | $L_{A253}$ | $L_{B2}$ |
| 2174 | $L_{A254}$ | $L_{B2}$ |
| 2175 | $L_{A255}$ | $L_{B2}$ |
| 2176 | $L_{A256}$ | $L_{B2}$ |
| 2177 | $L_{A257}$ | $L_{B2}$ |
| 2178 | $L_{A258}$ | $L_{B2}$ |
| 2179 | $L_{A259}$ | $L_{B2}$ |
| 2180 | $L_{A260}$ | $L_{B2}$ |
| 2181 | $L_{A261}$ | $L_{B2}$ |
| 2182 | $L_{A262}$ | $L_{B2}$ |
| 2183 | $L_{A263}$ | $L_{B2}$ |
| 2184 | $L_{A264}$ | $L_{B2}$ |
| 2185 | $L_{A265}$ | $L_{B2}$ |
| 2186 | $L_{A266}$ | $L_{B2}$ |
| 2187 | $L_{A267}$ | $L_{B2}$ |
| 2188 | $L_{A268}$ | $L_{B2}$ |
| 2189 | $L_{A269}$ | $L_{B2}$ |
| 2190 | $L_{A270}$ | $L_{B2}$ |
| 2191 | $L_{A271}$ | $L_{B2}$ |
| 2192 | $L_{A272}$ | $L_{B2}$ |
| 2193 | $L_{A273}$ | $L_{B2}$ |
| 2194 | $L_{A274}$ | $L_{B2}$ |
| 2195 | $L_{A275}$ | $L_{B2}$ |
| 2196 | $L_{A276}$ | $L_{B2}$ |
| 2197 | $L_{A277}$ | $L_{B2}$ |
| 2198 | $L_{A278}$ | $L_{B2}$ |
| 2199 | $L_{A279}$ | $L_{B2}$ |
| 2200 | $L_{A280}$ | $L_{B2}$ |
| 2201 | $L_{A281}$ | $L_{B2}$ |
| 2202 | $L_{A282}$ | $L_{B2}$ |
| 2203 | $L_{A283}$ | $L_{B2}$ |
| 2204 | $L_{A284}$ | $L_{B2}$ |
| 2205 | $L_{A285}$ | $L_{B2}$ |
| 2206 | $L_{A286}$ | $L_{B2}$ |
| 2207 | $L_{A287}$ | $L_{B2}$ |
| 2208 | $L_{A288}$ | $L_{B2}$ |
| 2209 | $L_{A289}$ | $L_{B2}$ |
| 2210 | $L_{A290}$ | $L_{B2}$ |
| 2211 | $L_{A291}$ | $L_{B2}$ |
| 2212 | $L_{A292}$ | $L_{B2}$ |
| 2213 | $L_{A293}$ | $L_{B2}$ |
| 2214 | $L_{A294}$ | $L_{B2}$ |
| 2215 | $L_{A295}$ | $L_{B2}$ |
| 2216 | $L_{A296}$ | $L_{B2}$ |
| 2217 | $L_{A297}$ | $L_{B2}$ |

-continued

| Compound Number | $L_A$ | $L_B$ |
|---|---|---|
| 2218 | $L_{A298}$ | $L_{B2}$ |
| 2219 | $L_{A299}$ | $L_{B2}$ |
| 2220 | $L_{A300}$ | $L_{B2}$ |
| 2221 | $L_{A301}$ | $L_{B2}$ |
| 2222 | $L_{A302}$ | $L_{B2}$ |
| 2223 | $L_{A303}$ | $L_{B2}$ |
| 2224 | $L_{A304}$ | $L_{B2}$ |
| 2225 | $L_{A305}$ | $L_{B2}$ |
| 2226 | $L_{A306}$ | $L_{B2}$ |
| 2227 | $L_{A307}$ | $L_{B2}$ |
| 2228 | $L_{A308}$ | $L_{B2}$ |
| 2229 | $L_{A309}$ | $L_{B2}$ |
| 2230 | $L_{A310}$ | $L_{B2}$ |
| 2231 | $L_{A311}$ | $L_{B2}$ |
| 2232 | $L_{A312}$ | $L_{B2}$ |
| 2233 | $L_{A313}$ | $L_{B2}$ |
| 2234 | $L_{A314}$ | $L_{B2}$ |
| 2235 | $L_{A315}$ | $L_{B2}$ |
| 2236 | $L_{A316}$ | $L_{B2}$ |
| 2237 | $L_{A317}$ | $L_{B2}$ |
| 2238 | $L_{A318}$ | $L_{B2}$ |
| 2239 | $L_{A319}$ | $L_{B2}$ |
| 2240 | $L_{A320}$ | $L_{B2}$ |
| 2241 | $L_{A321}$ | $L_{B2}$ |
| 2242 | $L_{A322}$ | $L_{B2}$ |
| 2243 | $L_{A323}$ | $L_{B2}$ |
| 2244 | $L_{A324}$ | $L_{B2}$ |
| 2245 | $L_{A325}$ | $L_{B2}$ |
| 2246 | $L_{A326}$ | $L_{B2}$ |
| 2247 | $L_{A327}$ | $L_{B2}$ |
| 2248 | $L_{A328}$ | $L_{B2}$ |
| 2249 | $L_{A329}$ | $L_{B2}$ |
| 2250 | $L_{A330}$ | $L_{B2}$ |
| 2251 | $L_{A331}$ | $L_{B2}$ |
| 2252 | $L_{A332}$ | $L_{B2}$ |
| 2253 | $L_{A333}$ | $L_{B2}$ |
| 2254 | $L_{A334}$ | $L_{B2}$ |
| 2255 | $L_{A335}$ | $L_{B2}$ |
| 2256 | $L_{A336}$ | $L_{B2}$ |
| 2257 | $L_{A337}$ | $L_{B2}$ |
| 2258 | $L_{A338}$ | $L_{B2}$ |
| 2259 | $L_{A339}$ | $L_{B2}$ |
| 2260 | $L_{A340}$ | $L_{B2}$ |
| 2261 | $L_{A341}$ | $L_{B2}$ |
| 2262 | $L_{A342}$ | $L_{B2}$ |
| 2263 | $L_{A343}$ | $L_{B2}$ |
| 2264 | $L_{A344}$ | $L_{B2}$ |
| 2265 | $L_{A345}$ | $L_{B2}$ |
| 2266 | $L_{A346}$ | $L_{B2}$ |
| 2267 | $L_{A347}$ | $L_{B2}$ |
| 2268 | $L_{A348}$ | $L_{B2}$ |
| 2269 | $L_{A349}$ | $L_{B2}$ |
| 2270 | $L_{A350}$ | $L_{B2}$ |
| 2271 | $L_{A351}$ | $L_{B2}$ |
| 2272 | $L_{A352}$ | $L_{B2}$ |
| 2273 | $L_{A353}$ | $L_{B2}$ |
| 2274 | $L_{A354}$ | $L_{B2}$ |
| 2275 | $L_{A355}$ | $L_{B2}$ |
| 2276 | $L_{A356}$ | $L_{B2}$ |
| 2277 | $L_{A357}$ | $L_{B2}$ |
| 2278 | $L_{A358}$ | $L_{B2}$ |
| 2279 | $L_{A359}$ | $L_{B2}$ |
| 2280 | $L_{A360}$ | $L_{B2}$ |
| 2281 | $L_{A361}$ | $L_{B2}$ |
| 2282 | $L_{A362}$ | $L_{B2}$ |
| 2283 | $L_{A363}$ | $L_{B2}$ |
| 2284 | $L_{A364}$ | $L_{B2}$ |
| 2285 | $L_{A365}$ | $L_{B2}$ |
| 2286 | $L_{A366}$ | $L_{B2}$ |
| 2287 | $L_{A367}$ | $L_{B2}$ |
| 2288 | $L_{A368}$ | $L_{B2}$ |
| 2289 | $L_{A369}$ | $L_{B2}$ |
| 2290 | $L_{A370}$ | $L_{B2}$ |
| 2291 | $L_{A371}$ | $L_{B2}$ |
| 2292 | $L_{A372}$ | $L_{B2}$ |
| 2293 | $L_{A373}$ | $L_{B2}$ |

-continued

| Compound Number | $L_A$ | $L_B$ |
|---|---|---|
| 2294 | $L_{A374}$ | $L_{B2}$ |
| 2295 | $L_{A375}$ | $L_{B2}$ |
| 2296 | $L_{A376}$ | $L_{B2}$ |
| 2297 | $L_{A377}$ | $L_{B2}$ |
| 2298 | $L_{A378}$ | $L_{B2}$ |
| 2299 | $L_{A379}$ | $L_{B2}$ |
| 2300 | $L_{A380}$ | $L_{B2}$ |
| 2301 | $L_{A381}$ | $L_{B2}$ |
| 2302 | $L_{A382}$ | $L_{B2}$ |
| 2303 | $L_{A383}$ | $L_{B2}$ |
| 2304 | $L_{A384}$ | $L_{B2}$ |
| 2305 | $L_{A385}$ | $L_{B2}$ |
| 2306 | $L_{A386}$ | $L_{B2}$ |
| 2307 | $L_{A387}$ | $L_{B2}$ |
| 2308 | $L_{A388}$ | $L_{B2}$ |
| 2309 | $L_{A389}$ | $L_{B2}$ |
| 2310 | $L_{A390}$ | $L_{B2}$ |
| 2311 | $L_{A391}$ | $L_{B2}$ |
| 2312 | $L_{A392}$ | $L_{B2}$ |
| 2313 | $L_{A393}$ | $L_{B2}$ |
| 2314 | $L_{A394}$ | $L_{B2}$ |
| 2315 | $L_{A395}$ | $L_{B2}$ |
| 2316 | $L_{A396}$ | $L_{B2}$ |
| 2317 | $L_{A397}$ | $L_{B2}$ |
| 2318 | $L_{A398}$ | $L_{B2}$ |
| 2319 | $L_{A399}$ | $L_{B2}$ |
| 2320 | $L_{A400}$ | $L_{B2}$ |
| 2321 | $L_{A401}$ | $L_{B2}$ |
| 2322 | $L_{A402}$ | $L_{B2}$ |
| 2323 | $L_{A403}$ | $L_{B2}$ |
| 2324 | $L_{A404}$ | $L_{B2}$ |
| 2325 | $L_{A405}$ | $L_{B2}$ |
| 2326 | $L_{A406}$ | $L_{B2}$ |
| 2327 | $L_{A407}$ | $L_{B2}$ |
| 2328 | $L_{A408}$ | $L_{B2}$ |
| 2329 | $L_{A409}$ | $L_{B2}$ |
| 2330 | $L_{A410}$ | $L_{B2}$ |
| 2331 | $L_{A411}$ | $L_{B2}$ |
| 2332 | $L_{A412}$ | $L_{B2}$ |
| 2333 | $L_{A413}$ | $L_{B2}$ |
| 2334 | $L_{A414}$ | $L_{B2}$ |
| 2335 | $L_{A415}$ | $L_{B2}$ |
| 2336 | $L_{A416}$ | $L_{B2}$ |
| 2337 | $L_{A417}$ | $L_{B2}$ |
| 2338 | $L_{A418}$ | $L_{B2}$ |
| 2339 | $L_{A419}$ | $L_{B2}$ |
| 2340 | $L_{A420}$ | $L_{B2}$ |
| 2341 | $L_{A421}$ | $L_{B2}$ |
| 2342 | $L_{A422}$ | $L_{B2}$ |
| 2343 | $L_{A423}$ | $L_{B2}$ |
| 2344 | $L_{A424}$ | $L_{B2}$ |
| 2345 | $L_{A425}$ | $L_{B2}$ |
| 2346 | $L_{A426}$ | $L_{B2}$ |
| 2347 | $L_{A427}$ | $L_{B2}$ |
| 2348 | $L_{A428}$ | $L_{B2}$ |
| 2349 | $L_{A429}$ | $L_{B2}$ |
| 2350 | $L_{A430}$ | $L_{B2}$ |
| 2351 | $L_{A431}$ | $L_{B2}$ |
| 2352 | $L_{A432}$ | $L_{B2}$ |
| 2353 | $L_{A433}$ | $L_{B2}$ |
| 2354 | $L_{A434}$ | $L_{B2}$ |
| 2355 | $L_{A435}$ | $L_{B2}$ |
| 2356 | $L_{A436}$ | $L_{B2}$ |
| 2357 | $L_{A437}$ | $L_{B2}$ |
| 2358 | $L_{A438}$ | $L_{B2}$ |
| 2359 | $L_{A439}$ | $L_{B2}$ |
| 2360 | $L_{A440}$ | $L_{B2}$ |
| 2361 | $L_{A441}$ | $L_{B2}$ |
| 2362 | $L_{A442}$ | $L_{B2}$ |
| 2363 | $L_{A443}$ | $L_{B2}$ |
| 2364 | $L_{A444}$ | $L_{B2}$ |
| 2365 | $L_{A445}$ | $L_{B2}$ |
| 2366 | $L_{A446}$ | $L_{B2}$ |
| 2367 | $L_{A447}$ | $L_{B2}$ |
| 2368 | $L_{A448}$ | $L_{B2}$ |
| 2369 | $L_{A449}$ | $L_{B2}$ |

-continued

| Compound Number | $L_A$ | $L_B$ |
|---|---|---|
| 2370 | $L_{A450}$ | $L_{B2}$ |
| 2371 | $L_{A451}$ | $L_{B2}$ |
| 2372 | $L_{A452}$ | $L_{B2}$ |
| 2373 | $L_{A453}$ | $L_{B2}$ |
| 2374 | $L_{A454}$ | $L_{B2}$ |
| 2375 | $L_{A455}$ | $L_{B2}$ |
| 2376 | $L_{A456}$ | $L_{B2}$ |
| 2377 | $L_{A457}$ | $L_{B2}$ |
| 2378 | $L_{A458}$ | $L_{B2}$ |
| 2379 | $L_{A459}$ | $L_{B2}$ |
| 2380 | $L_{A460}$ | $L_{B2}$ |
| 2381 | $L_{A461}$ | $L_{B2}$ |
| 2382 | $L_{A462}$ | $L_{B2}$ |
| 2383 | $L_{A463}$ | $L_{B2}$ |
| 2384 | $L_{A464}$ | $L_{B2}$ |
| 2385 | $L_{A465}$ | $L_{B2}$ |
| 2386 | $L_{A466}$ | $L_{B2}$ |
| 2387 | $L_{A467}$ | $L_{B2}$ |
| 2388 | $L_{A468}$ | $L_{B2}$ |
| 2389 | $L_{A469}$ | $L_{B2}$ |
| 2390 | $L_{A470}$ | $L_{B2}$ |
| 2391 | $L_{A471}$ | $L_{B2}$ |
| 2392 | $L_{A472}$ | $L_{B2}$ |
| 2393 | $L_{A473}$ | $L_{B2}$ |
| 2394 | $L_{A474}$ | $L_{B2}$ |
| 2395 | $L_{A475}$ | $L_{B2}$ |
| 2396 | $L_{A476}$ | $L_{B2}$ |
| 2397 | $L_{A477}$ | $L_{B2}$ |
| 2398 | $L_{A478}$ | $L_{B2}$ |
| 2399 | $L_{A479}$ | $L_{B2}$ |
| 2400 | $L_{A480}$ | $L_{B2}$ |
| 2401 | $L_{A481}$ | $L_{B2}$ |
| 2402 | $L_{A482}$ | $L_{B2}$ |
| 2403 | $L_{A483}$ | $L_{B2}$ |
| 2404 | $L_{A484}$ | $L_{B2}$ |
| 2405 | $L_{A485}$ | $L_{B2}$ |
| 2406 | $L_{A486}$ | $L_{B2}$ |
| 2407 | $L_{A487}$ | $L_{B2}$ |
| 2408 | $L_{A488}$ | $L_{B2}$ |
| 2409 | $L_{A489}$ | $L_{B2}$ |
| 2410 | $L_{A490}$ | $L_{B2}$ |
| 2411 | $L_{A491}$ | $L_{B2}$ |
| 2412 | $L_{A492}$ | $L_{B2}$ |
| 2413 | $L_{A493}$ | $L_{B2}$ |
| 2414 | $L_{A494}$ | $L_{B2}$ |
| 2415 | $L_{A495}$ | $L_{B2}$ |
| 2416 | $L_{A496}$ | $L_{B2}$ |
| 2417 | $L_{A497}$ | $L_{B2}$ |
| 2418 | $L_{A498}$ | $L_{B2}$ |
| 2419 | $L_{A499}$ | $L_{B2}$ |
| 2420 | $L_{A500}$ | $L_{B2}$ |
| 2421 | $L_{A501}$ | $L_{B2}$ |
| 2422 | $L_{A502}$ | $L_{B2}$ |
| 2423 | $L_{A503}$ | $L_{B2}$ |
| 2424 | $L_{A504}$ | $L_{B2}$ |
| 2425 | $L_{A505}$ | $L_{B2}$ |
| 2426 | $L_{A506}$ | $L_{B2}$ |
| 2427 | $L_{A507}$ | $L_{B2}$ |
| 2428 | $L_{A508}$ | $L_{B2}$ |
| 2429 | $L_{A509}$ | $L_{B2}$ |
| 2430 | $L_{A510}$ | $L_{B2}$ |
| 2431 | $L_{A511}$ | $L_{B2}$ |
| 2432 | $L_{A512}$ | $L_{B2}$ |
| 2433 | $L_{A513}$ | $L_{B2}$ |
| 2434 | $L_{A514}$ | $L_{B2}$ |
| 2435 | $L_{A515}$ | $L_{B2}$ |
| 2436 | $L_{A516}$ | $L_{B2}$ |
| 2437 | $L_{A517}$ | $L_{B2}$ |
| 2438 | $L_{A518}$ | $L_{B2}$ |
| 2439 | $L_{A519}$ | $L_{B2}$ |
| 2440 | $L_{A520}$ | $L_{B2}$ |
| 2441 | $L_{A521}$ | $L_{B2}$ |
| 2442 | $L_{A522}$ | $L_{B2}$ |
| 2443 | $L_{A523}$ | $L_{B2}$ |
| 2444 | $L_{A524}$ | $L_{B2}$ |
| 2445 | $L_{A525}$ | $L_{B2}$ |

-continued

| Compound Number | $L_A$ | $L_B$ |
|---|---|---|
| 2446 | $L_{A526}$ | $L_{B2}$ |
| 2447 | $L_{A527}$ | $L_{B2}$ |
| 2448 | $L_{A528}$ | $L_{B2}$ |
| 2449 | $L_{A529}$ | $L_{B2}$ |
| 2450 | $L_{A530}$ | $L_{B2}$ |
| 2451 | $L_{A531}$ | $L_{B2}$ |
| 2452 | $L_{A532}$ | $L_{B2}$ |
| 2453 | $L_{A533}$ | $L_{B2}$ |
| 2454 | $L_{A534}$ | $L_{B2}$ |
| 2455 | $L_{A535}$ | $L_{B2}$ |
| 2456 | $L_{A536}$ | $L_{B2}$ |
| 2457 | $L_{A537}$ | $L_{B2}$ |
| 2458 | $L_{A538}$ | $L_{B2}$ |
| 2459 | $L_{A539}$ | $L_{B2}$ |
| 2460 | $L_{A540}$ | $L_{B2}$ |
| 2461 | $L_{A541}$ | $L_{B2}$ |
| 2462 | $L_{A542}$ | $L_{B2}$ |
| 2463 | $L_{A543}$ | $L_{B2}$ |
| 2464 | $L_{A544}$ | $L_{B2}$ |
| 2465 | $L_{A545}$ | $L_{B2}$ |
| 2466 | $L_{A546}$ | $L_{B2}$ |
| 2467 | $L_{A547}$ | $L_{B2}$ |
| 2468 | $L_{A548}$ | $L_{B2}$ |
| 2469 | $L_{A549}$ | $L_{B2}$ |
| 2470 | $L_{A550}$ | $L_{B2}$ |
| 2471 | $L_{A551}$ | $L_{B2}$ |
| 2472 | $L_{A552}$ | $L_{B2}$ |
| 2473 | $L_{A553}$ | $L_{B2}$ |
| 2474 | $L_{A554}$ | $L_{B2}$ |
| 2475 | $L_{A555}$ | $L_{B2}$ |
| 2476 | $L_{A556}$ | $L_{B2}$ |
| 2477 | $L_{A557}$ | $L_{B2}$ |
| 2478 | $L_{A558}$ | $L_{B2}$ |
| 2479 | $L_{A559}$ | $L_{B2}$ |
| 2480 | $L_{A560}$ | $L_{B2}$ |
| 2481 | $L_{A561}$ | $L_{B2}$ |
| 2482 | $L_{A562}$ | $L_{B2}$ |
| 2483 | $L_{A563}$ | $L_{B2}$ |
| 2484 | $L_{A564}$ | $L_{B2}$ |
| 2485 | $L_{A565}$ | $L_{B2}$ |
| 2486 | $L_{A566}$ | $L_{B2}$ |
| 2487 | $L_{A567}$ | $L_{B2}$ |
| 2488 | $L_{A568}$ | $L_{B2}$ |
| 2489 | $L_{A569}$ | $L_{B2}$ |
| 2490 | $L_{A570}$ | $L_{B2}$ |
| 2491 | $L_{A571}$ | $L_{B2}$ |
| 2492 | $L_{A572}$ | $L_{B2}$ |
| 2493 | $L_{A573}$ | $L_{B2}$ |
| 2494 | $L_{A574}$ | $L_{B2}$ |
| 2495 | $L_{A575}$ | $L_{B2}$ |
| 2496 | $L_{A576}$ | $L_{B2}$ |
| 2497 | $L_{A577}$ | $L_{B2}$ |
| 2498 | $L_{A578}$ | $L_{B2}$ |
| 2499 | $L_{A579}$ | $L_{B2}$ |
| 2500 | $L_{A580}$ | $L_{B2}$ |
| 2501 | $L_{A581}$ | $L_{B2}$ |
| 2502 | $L_{A582}$ | $L_{B2}$ |
| 2503 | $L_{A583}$ | $L_{B2}$ |
| 2504 | $L_{A584}$ | $L_{B2}$ |
| 2505 | $L_{A585}$ | $L_{B2}$ |
| 2506 | $L_{A586}$ | $L_{B2}$ |
| 2507 | $L_{A587}$ | $L_{B2}$ |
| 2508 | $L_{A588}$ | $L_{B2}$ |
| 2509 | $L_{A589}$ | $L_{B2}$ |
| 2510 | $L_{A590}$ | $L_{B2}$ |
| 2511 | $L_{A591}$ | $L_{B2}$ |
| 2512 | $L_{A592}$ | $L_{B2}$ |
| 2513 | $L_{A593}$ | $L_{B2}$ |
| 2514 | $L_{A594}$ | $L_{B2}$ |
| 2515 | $L_{A595}$ | $L_{B2}$ |
| 2516 | $L_{A596}$ | $L_{B2}$ |
| 2517 | $L_{A597}$ | $L_{B2}$ |
| 2518 | $L_{A598}$ | $L_{B2}$ |
| 2519 | $L_{A599}$ | $L_{B2}$ |
| 2520 | $L_{A600}$ | $L_{B2}$ |
| 2521 | $L_{A601}$ | $L_{B2}$ |

-continued

| Compound Number | $L_A$ | $L_B$ |
|---|---|---|
| 2522 | $L_{A602}$ | $L_{B2}$ |
| 2523 | $L_{A603}$ | $L_{B2}$ |
| 2524 | $L_{A604}$ | $L_{B2}$ |
| 2525 | $L_{A605}$ | $L_{B2}$ |
| 2526 | $L_{A606}$ | $L_{B2}$ |
| 2527 | $L_{A607}$ | $L_{B2}$ |
| 2528 | $L_{A608}$ | $L_{B2}$ |
| 2529 | $L_{A609}$ | $L_{B2}$ |
| 2530 | $L_{A610}$ | $L_{B2}$ |
| 2531 | $L_{A611}$ | $L_{B2}$ |
| 2532 | $L_{A612}$ | $L_{B2}$ |
| 2533 | $L_{A613}$ | $L_{B2}$ |
| 2534 | $L_{A614}$ | $L_{B2}$ |
| 2535 | $L_{A615}$ | $L_{B2}$ |
| 2536 | $L_{A616}$ | $L_{B2}$ |
| 2537 | $L_{A617}$ | $L_{B2}$ |
| 2538 | $L_{A618}$ | $L_{B2}$ |
| 2539 | $L_{A619}$ | $L_{B2}$ |
| 2540 | $L_{A620}$ | $L_{B2}$ |
| 2541 | $L_{A621}$ | $L_{B2}$ |
| 2542 | $L_{A622}$ | $L_{B2}$ |
| 2543 | $L_{A623}$ | $L_{B2}$ |
| 2544 | $L_{A624}$ | $L_{B2}$ |
| 2545 | $L_{A625}$ | $L_{B2}$ |
| 2546 | $L_{A626}$ | $L_{B2}$ |
| 2547 | $L_{A627}$ | $L_{B2}$ |
| 2548 | $L_{A628}$ | $L_{B2}$ |
| 2549 | $L_{A629}$ | $L_{B2}$ |
| 2550 | $L_{A630}$ | $L_{B2}$ |
| 2551 | $L_{A631}$ | $L_{B2}$ |
| 2552 | $L_{A632}$ | $L_{B2}$ |
| 2553 | $L_{A633}$ | $L_{B2}$ |
| 2554 | $L_{A634}$ | $L_{B2}$ |
| 2555 | $L_{A635}$ | $L_{B2}$ |
| 2556 | $L_{A636}$ | $L_{B2}$ |
| 2557 | $L_{A637}$ | $L_{B2}$ |
| 2558 | $L_{A638}$ | $L_{B2}$ |
| 2559 | $L_{A639}$ | $L_{B2}$ |
| 2560 | $L_{A640}$ | $L_{B2}$ |
| 2561 | $L_{A641}$ | $L_{B2}$ |
| 2562 | $L_{A642}$ | $L_{B2}$ |
| 2563 | $L_{A643}$ | $L_{B2}$ |
| 2564 | $L_{A644}$ | $L_{B2}$ |
| 2565 | $L_{A645}$ | $L_{B2}$ |
| 2566 | $L_{A646}$ | $L_{B2}$ |
| 2567 | $L_{A647}$ | $L_{B2}$ |
| 2568 | $L_{A648}$ | $L_{B2}$ |
| 2569 | $L_{A649}$ | $L_{B2}$ |
| 2570 | $L_{A650}$ | $L_{B2}$ |
| 2571 | $L_{A651}$ | $L_{B2}$ |
| 2572 | $L_{A652}$ | $L_{B2}$ |
| 2573 | $L_{A653}$ | $L_{B2}$ |
| 2574 | $L_{A654}$ | $L_{B2}$ |
| 2575 | $L_{A655}$ | $L_{B2}$ |
| 2576 | $L_{A656}$ | $L_{B2}$ |
| 2577 | $L_{A657}$ | $L_{B2}$ |
| 2578 | $L_{A658}$ | $L_{B2}$ |
| 2579 | $L_{A659}$ | $L_{B2}$ |
| 2580 | $L_{A660}$ | $L_{B2}$ |
| 2581 | $L_{A661}$ | $L_{B2}$ |
| 2582 | $L_{A662}$ | $L_{B2}$ |
| 2583 | $L_{A663}$ | $L_{B2}$ |
| 2584 | $L_{A664}$ | $L_{B2}$ |
| 2585 | $L_{A665}$ | $L_{B2}$ |
| 2586 | $L_{A666}$ | $L_{B2}$ |
| 2587 | $L_{A667}$ | $L_{B2}$ |
| 2588 | $L_{A668}$ | $L_{B2}$ |
| 2589 | $L_{A669}$ | $L_{B2}$ |
| 2590 | $L_{A670}$ | $L_{B2}$ |
| 2591 | $L_{A671}$ | $L_{B2}$ |
| 2592 | $L_{A672}$ | $L_{B2}$ |
| 2593 | $L_{A673}$ | $L_{B2}$ |
| 2594 | $L_{A674}$ | $L_{B2}$ |
| 2595 | $L_{A675}$ | $L_{B2}$ |
| 2596 | $L_{A676}$ | $L_{B2}$ |
| 2597 | $L_{A677}$ | $L_{B2}$ |

-continued

| Compound Number | $L_A$ | $L_B$ |
|---|---|---|
| 2598 | $L_{A678}$ | $L_{B2}$ |
| 2599 | $L_{A679}$ | $L_{B2}$ |
| 2600 | $L_{A680}$ | $L_{B2}$ |
| 2601 | $L_{A681}$ | $L_{B2}$ |
| 2602 | $L_{A682}$ | $L_{B2}$ |
| 2603 | $L_{A683}$ | $L_{B2}$ |
| 2604 | $L_{A684}$ | $L_{B2}$ |
| 2605 | $L_{A685}$ | $L_{B2}$ |
| 2606 | $L_{A686}$ | $L_{B2}$ |
| 2607 | $L_{A687}$ | $L_{B2}$ |
| 2608 | $L_{A688}$ | $L_{B2}$ |
| 2609 | $L_{A689}$ | $L_{B2}$ |
| 2610 | $L_{A690}$ | $L_{B2}$ |
| 2611 | $L_{A691}$ | $L_{B2}$ |
| 2612 | $L_{A692}$ | $L_{B2}$ |
| 2613 | $L_{A693}$ | $L_{B2}$ |
| 2614 | $L_{A694}$ | $L_{B2}$ |
| 2615 | $L_{A695}$ | $L_{B2}$ |
| 2616 | $L_{A696}$ | $L_{B2}$ |
| 2617 | $L_{A697}$ | $L_{B2}$ |
| 2618 | $L_{A698}$ | $L_{B2}$ |
| 2619 | $L_{A699}$ | $L_{B2}$ |
| 2620 | $L_{A700}$ | $L_{B2}$ |
| 2621 | $L_{A701}$ | $L_{B2}$ |
| 2622 | $L_{A702}$ | $L_{B2}$ |
| 2623 | $L_{A703}$ | $L_{B2}$ |
| 2624 | $L_{A704}$ | $L_{B2}$ |
| 2625 | $L_{A705}$ | $L_{B2}$ |
| 2626 | $L_{A706}$ | $L_{B2}$ |
| 2627 | $L_{A707}$ | $L_{B2}$ |
| 2628 | $L_{A708}$ | $L_{B2}$ |
| 2629 | $L_{A709}$ | $L_{B2}$ |
| 2630 | $L_{A710}$ | $L_{B2}$ |
| 2631 | $L_{A711}$ | $L_{B2}$ |
| 2632 | $L_{A712}$ | $L_{B2}$ |
| 2633 | $L_{A713}$ | $L_{B2}$ |
| 2634 | $L_{A714}$ | $L_{B2}$ |
| 2635 | $L_{A715}$ | $L_{B2}$ |
| 2636 | $L_{A716}$ | $L_{B2}$ |
| 2637 | $L_{A717}$ | $L_{B2}$ |
| 2638 | $L_{A718}$ | $L_{B2}$ |
| 2639 | $L_{A719}$ | $L_{B2}$ |
| 2640 | $L_{A720}$ | $L_{B2}$ |
| 2641 | $L_{A721}$ | $L_{B2}$ |
| 2642 | $L_{A722}$ | $L_{B2}$ |
| 2643 | $L_{A723}$ | $L_{B2}$ |
| 2644 | $L_{A724}$ | $L_{B2}$ |
| 2645 | $L_{A725}$ | $L_{B2}$ |
| 2646 | $L_{A726}$ | $L_{B2}$ |
| 2647 | $L_{A727}$ | $L_{B2}$ |
| 2648 | $L_{A728}$ | $L_{B2}$ |
| 2649 | $L_{A729}$ | $L_{B2}$ |
| 2650 | $L_{A730}$ | $L_{B2}$ |
| 2651 | $L_{A731}$ | $L_{B2}$ |
| 2652 | $L_{A732}$ | $L_{B2}$ |
| 2653 | $L_{A733}$ | $L_{B2}$ |
| 2654 | $L_{A734}$ | $L_{B2}$ |
| 2655 | $L_{A735}$ | $L_{B2}$ |
| 2656 | $L_{A736}$ | $L_{B2}$ |
| 2657 | $L_{A737}$ | $L_{B2}$ |
| 2658 | $L_{A738}$ | $L_{B2}$ |
| 2659 | $L_{A739}$ | $L_{B2}$ |
| 2660 | $L_{A740}$ | $L_{B2}$ |
| 2661 | $L_{A741}$ | $L_{B2}$ |
| 2662 | $L_{A742}$ | $L_{B2}$ |
| 2663 | $L_{A743}$ | $L_{B2}$ |
| 2664 | $L_{A744}$ | $L_{B2}$ |
| 2665 | $L_{A745}$ | $L_{B2}$ |
| 2666 | $L_{A746}$ | $L_{B2}$ |
| 2667 | $L_{A747}$ | $L_{B2}$ |
| 2668 | $L_{A748}$ | $L_{B2}$ |
| 2669 | $L_{A749}$ | $L_{B2}$ |
| 2670 | $L_{A750}$ | $L_{B2}$ |
| 2671 | $L_{A751}$ | $L_{B2}$ |
| 2672 | $L_{A752}$ | $L_{B2}$ |
| 2673 | $L_{A753}$ | $L_{B2}$ |

-continued

| Compound Number | $L_A$ | $L_B$ |
|---|---|---|
| 2674 | $L_{A754}$ | $L_{B2}$ |
| 2675 | $L_{A755}$ | $L_{B2}$ |
| 2676 | $L_{A756}$ | $L_{B2}$ |
| 2677 | $L_{A757}$ | $L_{B2}$ |
| 2678 | $L_{A758}$ | $L_{B2}$ |
| 2679 | $L_{A759}$ | $L_{B2}$ |
| 2680 | $L_{A760}$ | $L_{B2}$ |
| 2681 | $L_{A761}$ | $L_{B2}$ |
| 2682 | $L_{A762}$ | $L_{B2}$ |
| 2683 | $L_{A763}$ | $L_{B2}$ |
| 2684 | $L_{A764}$ | $L_{B2}$ |
| 2685 | $L_{A765}$ | $L_{B2}$ |
| 2686 | $L_{A766}$ | $L_{B2}$ |
| 2687 | $L_{A767}$ | $L_{B2}$ |
| 2688 | $L_{A768}$ | $L_{B2}$ |
| 2689 | $L_{A769}$ | $L_{B2}$ |
| 2690 | $L_{A770}$ | $L_{B2}$ |
| 2691 | $L_{A771}$ | $L_{B2}$ |
| 2692 | $L_{A772}$ | $L_{B2}$ |
| 2693 | $L_{A773}$ | $L_{B2}$ |
| 2694 | $L_{A774}$ | $L_{B2}$ |
| 2695 | $L_{A775}$ | $L_{B2}$ |
| 2696 | $L_{A776}$ | $L_{B2}$ |
| 2697 | $L_{A777}$ | $L_{B2}$ |
| 2698 | $L_{A778}$ | $L_{B2}$ |
| 2699 | $L_{A779}$ | $L_{B2}$ |
| 2700 | $L_{A780}$ | $L_{B2}$ |
| 2701 | $L_{A781}$ | $L_{B2}$ |
| 2702 | $L_{A782}$ | $L_{B2}$ |
| 2703 | $L_{A783}$ | $L_{B2}$ |
| 2704 | $L_{A784}$ | $L_{B2}$ |
| 2705 | $L_{A785}$ | $L_{B2}$ |
| 2706 | $L_{A786}$ | $L_{B2}$ |
| 2707 | $L_{A787}$ | $L_{B2}$ |
| 2708 | $L_{A788}$ | $L_{B2}$ |
| 2709 | $L_{A789}$ | $L_{B2}$ |
| 2710 | $L_{A790}$ | $L_{B2}$ |
| 2711 | $L_{A791}$ | $L_{B2}$ |
| 2712 | $L_{A792}$ | $L_{B2}$ |
| 2713 | $L_{A793}$ | $L_{B2}$ |
| 2714 | $L_{A794}$ | $L_{B2}$ |
| 2715 | $L_{A795}$ | $L_{B2}$ |
| 2716 | $L_{A796}$ | $L_{B2}$ |
| 2717 | $L_{A797}$ | $L_{B2}$ |
| 2718 | $L_{A798}$ | $L_{B2}$ |
| 2719 | $L_{A799}$ | $L_{B2}$ |
| 2720 | $L_{A800}$ | $L_{B2}$ |
| 2721 | $L_{A801}$ | $L_{B2}$ |
| 2722 | $L_{A802}$ | $L_{B2}$ |
| 2723 | $L_{A803}$ | $L_{B2}$ |
| 2724 | $L_{A804}$ | $L_{B2}$ |
| 2725 | $L_{A805}$ | $L_{B2}$ |
| 2726 | $L_{A806}$ | $L_{B2}$ |
| 2727 | $L_{A807}$ | $L_{B2}$ |
| 2728 | $L_{A808}$ | $L_{B2}$ |
| 2729 | $L_{A809}$ | $L_{B2}$ |
| 2730 | $L_{A810}$ | $L_{B2}$ |
| 2731 | $L_{A811}$ | $L_{B2}$ |
| 2732 | $L_{A812}$ | $L_{B2}$ |
| 2733 | $L_{A813}$ | $L_{B2}$ |
| 2734 | $L_{A814}$ | $L_{B2}$ |
| 2735 | $L_{A815}$ | $L_{B2}$ |
| 2736 | $L_{A816}$ | $L_{B2}$ |
| 2737 | $L_{A817}$ | $L_{B2}$ |
| 2738 | $L_{A818}$ | $L_{B2}$ |
| 2739 | $L_{A819}$ | $L_{B2}$ |
| 2740 | $L_{A820}$ | $L_{B2}$ |
| 2741 | $L_{A821}$ | $L_{B2}$ |
| 2742 | $L_{A822}$ | $L_{B2}$ |
| 2743 | $L_{A823}$ | $L_{B2}$ |
| 2744 | $L_{A824}$ | $L_{B2}$ |
| 2745 | $L_{A825}$ | $L_{B2}$ |
| 2746 | $L_{A826}$ | $L_{B2}$ |
| 2747 | $L_{A827}$ | $L_{B2}$ |
| 2748 | $L_{A828}$ | $L_{B2}$ |
| 2749 | $L_{A829}$ | $L_{B2}$ |

-continued

| Compound Number | $L_A$ | $L_B$ |
|---|---|---|
| 2750 | $L_{A830}$ | $L_{B2}$ |
| 2751 | $L_{A831}$ | $L_{B2}$ |
| 2752 | $L_{A832}$ | $L_{B2}$ |
| 2753 | $L_{A833}$ | $L_{B2}$ |
| 2754 | $L_{A834}$ | $L_{B2}$ |
| 2755 | $L_{A835}$ | $L_{B2}$ |
| 2756 | $L_{A836}$ | $L_{B2}$ |
| 2757 | $L_{A837}$ | $L_{B2}$ |
| 2758 | $L_{A838}$ | $L_{B2}$ |
| 2759 | $L_{A839}$ | $L_{B2}$ |
| 2760 | $L_{A840}$ | $L_{B2}$ |
| 2761 | $L_{A841}$ | $L_{B2}$ |
| 2762 | $L_{A842}$ | $L_{B2}$ |
| 2763 | $L_{A843}$ | $L_{B2}$ |
| 2764 | $L_{A844}$ | $L_{B2}$ |
| 2765 | $L_{A845}$ | $L_{B2}$ |
| 2766 | $L_{A846}$ | $L_{B2}$ |
| 2767 | $L_{A847}$ | $L_{B2}$ |
| 2768 | $L_{A848}$ | $L_{B2}$ |
| 2769 | $L_{A849}$ | $L_{B2}$ |
| 2770 | $L_{A850}$ | $L_{B2}$ |
| 2771 | $L_{A851}$ | $L_{B2}$ |
| 2772 | $L_{A852}$ | $L_{B2}$ |
| 2773 | $L_{A853}$ | $L_{B2}$ |
| 2774 | $L_{A854}$ | $L_{B2}$ |
| 2775 | $L_{A855}$ | $L_{B2}$ |
| 2776 | $L_{A856}$ | $L_{B2}$ |
| 2777 | $L_{A857}$ | $L_{B2}$ |
| 2778 | $L_{A858}$ | $L_{B2}$ |
| 2779 | $L_{A859}$ | $L_{B2}$ |
| 2780 | $L_{A860}$ | $L_{B2}$ |
| 2781 | $L_{A861}$ | $L_{B2}$ |
| 2782 | $L_{A862}$ | $L_{B2}$ |
| 2783 | $L_{A863}$ | $L_{B2}$ |
| 2784 | $L_{A864}$ | $L_{B2}$ |
| 2785 | $L_{A865}$ | $L_{B2}$ |
| 2786 | $L_{A866}$ | $L_{B2}$ |
| 2787 | $L_{A867}$ | $L_{B2}$ |
| 2788 | $L_{A868}$ | $L_{B2}$ |
| 2789 | $L_{A869}$ | $L_{B2}$ |
| 2790 | $L_{A870}$ | $L_{B2}$ |
| 2791 | $L_{A871}$ | $L_{B2}$ |
| 2792 | $L_{A872}$ | $L_{B2}$ |
| 2793 | $L_{A873}$ | $L_{B2}$ |
| 2794 | $L_{A874}$ | $L_{B2}$ |
| 2795 | $L_{A875}$ | $L_{B2}$ |
| 2796 | $L_{A876}$ | $L_{B2}$ |
| 2797 | $L_{A877}$ | $L_{B2}$ |
| 2798 | $L_{A878}$ | $L_{B2}$ |
| 2799 | $L_{A879}$ | $L_{B2}$ |
| 2800 | $L_{A880}$ | $L_{B2}$ |
| 2801 | $L_{A881}$ | $L_{B2}$ |
| 2802 | $L_{A882}$ | $L_{B2}$ |
| 2803 | $L_{A883}$ | $L_{B2}$ |
| 2804 | $L_{A884}$ | $L_{B2}$ |
| 2805 | $L_{A885}$ | $L_{B2}$ |
| 2806 | $L_{A886}$ | $L_{B2}$ |
| 2807 | $L_{A887}$ | $L_{B2}$ |
| 2808 | $L_{A888}$ | $L_{B2}$ |
| 2809 | $L_{A889}$ | $L_{B2}$ |
| 2810 | $L_{A890}$ | $L_{B2}$ |
| 2811 | $L_{A891}$ | $L_{B2}$ |
| 2812 | $L_{A892}$ | $L_{B2}$ |
| 2813 | $L_{A893}$ | $L_{B2}$ |
| 2814 | $L_{A894}$ | $L_{B2}$ |
| 2815 | $L_{A895}$ | $L_{B2}$ |
| 2816 | $L_{A896}$ | $L_{B2}$ |
| 2817 | $L_{A897}$ | $L_{B2}$ |
| 2818 | $L_{A898}$ | $L_{B2}$ |
| 2819 | $L_{A899}$ | $L_{B2}$ |
| 2820 | $L_{A900}$ | $L_{B2}$ |
| 2821 | $L_{A901}$ | $L_{B2}$ |
| 2822 | $L_{A902}$ | $L_{B2}$ |
| 2823 | $L_{A903}$ | $L_{B2}$ |
| 2824 | $L_{A904}$ | $L_{B2}$ |
| 2825 | $L_{A905}$ | $L_{B2}$ |

-continued

| Compound Number | $L_A$ | $L_B$ |
|---|---|---|
| 2826 | $L_{A906}$ | $L_{B2}$ |
| 2827 | $L_{A907}$ | $L_{B2}$ |
| 2828 | $L_{A908}$ | $L_{B2}$ |
| 2829 | $L_{A909}$ | $L_{B2}$ |
| 2830 | $L_{A910}$ | $L_{B2}$ |
| 2831 | $L_{A911}$ | $L_{B2}$ |
| 2832 | $L_{A912}$ | $L_{B2}$ |
| 2833 | $L_{A913}$ | $L_{B2}$ |
| 2834 | $L_{A914}$ | $L_{B2}$ |
| 2835 | $L_{A915}$ | $L_{B2}$ |
| 2836 | $L_{A916}$ | $L_{B2}$ |
| 2837 | $L_{A917}$ | $L_{B2}$ |
| 2838 | $L_{A918}$ | $L_{B2}$ |
| 2839 | $L_{A919}$ | $L_{B2}$ |
| 2840 | $L_{A920}$ | $L_{B2}$ |
| 2841 | $L_{A921}$ | $L_{B2}$ |
| 2842 | $L_{A922}$ | $L_{B2}$ |
| 2843 | $L_{A923}$ | $L_{B2}$ |
| 2844 | $L_{A924}$ | $L_{B2}$ |
| 2845 | $L_{A925}$ | $L_{B2}$ |
| 2846 | $L_{A926}$ | $L_{B2}$ |
| 2847 | $L_{A927}$ | $L_{B2}$ |
| 2848 | $L_{A928}$ | $L_{B2}$ |
| 2849 | $L_{A929}$ | $L_{B2}$ |
| 2850 | $L_{A930}$ | $L_{B2}$ |
| 2851 | $L_{A931}$ | $L_{B2}$ |
| 2852 | $L_{A932}$ | $L_{B2}$ |
| 2853 | $L_{A933}$ | $L_{B2}$ |
| 2854 | $L_{A934}$ | $L_{B2}$ |
| 2855 | $L_{A935}$ | $L_{B2}$ |
| 2856 | $L_{A936}$ | $L_{B2}$ |
| 2857 | $L_{A937}$ | $L_{B2}$ |
| 2858 | $L_{A938}$ | $L_{B2}$ |
| 2859 | $L_{A939}$ | $L_{B2}$ |
| 2860 | $L_{A940}$ | $L_{B2}$ |
| 2861 | $L_{A941}$ | $L_{B2}$ |
| 2862 | $L_{A942}$ | $L_{B2}$ |
| 2863 | $L_{A943}$ | $L_{B2}$ |
| 2864 | $L_{A944}$ | $L_{B2}$ |
| 2865 | $L_{A945}$ | $L_{B2}$ |
| 2866 | $L_{A946}$ | $L_{B2}$ |
| 2867 | $L_{A947}$ | $L_{B2}$ |
| 2868 | $L_{A948}$ | $L_{B2}$ |
| 2869 | $L_{A949}$ | $L_{B2}$ |
| 2870 | $L_{A950}$ | $L_{B2}$ |
| 2871 | $L_{A951}$ | $L_{B2}$ |
| 2872 | $L_{A952}$ | $L_{B2}$ |
| 2873 | $L_{A953}$ | $L_{B2}$ |
| 2874 | $L_{A954}$ | $L_{B2}$ |
| 2875 | $L_{A955}$ | $L_{B2}$ |
| 2876 | $L_{A956}$ | $L_{B2}$ |
| 2877 | $L_{A957}$ | $L_{B2}$ |
| 2878 | $L_{A958}$ | $L_{B2}$ |
| 2879 | $L_{A959}$ | $L_{B2}$ |
| 2880 | $L_{A960}$ | $L_{B2}$ |
| 2881 | $L_{A1}$ | $L_{B5}$ |
| 2882 | $L_{A2}$ | $L_{B5}$ |
| 2883 | $L_{A3}$ | $L_{B5}$ |
| 2884 | $L_{A4}$ | $L_{B5}$ |
| 2885 | $L_{A5}$ | $L_{B5}$ |
| 2886 | $L_{A6}$ | $L_{B5}$ |
| 2887 | $L_{A7}$ | $L_{B5}$ |
| 2888 | $L_{A8}$ | $L_{B5}$ |
| 2889 | $L_{A9}$ | $L_{B5}$ |
| 2890 | $L_{A10}$ | $L_{B5}$ |
| 2891 | $L_{A11}$ | $L_{B5}$ |
| 2892 | $L_{A12}$ | $L_{B5}$ |
| 2893 | $L_{A13}$ | $L_{B5}$ |
| 2894 | $L_{A14}$ | $L_{B5}$ |
| 2895 | $L_{A15}$ | $L_{B5}$ |
| 2896 | $L_{A16}$ | $L_{B5}$ |
| 2897 | $L_{A17}$ | $L_{B5}$ |
| 2898 | $L_{A18}$ | $L_{B5}$ |
| 2899 | $L_{A19}$ | $L_{B5}$ |
| 2900 | $L_{A20}$ | $L_{B5}$ |
| 2901 | $L_{A21}$ | $L_{B5}$ |

| Compound Number | $L_A$ | $L_B$ |
|---|---|---|
| 2902 | $L_{A22}$ | $L_{B5}$ |
| 2903 | $L_{A23}$ | $L_{B5}$ |
| 2904 | $L_{A24}$ | $L_{B5}$ |
| 2905 | $L_{A25}$ | $L_{B5}$ |
| 2906 | $L_{A26}$ | $L_{B5}$ |
| 2907 | $L_{A27}$ | $L_{B5}$ |
| 2908 | $L_{A28}$ | $L_{B5}$ |
| 2909 | $L_{A29}$ | $L_{B5}$ |
| 2910 | $L_{A30}$ | $L_{B5}$ |
| 2911 | $L_{A31}$ | $L_{B5}$ |
| 2912 | $L_{A32}$ | $L_{B5}$ |
| 2913 | $L_{A33}$ | $L_{B5}$ |
| 2914 | $L_{A34}$ | $L_{B5}$ |
| 2915 | $L_{A35}$ | $L_{B5}$ |
| 2916 | $L_{A36}$ | $L_{B5}$ |
| 2917 | $L_{A37}$ | $L_{B5}$ |
| 2918 | $L_{A38}$ | $L_{B5}$ |
| 2919 | $L_{A39}$ | $L_{B5}$ |
| 2920 | $L_{A40}$ | $L_{B5}$ |
| 2921 | $L_{A41}$ | $L_{B5}$ |
| 2922 | $L_{A42}$ | $L_{B5}$ |
| 2923 | $L_{A43}$ | $L_{B5}$ |
| 2924 | $L_{A44}$ | $L_{B5}$ |
| 2925 | $L_{A45}$ | $L_{B5}$ |
| 2926 | $L_{A46}$ | $L_{B5}$ |
| 2927 | $L_{A47}$ | $L_{B5}$ |
| 2928 | $L_{A48}$ | $L_{B5}$ |
| 2929 | $L_{A49}$ | $L_{B5}$ |
| 2930 | $L_{A50}$ | $L_{B5}$ |
| 2931 | $L_{A51}$ | $L_{B5}$ |
| 2932 | $L_{A52}$ | $L_{B5}$ |
| 2933 | $L_{A53}$ | $L_{B5}$ |
| 2934 | $L_{A54}$ | $L_{B5}$ |
| 2935 | $L_{A55}$ | $L_{B5}$ |
| 2936 | $L_{A56}$ | $L_{B5}$ |
| 2937 | $L_{A57}$ | $L_{B5}$ |
| 2938 | $L_{A58}$ | $L_{B5}$ |
| 2939 | $L_{A59}$ | $L_{B5}$ |
| 2940 | $L_{A60}$ | $L_{B5}$ |
| 2941 | $L_{A61}$ | $L_{B5}$ |
| 2942 | $L_{A62}$ | $L_{B5}$ |
| 2943 | $L_{A63}$ | $L_{B5}$ |
| 2944 | $L_{A64}$ | $L_{B5}$ |
| 2945 | $L_{A65}$ | $L_{B5}$ |
| 2946 | $L_{A66}$ | $L_{B5}$ |
| 2947 | $L_{A67}$ | $L_{B5}$ |
| 2948 | $L_{A68}$ | $L_{B5}$ |
| 2949 | $L_{A69}$ | $L_{B5}$ |
| 2950 | $L_{A70}$ | $L_{B5}$ |
| 2951 | $L_{A71}$ | $L_{B5}$ |
| 2952 | $L_{A72}$ | $L_{B5}$ |
| 2953 | $L_{A73}$ | $L_{B5}$ |
| 2954 | $L_{A74}$ | $L_{B5}$ |
| 2955 | $L_{A75}$ | $L_{B5}$ |
| 2956 | $L_{A76}$ | $L_{B5}$ |
| 2957 | $L_{A77}$ | $L_{B5}$ |
| 2958 | $L_{A78}$ | $L_{B5}$ |
| 2959 | $L_{A79}$ | $L_{B5}$ |
| 2960 | $L_{A80}$ | $L_{B5}$ |
| 2961 | $L_{A81}$ | $L_{B5}$ |
| 2962 | $L_{A82}$ | $L_{B5}$ |
| 2963 | $L_{A83}$ | $L_{B5}$ |
| 2964 | $L_{A84}$ | $L_{B5}$ |
| 2965 | $L_{A85}$ | $L_{B5}$ |
| 2966 | $L_{A86}$ | $L_{B5}$ |
| 2967 | $L_{A87}$ | $L_{B5}$ |
| 2968 | $L_{A88}$ | $L_{B5}$ |
| 2969 | $L_{A89}$ | $L_{B5}$ |
| 2970 | $L_{A90}$ | $L_{B5}$ |
| 2971 | $L_{A91}$ | $L_{B5}$ |
| 2972 | $L_{A92}$ | $L_{B5}$ |
| 2973 | $L_{A93}$ | $L_{B5}$ |
| 2974 | $L_{A94}$ | $L_{B5}$ |
| 2975 | $L_{A95}$ | $L_{B5}$ |
| 2976 | $L_{A96}$ | $L_{B5}$ |
| 2977 | $L_{A97}$ | $L_{B5}$ |

| Compound Number | $L_A$ | $L_B$ |
|---|---|---|
| 2978 | $L_{A98}$ | $L_{B5}$ |
| 2979 | $L_{A99}$ | $L_{B5}$ |
| 2980 | $L_{A100}$ | $L_{B5}$ |
| 2981 | $L_{A101}$ | $L_{B5}$ |
| 2982 | $L_{A102}$ | $L_{B5}$ |
| 2983 | $L_{A103}$ | $L_{B5}$ |
| 2984 | $L_{A104}$ | $L_{B5}$ |
| 2985 | $L_{A105}$ | $L_{B5}$ |
| 2986 | $L_{A106}$ | $L_{B5}$ |
| 2987 | $L_{A107}$ | $L_{B5}$ |
| 2988 | $L_{A108}$ | $L_{B5}$ |
| 2989 | $L_{A109}$ | $L_{B5}$ |
| 2990 | $L_{A110}$ | $L_{B5}$ |
| 2991 | $L_{A111}$ | $L_{B5}$ |
| 2992 | $L_{A112}$ | $L_{B5}$ |
| 2993 | $L_{A113}$ | $L_{B5}$ |
| 2994 | $L_{A114}$ | $L_{B5}$ |
| 2995 | $L_{A115}$ | $L_{B5}$ |
| 2996 | $L_{A116}$ | $L_{B5}$ |
| 2997 | $L_{A117}$ | $L_{B5}$ |
| 2998 | $L_{A118}$ | $L_{B5}$ |
| 2999 | $L_{A119}$ | $L_{B5}$ |
| 3000 | $L_{A120}$ | $L_{B5}$ |
| 3001 | $L_{A121}$ | $L_{B5}$ |
| 3002 | $L_{A122}$ | $L_{B5}$ |
| 3003 | $L_{A123}$ | $L_{B5}$ |
| 3004 | $L_{A124}$ | $L_{B5}$ |
| 3005 | $L_{A125}$ | $L_{B5}$ |
| 3006 | $L_{A126}$ | $L_{B5}$ |
| 3007 | $L_{A127}$ | $L_{B5}$ |
| 3008 | $L_{A128}$ | $L_{B5}$ |
| 3009 | $L_{A129}$ | $L_{B5}$ |
| 3010 | $L_{A130}$ | $L_{B5}$ |
| 3011 | $L_{A131}$ | $L_{B5}$ |
| 3012 | $L_{A132}$ | $L_{B5}$ |
| 3013 | $L_{A133}$ | $L_{B5}$ |
| 3014 | $L_{A134}$ | $L_{B5}$ |
| 3015 | $L_{A135}$ | $L_{B5}$ |
| 3016 | $L_{A136}$ | $L_{B5}$ |
| 3017 | $L_{A137}$ | $L_{B5}$ |
| 3018 | $L_{A138}$ | $L_{B5}$ |
| 3019 | $L_{A139}$ | $L_{B5}$ |
| 3020 | $L_{A140}$ | $L_{B5}$ |
| 3021 | $L_{A141}$ | $L_{B5}$ |
| 3022 | $L_{A142}$ | $L_{B5}$ |
| 3023 | $L_{A143}$ | $L_{B5}$ |
| 3024 | $L_{A144}$ | $L_{B5}$ |
| 3025 | $L_{A145}$ | $L_{B5}$ |
| 3026 | $L_{A146}$ | $L_{B5}$ |
| 3027 | $L_{A147}$ | $L_{B5}$ |
| 3028 | $L_{A148}$ | $L_{B5}$ |
| 3029 | $L_{A149}$ | $L_{B5}$ |
| 3030 | $L_{A150}$ | $L_{B5}$ |
| 3031 | $L_{A151}$ | $L_{B5}$ |
| 3032 | $L_{A152}$ | $L_{B5}$ |
| 3033 | $L_{A153}$ | $L_{B5}$ |
| 3034 | $L_{A154}$ | $L_{B5}$ |
| 3035 | $L_{A155}$ | $L_{B5}$ |
| 3036 | $L_{A156}$ | $L_{B5}$ |
| 3037 | $L_{A157}$ | $L_{B5}$ |
| 3038 | $L_{A158}$ | $L_{B5}$ |
| 3039 | $L_{A159}$ | $L_{B5}$ |
| 3040 | $L_{A160}$ | $L_{B5}$ |
| 3041 | $L_{A161}$ | $L_{B5}$ |
| 3042 | $L_{A162}$ | $L_{B5}$ |
| 3043 | $L_{A163}$ | $L_{B5}$ |
| 3044 | $L_{A164}$ | $L_{B5}$ |
| 3045 | $L_{A165}$ | $L_{B5}$ |
| 3046 | $L_{A166}$ | $L_{B5}$ |
| 3047 | $L_{A167}$ | $L_{B5}$ |
| 3048 | $L_{A168}$ | $L_{B5}$ |
| 3049 | $L_{A169}$ | $L_{B5}$ |
| 3050 | $L_{A170}$ | $L_{B5}$ |
| 3051 | $L_{A171}$ | $L_{B5}$ |
| 3052 | $L_{A172}$ | $L_{B5}$ |
| 3053 | $L_{A173}$ | $L_{B5}$ |

-continued

| Compound Number | $L_A$ | $L_B$ |
| --- | --- | --- |
| 3054 | $L_{A174}$ | $L_{B5}$ |
| 3055 | $L_{A175}$ | $L_{B5}$ |
| 3056 | $L_{A176}$ | $L_{B5}$ |
| 3057 | $L_{A177}$ | $L_{B5}$ |
| 3058 | $L_{A178}$ | $L_{B5}$ |
| 3059 | $L_{A179}$ | $L_{B5}$ |
| 3060 | $L_{A180}$ | $L_{B5}$ |
| 3061 | $L_{A181}$ | $L_{B5}$ |
| 3062 | $L_{A182}$ | $L_{B5}$ |
| 3063 | $L_{A183}$ | $L_{B5}$ |
| 3064 | $L_{A184}$ | $L_{B5}$ |
| 3065 | $L_{A185}$ | $L_{B5}$ |
| 3066 | $L_{A186}$ | $L_{B5}$ |
| 3067 | $L_{A187}$ | $L_{B5}$ |
| 3068 | $L_{A188}$ | $L_{B5}$ |
| 3069 | $L_{A189}$ | $L_{B5}$ |
| 3070 | $L_{A190}$ | $L_{B5}$ |
| 3071 | $L_{A191}$ | $L_{B5}$ |
| 3072 | $L_{A192}$ | $L_{B5}$ |
| 3073 | $L_{A193}$ | $L_{B5}$ |
| 3074 | $L_{A194}$ | $L_{B5}$ |
| 3075 | $L_{A195}$ | $L_{B5}$ |
| 3076 | $L_{A196}$ | $L_{B5}$ |
| 3077 | $L_{A197}$ | $L_{B5}$ |
| 3078 | $L_{A198}$ | $L_{B5}$ |
| 3079 | $L_{A199}$ | $L_{B5}$ |
| 3080 | $L_{A200}$ | $L_{B5}$ |
| 3081 | $L_{A201}$ | $L_{B5}$ |
| 3082 | $L_{A202}$ | $L_{B5}$ |
| 3083 | $L_{A203}$ | $L_{B5}$ |
| 3084 | $L_{A204}$ | $L_{B5}$ |
| 3085 | $L_{A205}$ | $L_{B5}$ |
| 3086 | $L_{A206}$ | $L_{B5}$ |
| 3087 | $L_{A207}$ | $L_{B5}$ |
| 3088 | $L_{A208}$ | $L_{B5}$ |
| 3089 | $L_{A209}$ | $L_{B5}$ |
| 3090 | $L_{A210}$ | $L_{B5}$ |
| 3091 | $L_{A211}$ | $L_{B5}$ |
| 3092 | $L_{A212}$ | $L_{B5}$ |
| 3093 | $L_{A213}$ | $L_{B5}$ |
| 3094 | $L_{A214}$ | $L_{B5}$ |
| 3095 | $L_{A215}$ | $L_{B5}$ |
| 3096 | $L_{A216}$ | $L_{B5}$ |
| 3097 | $L_{A217}$ | $L_{B5}$ |
| 3098 | $L_{A218}$ | $L_{B5}$ |
| 3099 | $L_{A219}$ | $L_{B5}$ |
| 3100 | $L_{A220}$ | $L_{B5}$ |
| 3101 | $L_{A221}$ | $L_{B5}$ |
| 3102 | $L_{A222}$ | $L_{B5}$ |
| 3103 | $L_{A223}$ | $L_{B5}$ |
| 3104 | $L_{A224}$ | $L_{B5}$ |
| 3105 | $L_{A225}$ | $L_{B5}$ |
| 3106 | $L_{A226}$ | $L_{B5}$ |
| 3107 | $L_{A227}$ | $L_{B5}$ |
| 3108 | $L_{A228}$ | $L_{B5}$ |
| 3109 | $L_{A229}$ | $L_{B5}$ |
| 3110 | $L_{A230}$ | $L_{B5}$ |
| 3111 | $L_{A231}$ | $L_{B5}$ |
| 3112 | $L_{A232}$ | $L_{B5}$ |
| 3113 | $L_{A233}$ | $L_{B5}$ |
| 3114 | $L_{A234}$ | $L_{B5}$ |
| 3115 | $L_{A235}$ | $L_{B5}$ |
| 3116 | $L_{A236}$ | $L_{B5}$ |
| 3117 | $L_{A237}$ | $L_{B5}$ |
| 3118 | $L_{A238}$ | $L_{B5}$ |
| 3119 | $L_{A239}$ | $L_{B5}$ |
| 3120 | $L_{A240}$ | $L_{B5}$ |
| 3121 | $L_{A241}$ | $L_{B5}$ |
| 3122 | $L_{A242}$ | $L_{B5}$ |
| 3123 | $L_{A243}$ | $L_{B5}$ |
| 3124 | $L_{A244}$ | $L_{B5}$ |
| 3125 | $L_{A245}$ | $L_{B5}$ |
| 3126 | $L_{A246}$ | $L_{B5}$ |
| 3127 | $L_{A247}$ | $L_{B5}$ |
| 3128 | $L_{A248}$ | $L_{B5}$ |
| 3129 | $L_{A249}$ | $L_{B5}$ |

-continued

| Compound Number | $L_A$ | $L_B$ |
| --- | --- | --- |
| 3130 | $L_{A250}$ | $L_{B5}$ |
| 3131 | $L_{A251}$ | $L_{B5}$ |
| 3132 | $L_{A252}$ | $L_{B5}$ |
| 3133 | $L_{A253}$ | $L_{B5}$ |
| 3134 | $L_{A254}$ | $L_{B5}$ |
| 3135 | $L_{A255}$ | $L_{B5}$ |
| 3136 | $L_{A256}$ | $L_{B5}$ |
| 3137 | $L_{A257}$ | $L_{B5}$ |
| 3138 | $L_{A258}$ | $L_{B5}$ |
| 3139 | $L_{A259}$ | $L_{B5}$ |
| 3140 | $L_{A260}$ | $L_{B5}$ |
| 3141 | $L_{A261}$ | $L_{B5}$ |
| 3142 | $L_{A262}$ | $L_{B5}$ |
| 3143 | $L_{A263}$ | $L_{B5}$ |
| 3144 | $L_{A264}$ | $L_{B5}$ |
| 3145 | $L_{A265}$ | $L_{B5}$ |
| 3146 | $L_{A266}$ | $L_{B5}$ |
| 3147 | $L_{A267}$ | $L_{B5}$ |
| 3148 | $L_{A268}$ | $L_{B5}$ |
| 3149 | $L_{A269}$ | $L_{B5}$ |
| 3150 | $L_{A270}$ | $L_{B5}$ |
| 3151 | $L_{A271}$ | $L_{B5}$ |
| 3152 | $L_{A272}$ | $L_{B5}$ |
| 3153 | $L_{A273}$ | $L_{B5}$ |
| 3154 | $L_{A274}$ | $L_{B5}$ |
| 3155 | $L_{A275}$ | $L_{B5}$ |
| 3156 | $L_{A276}$ | $L_{B5}$ |
| 3157 | $L_{A277}$ | $L_{B5}$ |
| 3158 | $L_{A278}$ | $L_{B5}$ |
| 3159 | $L_{A279}$ | $L_{B5}$ |
| 3160 | $L_{A280}$ | $L_{B5}$ |
| 3161 | $L_{A281}$ | $L_{B5}$ |
| 3162 | $L_{A282}$ | $L_{B5}$ |
| 3163 | $L_{A283}$ | $L_{B5}$ |
| 3164 | $L_{A284}$ | $L_{B5}$ |
| 3165 | $L_{A285}$ | $L_{B5}$ |
| 3166 | $L_{A286}$ | $L_{B5}$ |
| 3167 | $L_{A287}$ | $L_{B5}$ |
| 3168 | $L_{A288}$ | $L_{B5}$ |
| 3169 | $L_{A289}$ | $L_{B5}$ |
| 3170 | $L_{A290}$ | $L_{B5}$ |
| 3171 | $L_{A291}$ | $L_{B5}$ |
| 3172 | $L_{A292}$ | $L_{B5}$ |
| 3173 | $L_{A293}$ | $L_{B5}$ |
| 3174 | $L_{A294}$ | $L_{B5}$ |
| 3175 | $L_{A295}$ | $L_{B5}$ |
| 3176 | $L_{A296}$ | $L_{B5}$ |
| 3177 | $L_{A297}$ | $L_{B5}$ |
| 3178 | $L_{A298}$ | $L_{B5}$ |
| 3179 | $L_{A299}$ | $L_{B5}$ |
| 3180 | $L_{A300}$ | $L_{B5}$ |
| 3181 | $L_{A301}$ | $L_{B5}$ |
| 3182 | $L_{A302}$ | $L_{B5}$ |
| 3183 | $L_{A303}$ | $L_{B5}$ |
| 3184 | $L_{A304}$ | $L_{B5}$ |
| 3185 | $L_{A305}$ | $L_{B5}$ |
| 3186 | $L_{A306}$ | $L_{B5}$ |
| 3187 | $L_{A307}$ | $L_{B5}$ |
| 3188 | $L_{A308}$ | $L_{B5}$ |
| 3189 | $L_{A309}$ | $L_{B5}$ |
| 3190 | $L_{A310}$ | $L_{B5}$ |
| 3191 | $L_{A311}$ | $L_{B5}$ |
| 3192 | $L_{A312}$ | $L_{B5}$ |
| 3193 | $L_{A313}$ | $L_{B5}$ |
| 3194 | $L_{A314}$ | $L_{B5}$ |
| 3195 | $L_{A315}$ | $L_{B5}$ |
| 3196 | $L_{A316}$ | $L_{B5}$ |
| 3197 | $L_{A317}$ | $L_{B5}$ |
| 3198 | $L_{A318}$ | $L_{B5}$ |
| 3199 | $L_{A319}$ | $L_{B5}$ |
| 3200 | $L_{A320}$ | $L_{B5}$ |
| 3201 | $L_{A321}$ | $L_{B5}$ |
| 3202 | $L_{A322}$ | $L_{B5}$ |
| 3203 | $L_{A323}$ | $L_{B5}$ |
| 3204 | $L_{A324}$ | $L_{B5}$ |
| 3205 | $L_{A325}$ | $L_{B5}$ |

-continued

| Compound Number | $L_A$ | $L_B$ |
|---|---|---|
| 3206 | $L_{A326}$ | $L_{B5}$ |
| 3207 | $L_{A327}$ | $L_{B5}$ |
| 3208 | $L_{A328}$ | $L_{B5}$ |
| 3209 | $L_{A329}$ | $L_{B5}$ |
| 3210 | $L_{A330}$ | $L_{B5}$ |
| 3211 | $L_{A331}$ | $L_{B5}$ |
| 3212 | $L_{A332}$ | $L_{B5}$ |
| 3213 | $L_{A333}$ | $L_{B5}$ |
| 3214 | $L_{A334}$ | $L_{B5}$ |
| 3215 | $L_{A335}$ | $L_{B5}$ |
| 3216 | $L_{A336}$ | $L_{B5}$ |
| 3217 | $L_{A337}$ | $L_{B5}$ |
| 3218 | $L_{A338}$ | $L_{B5}$ |
| 3219 | $L_{A339}$ | $L_{B5}$ |
| 3220 | $L_{A340}$ | $L_{B5}$ |
| 3221 | $L_{A341}$ | $L_{B5}$ |
| 3222 | $L_{A342}$ | $L_{B5}$ |
| 3223 | $L_{A343}$ | $L_{B5}$ |
| 3224 | $L_{A344}$ | $L_{B5}$ |
| 3225 | $L_{A345}$ | $L_{B5}$ |
| 3226 | $L_{A346}$ | $L_{B5}$ |
| 3227 | $L_{A347}$ | $L_{B5}$ |
| 3228 | $L_{A348}$ | $L_{B5}$ |
| 3229 | $L_{A349}$ | $L_{B5}$ |
| 3230 | $L_{A350}$ | $L_{B5}$ |
| 3231 | $L_{A351}$ | $L_{B5}$ |
| 3232 | $L_{A352}$ | $L_{B5}$ |
| 3233 | $L_{A353}$ | $L_{B5}$ |
| 3234 | $L_{A354}$ | $L_{B5}$ |
| 3235 | $L_{A355}$ | $L_{B5}$ |
| 3236 | $L_{A356}$ | $L_{B5}$ |
| 3237 | $L_{A357}$ | $L_{B5}$ |
| 3238 | $L_{A358}$ | $L_{B5}$ |
| 3239 | $L_{A359}$ | $L_{B5}$ |
| 3240 | $L_{A360}$ | $L_{B5}$ |
| 3241 | $L_{A361}$ | $L_{B5}$ |
| 3242 | $L_{A362}$ | $L_{B5}$ |
| 3243 | $L_{A363}$ | $L_{B5}$ |
| 3244 | $L_{A364}$ | $L_{B5}$ |
| 3245 | $L_{A365}$ | $L_{B5}$ |
| 3246 | $L_{A366}$ | $L_{B5}$ |
| 3247 | $L_{A367}$ | $L_{B5}$ |
| 3248 | $L_{A368}$ | $L_{B5}$ |
| 3249 | $L_{A369}$ | $L_{B5}$ |
| 3250 | $L_{A370}$ | $L_{B5}$ |
| 3251 | $L_{A371}$ | $L_{B5}$ |
| 3252 | $L_{A372}$ | $L_{B5}$ |
| 3253 | $L_{A373}$ | $L_{B5}$ |
| 3254 | $L_{A374}$ | $L_{B5}$ |
| 3255 | $L_{A375}$ | $L_{B5}$ |
| 3256 | $L_{A376}$ | $L_{B5}$ |
| 3257 | $L_{A377}$ | $L_{B5}$ |
| 3258 | $L_{A378}$ | $L_{B5}$ |
| 3259 | $L_{A379}$ | $L_{B5}$ |
| 3260 | $L_{A380}$ | $L_{B5}$ |
| 3261 | $L_{A381}$ | $L_{B5}$ |
| 3262 | $L_{A382}$ | $L_{B5}$ |
| 3263 | $L_{A383}$ | $L_{B5}$ |
| 3264 | $L_{A384}$ | $L_{B5}$ |
| 3265 | $L_{A385}$ | $L_{B5}$ |
| 3266 | $L_{A386}$ | $L_{B5}$ |
| 3267 | $L_{A387}$ | $L_{B5}$ |
| 3268 | $L_{A388}$ | $L_{B5}$ |
| 3269 | $L_{A389}$ | $L_{B5}$ |
| 3270 | $L_{A390}$ | $L_{B5}$ |
| 3271 | $L_{A391}$ | $L_{B5}$ |
| 3272 | $L_{A392}$ | $L_{B5}$ |
| 3273 | $L_{A393}$ | $L_{B5}$ |
| 3274 | $L_{A394}$ | $L_{B5}$ |
| 3275 | $L_{A395}$ | $L_{B5}$ |
| 3276 | $L_{A396}$ | $L_{B5}$ |
| 3277 | $L_{A397}$ | $L_{B5}$ |
| 3278 | $L_{A398}$ | $L_{B5}$ |
| 3279 | $L_{A399}$ | $L_{B5}$ |
| 3280 | $L_{A400}$ | $L_{B5}$ |
| 3281 | $L_{A401}$ | $L_{B5}$ |

-continued

| Compound Number | $L_A$ | $L_B$ |
|---|---|---|
| 3282 | $L_{A402}$ | $L_{B5}$ |
| 3283 | $L_{A403}$ | $L_{B5}$ |
| 3284 | $L_{A404}$ | $L_{B5}$ |
| 3285 | $L_{A405}$ | $L_{B5}$ |
| 3286 | $L_{A406}$ | $L_{B5}$ |
| 3287 | $L_{A407}$ | $L_{B5}$ |
| 3288 | $L_{A408}$ | $L_{B5}$ |
| 3289 | $L_{A409}$ | $L_{B5}$ |
| 3290 | $L_{A410}$ | $L_{B5}$ |
| 3291 | $L_{A411}$ | $L_{B5}$ |
| 3292 | $L_{A412}$ | $L_{B5}$ |
| 3293 | $L_{A413}$ | $L_{B5}$ |
| 3294 | $L_{A414}$ | $L_{B5}$ |
| 3295 | $L_{A415}$ | $L_{B5}$ |
| 3296 | $L_{A416}$ | $L_{B5}$ |
| 3297 | $L_{A417}$ | $L_{B5}$ |
| 3298 | $L_{A418}$ | $L_{B5}$ |
| 3299 | $L_{A419}$ | $L_{B5}$ |
| 3300 | $L_{A420}$ | $L_{B5}$ |
| 3301 | $L_{A421}$ | $L_{B5}$ |
| 3302 | $L_{A422}$ | $L_{B5}$ |
| 3303 | $L_{A423}$ | $L_{B5}$ |
| 3304 | $L_{A424}$ | $L_{B5}$ |
| 3305 | $L_{A425}$ | $L_{B5}$ |
| 3306 | $L_{A426}$ | $L_{B5}$ |
| 3307 | $L_{A427}$ | $L_{B5}$ |
| 3308 | $L_{A428}$ | $L_{B5}$ |
| 3309 | $L_{A429}$ | $L_{B5}$ |
| 3310 | $L_{A430}$ | $L_{B5}$ |
| 3311 | $L_{A431}$ | $L_{B5}$ |
| 3312 | $L_{A432}$ | $L_{B5}$ |
| 3313 | $L_{A433}$ | $L_{B5}$ |
| 3314 | $L_{A434}$ | $L_{B5}$ |
| 3315 | $L_{A435}$ | $L_{B5}$ |
| 3316 | $L_{A436}$ | $L_{B5}$ |
| 3317 | $L_{A437}$ | $L_{B5}$ |
| 3318 | $L_{A438}$ | $L_{B5}$ |
| 3319 | $L_{A439}$ | $L_{B5}$ |
| 3320 | $L_{A440}$ | $L_{B5}$ |
| 3321 | $L_{A441}$ | $L_{B5}$ |
| 3322 | $L_{A442}$ | $L_{B5}$ |
| 3323 | $L_{A443}$ | $L_{B5}$ |
| 3324 | $L_{A444}$ | $L_{B5}$ |
| 3325 | $L_{A445}$ | $L_{B5}$ |
| 3326 | $L_{A446}$ | $L_{B5}$ |
| 3327 | $L_{A447}$ | $L_{B5}$ |
| 3328 | $L_{A448}$ | $L_{B5}$ |
| 3329 | $L_{A449}$ | $L_{B5}$ |
| 3330 | $L_{A450}$ | $L_{B5}$ |
| 3331 | $L_{A451}$ | $L_{B5}$ |
| 3332 | $L_{A452}$ | $L_{B5}$ |
| 3333 | $L_{A453}$ | $L_{B5}$ |
| 3334 | $L_{A454}$ | $L_{B5}$ |
| 3335 | $L_{A455}$ | $L_{B5}$ |
| 3336 | $L_{A456}$ | $L_{B5}$ |
| 3337 | $L_{A457}$ | $L_{B5}$ |
| 3338 | $L_{A458}$ | $L_{B5}$ |
| 3339 | $L_{A459}$ | $L_{B5}$ |
| 3340 | $L_{A460}$ | $L_{B5}$ |
| 3341 | $L_{A461}$ | $L_{B5}$ |
| 3342 | $L_{A462}$ | $L_{B5}$ |
| 3343 | $L_{A463}$ | $L_{B5}$ |
| 3344 | $L_{A464}$ | $L_{B5}$ |
| 3345 | $L_{A465}$ | $L_{B5}$ |
| 3346 | $L_{A466}$ | $L_{B5}$ |
| 3347 | $L_{A467}$ | $L_{B5}$ |
| 3348 | $L_{A468}$ | $L_{B5}$ |
| 3349 | $L_{A469}$ | $L_{B5}$ |
| 3350 | $L_{A470}$ | $L_{B5}$ |
| 3351 | $L_{A471}$ | $L_{B5}$ |
| 3352 | $L_{A472}$ | $L_{B5}$ |
| 3353 | $L_{A473}$ | $L_{B5}$ |
| 3354 | $L_{A474}$ | $L_{B5}$ |
| 3355 | $L_{A475}$ | $L_{B5}$ |
| 3356 | $L_{A476}$ | $L_{B5}$ |
| 3357 | $L_{A477}$ | $L_{B5}$ |

-continued

| Compound Number | $L_A$ | $L_B$ |
|---|---|---|
| 3358 | $L_{A478}$ | $L_{B5}$ |
| 3359 | $L_{A479}$ | $L_{B5}$ |
| 3360 | $L_{A480}$ | $L_{B5}$ |
| 3361 | $L_{A481}$ | $L_{B5}$ |
| 3362 | $L_{A482}$ | $L_{B5}$ |
| 3363 | $L_{A483}$ | $L_{B5}$ |
| 3364 | $L_{A484}$ | $L_{B5}$ |
| 3365 | $L_{A485}$ | $L_{B5}$ |
| 3366 | $L_{A486}$ | $L_{B5}$ |
| 3367 | $L_{A487}$ | $L_{B5}$ |
| 3368 | $L_{A488}$ | $L_{B5}$ |
| 3369 | $L_{A489}$ | $L_{B5}$ |
| 3370 | $L_{A490}$ | $L_{B5}$ |
| 3371 | $L_{A491}$ | $L_{B5}$ |
| 3372 | $L_{A492}$ | $L_{B5}$ |
| 3373 | $L_{A493}$ | $L_{B5}$ |
| 3374 | $L_{A494}$ | $L_{B5}$ |
| 3375 | $L_{A495}$ | $L_{B5}$ |
| 3376 | $L_{A496}$ | $L_{B5}$ |
| 3377 | $L_{A497}$ | $L_{B5}$ |
| 3378 | $L_{A498}$ | $L_{B5}$ |
| 3379 | $L_{A499}$ | $L_{B5}$ |
| 3380 | $L_{A500}$ | $L_{B5}$ |
| 3381 | $L_{A501}$ | $L_{B5}$ |
| 3382 | $L_{A502}$ | $L_{B5}$ |
| 3383 | $L_{A503}$ | $L_{B5}$ |
| 3384 | $L_{A504}$ | $L_{B5}$ |
| 3385 | $L_{A505}$ | $L_{B5}$ |
| 3386 | $L_{A506}$ | $L_{B5}$ |
| 3387 | $L_{A507}$ | $L_{B5}$ |
| 3388 | $L_{A508}$ | $L_{B5}$ |
| 3389 | $L_{A509}$ | $L_{B5}$ |
| 3390 | $L_{A510}$ | $L_{B5}$ |
| 3391 | $L_{A511}$ | $L_{B5}$ |
| 3392 | $L_{A512}$ | $L_{B5}$ |
| 3393 | $L_{A513}$ | $L_{B5}$ |
| 3394 | $L_{A514}$ | $L_{B5}$ |
| 3395 | $L_{A515}$ | $L_{B5}$ |
| 3396 | $L_{A516}$ | $L_{B5}$ |
| 3397 | $L_{A517}$ | $L_{B5}$ |
| 3398 | $L_{A518}$ | $L_{B5}$ |
| 3399 | $L_{A519}$ | $L_{B5}$ |
| 3400 | $L_{A520}$ | $L_{B5}$ |
| 3401 | $L_{A521}$ | $L_{B5}$ |
| 3402 | $L_{A522}$ | $L_{B5}$ |
| 3403 | $L_{A523}$ | $L_{B5}$ |
| 3404 | $L_{A524}$ | $L_{B5}$ |
| 3405 | $L_{A525}$ | $L_{B5}$ |
| 3406 | $L_{A526}$ | $L_{B5}$ |
| 3407 | $L_{A527}$ | $L_{B5}$ |
| 3408 | $L_{A528}$ | $L_{B5}$ |
| 3409 | $L_{A529}$ | $L_{B5}$ |
| 3410 | $L_{A530}$ | $L_{B5}$ |
| 3411 | $L_{A531}$ | $L_{B5}$ |
| 3412 | $L_{A532}$ | $L_{B5}$ |
| 3413 | $L_{A533}$ | $L_{B5}$ |
| 3414 | $L_{A534}$ | $L_{B5}$ |
| 3415 | $L_{A535}$ | $L_{B5}$ |
| 3416 | $L_{A536}$ | $L_{B5}$ |
| 3417 | $L_{A537}$ | $L_{B5}$ |
| 3418 | $L_{A538}$ | $L_{B5}$ |
| 3419 | $L_{A539}$ | $L_{B5}$ |
| 3420 | $L_{A540}$ | $L_{B5}$ |
| 3421 | $L_{A541}$ | $L_{B5}$ |
| 3422 | $L_{A542}$ | $L_{B5}$ |
| 3423 | $L_{A543}$ | $L_{B5}$ |
| 3424 | $L_{A544}$ | $L_{B5}$ |
| 3425 | $L_{A545}$ | $L_{B5}$ |
| 3426 | $L_{A546}$ | $L_{B5}$ |
| 3427 | $L_{A547}$ | $L_{B5}$ |
| 3428 | $L_{A548}$ | $L_{B5}$ |
| 3429 | $L_{A549}$ | $L_{B5}$ |
| 3430 | $L_{A550}$ | $L_{B5}$ |
| 3431 | $L_{A551}$ | $L_{B5}$ |
| 3432 | $L_{A552}$ | $L_{B5}$ |
| 3433 | $L_{A553}$ | $L_{B5}$ |

-continued

| Compound Number | $L_A$ | $L_B$ |
|---|---|---|
| 3434 | $L_{A554}$ | $L_{B5}$ |
| 3435 | $L_{A555}$ | $L_{B5}$ |
| 3436 | $L_{A556}$ | $L_{B5}$ |
| 3437 | $L_{A557}$ | $L_{B5}$ |
| 3438 | $L_{A558}$ | $L_{B5}$ |
| 3439 | $L_{A559}$ | $L_{B5}$ |
| 3440 | $L_{A560}$ | $L_{B5}$ |
| 3441 | $L_{A561}$ | $L_{B5}$ |
| 3442 | $L_{A562}$ | $L_{B5}$ |
| 3443 | $L_{A563}$ | $L_{B5}$ |
| 3444 | $L_{A564}$ | $L_{B5}$ |
| 3445 | $L_{A565}$ | $L_{B5}$ |
| 3446 | $L_{A566}$ | $L_{B5}$ |
| 3447 | $L_{A567}$ | $L_{B5}$ |
| 3448 | $L_{A568}$ | $L_{B5}$ |
| 3449 | $L_{A569}$ | $L_{B5}$ |
| 3450 | $L_{A570}$ | $L_{B5}$ |
| 3451 | $L_{A571}$ | $L_{B5}$ |
| 3452 | $L_{A572}$ | $L_{B5}$ |
| 3453 | $L_{A573}$ | $L_{B5}$ |
| 3454 | $L_{A574}$ | $L_{B5}$ |
| 3455 | $L_{A575}$ | $L_{B5}$ |
| 3456 | $L_{A576}$ | $L_{B5}$ |
| 3457 | $L_{A577}$ | $L_{B5}$ |
| 3458 | $L_{A578}$ | $L_{B5}$ |
| 3459 | $L_{A579}$ | $L_{B5}$ |
| 3460 | $L_{A580}$ | $L_{B5}$ |
| 3461 | $L_{A581}$ | $L_{B5}$ |
| 3462 | $L_{A582}$ | $L_{B5}$ |
| 3463 | $L_{A583}$ | $L_{B5}$ |
| 3464 | $L_{A584}$ | $L_{B5}$ |
| 3465 | $L_{A585}$ | $L_{B5}$ |
| 3466 | $L_{A586}$ | $L_{B5}$ |
| 3467 | $L_{A587}$ | $L_{B5}$ |
| 3468 | $L_{A588}$ | $L_{B5}$ |
| 3469 | $L_{A589}$ | $L_{B5}$ |
| 3470 | $L_{A590}$ | $L_{B5}$ |
| 3471 | $L_{A591}$ | $L_{B5}$ |
| 3472 | $L_{A592}$ | $L_{B5}$ |
| 3473 | $L_{A593}$ | $L_{B5}$ |
| 3474 | $L_{A594}$ | $L_{B5}$ |
| 3475 | $L_{A595}$ | $L_{B5}$ |
| 3476 | $L_{A596}$ | $L_{B5}$ |
| 3477 | $L_{A597}$ | $L_{B5}$ |
| 3478 | $L_{A598}$ | $L_{B5}$ |
| 3479 | $L_{A599}$ | $L_{B5}$ |
| 3480 | $L_{A600}$ | $L_{B5}$ |
| 3481 | $L_{A601}$ | $L_{B5}$ |
| 3482 | $L_{A602}$ | $L_{B5}$ |
| 3483 | $L_{A603}$ | $L_{B5}$ |
| 3484 | $L_{A604}$ | $L_{B5}$ |
| 3485 | $L_{A605}$ | $L_{B5}$ |
| 3486 | $L_{A606}$ | $L_{B5}$ |
| 3487 | $L_{A607}$ | $L_{B5}$ |
| 3488 | $L_{A608}$ | $L_{B5}$ |
| 3489 | $L_{A609}$ | $L_{B5}$ |
| 3490 | $L_{A610}$ | $L_{B5}$ |
| 3491 | $L_{A611}$ | $L_{B5}$ |
| 3492 | $L_{A612}$ | $L_{B5}$ |
| 3493 | $L_{A613}$ | $L_{B5}$ |
| 3494 | $L_{A614}$ | $L_{B5}$ |
| 3495 | $L_{A615}$ | $L_{B5}$ |
| 3496 | $L_{A616}$ | $L_{B5}$ |
| 3497 | $L_{A617}$ | $L_{B5}$ |
| 3498 | $L_{A618}$ | $L_{B5}$ |
| 3499 | $L_{A619}$ | $L_{B5}$ |
| 3500 | $L_{A620}$ | $L_{B5}$ |
| 3501 | $L_{A621}$ | $L_{B5}$ |
| 3502 | $L_{A622}$ | $L_{B5}$ |
| 3503 | $L_{A623}$ | $L_{B5}$ |
| 3504 | $L_{A624}$ | $L_{B5}$ |
| 3505 | $L_{A625}$ | $L_{B5}$ |
| 3506 | $L_{A626}$ | $L_{B5}$ |
| 3507 | $L_{A627}$ | $L_{B5}$ |
| 3508 | $L_{A628}$ | $L_{B5}$ |
| 3509 | $L_{A629}$ | $L_{B5}$ |

-continued

| Compound Number | $L_A$ | $L_B$ |
|---|---|---|
| 3510 | $L_{A630}$ | $L_{B5}$ |
| 3511 | $L_{A631}$ | $L_{B5}$ |
| 3512 | $L_{A632}$ | $L_{B5}$ |
| 3513 | $L_{A633}$ | $L_{B5}$ |
| 3514 | $L_{A634}$ | $L_{B5}$ |
| 3515 | $L_{A635}$ | $L_{B5}$ |
| 3516 | $L_{A636}$ | $L_{B5}$ |
| 3517 | $L_{A637}$ | $L_{B5}$ |
| 3518 | $L_{A638}$ | $L_{B5}$ |
| 3519 | $L_{A639}$ | $L_{B5}$ |
| 3520 | $L_{A640}$ | $L_{B5}$ |
| 3521 | $L_{A641}$ | $L_{B5}$ |
| 3522 | $L_{A642}$ | $L_{B5}$ |
| 3523 | $L_{A643}$ | $L_{B5}$ |
| 3524 | $L_{A644}$ | $L_{B5}$ |
| 3525 | $L_{A645}$ | $L_{B5}$ |
| 3526 | $L_{A646}$ | $L_{B5}$ |
| 3527 | $L_{A647}$ | $L_{B5}$ |
| 3528 | $L_{A648}$ | $L_{B5}$ |
| 3529 | $L_{A649}$ | $L_{B5}$ |
| 3530 | $L_{A650}$ | $L_{B5}$ |
| 3531 | $L_{A651}$ | $L_{B5}$ |
| 3532 | $L_{A652}$ | $L_{B5}$ |
| 3533 | $L_{A653}$ | $L_{B5}$ |
| 3534 | $L_{A654}$ | $L_{B5}$ |
| 3535 | $L_{A655}$ | $L_{B5}$ |
| 3536 | $L_{A656}$ | $L_{B5}$ |
| 3537 | $L_{A657}$ | $L_{B5}$ |
| 3538 | $L_{A658}$ | $L_{B5}$ |
| 3539 | $L_{A659}$ | $L_{B5}$ |
| 3540 | $L_{A660}$ | $L_{B5}$ |
| 3541 | $L_{A661}$ | $L_{B5}$ |
| 3542 | $L_{A662}$ | $L_{B5}$ |
| 3543 | $L_{A663}$ | $L_{B5}$ |
| 3544 | $L_{A664}$ | $L_{B5}$ |
| 3545 | $L_{A665}$ | $L_{B5}$ |
| 3546 | $L_{A666}$ | $L_{B5}$ |
| 3547 | $L_{A667}$ | $L_{B5}$ |
| 3548 | $L_{A668}$ | $L_{B5}$ |
| 3549 | $L_{A669}$ | $L_{B5}$ |
| 3550 | $L_{A670}$ | $L_{B5}$ |
| 3551 | $L_{A671}$ | $L_{B5}$ |
| 3552 | $L_{A672}$ | $L_{B5}$ |
| 3553 | $L_{A673}$ | $L_{B5}$ |
| 3554 | $L_{A674}$ | $L_{B5}$ |
| 3555 | $L_{A675}$ | $L_{B5}$ |
| 3556 | $L_{A676}$ | $L_{B5}$ |
| 3557 | $L_{A677}$ | $L_{B5}$ |
| 3558 | $L_{A678}$ | $L_{B5}$ |
| 3559 | $L_{A679}$ | $L_{B5}$ |
| 3560 | $L_{A680}$ | $L_{B5}$ |
| 3561 | $L_{A681}$ | $L_{B5}$ |
| 3562 | $L_{A682}$ | $L_{B5}$ |
| 3563 | $L_{A683}$ | $L_{B5}$ |
| 3564 | $L_{A684}$ | $L_{B5}$ |
| 3565 | $L_{A685}$ | $L_{B5}$ |
| 3566 | $L_{A686}$ | $L_{B5}$ |
| 3567 | $L_{A687}$ | $L_{B5}$ |
| 3568 | $L_{A688}$ | $L_{B5}$ |
| 3569 | $L_{A689}$ | $L_{B5}$ |
| 3570 | $L_{A690}$ | $L_{B5}$ |
| 3571 | $L_{A691}$ | $L_{B5}$ |
| 3572 | $L_{A692}$ | $L_{B5}$ |
| 3573 | $L_{A693}$ | $L_{B5}$ |
| 3574 | $L_{A694}$ | $L_{B5}$ |
| 3575 | $L_{A695}$ | $L_{B5}$ |
| 3576 | $L_{A696}$ | $L_{B5}$ |
| 3577 | $L_{A697}$ | $L_{B5}$ |
| 3578 | $L_{A698}$ | $L_{B5}$ |
| 3579 | $L_{A699}$ | $L_{B5}$ |
| 3580 | $L_{A700}$ | $L_{B5}$ |
| 3581 | $L_{A701}$ | $L_{B5}$ |
| 3582 | $L_{A702}$ | $L_{B5}$ |
| 3583 | $L_{A703}$ | $L_{B5}$ |
| 3584 | $L_{A704}$ | $L_{B5}$ |
| 3585 | $L_{A705}$ | $L_{B5}$ |

-continued

| Compound Number | $L_A$ | $L_B$ |
|---|---|---|
| 3586 | $L_{A706}$ | $L_{B5}$ |
| 3587 | $L_{A707}$ | $L_{B5}$ |
| 3588 | $L_{A708}$ | $L_{B5}$ |
| 3589 | $L_{A709}$ | $L_{B5}$ |
| 3590 | $L_{A710}$ | $L_{B5}$ |
| 3591 | $L_{A711}$ | $L_{B5}$ |
| 3592 | $L_{A712}$ | $L_{B5}$ |
| 3593 | $L_{A713}$ | $L_{B5}$ |
| 3594 | $L_{A714}$ | $L_{B5}$ |
| 3595 | $L_{A715}$ | $L_{B5}$ |
| 3596 | $L_{A716}$ | $L_{B5}$ |
| 3597 | $L_{A717}$ | $L_{B5}$ |
| 3598 | $L_{A718}$ | $L_{B5}$ |
| 3599 | $L_{A719}$ | $L_{B5}$ |
| 3600 | $L_{A720}$ | $L_{B5}$ |
| 3601 | $L_{A721}$ | $L_{B5}$ |
| 3602 | $L_{A722}$ | $L_{B5}$ |
| 3603 | $L_{A723}$ | $L_{B5}$ |
| 3604 | $L_{A724}$ | $L_{B5}$ |
| 3605 | $L_{A725}$ | $L_{B5}$ |
| 3606 | $L_{A726}$ | $L_{B5}$ |
| 3607 | $L_{A727}$ | $L_{B5}$ |
| 3608 | $L_{A728}$ | $L_{B5}$ |
| 3609 | $L_{A729}$ | $L_{B5}$ |
| 3610 | $L_{A730}$ | $L_{B5}$ |
| 3611 | $L_{A731}$ | $L_{B5}$ |
| 3612 | $L_{A732}$ | $L_{B5}$ |
| 3613 | $L_{A733}$ | $L_{B5}$ |
| 3614 | $L_{A734}$ | $L_{B5}$ |
| 3615 | $L_{A735}$ | $L_{B5}$ |
| 3616 | $L_{A736}$ | $L_{B5}$ |
| 3617 | $L_{A737}$ | $L_{B5}$ |
| 3618 | $L_{A738}$ | $L_{B5}$ |
| 3619 | $L_{A739}$ | $L_{B5}$ |
| 3620 | $L_{A740}$ | $L_{B5}$ |
| 3621 | $L_{A741}$ | $L_{B5}$ |
| 3622 | $L_{A742}$ | $L_{B5}$ |
| 3623 | $L_{A743}$ | $L_{B5}$ |
| 3624 | $L_{A744}$ | $L_{B5}$ |
| 3625 | $L_{A745}$ | $L_{B5}$ |
| 3626 | $L_{A746}$ | $L_{B5}$ |
| 3627 | $L_{A747}$ | $L_{B5}$ |
| 3628 | $L_{A748}$ | $L_{B5}$ |
| 3629 | $L_{A749}$ | $L_{B5}$ |
| 3630 | $L_{A750}$ | $L_{B5}$ |
| 3631 | $L_{A751}$ | $L_{B5}$ |
| 3632 | $L_{A752}$ | $L_{B5}$ |
| 3633 | $L_{A753}$ | $L_{B5}$ |
| 3634 | $L_{A754}$ | $L_{B5}$ |
| 3635 | $L_{A755}$ | $L_{B5}$ |
| 3636 | $L_{A756}$ | $L_{B5}$ |
| 3637 | $L_{A757}$ | $L_{B5}$ |
| 3638 | $L_{A758}$ | $L_{B5}$ |
| 3639 | $L_{A759}$ | $L_{B5}$ |
| 3640 | $L_{A760}$ | $L_{B5}$ |
| 3641 | $L_{A761}$ | $L_{B5}$ |
| 3642 | $L_{A762}$ | $L_{B5}$ |
| 3643 | $L_{A763}$ | $L_{B5}$ |
| 3644 | $L_{A764}$ | $L_{B5}$ |
| 3645 | $L_{A765}$ | $L_{B5}$ |
| 3646 | $L_{A766}$ | $L_{B5}$ |
| 3647 | $L_{A767}$ | $L_{B5}$ |
| 3648 | $L_{A768}$ | $L_{B5}$ |
| 3649 | $L_{A769}$ | $L_{B5}$ |
| 3650 | $L_{A770}$ | $L_{B5}$ |
| 3651 | $L_{A771}$ | $L_{B5}$ |
| 3652 | $L_{A772}$ | $L_{B5}$ |
| 3653 | $L_{A773}$ | $L_{B5}$ |
| 3654 | $L_{A774}$ | $L_{B5}$ |
| 3655 | $L_{A775}$ | $L_{B5}$ |
| 3656 | $L_{A776}$ | $L_{B5}$ |
| 3657 | $L_{A777}$ | $L_{B5}$ |
| 3658 | $L_{A778}$ | $L_{B5}$ |
| 3659 | $L_{A779}$ | $L_{B5}$ |
| 3660 | $L_{A780}$ | $L_{B5}$ |
| 3661 | $L_{A781}$ | $L_{B5}$ |

-continued

| Compound Number | $L_A$ | $L_B$ |
|---|---|---|
| 3662 | $L_{A782}$ | $L_{B5}$ |
| 3663 | $L_{A783}$ | $L_{B5}$ |
| 3664 | $L_{A784}$ | $L_{B5}$ |
| 3665 | $L_{A785}$ | $L_{B5}$ |
| 3666 | $L_{A786}$ | $L_{B5}$ |
| 3667 | $L_{A787}$ | $L_{B5}$ |
| 3668 | $L_{A788}$ | $L_{B5}$ |
| 3669 | $L_{A789}$ | $L_{B5}$ |
| 3670 | $L_{A790}$ | $L_{B5}$ |
| 3671 | $L_{A791}$ | $L_{B5}$ |
| 3672 | $L_{A792}$ | $L_{B5}$ |
| 3673 | $L_{A793}$ | $L_{B5}$ |
| 3674 | $L_{A794}$ | $L_{B5}$ |
| 3675 | $L_{A795}$ | $L_{B5}$ |
| 3676 | $L_{A796}$ | $L_{B5}$ |
| 3677 | $L_{A797}$ | $L_{B5}$ |
| 3678 | $L_{A798}$ | $L_{B5}$ |
| 3679 | $L_{A799}$ | $L_{B5}$ |
| 3680 | $L_{A800}$ | $L_{B5}$ |
| 3681 | $L_{A801}$ | $L_{B5}$ |
| 3682 | $L_{A802}$ | $L_{B5}$ |
| 3683 | $L_{A803}$ | $L_{B5}$ |
| 3684 | $L_{A804}$ | $L_{B5}$ |
| 3685 | $L_{A805}$ | $L_{B5}$ |
| 3686 | $L_{A806}$ | $L_{B5}$ |
| 3687 | $L_{A807}$ | $L_{B5}$ |
| 3688 | $L_{A808}$ | $L_{B5}$ |
| 3689 | $L_{A809}$ | $L_{B5}$ |
| 3690 | $L_{A810}$ | $L_{B5}$ |
| 3691 | $L_{A811}$ | $L_{B5}$ |
| 3692 | $L_{A812}$ | $L_{B5}$ |
| 3693 | $L_{A813}$ | $L_{B5}$ |
| 3694 | $L_{A814}$ | $L_{B5}$ |
| 3695 | $L_{A815}$ | $L_{B5}$ |
| 3696 | $L_{A816}$ | $L_{B5}$ |
| 3697 | $L_{A817}$ | $L_{B5}$ |
| 3698 | $L_{A818}$ | $L_{B5}$ |
| 3699 | $L_{A819}$ | $L_{B5}$ |
| 3700 | $L_{A820}$ | $L_{B5}$ |
| 3701 | $L_{A821}$ | $L_{B5}$ |
| 3702 | $L_{A822}$ | $L_{B5}$ |
| 3703 | $L_{A823}$ | $L_{B5}$ |
| 3704 | $L_{A824}$ | $L_{B5}$ |
| 3705 | $L_{A825}$ | $L_{B5}$ |
| 3706 | $L_{A826}$ | $L_{B5}$ |
| 3707 | $L_{A827}$ | $L_{B5}$ |
| 3708 | $L_{A828}$ | $L_{B5}$ |
| 3709 | $L_{A829}$ | $L_{B5}$ |
| 3710 | $L_{A830}$ | $L_{B5}$ |
| 3711 | $L_{A831}$ | $L_{B5}$ |
| 3712 | $L_{A832}$ | $L_{B5}$ |
| 3713 | $L_{A833}$ | $L_{B5}$ |
| 3714 | $L_{A834}$ | $L_{B5}$ |
| 3715 | $L_{A835}$ | $L_{B5}$ |
| 3716 | $L_{A836}$ | $L_{B5}$ |
| 3717 | $L_{A837}$ | $L_{B5}$ |
| 3718 | $L_{A838}$ | $L_{B5}$ |
| 3719 | $L_{A839}$ | $L_{B5}$ |
| 3720 | $L_{A840}$ | $L_{B5}$ |
| 3721 | $L_{A841}$ | $L_{B5}$ |
| 3722 | $L_{A842}$ | $L_{B5}$ |
| 3723 | $L_{A843}$ | $L_{B5}$ |
| 3724 | $L_{A844}$ | $L_{B5}$ |
| 3725 | $L_{A845}$ | $L_{B5}$ |
| 3726 | $L_{A846}$ | $L_{B5}$ |
| 3727 | $L_{A847}$ | $L_{B5}$ |
| 3728 | $L_{A848}$ | $L_{B5}$ |
| 3729 | $L_{A849}$ | $L_{B5}$ |
| 3730 | $L_{A850}$ | $L_{B5}$ |
| 3731 | $L_{A851}$ | $L_{B5}$ |
| 3732 | $L_{A852}$ | $L_{B5}$ |
| 3733 | $L_{A853}$ | $L_{B5}$ |
| 3734 | $L_{A854}$ | $L_{B5}$ |
| 3735 | $L_{A855}$ | $L_{B5}$ |
| 3736 | $L_{A856}$ | $L_{B5}$ |
| 3737 | $L_{A857}$ | $L_{B5}$ |
| 3738 | $L_{A858}$ | $L_{B5}$ |
| 3739 | $L_{A859}$ | $L_{B5}$ |
| 3740 | $L_{A860}$ | $L_{B5}$ |
| 3741 | $L_{A861}$ | $L_{B5}$ |
| 3742 | $L_{A862}$ | $L_{B5}$ |
| 3743 | $L_{A863}$ | $L_{B5}$ |
| 3744 | $L_{A864}$ | $L_{B5}$ |
| 3745 | $L_{A865}$ | $L_{B5}$ |
| 3746 | $L_{A866}$ | $L_{B5}$ |
| 3747 | $L_{A867}$ | $L_{B5}$ |
| 3748 | $L_{A868}$ | $L_{B5}$ |
| 3749 | $L_{A869}$ | $L_{B5}$ |
| 3750 | $L_{A870}$ | $L_{B5}$ |
| 3751 | $L_{A871}$ | $L_{B5}$ |
| 3752 | $L_{A872}$ | $L_{B5}$ |
| 3753 | $L_{A873}$ | $L_{B5}$ |
| 3754 | $L_{A874}$ | $L_{B5}$ |
| 3755 | $L_{A875}$ | $L_{B5}$ |
| 3756 | $L_{A876}$ | $L_{B5}$ |
| 3757 | $L_{A877}$ | $L_{B5}$ |
| 3758 | $L_{A878}$ | $L_{B5}$ |
| 3759 | $L_{A879}$ | $L_{B5}$ |
| 3760 | $L_{A880}$ | $L_{B5}$ |
| 3761 | $L_{A881}$ | $L_{B5}$ |
| 3762 | $L_{A882}$ | $L_{B5}$ |
| 3763 | $L_{A883}$ | $L_{B5}$ |
| 3764 | $L_{A884}$ | $L_{B5}$ |
| 3765 | $L_{A885}$ | $L_{B5}$ |
| 3766 | $L_{A886}$ | $L_{B5}$ |
| 3767 | $L_{A887}$ | $L_{B5}$ |
| 3768 | $L_{A888}$ | $L_{B5}$ |
| 3769 | $L_{A889}$ | $L_{B5}$ |
| 3770 | $L_{A890}$ | $L_{B5}$ |
| 3771 | $L_{A891}$ | $L_{B5}$ |
| 3772 | $L_{A892}$ | $L_{B5}$ |
| 3773 | $L_{A893}$ | $L_{B5}$ |
| 3774 | $L_{A894}$ | $L_{B5}$ |
| 3775 | $L_{A895}$ | $L_{B5}$ |
| 3776 | $L_{A896}$ | $L_{B5}$ |
| 3777 | $L_{A897}$ | $L_{B5}$ |
| 3778 | $L_{A898}$ | $L_{B5}$ |
| 3779 | $L_{A899}$ | $L_{B5}$ |
| 3780 | $L_{A900}$ | $L_{B5}$ |
| 3781 | $L_{A901}$ | $L_{B5}$ |
| 3782 | $L_{A902}$ | $L_{B5}$ |
| 3783 | $L_{A903}$ | $L_{B5}$ |
| 3784 | $L_{A904}$ | $L_{B5}$ |
| 3785 | $L_{A905}$ | $L_{B5}$ |
| 3786 | $L_{A906}$ | $L_{B5}$ |
| 3787 | $L_{A907}$ | $L_{B5}$ |
| 3788 | $L_{A908}$ | $L_{B5}$ |
| 3789 | $L_{A909}$ | $L_{B5}$ |
| 3790 | $L_{A910}$ | $L_{B5}$ |
| 3791 | $L_{A911}$ | $L_{B5}$ |
| 3792 | $L_{A912}$ | $L_{B5}$ |
| 3793 | $L_{A913}$ | $L_{B5}$ |
| 3794 | $L_{A914}$ | $L_{B5}$ |
| 3795 | $L_{A915}$ | $L_{B5}$ |
| 3796 | $L_{A916}$ | $L_{B5}$ |
| 3797 | $L_{A917}$ | $L_{B5}$ |
| 3798 | $L_{A918}$ | $L_{B5}$ |
| 3799 | $L_{A919}$ | $L_{B5}$ |
| 3800 | $L_{A920}$ | $L_{B5}$ |
| 3801 | $L_{A921}$ | $L_{B5}$ |
| 3802 | $L_{A922}$ | $L_{B5}$ |
| 3803 | $L_{A923}$ | $L_{B5}$ |
| 3804 | $L_{A924}$ | $L_{B5}$ |
| 3805 | $L_{A925}$ | $L_{B5}$ |
| 3806 | $L_{A926}$ | $L_{B5}$ |
| 3807 | $L_{A927}$ | $L_{B5}$ |
| 3808 | $L_{A928}$ | $L_{B5}$ |
| 3809 | $L_{A929}$ | $L_{B5}$ |
| 3810 | $L_{A930}$ | $L_{B5}$ |
| 3811 | $L_{A931}$ | $L_{B5}$ |
| 3812 | $L_{A932}$ | $L_{B5}$ |
| 3813 | $L_{A933}$ | $L_{B5}$ |

-continued

| Compound Number | $L_A$ | $L_B$ |
|---|---|---|
| 3814 | $L_{A934}$ | $L_{B5}$ |
| 3815 | $L_{A935}$ | $L_{B5}$ |
| 3816 | $L_{A936}$ | $L_{B5}$ |
| 3817 | $L_{A937}$ | $L_{B5}$ |
| 3818 | $L_{A938}$ | $L_{B5}$ |
| 3819 | $L_{A939}$ | $L_{B5}$ |
| 3820 | $L_{A940}$ | $L_{B5}$ |
| 3821 | $L_{A941}$ | $L_{B5}$ |
| 3822 | $L_{A942}$ | $L_{B5}$ |
| 3823 | $L_{A943}$ | $L_{B5}$ |
| 3824 | $L_{A944}$ | $L_{B5}$ |
| 3825 | $L_{A945}$ | $L_{B5}$ |
| 3826 | $L_{A946}$ | $L_{B5}$ |
| 3827 | $L_{A947}$ | $L_{B5}$ |
| 3828 | $L_{A948}$ | $L_{B5}$ |
| 3829 | $L_{A949}$ | $L_{B5}$ |
| 3830 | $L_{A950}$ | $L_{B5}$ |
| 3831 | $L_{A951}$ | $L_{B5}$ |
| 3832 | $L_{A952}$ | $L_{B5}$ |
| 3833 | $L_{A953}$ | $L_{B5}$ |
| 3834 | $L_{A954}$ | $L_{B5}$ |
| 3835 | $L_{A955}$ | $L_{B5}$ |
| 3836 | $L_{A956}$ | $L_{B5}$ |
| 3837 | $L_{A957}$ | $L_{B5}$ |
| 3838 | $L_{A958}$ | $L_{B5}$ |
| 3839 | $L_{A959}$ | $L_{B5}$ |
| 3840 | $L_{A960}$ | $L_{B5}$ |
| 3841 | $L_{A1}$ | $L_{B10}$ |
| 3842 | $L_{A2}$ | $L_{B10}$ |
| 3843 | $L_{A3}$ | $L_{B10}$ |
| 3844 | $L_{A4}$ | $L_{B10}$ |
| 3845 | $L_{A5}$ | $L_{B10}$ |
| 3846 | $L_{A6}$ | $L_{B10}$ |
| 3847 | $L_{A7}$ | $L_{B10}$ |
| 3848 | $L_{A8}$ | $L_{B10}$ |
| 3849 | $L_{A9}$ | $L_{B10}$ |
| 3850 | $L_{A10}$ | $L_{B10}$ |
| 3851 | $L_{A11}$ | $L_{B10}$ |
| 3852 | $L_{A12}$ | $L_{B10}$ |
| 3853 | $L_{A13}$ | $L_{B10}$ |
| 3854 | $L_{A14}$ | $L_{B10}$ |
| 3855 | $L_{A15}$ | $L_{B10}$ |
| 3856 | $L_{A16}$ | $L_{B10}$ |
| 3857 | $L_{A17}$ | $L_{B10}$ |
| 3858 | $L_{A18}$ | $L_{B10}$ |
| 3859 | $L_{A19}$ | $L_{B10}$ |
| 3860 | $L_{A20}$ | $L_{B10}$ |
| 3861 | $L_{A21}$ | $L_{B10}$ |
| 3862 | $L_{A22}$ | $L_{B10}$ |
| 3863 | $L_{A23}$ | $L_{B10}$ |
| 3864 | $L_{A24}$ | $L_{B10}$ |
| 3865 | $L_{A25}$ | $L_{B10}$ |
| 3866 | $L_{A26}$ | $L_{B10}$ |
| 3867 | $L_{A27}$ | $L_{B10}$ |
| 3868 | $L_{A28}$ | $L_{B10}$ |
| 3869 | $L_{A29}$ | $L_{B10}$ |
| 3870 | $L_{A30}$ | $L_{B10}$ |
| 3871 | $L_{A31}$ | $L_{B10}$ |
| 3872 | $L_{A32}$ | $L_{B10}$ |
| 3873 | $L_{A33}$ | $L_{B10}$ |
| 3874 | $L_{A34}$ | $L_{B10}$ |
| 3875 | $L_{A35}$ | $L_{B10}$ |
| 3876 | $L_{A36}$ | $L_{B10}$ |
| 3877 | $L_{A37}$ | $L_{B10}$ |
| 3878 | $L_{A38}$ | $L_{B10}$ |
| 3879 | $L_{A39}$ | $L_{B10}$ |
| 3880 | $L_{A40}$ | $L_{B10}$ |
| 3881 | $L_{A41}$ | $L_{B10}$ |
| 3882 | $L_{A42}$ | $L_{B10}$ |
| 3883 | $L_{A43}$ | $L_{B10}$ |
| 3884 | $L_{A44}$ | $L_{B10}$ |
| 3885 | $L_{A45}$ | $L_{B10}$ |
| 3886 | $L_{A46}$ | $L_{B10}$ |
| 3887 | $L_{A47}$ | $L_{B10}$ |
| 3888 | $L_{A48}$ | $L_{B10}$ |
| 3889 | $L_{A49}$ | $L_{B10}$ |

-continued

| Compound Number | $L_A$ | $L_B$ |
|---|---|---|
| 3890 | $L_{A50}$ | $L_{B10}$ |
| 3891 | $L_{A51}$ | $L_{B10}$ |
| 3892 | $L_{A52}$ | $L_{B10}$ |
| 3893 | $L_{A53}$ | $L_{B10}$ |
| 3894 | $L_{A54}$ | $L_{B10}$ |
| 3895 | $L_{A55}$ | $L_{B10}$ |
| 3896 | $L_{A56}$ | $L_{B10}$ |
| 3897 | $L_{A57}$ | $L_{B10}$ |
| 3898 | $L_{A58}$ | $L_{B10}$ |
| 3899 | $L_{A59}$ | $L_{B10}$ |
| 3900 | $L_{A60}$ | $L_{B10}$ |
| 3901 | $L_{A61}$ | $L_{B10}$ |
| 3902 | $L_{A62}$ | $L_{B10}$ |
| 3903 | $L_{A63}$ | $L_{B10}$ |
| 3904 | $L_{A64}$ | $L_{B10}$ |
| 3905 | $L_{A65}$ | $L_{B10}$ |
| 3906 | $L_{A66}$ | $L_{B10}$ |
| 3907 | $L_{A67}$ | $L_{B10}$ |
| 3908 | $L_{A68}$ | $L_{B10}$ |
| 3909 | $L_{A69}$ | $L_{B10}$ |
| 3910 | $L_{A70}$ | $L_{B10}$ |
| 3911 | $L_{A71}$ | $L_{B10}$ |
| 3912 | $L_{A72}$ | $L_{B10}$ |
| 3913 | $L_{A73}$ | $L_{B10}$ |
| 3914 | $L_{A74}$ | $L_{B10}$ |
| 3915 | $L_{A75}$ | $L_{B10}$ |
| 3916 | $L_{A76}$ | $L_{B10}$ |
| 3917 | $L_{A77}$ | $L_{B10}$ |
| 3918 | $L_{A78}$ | $L_{B10}$ |
| 3919 | $L_{A79}$ | $L_{B10}$ |
| 3920 | $L_{A80}$ | $L_{B10}$ |
| 3921 | $L_{A81}$ | $L_{B10}$ |
| 3922 | $L_{A82}$ | $L_{B10}$ |
| 3923 | $L_{A83}$ | $L_{B10}$ |
| 3924 | $L_{A84}$ | $L_{B10}$ |
| 3925 | $L_{A85}$ | $L_{B10}$ |
| 3926 | $L_{A86}$ | $L_{B10}$ |
| 3927 | $L_{A87}$ | $L_{B10}$ |
| 3928 | $L_{A88}$ | $L_{B10}$ |
| 3929 | $L_{A89}$ | $L_{B10}$ |
| 3930 | $L_{A90}$ | $L_{B10}$ |
| 3931 | $L_{A91}$ | $L_{B10}$ |
| 3932 | $L_{A92}$ | $L_{B10}$ |
| 3933 | $L_{A93}$ | $L_{B10}$ |
| 3934 | $L_{A94}$ | $L_{B10}$ |
| 3935 | $L_{A95}$ | $L_{B10}$ |
| 3936 | $L_{A96}$ | $L_{B10}$ |
| 3937 | $L_{A97}$ | $L_{B10}$ |
| 3938 | $L_{A98}$ | $L_{B10}$ |
| 3939 | $L_{A99}$ | $L_{B10}$ |
| 3940 | $L_{A100}$ | $L_{B10}$ |
| 3941 | $L_{A101}$ | $L_{B10}$ |
| 3942 | $L_{A102}$ | $L_{B10}$ |
| 3943 | $L_{A103}$ | $L_{B10}$ |
| 3944 | $L_{A104}$ | $L_{B10}$ |
| 3945 | $L_{A105}$ | $L_{B10}$ |
| 3946 | $L_{A106}$ | $L_{B10}$ |
| 3947 | $L_{A107}$ | $L_{B10}$ |
| 3948 | $L_{A108}$ | $L_{B10}$ |
| 3949 | $L_{A109}$ | $L_{B10}$ |
| 3950 | $L_{A110}$ | $L_{B10}$ |
| 3951 | $L_{A111}$ | $L_{B10}$ |
| 3952 | $L_{A112}$ | $L_{B10}$ |
| 3953 | $L_{A113}$ | $L_{B10}$ |
| 3954 | $L_{A114}$ | $L_{B10}$ |
| 3955 | $L_{A115}$ | $L_{B10}$ |
| 3956 | $L_{A116}$ | $L_{B10}$ |
| 3957 | $L_{A117}$ | $L_{B10}$ |
| 3958 | $L_{A118}$ | $L_{B10}$ |
| 3959 | $L_{A119}$ | $L_{B10}$ |
| 3960 | $L_{A120}$ | $L_{B10}$ |
| 3961 | $L_{A121}$ | $L_{B10}$ |
| 3962 | $L_{A122}$ | $L_{B10}$ |
| 3963 | $L_{A123}$ | $L_{B10}$ |
| 3964 | $L_{A124}$ | $L_{B10}$ |
| 3965 | $L_{A125}$ | $L_{B10}$ |

-continued

| Compound Number | $L_A$ | $L_B$ |
|---|---|---|
| 3966 | $L_{A126}$ | $L_{B10}$ |
| 3967 | $L_{A127}$ | $L_{B10}$ |
| 3968 | $L_{A128}$ | $L_{B10}$ |
| 3969 | $L_{A129}$ | $L_{B10}$ |
| 3970 | $L_{A130}$ | $L_{B10}$ |
| 3971 | $L_{A131}$ | $L_{B10}$ |
| 3972 | $L_{A132}$ | $L_{B10}$ |
| 3973 | $L_{A133}$ | $L_{B10}$ |
| 3974 | $L_{A134}$ | $L_{B10}$ |
| 3975 | $L_{A135}$ | $L_{B10}$ |
| 3976 | $L_{A136}$ | $L_{B10}$ |
| 3977 | $L_{A137}$ | $L_{B10}$ |
| 3978 | $L_{A138}$ | $L_{B10}$ |
| 3979 | $L_{A139}$ | $L_{B10}$ |
| 3980 | $L_{A140}$ | $L_{B10}$ |
| 3981 | $L_{A141}$ | $L_{B10}$ |
| 3982 | $L_{A142}$ | $L_{B10}$ |
| 3983 | $L_{A143}$ | $L_{B10}$ |
| 3984 | $L_{A144}$ | $L_{B10}$ |
| 3985 | $L_{A145}$ | $L_{B10}$ |
| 3986 | $L_{A146}$ | $L_{B10}$ |
| 3987 | $L_{A147}$ | $L_{B10}$ |
| 3988 | $L_{A148}$ | $L_{B10}$ |
| 3989 | $L_{A149}$ | $L_{B10}$ |
| 3990 | $L_{A150}$ | $L_{B10}$ |
| 3991 | $L_{A151}$ | $L_{B10}$ |
| 3992 | $L_{A152}$ | $L_{B10}$ |
| 3993 | $L_{A153}$ | $L_{B10}$ |
| 3994 | $L_{A154}$ | $L_{B10}$ |
| 3995 | $L_{A155}$ | $L_{B10}$ |
| 3996 | $L_{A156}$ | $L_{B10}$ |
| 3997 | $L_{A157}$ | $L_{B10}$ |
| 3998 | $L_{A158}$ | $L_{B10}$ |
| 3999 | $L_{A159}$ | $L_{B10}$ |
| 4000 | $L_{A160}$ | $L_{B10}$ |
| 4001 | $L_{A161}$ | $L_{B10}$ |
| 4002 | $L_{A162}$ | $L_{B10}$ |
| 4003 | $L_{A163}$ | $L_{B10}$ |
| 4004 | $L_{A164}$ | $L_{B10}$ |
| 4005 | $L_{A165}$ | $L_{B10}$ |
| 4006 | $L_{A166}$ | $L_{B10}$ |
| 4007 | $L_{A167}$ | $L_{B10}$ |
| 4008 | $L_{A168}$ | $L_{B10}$ |
| 4009 | $L_{A169}$ | $L_{B10}$ |
| 4010 | $L_{A170}$ | $L_{B10}$ |
| 4011 | $L_{A171}$ | $L_{B10}$ |
| 4012 | $L_{A172}$ | $L_{B10}$ |
| 4013 | $L_{A173}$ | $L_{B10}$ |
| 4014 | $L_{A174}$ | $L_{B10}$ |
| 4015 | $L_{A175}$ | $L_{B10}$ |
| 4016 | $L_{A176}$ | $L_{B10}$ |
| 4017 | $L_{A177}$ | $L_{B10}$ |
| 4018 | $L_{A178}$ | $L_{B10}$ |
| 4019 | $L_{A179}$ | $L_{B10}$ |
| 4020 | $L_{A180}$ | $L_{B10}$ |
| 4021 | $L_{A181}$ | $L_{B10}$ |
| 4022 | $L_{A182}$ | $L_{B10}$ |
| 4023 | $L_{A183}$ | $L_{B10}$ |
| 4024 | $L_{A184}$ | $L_{B10}$ |
| 4025 | $L_{A185}$ | $L_{B10}$ |
| 4026 | $L_{A186}$ | $L_{B10}$ |
| 4027 | $L_{A187}$ | $L_{B10}$ |
| 4028 | $L_{A188}$ | $L_{B10}$ |
| 4029 | $L_{A189}$ | $L_{B10}$ |
| 4030 | $L_{A190}$ | $L_{B10}$ |
| 4031 | $L_{A191}$ | $L_{B10}$ |
| 4032 | $L_{A192}$ | $L_{B10}$ |
| 4033 | $L_{A193}$ | $L_{B10}$ |
| 4034 | $L_{A194}$ | $L_{B10}$ |
| 4035 | $L_{A195}$ | $L_{B10}$ |
| 4036 | $L_{A196}$ | $L_{B10}$ |
| 4037 | $L_{A197}$ | $L_{B10}$ |
| 4038 | $L_{A198}$ | $L_{B10}$ |
| 4039 | $L_{A199}$ | $L_{B10}$ |
| 4040 | $L_{A200}$ | $L_{B10}$ |
| 4041 | $L_{A201}$ | $L_{B10}$ |

-continued

| Compound Number | $L_A$ | $L_B$ |
|---|---|---|
| 4042 | $L_{A202}$ | $L_{B10}$ |
| 4043 | $L_{A203}$ | $L_{B10}$ |
| 4044 | $L_{A204}$ | $L_{B10}$ |
| 4045 | $L_{A205}$ | $L_{B10}$ |
| 4046 | $L_{A206}$ | $L_{B10}$ |
| 4047 | $L_{A207}$ | $L_{B10}$ |
| 4048 | $L_{A208}$ | $L_{B10}$ |
| 4049 | $L_{A209}$ | $L_{B10}$ |
| 4050 | $L_{A210}$ | $L_{B10}$ |
| 4051 | $L_{A211}$ | $L_{B10}$ |
| 4052 | $L_{A212}$ | $L_{B10}$ |
| 4053 | $L_{A213}$ | $L_{B10}$ |
| 4054 | $L_{A214}$ | $L_{B10}$ |
| 4055 | $L_{A215}$ | $L_{B10}$ |
| 4056 | $L_{A216}$ | $L_{B10}$ |
| 4057 | $L_{A217}$ | $L_{B10}$ |
| 4058 | $L_{A218}$ | $L_{B10}$ |
| 4059 | $L_{A219}$ | $L_{B10}$ |
| 4060 | $L_{A220}$ | $L_{B10}$ |
| 4061 | $L_{A221}$ | $L_{B10}$ |
| 4062 | $L_{A222}$ | $L_{B10}$ |
| 4063 | $L_{A223}$ | $L_{B10}$ |
| 4064 | $L_{A224}$ | $L_{B10}$ |
| 4065 | $L_{A225}$ | $L_{B10}$ |
| 4066 | $L_{A226}$ | $L_{B10}$ |
| 4067 | $L_{A227}$ | $L_{B10}$ |
| 4068 | $L_{A228}$ | $L_{B10}$ |
| 4069 | $L_{A229}$ | $L_{B10}$ |
| 4070 | $L_{A230}$ | $L_{B10}$ |
| 4071 | $L_{A231}$ | $L_{B10}$ |
| 4072 | $L_{A232}$ | $L_{B10}$ |
| 4073 | $L_{A233}$ | $L_{B10}$ |
| 4074 | $L_{A234}$ | $L_{B10}$ |
| 4075 | $L_{A235}$ | $L_{B10}$ |
| 4076 | $L_{A236}$ | $L_{B10}$ |
| 4077 | $L_{A237}$ | $L_{B10}$ |
| 4078 | $L_{A238}$ | $L_{B10}$ |
| 4079 | $L_{A239}$ | $L_{B10}$ |
| 4080 | $L_{A240}$ | $L_{B10}$ |
| 4081 | $L_{A241}$ | $L_{B10}$ |
| 4082 | $L_{A242}$ | $L_{B10}$ |
| 4083 | $L_{A243}$ | $L_{B10}$ |
| 4084 | $L_{A244}$ | $L_{B10}$ |
| 4085 | $L_{A245}$ | $L_{B10}$ |
| 4086 | $L_{A246}$ | $L_{B10}$ |
| 4087 | $L_{A247}$ | $L_{B10}$ |
| 4088 | $L_{A248}$ | $L_{B10}$ |
| 4089 | $L_{A249}$ | $L_{B10}$ |
| 4090 | $L_{A250}$ | $L_{B10}$ |
| 4091 | $L_{A251}$ | $L_{B10}$ |
| 4092 | $L_{A252}$ | $L_{B10}$ |
| 4093 | $L_{A253}$ | $L_{B10}$ |
| 4094 | $L_{A254}$ | $L_{B10}$ |
| 4095 | $L_{A255}$ | $L_{B10}$ |
| 4096 | $L_{A256}$ | $L_{B10}$ |
| 4097 | $L_{A257}$ | $L_{B10}$ |
| 4098 | $L_{A258}$ | $L_{B10}$ |
| 4099 | $L_{A259}$ | $L_{B10}$ |
| 4100 | $L_{A260}$ | $L_{B10}$ |
| 4101 | $L_{A261}$ | $L_{B10}$ |
| 4102 | $L_{A262}$ | $L_{B10}$ |
| 4103 | $L_{A263}$ | $L_{B10}$ |
| 4104 | $L_{A264}$ | $L_{B10}$ |
| 4105 | $L_{A265}$ | $L_{B10}$ |
| 4106 | $L_{A266}$ | $L_{B10}$ |
| 4107 | $L_{A267}$ | $L_{B10}$ |
| 4108 | $L_{A268}$ | $L_{B10}$ |
| 4109 | $L_{A269}$ | $L_{B10}$ |
| 4110 | $L_{A270}$ | $L_{B10}$ |
| 4111 | $L_{A271}$ | $L_{B10}$ |
| 4112 | $L_{A272}$ | $L_{B10}$ |
| 4113 | $L_{A273}$ | $L_{B10}$ |
| 4114 | $L_{A274}$ | $L_{B10}$ |
| 4115 | $L_{A275}$ | $L_{B10}$ |
| 4116 | $L_{A276}$ | $L_{B10}$ |
| 4117 | $L_{A277}$ | $L_{B10}$ |

-continued

| Compound Number | $L_A$ | $L_B$ |
|---|---|---|
| 4118 | $L_{A278}$ | $L_{B10}$ |
| 4119 | $L_{A279}$ | $L_{B10}$ |
| 4120 | $L_{A280}$ | $L_{B10}$ |
| 4121 | $L_{A281}$ | $L_{B10}$ |
| 4122 | $L_{A282}$ | $L_{B10}$ |
| 4123 | $L_{A283}$ | $L_{B10}$ |
| 4124 | $L_{A284}$ | $L_{B10}$ |
| 4125 | $L_{A285}$ | $L_{B10}$ |
| 4126 | $L_{A286}$ | $L_{B10}$ |
| 4127 | $L_{A287}$ | $L_{B10}$ |
| 4128 | $L_{A288}$ | $L_{B10}$ |
| 4129 | $L_{A289}$ | $L_{B10}$ |
| 4130 | $L_{A290}$ | $L_{B10}$ |
| 4131 | $L_{A291}$ | $L_{B10}$ |
| 4132 | $L_{A292}$ | $L_{B10}$ |
| 4133 | $L_{A293}$ | $L_{B10}$ |
| 4134 | $L_{A294}$ | $L_{B10}$ |
| 4135 | $L_{A295}$ | $L_{B10}$ |
| 4136 | $L_{A296}$ | $L_{B10}$ |
| 4137 | $L_{A297}$ | $L_{B10}$ |
| 4138 | $L_{A298}$ | $L_{B10}$ |
| 4139 | $L_{A299}$ | $L_{B10}$ |
| 4140 | $L_{A300}$ | $L_{B10}$ |
| 4141 | $L_{A301}$ | $L_{B10}$ |
| 4142 | $L_{A302}$ | $L_{B10}$ |
| 4143 | $L_{A303}$ | $L_{B10}$ |
| 4144 | $L_{A304}$ | $L_{B10}$ |
| 4145 | $L_{A305}$ | $L_{B10}$ |
| 4146 | $L_{A306}$ | $L_{B10}$ |
| 4147 | $L_{A307}$ | $L_{B10}$ |
| 4148 | $L_{A308}$ | $L_{B10}$ |
| 4149 | $L_{A309}$ | $L_{B10}$ |
| 4150 | $L_{A310}$ | $L_{B10}$ |
| 4151 | $L_{A311}$ | $L_{B10}$ |
| 4152 | $L_{A312}$ | $L_{B10}$ |
| 4153 | $L_{A313}$ | $L_{B10}$ |
| 4154 | $L_{A314}$ | $L_{B10}$ |
| 4155 | $L_{A315}$ | $L_{B10}$ |
| 4156 | $L_{A316}$ | $L_{B10}$ |
| 4157 | $L_{A317}$ | $L_{B10}$ |
| 4158 | $L_{A318}$ | $L_{B10}$ |
| 4159 | $L_{A319}$ | $L_{B10}$ |
| 4160 | $L_{A320}$ | $L_{B10}$ |
| 4161 | $L_{A321}$ | $L_{B10}$ |
| 4162 | $L_{A322}$ | $L_{B10}$ |
| 4163 | $L_{A323}$ | $L_{B10}$ |
| 4164 | $L_{A324}$ | $L_{B10}$ |
| 4165 | $L_{A325}$ | $L_{B10}$ |
| 4166 | $L_{A326}$ | $L_{B10}$ |
| 4167 | $L_{A327}$ | $L_{B10}$ |
| 4168 | $L_{A328}$ | $L_{B10}$ |
| 4169 | $L_{A329}$ | $L_{B10}$ |
| 4170 | $L_{A330}$ | $L_{B10}$ |
| 4171 | $L_{A331}$ | $L_{B10}$ |
| 4172 | $L_{A332}$ | $L_{B10}$ |
| 4173 | $L_{A333}$ | $L_{B10}$ |
| 4174 | $L_{A334}$ | $L_{B10}$ |
| 4175 | $L_{A335}$ | $L_{B10}$ |
| 4176 | $L_{A336}$ | $L_{B10}$ |
| 4177 | $L_{A337}$ | $L_{B10}$ |
| 4178 | $L_{A338}$ | $L_{B10}$ |
| 4179 | $L_{A339}$ | $L_{B10}$ |
| 4180 | $L_{A340}$ | $L_{B10}$ |
| 4181 | $L_{A341}$ | $L_{B10}$ |
| 4182 | $L_{A342}$ | $L_{B10}$ |
| 4183 | $L_{A343}$ | $L_{B10}$ |
| 4184 | $L_{A344}$ | $L_{B10}$ |
| 4185 | $L_{A345}$ | $L_{B10}$ |
| 4186 | $L_{A346}$ | $L_{B10}$ |
| 4187 | $L_{A347}$ | $L_{B10}$ |
| 4188 | $L_{A348}$ | $L_{B10}$ |
| 4189 | $L_{A349}$ | $L_{B10}$ |
| 4190 | $L_{A350}$ | $L_{B10}$ |
| 4191 | $L_{A351}$ | $L_{B10}$ |
| 4192 | $L_{A352}$ | $L_{B10}$ |
| 4193 | $L_{A353}$ | $L_{B10}$ |

-continued

| Compound Number | $L_A$ | $L_B$ |
|---|---|---|
| 4194 | $L_{A354}$ | $L_{B10}$ |
| 4195 | $L_{A355}$ | $L_{B10}$ |
| 4196 | $L_{A356}$ | $L_{B10}$ |
| 4197 | $L_{A357}$ | $L_{B10}$ |
| 4198 | $L_{A358}$ | $L_{B10}$ |
| 4199 | $L_{A359}$ | $L_{B10}$ |
| 4200 | $L_{A360}$ | $L_{B10}$ |
| 4201 | $L_{A361}$ | $L_{B10}$ |
| 4202 | $L_{A362}$ | $L_{B10}$ |
| 4203 | $L_{A363}$ | $L_{B10}$ |
| 4204 | $L_{A364}$ | $L_{B10}$ |
| 4205 | $L_{A365}$ | $L_{B10}$ |
| 4206 | $L_{A366}$ | $L_{B10}$ |
| 4207 | $L_{A367}$ | $L_{B10}$ |
| 4208 | $L_{A368}$ | $L_{B10}$ |
| 4209 | $L_{A369}$ | $L_{B10}$ |
| 4210 | $L_{A370}$ | $L_{B10}$ |
| 4211 | $L_{A371}$ | $L_{B10}$ |
| 4212 | $L_{A372}$ | $L_{B10}$ |
| 4213 | $L_{A373}$ | $L_{B10}$ |
| 4214 | $L_{A374}$ | $L_{B10}$ |
| 4215 | $L_{A375}$ | $L_{B10}$ |
| 4216 | $L_{A376}$ | $L_{B10}$ |
| 4217 | $L_{A377}$ | $L_{B10}$ |
| 4218 | $L_{A378}$ | $L_{B10}$ |
| 4219 | $L_{A379}$ | $L_{B10}$ |
| 4220 | $L_{A380}$ | $L_{B10}$ |
| 4221 | $L_{A381}$ | $L_{B10}$ |
| 4222 | $L_{A382}$ | $L_{B10}$ |
| 4223 | $L_{A383}$ | $L_{B10}$ |
| 4224 | $L_{A384}$ | $L_{B10}$ |
| 4225 | $L_{A385}$ | $L_{B10}$ |
| 4226 | $L_{A386}$ | $L_{B10}$ |
| 4227 | $L_{A387}$ | $L_{B10}$ |
| 4228 | $L_{A388}$ | $L_{B10}$ |
| 4229 | $L_{A389}$ | $L_{B10}$ |
| 4230 | $L_{A390}$ | $L_{B10}$ |
| 4231 | $L_{A391}$ | $L_{B10}$ |
| 4232 | $L_{A392}$ | $L_{B10}$ |
| 4233 | $L_{A393}$ | $L_{B10}$ |
| 4234 | $L_{A394}$ | $L_{B10}$ |
| 4235 | $L_{A395}$ | $L_{B10}$ |
| 4236 | $L_{A396}$ | $L_{B10}$ |
| 4237 | $L_{A397}$ | $L_{B10}$ |
| 4238 | $L_{A398}$ | $L_{B10}$ |
| 4239 | $L_{A399}$ | $L_{B10}$ |
| 4240 | $L_{A400}$ | $L_{B10}$ |
| 4241 | $L_{A401}$ | $L_{B10}$ |
| 4242 | $L_{A402}$ | $L_{B10}$ |
| 4243 | $L_{A403}$ | $L_{B10}$ |
| 4244 | $L_{A404}$ | $L_{B10}$ |
| 4245 | $L_{A405}$ | $L_{B10}$ |
| 4246 | $L_{A406}$ | $L_{B10}$ |
| 4247 | $L_{A407}$ | $L_{B10}$ |
| 4248 | $L_{A408}$ | $L_{B10}$ |
| 4249 | $L_{A409}$ | $L_{B10}$ |
| 4250 | $L_{A410}$ | $L_{B10}$ |
| 4251 | $L_{A411}$ | $L_{B10}$ |
| 4252 | $L_{A412}$ | $L_{B10}$ |
| 4253 | $L_{A413}$ | $L_{B10}$ |
| 4254 | $L_{A414}$ | $L_{B10}$ |
| 4255 | $L_{A415}$ | $L_{B10}$ |
| 4256 | $L_{A416}$ | $L_{B10}$ |
| 4257 | $L_{A417}$ | $L_{B10}$ |
| 4258 | $L_{A418}$ | $L_{B10}$ |
| 4259 | $L_{A419}$ | $L_{B10}$ |
| 4260 | $L_{A420}$ | $L_{B10}$ |
| 4261 | $L_{A421}$ | $L_{B10}$ |
| 4262 | $L_{A422}$ | $L_{B10}$ |
| 4263 | $L_{A423}$ | $L_{B10}$ |
| 4264 | $L_{A424}$ | $L_{B10}$ |
| 4265 | $L_{A425}$ | $L_{B10}$ |
| 4266 | $L_{A426}$ | $L_{B10}$ |
| 4267 | $L_{A427}$ | $L_{B10}$ |
| 4268 | $L_{A428}$ | $L_{B10}$ |
| 4269 | $L_{A429}$ | $L_{B10}$ |

-continued

| Compound Number | $L_A$ | $L_B$ |
|---|---|---|
| 4270 | $L_{A430}$ | $L_{B10}$ |
| 4271 | $L_{A431}$ | $L_{B10}$ |
| 4272 | $L_{A432}$ | $L_{B10}$ |
| 4273 | $L_{A433}$ | $L_{B10}$ |
| 4274 | $L_{A434}$ | $L_{B10}$ |
| 4275 | $L_{A435}$ | $L_{B10}$ |
| 4276 | $L_{A436}$ | $L_{B10}$ |
| 4277 | $L_{A437}$ | $L_{B10}$ |
| 4278 | $L_{A438}$ | $L_{B10}$ |
| 4279 | $L_{A439}$ | $L_{B10}$ |
| 4280 | $L_{A440}$ | $L_{B10}$ |
| 4281 | $L_{A441}$ | $L_{B10}$ |
| 4282 | $L_{A442}$ | $L_{B10}$ |
| 4283 | $L_{A443}$ | $L_{B10}$ |
| 4284 | $L_{A444}$ | $L_{B10}$ |
| 4285 | $L_{A445}$ | $L_{B10}$ |
| 4286 | $L_{A446}$ | $L_{B10}$ |
| 4287 | $L_{A447}$ | $L_{B10}$ |
| 4288 | $L_{A448}$ | $L_{B10}$ |
| 4289 | $L_{A449}$ | $L_{B10}$ |
| 4290 | $L_{A450}$ | $L_{B10}$ |
| 4291 | $L_{A451}$ | $L_{B10}$ |
| 4292 | $L_{A452}$ | $L_{B10}$ |
| 4293 | $L_{A453}$ | $L_{B10}$ |
| 4294 | $L_{A454}$ | $L_{B10}$ |
| 4295 | $L_{A455}$ | $L_{B10}$ |
| 4296 | $L_{A456}$ | $L_{B10}$ |
| 4297 | $L_{A457}$ | $L_{B10}$ |
| 4298 | $L_{A458}$ | $L_{B10}$ |
| 4299 | $L_{A459}$ | $L_{B10}$ |
| 4300 | $L_{A460}$ | $L_{B10}$ |
| 4301 | $L_{A461}$ | $L_{B10}$ |
| 4302 | $L_{A462}$ | $L_{B10}$ |
| 4303 | $L_{A463}$ | $L_{B10}$ |
| 4304 | $L_{A464}$ | $L_{B10}$ |
| 4305 | $L_{A465}$ | $L_{B10}$ |
| 4306 | $L_{A466}$ | $L_{B10}$ |
| 4307 | $L_{A467}$ | $L_{B10}$ |
| 4308 | $L_{A468}$ | $L_{B10}$ |
| 4309 | $L_{A469}$ | $L_{B10}$ |
| 4310 | $L_{A470}$ | $L_{B10}$ |
| 4311 | $L_{A471}$ | $L_{B10}$ |
| 4312 | $L_{A472}$ | $L_{B10}$ |
| 4313 | $L_{A473}$ | $L_{B10}$ |
| 4314 | $L_{A474}$ | $L_{B10}$ |
| 4315 | $L_{A475}$ | $L_{B10}$ |
| 4316 | $L_{A476}$ | $L_{B10}$ |
| 4317 | $L_{A477}$ | $L_{B10}$ |
| 4318 | $L_{A478}$ | $L_{B10}$ |
| 4319 | $L_{A479}$ | $L_{B10}$ |
| 4320 | $L_{A480}$ | $L_{B10}$ |
| 4321 | $L_{A481}$ | $L_{B10}$ |
| 4322 | $L_{A482}$ | $L_{B10}$ |
| 4323 | $L_{A483}$ | $L_{B10}$ |
| 4324 | $L_{A484}$ | $L_{B10}$ |
| 4325 | $L_{A485}$ | $L_{B10}$ |
| 4326 | $L_{A486}$ | $L_{B10}$ |
| 4327 | $L_{A487}$ | $L_{B10}$ |
| 4328 | $L_{A488}$ | $L_{B10}$ |
| 4329 | $L_{A489}$ | $L_{B10}$ |
| 4330 | $L_{A490}$ | $L_{B10}$ |
| 4331 | $L_{A491}$ | $L_{B10}$ |
| 4332 | $L_{A492}$ | $L_{B10}$ |
| 4333 | $L_{A493}$ | $L_{B10}$ |
| 4334 | $L_{A494}$ | $L_{B10}$ |
| 4335 | $L_{A495}$ | $L_{B10}$ |
| 4336 | $L_{A496}$ | $L_{B10}$ |
| 4337 | $L_{A497}$ | $L_{B10}$ |
| 4338 | $L_{A498}$ | $L_{B10}$ |
| 4339 | $L_{A499}$ | $L_{B10}$ |
| 4340 | $L_{A500}$ | $L_{B10}$ |
| 4341 | $L_{A501}$ | $L_{B10}$ |
| 4342 | $L_{A502}$ | $L_{B10}$ |
| 4343 | $L_{A503}$ | $L_{B10}$ |
| 4344 | $L_{A504}$ | $L_{B10}$ |
| 4345 | $L_{A505}$ | $L_{B10}$ |

-continued

| Compound Number | $L_A$ | $L_B$ |
|---|---|---|
| 4346 | $L_{A506}$ | $L_{B10}$ |
| 4347 | $L_{A507}$ | $L_{B10}$ |
| 4348 | $L_{A508}$ | $L_{B10}$ |
| 4349 | $L_{A509}$ | $L_{B10}$ |
| 4350 | $L_{A510}$ | $L_{B10}$ |
| 4351 | $L_{A511}$ | $L_{B10}$ |
| 4352 | $L_{A512}$ | $L_{B10}$ |
| 4353 | $L_{A513}$ | $L_{B10}$ |
| 4354 | $L_{A514}$ | $L_{B10}$ |
| 4355 | $L_{A515}$ | $L_{B10}$ |
| 4356 | $L_{A516}$ | $L_{B10}$ |
| 4357 | $L_{A517}$ | $L_{B10}$ |
| 4358 | $L_{A518}$ | $L_{B10}$ |
| 4359 | $L_{A519}$ | $L_{B10}$ |
| 4360 | $L_{A520}$ | $L_{B10}$ |
| 4361 | $L_{A521}$ | $L_{B10}$ |
| 4362 | $L_{A522}$ | $L_{B10}$ |
| 4363 | $L_{A523}$ | $L_{B10}$ |
| 4364 | $L_{A524}$ | $L_{B10}$ |
| 4365 | $L_{A525}$ | $L_{B10}$ |
| 4366 | $L_{A526}$ | $L_{B10}$ |
| 4367 | $L_{A527}$ | $L_{B10}$ |
| 4368 | $L_{A528}$ | $L_{B10}$ |
| 4369 | $L_{A529}$ | $L_{B10}$ |
| 4370 | $L_{A530}$ | $L_{B10}$ |
| 4371 | $L_{A531}$ | $L_{B10}$ |
| 4372 | $L_{A532}$ | $L_{B10}$ |
| 4373 | $L_{A533}$ | $L_{B10}$ |
| 4374 | $L_{A534}$ | $L_{B10}$ |
| 4375 | $L_{A535}$ | $L_{B10}$ |
| 4376 | $L_{A536}$ | $L_{B10}$ |
| 4377 | $L_{A537}$ | $L_{B10}$ |
| 4378 | $L_{A538}$ | $L_{B10}$ |
| 4379 | $L_{A539}$ | $L_{B10}$ |
| 4380 | $L_{A540}$ | $L_{B10}$ |
| 4381 | $L_{A541}$ | $L_{B10}$ |
| 4382 | $L_{A542}$ | $L_{B10}$ |
| 4383 | $L_{A543}$ | $L_{B10}$ |
| 4384 | $L_{A544}$ | $L_{B10}$ |
| 4385 | $L_{A545}$ | $L_{B10}$ |
| 4386 | $L_{A546}$ | $L_{B10}$ |
| 4387 | $L_{A547}$ | $L_{B10}$ |
| 4388 | $L_{A548}$ | $L_{B10}$ |
| 4389 | $L_{A549}$ | $L_{B10}$ |
| 4390 | $L_{A550}$ | $L_{B10}$ |
| 4391 | $L_{A551}$ | $L_{B10}$ |
| 4392 | $L_{A552}$ | $L_{B10}$ |
| 4393 | $L_{A553}$ | $L_{B10}$ |
| 4394 | $L_{A554}$ | $L_{B10}$ |
| 4395 | $L_{A555}$ | $L_{B10}$ |
| 4396 | $L_{A556}$ | $L_{B10}$ |
| 4397 | $L_{A557}$ | $L_{B10}$ |
| 4398 | $L_{A558}$ | $L_{B10}$ |
| 4399 | $L_{A559}$ | $L_{B10}$ |
| 4400 | $L_{A560}$ | $L_{B10}$ |
| 4401 | $L_{A561}$ | $L_{B10}$ |
| 4402 | $L_{A562}$ | $L_{B10}$ |
| 4403 | $L_{A563}$ | $L_{B10}$ |
| 4404 | $L_{A564}$ | $L_{B10}$ |
| 4405 | $L_{A565}$ | $L_{B10}$ |
| 4406 | $L_{A566}$ | $L_{B10}$ |
| 4407 | $L_{A567}$ | $L_{B10}$ |
| 4408 | $L_{A568}$ | $L_{B10}$ |
| 4409 | $L_{A569}$ | $L_{B10}$ |
| 4410 | $L_{A570}$ | $L_{B10}$ |
| 4411 | $L_{A571}$ | $L_{B10}$ |
| 4412 | $L_{A572}$ | $L_{B10}$ |
| 4413 | $L_{A573}$ | $L_{B10}$ |
| 4414 | $L_{A574}$ | $L_{B10}$ |
| 4415 | $L_{A575}$ | $L_{B10}$ |
| 4416 | $L_{A576}$ | $L_{B10}$ |
| 4417 | $L_{A577}$ | $L_{B10}$ |
| 4418 | $L_{A578}$ | $L_{B10}$ |
| 4419 | $L_{A579}$ | $L_{B10}$ |
| 4420 | $L_{A580}$ | $L_{B10}$ |
| 4421 | $L_{A581}$ | $L_{B10}$ |

-continued

| Compound Number | $L_A$ | $L_B$ |
|---|---|---|
| 4422 | $L_{A582}$ | $L_{B10}$ |
| 4423 | $L_{A583}$ | $L_{B10}$ |
| 4424 | $L_{A584}$ | $L_{B10}$ |
| 4425 | $L_{A585}$ | $L_{B10}$ |
| 4426 | $L_{A586}$ | $L_{B10}$ |
| 4427 | $L_{A587}$ | $L_{B10}$ |
| 4428 | $L_{A588}$ | $L_{B10}$ |
| 4429 | $L_{A589}$ | $L_{B10}$ |
| 4430 | $L_{A590}$ | $L_{B10}$ |
| 4431 | $L_{A591}$ | $L_{B10}$ |
| 4432 | $L_{A592}$ | $L_{B10}$ |
| 4433 | $L_{A593}$ | $L_{B10}$ |
| 4434 | $L_{A594}$ | $L_{B10}$ |
| 4435 | $L_{A595}$ | $L_{B10}$ |
| 4436 | $L_{A596}$ | $L_{B10}$ |
| 4437 | $L_{A597}$ | $L_{B10}$ |
| 4438 | $L_{A598}$ | $L_{B10}$ |
| 4439 | $L_{A599}$ | $L_{B10}$ |
| 4440 | $L_{A600}$ | $L_{B10}$ |
| 4441 | $L_{A601}$ | $L_{B10}$ |
| 4442 | $L_{A602}$ | $L_{B10}$ |
| 4443 | $L_{A603}$ | $L_{B10}$ |
| 4444 | $L_{A604}$ | $L_{B10}$ |
| 4445 | $L_{A605}$ | $L_{B10}$ |
| 4446 | $L_{A606}$ | $L_{B10}$ |
| 4447 | $L_{A607}$ | $L_{B10}$ |
| 4448 | $L_{A608}$ | $L_{B10}$ |
| 4449 | $L_{A609}$ | $L_{B10}$ |
| 4450 | $L_{A610}$ | $L_{B10}$ |
| 4451 | $L_{A611}$ | $L_{B10}$ |
| 4452 | $L_{A612}$ | $L_{B10}$ |
| 4453 | $L_{A613}$ | $L_{B10}$ |
| 4454 | $L_{A614}$ | $L_{B10}$ |
| 4455 | $L_{A615}$ | $L_{B10}$ |
| 4456 | $L_{A616}$ | $L_{B10}$ |
| 4457 | $L_{A617}$ | $L_{B10}$ |
| 4458 | $L_{A618}$ | $L_{B10}$ |
| 4459 | $L_{A619}$ | $L_{B10}$ |
| 4460 | $L_{A620}$ | $L_{B10}$ |
| 4461 | $L_{A621}$ | $L_{B10}$ |
| 4462 | $L_{A622}$ | $L_{B10}$ |
| 4463 | $L_{A623}$ | $L_{B10}$ |
| 4464 | $L_{A624}$ | $L_{B10}$ |
| 4465 | $L_{A625}$ | $L_{B10}$ |
| 4466 | $L_{A626}$ | $L_{B10}$ |
| 4467 | $L_{A627}$ | $L_{B10}$ |
| 4468 | $L_{A628}$ | $L_{B10}$ |
| 4469 | $L_{A629}$ | $L_{B10}$ |
| 4470 | $L_{A630}$ | $L_{B10}$ |
| 4471 | $L_{A631}$ | $L_{B10}$ |
| 4472 | $L_{A632}$ | $L_{B10}$ |
| 4473 | $L_{A633}$ | $L_{B10}$ |
| 4474 | $L_{A634}$ | $L_{B10}$ |
| 4475 | $L_{A635}$ | $L_{B10}$ |
| 4476 | $L_{A636}$ | $L_{B10}$ |
| 4477 | $L_{A637}$ | $L_{B10}$ |
| 4478 | $L_{A638}$ | $L_{B10}$ |
| 4479 | $L_{A639}$ | $L_{B10}$ |
| 4480 | $L_{A640}$ | $L_{B10}$ |
| 4481 | $L_{A641}$ | $L_{B10}$ |
| 4482 | $L_{A642}$ | $L_{B10}$ |
| 4483 | $L_{A643}$ | $L_{B10}$ |
| 4484 | $L_{A644}$ | $L_{B10}$ |
| 4485 | $L_{A645}$ | $L_{B10}$ |
| 4486 | $L_{A646}$ | $L_{B10}$ |
| 4487 | $L_{A647}$ | $L_{B10}$ |
| 4488 | $L_{A648}$ | $L_{B10}$ |
| 4489 | $L_{A649}$ | $L_{B10}$ |
| 4490 | $L_{A650}$ | $L_{B10}$ |
| 4491 | $L_{A651}$ | $L_{B10}$ |
| 4492 | $L_{A652}$ | $L_{B10}$ |
| 4493 | $L_{A653}$ | $L_{B10}$ |
| 4494 | $L_{A654}$ | $L_{B10}$ |
| 4495 | $L_{A655}$ | $L_{B10}$ |
| 4496 | $L_{A656}$ | $L_{B10}$ |
| 4497 | $L_{A657}$ | $L_{B10}$ |

-continued

| Compound Number | $L_A$ | $L_B$ |
|---|---|---|
| 4498 | $L_{A658}$ | $L_{B10}$ |
| 4499 | $L_{A659}$ | $L_{B10}$ |
| 4500 | $L_{A660}$ | $L_{B10}$ |
| 4501 | $L_{A661}$ | $L_{B10}$ |
| 4502 | $L_{A662}$ | $L_{B10}$ |
| 4503 | $L_{A663}$ | $L_{B10}$ |
| 4504 | $L_{A664}$ | $L_{B10}$ |
| 4505 | $L_{A665}$ | $L_{B10}$ |
| 4506 | $L_{A666}$ | $L_{B10}$ |
| 4507 | $L_{A667}$ | $L_{B10}$ |
| 4508 | $L_{A668}$ | $L_{B10}$ |
| 4509 | $L_{A669}$ | $L_{B10}$ |
| 4510 | $L_{A670}$ | $L_{B10}$ |
| 4511 | $L_{A671}$ | $L_{B10}$ |
| 4512 | $L_{A672}$ | $L_{B10}$ |
| 4513 | $L_{A673}$ | $L_{B10}$ |
| 4514 | $L_{A674}$ | $L_{B10}$ |
| 4515 | $L_{A675}$ | $L_{B10}$ |
| 4516 | $L_{A676}$ | $L_{B10}$ |
| 4517 | $L_{A677}$ | $L_{B10}$ |
| 4518 | $L_{A678}$ | $L_{B10}$ |
| 4519 | $L_{A679}$ | $L_{B10}$ |
| 4520 | $L_{A680}$ | $L_{B10}$ |
| 4521 | $L_{A681}$ | $L_{B10}$ |
| 4522 | $L_{A682}$ | $L_{B10}$ |
| 4523 | $L_{A683}$ | $L_{B10}$ |
| 4524 | $L_{A684}$ | $L_{B10}$ |
| 4525 | $L_{A685}$ | $L_{B10}$ |
| 4526 | $L_{A686}$ | $L_{B10}$ |
| 4527 | $L_{A687}$ | $L_{B10}$ |
| 4528 | $L_{A688}$ | $L_{B10}$ |
| 4529 | $L_{A689}$ | $L_{B10}$ |
| 4530 | $L_{A690}$ | $L_{B10}$ |
| 4531 | $L_{A691}$ | $L_{B10}$ |
| 4532 | $L_{A692}$ | $L_{B10}$ |
| 4533 | $L_{A693}$ | $L_{B10}$ |
| 4534 | $L_{A694}$ | $L_{B10}$ |
| 4535 | $L_{A695}$ | $L_{B10}$ |
| 4536 | $L_{A696}$ | $L_{B10}$ |
| 4537 | $L_{A697}$ | $L_{B10}$ |
| 4538 | $L_{A698}$ | $L_{B10}$ |
| 4539 | $L_{A699}$ | $L_{B10}$ |
| 4540 | $L_{A700}$ | $L_{B10}$ |
| 4541 | $L_{A701}$ | $L_{B10}$ |
| 4542 | $L_{A702}$ | $L_{B10}$ |
| 4543 | $L_{A703}$ | $L_{B10}$ |
| 4544 | $L_{A704}$ | $L_{B10}$ |
| 4545 | $L_{A705}$ | $L_{B10}$ |
| 4546 | $L_{A706}$ | $L_{B10}$ |
| 4547 | $L_{A707}$ | $L_{B10}$ |
| 4548 | $L_{A708}$ | $L_{B10}$ |
| 4549 | $L_{A709}$ | $L_{B10}$ |
| 4550 | $L_{A710}$ | $L_{B10}$ |
| 4551 | $L_{A711}$ | $L_{B10}$ |
| 4552 | $L_{A712}$ | $L_{B10}$ |
| 4553 | $L_{A713}$ | $L_{B10}$ |
| 4554 | $L_{A714}$ | $L_{B10}$ |
| 4555 | $L_{A715}$ | $L_{B10}$ |
| 4556 | $L_{A716}$ | $L_{B10}$ |
| 4557 | $L_{A717}$ | $L_{B10}$ |
| 4558 | $L_{A718}$ | $L_{B10}$ |
| 4559 | $L_{A719}$ | $L_{B10}$ |
| 4560 | $L_{A720}$ | $L_{B10}$ |
| 4561 | $L_{A721}$ | $L_{B10}$ |
| 4562 | $L_{A722}$ | $L_{B10}$ |
| 4563 | $L_{A723}$ | $L_{B10}$ |
| 4564 | $L_{A724}$ | $L_{B10}$ |
| 4565 | $L_{A725}$ | $L_{B10}$ |
| 4566 | $L_{A726}$ | $L_{B10}$ |
| 4567 | $L_{A727}$ | $L_{B10}$ |
| 4568 | $L_{A728}$ | $L_{B10}$ |
| 4569 | $L_{A729}$ | $L_{B10}$ |
| 4570 | $L_{A730}$ | $L_{B10}$ |
| 4571 | $L_{A731}$ | $L_{B10}$ |
| 4572 | $L_{A732}$ | $L_{B10}$ |
| 4573 | $L_{A733}$ | $L_{B10}$ |

-continued

| Compound Number | $L_A$ | $L_B$ |
|---|---|---|
| 4574 | $L_{A734}$ | $L_{B10}$ |
| 4575 | $L_{A735}$ | $L_{B10}$ |
| 4576 | $L_{A736}$ | $L_{B10}$ |
| 4577 | $L_{A737}$ | $L_{B10}$ |
| 4578 | $L_{A738}$ | $L_{B10}$ |
| 4579 | $L_{A739}$ | $L_{B10}$ |
| 4580 | $L_{A740}$ | $L_{B10}$ |
| 4581 | $L_{A741}$ | $L_{B10}$ |
| 4582 | $L_{A742}$ | $L_{B10}$ |
| 4583 | $L_{A743}$ | $L_{B10}$ |
| 4584 | $L_{A744}$ | $L_{B10}$ |
| 4585 | $L_{A745}$ | $L_{B10}$ |
| 4586 | $L_{A746}$ | $L_{B10}$ |
| 4587 | $L_{A747}$ | $L_{B10}$ |
| 4588 | $L_{A748}$ | $L_{B10}$ |
| 4589 | $L_{A749}$ | $L_{B10}$ |
| 4590 | $L_{A750}$ | $L_{B10}$ |
| 4591 | $L_{A751}$ | $L_{B10}$ |
| 4592 | $L_{A752}$ | $L_{B10}$ |
| 4593 | $L_{A753}$ | $L_{B10}$ |
| 4594 | $L_{A754}$ | $L_{B10}$ |
| 4595 | $L_{A755}$ | $L_{B10}$ |
| 4596 | $L_{A756}$ | $L_{B10}$ |
| 4597 | $L_{A757}$ | $L_{B10}$ |
| 4598 | $L_{A758}$ | $L_{B10}$ |
| 4599 | $L_{A759}$ | $L_{B10}$ |
| 4600 | $L_{A760}$ | $L_{B10}$ |
| 4601 | $L_{A761}$ | $L_{B10}$ |
| 4602 | $L_{A762}$ | $L_{B10}$ |
| 4603 | $L_{A763}$ | $L_{B10}$ |
| 4604 | $L_{A764}$ | $L_{B10}$ |
| 4605 | $L_{A765}$ | $L_{B10}$ |
| 4606 | $L_{A766}$ | $L_{B10}$ |
| 4607 | $L_{A767}$ | $L_{B10}$ |
| 4608 | $L_{A768}$ | $L_{B10}$ |
| 4609 | $L_{A769}$ | $L_{B10}$ |
| 4610 | $L_{A770}$ | $L_{B10}$ |
| 4611 | $L_{A771}$ | $L_{B10}$ |
| 4612 | $L_{A772}$ | $L_{B10}$ |
| 4613 | $L_{A773}$ | $L_{B10}$ |
| 4614 | $L_{A774}$ | $L_{B10}$ |
| 4615 | $L_{A775}$ | $L_{B10}$ |
| 4616 | $L_{A776}$ | $L_{B10}$ |
| 4617 | $L_{A777}$ | $L_{B10}$ |
| 4618 | $L_{A778}$ | $L_{B10}$ |
| 4619 | $L_{A779}$ | $L_{B10}$ |
| 4620 | $L_{A780}$ | $L_{B10}$ |
| 4621 | $L_{A781}$ | $L_{B10}$ |
| 4622 | $L_{A782}$ | $L_{B10}$ |
| 4623 | $L_{A783}$ | $L_{B10}$ |
| 4624 | $L_{A784}$ | $L_{B10}$ |
| 4625 | $L_{A785}$ | $L_{B10}$ |
| 4626 | $L_{A786}$ | $L_{B10}$ |
| 4627 | $L_{A787}$ | $L_{B10}$ |
| 4628 | $L_{A788}$ | $L_{B10}$ |
| 4629 | $L_{A789}$ | $L_{B10}$ |
| 4630 | $L_{A790}$ | $L_{B10}$ |
| 4631 | $L_{A791}$ | $L_{B10}$ |
| 4632 | $L_{A792}$ | $L_{B10}$ |
| 4633 | $L_{A793}$ | $L_{B10}$ |
| 4634 | $L_{A794}$ | $L_{B10}$ |
| 4635 | $L_{A795}$ | $L_{B10}$ |
| 4636 | $L_{A796}$ | $L_{B10}$ |
| 4637 | $L_{A797}$ | $L_{B10}$ |
| 4638 | $L_{A798}$ | $L_{B10}$ |
| 4639 | $L_{A799}$ | $L_{B10}$ |
| 4640 | $L_{A800}$ | $L_{B10}$ |
| 4641 | $L_{A801}$ | $L_{B10}$ |
| 4642 | $L_{A802}$ | $L_{B10}$ |
| 4643 | $L_{A803}$ | $L_{B10}$ |
| 4644 | $L_{A804}$ | $L_{B10}$ |
| 4645 | $L_{A805}$ | $L_{B10}$ |
| 4646 | $L_{A806}$ | $L_{B10}$ |
| 4647 | $L_{A807}$ | $L_{B10}$ |
| 4648 | $L_{A808}$ | $L_{B10}$ |
| 4649 | $L_{A809}$ | $L_{B10}$ |

-continued

| Compound Number | $L_A$ | $L_B$ |
|---|---|---|
| 4650 | $L_{A810}$ | $L_{B10}$ |
| 4651 | $L_{A811}$ | $L_{B10}$ |
| 4652 | $L_{A812}$ | $L_{B10}$ |
| 4653 | $L_{A813}$ | $L_{B10}$ |
| 4654 | $L_{A814}$ | $L_{B10}$ |
| 4655 | $L_{A815}$ | $L_{B10}$ |
| 4656 | $L_{A816}$ | $L_{B10}$ |
| 4657 | $L_{A817}$ | $L_{B10}$ |
| 4658 | $L_{A818}$ | $L_{B10}$ |
| 4659 | $L_{A819}$ | $L_{B10}$ |
| 4660 | $L_{A820}$ | $L_{B10}$ |
| 4661 | $L_{A821}$ | $L_{B10}$ |
| 4662 | $L_{A822}$ | $L_{B10}$ |
| 4663 | $L_{A823}$ | $L_{B10}$ |
| 4664 | $L_{A824}$ | $L_{B10}$ |
| 4665 | $L_{A825}$ | $L_{B10}$ |
| 4666 | $L_{A826}$ | $L_{B10}$ |
| 4667 | $L_{A827}$ | $L_{B10}$ |
| 4668 | $L_{A828}$ | $L_{B10}$ |
| 4669 | $L_{A829}$ | $L_{B10}$ |
| 4670 | $L_{A830}$ | $L_{B10}$ |
| 4671 | $L_{A831}$ | $L_{B10}$ |
| 4672 | $L_{A832}$ | $L_{B10}$ |
| 4673 | $L_{A833}$ | $L_{B10}$ |
| 4674 | $L_{A834}$ | $L_{B10}$ |
| 4675 | $L_{A835}$ | $L_{B10}$ |
| 4676 | $L_{A836}$ | $L_{B10}$ |
| 4677 | $L_{A837}$ | $L_{B10}$ |
| 4678 | $L_{A838}$ | $L_{B10}$ |
| 4679 | $L_{A839}$ | $L_{B10}$ |
| 4680 | $L_{A840}$ | $L_{B10}$ |
| 4681 | $L_{A841}$ | $L_{B10}$ |
| 4682 | $L_{A842}$ | $L_{B10}$ |
| 4683 | $L_{A843}$ | $L_{B10}$ |
| 4684 | $L_{A844}$ | $L_{B10}$ |
| 4685 | $L_{A845}$ | $L_{B10}$ |
| 4686 | $L_{A846}$ | $L_{B10}$ |
| 4687 | $L_{A847}$ | $L_{B10}$ |
| 4688 | $L_{A848}$ | $L_{B10}$ |
| 4689 | $L_{A849}$ | $L_{B10}$ |
| 4690 | $L_{A850}$ | $L_{B10}$ |
| 4691 | $L_{A851}$ | $L_{B10}$ |
| 4692 | $L_{A852}$ | $L_{B10}$ |
| 4693 | $L_{A853}$ | $L_{B10}$ |
| 4694 | $L_{A854}$ | $L_{B10}$ |
| 4695 | $L_{A855}$ | $L_{B10}$ |
| 4696 | $L_{A856}$ | $L_{B10}$ |
| 4697 | $L_{A857}$ | $L_{B10}$ |
| 4698 | $L_{A858}$ | $L_{B10}$ |
| 4699 | $L_{A859}$ | $L_{B10}$ |
| 4700 | $L_{A860}$ | $L_{B10}$ |
| 4701 | $L_{A861}$ | $L_{B10}$ |
| 4702 | $L_{A862}$ | $L_{B10}$ |
| 4703 | $L_{A863}$ | $L_{B10}$ |
| 4704 | $L_{A864}$ | $L_{B10}$ |
| 4705 | $L_{A865}$ | $L_{B10}$ |
| 4706 | $L_{A866}$ | $L_{B10}$ |
| 4707 | $L_{A867}$ | $L_{B10}$ |
| 4708 | $L_{A868}$ | $L_{B10}$ |
| 4709 | $L_{A869}$ | $L_{B10}$ |
| 4710 | $L_{A870}$ | $L_{B10}$ |
| 4711 | $L_{A871}$ | $L_{B10}$ |
| 4712 | $L_{A872}$ | $L_{B10}$ |
| 4713 | $L_{A873}$ | $L_{B10}$ |
| 4714 | $L_{A874}$ | $L_{B10}$ |
| 4715 | $L_{A875}$ | $L_{B10}$ |
| 4716 | $L_{A876}$ | $L_{B10}$ |
| 4717 | $L_{A877}$ | $L_{B10}$ |
| 4718 | $L_{A878}$ | $L_{B10}$ |
| 4719 | $L_{A879}$ | $L_{B10}$ |
| 4720 | $L_{A880}$ | $L_{B10}$ |
| 4721 | $L_{A881}$ | $L_{B10}$ |
| 4722 | $L_{A882}$ | $L_{B10}$ |
| 4723 | $L_{A883}$ | $L_{B10}$ |
| 4724 | $L_{A884}$ | $L_{B10}$ |
| 4725 | $L_{A885}$ | $L_{B10}$ |

-continued

| Compound Number | $L_A$ | $L_B$ |
|---|---|---|
| 4726 | $L_{A886}$ | $L_{B10}$ |
| 4727 | $L_{A887}$ | $L_{B10}$ |
| 4728 | $L_{A888}$ | $L_{B10}$ |
| 4729 | $L_{A889}$ | $L_{B10}$ |
| 4730 | $L_{A890}$ | $L_{B10}$ |
| 4731 | $L_{A891}$ | $L_{B10}$ |
| 4732 | $L_{A892}$ | $L_{B10}$ |
| 4733 | $L_{A893}$ | $L_{B10}$ |
| 4734 | $L_{A894}$ | $L_{B10}$ |
| 4735 | $L_{A895}$ | $L_{B10}$ |
| 4736 | $L_{A896}$ | $L_{B10}$ |
| 4737 | $L_{A897}$ | $L_{B10}$ |
| 4738 | $L_{A898}$ | $L_{B10}$ |
| 4739 | $L_{A899}$ | $L_{B10}$ |
| 4740 | $L_{A900}$ | $L_{B10}$ |
| 4741 | $L_{A901}$ | $L_{B10}$ |
| 4742 | $L_{A902}$ | $L_{B10}$ |
| 4743 | $L_{A903}$ | $L_{B10}$ |
| 4744 | $L_{A904}$ | $L_{B10}$ |
| 4745 | $L_{A905}$ | $L_{B10}$ |
| 4746 | $L_{A906}$ | $L_{B10}$ |
| 4747 | $L_{A907}$ | $L_{B10}$ |
| 4748 | $L_{A908}$ | $L_{B10}$ |
| 4749 | $L_{A909}$ | $L_{B10}$ |
| 4750 | $L_{A910}$ | $L_{B10}$ |
| 4751 | $L_{A911}$ | $L_{B10}$ |
| 4752 | $L_{A912}$ | $L_{B10}$ |
| 4753 | $L_{A913}$ | $L_{B10}$ |
| 4754 | $L_{A914}$ | $L_{B10}$ |
| 4755 | $L_{A915}$ | $L_{B10}$ |
| 4756 | $L_{A916}$ | $L_{B10}$ |
| 4757 | $L_{A917}$ | $L_{B10}$ |
| 4758 | $L_{A918}$ | $L_{B10}$ |
| 4759 | $L_{A919}$ | $L_{B10}$ |
| 4760 | $L_{A920}$ | $L_{B10}$ |
| 4761 | $L_{A921}$ | $L_{B10}$ |
| 4762 | $L_{A922}$ | $L_{B10}$ |
| 4763 | $L_{A923}$ | $L_{B10}$ |
| 4764 | $L_{A924}$ | $L_{B10}$ |
| 4765 | $L_{A925}$ | $L_{B10}$ |
| 4766 | $L_{A926}$ | $L_{B10}$ |
| 4767 | $L_{A927}$ | $L_{B10}$ |
| 4768 | $L_{A928}$ | $L_{B10}$ |
| 4769 | $L_{A929}$ | $L_{B10}$ |
| 4770 | $L_{A930}$ | $L_{B10}$ |
| 4771 | $L_{A931}$ | $L_{B10}$ |
| 4772 | $L_{A932}$ | $L_{B10}$ |
| 4773 | $L_{A933}$ | $L_{B10}$ |
| 4774 | $L_{A934}$ | $L_{B10}$ |
| 4775 | $L_{A935}$ | $L_{B10}$ |
| 4776 | $L_{A936}$ | $L_{B10}$ |
| 4777 | $L_{A937}$ | $L_{B10}$ |
| 4778 | $L_{A938}$ | $L_{B10}$ |
| 4779 | $L_{A939}$ | $L_{B10}$ |
| 4780 | $L_{A940}$ | $L_{B10}$ |
| 4781 | $L_{A941}$ | $L_{B10}$ |
| 4782 | $L_{A942}$ | $L_{B10}$ |
| 4783 | $L_{A943}$ | $L_{B10}$ |
| 4784 | $L_{A944}$ | $L_{B10}$ |
| 4785 | $L_{A945}$ | $L_{B10}$ |
| 4786 | $L_{A946}$ | $L_{B10}$ |
| 4787 | $L_{A947}$ | $L_{B10}$ |
| 4788 | $L_{A948}$ | $L_{B10}$ |
| 4789 | $L_{A949}$ | $L_{B10}$ |
| 4790 | $L_{A950}$ | $L_{B10}$ |
| 4791 | $L_{A951}$ | $L_{B10}$ |
| 4792 | $L_{A952}$ | $L_{B10}$ |
| 4793 | $L_{A953}$ | $L_{B10}$ |
| 4794 | $L_{A954}$ | $L_{B10}$ |
| 4795 | $L_{A955}$ | $L_{B10}$ |
| 4796 | $L_{A956}$ | $L_{B10}$ |
| 4797 | $L_{A957}$ | $L_{B10}$ |
| 4798 | $L_{A958}$ | $L_{B10}$ |
| 4799 | $L_{A959}$ | $L_{B10}$ |
| 4800 | $L_{A960}$ | $L_{B10}$ |
| 4801 | $L_{A1}$ | $L_{B12}$ |

-continued

| Compound Number | $L_A$ | $L_B$ |
|---|---|---|
| 4802 | $L_{A2}$ | $L_{B12}$ |
| 4803 | $L_{A3}$ | $L_{B12}$ |
| 4804 | $L_{A4}$ | $L_{B12}$ |
| 4805 | $L_{A5}$ | $L_{B12}$ |
| 4806 | $L_{A6}$ | $L_{B12}$ |
| 4807 | $L_{A7}$ | $L_{B12}$ |
| 4808 | $L_{A8}$ | $L_{B12}$ |
| 4809 | $L_{A9}$ | $L_{B12}$ |
| 4810 | $L_{A10}$ | $L_{B12}$ |
| 4811 | $L_{A11}$ | $L_{B12}$ |
| 4812 | $L_{A12}$ | $L_{B12}$ |
| 4813 | $L_{A13}$ | $L_{B12}$ |
| 4814 | $L_{A14}$ | $L_{B12}$ |
| 4815 | $L_{A15}$ | $L_{B12}$ |
| 4816 | $L_{A16}$ | $L_{B12}$ |
| 4817 | $L_{A17}$ | $L_{B12}$ |
| 4818 | $L_{A18}$ | $L_{B12}$ |
| 4819 | $L_{A19}$ | $L_{B12}$ |
| 4820 | $L_{A20}$ | $L_{B12}$ |
| 4821 | $L_{A21}$ | $L_{B12}$ |
| 4822 | $L_{A22}$ | $L_{B12}$ |
| 4823 | $L_{A23}$ | $L_{B12}$ |
| 4824 | $L_{A24}$ | $L_{B12}$ |
| 4825 | $L_{A25}$ | $L_{B12}$ |
| 4826 | $L_{A26}$ | $L_{B12}$ |
| 4827 | $L_{A27}$ | $L_{B12}$ |
| 4828 | $L_{A28}$ | $L_{B12}$ |
| 4829 | $L_{A29}$ | $L_{B12}$ |
| 4830 | $L_{A30}$ | $L_{B12}$ |
| 4831 | $L_{A31}$ | $L_{B12}$ |
| 4832 | $L_{A32}$ | $L_{B12}$ |
| 4833 | $L_{A33}$ | $L_{B12}$ |
| 4834 | $L_{A34}$ | $L_{B12}$ |
| 4835 | $L_{A35}$ | $L_{B12}$ |
| 4836 | $L_{A36}$ | $L_{B12}$ |
| 4837 | $L_{A37}$ | $L_{B12}$ |
| 4838 | $L_{A38}$ | $L_{B12}$ |
| 4839 | $L_{A39}$ | $L_{B12}$ |
| 4840 | $L_{A40}$ | $L_{B12}$ |
| 4841 | $L_{A41}$ | $L_{B12}$ |
| 4842 | $L_{A42}$ | $L_{B12}$ |
| 4843 | $L_{A43}$ | $L_{B12}$ |
| 4844 | $L_{A44}$ | $L_{B12}$ |
| 4845 | $L_{A45}$ | $L_{B12}$ |
| 4846 | $L_{A46}$ | $L_{B12}$ |
| 4847 | $L_{A47}$ | $L_{B12}$ |
| 4848 | $L_{A48}$ | $L_{B12}$ |
| 4849 | $L_{A49}$ | $L_{B12}$ |
| 4850 | $L_{A50}$ | $L_{B12}$ |
| 4851 | $L_{A51}$ | $L_{B12}$ |
| 4852 | $L_{A52}$ | $L_{B12}$ |
| 4853 | $L_{A53}$ | $L_{B12}$ |
| 4854 | $L_{A54}$ | $L_{B12}$ |
| 4855 | $L_{A55}$ | $L_{B12}$ |
| 4856 | $L_{A56}$ | $L_{B12}$ |
| 4857 | $L_{A57}$ | $L_{B12}$ |
| 4858 | $L_{A58}$ | $L_{B12}$ |
| 4859 | $L_{A59}$ | $L_{B12}$ |
| 4860 | $L_{A60}$ | $L_{B12}$ |
| 4861 | $L_{A61}$ | $L_{B12}$ |
| 4862 | $L_{A62}$ | $L_{B12}$ |
| 4863 | $L_{A63}$ | $L_{B12}$ |
| 4864 | $L_{A64}$ | $L_{B12}$ |
| 4865 | $L_{A65}$ | $L_{B12}$ |
| 4866 | $L_{A66}$ | $L_{B12}$ |
| 4867 | $L_{A67}$ | $L_{B12}$ |
| 4868 | $L_{A68}$ | $L_{B12}$ |
| 4869 | $L_{A69}$ | $L_{B12}$ |
| 4870 | $L_{A70}$ | $L_{B12}$ |
| 4871 | $L_{A71}$ | $L_{B12}$ |
| 4872 | $L_{A72}$ | $L_{B12}$ |
| 4873 | $L_{A73}$ | $L_{B12}$ |
| 4874 | $L_{A74}$ | $L_{B12}$ |
| 4875 | $L_{A75}$ | $L_{B12}$ |
| 4876 | $L_{A76}$ | $L_{B12}$ |
| 4877 | $L_{A77}$ | $L_{B12}$ |

-continued

| Compound Number | $L_A$ | $L_B$ |
|---|---|---|
| 4878 | $L_{A78}$ | $L_{B12}$ |
| 4879 | $L_{A79}$ | $L_{B12}$ |
| 4880 | $L_{A80}$ | $L_{B12}$ |
| 4881 | $L_{A81}$ | $L_{B12}$ |
| 4882 | $L_{A82}$ | $L_{B12}$ |
| 4883 | $L_{A83}$ | $L_{B12}$ |
| 4884 | $L_{A84}$ | $L_{B12}$ |
| 4885 | $L_{A85}$ | $L_{B12}$ |
| 4886 | $L_{A86}$ | $L_{B12}$ |
| 4887 | $L_{A87}$ | $L_{B12}$ |
| 4888 | $L_{A88}$ | $L_{B12}$ |
| 4889 | $L_{A89}$ | $L_{B12}$ |
| 4890 | $L_{A90}$ | $L_{B12}$ |
| 4891 | $L_{A91}$ | $L_{B12}$ |
| 4892 | $L_{A92}$ | $L_{B12}$ |
| 4893 | $L_{A93}$ | $L_{B12}$ |
| 4894 | $L_{A94}$ | $L_{B12}$ |
| 4895 | $L_{A95}$ | $L_{B12}$ |
| 4896 | $L_{A96}$ | $L_{B12}$ |
| 4897 | $L_{A97}$ | $L_{B12}$ |
| 4898 | $L_{A98}$ | $L_{B12}$ |
| 4899 | $L_{A99}$ | $L_{B12}$ |
| 4900 | $L_{A100}$ | $L_{B12}$ |
| 4901 | $L_{A101}$ | $L_{B12}$ |
| 4902 | $L_{A102}$ | $L_{B12}$ |
| 4903 | $L_{A103}$ | $L_{B12}$ |
| 4904 | $L_{A104}$ | $L_{B12}$ |
| 4905 | $L_{A105}$ | $L_{B12}$ |
| 4906 | $L_{A106}$ | $L_{B12}$ |
| 4907 | $L_{A107}$ | $L_{B12}$ |
| 4908 | $L_{A108}$ | $L_{B12}$ |
| 4909 | $L_{A109}$ | $L_{B12}$ |
| 4910 | $L_{A110}$ | $L_{B12}$ |
| 4911 | $L_{A111}$ | $L_{B12}$ |
| 4912 | $L_{A112}$ | $L_{B12}$ |
| 4913 | $L_{A113}$ | $L_{B12}$ |
| 4914 | $L_{A114}$ | $L_{B12}$ |
| 4915 | $L_{A115}$ | $L_{B12}$ |
| 4916 | $L_{A116}$ | $L_{B12}$ |
| 4917 | $L_{A117}$ | $L_{B12}$ |
| 4918 | $L_{A118}$ | $L_{B12}$ |
| 4919 | $L_{A119}$ | $L_{B12}$ |
| 4920 | $L_{A120}$ | $L_{B12}$ |
| 4921 | $L_{A121}$ | $L_{B12}$ |
| 4922 | $L_{A122}$ | $L_{B12}$ |
| 4923 | $L_{A123}$ | $L_{B12}$ |
| 4924 | $L_{A124}$ | $L_{B12}$ |
| 4925 | $L_{A125}$ | $L_{B12}$ |
| 4926 | $L_{A126}$ | $L_{B12}$ |
| 4927 | $L_{A127}$ | $L_{B12}$ |
| 4928 | $L_{A128}$ | $L_{B12}$ |
| 4929 | $L_{A129}$ | $L_{B12}$ |
| 4930 | $L_{A130}$ | $L_{B12}$ |
| 4931 | $L_{A131}$ | $L_{B12}$ |
| 4932 | $L_{A132}$ | $L_{B12}$ |
| 4933 | $L_{A133}$ | $L_{B12}$ |
| 4934 | $L_{A134}$ | $L_{B12}$ |
| 4935 | $L_{A135}$ | $L_{B12}$ |
| 4936 | $L_{A136}$ | $L_{B12}$ |
| 4937 | $L_{A137}$ | $L_{B12}$ |
| 4938 | $L_{A138}$ | $L_{B12}$ |
| 4939 | $L_{A139}$ | $L_{B12}$ |
| 4940 | $L_{A140}$ | $L_{B12}$ |
| 4941 | $L_{A141}$ | $L_{B12}$ |
| 4942 | $L_{A142}$ | $L_{B12}$ |
| 4943 | $L_{A143}$ | $L_{B12}$ |
| 4944 | $L_{A144}$ | $L_{B12}$ |
| 4945 | $L_{A145}$ | $L_{B12}$ |
| 4946 | $L_{A146}$ | $L_{B12}$ |
| 4947 | $L_{A147}$ | $L_{B12}$ |
| 4948 | $L_{A148}$ | $L_{B12}$ |
| 4949 | $L_{A149}$ | $L_{B12}$ |
| 4950 | $L_{A150}$ | $L_{B12}$ |
| 4951 | $L_{A151}$ | $L_{B12}$ |
| 4952 | $L_{A152}$ | $L_{B12}$ |
| 4953 | $L_{A153}$ | $L_{B12}$ |

-continued

| Compound Number | $L_A$ | $L_B$ |
|---|---|---|
| 4954 | $L_{A154}$ | $L_{B12}$ |
| 4955 | $L_{A155}$ | $L_{B12}$ |
| 4956 | $L_{A156}$ | $L_{B12}$ |
| 4957 | $L_{A157}$ | $L_{B12}$ |
| 4958 | $L_{A158}$ | $L_{B12}$ |
| 4959 | $L_{A159}$ | $L_{B12}$ |
| 4960 | $L_{A160}$ | $L_{B12}$ |
| 4961 | $L_{A161}$ | $L_{B12}$ |
| 4962 | $L_{A162}$ | $L_{B12}$ |
| 4963 | $L_{A163}$ | $L_{B12}$ |
| 4964 | $L_{A164}$ | $L_{B12}$ |
| 4965 | $L_{A165}$ | $L_{B12}$ |
| 4966 | $L_{A166}$ | $L_{B12}$ |
| 4967 | $L_{A167}$ | $L_{B12}$ |
| 4968 | $L_{A168}$ | $L_{B12}$ |
| 4969 | $L_{A169}$ | $L_{B12}$ |
| 4970 | $L_{A170}$ | $L_{B12}$ |
| 4971 | $L_{A171}$ | $L_{B12}$ |
| 4972 | $L_{A172}$ | $L_{B12}$ |
| 4973 | $L_{A173}$ | $L_{B12}$ |
| 4974 | $L_{A174}$ | $L_{B12}$ |
| 4975 | $L_{A175}$ | $L_{B12}$ |
| 4976 | $L_{A176}$ | $L_{B12}$ |
| 4977 | $L_{A177}$ | $L_{B12}$ |
| 4978 | $L_{A178}$ | $L_{B12}$ |
| 4979 | $L_{A179}$ | $L_{B12}$ |
| 4980 | $L_{A180}$ | $L_{B12}$ |
| 4981 | $L_{A181}$ | $L_{B12}$ |
| 4982 | $L_{A182}$ | $L_{B12}$ |
| 4983 | $L_{A183}$ | $L_{B12}$ |
| 4984 | $L_{A184}$ | $L_{B12}$ |
| 4985 | $L_{A185}$ | $L_{B12}$ |
| 4986 | $L_{A186}$ | $L_{B12}$ |
| 4987 | $L_{A187}$ | $L_{B12}$ |
| 4988 | $L_{A188}$ | $L_{B12}$ |
| 4989 | $L_{A189}$ | $L_{B12}$ |
| 4990 | $L_{A190}$ | $L_{B12}$ |
| 4991 | $L_{A191}$ | $L_{B12}$ |
| 4992 | $L_{A192}$ | $L_{B12}$ |
| 4993 | $L_{A193}$ | $L_{B12}$ |
| 4994 | $L_{A194}$ | $L_{B12}$ |
| 4995 | $L_{A195}$ | $L_{B12}$ |
| 4996 | $L_{A196}$ | $L_{B12}$ |
| 4997 | $L_{A197}$ | $L_{B12}$ |
| 4998 | $L_{A198}$ | $L_{B12}$ |
| 4999 | $L_{A199}$ | $L_{B12}$ |
| 5000 | $L_{A200}$ | $L_{B12}$ |
| 5001 | $L_{A201}$ | $L_{B12}$ |
| 5002 | $L_{A202}$ | $L_{B12}$ |
| 5003 | $L_{A203}$ | $L_{B12}$ |
| 5004 | $L_{A204}$ | $L_{B12}$ |
| 5005 | $L_{A205}$ | $L_{B12}$ |
| 5006 | $L_{A206}$ | $L_{B12}$ |
| 5007 | $L_{A207}$ | $L_{B12}$ |
| 5008 | $L_{A208}$ | $L_{B12}$ |
| 5009 | $L_{A209}$ | $L_{B12}$ |
| 5010 | $L_{A210}$ | $L_{B12}$ |
| 5011 | $L_{A211}$ | $L_{B12}$ |
| 5012 | $L_{A212}$ | $L_{B12}$ |
| 5013 | $L_{A213}$ | $L_{B12}$ |
| 5014 | $L_{A214}$ | $L_{B12}$ |
| 5015 | $L_{A215}$ | $L_{B12}$ |
| 5016 | $L_{A216}$ | $L_{B12}$ |
| 5017 | $L_{A217}$ | $L_{B12}$ |
| 5018 | $L_{A218}$ | $L_{B12}$ |
| 5019 | $L_{A219}$ | $L_{B12}$ |
| 5020 | $L_{A220}$ | $L_{B12}$ |
| 5021 | $L_{A221}$ | $L_{B12}$ |
| 5022 | $L_{A222}$ | $L_{B12}$ |
| 5023 | $L_{A223}$ | $L_{B12}$ |
| 5024 | $L_{A224}$ | $L_{B12}$ |
| 5025 | $L_{A225}$ | $L_{B12}$ |
| 5026 | $L_{A226}$ | $L_{B12}$ |
| 5027 | $L_{A227}$ | $L_{B12}$ |
| 5028 | $L_{A228}$ | $L_{B12}$ |
| 5029 | $L_{A229}$ | $L_{B12}$ |

-continued

| Compound Number | $L_A$ | $L_B$ |
|---|---|---|
| 5030 | $L_{A230}$ | $L_{B12}$ |
| 5031 | $L_{A231}$ | $L_{B12}$ |
| 5032 | $L_{A232}$ | $L_{B12}$ |
| 5033 | $L_{A233}$ | $L_{B12}$ |
| 5034 | $L_{A234}$ | $L_{B12}$ |
| 5035 | $L_{A235}$ | $L_{B12}$ |
| 5036 | $L_{A236}$ | $L_{B12}$ |
| 5037 | $L_{A237}$ | $L_{B12}$ |
| 5038 | $L_{A238}$ | $L_{B12}$ |
| 5039 | $L_{A239}$ | $L_{B12}$ |
| 5040 | $L_{A240}$ | $L_{B12}$ |
| 5041 | $L_{A241}$ | $L_{B12}$ |
| 5042 | $L_{A242}$ | $L_{B12}$ |
| 5043 | $L_{A243}$ | $L_{B12}$ |
| 5044 | $L_{A244}$ | $L_{B12}$ |
| 5045 | $L_{A245}$ | $L_{B12}$ |
| 5046 | $L_{A246}$ | $L_{B12}$ |
| 5047 | $L_{A247}$ | $L_{B12}$ |
| 5048 | $L_{A248}$ | $L_{B12}$ |
| 5049 | $L_{A249}$ | $L_{B12}$ |
| 5050 | $L_{A250}$ | $L_{B12}$ |
| 5051 | $L_{A251}$ | $L_{B12}$ |
| 5052 | $L_{A252}$ | $L_{B12}$ |
| 5053 | $L_{A253}$ | $L_{B12}$ |
| 5054 | $L_{A254}$ | $L_{B12}$ |
| 5055 | $L_{A255}$ | $L_{B12}$ |
| 5056 | $L_{A256}$ | $L_{B12}$ |
| 5057 | $L_{A257}$ | $L_{B12}$ |
| 5058 | $L_{A258}$ | $L_{B12}$ |
| 5059 | $L_{A259}$ | $L_{B12}$ |
| 5060 | $L_{A260}$ | $L_{B12}$ |
| 5061 | $L_{A261}$ | $L_{B12}$ |
| 5062 | $L_{A262}$ | $L_{B12}$ |
| 5063 | $L_{A263}$ | $L_{B12}$ |
| 5064 | $L_{A264}$ | $L_{B12}$ |
| 5065 | $L_{A265}$ | $L_{B12}$ |
| 5066 | $L_{A266}$ | $L_{B12}$ |
| 5067 | $L_{A267}$ | $L_{B12}$ |
| 5068 | $L_{A268}$ | $L_{B12}$ |
| 5069 | $L_{A269}$ | $L_{B12}$ |
| 5070 | $L_{A270}$ | $L_{B12}$ |
| 5071 | $L_{A271}$ | $L_{B12}$ |
| 5072 | $L_{A272}$ | $L_{B12}$ |
| 5073 | $L_{A273}$ | $L_{B12}$ |
| 5074 | $L_{A274}$ | $L_{B12}$ |
| 5075 | $L_{A275}$ | $L_{B12}$ |
| 5076 | $L_{A276}$ | $L_{B12}$ |
| 5077 | $L_{A277}$ | $L_{B12}$ |
| 5078 | $L_{A278}$ | $L_{B12}$ |
| 5079 | $L_{A279}$ | $L_{B12}$ |
| 5080 | $L_{A280}$ | $L_{B12}$ |
| 5081 | $L_{A281}$ | $L_{B12}$ |
| 5082 | $L_{A282}$ | $L_{B12}$ |
| 5083 | $L_{A283}$ | $L_{B12}$ |
| 5084 | $L_{A284}$ | $L_{B12}$ |
| 5085 | $L_{A285}$ | $L_{B12}$ |
| 5086 | $L_{A286}$ | $L_{B12}$ |
| 5087 | $L_{A287}$ | $L_{B12}$ |
| 5088 | $L_{A288}$ | $L_{B12}$ |
| 5089 | $L_{A289}$ | $L_{B12}$ |
| 5090 | $L_{A290}$ | $L_{B12}$ |
| 5091 | $L_{A291}$ | $L_{B12}$ |
| 5092 | $L_{A292}$ | $L_{B12}$ |
| 5093 | $L_{A293}$ | $L_{B12}$ |
| 5094 | $L_{A294}$ | $L_{B12}$ |
| 5095 | $L_{A295}$ | $L_{B12}$ |
| 5096 | $L_{A296}$ | $L_{B12}$ |
| 5097 | $L_{A297}$ | $L_{B12}$ |
| 5098 | $L_{A298}$ | $L_{B12}$ |
| 5099 | $L_{A299}$ | $L_{B12}$ |
| 5100 | $L_{A300}$ | $L_{B12}$ |
| 5101 | $L_{A301}$ | $L_{B12}$ |
| 5102 | $L_{A302}$ | $L_{B12}$ |
| 5103 | $L_{A303}$ | $L_{B12}$ |
| 5104 | $L_{A304}$ | $L_{B12}$ |
| 5105 | $L_{A305}$ | $L_{B12}$ |

-continued

| Compound Number | $L_A$ | $L_B$ |
|---|---|---|
| 5106 | $L_{A306}$ | $L_{B12}$ |
| 5107 | $L_{A307}$ | $L_{B12}$ |
| 5108 | $L_{A308}$ | $L_{B12}$ |
| 5109 | $L_{A309}$ | $L_{B12}$ |
| 5110 | $L_{A310}$ | $L_{B12}$ |
| 5111 | $L_{A311}$ | $L_{B12}$ |
| 5112 | $L_{A312}$ | $L_{B12}$ |
| 5113 | $L_{A313}$ | $L_{B12}$ |
| 5114 | $L_{A314}$ | $L_{B12}$ |
| 5115 | $L_{A315}$ | $L_{B12}$ |
| 5116 | $L_{A316}$ | $L_{B12}$ |
| 5117 | $L_{A317}$ | $L_{B12}$ |
| 5118 | $L_{A318}$ | $L_{B12}$ |
| 5119 | $L_{A319}$ | $L_{B12}$ |
| 5120 | $L_{A320}$ | $L_{B12}$ |
| 5121 | $L_{A321}$ | $L_{B12}$ |
| 5122 | $L_{A322}$ | $L_{B12}$ |
| 5123 | $L_{A323}$ | $L_{B12}$ |
| 5124 | $L_{A324}$ | $L_{B12}$ |
| 5125 | $L_{A325}$ | $L_{B12}$ |
| 5126 | $L_{A326}$ | $L_{B12}$ |
| 5127 | $L_{A327}$ | $L_{B12}$ |
| 5128 | $L_{A328}$ | $L_{B12}$ |
| 5129 | $L_{A329}$ | $L_{B12}$ |
| 5130 | $L_{A330}$ | $L_{B12}$ |
| 5131 | $L_{A331}$ | $L_{B12}$ |
| 5132 | $L_{A332}$ | $L_{B12}$ |
| 5133 | $L_{A333}$ | $L_{B12}$ |
| 5134 | $L_{A334}$ | $L_{B12}$ |
| 5135 | $L_{A335}$ | $L_{B12}$ |
| 5136 | $L_{A336}$ | $L_{B12}$ |
| 5137 | $L_{A337}$ | $L_{B12}$ |
| 5138 | $L_{A338}$ | $L_{B12}$ |
| 5139 | $L_{A339}$ | $L_{B12}$ |
| 5140 | $L_{A340}$ | $L_{B12}$ |
| 5141 | $L_{A341}$ | $L_{B12}$ |
| 5142 | $L_{A342}$ | $L_{B12}$ |
| 5143 | $L_{A343}$ | $L_{B12}$ |
| 5144 | $L_{A344}$ | $L_{B12}$ |
| 5145 | $L_{A345}$ | $L_{B12}$ |
| 5146 | $L_{A346}$ | $L_{B12}$ |
| 5147 | $L_{A347}$ | $L_{B12}$ |
| 5148 | $L_{A348}$ | $L_{B12}$ |
| 5149 | $L_{A349}$ | $L_{B12}$ |
| 5150 | $L_{A350}$ | $L_{B12}$ |
| 5151 | $L_{A351}$ | $L_{B12}$ |
| 5152 | $L_{A352}$ | $L_{B12}$ |
| 5153 | $L_{A353}$ | $L_{B12}$ |
| 5154 | $L_{A354}$ | $L_{B12}$ |
| 5155 | $L_{A355}$ | $L_{B12}$ |
| 5156 | $L_{A356}$ | $L_{B12}$ |
| 5157 | $L_{A357}$ | $L_{B12}$ |
| 5158 | $L_{A358}$ | $L_{B12}$ |
| 5159 | $L_{A359}$ | $L_{B12}$ |
| 5160 | $L_{A360}$ | $L_{B12}$ |
| 5161 | $L_{A361}$ | $L_{B12}$ |
| 5162 | $L_{A362}$ | $L_{B12}$ |
| 5163 | $L_{A363}$ | $L_{B12}$ |
| 5164 | $L_{A364}$ | $L_{B12}$ |
| 5165 | $L_{A365}$ | $L_{B12}$ |
| 5166 | $L_{A366}$ | $L_{B12}$ |
| 5167 | $L_{A367}$ | $L_{B12}$ |
| 5168 | $L_{A368}$ | $L_{B12}$ |
| 5169 | $L_{A369}$ | $L_{B12}$ |
| 5170 | $L_{A370}$ | $L_{B12}$ |
| 5171 | $L_{A371}$ | $L_{B12}$ |
| 5172 | $L_{A372}$ | $L_{B12}$ |
| 5173 | $L_{A373}$ | $L_{B12}$ |
| 5174 | $L_{A374}$ | $L_{B12}$ |
| 5175 | $L_{A375}$ | $L_{B12}$ |
| 5176 | $L_{A376}$ | $L_{B12}$ |
| 5177 | $L_{A377}$ | $L_{B12}$ |
| 5178 | $L_{A378}$ | $L_{B12}$ |
| 5179 | $L_{A379}$ | $L_{B12}$ |
| 5180 | $L_{A380}$ | $L_{B12}$ |
| 5181 | $L_{A381}$ | $L_{B12}$ |

| Compound Number | $L_A$ | $L_B$ |
|---|---|---|
| 5182 | $L_{A382}$ | $L_{B12}$ |
| 5183 | $L_{A383}$ | $L_{B12}$ |
| 5184 | $L_{A384}$ | $L_{B12}$ |
| 5185 | $L_{A385}$ | $L_{B12}$ |
| 5186 | $L_{A386}$ | $L_{B12}$ |
| 5187 | $L_{A387}$ | $L_{B12}$ |
| 5188 | $L_{A388}$ | $L_{B12}$ |
| 5189 | $L_{A389}$ | $L_{B12}$ |
| 5190 | $L_{A390}$ | $L_{B12}$ |
| 5191 | $L_{A391}$ | $L_{B12}$ |
| 5192 | $L_{A392}$ | $L_{B12}$ |
| 5193 | $L_{A393}$ | $L_{B12}$ |
| 5194 | $L_{A394}$ | $L_{B12}$ |
| 5195 | $L_{A395}$ | $L_{B12}$ |
| 5196 | $L_{A396}$ | $L_{B12}$ |
| 5197 | $L_{A397}$ | $L_{B12}$ |
| 5198 | $L_{A398}$ | $L_{B12}$ |
| 5199 | $L_{A399}$ | $L_{B12}$ |
| 5200 | $L_{A400}$ | $L_{B12}$ |
| 5201 | $L_{A401}$ | $L_{B12}$ |
| 5202 | $L_{A402}$ | $L_{B12}$ |
| 5203 | $L_{A403}$ | $L_{B12}$ |
| 5204 | $L_{A404}$ | $L_{B12}$ |
| 5205 | $L_{A405}$ | $L_{B12}$ |
| 5206 | $L_{A406}$ | $L_{B12}$ |
| 5207 | $L_{A407}$ | $L_{B12}$ |
| 5208 | $L_{A408}$ | $L_{B12}$ |
| 5209 | $L_{A409}$ | $L_{B12}$ |
| 5210 | $L_{A410}$ | $L_{B12}$ |
| 5211 | $L_{A411}$ | $L_{B12}$ |
| 5212 | $L_{A412}$ | $L_{B12}$ |
| 5213 | $L_{A413}$ | $L_{B12}$ |
| 5214 | $L_{A414}$ | $L_{B12}$ |
| 5215 | $L_{A415}$ | $L_{B12}$ |
| 5216 | $L_{A416}$ | $L_{B12}$ |
| 5217 | $L_{A417}$ | $L_{B12}$ |
| 5218 | $L_{A418}$ | $L_{B12}$ |
| 5219 | $L_{A419}$ | $L_{B12}$ |
| 5220 | $L_{A420}$ | $L_{B12}$ |
| 5221 | $L_{A421}$ | $L_{B12}$ |
| 5222 | $L_{A422}$ | $L_{B12}$ |
| 5223 | $L_{A423}$ | $L_{B12}$ |
| 5224 | $L_{A424}$ | $L_{B12}$ |
| 5225 | $L_{A425}$ | $L_{B12}$ |
| 5226 | $L_{A426}$ | $L_{B12}$ |
| 5227 | $L_{A427}$ | $L_{B12}$ |
| 5228 | $L_{A428}$ | $L_{B12}$ |
| 5229 | $L_{A429}$ | $L_{B12}$ |
| 5230 | $L_{A430}$ | $L_{B12}$ |
| 5231 | $L_{A431}$ | $L_{B12}$ |
| 5232 | $L_{A432}$ | $L_{B12}$ |
| 5233 | $L_{A433}$ | $L_{B12}$ |
| 5234 | $L_{A434}$ | $L_{B12}$ |
| 5235 | $L_{A435}$ | $L_{B12}$ |
| 5236 | $L_{A436}$ | $L_{B12}$ |
| 5237 | $L_{A437}$ | $L_{B12}$ |
| 5238 | $L_{A438}$ | $L_{B12}$ |
| 5239 | $L_{A439}$ | $L_{B12}$ |
| 5240 | $L_{A440}$ | $L_{B12}$ |
| 5241 | $L_{A441}$ | $L_{B12}$ |
| 5242 | $L_{A442}$ | $L_{B12}$ |
| 5243 | $L_{A443}$ | $L_{B12}$ |
| 5244 | $L_{A444}$ | $L_{B12}$ |
| 5245 | $L_{A445}$ | $L_{B12}$ |
| 5246 | $L_{A446}$ | $L_{B12}$ |
| 5247 | $L_{A447}$ | $L_{B12}$ |
| 5248 | $L_{A448}$ | $L_{B12}$ |
| 5249 | $L_{A449}$ | $L_{B12}$ |
| 5250 | $L_{A450}$ | $L_{B12}$ |
| 5251 | $L_{A451}$ | $L_{B12}$ |
| 5252 | $L_{A452}$ | $L_{B12}$ |
| 5253 | $L_{A453}$ | $L_{B12}$ |
| 5254 | $L_{A454}$ | $L_{B12}$ |
| 5255 | $L_{A455}$ | $L_{B12}$ |
| 5256 | $L_{A456}$ | $L_{B12}$ |
| 5257 | $L_{A457}$ | $L_{B12}$ |

| Compound Number | $L_A$ | $L_B$ |
|---|---|---|
| 5258 | $L_{A458}$ | $L_{B12}$ |
| 5259 | $L_{A459}$ | $L_{B12}$ |
| 5260 | $L_{A460}$ | $L_{B12}$ |
| 5261 | $L_{A461}$ | $L_{B12}$ |
| 5262 | $L_{A462}$ | $L_{B12}$ |
| 5263 | $L_{A463}$ | $L_{B12}$ |
| 5264 | $L_{A464}$ | $L_{B12}$ |
| 5265 | $L_{A465}$ | $L_{B12}$ |
| 5266 | $L_{A466}$ | $L_{B12}$ |
| 5267 | $L_{A467}$ | $L_{B12}$ |
| 5268 | $L_{A468}$ | $L_{B12}$ |
| 5269 | $L_{A469}$ | $L_{B12}$ |
| 5270 | $L_{A470}$ | $L_{B12}$ |
| 5271 | $L_{A471}$ | $L_{B12}$ |
| 5272 | $L_{A472}$ | $L_{B12}$ |
| 5273 | $L_{A473}$ | $L_{B12}$ |
| 5274 | $L_{A474}$ | $L_{B12}$ |
| 5275 | $L_{A475}$ | $L_{B12}$ |
| 5276 | $L_{A476}$ | $L_{B12}$ |
| 5277 | $L_{A477}$ | $L_{B12}$ |
| 5278 | $L_{A478}$ | $L_{B12}$ |
| 5279 | $L_{A479}$ | $L_{B12}$ |
| 5280 | $L_{A480}$ | $L_{B12}$ |
| 5281 | $L_{A481}$ | $L_{B12}$ |
| 5282 | $L_{A482}$ | $L_{B12}$ |
| 5283 | $L_{A483}$ | $L_{B12}$ |
| 5284 | $L_{A484}$ | $L_{B12}$ |
| 5285 | $L_{A485}$ | $L_{B12}$ |
| 5286 | $L_{A486}$ | $L_{B12}$ |
| 5287 | $L_{A487}$ | $L_{B12}$ |
| 5288 | $L_{A488}$ | $L_{B12}$ |
| 5289 | $L_{A489}$ | $L_{B12}$ |
| 5290 | $L_{A490}$ | $L_{B12}$ |
| 5291 | $L_{A491}$ | $L_{B12}$ |
| 5292 | $L_{A492}$ | $L_{B12}$ |
| 5293 | $L_{A493}$ | $L_{B12}$ |
| 5294 | $L_{A494}$ | $L_{B12}$ |
| 5295 | $L_{A495}$ | $L_{B12}$ |
| 5296 | $L_{A496}$ | $L_{B12}$ |
| 5297 | $L_{A497}$ | $L_{B12}$ |
| 5298 | $L_{A498}$ | $L_{B12}$ |
| 5299 | $L_{A499}$ | $L_{B12}$ |
| 5300 | $L_{A500}$ | $L_{B12}$ |
| 5301 | $L_{A501}$ | $L_{B12}$ |
| 5302 | $L_{A502}$ | $L_{B12}$ |
| 5303 | $L_{A503}$ | $L_{B12}$ |
| 5304 | $L_{A504}$ | $L_{B12}$ |
| 5305 | $L_{A505}$ | $L_{B12}$ |
| 5306 | $L_{A506}$ | $L_{B12}$ |
| 5307 | $L_{A507}$ | $L_{B12}$ |
| 5308 | $L_{A508}$ | $L_{B12}$ |
| 5309 | $L_{A509}$ | $L_{B12}$ |
| 5310 | $L_{A510}$ | $L_{B12}$ |
| 5311 | $L_{A511}$ | $L_{B12}$ |
| 5312 | $L_{A512}$ | $L_{B12}$ |
| 5313 | $L_{A513}$ | $L_{B12}$ |
| 5314 | $L_{A514}$ | $L_{B12}$ |
| 5315 | $L_{A515}$ | $L_{B12}$ |
| 5316 | $L_{A516}$ | $L_{B12}$ |
| 5317 | $L_{A517}$ | $L_{B12}$ |
| 5318 | $L_{A518}$ | $L_{B12}$ |
| 5319 | $L_{A519}$ | $L_{B12}$ |
| 5320 | $L_{A520}$ | $L_{B12}$ |
| 5321 | $L_{A521}$ | $L_{B12}$ |
| 5322 | $L_{A522}$ | $L_{B12}$ |
| 5323 | $L_{A523}$ | $L_{B12}$ |
| 5324 | $L_{A524}$ | $L_{B12}$ |
| 5325 | $L_{A525}$ | $L_{B12}$ |
| 5326 | $L_{A526}$ | $L_{B12}$ |
| 5327 | $L_{A527}$ | $L_{B12}$ |
| 5328 | $L_{A528}$ | $L_{B12}$ |
| 5329 | $L_{A529}$ | $L_{B12}$ |
| 5330 | $L_{A530}$ | $L_{B12}$ |
| 5331 | $L_{A531}$ | $L_{B12}$ |
| 5332 | $L_{A532}$ | $L_{B12}$ |
| 5333 | $L_{A533}$ | $L_{B12}$ |

| Compound Number | $L_A$ | $L_B$ |
|---|---|---|
| 5334 | $L_{A534}$ | $L_{B12}$ |
| 5335 | $L_{A535}$ | $L_{B12}$ |
| 5336 | $L_{A536}$ | $L_{B12}$ |
| 5337 | $L_{A537}$ | $L_{B12}$ |
| 5338 | $L_{A538}$ | $L_{B12}$ |
| 5339 | $L_{A539}$ | $L_{B12}$ |
| 5340 | $L_{A540}$ | $L_{B12}$ |
| 5341 | $L_{A541}$ | $L_{B12}$ |
| 5342 | $L_{A542}$ | $L_{B12}$ |
| 5343 | $L_{A543}$ | $L_{B12}$ |
| 5344 | $L_{A544}$ | $L_{B12}$ |
| 5345 | $L_{A545}$ | $L_{B12}$ |
| 5346 | $L_{A546}$ | $L_{B12}$ |
| 5347 | $L_{A547}$ | $L_{B12}$ |
| 5348 | $L_{A548}$ | $L_{B12}$ |
| 5349 | $L_{A549}$ | $L_{B12}$ |
| 5350 | $L_{A550}$ | $L_{B12}$ |
| 5351 | $L_{A551}$ | $L_{B12}$ |
| 5352 | $L_{A552}$ | $L_{B12}$ |
| 5353 | $L_{A553}$ | $L_{B12}$ |
| 5354 | $L_{A554}$ | $L_{B12}$ |
| 5355 | $L_{A555}$ | $L_{B12}$ |
| 5356 | $L_{A556}$ | $L_{B12}$ |
| 5357 | $L_{A557}$ | $L_{B12}$ |
| 5358 | $L_{A558}$ | $L_{B12}$ |
| 5359 | $L_{A559}$ | $L_{B12}$ |
| 5360 | $L_{A560}$ | $L_{B12}$ |
| 5361 | $L_{A561}$ | $L_{B12}$ |
| 5362 | $L_{A562}$ | $L_{B12}$ |
| 5363 | $L_{A563}$ | $L_{B12}$ |
| 5364 | $L_{A564}$ | $L_{B12}$ |
| 5365 | $L_{A565}$ | $L_{B12}$ |
| 5366 | $L_{A566}$ | $L_{B12}$ |
| 5367 | $L_{A567}$ | $L_{B12}$ |
| 5368 | $L_{A568}$ | $L_{B12}$ |
| 5369 | $L_{A569}$ | $L_{B12}$ |
| 5370 | $L_{A570}$ | $L_{B12}$ |
| 5371 | $L_{A571}$ | $L_{B12}$ |
| 5372 | $L_{A572}$ | $L_{B12}$ |
| 5373 | $L_{A573}$ | $L_{B12}$ |
| 5374 | $L_{A574}$ | $L_{B12}$ |
| 5375 | $L_{A575}$ | $L_{B12}$ |
| 5376 | $L_{A576}$ | $L_{B12}$ |
| 5377 | $L_{A577}$ | $L_{B12}$ |
| 5378 | $L_{A578}$ | $L_{B12}$ |
| 5379 | $L_{A579}$ | $L_{B12}$ |
| 5380 | $L_{A580}$ | $L_{B12}$ |
| 5381 | $L_{A581}$ | $L_{B12}$ |
| 5382 | $L_{A582}$ | $L_{B12}$ |
| 5383 | $L_{A583}$ | $L_{B12}$ |
| 5384 | $L_{A584}$ | $L_{B12}$ |
| 5385 | $L_{A585}$ | $L_{B12}$ |
| 5386 | $L_{A586}$ | $L_{B12}$ |
| 5387 | $L_{A587}$ | $L_{B12}$ |
| 5388 | $L_{A588}$ | $L_{B12}$ |
| 5389 | $L_{A589}$ | $L_{B12}$ |
| 5390 | $L_{A590}$ | $L_{B12}$ |
| 5391 | $L_{A591}$ | $L_{B12}$ |
| 5392 | $L_{A592}$ | $L_{B12}$ |
| 5393 | $L_{A593}$ | $L_{B12}$ |
| 5394 | $L_{A594}$ | $L_{B12}$ |
| 5395 | $L_{A595}$ | $L_{B12}$ |
| 5396 | $L_{A596}$ | $L_{B12}$ |
| 5397 | $L_{A597}$ | $L_{B12}$ |
| 5398 | $L_{A598}$ | $L_{B12}$ |
| 5399 | $L_{A599}$ | $L_{B12}$ |
| 5400 | $L_{A600}$ | $L_{B12}$ |
| 5401 | $L_{A601}$ | $L_{B12}$ |
| 5402 | $L_{A602}$ | $L_{B12}$ |
| 5403 | $L_{A603}$ | $L_{B12}$ |
| 5404 | $L_{A604}$ | $L_{B12}$ |
| 5405 | $L_{A605}$ | $L_{B12}$ |
| 5406 | $L_{A606}$ | $L_{B12}$ |
| 5407 | $L_{A607}$ | $L_{B12}$ |
| 5408 | $L_{A608}$ | $L_{B12}$ |
| 5409 | $L_{A609}$ | $L_{B12}$ |

| Compound Number | $L_A$ | $L_B$ |
|---|---|---|
| 5410 | $L_{A610}$ | $L_{B12}$ |
| 5411 | $L_{A611}$ | $L_{B12}$ |
| 5412 | $L_{A612}$ | $L_{B12}$ |
| 5413 | $L_{A613}$ | $L_{B12}$ |
| 5414 | $L_{A614}$ | $L_{B12}$ |
| 5415 | $L_{A615}$ | $L_{B12}$ |
| 5416 | $L_{A616}$ | $L_{B12}$ |
| 5417 | $L_{A617}$ | $L_{B12}$ |
| 5418 | $L_{A618}$ | $L_{B12}$ |
| 5419 | $L_{A619}$ | $L_{B12}$ |
| 5420 | $L_{A620}$ | $L_{B12}$ |
| 5421 | $L_{A621}$ | $L_{B12}$ |
| 5422 | $L_{A622}$ | $L_{B12}$ |
| 5423 | $L_{A623}$ | $L_{B12}$ |
| 5424 | $L_{A624}$ | $L_{B12}$ |
| 5425 | $L_{A625}$ | $L_{B12}$ |
| 5426 | $L_{A626}$ | $L_{B12}$ |
| 5427 | $L_{A627}$ | $L_{B12}$ |
| 5428 | $L_{A628}$ | $L_{B12}$ |
| 5429 | $L_{A629}$ | $L_{B12}$ |
| 5430 | $L_{A630}$ | $L_{B12}$ |
| 5431 | $L_{A631}$ | $L_{B12}$ |
| 5432 | $L_{A632}$ | $L_{B12}$ |
| 5433 | $L_{A633}$ | $L_{B12}$ |
| 5434 | $L_{A634}$ | $L_{B12}$ |
| 5435 | $L_{A635}$ | $L_{B12}$ |
| 5436 | $L_{A636}$ | $L_{B12}$ |
| 5437 | $L_{A637}$ | $L_{B12}$ |
| 5438 | $L_{A638}$ | $L_{B12}$ |
| 5439 | $L_{A639}$ | $L_{B12}$ |
| 5440 | $L_{A640}$ | $L_{B12}$ |
| 5441 | $L_{A641}$ | $L_{B12}$ |
| 5442 | $L_{A642}$ | $L_{B12}$ |
| 5443 | $L_{A643}$ | $L_{B12}$ |
| 5444 | $L_{A644}$ | $L_{B12}$ |
| 5445 | $L_{A645}$ | $L_{B12}$ |
| 5446 | $L_{A646}$ | $L_{B12}$ |
| 5447 | $L_{A647}$ | $L_{B12}$ |
| 5448 | $L_{A648}$ | $L_{B12}$ |
| 5449 | $L_{A649}$ | $L_{B12}$ |
| 5450 | $L_{A650}$ | $L_{B12}$ |
| 5451 | $L_{A651}$ | $L_{B12}$ |
| 5452 | $L_{A652}$ | $L_{B12}$ |
| 5453 | $L_{A653}$ | $L_{B12}$ |
| 5454 | $L_{A654}$ | $L_{B12}$ |
| 5455 | $L_{A655}$ | $L_{B12}$ |
| 5456 | $L_{A656}$ | $L_{B12}$ |
| 5457 | $L_{A657}$ | $L_{B12}$ |
| 5458 | $L_{A658}$ | $L_{B12}$ |
| 5459 | $L_{A659}$ | $L_{B12}$ |
| 5460 | $L_{A660}$ | $L_{B12}$ |
| 5461 | $L_{A661}$ | $L_{B12}$ |
| 5462 | $L_{A662}$ | $L_{B12}$ |
| 5463 | $L_{A663}$ | $L_{B12}$ |
| 5464 | $L_{A664}$ | $L_{B12}$ |
| 5465 | $L_{A665}$ | $L_{B12}$ |
| 5466 | $L_{A666}$ | $L_{B12}$ |
| 5467 | $L_{A667}$ | $L_{B12}$ |
| 5468 | $L_{A668}$ | $L_{B12}$ |
| 5469 | $L_{A669}$ | $L_{B12}$ |
| 5470 | $L_{A670}$ | $L_{B12}$ |
| 5471 | $L_{A671}$ | $L_{B12}$ |
| 5472 | $L_{A672}$ | $L_{B12}$ |
| 5473 | $L_{A673}$ | $L_{B12}$ |
| 5474 | $L_{A674}$ | $L_{B12}$ |
| 5475 | $L_{A675}$ | $L_{B12}$ |
| 5476 | $L_{A676}$ | $L_{B12}$ |
| 5477 | $L_{A677}$ | $L_{B12}$ |
| 5478 | $L_{A678}$ | $L_{B12}$ |
| 5479 | $L_{A679}$ | $L_{B12}$ |
| 5480 | $L_{A680}$ | $L_{B12}$ |
| 5481 | $L_{A681}$ | $L_{B12}$ |
| 5482 | $L_{A682}$ | $L_{B12}$ |
| 5483 | $L_{A683}$ | $L_{B12}$ |
| 5484 | $L_{A684}$ | $L_{B12}$ |
| 5485 | $L_{A685}$ | $L_{B12}$ |

-continued

| Compound Number | $L_A$ | $L_B$ |
|---|---|---|
| 5486 | $L_{A686}$ | $L_{B12}$ |
| 5487 | $L_{A687}$ | $L_{B12}$ |
| 5488 | $L_{A688}$ | $L_{B12}$ |
| 5489 | $L_{A689}$ | $L_{B12}$ |
| 5490 | $L_{A690}$ | $L_{B12}$ |
| 5491 | $L_{A691}$ | $L_{B12}$ |
| 5492 | $L_{A692}$ | $L_{B12}$ |
| 5493 | $L_{A693}$ | $L_{B12}$ |
| 5494 | $L_{A694}$ | $L_{B12}$ |
| 5495 | $L_{A695}$ | $L_{B12}$ |
| 5496 | $L_{A696}$ | $L_{B12}$ |
| 5497 | $L_{A697}$ | $L_{B12}$ |
| 5498 | $L_{A698}$ | $L_{B12}$ |
| 5499 | $L_{A699}$ | $L_{B12}$ |
| 5500 | $L_{A700}$ | $L_{B12}$ |
| 5501 | $L_{A701}$ | $L_{B12}$ |
| 5502 | $L_{A702}$ | $L_{B12}$ |
| 5503 | $L_{A703}$ | $L_{B12}$ |
| 5504 | $L_{A704}$ | $L_{B12}$ |
| 5505 | $L_{A705}$ | $L_{B12}$ |
| 5506 | $L_{A706}$ | $L_{B12}$ |
| 5507 | $L_{A707}$ | $L_{B12}$ |
| 5508 | $L_{A708}$ | $L_{B12}$ |
| 5509 | $L_{A709}$ | $L_{B12}$ |
| 5510 | $L_{A710}$ | $L_{B12}$ |
| 5511 | $L_{A711}$ | $L_{B12}$ |
| 5512 | $L_{A712}$ | $L_{B12}$ |
| 5513 | $L_{A713}$ | $L_{B12}$ |
| 5514 | $L_{A714}$ | $L_{B12}$ |
| 5515 | $L_{A715}$ | $L_{B12}$ |
| 5516 | $L_{A716}$ | $L_{B12}$ |
| 5517 | $L_{A717}$ | $L_{B12}$ |
| 5518 | $L_{A718}$ | $L_{B12}$ |
| 5519 | $L_{A719}$ | $L_{B12}$ |
| 5520 | $L_{A720}$ | $L_{B12}$ |
| 5521 | $L_{A721}$ | $L_{B12}$ |
| 5522 | $L_{A722}$ | $L_{B12}$ |
| 5523 | $L_{A723}$ | $L_{B12}$ |
| 5524 | $L_{A724}$ | $L_{B12}$ |
| 5525 | $L_{A725}$ | $L_{B12}$ |
| 5526 | $L_{A726}$ | $L_{B12}$ |
| 5527 | $L_{A727}$ | $L_{B12}$ |
| 5528 | $L_{A728}$ | $L_{B12}$ |
| 5529 | $L_{A729}$ | $L_{B12}$ |
| 5530 | $L_{A730}$ | $L_{B12}$ |
| 5531 | $L_{A731}$ | $L_{B12}$ |
| 5532 | $L_{A732}$ | $L_{B12}$ |
| 5533 | $L_{A733}$ | $L_{B12}$ |
| 5534 | $L_{A734}$ | $L_{B12}$ |
| 5535 | $L_{A735}$ | $L_{B12}$ |
| 5536 | $L_{A736}$ | $L_{B12}$ |
| 5537 | $L_{A737}$ | $L_{B12}$ |
| 5538 | $L_{A738}$ | $L_{B12}$ |
| 5539 | $L_{A739}$ | $L_{B12}$ |
| 5540 | $L_{A740}$ | $L_{B12}$ |
| 5541 | $L_{A741}$ | $L_{B12}$ |
| 5542 | $L_{A742}$ | $L_{B12}$ |
| 5543 | $L_{A743}$ | $L_{B12}$ |
| 5544 | $L_{A744}$ | $L_{B12}$ |
| 5545 | $L_{A745}$ | $L_{B12}$ |
| 5546 | $L_{A746}$ | $L_{B12}$ |
| 5547 | $L_{A747}$ | $L_{B12}$ |
| 5548 | $L_{A748}$ | $L_{B12}$ |
| 5549 | $L_{A749}$ | $L_{B12}$ |
| 5550 | $L_{A750}$ | $L_{B12}$ |
| 5551 | $L_{A751}$ | $L_{B12}$ |
| 5552 | $L_{A752}$ | $L_{B12}$ |
| 5553 | $L_{A753}$ | $L_{B12}$ |
| 5554 | $L_{A754}$ | $L_{B12}$ |
| 5555 | $L_{A755}$ | $L_{B12}$ |
| 5556 | $L_{A756}$ | $L_{B12}$ |
| 5557 | $L_{A757}$ | $L_{B12}$ |
| 5558 | $L_{A758}$ | $L_{B12}$ |
| 5559 | $L_{A759}$ | $L_{B12}$ |
| 5560 | $L_{A760}$ | $L_{B12}$ |
| 5561 | $L_{A761}$ | $L_{B12}$ |

-continued

| Compound Number | $L_A$ | $L_B$ |
|---|---|---|
| 5562 | $L_{A762}$ | $L_{B12}$ |
| 5563 | $L_{A763}$ | $L_{B12}$ |
| 5564 | $L_{A764}$ | $L_{B12}$ |
| 5565 | $L_{A765}$ | $L_{B12}$ |
| 5566 | $L_{A766}$ | $L_{B12}$ |
| 5567 | $L_{A767}$ | $L_{B12}$ |
| 5568 | $L_{A768}$ | $L_{B12}$ |
| 5569 | $L_{A769}$ | $L_{B12}$ |
| 5570 | $L_{A770}$ | $L_{B12}$ |
| 5571 | $L_{A771}$ | $L_{B12}$ |
| 5572 | $L_{A772}$ | $L_{B12}$ |
| 5573 | $L_{A773}$ | $L_{B12}$ |
| 5574 | $L_{A774}$ | $L_{B12}$ |
| 5575 | $L_{A775}$ | $L_{B12}$ |
| 5576 | $L_{A776}$ | $L_{B12}$ |
| 5577 | $L_{A777}$ | $L_{B12}$ |
| 5578 | $L_{A778}$ | $L_{B12}$ |
| 5579 | $L_{A779}$ | $L_{B12}$ |
| 5580 | $L_{A780}$ | $L_{B12}$ |
| 5581 | $L_{A781}$ | $L_{B12}$ |
| 5582 | $L_{A782}$ | $L_{B12}$ |
| 5583 | $L_{A783}$ | $L_{B12}$ |
| 5584 | $L_{A784}$ | $L_{B12}$ |
| 5585 | $L_{A785}$ | $L_{B12}$ |
| 5586 | $L_{A786}$ | $L_{B12}$ |
| 5587 | $L_{A787}$ | $L_{B12}$ |
| 5588 | $L_{A788}$ | $L_{B12}$ |
| 5589 | $L_{A789}$ | $L_{B12}$ |
| 5590 | $L_{A790}$ | $L_{B12}$ |
| 5591 | $L_{A791}$ | $L_{B12}$ |
| 5592 | $L_{A792}$ | $L_{B12}$ |
| 5593 | $L_{A793}$ | $L_{B12}$ |
| 5594 | $L_{A794}$ | $L_{B12}$ |
| 5595 | $L_{A795}$ | $L_{B12}$ |
| 5596 | $L_{A796}$ | $L_{B12}$ |
| 5597 | $L_{A797}$ | $L_{B12}$ |
| 5598 | $L_{A798}$ | $L_{B12}$ |
| 5599 | $L_{A799}$ | $L_{B12}$ |
| 5600 | $L_{A800}$ | $L_{B12}$ |
| 5601 | $L_{A801}$ | $L_{B12}$ |
| 5602 | $L_{A802}$ | $L_{B12}$ |
| 5603 | $L_{A803}$ | $L_{B12}$ |
| 5604 | $L_{A804}$ | $L_{B12}$ |
| 5605 | $L_{A805}$ | $L_{B12}$ |
| 5606 | $L_{A806}$ | $L_{B12}$ |
| 5607 | $L_{A807}$ | $L_{B12}$ |
| 5608 | $L_{A808}$ | $L_{B12}$ |
| 5609 | $L_{A809}$ | $L_{B12}$ |
| 5610 | $L_{A810}$ | $L_{B12}$ |
| 5611 | $L_{A811}$ | $L_{B12}$ |
| 5612 | $L_{A812}$ | $L_{B12}$ |
| 5613 | $L_{A813}$ | $L_{B12}$ |
| 5614 | $L_{A814}$ | $L_{B12}$ |
| 5615 | $L_{A815}$ | $L_{B12}$ |
| 5616 | $L_{A816}$ | $L_{B12}$ |
| 5617 | $L_{A817}$ | $L_{B12}$ |
| 5618 | $L_{A818}$ | $L_{B12}$ |
| 5619 | $L_{A819}$ | $L_{B12}$ |
| 5620 | $L_{A820}$ | $L_{B12}$ |
| 5621 | $L_{A821}$ | $L_{B12}$ |
| 5622 | $L_{A822}$ | $L_{B12}$ |
| 5623 | $L_{A823}$ | $L_{B12}$ |
| 5624 | $L_{A824}$ | $L_{B12}$ |
| 5625 | $L_{A825}$ | $L_{B12}$ |
| 5626 | $L_{A826}$ | $L_{B12}$ |
| 5627 | $L_{A827}$ | $L_{B12}$ |
| 5628 | $L_{A828}$ | $L_{B12}$ |
| 5629 | $L_{A829}$ | $L_{B12}$ |
| 5630 | $L_{A830}$ | $L_{B12}$ |
| 5631 | $L_{A831}$ | $L_{B12}$ |
| 5632 | $L_{A832}$ | $L_{B12}$ |
| 5633 | $L_{A833}$ | $L_{B12}$ |
| 5634 | $L_{A834}$ | $L_{B12}$ |
| 5635 | $L_{A835}$ | $L_{B12}$ |
| 5636 | $L_{A836}$ | $L_{B12}$ |
| 5637 | $L_{A837}$ | $L_{B12}$ |

-continued

| Compound Number | $L_A$ | $L_B$ |
|---|---|---|
| 5638 | $L_{A4838}$ | $L_{B12}$ |
| 5639 | $L_{A4839}$ | $L_{B12}$ |
| 5640 | $L_{A4840}$ | $L_{B12}$ |
| 5641 | $L_{A4841}$ | $L_{B12}$ |
| 5642 | $L_{A4842}$ | $L_{B12}$ |
| 5643 | $L_{A4843}$ | $L_{B12}$ |
| 5644 | $L_{A4844}$ | $L_{B12}$ |
| 5645 | $L_{A4845}$ | $L_{B12}$ |
| 5646 | $L_{A4846}$ | $L_{B12}$ |
| 5647 | $L_{A4847}$ | $L_{B12}$ |
| 5648 | $L_{A4848}$ | $L_{B12}$ |
| 5649 | $L_{A4849}$ | $L_{B12}$ |
| 5650 | $L_{A4850}$ | $L_{B12}$ |
| 5651 | $L_{A4851}$ | $L_{B12}$ |
| 5652 | $L_{A4852}$ | $L_{B12}$ |
| 5653 | $L_{A4853}$ | $L_{B12}$ |
| 5654 | $L_{A4854}$ | $L_{B12}$ |
| 5655 | $L_{A4855}$ | $L_{B12}$ |
| 5656 | $L_{A4856}$ | $L_{B12}$ |
| 5657 | $L_{A4857}$ | $L_{B12}$ |
| 5658 | $L_{A4858}$ | $L_{B12}$ |
| 5659 | $L_{A4859}$ | $L_{B12}$ |
| 5660 | $L_{A4860}$ | $L_{B12}$ |
| 5661 | $L_{A4861}$ | $L_{B12}$ |
| 5662 | $L_{A4862}$ | $L_{B12}$ |
| 5663 | $L_{A4863}$ | $L_{B12}$ |
| 5664 | $L_{A4864}$ | $L_{B12}$ |
| 5665 | $L_{A4865}$ | $L_{B12}$ |
| 5666 | $L_{A4866}$ | $L_{B12}$ |
| 5667 | $L_{A4867}$ | $L_{B12}$ |
| 5668 | $L_{A4868}$ | $L_{B12}$ |
| 5669 | $L_{A4869}$ | $L_{B12}$ |
| 5670 | $L_{A4870}$ | $L_{B12}$ |
| 5671 | $L_{A4871}$ | $L_{B12}$ |
| 5672 | $L_{A4872}$ | $L_{B12}$ |
| 5673 | $L_{A4873}$ | $L_{B12}$ |
| 5674 | $L_{A4874}$ | $L_{B12}$ |
| 5675 | $L_{A4875}$ | $L_{B12}$ |
| 5676 | $L_{A4876}$ | $L_{B12}$ |
| 5677 | $L_{A4877}$ | $L_{B12}$ |
| 5678 | $L_{A4878}$ | $L_{B12}$ |
| 5679 | $L_{A4879}$ | $L_{B12}$ |
| 5680 | $L_{A4880}$ | $L_{B12}$ |
| 5681 | $L_{A4881}$ | $L_{B12}$ |
| 5682 | $L_{A4882}$ | $L_{B12}$ |
| 5683 | $L_{A4883}$ | $L_{B12}$ |
| 5684 | $L_{A4884}$ | $L_{B12}$ |
| 5685 | $L_{A4885}$ | $L_{B12}$ |
| 5686 | $L_{A4886}$ | $L_{B12}$ |
| 5687 | $L_{A4887}$ | $L_{B12}$ |
| 5688 | $L_{A4888}$ | $L_{B12}$ |
| 5689 | $L_{A4889}$ | $L_{B12}$ |
| 5690 | $L_{A4890}$ | $L_{B12}$ |
| 5691 | $L_{A4891}$ | $L_{B12}$ |
| 5692 | $L_{A4892}$ | $L_{B12}$ |
| 5693 | $L_{A4893}$ | $L_{B12}$ |
| 5694 | $L_{A4894}$ | $L_{B12}$ |
| 5695 | $L_{A4895}$ | $L_{B12}$ |
| 5696 | $L_{A4896}$ | $L_{B12}$ |
| 5697 | $L_{A4897}$ | $L_{B12}$ |
| 5698 | $L_{A4898}$ | $L_{B12}$ |
| 5699 | $L_{A4899}$ | $L_{B12}$ |
| 5700 | $L_{A4900}$ | $L_{B12}$ |
| 5701 | $L_{A4901}$ | $L_{B12}$ |
| 5702 | $L_{A4902}$ | $L_{B12}$ |
| 5703 | $L_{A4903}$ | $L_{B12}$ |
| 5704 | $L_{A4904}$ | $L_{B12}$ |
| 5705 | $L_{A4905}$ | $L_{B12}$ |
| 5706 | $L_{A4906}$ | $L_{B12}$ |
| 5707 | $L_{A4907}$ | $L_{B12}$ |
| 5708 | $L_{A4908}$ | $L_{B12}$ |
| 5709 | $L_{A4909}$ | $L_{B12}$ |
| 5710 | $L_{A4910}$ | $L_{B12}$ |
| 5711 | $L_{A4911}$ | $L_{B12}$ |
| 5712 | $L_{A4912}$ | $L_{B12}$ |
| 5713 | $L_{A4913}$ | $L_{B12}$ |
| 5714 | $L_{A4914}$ | $L_{B12}$ |
| 5715 | $L_{A4915}$ | $L_{B12}$ |
| 5716 | $L_{A4916}$ | $L_{B12}$ |
| 5717 | $L_{A4917}$ | $L_{B12}$ |
| 5718 | $L_{A4918}$ | $L_{B12}$ |
| 5719 | $L_{A4919}$ | $L_{B12}$ |
| 5720 | $L_{A4920}$ | $L_{B12}$ |
| 5721 | $L_{A4921}$ | $L_{B12}$ |
| 5722 | $L_{A4922}$ | $L_{B12}$ |
| 5723 | $L_{A4923}$ | $L_{B12}$ |
| 5724 | $L_{A4924}$ | $L_{B12}$ |
| 5725 | $L_{A4925}$ | $L_{B12}$ |
| 5726 | $L_{A4926}$ | $L_{B12}$ |
| 5727 | $L_{A4927}$ | $L_{B12}$ |
| 5728 | $L_{A4928}$ | $L_{B12}$ |
| 5729 | $L_{A4929}$ | $L_{B12}$ |
| 5730 | $L_{A4930}$ | $L_{B12}$ |
| 5731 | $L_{A4931}$ | $L_{B12}$ |
| 5732 | $L_{A4932}$ | $L_{B12}$ |
| 5733 | $L_{A4933}$ | $L_{B12}$ |
| 5734 | $L_{A4934}$ | $L_{B12}$ |
| 5735 | $L_{A4935}$ | $L_{B12}$ |
| 5736 | $L_{A4936}$ | $L_{B12}$ |
| 5737 | $L_{A4937}$ | $L_{B12}$ |
| 5738 | $L_{A4938}$ | $L_{B12}$ |
| 5739 | $L_{A4939}$ | $L_{B12}$ |
| 5740 | $L_{A4940}$ | $L_{B12}$ |
| 5741 | $L_{A4941}$ | $L_{B12}$ |
| 5742 | $L_{A4942}$ | $L_{B12}$ |
| 5743 | $L_{A4943}$ | $L_{B12}$ |
| 5744 | $L_{A4944}$ | $L_{B12}$ |
| 5745 | $L_{A4945}$ | $L_{B12}$ |
| 5746 | $L_{A4946}$ | $L_{B12}$ |
| 5747 | $L_{A4947}$ | $L_{B12}$ |
| 5748 | $L_{A4948}$ | $L_{B12}$ |
| 5749 | $L_{A4949}$ | $L_{B12}$ |
| 5750 | $L_{A4950}$ | $L_{B12}$ |
| 5751 | $L_{A4951}$ | $L_{B12}$ |
| 5752 | $L_{A4952}$ | $L_{B12}$ |
| 5753 | $L_{A4953}$ | $L_{B12}$ |
| 5754 | $L_{A4954}$ | $L_{B12}$ |
| 5755 | $L_{A4955}$ | $L_{B12}$ |
| 5756 | $L_{A4956}$ | $L_{B12}$ |
| 5757 | $L_{A4957}$ | $L_{B12}$ |
| 5758 | $L_{A4958}$ | $L_{B12}$ |
| 5759 | $L_{A4959}$ | $L_{B12}$ |
| 5760 | $L_{A4960}$ | $L_{B12}$. |

17. The compound of claim 14, wherein $L_B$ is selected from the group consisting of:

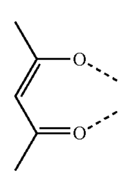

$L_{B42}$

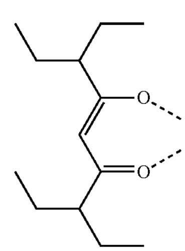

$L_{B43}$

-continued

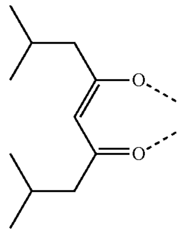

$L_{B44}$

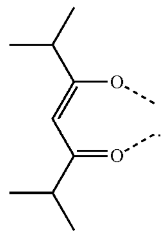

$L_{B45}$

18. The compound of claim 17, wherein the compound has formula VI:

$$(L_A)_2Ir(L_B)_1 \quad (VI);$$

and the compound is selected from the group consisting of compound 5761 to compound 7680 listed in the table below, where $L_A$ for each compound are defined:

-continued

| Compound Number | $L_A$ | $L_B$ |
|---|---|---|
| 5761 | $L_{A1}$ | $L_{B42}$ |
| 5762 | $L_{A2}$ | $L_{B42}$ |
| 5763 | $L_{A3}$ | $L_{B42}$ |
| 5764 | $L_{A4}$ | $L_{B42}$ |
| 5765 | $L_{A5}$ | $L_{B42}$ |
| 5766 | $L_{A6}$ | $L_{B42}$ |
| 5767 | $L_{A7}$ | $L_{B42}$ |
| 5768 | $L_{A8}$ | $L_{B42}$ |
| 5769 | $L_{A9}$ | $L_{B42}$ |
| 5770 | $L_{A10}$ | $L_{B42}$ |
| 5771 | $L_{A11}$ | $L_{B42}$ |
| 5772 | $L_{A12}$ | $L_{B42}$ |
| 5773 | $L_{A13}$ | $L_{B42}$ |
| 5774 | $L_{A14}$ | $L_{B42}$ |
| 5775 | $L_{A15}$ | $L_{B42}$ |
| 5776 | $L_{A16}$ | $L_{B42}$ |
| 5777 | $L_{A17}$ | $L_{B42}$ |
| 5778 | $L_{A18}$ | $L_{B42}$ |
| 5779 | $L_{A19}$ | $L_{B42}$ |
| 5780 | $L_{A20}$ | $L_{B42}$ |
| 5781 | $L_{A21}$ | $L_{B42}$ |
| 5782 | $L_{A22}$ | $L_{B42}$ |
| 5783 | $L_{A23}$ | $L_{B42}$ |
| 5784 | $L_{A24}$ | $L_{B42}$ |
| 5785 | $L_{A25}$ | $L_{B42}$ |
| 5786 | $L_{A26}$ | $L_{B42}$ |
| 5787 | $L_{A27}$ | $L_{B42}$ |
| 5788 | $L_{A28}$ | $L_{B42}$ |
| 5789 | $L_{A29}$ | $L_{B42}$ |
| 5790 | $L_{A30}$ | $L_{B42}$ |
| 5791 | $L_{A31}$ | $L_{B42}$ |
| 5792 | $L_{A32}$ | $L_{B42}$ |
| 5793 | $L_{A33}$ | $L_{B42}$ |
| 5794 | $L_{A34}$ | $L_{B42}$ |
| 5795 | $L_{A35}$ | $L_{B42}$ |
| 5796 | $L_{A36}$ | $L_{B42}$ |
| 5797 | $L_{A37}$ | $L_{B42}$ |
| 5798 | $L_{A38}$ | $L_{B42}$ |
| 5799 | $L_{A39}$ | $L_{B42}$ |
| 5800 | $L_{A40}$ | $L_{B42}$ |
| 5801 | $L_{A41}$ | $L_{B42}$ |
| 5802 | $L_{A42}$ | $L_{B42}$ |
| 5803 | $L_{A43}$ | $L_{B42}$ |
| 5804 | $L_{A44}$ | $L_{B42}$ |
| 5805 | $L_{A45}$ | $L_{B42}$ |
| 5806 | $L_{A46}$ | $L_{B42}$ |
| 5807 | $L_{A47}$ | $L_{B42}$ |
| 5808 | $L_{A48}$ | $L_{B42}$ |
| 5809 | $L_{A49}$ | $L_{B42}$ |
| 5810 | $L_{A50}$ | $L_{B42}$ |
| 5811 | $L_{A51}$ | $L_{B42}$ |
| 5812 | $L_{A52}$ | $L_{B42}$ |
| 5813 | $L_{A53}$ | $L_{B42}$ |
| 5814 | $L_{A54}$ | $L_{B42}$ |
| 5815 | $L_{A55}$ | $L_{B42}$ |
| 5816 | $L_{A56}$ | $L_{B42}$ |
| 5817 | $L_{A57}$ | $L_{B42}$ |
| 5818 | $L_{A58}$ | $L_{B42}$ |
| 5819 | $L_{A59}$ | $L_{B42}$ |
| 5820 | $L_{A60}$ | $L_{B42}$ |
| 5821 | $L_{A61}$ | $L_{B42}$ |
| 5822 | $L_{A62}$ | $L_{B42}$ |
| 5823 | $L_{A63}$ | $L_{B42}$ |
| 5824 | $L_{A64}$ | $L_{B42}$ |
| 5825 | $L_{A65}$ | $L_{B42}$ |
| 5826 | $L_{A66}$ | $L_{B42}$ |
| 5827 | $L_{A67}$ | $L_{B42}$ |
| 5828 | $L_{A68}$ | $L_{B42}$ |
| 5829 | $L_{A69}$ | $L_{B42}$ |
| 5830 | $L_{A70}$ | $L_{B42}$ |
| 5831 | $L_{A71}$ | $L_{B42}$ |
| 5832 | $L_{A72}$ | $L_{B42}$ |
| 5833 | $L_{A73}$ | $L_{B42}$ |
| 5834 | $L_{A74}$ | $L_{B42}$ |
| 5835 | $L_{A75}$ | $L_{B42}$ |
| 5836 | $L_{A76}$ | $L_{B42}$ |
| 5837 | $L_{A77}$ | $L_{B42}$ |
| 5838 | $L_{A78}$ | $L_{B42}$ |
| 5839 | $L_{A79}$ | $L_{B42}$ |
| 5840 | $L_{A80}$ | $L_{B42}$ |
| 5841 | $L_{A81}$ | $L_{B42}$ |
| 5842 | $L_{A82}$ | $L_{B42}$ |
| 5843 | $L_{A83}$ | $L_{B42}$ |
| 5844 | $L_{A84}$ | $L_{B42}$ |
| 5845 | $L_{A85}$ | $L_{B42}$ |
| 5846 | $L_{A86}$ | $L_{B42}$ |
| 5847 | $L_{A87}$ | $L_{B42}$ |
| 5848 | $L_{A88}$ | $L_{B42}$ |
| 5849 | $L_{A89}$ | $L_{B42}$ |
| 5850 | $L_{A90}$ | $L_{B42}$ |
| 5851 | $L_{A91}$ | $L_{B42}$ |
| 5852 | $L_{A92}$ | $L_{B42}$ |
| 5853 | $L_{A93}$ | $L_{B42}$ |
| 5854 | $L_{A94}$ | $L_{B42}$ |
| 5855 | $L_{A95}$ | $L_{B42}$ |
| 5856 | $L_{A96}$ | $L_{B42}$ |
| 5857 | $L_{A97}$ | $L_{B42}$ |
| 5858 | $L_{A98}$ | $L_{B42}$ |
| 5859 | $L_{A99}$ | $L_{B42}$ |
| 5860 | $L_{A100}$ | $L_{B42}$ |
| 5861 | $L_{A101}$ | $L_{B42}$ |
| 5862 | $L_{A102}$ | $L_{B42}$ |
| 5863 | $L_{A103}$ | $L_{B42}$ |
| 5864 | $L_{A104}$ | $L_{B42}$ |
| 5865 | $L_{A105}$ | $L_{B42}$ |
| 5866 | $L_{A106}$ | $L_{B42}$ |
| 5867 | $L_{A107}$ | $L_{B42}$ |
| 5868 | $L_{A108}$ | $L_{B42}$ |
| 5869 | $L_{A109}$ | $L_{B42}$ |
| 5870 | $L_{A110}$ | $L_{B42}$ |
| 5871 | $L_{A111}$ | $L_{B42}$ |
| 5872 | $L_{A112}$ | $L_{B42}$ |
| 5873 | $L_{A113}$ | $L_{B42}$ |
| 5874 | $L_{A114}$ | $L_{B42}$ |
| 5875 | $L_{A115}$ | $L_{B42}$ |
| 5876 | $L_{A116}$ | $L_{B42}$ |
| 5877 | $L_{A117}$ | $L_{B42}$ |

-continued

| Compound Number | $L_A$ | $L_B$ |
|---|---|---|
| 5878 | $L_{A118}$ | $L_{B42}$ |
| 5879 | $L_{A119}$ | $L_{B42}$ |
| 5880 | $L_{A120}$ | $L_{B42}$ |
| 5881 | $L_{A121}$ | $L_{B42}$ |
| 5882 | $L_{A122}$ | $L_{B42}$ |
| 5883 | $L_{A123}$ | $L_{B42}$ |
| 5884 | $L_{A124}$ | $L_{B42}$ |
| 5885 | $L_{A125}$ | $L_{B42}$ |
| 5886 | $L_{A126}$ | $L_{B42}$ |
| 5887 | $L_{A127}$ | $L_{B42}$ |
| 5888 | $L_{A128}$ | $L_{B42}$ |
| 5889 | $L_{A129}$ | $L_{B42}$ |
| 5890 | $L_{A130}$ | $L_{B42}$ |
| 5891 | $L_{A131}$ | $L_{B42}$ |
| 5892 | $L_{A132}$ | $L_{B42}$ |
| 5893 | $L_{A133}$ | $L_{B42}$ |
| 5894 | $L_{A134}$ | $L_{B42}$ |
| 5895 | $L_{A135}$ | $L_{B42}$ |
| 5896 | $L_{A136}$ | $L_{B42}$ |
| 5897 | $L_{A137}$ | $L_{B42}$ |
| 5898 | $L_{A138}$ | $L_{B42}$ |
| 5899 | $L_{A139}$ | $L_{B42}$ |
| 5900 | $L_{A140}$ | $L_{B42}$ |
| 5901 | $L_{A141}$ | $L_{B42}$ |
| 5902 | $L_{A142}$ | $L_{B42}$ |
| 5903 | $L_{A143}$ | $L_{B42}$ |
| 5904 | $L_{A144}$ | $L_{B42}$ |
| 5905 | $L_{A145}$ | $L_{B42}$ |
| 5906 | $L_{A146}$ | $L_{B42}$ |
| 5907 | $L_{A147}$ | $L_{B42}$ |
| 5908 | $L_{A148}$ | $L_{B42}$ |
| 5909 | $L_{A149}$ | $L_{B42}$ |
| 5910 | $L_{A150}$ | $L_{B42}$ |
| 5911 | $L_{A151}$ | $L_{B42}$ |
| 5912 | $L_{A152}$ | $L_{B42}$ |
| 5913 | $L_{A153}$ | $L_{B42}$ |
| 5914 | $L_{A154}$ | $L_{B42}$ |
| 5915 | $L_{A155}$ | $L_{B42}$ |
| 5916 | $L_{A156}$ | $L_{B42}$ |
| 5917 | $L_{A157}$ | $L_{B42}$ |
| 5918 | $L_{A158}$ | $L_{B42}$ |
| 5919 | $L_{A159}$ | $L_{B42}$ |
| 5920 | $L_{A160}$ | $L_{B42}$ |
| 5921 | $L_{A161}$ | $L_{B42}$ |
| 5922 | $L_{A162}$ | $L_{B42}$ |
| 5923 | $L_{A163}$ | $L_{B42}$ |
| 5924 | $L_{A164}$ | $L_{B42}$ |
| 5925 | $L_{A165}$ | $L_{B42}$ |
| 5926 | $L_{A166}$ | $L_{B42}$ |
| 5927 | $L_{A167}$ | $L_{B42}$ |
| 5928 | $L_{A168}$ | $L_{B42}$ |
| 5929 | $L_{A169}$ | $L_{B42}$ |
| 5930 | $L_{A170}$ | $L_{B42}$ |
| 5931 | $L_{A171}$ | $L_{B42}$ |
| 5932 | $L_{A172}$ | $L_{B42}$ |
| 5933 | $L_{A173}$ | $L_{B42}$ |
| 5934 | $L_{A174}$ | $L_{B42}$ |
| 5935 | $L_{A175}$ | $L_{B42}$ |
| 5936 | $L_{A176}$ | $L_{B42}$ |
| 5937 | $L_{A177}$ | $L_{B42}$ |
| 5938 | $L_{A178}$ | $L_{B42}$ |
| 5939 | $L_{A179}$ | $L_{B42}$ |
| 5940 | $L_{A180}$ | $L_{B42}$ |
| 5941 | $L_{A181}$ | $L_{B42}$ |
| 5942 | $L_{A182}$ | $L_{B42}$ |
| 5943 | $L_{A183}$ | $L_{B42}$ |
| 5944 | $L_{A184}$ | $L_{B42}$ |
| 5945 | $L_{A185}$ | $L_{B42}$ |
| 5946 | $L_{A186}$ | $L_{B42}$ |
| 5947 | $L_{A187}$ | $L_{B42}$ |
| 5948 | $L_{A188}$ | $L_{B42}$ |
| 5949 | $L_{A189}$ | $L_{B42}$ |
| 5950 | $L_{A190}$ | $L_{B42}$ |
| 5951 | $L_{A191}$ | $L_{B42}$ |
| 5952 | $L_{A192}$ | $L_{B42}$ |
| 5953 | $L_{A193}$ | $L_{B42}$ |

-continued

| Compound Number | $L_A$ | $L_B$ |
|---|---|---|
| 5954 | $L_{A194}$ | $L_{B42}$ |
| 5955 | $L_{A195}$ | $L_{B42}$ |
| 5956 | $L_{A196}$ | $L_{B42}$ |
| 5957 | $L_{A197}$ | $L_{B42}$ |
| 5958 | $L_{A198}$ | $L_{B42}$ |
| 5959 | $L_{A199}$ | $L_{B42}$ |
| 5960 | $L_{A200}$ | $L_{B42}$ |
| 5961 | $L_{A201}$ | $L_{B42}$ |
| 5962 | $L_{A202}$ | $L_{B42}$ |
| 5963 | $L_{A203}$ | $L_{B42}$ |
| 5964 | $L_{A204}$ | $L_{B42}$ |
| 5965 | $L_{A205}$ | $L_{B42}$ |
| 5966 | $L_{A206}$ | $L_{B42}$ |
| 5967 | $L_{A207}$ | $L_{B42}$ |
| 5968 | $L_{A208}$ | $L_{B42}$ |
| 5969 | $L_{A209}$ | $L_{B42}$ |
| 5970 | $L_{A210}$ | $L_{B42}$ |
| 5971 | $L_{A211}$ | $L_{B42}$ |
| 5972 | $L_{A212}$ | $L_{B42}$ |
| 5973 | $L_{A213}$ | $L_{B42}$ |
| 5974 | $L_{A214}$ | $L_{B42}$ |
| 5975 | $L_{A215}$ | $L_{B42}$ |
| 5976 | $L_{A216}$ | $L_{B42}$ |
| 5977 | $L_{A217}$ | $L_{B42}$ |
| 5978 | $L_{A218}$ | $L_{B42}$ |
| 5979 | $L_{A219}$ | $L_{B42}$ |
| 5980 | $L_{A220}$ | $L_{B42}$ |
| 5981 | $L_{A221}$ | $L_{B42}$ |
| 5982 | $L_{A222}$ | $L_{B42}$ |
| 5983 | $L_{A223}$ | $L_{B42}$ |
| 5984 | $L_{A224}$ | $L_{B42}$ |
| 5985 | $L_{A225}$ | $L_{B42}$ |
| 5986 | $L_{A226}$ | $L_{B42}$ |
| 5987 | $L_{A227}$ | $L_{B42}$ |
| 5988 | $L_{A228}$ | $L_{B42}$ |
| 5989 | $L_{A229}$ | $L_{B42}$ |
| 5990 | $L_{A230}$ | $L_{B42}$ |
| 5991 | $L_{A231}$ | $L_{B42}$ |
| 5992 | $L_{A232}$ | $L_{B42}$ |
| 5993 | $L_{A233}$ | $L_{B42}$ |
| 5994 | $L_{A234}$ | $L_{B42}$ |
| 5995 | $L_{A235}$ | $L_{B42}$ |
| 5996 | $L_{A236}$ | $L_{B42}$ |
| 5997 | $L_{A237}$ | $L_{B42}$ |
| 5998 | $L_{A238}$ | $L_{B42}$ |
| 5999 | $L_{A239}$ | $L_{B42}$ |
| 6000 | $L_{A240}$ | $L_{B42}$ |
| 6001 | $L_{A241}$ | $L_{B42}$ |
| 6002 | $L_{A242}$ | $L_{B42}$ |
| 6003 | $L_{A243}$ | $L_{B42}$ |
| 6004 | $L_{A244}$ | $L_{B42}$ |
| 6005 | $L_{A245}$ | $L_{B42}$ |
| 6006 | $L_{A246}$ | $L_{B42}$ |
| 6007 | $L_{A247}$ | $L_{B42}$ |
| 6008 | $L_{A248}$ | $L_{B42}$ |
| 6009 | $L_{A249}$ | $L_{B42}$ |
| 6010 | $L_{A250}$ | $L_{B42}$ |
| 6011 | $L_{A251}$ | $L_{B42}$ |
| 6012 | $L_{A252}$ | $L_{B42}$ |
| 6013 | $L_{A253}$ | $L_{B42}$ |
| 6014 | $L_{A254}$ | $L_{B42}$ |
| 6015 | $L_{A255}$ | $L_{B42}$ |
| 6016 | $L_{A256}$ | $L_{B42}$ |
| 6017 | $L_{A257}$ | $L_{B42}$ |
| 6018 | $L_{A258}$ | $L_{B42}$ |
| 6019 | $L_{A259}$ | $L_{B42}$ |
| 6020 | $L_{A260}$ | $L_{B42}$ |
| 6021 | $L_{A261}$ | $L_{B42}$ |
| 6022 | $L_{A262}$ | $L_{B42}$ |
| 6023 | $L_{A263}$ | $L_{B42}$ |
| 6024 | $L_{A264}$ | $L_{B42}$ |
| 6025 | $L_{A265}$ | $L_{B42}$ |
| 6026 | $L_{A266}$ | $L_{B42}$ |
| 6027 | $L_{A267}$ | $L_{B42}$ |
| 6028 | $L_{A268}$ | $L_{B42}$ |
| 6029 | $L_{A269}$ | $L_{B42}$ |

-continued

| Compound Number | $L_A$ | $L_B$ |
|---|---|---|
| 6030 | $L_{A270}$ | $L_{B42}$ |
| 6031 | $L_{A271}$ | $L_{B42}$ |
| 6032 | $L_{A272}$ | $L_{B42}$ |
| 6033 | $L_{A273}$ | $L_{B42}$ |
| 6034 | $L_{A274}$ | $L_{B42}$ |
| 6035 | $L_{A275}$ | $L_{B42}$ |
| 6036 | $L_{A276}$ | $L_{B42}$ |
| 6037 | $L_{A277}$ | $L_{B42}$ |
| 6038 | $L_{A278}$ | $L_{B42}$ |
| 6039 | $L_{A279}$ | $L_{B42}$ |
| 6040 | $L_{A280}$ | $L_{B42}$ |
| 6041 | $L_{A281}$ | $L_{B42}$ |
| 6042 | $L_{A282}$ | $L_{B42}$ |
| 6043 | $L_{A283}$ | $L_{B42}$ |
| 6044 | $L_{A284}$ | $L_{B42}$ |
| 6045 | $L_{A285}$ | $L_{B42}$ |
| 6046 | $L_{A286}$ | $L_{B42}$ |
| 6047 | $L_{A287}$ | $L_{B42}$ |
| 6048 | $L_{A288}$ | $L_{B42}$ |
| 6049 | $L_{A289}$ | $L_{B42}$ |
| 6050 | $L_{A290}$ | $L_{B42}$ |
| 6051 | $L_{A291}$ | $L_{B42}$ |
| 6052 | $L_{A292}$ | $L_{B42}$ |
| 6053 | $L_{A293}$ | $L_{B42}$ |
| 6054 | $L_{A294}$ | $L_{B42}$ |
| 6055 | $L_{A295}$ | $L_{B42}$ |
| 6056 | $L_{A296}$ | $L_{B42}$ |
| 6057 | $L_{A297}$ | $L_{B42}$ |
| 6058 | $L_{A298}$ | $L_{B42}$ |
| 6059 | $L_{A299}$ | $L_{B42}$ |
| 6060 | $L_{A300}$ | $L_{B42}$ |
| 6061 | $L_{A301}$ | $L_{B42}$ |
| 6062 | $L_{A302}$ | $L_{B42}$ |
| 6063 | $L_{A303}$ | $L_{B42}$ |
| 6064 | $L_{A304}$ | $L_{B42}$ |
| 6065 | $L_{A305}$ | $L_{B42}$ |
| 6066 | $L_{A306}$ | $L_{B42}$ |
| 6067 | $L_{A307}$ | $L_{B42}$ |
| 6068 | $L_{A308}$ | $L_{B42}$ |
| 6069 | $L_{A309}$ | $L_{B42}$ |
| 6070 | $L_{A310}$ | $L_{B42}$ |
| 6071 | $L_{A311}$ | $L_{B42}$ |
| 6072 | $L_{A312}$ | $L_{B42}$ |
| 6073 | $L_{A313}$ | $L_{B42}$ |
| 6074 | $L_{A314}$ | $L_{B42}$ |
| 6075 | $L_{A315}$ | $L_{B42}$ |
| 6076 | $L_{A316}$ | $L_{B42}$ |
| 6077 | $L_{A317}$ | $L_{B42}$ |
| 6078 | $L_{A318}$ | $L_{B42}$ |
| 6079 | $L_{A319}$ | $L_{B42}$ |
| 6080 | $L_{A320}$ | $L_{B42}$ |
| 6081 | $L_{A321}$ | $L_{B42}$ |
| 6082 | $L_{A322}$ | $L_{B42}$ |
| 6083 | $L_{A323}$ | $L_{B42}$ |
| 6084 | $L_{A324}$ | $L_{B42}$ |
| 6085 | $L_{A325}$ | $L_{B42}$ |
| 6086 | $L_{A326}$ | $L_{B42}$ |
| 6087 | $L_{A327}$ | $L_{B42}$ |
| 6088 | $L_{A328}$ | $L_{B42}$ |
| 6089 | $L_{A329}$ | $L_{B42}$ |
| 6090 | $L_{A330}$ | $L_{B42}$ |
| 6091 | $L_{A331}$ | $L_{B42}$ |
| 6092 | $L_{A332}$ | $L_{B42}$ |
| 6093 | $L_{A333}$ | $L_{B42}$ |
| 6094 | $L_{A334}$ | $L_{B42}$ |
| 6095 | $L_{A335}$ | $L_{B42}$ |
| 6096 | $L_{A336}$ | $L_{B42}$ |
| 6097 | $L_{A337}$ | $L_{B42}$ |
| 6098 | $L_{A338}$ | $L_{B42}$ |
| 6099 | $L_{A339}$ | $L_{B42}$ |
| 6100 | $L_{A340}$ | $L_{B42}$ |
| 6101 | $L_{A341}$ | $L_{B42}$ |
| 6102 | $L_{A342}$ | $L_{B42}$ |
| 6103 | $L_{A343}$ | $L_{B42}$ |
| 6104 | $L_{A344}$ | $L_{B42}$ |
| 6105 | $L_{A345}$ | $L_{B42}$ |

-continued

| Compound Number | $L_A$ | $L_B$ |
|---|---|---|
| 6106 | $L_{A346}$ | $L_{B42}$ |
| 6107 | $L_{A347}$ | $L_{B42}$ |
| 6108 | $L_{A348}$ | $L_{B42}$ |
| 6109 | $L_{A349}$ | $L_{B42}$ |
| 6110 | $L_{A350}$ | $L_{B42}$ |
| 6111 | $L_{A351}$ | $L_{B42}$ |
| 6112 | $L_{A352}$ | $L_{B42}$ |
| 6113 | $L_{A353}$ | $L_{B42}$ |
| 6114 | $L_{A354}$ | $L_{B42}$ |
| 6115 | $L_{A355}$ | $L_{B42}$ |
| 6116 | $L_{A356}$ | $L_{B42}$ |
| 6117 | $L_{A357}$ | $L_{B42}$ |
| 6118 | $L_{A358}$ | $L_{B42}$ |
| 6119 | $L_{A359}$ | $L_{B42}$ |
| 6120 | $L_{A360}$ | $L_{B42}$ |
| 6121 | $L_{A361}$ | $L_{B42}$ |
| 6122 | $L_{A362}$ | $L_{B42}$ |
| 6123 | $L_{A363}$ | $L_{B42}$ |
| 6124 | $L_{A364}$ | $L_{B42}$ |
| 6125 | $L_{A365}$ | $L_{B42}$ |
| 6126 | $L_{A366}$ | $L_{B42}$ |
| 6127 | $L_{A367}$ | $L_{B42}$ |
| 6128 | $L_{A368}$ | $L_{B42}$ |
| 6129 | $L_{A369}$ | $L_{B42}$ |
| 6130 | $L_{A370}$ | $L_{B42}$ |
| 6131 | $L_{A371}$ | $L_{B42}$ |
| 6132 | $L_{A372}$ | $L_{B42}$ |
| 6133 | $L_{A373}$ | $L_{B42}$ |
| 6134 | $L_{A374}$ | $L_{B42}$ |
| 6135 | $L_{A375}$ | $L_{B42}$ |
| 6136 | $L_{A376}$ | $L_{B42}$ |
| 6137 | $L_{A377}$ | $L_{B42}$ |
| 6138 | $L_{A378}$ | $L_{B42}$ |
| 6139 | $L_{A379}$ | $L_{B42}$ |
| 6140 | $L_{A380}$ | $L_{B42}$ |
| 6141 | $L_{A381}$ | $L_{B42}$ |
| 6142 | $L_{A382}$ | $L_{B42}$ |
| 6143 | $L_{A383}$ | $L_{B42}$ |
| 6144 | $L_{A384}$ | $L_{B42}$ |
| 6145 | $L_{A385}$ | $L_{B42}$ |
| 6146 | $L_{A386}$ | $L_{B42}$ |
| 6147 | $L_{A387}$ | $L_{B42}$ |
| 6148 | $L_{A388}$ | $L_{B42}$ |
| 6149 | $L_{A389}$ | $L_{B42}$ |
| 6150 | $L_{A390}$ | $L_{B42}$ |
| 6151 | $L_{A391}$ | $L_{B42}$ |
| 6152 | $L_{A392}$ | $L_{B42}$ |
| 6153 | $L_{A393}$ | $L_{B42}$ |
| 6154 | $L_{A394}$ | $L_{B42}$ |
| 6155 | $L_{A395}$ | $L_{B42}$ |
| 6156 | $L_{A396}$ | $L_{B42}$ |
| 6157 | $L_{A397}$ | $L_{B42}$ |
| 6158 | $L_{A398}$ | $L_{B42}$ |
| 6159 | $L_{A399}$ | $L_{B42}$ |
| 6160 | $L_{A400}$ | $L_{B42}$ |
| 6161 | $L_{A401}$ | $L_{B42}$ |
| 6162 | $L_{A402}$ | $L_{B42}$ |
| 6163 | $L_{A403}$ | $L_{B42}$ |
| 6164 | $L_{A404}$ | $L_{B42}$ |
| 6165 | $L_{A405}$ | $L_{B42}$ |
| 6166 | $L_{A406}$ | $L_{B42}$ |
| 6167 | $L_{A407}$ | $L_{B42}$ |
| 6168 | $L_{A408}$ | $L_{B42}$ |
| 6169 | $L_{A409}$ | $L_{B42}$ |
| 6170 | $L_{A410}$ | $L_{B42}$ |
| 6171 | $L_{A411}$ | $L_{B42}$ |
| 6172 | $L_{A412}$ | $L_{B42}$ |
| 6173 | $L_{A413}$ | $L_{B42}$ |
| 6174 | $L_{A414}$ | $L_{B42}$ |
| 6175 | $L_{A415}$ | $L_{B42}$ |
| 6176 | $L_{A416}$ | $L_{B42}$ |
| 6177 | $L_{A417}$ | $L_{B42}$ |
| 6178 | $L_{A418}$ | $L_{B42}$ |
| 6179 | $L_{A419}$ | $L_{B42}$ |
| 6180 | $L_{A420}$ | $L_{B42}$ |
| 6181 | $L_{A421}$ | $L_{B42}$ |

-continued

| Compound Number | $L_A$ | $L_B$ |
|---|---|---|
| 6182 | $L_{A422}$ | $L_{B42}$ |
| 6183 | $L_{A423}$ | $L_{B42}$ |
| 6184 | $L_{A424}$ | $L_{B42}$ |
| 6185 | $L_{A425}$ | $L_{B42}$ |
| 6186 | $L_{A426}$ | $L_{B42}$ |
| 6187 | $L_{A427}$ | $L_{B42}$ |
| 6188 | $L_{A428}$ | $L_{B42}$ |
| 6189 | $L_{A429}$ | $L_{B42}$ |
| 6190 | $L_{A430}$ | $L_{B42}$ |
| 6191 | $L_{A431}$ | $L_{B42}$ |
| 6192 | $L_{A432}$ | $L_{B42}$ |
| 6193 | $L_{A433}$ | $L_{B42}$ |
| 6194 | $L_{A434}$ | $L_{B42}$ |
| 6195 | $L_{A435}$ | $L_{B42}$ |
| 6196 | $L_{A436}$ | $L_{B42}$ |
| 6197 | $L_{A437}$ | $L_{B42}$ |
| 6198 | $L_{A438}$ | $L_{B42}$ |
| 6199 | $L_{A439}$ | $L_{B42}$ |
| 6200 | $L_{A440}$ | $L_{B42}$ |
| 6201 | $L_{A441}$ | $L_{B42}$ |
| 6202 | $L_{A442}$ | $L_{B42}$ |
| 6203 | $L_{A443}$ | $L_{B42}$ |
| 6204 | $L_{A444}$ | $L_{B42}$ |
| 6205 | $L_{A445}$ | $L_{B42}$ |
| 6206 | $L_{A446}$ | $L_{B42}$ |
| 6207 | $L_{A447}$ | $L_{B42}$ |
| 6208 | $L_{A448}$ | $L_{B42}$ |
| 6209 | $L_{A449}$ | $L_{B42}$ |
| 6210 | $L_{A450}$ | $L_{B42}$ |
| 6211 | $L_{A451}$ | $L_{B42}$ |
| 6212 | $L_{A452}$ | $L_{B42}$ |
| 6213 | $L_{A453}$ | $L_{B42}$ |
| 6214 | $L_{A454}$ | $L_{B42}$ |
| 6215 | $L_{A455}$ | $L_{B42}$ |
| 6216 | $L_{A456}$ | $L_{B42}$ |
| 6217 | $L_{A457}$ | $L_{B42}$ |
| 6218 | $L_{A458}$ | $L_{B42}$ |
| 6219 | $L_{A459}$ | $L_{B42}$ |
| 6220 | $L_{A460}$ | $L_{B42}$ |
| 6221 | $L_{A461}$ | $L_{B42}$ |
| 6222 | $L_{A462}$ | $L_{B42}$ |
| 6223 | $L_{A463}$ | $L_{B42}$ |
| 6224 | $L_{A464}$ | $L_{B42}$ |
| 6225 | $L_{A465}$ | $L_{B42}$ |
| 6226 | $L_{A466}$ | $L_{B42}$ |
| 6227 | $L_{A467}$ | $L_{B42}$ |
| 6228 | $L_{A468}$ | $L_{B42}$ |
| 6229 | $L_{A469}$ | $L_{B42}$ |
| 6230 | $L_{A470}$ | $L_{B42}$ |
| 6231 | $L_{A471}$ | $L_{B42}$ |
| 6232 | $L_{A472}$ | $L_{B42}$ |
| 6233 | $L_{A473}$ | $L_{B42}$ |
| 6234 | $L_{A474}$ | $L_{B42}$ |
| 6235 | $L_{A475}$ | $L_{B42}$ |
| 6236 | $L_{A476}$ | $L_{B42}$ |
| 6237 | $L_{A477}$ | $L_{B42}$ |
| 6238 | $L_{A478}$ | $L_{B42}$ |
| 6239 | $L_{A479}$ | $L_{B42}$ |
| 6240 | $L_{A480}$ | $L_{B42}$ |
| 6241 | $L_{A481}$ | $L_{B42}$ |
| 6242 | $L_{A482}$ | $L_{B42}$ |
| 6243 | $L_{A483}$ | $L_{B42}$ |
| 6244 | $L_{A484}$ | $L_{B42}$ |
| 6245 | $L_{A485}$ | $L_{B42}$ |
| 6246 | $L_{A486}$ | $L_{B42}$ |
| 6247 | $L_{A487}$ | $L_{B42}$ |
| 6248 | $L_{A488}$ | $L_{B42}$ |
| 6249 | $L_{A489}$ | $L_{B42}$ |
| 6250 | $L_{A490}$ | $L_{B42}$ |
| 6251 | $L_{A491}$ | $L_{B42}$ |
| 6252 | $L_{A492}$ | $L_{B42}$ |
| 6253 | $L_{A493}$ | $L_{B42}$ |
| 6254 | $L_{A494}$ | $L_{B42}$ |
| 6255 | $L_{A495}$ | $L_{B42}$ |
| 6256 | $L_{A496}$ | $L_{B42}$ |
| 6257 | $L_{A497}$ | $L_{B42}$ |
| 6258 | $L_{A498}$ | $L_{B42}$ |
| 6259 | $L_{A499}$ | $L_{B42}$ |
| 6260 | $L_{A500}$ | $L_{B42}$ |
| 6261 | $L_{A501}$ | $L_{B42}$ |
| 6262 | $L_{A502}$ | $L_{B42}$ |
| 6263 | $L_{A503}$ | $L_{B42}$ |
| 6264 | $L_{A504}$ | $L_{B42}$ |
| 6265 | $L_{A505}$ | $L_{B42}$ |
| 6266 | $L_{A506}$ | $L_{B42}$ |
| 6267 | $L_{A507}$ | $L_{B42}$ |
| 6268 | $L_{A508}$ | $L_{B42}$ |
| 6269 | $L_{A509}$ | $L_{B42}$ |
| 6270 | $L_{A510}$ | $L_{B42}$ |
| 6271 | $L_{A511}$ | $L_{B42}$ |
| 6272 | $L_{A512}$ | $L_{B42}$ |
| 6273 | $L_{A513}$ | $L_{B42}$ |
| 6274 | $L_{A514}$ | $L_{B42}$ |
| 6275 | $L_{A515}$ | $L_{B42}$ |
| 6276 | $L_{A516}$ | $L_{B42}$ |
| 6277 | $L_{A517}$ | $L_{B42}$ |
| 6278 | $L_{A518}$ | $L_{B42}$ |
| 6279 | $L_{A519}$ | $L_{B42}$ |
| 6280 | $L_{A520}$ | $L_{B42}$ |
| 6281 | $L_{A521}$ | $L_{B42}$ |
| 6282 | $L_{A522}$ | $L_{B42}$ |
| 6283 | $L_{A523}$ | $L_{B42}$ |
| 6284 | $L_{A524}$ | $L_{B42}$ |
| 6285 | $L_{A525}$ | $L_{B42}$ |
| 6286 | $L_{A526}$ | $L_{B42}$ |
| 6287 | $L_{A527}$ | $L_{B42}$ |
| 6288 | $L_{A528}$ | $L_{B42}$ |
| 6289 | $L_{A529}$ | $L_{B42}$ |
| 6290 | $L_{A530}$ | $L_{B42}$ |
| 6291 | $L_{A531}$ | $L_{B42}$ |
| 6292 | $L_{A532}$ | $L_{B42}$ |
| 6293 | $L_{A533}$ | $L_{B42}$ |
| 6294 | $L_{A534}$ | $L_{B42}$ |
| 6295 | $L_{A535}$ | $L_{B42}$ |
| 6296 | $L_{A536}$ | $L_{B42}$ |
| 6297 | $L_{A537}$ | $L_{B42}$ |
| 6298 | $L_{A538}$ | $L_{B42}$ |
| 6299 | $L_{A539}$ | $L_{B42}$ |
| 6300 | $L_{A540}$ | $L_{B42}$ |
| 6301 | $L_{A541}$ | $L_{B42}$ |
| 6302 | $L_{A542}$ | $L_{B42}$ |
| 6303 | $L_{A543}$ | $L_{B42}$ |
| 6304 | $L_{A544}$ | $L_{B42}$ |
| 6305 | $L_{A545}$ | $L_{B42}$ |
| 6306 | $L_{A546}$ | $L_{B42}$ |
| 6307 | $L_{A547}$ | $L_{B42}$ |
| 6308 | $L_{A548}$ | $L_{B42}$ |
| 6309 | $L_{A549}$ | $L_{B42}$ |
| 6310 | $L_{A550}$ | $L_{B42}$ |
| 6311 | $L_{A551}$ | $L_{B42}$ |
| 6312 | $L_{A552}$ | $L_{B42}$ |
| 6313 | $L_{A553}$ | $L_{B42}$ |
| 6314 | $L_{A554}$ | $L_{B42}$ |
| 6315 | $L_{A555}$ | $L_{B42}$ |
| 6316 | $L_{A556}$ | $L_{B42}$ |
| 6317 | $L_{A557}$ | $L_{B42}$ |
| 6318 | $L_{A558}$ | $L_{B42}$ |
| 6319 | $L_{A559}$ | $L_{B42}$ |
| 6320 | $L_{A560}$ | $L_{B42}$ |
| 6321 | $L_{A561}$ | $L_{B42}$ |
| 6322 | $L_{A562}$ | $L_{B42}$ |
| 6323 | $L_{A563}$ | $L_{B42}$ |
| 6324 | $L_{A564}$ | $L_{B42}$ |
| 6325 | $L_{A565}$ | $L_{B42}$ |
| 6326 | $L_{A566}$ | $L_{B42}$ |
| 6327 | $L_{A567}$ | $L_{B42}$ |
| 6328 | $L_{A568}$ | $L_{B42}$ |
| 6329 | $L_{A569}$ | $L_{B42}$ |
| 6330 | $L_{A570}$ | $L_{B42}$ |
| 6331 | $L_{A571}$ | $L_{B42}$ |
| 6332 | $L_{A572}$ | $L_{B42}$ |
| 6333 | $L_{A573}$ | $L_{B42}$ |

-continued

| Compound Number | $L_A$ | $L_B$ |
|---|---|---|
| 6334 | $L_{A574}$ | $L_{B42}$ |
| 6335 | $L_{A575}$ | $L_{B42}$ |
| 6336 | $L_{A576}$ | $L_{B42}$ |
| 6337 | $L_{A577}$ | $L_{B42}$ |
| 6338 | $L_{A578}$ | $L_{B42}$ |
| 6339 | $L_{A579}$ | $L_{B42}$ |
| 6340 | $L_{A580}$ | $L_{B42}$ |
| 6341 | $L_{A581}$ | $L_{B42}$ |
| 6342 | $L_{A582}$ | $L_{B42}$ |
| 6343 | $L_{A583}$ | $L_{B42}$ |
| 6344 | $L_{A584}$ | $L_{B42}$ |
| 6345 | $L_{A585}$ | $L_{B42}$ |
| 6346 | $L_{A586}$ | $L_{B42}$ |
| 6347 | $L_{A587}$ | $L_{B42}$ |
| 6348 | $L_{A588}$ | $L_{B42}$ |
| 6349 | $L_{A589}$ | $L_{B42}$ |
| 6350 | $L_{A590}$ | $L_{B42}$ |
| 6351 | $L_{A591}$ | $L_{B42}$ |
| 6352 | $L_{A592}$ | $L_{B42}$ |
| 6353 | $L_{A593}$ | $L_{B42}$ |
| 6354 | $L_{A594}$ | $L_{B42}$ |
| 6355 | $L_{A595}$ | $L_{B42}$ |
| 6356 | $L_{A596}$ | $L_{B42}$ |
| 6357 | $L_{A597}$ | $L_{B42}$ |
| 6358 | $L_{A598}$ | $L_{B42}$ |
| 6359 | $L_{A599}$ | $L_{B42}$ |
| 6360 | $L_{A600}$ | $L_{B42}$ |
| 6361 | $L_{A601}$ | $L_{B42}$ |
| 6362 | $L_{A602}$ | $L_{B42}$ |
| 6363 | $L_{A603}$ | $L_{B42}$ |
| 6364 | $L_{A604}$ | $L_{B42}$ |
| 6365 | $L_{A605}$ | $L_{B42}$ |
| 6366 | $L_{A606}$ | $L_{B42}$ |
| 6367 | $L_{A607}$ | $L_{B42}$ |
| 6368 | $L_{A608}$ | $L_{B42}$ |
| 6369 | $L_{A609}$ | $L_{B42}$ |
| 6370 | $L_{A610}$ | $L_{B42}$ |
| 6371 | $L_{A611}$ | $L_{B42}$ |
| 6372 | $L_{A612}$ | $L_{B42}$ |
| 6373 | $L_{A613}$ | $L_{B42}$ |
| 6374 | $L_{A614}$ | $L_{B42}$ |
| 6375 | $L_{A615}$ | $L_{B42}$ |
| 6376 | $L_{A616}$ | $L_{B42}$ |
| 6377 | $L_{A617}$ | $L_{B42}$ |
| 6378 | $L_{A618}$ | $L_{B42}$ |
| 6379 | $L_{A619}$ | $L_{B42}$ |
| 6380 | $L_{A620}$ | $L_{B42}$ |
| 6381 | $L_{A621}$ | $L_{B42}$ |
| 6382 | $L_{A622}$ | $L_{B42}$ |
| 6383 | $L_{A623}$ | $L_{B42}$ |
| 6384 | $L_{A624}$ | $L_{B42}$ |
| 6385 | $L_{A625}$ | $L_{B42}$ |
| 6386 | $L_{A626}$ | $L_{B42}$ |
| 6387 | $L_{A627}$ | $L_{B42}$ |
| 6388 | $L_{A628}$ | $L_{B42}$ |
| 6389 | $L_{A629}$ | $L_{B42}$ |
| 6390 | $L_{A630}$ | $L_{B42}$ |
| 6391 | $L_{A631}$ | $L_{B42}$ |
| 6392 | $L_{A632}$ | $L_{B42}$ |
| 6393 | $L_{A633}$ | $L_{B42}$ |
| 6394 | $L_{A634}$ | $L_{B42}$ |
| 6395 | $L_{A635}$ | $L_{B42}$ |
| 6396 | $L_{A636}$ | $L_{B42}$ |
| 6397 | $L_{A637}$ | $L_{B42}$ |
| 6398 | $L_{A638}$ | $L_{B42}$ |
| 6399 | $L_{A639}$ | $L_{B42}$ |
| 6400 | $L_{A640}$ | $L_{B42}$ |
| 6401 | $L_{A641}$ | $L_{B42}$ |
| 6402 | $L_{A642}$ | $L_{B42}$ |
| 6403 | $L_{A643}$ | $L_{B42}$ |
| 6404 | $L_{A644}$ | $L_{B42}$ |
| 6405 | $L_{A645}$ | $L_{B42}$ |
| 6406 | $L_{A646}$ | $L_{B42}$ |
| 6407 | $L_{A647}$ | $L_{B42}$ |
| 6408 | $L_{A648}$ | $L_{B42}$ |
| 6409 | $L_{A649}$ | $L_{B42}$ |
| 6410 | $L_{A650}$ | $L_{B42}$ |
| 6411 | $L_{A651}$ | $L_{B42}$ |
| 6412 | $L_{A652}$ | $L_{B42}$ |
| 6413 | $L_{A653}$ | $L_{B42}$ |
| 6414 | $L_{A654}$ | $L_{B42}$ |
| 6415 | $L_{A655}$ | $L_{B42}$ |
| 6416 | $L_{A656}$ | $L_{B42}$ |
| 6417 | $L_{A657}$ | $L_{B42}$ |
| 6418 | $L_{A658}$ | $L_{B42}$ |
| 6419 | $L_{A659}$ | $L_{B42}$ |
| 6420 | $L_{A660}$ | $L_{B42}$ |
| 6421 | $L_{A661}$ | $L_{B42}$ |
| 6422 | $L_{A662}$ | $L_{B42}$ |
| 6423 | $L_{A663}$ | $L_{B42}$ |
| 6424 | $L_{A664}$ | $L_{B42}$ |
| 6425 | $L_{A665}$ | $L_{B42}$ |
| 6426 | $L_{A666}$ | $L_{B42}$ |
| 6427 | $L_{A667}$ | $L_{B42}$ |
| 6428 | $L_{A668}$ | $L_{B42}$ |
| 6429 | $L_{A669}$ | $L_{B42}$ |
| 6430 | $L_{A670}$ | $L_{B42}$ |
| 6431 | $L_{A671}$ | $L_{B42}$ |
| 6432 | $L_{A672}$ | $L_{B42}$ |
| 6433 | $L_{A673}$ | $L_{B42}$ |
| 6434 | $L_{A674}$ | $L_{B42}$ |
| 6435 | $L_{A675}$ | $L_{B42}$ |
| 6436 | $L_{A676}$ | $L_{B42}$ |
| 6437 | $L_{A677}$ | $L_{B42}$ |
| 6438 | $L_{A678}$ | $L_{B42}$ |
| 6439 | $L_{A679}$ | $L_{B42}$ |
| 6440 | $L_{A680}$ | $L_{B42}$ |
| 6441 | $L_{A681}$ | $L_{B42}$ |
| 6442 | $L_{A682}$ | $L_{B42}$ |
| 6443 | $L_{A683}$ | $L_{B42}$ |
| 6444 | $L_{A684}$ | $L_{B42}$ |
| 6445 | $L_{A685}$ | $L_{B42}$ |
| 6446 | $L_{A686}$ | $L_{B42}$ |
| 6447 | $L_{A687}$ | $L_{B42}$ |
| 6448 | $L_{A688}$ | $L_{B42}$ |
| 6449 | $L_{A689}$ | $L_{B42}$ |
| 6450 | $L_{A690}$ | $L_{B42}$ |
| 6451 | $L_{A691}$ | $L_{B42}$ |
| 6452 | $L_{A692}$ | $L_{B42}$ |
| 6453 | $L_{A693}$ | $L_{B42}$ |
| 6454 | $L_{A694}$ | $L_{B42}$ |
| 6455 | $L_{A695}$ | $L_{B42}$ |
| 6456 | $L_{A696}$ | $L_{B42}$ |
| 6457 | $L_{A697}$ | $L_{B42}$ |
| 6458 | $L_{A698}$ | $L_{B42}$ |
| 6459 | $L_{A699}$ | $L_{B42}$ |
| 6460 | $L_{A700}$ | $L_{B42}$ |
| 6461 | $L_{A701}$ | $L_{B42}$ |
| 6462 | $L_{A702}$ | $L_{B42}$ |
| 6463 | $L_{A703}$ | $L_{B42}$ |
| 6464 | $L_{A704}$ | $L_{B42}$ |
| 6465 | $L_{A705}$ | $L_{B42}$ |
| 6466 | $L_{A706}$ | $L_{B42}$ |
| 6467 | $L_{A707}$ | $L_{B42}$ |
| 6468 | $L_{A708}$ | $L_{B42}$ |
| 6469 | $L_{A709}$ | $L_{B42}$ |
| 6470 | $L_{A710}$ | $L_{B42}$ |
| 6471 | $L_{A711}$ | $L_{B42}$ |
| 6472 | $L_{A712}$ | $L_{B42}$ |
| 6473 | $L_{A713}$ | $L_{B42}$ |
| 6474 | $L_{A714}$ | $L_{B42}$ |
| 6475 | $L_{A715}$ | $L_{B42}$ |
| 6476 | $L_{A716}$ | $L_{B42}$ |
| 6477 | $L_{A717}$ | $L_{B42}$ |
| 6478 | $L_{A718}$ | $L_{B42}$ |
| 6479 | $L_{A719}$ | $L_{B42}$ |
| 6480 | $L_{A720}$ | $L_{B42}$ |
| 6481 | $L_{A721}$ | $L_{B42}$ |
| 6482 | $L_{A722}$ | $L_{B42}$ |
| 6483 | $L_{A723}$ | $L_{B42}$ |
| 6484 | $L_{A724}$ | $L_{B42}$ |
| 6485 | $L_{A725}$ | $L_{B42}$ |

| Compound Number | $L_A$ | $L_B$ |
|---|---|---|
| 6486 | $L_{A726}$ | $L_{B42}$ |
| 6487 | $L_{A727}$ | $L_{B42}$ |
| 6488 | $L_{A728}$ | $L_{B42}$ |
| 6489 | $L_{A729}$ | $L_{B42}$ |
| 6490 | $L_{A730}$ | $L_{B42}$ |
| 6491 | $L_{A731}$ | $L_{B42}$ |
| 6492 | $L_{A732}$ | $L_{B42}$ |
| 6493 | $L_{A733}$ | $L_{B42}$ |
| 6494 | $L_{A734}$ | $L_{B42}$ |
| 6495 | $L_{A735}$ | $L_{B42}$ |
| 6496 | $L_{A736}$ | $L_{B42}$ |
| 6497 | $L_{A737}$ | $L_{B42}$ |
| 6498 | $L_{A738}$ | $L_{B42}$ |
| 6499 | $L_{A739}$ | $L_{B42}$ |
| 6500 | $L_{A740}$ | $L_{B42}$ |
| 6501 | $L_{A741}$ | $L_{B42}$ |
| 6502 | $L_{A742}$ | $L_{B42}$ |
| 6503 | $L_{A743}$ | $L_{B42}$ |
| 6504 | $L_{A744}$ | $L_{B42}$ |
| 6505 | $L_{A745}$ | $L_{B42}$ |
| 6506 | $L_{A746}$ | $L_{B42}$ |
| 6507 | $L_{A747}$ | $L_{B42}$ |
| 6508 | $L_{A748}$ | $L_{B42}$ |
| 6509 | $L_{A749}$ | $L_{B42}$ |
| 6510 | $L_{A750}$ | $L_{B42}$ |
| 6511 | $L_{A751}$ | $L_{B42}$ |
| 6512 | $L_{A752}$ | $L_{B42}$ |
| 6513 | $L_{A753}$ | $L_{B42}$ |
| 6514 | $L_{A754}$ | $L_{B42}$ |
| 6515 | $L_{A755}$ | $L_{B42}$ |
| 6516 | $L_{A756}$ | $L_{B42}$ |
| 6517 | $L_{A757}$ | $L_{B42}$ |
| 6518 | $L_{A758}$ | $L_{B42}$ |
| 6519 | $L_{A759}$ | $L_{B42}$ |
| 6520 | $L_{A760}$ | $L_{B42}$ |
| 6521 | $L_{A761}$ | $L_{B42}$ |
| 6522 | $L_{A762}$ | $L_{B42}$ |
| 6523 | $L_{A763}$ | $L_{B42}$ |
| 6524 | $L_{A764}$ | $L_{B42}$ |
| 6525 | $L_{A765}$ | $L_{B42}$ |
| 6526 | $L_{A766}$ | $L_{B42}$ |
| 6527 | $L_{A767}$ | $L_{B42}$ |
| 6528 | $L_{A768}$ | $L_{B42}$ |
| 6529 | $L_{A769}$ | $L_{B42}$ |
| 6530 | $L_{A770}$ | $L_{B42}$ |
| 6531 | $L_{A771}$ | $L_{B42}$ |
| 6532 | $L_{A772}$ | $L_{B42}$ |
| 6533 | $L_{A773}$ | $L_{B42}$ |
| 6534 | $L_{A774}$ | $L_{B42}$ |
| 6535 | $L_{A775}$ | $L_{B42}$ |
| 6536 | $L_{A776}$ | $L_{B42}$ |
| 6537 | $L_{A777}$ | $L_{B42}$ |
| 6538 | $L_{A778}$ | $L_{B42}$ |
| 6539 | $L_{A779}$ | $L_{B42}$ |
| 6540 | $L_{A780}$ | $L_{B42}$ |
| 6541 | $L_{A781}$ | $L_{B42}$ |
| 6542 | $L_{A782}$ | $L_{B42}$ |
| 6543 | $L_{A783}$ | $L_{B42}$ |
| 6544 | $L_{A784}$ | $L_{B42}$ |
| 6545 | $L_{A785}$ | $L_{B42}$ |
| 6546 | $L_{A786}$ | $L_{B42}$ |
| 6547 | $L_{A787}$ | $L_{B42}$ |
| 6548 | $L_{A788}$ | $L_{B42}$ |
| 6549 | $L_{A789}$ | $L_{B42}$ |
| 6550 | $L_{A790}$ | $L_{B42}$ |
| 6551 | $L_{A791}$ | $L_{B42}$ |
| 6552 | $L_{A792}$ | $L_{B42}$ |
| 6553 | $L_{A793}$ | $L_{B42}$ |
| 6554 | $L_{A794}$ | $L_{B42}$ |
| 6555 | $L_{A795}$ | $L_{B42}$ |
| 6556 | $L_{A796}$ | $L_{B42}$ |
| 6557 | $L_{A797}$ | $L_{B42}$ |
| 6558 | $L_{A798}$ | $L_{B42}$ |
| 6559 | $L_{A799}$ | $L_{B42}$ |
| 6560 | $L_{A800}$ | $L_{B42}$ |
| 6561 | $L_{A801}$ | $L_{B42}$ |

| Compound Number | $L_A$ | $L_B$ |
|---|---|---|
| 6562 | $L_{A802}$ | $L_{B42}$ |
| 6563 | $L_{A803}$ | $L_{B42}$ |
| 6564 | $L_{A804}$ | $L_{B42}$ |
| 6565 | $L_{A805}$ | $L_{B42}$ |
| 6566 | $L_{A806}$ | $L_{B42}$ |
| 6567 | $L_{A807}$ | $L_{B42}$ |
| 6568 | $L_{A808}$ | $L_{B42}$ |
| 6569 | $L_{A809}$ | $L_{B42}$ |
| 6570 | $L_{A810}$ | $L_{B42}$ |
| 6571 | $L_{A811}$ | $L_{B42}$ |
| 6572 | $L_{A812}$ | $L_{B42}$ |
| 6573 | $L_{A813}$ | $L_{B42}$ |
| 6574 | $L_{A814}$ | $L_{B42}$ |
| 6575 | $L_{A815}$ | $L_{B42}$ |
| 6576 | $L_{A816}$ | $L_{B42}$ |
| 6577 | $L_{A817}$ | $L_{B42}$ |
| 6578 | $L_{A818}$ | $L_{B42}$ |
| 6579 | $L_{A819}$ | $L_{B42}$ |
| 6580 | $L_{A820}$ | $L_{B42}$ |
| 6581 | $L_{A821}$ | $L_{B42}$ |
| 6582 | $L_{A822}$ | $L_{B42}$ |
| 6583 | $L_{A823}$ | $L_{B42}$ |
| 6584 | $L_{A824}$ | $L_{B42}$ |
| 6585 | $L_{A825}$ | $L_{B42}$ |
| 6586 | $L_{A826}$ | $L_{B42}$ |
| 6587 | $L_{A827}$ | $L_{B42}$ |
| 6588 | $L_{A828}$ | $L_{B42}$ |
| 6589 | $L_{A829}$ | $L_{B42}$ |
| 6590 | $L_{A830}$ | $L_{B42}$ |
| 6591 | $L_{A831}$ | $L_{B42}$ |
| 6592 | $L_{A832}$ | $L_{B42}$ |
| 6593 | $L_{A833}$ | $L_{B42}$ |
| 6594 | $L_{A834}$ | $L_{B42}$ |
| 6595 | $L_{A835}$ | $L_{B42}$ |
| 6596 | $L_{A836}$ | $L_{B42}$ |
| 6597 | $L_{A837}$ | $L_{B42}$ |
| 6598 | $L_{A838}$ | $L_{B42}$ |
| 6599 | $L_{A839}$ | $L_{B42}$ |
| 6600 | $L_{A840}$ | $L_{B42}$ |
| 6601 | $L_{A841}$ | $L_{B42}$ |
| 6602 | $L_{A842}$ | $L_{B42}$ |
| 6603 | $L_{A843}$ | $L_{B42}$ |
| 6604 | $L_{A844}$ | $L_{B42}$ |
| 6605 | $L_{A845}$ | $L_{B42}$ |
| 6606 | $L_{A846}$ | $L_{B42}$ |
| 6607 | $L_{A847}$ | $L_{B42}$ |
| 6608 | $L_{A848}$ | $L_{B42}$ |
| 6609 | $L_{A849}$ | $L_{B42}$ |
| 6610 | $L_{A850}$ | $L_{B42}$ |
| 6611 | $L_{A851}$ | $L_{B42}$ |
| 6612 | $L_{A852}$ | $L_{B42}$ |
| 6613 | $L_{A853}$ | $L_{B42}$ |
| 6614 | $L_{A854}$ | $L_{B42}$ |
| 6615 | $L_{A855}$ | $L_{B42}$ |
| 6616 | $L_{A856}$ | $L_{B42}$ |
| 6617 | $L_{A857}$ | $L_{B42}$ |
| 6618 | $L_{A858}$ | $L_{B42}$ |
| 6619 | $L_{A859}$ | $L_{B42}$ |
| 6620 | $L_{A860}$ | $L_{B42}$ |
| 6621 | $L_{A861}$ | $L_{B42}$ |
| 6622 | $L_{A862}$ | $L_{B42}$ |
| 6623 | $L_{A863}$ | $L_{B42}$ |
| 6624 | $L_{A864}$ | $L_{B42}$ |
| 6625 | $L_{A865}$ | $L_{B42}$ |
| 6626 | $L_{A866}$ | $L_{B42}$ |
| 6627 | $L_{A867}$ | $L_{B42}$ |
| 6628 | $L_{A868}$ | $L_{B42}$ |
| 6629 | $L_{A869}$ | $L_{B42}$ |
| 6630 | $L_{A870}$ | $L_{B42}$ |
| 6631 | $L_{A871}$ | $L_{B42}$ |
| 6632 | $L_{A872}$ | $L_{B42}$ |
| 6633 | $L_{A873}$ | $L_{B42}$ |
| 6634 | $L_{A874}$ | $L_{B42}$ |
| 6635 | $L_{A875}$ | $L_{B42}$ |
| 6636 | $L_{A876}$ | $L_{B42}$ |
| 6637 | $L_{A877}$ | $L_{B42}$ |

-continued

| Compound Number | $L_A$ | $L_B$ |
|---|---|---|
| 6638 | $L_{A878}$ | $L_{B42}$ |
| 6639 | $L_{A879}$ | $L_{B42}$ |
| 6640 | $L_{A880}$ | $L_{B42}$ |
| 6641 | $L_{A881}$ | $L_{B42}$ |
| 6642 | $L_{A882}$ | $L_{B42}$ |
| 6643 | $L_{A883}$ | $L_{B42}$ |
| 6644 | $L_{A884}$ | $L_{B42}$ |
| 6645 | $L_{A885}$ | $L_{B42}$ |
| 6646 | $L_{A886}$ | $L_{B42}$ |
| 6647 | $L_{A887}$ | $L_{B42}$ |
| 6648 | $L_{A888}$ | $L_{B42}$ |
| 6649 | $L_{A889}$ | $L_{B42}$ |
| 6650 | $L_{A890}$ | $L_{B42}$ |
| 6651 | $L_{A891}$ | $L_{B42}$ |
| 6652 | $L_{A892}$ | $L_{B42}$ |
| 6653 | $L_{A893}$ | $L_{B42}$ |
| 6654 | $L_{A894}$ | $L_{B42}$ |
| 6655 | $L_{A895}$ | $L_{B42}$ |
| 6656 | $L_{A896}$ | $L_{B42}$ |
| 6657 | $L_{A897}$ | $L_{B42}$ |
| 6658 | $L_{A898}$ | $L_{B42}$ |
| 6659 | $L_{A899}$ | $L_{B42}$ |
| 6660 | $L_{A900}$ | $L_{B42}$ |
| 6661 | $L_{A901}$ | $L_{B42}$ |
| 6662 | $L_{A902}$ | $L_{B42}$ |
| 6663 | $L_{A903}$ | $L_{B42}$ |
| 6664 | $L_{A904}$ | $L_{B42}$ |
| 6665 | $L_{A905}$ | $L_{B42}$ |
| 6666 | $L_{A906}$ | $L_{B42}$ |
| 6667 | $L_{A907}$ | $L_{B42}$ |
| 6668 | $L_{A908}$ | $L_{B42}$ |
| 6669 | $L_{A909}$ | $L_{B42}$ |
| 6670 | $L_{A910}$ | $L_{B42}$ |
| 6671 | $L_{A911}$ | $L_{B42}$ |
| 6672 | $L_{A912}$ | $L_{B42}$ |
| 6673 | $L_{A913}$ | $L_{B42}$ |
| 6674 | $L_{A914}$ | $L_{B42}$ |
| 6675 | $L_{A915}$ | $L_{B42}$ |
| 6676 | $L_{A916}$ | $L_{B42}$ |
| 6677 | $L_{A917}$ | $L_{B42}$ |
| 6678 | $L_{A918}$ | $L_{B42}$ |
| 6679 | $L_{A919}$ | $L_{B42}$ |
| 6680 | $L_{A920}$ | $L_{B42}$ |
| 6681 | $L_{A921}$ | $L_{B42}$ |
| 6682 | $L_{A922}$ | $L_{B42}$ |
| 6683 | $L_{A923}$ | $L_{B42}$ |
| 6684 | $L_{A924}$ | $L_{B42}$ |
| 6685 | $L_{A925}$ | $L_{B42}$ |
| 6686 | $L_{A926}$ | $L_{B42}$ |
| 6687 | $L_{A927}$ | $L_{B42}$ |
| 6688 | $L_{A928}$ | $L_{B42}$ |
| 6689 | $L_{A929}$ | $L_{B42}$ |
| 6690 | $L_{A930}$ | $L_{B42}$ |
| 6691 | $L_{A931}$ | $L_{B42}$ |
| 6692 | $L_{A932}$ | $L_{B42}$ |
| 6693 | $L_{A933}$ | $L_{B42}$ |
| 6694 | $L_{A934}$ | $L_{B42}$ |
| 6695 | $L_{A935}$ | $L_{B42}$ |
| 6696 | $L_{A936}$ | $L_{B42}$ |
| 6697 | $L_{A937}$ | $L_{B42}$ |
| 6698 | $L_{A938}$ | $L_{B42}$ |
| 6699 | $L_{A939}$ | $L_{B42}$ |
| 6700 | $L_{A940}$ | $L_{B42}$ |
| 6701 | $L_{A941}$ | $L_{B42}$ |
| 6702 | $L_{A942}$ | $L_{B42}$ |
| 6703 | $L_{A943}$ | $L_{B42}$ |
| 6704 | $L_{A944}$ | $L_{B42}$ |
| 6705 | $L_{A945}$ | $L_{B42}$ |
| 6706 | $L_{A946}$ | $L_{B42}$ |
| 6707 | $L_{A947}$ | $L_{B42}$ |
| 6708 | $L_{A948}$ | $L_{B42}$ |
| 6709 | $L_{A949}$ | $L_{B42}$ |
| 6710 | $L_{A950}$ | $L_{B42}$ |
| 6711 | $L_{A951}$ | $L_{B42}$ |
| 6712 | $L_{A952}$ | $L_{B42}$ |
| 6713 | $L_{A953}$ | $L_{B42}$ |

-continued

| Compound Number | $L_A$ | $L_B$ |
|---|---|---|
| 6714 | $L_{A954}$ | $L_{B42}$ |
| 6715 | $L_{A955}$ | $L_{B42}$ |
| 6716 | $L_{A956}$ | $L_{B42}$ |
| 6717 | $L_{A957}$ | $L_{B42}$ |
| 6718 | $L_{A958}$ | $L_{B42}$ |
| 6719 | $L_{A959}$ | $L_{B42}$ |
| 6720 | $L_{A960}$ | $L_{B42}$ |
| 6721 | $L_{A1}$ | $L_{B43}$ |
| 6722 | $L_{A2}$ | $L_{B43}$ |
| 6723 | $L_{A3}$ | $L_{B43}$ |
| 6724 | $L_{A4}$ | $L_{B43}$ |
| 6725 | $L_{A5}$ | $L_{B43}$ |
| 6726 | $L_{A6}$ | $L_{B43}$ |
| 6727 | $L_{A7}$ | $L_{B43}$ |
| 6728 | $L_{A8}$ | $L_{B43}$ |
| 6729 | $L_{A9}$ | $L_{B43}$ |
| 6730 | $L_{A10}$ | $L_{B43}$ |
| 6731 | $L_{A11}$ | $L_{B43}$ |
| 6732 | $L_{A12}$ | $L_{B43}$ |
| 6733 | $L_{A13}$ | $L_{B43}$ |
| 6734 | $L_{A14}$ | $L_{B43}$ |
| 6735 | $L_{A15}$ | $L_{B43}$ |
| 6736 | $L_{A16}$ | $L_{B43}$ |
| 6737 | $L_{A17}$ | $L_{B43}$ |
| 6738 | $L_{A18}$ | $L_{B43}$ |
| 6739 | $L_{A19}$ | $L_{B43}$ |
| 6740 | $L_{A20}$ | $L_{B43}$ |
| 6741 | $L_{A21}$ | $L_{B43}$ |
| 6742 | $L_{A22}$ | $L_{B43}$ |
| 6743 | $L_{A23}$ | $L_{B43}$ |
| 6744 | $L_{A24}$ | $L_{B43}$ |
| 6745 | $L_{A25}$ | $L_{B43}$ |
| 6746 | $L_{A26}$ | $L_{B43}$ |
| 6747 | $L_{A27}$ | $L_{B43}$ |
| 6748 | $L_{A28}$ | $L_{B43}$ |
| 6749 | $L_{A29}$ | $L_{B43}$ |
| 6750 | $L_{A30}$ | $L_{B43}$ |
| 6751 | $L_{A31}$ | $L_{B43}$ |
| 6752 | $L_{A32}$ | $L_{B43}$ |
| 6753 | $L_{A33}$ | $L_{B43}$ |
| 6754 | $L_{A34}$ | $L_{B43}$ |
| 6755 | $L_{A35}$ | $L_{B43}$ |
| 6756 | $L_{A36}$ | $L_{B43}$ |
| 6757 | $L_{A37}$ | $L_{B43}$ |
| 6758 | $L_{A38}$ | $L_{B43}$ |
| 6759 | $L_{A39}$ | $L_{B43}$ |
| 6760 | $L_{A40}$ | $L_{B43}$ |
| 6761 | $L_{A41}$ | $L_{B43}$ |
| 6762 | $L_{A42}$ | $L_{B43}$ |
| 6763 | $L_{A43}$ | $L_{B43}$ |
| 6764 | $L_{A44}$ | $L_{B43}$ |
| 6765 | $L_{A45}$ | $L_{B43}$ |
| 6766 | $L_{A46}$ | $L_{B43}$ |
| 6767 | $L_{A47}$ | $L_{B43}$ |
| 6768 | $L_{A48}$ | $L_{B43}$ |
| 6769 | $L_{A49}$ | $L_{B43}$ |
| 6770 | $L_{A50}$ | $L_{B43}$ |
| 6771 | $L_{A51}$ | $L_{B43}$ |
| 6772 | $L_{A52}$ | $L_{B43}$ |
| 6773 | $L_{A53}$ | $L_{B43}$ |
| 6774 | $L_{A54}$ | $L_{B43}$ |
| 6775 | $L_{A55}$ | $L_{B43}$ |
| 6776 | $L_{A56}$ | $L_{B43}$ |
| 6777 | $L_{A57}$ | $L_{B43}$ |
| 6778 | $L_{A58}$ | $L_{B43}$ |
| 6779 | $L_{A59}$ | $L_{B43}$ |
| 6780 | $L_{A60}$ | $L_{B43}$ |
| 6781 | $L_{A61}$ | $L_{B43}$ |
| 6782 | $L_{A62}$ | $L_{B43}$ |
| 6783 | $L_{A63}$ | $L_{B43}$ |
| 6784 | $L_{A64}$ | $L_{B43}$ |
| 6785 | $L_{A65}$ | $L_{B43}$ |
| 6786 | $L_{A66}$ | $L_{B43}$ |
| 6787 | $L_{A67}$ | $L_{B43}$ |
| 6788 | $L_{A68}$ | $L_{B43}$ |
| 6789 | $L_{A69}$ | $L_{B43}$ |

-continued

| Compound Number | $L_A$ | $L_B$ |
|---|---|---|
| 6790 | $L_{A70}$ | $L_{B43}$ |
| 6791 | $L_{A71}$ | $L_{B43}$ |
| 6792 | $L_{A72}$ | $L_{B43}$ |
| 6793 | $L_{A73}$ | $L_{B43}$ |
| 6794 | $L_{A74}$ | $L_{B43}$ |
| 6795 | $L_{A75}$ | $L_{B43}$ |
| 6796 | $L_{A76}$ | $L_{B43}$ |
| 6797 | $L_{A77}$ | $L_{B43}$ |
| 6798 | $L_{A78}$ | $L_{B43}$ |
| 6799 | $L_{A79}$ | $L_{B43}$ |
| 6800 | $L_{A80}$ | $L_{B43}$ |
| 6801 | $L_{A81}$ | $L_{B43}$ |
| 6802 | $L_{A82}$ | $L_{B43}$ |
| 6803 | $L_{A83}$ | $L_{B43}$ |
| 6804 | $L_{A84}$ | $L_{B43}$ |
| 6805 | $L_{A85}$ | $L_{B43}$ |
| 6806 | $L_{A86}$ | $L_{B43}$ |
| 6807 | $L_{A87}$ | $L_{B43}$ |
| 6808 | $L_{A88}$ | $L_{B43}$ |
| 6809 | $L_{A89}$ | $L_{B43}$ |
| 6810 | $L_{A90}$ | $L_{B43}$ |
| 6811 | $L_{A91}$ | $L_{B43}$ |
| 6812 | $L_{A92}$ | $L_{B43}$ |
| 6813 | $L_{A93}$ | $L_{B43}$ |
| 6814 | $L_{A94}$ | $L_{B43}$ |
| 6815 | $L_{A95}$ | $L_{B43}$ |
| 6816 | $L_{A96}$ | $L_{B43}$ |
| 6817 | $L_{A97}$ | $L_{B43}$ |
| 6818 | $L_{A98}$ | $L_{B43}$ |
| 6819 | $L_{A99}$ | $L_{B43}$ |
| 6820 | $L_{A100}$ | $L_{B43}$ |
| 6821 | $L_{A101}$ | $L_{B43}$ |
| 6822 | $L_{A102}$ | $L_{B43}$ |
| 6823 | $L_{A103}$ | $L_{B43}$ |
| 6824 | $L_{A104}$ | $L_{B43}$ |
| 6825 | $L_{A105}$ | $L_{B43}$ |
| 6826 | $L_{A106}$ | $L_{B43}$ |
| 6827 | $L_{A107}$ | $L_{B43}$ |
| 6828 | $L_{A108}$ | $L_{B43}$ |
| 6829 | $L_{A109}$ | $L_{B43}$ |
| 6830 | $L_{A110}$ | $L_{B43}$ |
| 6831 | $L_{A111}$ | $L_{B43}$ |
| 6832 | $L_{A112}$ | $L_{B43}$ |
| 6833 | $L_{A113}$ | $L_{B43}$ |
| 6834 | $L_{A114}$ | $L_{B43}$ |
| 6835 | $L_{A115}$ | $L_{B43}$ |
| 6836 | $L_{A116}$ | $L_{B43}$ |
| 6837 | $L_{A117}$ | $L_{B43}$ |
| 6838 | $L_{A118}$ | $L_{B43}$ |
| 6839 | $L_{A119}$ | $L_{B43}$ |
| 6840 | $L_{A120}$ | $L_{B43}$ |
| 6841 | $L_{A121}$ | $L_{B43}$ |
| 6842 | $L_{A122}$ | $L_{B43}$ |
| 6843 | $L_{A123}$ | $L_{B43}$ |
| 6844 | $L_{A124}$ | $L_{B43}$ |
| 6845 | $L_{A125}$ | $L_{B43}$ |
| 6846 | $L_{A126}$ | $L_{B43}$ |
| 6847 | $L_{A127}$ | $L_{B43}$ |
| 6848 | $L_{A128}$ | $L_{B43}$ |
| 6849 | $L_{A129}$ | $L_{B43}$ |
| 6850 | $L_{A130}$ | $L_{B43}$ |
| 6851 | $L_{A131}$ | $L_{B43}$ |
| 6852 | $L_{A132}$ | $L_{B43}$ |
| 6853 | $L_{A133}$ | $L_{B43}$ |
| 6854 | $L_{A134}$ | $L_{B43}$ |
| 6855 | $L_{A135}$ | $L_{B43}$ |
| 6856 | $L_{A136}$ | $L_{B43}$ |
| 6857 | $L_{A137}$ | $L_{B43}$ |
| 6858 | $L_{A138}$ | $L_{B43}$ |
| 6859 | $L_{A139}$ | $L_{B43}$ |
| 6860 | $L_{A140}$ | $L_{B43}$ |
| 6861 | $L_{A141}$ | $L_{B43}$ |
| 6862 | $L_{A142}$ | $L_{B43}$ |
| 6863 | $L_{A143}$ | $L_{B43}$ |
| 6864 | $L_{A144}$ | $L_{B43}$ |
| 6865 | $L_{A145}$ | $L_{B43}$ |
| 6866 | $L_{A146}$ | $L_{B43}$ |
| 6867 | $L_{A147}$ | $L_{B43}$ |
| 6868 | $L_{A148}$ | $L_{B43}$ |
| 6869 | $L_{A149}$ | $L_{B43}$ |
| 6870 | $L_{A150}$ | $L_{B43}$ |
| 6871 | $L_{A151}$ | $L_{B43}$ |
| 6872 | $L_{A152}$ | $L_{B43}$ |
| 6873 | $L_{A153}$ | $L_{B43}$ |
| 6874 | $L_{A154}$ | $L_{B43}$ |
| 6875 | $L_{A155}$ | $L_{B43}$ |
| 6876 | $L_{A156}$ | $L_{B43}$ |
| 6877 | $L_{A157}$ | $L_{B43}$ |
| 6878 | $L_{A158}$ | $L_{B43}$ |
| 6879 | $L_{A159}$ | $L_{B43}$ |
| 6880 | $L_{A160}$ | $L_{B43}$ |
| 6881 | $L_{A161}$ | $L_{B43}$ |
| 6882 | $L_{A162}$ | $L_{B43}$ |
| 6883 | $L_{A163}$ | $L_{B43}$ |
| 6884 | $L_{A164}$ | $L_{B43}$ |
| 6885 | $L_{A165}$ | $L_{B43}$ |
| 6886 | $L_{A166}$ | $L_{B43}$ |
| 6887 | $L_{A167}$ | $L_{B43}$ |
| 6888 | $L_{A168}$ | $L_{B43}$ |
| 6889 | $L_{A169}$ | $L_{B43}$ |
| 6890 | $L_{A170}$ | $L_{B43}$ |
| 6891 | $L_{A171}$ | $L_{B43}$ |
| 6892 | $L_{A172}$ | $L_{B43}$ |
| 6893 | $L_{A173}$ | $L_{B43}$ |
| 6894 | $L_{A174}$ | $L_{B43}$ |
| 6895 | $L_{A175}$ | $L_{B43}$ |
| 6896 | $L_{A176}$ | $L_{B43}$ |
| 6897 | $L_{A177}$ | $L_{B43}$ |
| 6898 | $L_{A178}$ | $L_{B43}$ |
| 6899 | $L_{A179}$ | $L_{B43}$ |
| 6900 | $L_{A180}$ | $L_{B43}$ |
| 6901 | $L_{A181}$ | $L_{B43}$ |
| 6902 | $L_{A182}$ | $L_{B43}$ |
| 6903 | $L_{A183}$ | $L_{B43}$ |
| 6904 | $L_{A184}$ | $L_{B43}$ |
| 6905 | $L_{A185}$ | $L_{B43}$ |
| 6906 | $L_{A186}$ | $L_{B43}$ |
| 6907 | $L_{A187}$ | $L_{B43}$ |
| 6908 | $L_{A188}$ | $L_{B43}$ |
| 6909 | $L_{A189}$ | $L_{B43}$ |
| 6910 | $L_{A190}$ | $L_{B43}$ |
| 6911 | $L_{A191}$ | $L_{B43}$ |
| 6912 | $L_{A192}$ | $L_{B43}$ |
| 6913 | $L_{A193}$ | $L_{B43}$ |
| 6914 | $L_{A194}$ | $L_{B43}$ |
| 6915 | $L_{A195}$ | $L_{B43}$ |
| 6916 | $L_{A196}$ | $L_{B43}$ |
| 6917 | $L_{A197}$ | $L_{B43}$ |
| 6918 | $L_{A198}$ | $L_{B43}$ |
| 6919 | $L_{A199}$ | $L_{B43}$ |
| 6920 | $L_{A200}$ | $L_{B43}$ |
| 6921 | $L_{A201}$ | $L_{B43}$ |
| 6922 | $L_{A202}$ | $L_{B43}$ |
| 6923 | $L_{A203}$ | $L_{B43}$ |
| 6924 | $L_{A204}$ | $L_{B43}$ |
| 6925 | $L_{A205}$ | $L_{B43}$ |
| 6926 | $L_{A206}$ | $L_{B43}$ |
| 6927 | $L_{A207}$ | $L_{B43}$ |
| 6928 | $L_{A208}$ | $L_{B43}$ |
| 6929 | $L_{A209}$ | $L_{B43}$ |
| 6930 | $L_{A210}$ | $L_{B43}$ |
| 6931 | $L_{A211}$ | $L_{B43}$ |
| 6932 | $L_{A212}$ | $L_{B43}$ |
| 6933 | $L_{A213}$ | $L_{B43}$ |
| 6934 | $L_{A214}$ | $L_{B43}$ |
| 6935 | $L_{A215}$ | $L_{B43}$ |
| 6936 | $L_{A216}$ | $L_{B43}$ |
| 6937 | $L_{A217}$ | $L_{B43}$ |
| 6938 | $L_{A218}$ | $L_{B43}$ |
| 6939 | $L_{A219}$ | $L_{B43}$ |
| 6940 | $L_{A220}$ | $L_{B43}$ |
| 6941 | $L_{A221}$ | $L_{B43}$ |

-continued

| Compound Number | $L_A$ | $L_B$ |
|---|---|---|
| 6942 | $L_{A222}$ | $L_{B43}$ |
| 6943 | $L_{A223}$ | $L_{B43}$ |
| 6944 | $L_{A224}$ | $L_{B43}$ |
| 6945 | $L_{A225}$ | $L_{B43}$ |
| 6946 | $L_{A226}$ | $L_{B43}$ |
| 6947 | $L_{A227}$ | $L_{B43}$ |
| 6948 | $L_{A228}$ | $L_{B43}$ |
| 6949 | $L_{A229}$ | $L_{B43}$ |
| 6950 | $L_{A230}$ | $L_{B43}$ |
| 6951 | $L_{A231}$ | $L_{B43}$ |
| 6952 | $L_{A232}$ | $L_{B43}$ |
| 6953 | $L_{A233}$ | $L_{B43}$ |
| 6954 | $L_{A234}$ | $L_{B43}$ |
| 6955 | $L_{A235}$ | $L_{B43}$ |
| 6956 | $L_{A236}$ | $L_{B43}$ |
| 6957 | $L_{A237}$ | $L_{B43}$ |
| 6958 | $L_{A238}$ | $L_{B43}$ |
| 6959 | $L_{A239}$ | $L_{B43}$ |
| 6960 | $L_{A240}$ | $L_{B43}$ |
| 6961 | $L_{A241}$ | $L_{B43}$ |
| 6962 | $L_{A242}$ | $L_{B43}$ |
| 6963 | $L_{A243}$ | $L_{B43}$ |
| 6964 | $L_{A244}$ | $L_{B43}$ |
| 6965 | $L_{A245}$ | $L_{B43}$ |
| 6966 | $L_{A246}$ | $L_{B43}$ |
| 6967 | $L_{A247}$ | $L_{B43}$ |
| 6968 | $L_{A248}$ | $L_{B43}$ |
| 6969 | $L_{A249}$ | $L_{B43}$ |
| 6970 | $L_{A250}$ | $L_{B43}$ |
| 6971 | $L_{A251}$ | $L_{B43}$ |
| 6972 | $L_{A252}$ | $L_{B43}$ |
| 6973 | $L_{A253}$ | $L_{B43}$ |
| 6974 | $L_{A254}$ | $L_{B43}$ |
| 6975 | $L_{A255}$ | $L_{B43}$ |
| 6976 | $L_{A256}$ | $L_{B43}$ |
| 6977 | $L_{A257}$ | $L_{B43}$ |
| 6978 | $L_{A258}$ | $L_{B43}$ |
| 6979 | $L_{A259}$ | $L_{B43}$ |
| 6980 | $L_{A260}$ | $L_{B43}$ |
| 6981 | $L_{A261}$ | $L_{B43}$ |
| 6982 | $L_{A262}$ | $L_{B43}$ |
| 6983 | $L_{A263}$ | $L_{B43}$ |
| 6984 | $L_{A264}$ | $L_{B43}$ |
| 6985 | $L_{A265}$ | $L_{B43}$ |
| 6986 | $L_{A266}$ | $L_{B43}$ |
| 6987 | $L_{A267}$ | $L_{B43}$ |
| 6988 | $L_{A268}$ | $L_{B43}$ |
| 6989 | $L_{A269}$ | $L_{B43}$ |
| 6990 | $L_{A270}$ | $L_{B43}$ |
| 6991 | $L_{A271}$ | $L_{B43}$ |
| 6992 | $L_{A272}$ | $L_{B43}$ |
| 6993 | $L_{A273}$ | $L_{B43}$ |
| 6994 | $L_{A274}$ | $L_{B43}$ |
| 6995 | $L_{A275}$ | $L_{B43}$ |
| 6996 | $L_{A276}$ | $L_{B43}$ |
| 6997 | $L_{A277}$ | $L_{B43}$ |
| 6998 | $L_{A278}$ | $L_{B43}$ |
| 6999 | $L_{A279}$ | $L_{B43}$ |
| 7000 | $L_{A280}$ | $L_{B43}$ |
| 7001 | $L_{A281}$ | $L_{B43}$ |
| 7002 | $L_{A282}$ | $L_{B43}$ |
| 7003 | $L_{A283}$ | $L_{B43}$ |
| 7004 | $L_{A284}$ | $L_{B43}$ |
| 7005 | $L_{A285}$ | $L_{B43}$ |
| 7006 | $L_{A286}$ | $L_{B43}$ |
| 7007 | $L_{A287}$ | $L_{B43}$ |
| 7008 | $L_{A288}$ | $L_{B43}$ |
| 7009 | $L_{A289}$ | $L_{B43}$ |
| 7010 | $L_{A290}$ | $L_{B43}$ |
| 7011 | $L_{A291}$ | $L_{B43}$ |
| 7012 | $L_{A292}$ | $L_{B43}$ |
| 7013 | $L_{A293}$ | $L_{B43}$ |
| 7014 | $L_{A294}$ | $L_{B43}$ |
| 7015 | $L_{A295}$ | $L_{B43}$ |
| 7016 | $L_{A296}$ | $L_{B43}$ |
| 7017 | $L_{A297}$ | $L_{B43}$ |

-continued

| Compound Number | $L_A$ | $L_B$ |
|---|---|---|
| 7018 | $L_{A298}$ | $L_{B43}$ |
| 7019 | $L_{A299}$ | $L_{B43}$ |
| 7020 | $L_{A300}$ | $L_{B43}$ |
| 7021 | $L_{A301}$ | $L_{B43}$ |
| 7022 | $L_{A302}$ | $L_{B43}$ |
| 7023 | $L_{A303}$ | $L_{B43}$ |
| 7024 | $L_{A304}$ | $L_{B43}$ |
| 7025 | $L_{A305}$ | $L_{B43}$ |
| 7026 | $L_{A306}$ | $L_{B43}$ |
| 7027 | $L_{A307}$ | $L_{B43}$ |
| 7028 | $L_{A308}$ | $L_{B43}$ |
| 7029 | $L_{A309}$ | $L_{B43}$ |
| 7030 | $L_{A310}$ | $L_{B43}$ |
| 7031 | $L_{A311}$ | $L_{B43}$ |
| 7032 | $L_{A312}$ | $L_{B43}$ |
| 7033 | $L_{A313}$ | $L_{B43}$ |
| 7034 | $L_{A314}$ | $L_{B43}$ |
| 7035 | $L_{A315}$ | $L_{B43}$ |
| 7036 | $L_{A316}$ | $L_{B43}$ |
| 7037 | $L_{A317}$ | $L_{B43}$ |
| 7038 | $L_{A318}$ | $L_{B43}$ |
| 7039 | $L_{A319}$ | $L_{B43}$ |
| 7040 | $L_{A320}$ | $L_{B43}$ |
| 7041 | $L_{A321}$ | $L_{B43}$ |
| 7042 | $L_{A322}$ | $L_{B43}$ |
| 7043 | $L_{A323}$ | $L_{B43}$ |
| 7044 | $L_{A324}$ | $L_{B43}$ |
| 7045 | $L_{A325}$ | $L_{B43}$ |
| 7046 | $L_{A326}$ | $L_{B43}$ |
| 7047 | $L_{A327}$ | $L_{B43}$ |
| 7048 | $L_{A328}$ | $L_{B43}$ |
| 7049 | $L_{A329}$ | $L_{B43}$ |
| 7050 | $L_{A330}$ | $L_{B43}$ |
| 7051 | $L_{A331}$ | $L_{B43}$ |
| 7052 | $L_{A332}$ | $L_{B43}$ |
| 7053 | $L_{A333}$ | $L_{B43}$ |
| 7054 | $L_{A334}$ | $L_{B43}$ |
| 7055 | $L_{A335}$ | $L_{B43}$ |
| 7056 | $L_{A336}$ | $L_{B43}$ |
| 7057 | $L_{A337}$ | $L_{B43}$ |
| 7058 | $L_{A338}$ | $L_{B43}$ |
| 7059 | $L_{A339}$ | $L_{B43}$ |
| 7060 | $L_{A340}$ | $L_{B43}$ |
| 7061 | $L_{A341}$ | $L_{B43}$ |
| 7062 | $L_{A342}$ | $L_{B43}$ |
| 7063 | $L_{A343}$ | $L_{B43}$ |
| 7064 | $L_{A344}$ | $L_{B43}$ |
| 7065 | $L_{A345}$ | $L_{B43}$ |
| 7066 | $L_{A346}$ | $L_{B43}$ |
| 7067 | $L_{A347}$ | $L_{B43}$ |
| 7068 | $L_{A348}$ | $L_{B43}$ |
| 7069 | $L_{A349}$ | $L_{B43}$ |
| 7070 | $L_{A350}$ | $L_{B43}$ |
| 7071 | $L_{A351}$ | $L_{B43}$ |
| 7072 | $L_{A352}$ | $L_{B43}$ |
| 7073 | $L_{A353}$ | $L_{B43}$ |
| 7074 | $L_{A354}$ | $L_{B43}$ |
| 7075 | $L_{A355}$ | $L_{B43}$ |
| 7076 | $L_{A356}$ | $L_{B43}$ |
| 7077 | $L_{A357}$ | $L_{B43}$ |
| 7078 | $L_{A358}$ | $L_{B43}$ |
| 7079 | $L_{A359}$ | $L_{B43}$ |
| 7080 | $L_{A360}$ | $L_{B43}$ |
| 7081 | $L_{A361}$ | $L_{B43}$ |
| 7082 | $L_{A362}$ | $L_{B43}$ |
| 7083 | $L_{A363}$ | $L_{B43}$ |
| 7084 | $L_{A364}$ | $L_{B43}$ |
| 7085 | $L_{A365}$ | $L_{B43}$ |
| 7086 | $L_{A366}$ | $L_{B43}$ |
| 7087 | $L_{A367}$ | $L_{B43}$ |
| 7088 | $L_{A368}$ | $L_{B43}$ |
| 7089 | $L_{A369}$ | $L_{B43}$ |
| 7090 | $L_{A370}$ | $L_{B43}$ |
| 7091 | $L_{A371}$ | $L_{B43}$ |
| 7092 | $L_{A372}$ | $L_{B43}$ |
| 7093 | $L_{A373}$ | $L_{B43}$ |

-continued

| Compound Number | $L_A$ | $L_B$ |
|---|---|---|
| 7094 | $L_{A374}$ | $L_{B43}$ |
| 7095 | $L_{A375}$ | $L_{B43}$ |
| 7096 | $L_{A376}$ | $L_{B43}$ |
| 7097 | $L_{A377}$ | $L_{B43}$ |
| 7098 | $L_{A378}$ | $L_{B43}$ |
| 7099 | $L_{A379}$ | $L_{B43}$ |
| 7100 | $L_{A380}$ | $L_{B43}$ |
| 7101 | $L_{A381}$ | $L_{B43}$ |
| 7102 | $L_{A382}$ | $L_{B43}$ |
| 7103 | $L_{A383}$ | $L_{B43}$ |
| 7104 | $L_{A384}$ | $L_{B43}$ |
| 7105 | $L_{A385}$ | $L_{B43}$ |
| 7106 | $L_{A386}$ | $L_{B43}$ |
| 7107 | $L_{A387}$ | $L_{B43}$ |
| 7108 | $L_{A388}$ | $L_{B43}$ |
| 7109 | $L_{A389}$ | $L_{B43}$ |
| 7110 | $L_{A390}$ | $L_{B43}$ |
| 7111 | $L_{A391}$ | $L_{B43}$ |
| 7112 | $L_{A392}$ | $L_{B43}$ |
| 7113 | $L_{A393}$ | $L_{B43}$ |
| 7114 | $L_{A394}$ | $L_{B43}$ |
| 7115 | $L_{A395}$ | $L_{B43}$ |
| 7116 | $L_{A396}$ | $L_{B43}$ |
| 7117 | $L_{A397}$ | $L_{B43}$ |
| 7118 | $L_{A398}$ | $L_{B43}$ |
| 7119 | $L_{A399}$ | $L_{B43}$ |
| 7120 | $L_{A400}$ | $L_{B43}$ |
| 7121 | $L_{A401}$ | $L_{B43}$ |
| 7122 | $L_{A402}$ | $L_{B43}$ |
| 7123 | $L_{A403}$ | $L_{B43}$ |
| 7124 | $L_{A404}$ | $L_{B43}$ |
| 7125 | $L_{A405}$ | $L_{B43}$ |
| 7126 | $L_{A406}$ | $L_{B43}$ |
| 7127 | $L_{A407}$ | $L_{B43}$ |
| 7128 | $L_{A408}$ | $L_{B43}$ |
| 7129 | $L_{A409}$ | $L_{B43}$ |
| 7130 | $L_{A410}$ | $L_{B43}$ |
| 7131 | $L_{A411}$ | $L_{B43}$ |
| 7132 | $L_{A412}$ | $L_{B43}$ |
| 7133 | $L_{A413}$ | $L_{B43}$ |
| 7134 | $L_{A414}$ | $L_{B43}$ |
| 7135 | $L_{A415}$ | $L_{B43}$ |
| 7136 | $L_{A416}$ | $L_{B43}$ |
| 7137 | $L_{A417}$ | $L_{B43}$ |
| 7138 | $L_{A418}$ | $L_{B43}$ |
| 7139 | $L_{A419}$ | $L_{B43}$ |
| 7140 | $L_{A420}$ | $L_{B43}$ |
| 7141 | $L_{A421}$ | $L_{B43}$ |
| 7142 | $L_{A422}$ | $L_{B43}$ |
| 7143 | $L_{A423}$ | $L_{B43}$ |
| 7144 | $L_{A424}$ | $L_{B43}$ |
| 7145 | $L_{A425}$ | $L_{B43}$ |
| 7146 | $L_{A426}$ | $L_{B43}$ |
| 7147 | $L_{A427}$ | $L_{B43}$ |
| 7148 | $L_{A428}$ | $L_{B43}$ |
| 7149 | $L_{A429}$ | $L_{B43}$ |
| 7150 | $L_{A430}$ | $L_{B43}$ |
| 7151 | $L_{A431}$ | $L_{B43}$ |
| 7152 | $L_{A432}$ | $L_{B43}$ |
| 7153 | $L_{A433}$ | $L_{B43}$ |
| 7154 | $L_{A434}$ | $L_{B43}$ |
| 7155 | $L_{A435}$ | $L_{B43}$ |
| 7156 | $L_{A436}$ | $L_{B43}$ |
| 7157 | $L_{A437}$ | $L_{B43}$ |
| 7158 | $L_{A438}$ | $L_{B43}$ |
| 7159 | $L_{A439}$ | $L_{B43}$ |
| 7160 | $L_{A440}$ | $L_{B43}$ |
| 7161 | $L_{A441}$ | $L_{B43}$ |
| 7162 | $L_{A442}$ | $L_{B43}$ |
| 7163 | $L_{A443}$ | $L_{B43}$ |
| 7164 | $L_{A444}$ | $L_{B43}$ |
| 7165 | $L_{A445}$ | $L_{B43}$ |
| 7166 | $L_{A446}$ | $L_{B43}$ |
| 7167 | $L_{A447}$ | $L_{B43}$ |
| 7168 | $L_{A448}$ | $L_{B43}$ |
| 7169 | $L_{A449}$ | $L_{B43}$ |

-continued

| Compound Number | $L_A$ | $L_B$ |
|---|---|---|
| 7170 | $L_{A450}$ | $L_{B43}$ |
| 7171 | $L_{A451}$ | $L_{B43}$ |
| 7172 | $L_{A452}$ | $L_{B43}$ |
| 7173 | $L_{A453}$ | $L_{B43}$ |
| 7174 | $L_{A454}$ | $L_{B43}$ |
| 7175 | $L_{A455}$ | $L_{B43}$ |
| 7176 | $L_{A456}$ | $L_{B43}$ |
| 7177 | $L_{A457}$ | $L_{B43}$ |
| 7178 | $L_{A458}$ | $L_{B43}$ |
| 7179 | $L_{A459}$ | $L_{B43}$ |
| 7180 | $L_{A460}$ | $L_{B43}$ |
| 7181 | $L_{A461}$ | $L_{B43}$ |
| 7182 | $L_{A462}$ | $L_{B43}$ |
| 7183 | $L_{A463}$ | $L_{B43}$ |
| 7184 | $L_{A464}$ | $L_{B43}$ |
| 7185 | $L_{A465}$ | $L_{B43}$ |
| 7186 | $L_{A466}$ | $L_{B43}$ |
| 7187 | $L_{A467}$ | $L_{B43}$ |
| 7188 | $L_{A468}$ | $L_{B43}$ |
| 7189 | $L_{A469}$ | $L_{B43}$ |
| 7190 | $L_{A470}$ | $L_{B43}$ |
| 7191 | $L_{A471}$ | $L_{B43}$ |
| 7192 | $L_{A472}$ | $L_{B43}$ |
| 7193 | $L_{A473}$ | $L_{B43}$ |
| 7194 | $L_{A474}$ | $L_{B43}$ |
| 7195 | $L_{A475}$ | $L_{B43}$ |
| 7196 | $L_{A476}$ | $L_{B43}$ |
| 7197 | $L_{A477}$ | $L_{B43}$ |
| 7198 | $L_{A478}$ | $L_{B43}$ |
| 7199 | $L_{A479}$ | $L_{B43}$ |
| 7200 | $L_{A480}$ | $L_{B43}$ |
| 7201 | $L_{A481}$ | $L_{B43}$ |
| 7202 | $L_{A482}$ | $L_{B43}$ |
| 7203 | $L_{A483}$ | $L_{B43}$ |
| 7204 | $L_{A484}$ | $L_{B43}$ |
| 7205 | $L_{A485}$ | $L_{B43}$ |
| 7206 | $L_{A486}$ | $L_{B43}$ |
| 7207 | $L_{A487}$ | $L_{B43}$ |
| 7208 | $L_{A488}$ | $L_{B43}$ |
| 7209 | $L_{A489}$ | $L_{B43}$ |
| 7210 | $L_{A490}$ | $L_{B43}$ |
| 7211 | $L_{A491}$ | $L_{B43}$ |
| 7212 | $L_{A492}$ | $L_{B43}$ |
| 7213 | $L_{A493}$ | $L_{B43}$ |
| 7214 | $L_{A494}$ | $L_{B43}$ |
| 7215 | $L_{A495}$ | $L_{B43}$ |
| 7216 | $L_{A496}$ | $L_{B43}$ |
| 7217 | $L_{A497}$ | $L_{B43}$ |
| 7218 | $L_{A498}$ | $L_{B43}$ |
| 7219 | $L_{A499}$ | $L_{B43}$ |
| 7220 | $L_{A500}$ | $L_{B43}$ |
| 7221 | $L_{A501}$ | $L_{B43}$ |
| 7222 | $L_{A502}$ | $L_{B43}$ |
| 7223 | $L_{A503}$ | $L_{B43}$ |
| 7224 | $L_{A504}$ | $L_{B43}$ |
| 7225 | $L_{A505}$ | $L_{B43}$ |
| 7226 | $L_{A506}$ | $L_{B43}$ |
| 7227 | $L_{A507}$ | $L_{B43}$ |
| 7228 | $L_{A508}$ | $L_{B43}$ |
| 7229 | $L_{A509}$ | $L_{B43}$ |
| 7230 | $L_{A510}$ | $L_{B43}$ |
| 7231 | $L_{A511}$ | $L_{B43}$ |
| 7232 | $L_{A512}$ | $L_{B43}$ |
| 7233 | $L_{A513}$ | $L_{B43}$ |
| 7234 | $L_{A514}$ | $L_{B43}$ |
| 7235 | $L_{A515}$ | $L_{B43}$ |
| 7236 | $L_{A516}$ | $L_{B43}$ |
| 7237 | $L_{A517}$ | $L_{B43}$ |
| 7238 | $L_{A518}$ | $L_{B43}$ |
| 7239 | $L_{A519}$ | $L_{B43}$ |
| 7240 | $L_{A520}$ | $L_{B43}$ |
| 7241 | $L_{A521}$ | $L_{B43}$ |
| 7242 | $L_{A522}$ | $L_{B43}$ |
| 7243 | $L_{A523}$ | $L_{B43}$ |
| 7244 | $L_{A524}$ | $L_{B43}$ |
| 7245 | $L_{A525}$ | $L_{B43}$ |

-continued

| Compound Number | $L_A$ | $L_B$ |
|---|---|---|
| 7246 | $L_{A526}$ | $L_{B43}$ |
| 7247 | $L_{A527}$ | $L_{B43}$ |
| 7248 | $L_{A528}$ | $L_{B43}$ |
| 7249 | $L_{A529}$ | $L_{B43}$ |
| 7250 | $L_{A530}$ | $L_{B43}$ |
| 7251 | $L_{A531}$ | $L_{B43}$ |
| 7252 | $L_{A532}$ | $L_{B43}$ |
| 7253 | $L_{A533}$ | $L_{B43}$ |
| 7254 | $L_{A534}$ | $L_{B43}$ |
| 7255 | $L_{A535}$ | $L_{B43}$ |
| 7256 | $L_{A536}$ | $L_{B43}$ |
| 7257 | $L_{A537}$ | $L_{B43}$ |
| 7258 | $L_{A538}$ | $L_{B43}$ |
| 7259 | $L_{A539}$ | $L_{B43}$ |
| 7260 | $L_{A540}$ | $L_{B43}$ |
| 7261 | $L_{A541}$ | $L_{B43}$ |
| 7262 | $L_{A542}$ | $L_{B43}$ |
| 7263 | $L_{A543}$ | $L_{B43}$ |
| 7264 | $L_{A544}$ | $L_{B43}$ |
| 7265 | $L_{A545}$ | $L_{B43}$ |
| 7266 | $L_{A546}$ | $L_{B43}$ |
| 7267 | $L_{A547}$ | $L_{B43}$ |
| 7268 | $L_{A548}$ | $L_{B43}$ |
| 7269 | $L_{A549}$ | $L_{B43}$ |
| 7270 | $L_{A550}$ | $L_{B43}$ |
| 7271 | $L_{A551}$ | $L_{B43}$ |
| 7272 | $L_{A552}$ | $L_{B43}$ |
| 7273 | $L_{A553}$ | $L_{B43}$ |
| 7274 | $L_{A554}$ | $L_{B43}$ |
| 7275 | $L_{A555}$ | $L_{B43}$ |
| 7276 | $L_{A556}$ | $L_{B43}$ |
| 7277 | $L_{A557}$ | $L_{B43}$ |
| 7278 | $L_{A558}$ | $L_{B43}$ |
| 7279 | $L_{A559}$ | $L_{B43}$ |
| 7280 | $L_{A560}$ | $L_{B43}$ |
| 7281 | $L_{A561}$ | $L_{B43}$ |
| 7282 | $L_{A562}$ | $L_{B43}$ |
| 7283 | $L_{A563}$ | $L_{B43}$ |
| 7284 | $L_{A564}$ | $L_{B43}$ |
| 7285 | $L_{A565}$ | $L_{B43}$ |
| 7286 | $L_{A566}$ | $L_{B43}$ |
| 7287 | $L_{A567}$ | $L_{B43}$ |
| 7288 | $L_{A568}$ | $L_{B43}$ |
| 7289 | $L_{A569}$ | $L_{B43}$ |
| 7290 | $L_{A570}$ | $L_{B43}$ |
| 7291 | $L_{A571}$ | $L_{B43}$ |
| 7292 | $L_{A572}$ | $L_{B43}$ |
| 7293 | $L_{A573}$ | $L_{B43}$ |
| 7294 | $L_{A574}$ | $L_{B43}$ |
| 7295 | $L_{A575}$ | $L_{B43}$ |
| 7296 | $L_{A576}$ | $L_{B43}$ |
| 7297 | $L_{A577}$ | $L_{B43}$ |
| 7298 | $L_{A578}$ | $L_{B43}$ |
| 7299 | $L_{A579}$ | $L_{B43}$ |
| 7300 | $L_{A580}$ | $L_{B43}$ |
| 7301 | $L_{A581}$ | $L_{B43}$ |
| 7302 | $L_{A582}$ | $L_{B43}$ |
| 7303 | $L_{A583}$ | $L_{B43}$ |
| 7304 | $L_{A584}$ | $L_{B43}$ |
| 7305 | $L_{A585}$ | $L_{B43}$ |
| 7306 | $L_{A586}$ | $L_{B43}$ |
| 7307 | $L_{A587}$ | $L_{B43}$ |
| 7308 | $L_{A588}$ | $L_{B43}$ |
| 7309 | $L_{A589}$ | $L_{B43}$ |
| 7310 | $L_{A590}$ | $L_{B43}$ |
| 7311 | $L_{A591}$ | $L_{B43}$ |
| 7312 | $L_{A592}$ | $L_{B43}$ |
| 7313 | $L_{A593}$ | $L_{B43}$ |
| 7314 | $L_{A594}$ | $L_{B43}$ |
| 7315 | $L_{A595}$ | $L_{B43}$ |
| 7316 | $L_{A596}$ | $L_{B43}$ |
| 7317 | $L_{A597}$ | $L_{B43}$ |
| 7318 | $L_{A598}$ | $L_{B43}$ |
| 7319 | $L_{A599}$ | $L_{B43}$ |
| 7320 | $L_{A600}$ | $L_{B43}$ |
| 7321 | $L_{A601}$ | $L_{B43}$ |

-continued

| Compound Number | $L_A$ | $L_B$ |
|---|---|---|
| 7322 | $L_{A602}$ | $L_{B43}$ |
| 7323 | $L_{A603}$ | $L_{B43}$ |
| 7324 | $L_{A604}$ | $L_{B43}$ |
| 7325 | $L_{A605}$ | $L_{B43}$ |
| 7326 | $L_{A606}$ | $L_{B43}$ |
| 7327 | $L_{A607}$ | $L_{B43}$ |
| 7328 | $L_{A608}$ | $L_{B43}$ |
| 7329 | $L_{A609}$ | $L_{B43}$ |
| 7330 | $L_{A610}$ | $L_{B43}$ |
| 7331 | $L_{A611}$ | $L_{B43}$ |
| 7332 | $L_{A612}$ | $L_{B43}$ |
| 7333 | $L_{A613}$ | $L_{B43}$ |
| 7334 | $L_{A614}$ | $L_{B43}$ |
| 7335 | $L_{A615}$ | $L_{B43}$ |
| 7336 | $L_{A616}$ | $L_{B43}$ |
| 7337 | $L_{A617}$ | $L_{B43}$ |
| 7338 | $L_{A618}$ | $L_{B43}$ |
| 7339 | $L_{A619}$ | $L_{B43}$ |
| 7340 | $L_{A620}$ | $L_{B43}$ |
| 7341 | $L_{A621}$ | $L_{B43}$ |
| 7342 | $L_{A622}$ | $L_{B43}$ |
| 7343 | $L_{A623}$ | $L_{B43}$ |
| 7344 | $L_{A624}$ | $L_{B43}$ |
| 7345 | $L_{A625}$ | $L_{B43}$ |
| 7346 | $L_{A626}$ | $L_{B43}$ |
| 7347 | $L_{A627}$ | $L_{B43}$ |
| 7348 | $L_{A628}$ | $L_{B43}$ |
| 7349 | $L_{A629}$ | $L_{B43}$ |
| 7350 | $L_{A630}$ | $L_{B43}$ |
| 7351 | $L_{A631}$ | $L_{B43}$ |
| 7352 | $L_{A632}$ | $L_{B43}$ |
| 7353 | $L_{A633}$ | $L_{B43}$ |
| 7354 | $L_{A634}$ | $L_{B43}$ |
| 7355 | $L_{A635}$ | $L_{B43}$ |
| 7356 | $L_{A636}$ | $L_{B43}$ |
| 7357 | $L_{A637}$ | $L_{B43}$ |
| 7358 | $L_{A638}$ | $L_{B43}$ |
| 7359 | $L_{A639}$ | $L_{B43}$ |
| 7360 | $L_{A640}$ | $L_{B43}$ |
| 7361 | $L_{A641}$ | $L_{B43}$ |
| 7362 | $L_{A642}$ | $L_{B43}$ |
| 7363 | $L_{A643}$ | $L_{B43}$ |
| 7364 | $L_{A644}$ | $L_{B43}$ |
| 7365 | $L_{A645}$ | $L_{B43}$ |
| 7366 | $L_{A646}$ | $L_{B43}$ |
| 7367 | $L_{A647}$ | $L_{B43}$ |
| 7368 | $L_{A648}$ | $L_{B43}$ |
| 7369 | $L_{A649}$ | $L_{B43}$ |
| 7370 | $L_{A650}$ | $L_{B43}$ |
| 7371 | $L_{A651}$ | $L_{B43}$ |
| 7372 | $L_{A652}$ | $L_{B43}$ |
| 7373 | $L_{A653}$ | $L_{B43}$ |
| 7374 | $L_{A654}$ | $L_{B43}$ |
| 7375 | $L_{A655}$ | $L_{B43}$ |
| 7376 | $L_{A656}$ | $L_{B43}$ |
| 7377 | $L_{A657}$ | $L_{B43}$ |
| 7378 | $L_{A658}$ | $L_{B43}$ |
| 7379 | $L_{A659}$ | $L_{B43}$ |
| 7380 | $L_{A660}$ | $L_{B43}$ |
| 7381 | $L_{A661}$ | $L_{B43}$ |
| 7382 | $L_{A662}$ | $L_{B43}$ |
| 7383 | $L_{A663}$ | $L_{B43}$ |
| 7384 | $L_{A664}$ | $L_{B43}$ |
| 7385 | $L_{A665}$ | $L_{B43}$ |
| 7386 | $L_{A666}$ | $L_{B43}$ |
| 7387 | $L_{A667}$ | $L_{B43}$ |
| 7388 | $L_{A668}$ | $L_{B43}$ |
| 7389 | $L_{A669}$ | $L_{B43}$ |
| 7390 | $L_{A670}$ | $L_{B43}$ |
| 7391 | $L_{A671}$ | $L_{B43}$ |
| 7392 | $L_{A672}$ | $L_{B43}$ |
| 7393 | $L_{A673}$ | $L_{B43}$ |
| 7394 | $L_{A674}$ | $L_{B43}$ |
| 7395 | $L_{A675}$ | $L_{B43}$ |
| 7396 | $L_{A676}$ | $L_{B43}$ |
| 7397 | $L_{A677}$ | $L_{B43}$ |

-continued

| Compound Number | $L_A$ | $L_B$ |
|---|---|---|
| 7398 | $L_{A678}$ | $L_{B43}$ |
| 7399 | $L_{A679}$ | $L_{B43}$ |
| 7400 | $L_{A680}$ | $L_{B43}$ |
| 7401 | $L_{A681}$ | $L_{B43}$ |
| 7402 | $L_{A682}$ | $L_{B43}$ |
| 7403 | $L_{A683}$ | $L_{B43}$ |
| 7404 | $L_{A684}$ | $L_{B43}$ |
| 7405 | $L_{A685}$ | $L_{B43}$ |
| 7406 | $L_{A686}$ | $L_{B43}$ |
| 7407 | $L_{A687}$ | $L_{B43}$ |
| 7408 | $L_{A688}$ | $L_{B43}$ |
| 7409 | $L_{A689}$ | $L_{B43}$ |
| 7410 | $L_{A690}$ | $L_{B43}$ |
| 7411 | $L_{A691}$ | $L_{B43}$ |
| 7412 | $L_{A692}$ | $L_{B43}$ |
| 7413 | $L_{A693}$ | $L_{B43}$ |
| 7414 | $L_{A694}$ | $L_{B43}$ |
| 7415 | $L_{A695}$ | $L_{B43}$ |
| 7416 | $L_{A696}$ | $L_{B43}$ |
| 7417 | $L_{A697}$ | $L_{B43}$ |
| 7418 | $L_{A698}$ | $L_{B43}$ |
| 7419 | $L_{A699}$ | $L_{B43}$ |
| 7420 | $L_{A700}$ | $L_{B43}$ |
| 7421 | $L_{A701}$ | $L_{B43}$ |
| 7422 | $L_{A702}$ | $L_{B43}$ |
| 7423 | $L_{A703}$ | $L_{B43}$ |
| 7424 | $L_{A704}$ | $L_{B43}$ |
| 7425 | $L_{A705}$ | $L_{B43}$ |
| 7426 | $L_{A706}$ | $L_{B43}$ |
| 7427 | $L_{A707}$ | $L_{B43}$ |
| 7428 | $L_{A708}$ | $L_{B43}$ |
| 7429 | $L_{A709}$ | $L_{B43}$ |
| 7430 | $L_{A710}$ | $L_{B43}$ |
| 7431 | $L_{A711}$ | $L_{B43}$ |
| 7432 | $L_{A712}$ | $L_{B43}$ |
| 7433 | $L_{A713}$ | $L_{B43}$ |
| 7434 | $L_{A714}$ | $L_{B43}$ |
| 7435 | $L_{A715}$ | $L_{B43}$ |
| 7436 | $L_{A716}$ | $L_{B43}$ |
| 7437 | $L_{A717}$ | $L_{B43}$ |
| 7438 | $L_{A718}$ | $L_{B43}$ |
| 7439 | $L_{A719}$ | $L_{B43}$ |
| 7440 | $L_{A720}$ | $L_{B43}$ |
| 7441 | $L_{A721}$ | $L_{B43}$ |
| 7442 | $L_{A722}$ | $L_{B43}$ |
| 7443 | $L_{A723}$ | $L_{B43}$ |
| 7444 | $L_{A724}$ | $L_{B43}$ |
| 7445 | $L_{A725}$ | $L_{B43}$ |
| 7446 | $L_{A726}$ | $L_{B43}$ |
| 7447 | $L_{A727}$ | $L_{B43}$ |
| 7448 | $L_{A728}$ | $L_{B43}$ |
| 7449 | $L_{A729}$ | $L_{B43}$ |
| 7450 | $L_{A730}$ | $L_{B43}$ |
| 7451 | $L_{A731}$ | $L_{B43}$ |
| 7452 | $L_{A732}$ | $L_{B43}$ |
| 7453 | $L_{A733}$ | $L_{B43}$ |
| 7454 | $L_{A734}$ | $L_{B43}$ |
| 7455 | $L_{A735}$ | $L_{B43}$ |
| 7456 | $L_{A736}$ | $L_{B43}$ |
| 7457 | $L_{A737}$ | $L_{B43}$ |
| 7458 | $L_{A738}$ | $L_{B43}$ |
| 7459 | $L_{A739}$ | $L_{B43}$ |
| 7460 | $L_{A740}$ | $L_{B43}$ |
| 7461 | $L_{A741}$ | $L_{B43}$ |
| 7462 | $L_{A742}$ | $L_{B43}$ |
| 7463 | $L_{A743}$ | $L_{B43}$ |
| 7464 | $L_{A744}$ | $L_{B43}$ |
| 7465 | $L_{A745}$ | $L_{B43}$ |
| 7466 | $L_{A746}$ | $L_{B43}$ |
| 7467 | $L_{A747}$ | $L_{B43}$ |
| 7468 | $L_{A748}$ | $L_{B43}$ |
| 7469 | $L_{A749}$ | $L_{B43}$ |
| 7470 | $L_{A750}$ | $L_{B43}$ |
| 7471 | $L_{A751}$ | $L_{B43}$ |
| 7472 | $L_{A752}$ | $L_{B43}$ |
| 7473 | $L_{A753}$ | $L_{B43}$ |

-continued

| Compound Number | $L_A$ | $L_B$ |
|---|---|---|
| 7474 | $L_{A754}$ | $L_{B43}$ |
| 7475 | $L_{A755}$ | $L_{B43}$ |
| 7476 | $L_{A756}$ | $L_{B43}$ |
| 7477 | $L_{A757}$ | $L_{B43}$ |
| 7478 | $L_{A758}$ | $L_{B43}$ |
| 7479 | $L_{A759}$ | $L_{B43}$ |
| 7480 | $L_{A760}$ | $L_{B43}$ |
| 7481 | $L_{A761}$ | $L_{B43}$ |
| 7482 | $L_{A762}$ | $L_{B43}$ |
| 7483 | $L_{A763}$ | $L_{B43}$ |
| 7484 | $L_{A764}$ | $L_{B43}$ |
| 7485 | $L_{A765}$ | $L_{B43}$ |
| 7486 | $L_{A766}$ | $L_{B43}$ |
| 7487 | $L_{A767}$ | $L_{B43}$ |
| 7488 | $L_{A768}$ | $L_{B43}$ |
| 7489 | $L_{A769}$ | $L_{B43}$ |
| 7490 | $L_{A770}$ | $L_{B43}$ |
| 7491 | $L_{A771}$ | $L_{B43}$ |
| 7492 | $L_{A772}$ | $L_{B43}$ |
| 7493 | $L_{A773}$ | $L_{B43}$ |
| 7494 | $L_{A774}$ | $L_{B43}$ |
| 7495 | $L_{A775}$ | $L_{B43}$ |
| 7496 | $L_{A776}$ | $L_{B43}$ |
| 7497 | $L_{A777}$ | $L_{B43}$ |
| 7498 | $L_{A778}$ | $L_{B43}$ |
| 7499 | $L_{A779}$ | $L_{B43}$ |
| 7500 | $L_{A780}$ | $L_{B43}$ |
| 7501 | $L_{A781}$ | $L_{B43}$ |
| 7502 | $L_{A782}$ | $L_{B43}$ |
| 7503 | $L_{A783}$ | $L_{B43}$ |
| 7504 | $L_{A784}$ | $L_{B43}$ |
| 7505 | $L_{A785}$ | $L_{B43}$ |
| 7506 | $L_{A786}$ | $L_{B43}$ |
| 7507 | $L_{A787}$ | $L_{B43}$ |
| 7508 | $L_{A788}$ | $L_{B43}$ |
| 7509 | $L_{A789}$ | $L_{B43}$ |
| 7510 | $L_{A790}$ | $L_{B43}$ |
| 7511 | $L_{A791}$ | $L_{B43}$ |
| 7512 | $L_{A792}$ | $L_{B43}$ |
| 7513 | $L_{A793}$ | $L_{B43}$ |
| 7514 | $L_{A794}$ | $L_{B43}$ |
| 7515 | $L_{A795}$ | $L_{B43}$ |
| 7516 | $L_{A796}$ | $L_{B43}$ |
| 7517 | $L_{A797}$ | $L_{B43}$ |
| 7518 | $L_{A798}$ | $L_{B43}$ |
| 7519 | $L_{A799}$ | $L_{B43}$ |
| 7520 | $L_{A800}$ | $L_{B43}$ |
| 7521 | $L_{A801}$ | $L_{B43}$ |
| 7522 | $L_{A802}$ | $L_{B43}$ |
| 7523 | $L_{A803}$ | $L_{B43}$ |
| 7524 | $L_{A804}$ | $L_{B43}$ |
| 7525 | $L_{A805}$ | $L_{B43}$ |
| 7526 | $L_{A806}$ | $L_{B43}$ |
| 7527 | $L_{A807}$ | $L_{B43}$ |
| 7528 | $L_{A808}$ | $L_{B43}$ |
| 7529 | $L_{A809}$ | $L_{B43}$ |
| 7530 | $L_{A810}$ | $L_{B43}$ |
| 7531 | $L_{A811}$ | $L_{B43}$ |
| 7532 | $L_{A812}$ | $L_{B43}$ |
| 7533 | $L_{A813}$ | $L_{B43}$ |
| 7534 | $L_{A814}$ | $L_{B43}$ |
| 7535 | $L_{A815}$ | $L_{B43}$ |
| 7536 | $L_{A816}$ | $L_{B43}$ |
| 7537 | $L_{A817}$ | $L_{B43}$ |
| 7538 | $L_{A818}$ | $L_{B43}$ |
| 7539 | $L_{A819}$ | $L_{B43}$ |
| 7540 | $L_{A820}$ | $L_{B43}$ |
| 7541 | $L_{A821}$ | $L_{B43}$ |
| 7542 | $L_{A822}$ | $L_{B43}$ |
| 7543 | $L_{A823}$ | $L_{B43}$ |
| 7544 | $L_{A824}$ | $L_{B43}$ |
| 7545 | $L_{A825}$ | $L_{B43}$ |
| 7546 | $L_{A826}$ | $L_{B43}$ |
| 7547 | $L_{A827}$ | $L_{B43}$ |
| 7548 | $L_{A828}$ | $L_{B43}$ |
| 7549 | $L_{A829}$ | $L_{B43}$ |

-continued

| Compound Number | $L_A$ | $L_B$ |
|---|---|---|
| 7550 | $L_{A830}$ | $L_{B43}$ |
| 7551 | $L_{A831}$ | $L_{B43}$ |
| 7552 | $L_{A832}$ | $L_{B43}$ |
| 7553 | $L_{A833}$ | $L_{B43}$ |
| 7554 | $L_{A834}$ | $L_{B43}$ |
| 7555 | $L_{A835}$ | $L_{B43}$ |
| 7556 | $L_{A836}$ | $L_{B43}$ |
| 7557 | $L_{A837}$ | $L_{B43}$ |
| 7558 | $L_{A838}$ | $L_{B43}$ |
| 7559 | $L_{A839}$ | $L_{B43}$ |
| 7560 | $L_{A840}$ | $L_{B43}$ |
| 7561 | $L_{A841}$ | $L_{B43}$ |
| 7562 | $L_{A842}$ | $L_{B43}$ |
| 7563 | $L_{A843}$ | $L_{B43}$ |
| 7564 | $L_{A844}$ | $L_{B43}$ |
| 7565 | $L_{A845}$ | $L_{B43}$ |
| 7566 | $L_{A846}$ | $L_{B43}$ |
| 7567 | $L_{A847}$ | $L_{B43}$ |
| 7568 | $L_{A848}$ | $L_{B43}$ |
| 7569 | $L_{A849}$ | $L_{B43}$ |
| 7570 | $L_{A850}$ | $L_{B43}$ |
| 7571 | $L_{A851}$ | $L_{B43}$ |
| 7572 | $L_{A852}$ | $L_{B43}$ |
| 7573 | $L_{A853}$ | $L_{B43}$ |
| 7574 | $L_{A854}$ | $L_{B43}$ |
| 7575 | $L_{A855}$ | $L_{B43}$ |
| 7576 | $L_{A856}$ | $L_{B43}$ |
| 7577 | $L_{A857}$ | $L_{B43}$ |
| 7578 | $L_{A858}$ | $L_{B43}$ |
| 7579 | $L_{A859}$ | $L_{B43}$ |
| 7580 | $L_{A860}$ | $L_{B43}$ |
| 7581 | $L_{A861}$ | $L_{B43}$ |
| 7582 | $L_{A862}$ | $L_{B43}$ |
| 7583 | $L_{A863}$ | $L_{B43}$ |
| 7584 | $L_{A864}$ | $L_{B43}$ |
| 7585 | $L_{A865}$ | $L_{B43}$ |
| 7586 | $L_{A866}$ | $L_{B43}$ |
| 7587 | $L_{A867}$ | $L_{B43}$ |
| 7588 | $L_{A868}$ | $L_{B43}$ |
| 7589 | $L_{A869}$ | $L_{B43}$ |
| 7590 | $L_{A870}$ | $L_{B43}$ |
| 7591 | $L_{A871}$ | $L_{B43}$ |
| 7592 | $L_{A872}$ | $L_{B43}$ |
| 7593 | $L_{A873}$ | $L_{B43}$ |
| 7594 | $L_{A874}$ | $L_{B43}$ |
| 7595 | $L_{A875}$ | $L_{B43}$ |
| 7596 | $L_{A876}$ | $L_{B43}$ |
| 7597 | $L_{A877}$ | $L_{B43}$ |
| 7598 | $L_{A878}$ | $L_{B43}$ |
| 7599 | $L_{A879}$ | $L_{B43}$ |
| 7600 | $L_{A880}$ | $L_{B43}$ |
| 7601 | $L_{A881}$ | $L_{B43}$ |
| 7602 | $L_{A882}$ | $L_{B43}$ |
| 7603 | $L_{A883}$ | $L_{B43}$ |
| 7604 | $L_{A884}$ | $L_{B43}$ |
| 7605 | $L_{A885}$ | $L_{B43}$ |
| 7606 | $L_{A886}$ | $L_{B43}$ |
| 7607 | $L_{A887}$ | $L_{B43}$ |
| 7608 | $L_{A888}$ | $L_{B43}$ |
| 7609 | $L_{A889}$ | $L_{B43}$ |
| 7610 | $L_{A890}$ | $L_{B43}$ |
| 7611 | $L_{A891}$ | $L_{B43}$ |
| 7612 | $L_{A892}$ | $L_{B43}$ |
| 7613 | $L_{A893}$ | $L_{B43}$ |
| 7614 | $L_{A894}$ | $L_{B43}$ |
| 7615 | $L_{A895}$ | $L_{B43}$ |
| 7616 | $L_{A896}$ | $L_{B43}$ |
| 7617 | $L_{A897}$ | $L_{B43}$ |
| 7618 | $L_{A898}$ | $L_{B43}$ |
| 7619 | $L_{A899}$ | $L_{B43}$ |
| 7620 | $L_{A900}$ | $L_{B43}$ |
| 7621 | $L_{A901}$ | $L_{B43}$ |
| 7622 | $L_{A902}$ | $L_{B43}$ |
| 7623 | $L_{A903}$ | $L_{B43}$ |
| 7624 | $L_{A904}$ | $L_{B43}$ |
| 7625 | $L_{A905}$ | $L_{B43}$ |

-continued

| Compound Number | $L_A$ | $L_B$ |
|---|---|---|
| 7626 | $L_{A906}$ | $L_{B43}$ |
| 7627 | $L_{A907}$ | $L_{B43}$ |
| 7628 | $L_{A908}$ | $L_{B43}$ |
| 7629 | $L_{A909}$ | $L_{B43}$ |
| 7630 | $L_{A910}$ | $L_{B43}$ |
| 7631 | $L_{A911}$ | $L_{B43}$ |
| 7632 | $L_{A912}$ | $L_{B43}$ |
| 7633 | $L_{A913}$ | $L_{B43}$ |
| 7634 | $L_{A914}$ | $L_{B43}$ |
| 7635 | $L_{A915}$ | $L_{B43}$ |
| 7636 | $L_{A916}$ | $L_{B43}$ |
| 7637 | $L_{A917}$ | $L_{B43}$ |
| 7638 | $L_{A918}$ | $L_{B43}$ |
| 7639 | $L_{A919}$ | $L_{B43}$ |
| 7640 | $L_{A920}$ | $L_{B43}$ |
| 7641 | $L_{A921}$ | $L_{B43}$ |
| 7642 | $L_{A922}$ | $L_{B43}$ |
| 7643 | $L_{A923}$ | $L_{B43}$ |
| 7644 | $L_{A924}$ | $L_{B43}$ |
| 7645 | $L_{A925}$ | $L_{B43}$ |
| 7646 | $L_{A926}$ | $L_{B43}$ |
| 7647 | $L_{A927}$ | $L_{B43}$ |
| 7648 | $L_{A928}$ | $L_{B43}$ |
| 7649 | $L_{A929}$ | $L_{B43}$ |
| 7650 | $L_{A930}$ | $L_{B43}$ |
| 7651 | $L_{A931}$ | $L_{B43}$ |
| 7652 | $L_{A932}$ | $L_{B43}$ |
| 7653 | $L_{A933}$ | $L_{B43}$ |
| 7654 | $L_{A934}$ | $L_{B43}$ |
| 7655 | $L_{A935}$ | $L_{B43}$ |
| 7656 | $L_{A936}$ | $L_{B43}$ |
| 7657 | $L_{A937}$ | $L_{B43}$ |
| 7658 | $L_{A938}$ | $L_{B43}$ |
| 7659 | $L_{A939}$ | $L_{B43}$ |
| 7660 | $L_{A940}$ | $L_{B43}$ |
| 7661 | $L_{A941}$ | $L_{B43}$ |
| 7662 | $L_{A942}$ | $L_{B43}$ |
| 7663 | $L_{A943}$ | $L_{B43}$ |
| 7664 | $L_{A944}$ | $L_{B43}$ |
| 7665 | $L_{A945}$ | $L_{B43}$ |
| 7666 | $L_{A946}$ | $L_{B43}$ |
| 7667 | $L_{A947}$ | $L_{B43}$ |
| 7668 | $L_{A948}$ | $L_{B43}$ |
| 7669 | $L_{A949}$ | $L_{B43}$ |
| 7670 | $L_{A950}$ | $L_{B43}$ |
| 7671 | $L_{A951}$ | $L_{B43}$ |
| 7672 | $L_{A952}$ | $L_{B43}$ |
| 7673 | $L_{A953}$ | $L_{B43}$ |
| 7674 | $L_{A954}$ | $L_{B43}$ |
| 7675 | $L_{A955}$ | $L_{B43}$ |
| 7676 | $L_{A956}$ | $L_{B43}$ |
| 7677 | $L_{A957}$ | $L_{B43}$ |
| 7678 | $L_{A958}$ | $L_{B43}$ |
| 7679 | $L_{A959}$ | $L_{B43}$ |
| 7680 | $L_{A960}$ | $L_{B43}$. |

19. The compound of claim 14, wherein the compound has formula IV:

$$_A(L_A)_3\text{-Ir} \quad \text{(IV)};$$

and the compound is selected from the group consisting of compound 1 to compound 960 listed in the table below, where $L_A$ for each compound is identified:

| Compound Number | $L_A$ |
|---|---|
| 1 | $L_{A1}$ |
| 2 | $L_{A2}$ |
| 3 | $L_{A3}$ |
| 4 | $L_{A4}$ |
| 5 | $L_{A5}$ |
| 6 | $L_{A6}$ |

-continued

| Compound Number | $L_A$ |
|---|---|
| 7 | $L_{A7}$ |
| 8 | $L_{A8}$ |
| 9 | $L_{A9}$ |
| 10 | $L_{A10}$ |
| 11 | $L_{A11}$ |
| 12 | $L_{A12}$ |
| 13 | $L_{A13}$ |
| 14 | $L_{A14}$ |
| 15 | $L_{A15}$ |
| 16 | $L_{A16}$ |
| 17 | $L_{A17}$ |
| 18 | $L_{A18}$ |
| 19 | $L_{A19}$ |
| 20 | $L_{A20}$ |
| 21 | $L_{A21}$ |
| 22 | $L_{A22}$ |
| 23 | $L_{A23}$ |
| 24 | $L_{A24}$ |
| 25 | $L_{A25}$ |
| 26 | $L_{A26}$ |
| 27 | $L_{A27}$ |
| 28 | $L_{A28}$ |
| 29 | $L_{A29}$ |
| 30 | $L_{A30}$ |
| 31 | $L_{A31}$ |
| 32 | $L_{A32}$ |
| 33 | $L_{A33}$ |
| 34 | $L_{A34}$ |
| 35 | $L_{A35}$ |
| 36 | $L_{A36}$ |
| 37 | $L_{A37}$ |
| 38 | $L_{A38}$ |
| 39 | $L_{A39}$ |
| 40 | $L_{A40}$ |
| 41 | $L_{A41}$ |
| 42 | $L_{A42}$ |
| 43 | $L_{A43}$ |
| 44 | $L_{A44}$ |
| 45 | $L_{A45}$ |
| 46 | $L_{A46}$ |
| 47 | $L_{A47}$ |
| 48 | $L_{A48}$ |
| 49 | $L_{A49}$ |
| 50 | $L_{A50}$ |
| 51 | $L_{A51}$ |
| 52 | $L_{A52}$ |
| 53 | $L_{A53}$ |
| 54 | $L_{A54}$ |
| 55 | $L_{A55}$ |
| 56 | $L_{A56}$ |
| 57 | $L_{A57}$ |
| 58 | $L_{A58}$ |
| 59 | $L_{A59}$ |
| 60 | $L_{A60}$ |
| 61 | $L_{A61}$ |
| 62 | $L_{A62}$ |
| 63 | $L_{A63}$ |
| 64 | $L_{A64}$ |
| 65 | $L_{A65}$ |
| 66 | $L_{A66}$ |
| 67 | $L_{A67}$ |
| 68 | $L_{A68}$ |
| 69 | $L_{A69}$ |
| 70 | $L_{A70}$ |
| 71 | $L_{A71}$ |
| 72 | $L_{A72}$ |
| 73 | $L_{A73}$ |
| 74 | $L_{A74}$ |
| 75 | $L_{A75}$ |
| 76 | $L_{A76}$ |
| 77 | $L_{A77}$ |
| 78 | $L_{A78}$ |
| 79 | $L_{A79}$ |
| 80 | $L_{A80}$ |
| 81 | $L_{A81}$ |
| 82 | $L_{A82}$ |

-continued

| Compound Number | $L_A$ |
|---|---|
| 83 | $L_{A83}$ |
| 84 | $L_{A84}$ |
| 85 | $L_{A85}$ |
| 86 | $L_{A86}$ |
| 87 | $L_{A87}$ |
| 88 | $L_{A88}$ |
| 89 | $L_{A89}$ |
| 90 | $L_{A90}$ |
| 91 | $L_{A91}$ |
| 92 | $L_{A92}$ |
| 93 | $L_{A93}$ |
| 94 | $L_{A94}$ |
| 95 | $L_{A95}$ |
| 96 | $L_{A96}$ |
| 97 | $L_{A97}$ |
| 98 | $L_{A98}$ |
| 99 | $L_{A99}$ |
| 100 | $L_{A100}$ |
| 101 | $L_{A101}$ |
| 102 | $L_{A102}$ |
| 103 | $L_{A103}$ |
| 104 | $L_{A104}$ |
| 105 | $L_{A105}$ |
| 106 | $L_{A106}$ |
| 107 | $L_{A107}$ |
| 108 | $L_{A108}$ |
| 109 | $L_{A109}$ |
| 110 | $L_{A110}$ |
| 111 | $L_{A111}$ |
| 112 | $L_{A112}$ |
| 113 | $L_{A113}$ |
| 114 | $L_{A114}$ |
| 115 | $L_{A115}$ |
| 116 | $L_{A116}$ |
| 117 | $L_{A117}$ |
| 118 | $L_{A118}$ |
| 119 | $L_{A119}$ |
| 120 | $L_{A120}$ |
| 121 | $L_{A121}$ |
| 122 | $L_{A122}$ |
| 123 | $L_{A123}$ |
| 124 | $L_{A124}$ |
| 125 | $L_{A125}$ |
| 126 | $L_{A126}$ |
| 127 | $L_{A127}$ |
| 128 | $L_{A128}$ |
| 129 | $L_{A129}$ |
| 130 | $L_{A130}$ |
| 131 | $L_{A131}$ |
| 132 | $L_{A132}$ |
| 133 | $L_{A133}$ |
| 134 | $L_{A134}$ |
| 135 | $L_{A135}$ |
| 136 | $L_{A136}$ |
| 137 | $L_{A137}$ |
| 138 | $L_{A138}$ |
| 139 | $L_{A139}$ |
| 140 | $L_{A140}$ |
| 141 | $L_{A141}$ |
| 142 | $L_{A142}$ |
| 143 | $L_{A143}$ |
| 144 | $L_{A144}$ |
| 145 | $L_{A145}$ |
| 146 | $L_{A146}$ |
| 147 | $L_{A147}$ |
| 148 | $L_{A148}$ |
| 149 | $L_{A149}$ |
| 150 | $L_{A150}$ |
| 151 | $L_{A151}$ |
| 152 | $L_{A152}$ |
| 153 | $L_{A153}$ |
| 154 | $L_{A154}$ |
| 155 | $L_{A155}$ |
| 156 | $L_{A156}$ |
| 157 | $L_{A157}$ |
| 158 | $L_{A158}$ |

-continued

| Compound Number | $L_A$ |
|---|---|
| 159 | $L_{A159}$ |
| 160 | $L_{A160}$ |
| 161 | $L_{A161}$ |
| 162 | $L_{A162}$ |
| 163 | $L_{A163}$ |
| 164 | $L_{A164}$ |
| 165 | $L_{A165}$ |
| 166 | $L_{A166}$ |
| 167 | $L_{A167}$ |
| 168 | $L_{A168}$ |
| 169 | $L_{A169}$ |
| 170 | $L_{A170}$ |
| 171 | $L_{A171}$ |
| 172 | $L_{A172}$ |
| 173 | $L_{A173}$ |
| 174 | $L_{A174}$ |
| 175 | $L_{A175}$ |
| 176 | $L_{A176}$ |
| 177 | $L_{A177}$ |
| 178 | $L_{A178}$ |
| 179 | $L_{A179}$ |
| 180 | $L_{A180}$ |
| 181 | $L_{A181}$ |
| 182 | $L_{A182}$ |
| 183 | $L_{A183}$ |
| 184 | $L_{A184}$ |
| 185 | $L_{A185}$ |
| 186 | $L_{A186}$ |
| 187 | $L_{A187}$ |
| 188 | $L_{A188}$ |
| 189 | $L_{A189}$ |
| 190 | $L_{A190}$ |
| 191 | $L_{A191}$ |
| 192 | $L_{A192}$ |
| 193 | $L_{A193}$ |
| 194 | $L_{A194}$ |
| 195 | $L_{A195}$ |
| 196 | $L_{A196}$ |
| 197 | $L_{A197}$ |
| 198 | $L_{A198}$ |
| 199 | $L_{A199}$ |
| 200 | $L_{A200}$ |
| 201 | $L_{A201}$ |
| 202 | $L_{A202}$ |
| 203 | $L_{A203}$ |
| 204 | $L_{A204}$ |
| 205 | $L_{A205}$ |
| 206 | $L_{A206}$ |
| 207 | $L_{A207}$ |
| 208 | $L_{A208}$ |
| 209 | $L_{A209}$ |
| 210 | $L_{A210}$ |
| 211 | $L_{A211}$ |
| 212 | $L_{A212}$ |
| 213 | $L_{A213}$ |
| 214 | $L_{A214}$ |
| 215 | $L_{A215}$ |
| 216 | $L_{A216}$ |
| 217 | $L_{A217}$ |
| 218 | $L_{A218}$ |
| 219 | $L_{A219}$ |
| 220 | $L_{A220}$ |
| 221 | $L_{A221}$ |
| 222 | $L_{A222}$ |
| 223 | $L_{A223}$ |
| 224 | $L_{A224}$ |
| 225 | $L_{A225}$ |
| 226 | $L_{A226}$ |
| 227 | $L_{A227}$ |
| 228 | $L_{A228}$ |
| 229 | $L_{A229}$ |
| 230 | $L_{A230}$ |
| 231 | $L_{A231}$ |
| 232 | $L_{A232}$ |
| 233 | $L_{A233}$ |
| 234 | $L_{A234}$ |

-continued

| Compound Number | $L_A$ |
|---|---|
| 235 | $L_{A235}$ |
| 236 | $L_{A236}$ |
| 237 | $L_{A237}$ |
| 238 | $L_{A238}$ |
| 239 | $L_{A239}$ |
| 240 | $L_{A240}$ |
| 241 | $L_{A241}$ |
| 242 | $L_{A242}$ |
| 243 | $L_{A243}$ |
| 244 | $L_{A244}$ |
| 245 | $L_{A245}$ |
| 246 | $L_{A246}$ |
| 247 | $L_{A247}$ |
| 248 | $L_{A248}$ |
| 249 | $L_{A249}$ |
| 250 | $L_{A250}$ |
| 251 | $L_{A251}$ |
| 252 | $L_{A252}$ |
| 253 | $L_{A253}$ |
| 254 | $L_{A254}$ |
| 255 | $L_{A255}$ |
| 256 | $L_{A256}$ |
| 257 | $L_{A257}$ |
| 258 | $L_{A258}$ |
| 259 | $L_{A259}$ |
| 260 | $L_{A260}$ |
| 261 | $L_{A261}$ |
| 262 | $L_{A262}$ |
| 263 | $L_{A263}$ |
| 264 | $L_{A264}$ |
| 265 | $L_{A265}$ |
| 266 | $L_{A266}$ |
| 267 | $L_{A267}$ |
| 268 | $L_{A268}$ |
| 269 | $L_{A269}$ |
| 270 | $L_{A270}$ |
| 271 | $L_{A271}$ |
| 272 | $L_{A272}$ |
| 273 | $L_{A273}$ |
| 274 | $L_{A274}$ |
| 275 | $L_{A275}$ |
| 276 | $L_{A276}$ |
| 277 | $L_{A277}$ |
| 278 | $L_{A278}$ |
| 279 | $L_{A279}$ |
| 280 | $L_{A280}$ |
| 281 | $L_{A281}$ |
| 282 | $L_{A282}$ |
| 283 | $L_{A283}$ |
| 284 | $L_{A284}$ |
| 285 | $L_{A285}$ |
| 286 | $L_{A286}$ |
| 287 | $L_{A287}$ |
| 288 | $L_{A288}$ |
| 289 | $L_{A289}$ |
| 290 | $L_{A290}$ |
| 291 | $L_{A291}$ |
| 292 | $L_{A292}$ |
| 293 | $L_{A293}$ |
| 294 | $L_{A294}$ |
| 295 | $L_{A295}$ |
| 296 | $L_{A296}$ |
| 297 | $L_{A297}$ |
| 298 | $L_{A298}$ |
| 299 | $L_{A299}$ |
| 300 | $L_{A300}$ |
| 301 | $L_{A301}$ |
| 302 | $L_{A302}$ |
| 303 | $L_{A303}$ |
| 304 | $L_{A304}$ |
| 305 | $L_{A305}$ |
| 306 | $L_{A306}$ |
| 307 | $L_{A307}$ |
| 308 | $L_{A308}$ |
| 309 | $L_{A309}$ |
| 310 | $L_{A310}$ |

-continued

| Compound Number | $L_A$ |
|---|---|
| 311 | $L_{A311}$ |
| 312 | $L_{A312}$ |
| 313 | $L_{A313}$ |
| 314 | $L_{A314}$ |
| 315 | $L_{A315}$ |
| 316 | $L_{A316}$ |
| 317 | $L_{A317}$ |
| 318 | $L_{A318}$ |
| 319 | $L_{A319}$ |
| 320 | $L_{A320}$ |
| 321 | $L_{A321}$ |
| 322 | $L_{A322}$ |
| 323 | $L_{A323}$ |
| 324 | $L_{A324}$ |
| 325 | $L_{A325}$ |
| 326 | $L_{A326}$ |
| 327 | $L_{A327}$ |
| 328 | $L_{A328}$ |
| 329 | $L_{A329}$ |
| 330 | $L_{A330}$ |
| 331 | $L_{A331}$ |
| 332 | $L_{A332}$ |
| 333 | $L_{A333}$ |
| 334 | $L_{A334}$ |
| 335 | $L_{A335}$ |
| 336 | $L_{A336}$ |
| 337 | $L_{A337}$ |
| 338 | $L_{A338}$ |
| 339 | $L_{A339}$ |
| 340 | $L_{A340}$ |
| 341 | $L_{A341}$ |
| 342 | $L_{A342}$ |
| 343 | $L_{A343}$ |
| 344 | $L_{A344}$ |
| 345 | $L_{A345}$ |
| 346 | $L_{A346}$ |
| 347 | $L_{A347}$ |
| 348 | $L_{A348}$ |
| 349 | $L_{A349}$ |
| 350 | $L_{A350}$ |
| 351 | $L_{A351}$ |
| 352 | $L_{A352}$ |
| 353 | $L_{A353}$ |
| 354 | $L_{A354}$ |
| 355 | $L_{A355}$ |
| 356 | $L_{A356}$ |
| 357 | $L_{A357}$ |
| 358 | $L_{A358}$ |
| 359 | $L_{A359}$ |
| 360 | $L_{A360}$ |
| 361 | $L_{A361}$ |
| 362 | $L_{A362}$ |
| 363 | $L_{A363}$ |
| 364 | $L_{A364}$ |
| 365 | $L_{A365}$ |
| 366 | $L_{A366}$ |
| 367 | $L_{A367}$ |
| 368 | $L_{A368}$ |
| 369 | $L_{A369}$ |
| 370 | $L_{A370}$ |
| 371 | $L_{A371}$ |
| 372 | $L_{A372}$ |
| 373 | $L_{A373}$ |
| 374 | $L_{A374}$ |
| 375 | $L_{A375}$ |
| 376 | $L_{A376}$ |
| 377 | $L_{A377}$ |
| 378 | $L_{A378}$ |
| 379 | $L_{A379}$ |
| 380 | $L_{A380}$ |
| 381 | $L_{A381}$ |
| 382 | $L_{A382}$ |
| 383 | $L_{A383}$ |
| 384 | $L_{A384}$ |
| 385 | $L_{A385}$ |
| 386 | $L_{A386}$ |

-continued

| Compound Number | $L_A$ |
|---|---|
| 387 | $L_{A387}$ |
| 388 | $L_{A388}$ |
| 389 | $L_{A389}$ |
| 390 | $L_{A390}$ |
| 391 | $L_{A391}$ |
| 392 | $L_{A392}$ |
| 393 | $L_{A393}$ |
| 394 | $L_{A394}$ |
| 395 | $L_{A395}$ |
| 396 | $L_{A396}$ |
| 397 | $L_{A397}$ |
| 398 | $L_{A398}$ |
| 399 | $L_{A399}$ |
| 400 | $L_{A400}$ |
| 401 | $L_{A401}$ |
| 402 | $L_{A402}$ |
| 403 | $L_{A403}$ |
| 404 | $L_{A404}$ |
| 405 | $L_{A405}$ |
| 406 | $L_{A406}$ |
| 407 | $L_{A407}$ |
| 408 | $L_{A408}$ |
| 409 | $L_{A409}$ |
| 410 | $L_{A410}$ |
| 411 | $L_{A411}$ |
| 412 | $L_{A412}$ |
| 413 | $L_{A413}$ |
| 414 | $L_{A414}$ |
| 415 | $L_{A415}$ |
| 416 | $L_{A416}$ |
| 417 | $L_{A417}$ |
| 418 | $L_{A418}$ |
| 419 | $L_{A419}$ |
| 420 | $L_{A420}$ |
| 421 | $L_{A421}$ |
| 422 | $L_{A422}$ |
| 423 | $L_{A423}$ |
| 424 | $L_{A424}$ |
| 425 | $L_{A425}$ |
| 426 | $L_{A426}$ |
| 427 | $L_{A427}$ |
| 428 | $L_{A428}$ |
| 429 | $L_{A429}$ |
| 430 | $L_{A430}$ |
| 431 | $L_{A431}$ |
| 432 | $L_{A432}$ |
| 433 | $L_{A433}$ |
| 434 | $L_{A434}$ |
| 435 | $L_{A435}$ |
| 436 | $L_{A436}$ |
| 437 | $L_{A437}$ |
| 438 | $L_{A438}$ |
| 439 | $L_{A439}$ |
| 440 | $L_{A440}$ |
| 441 | $L_{A441}$ |
| 442 | $L_{A442}$ |
| 443 | $L_{A443}$ |
| 444 | $L_{A444}$ |
| 445 | $L_{A445}$ |
| 446 | $L_{A446}$ |
| 447 | $L_{A447}$ |
| 448 | $L_{A448}$ |
| 449 | $L_{A449}$ |
| 450 | $L_{A450}$ |
| 451 | $L_{A451}$ |
| 452 | $L_{A452}$ |
| 453 | $L_{A453}$ |
| 454 | $L_{A454}$ |
| 455 | $L_{A455}$ |
| 456 | $L_{A456}$ |
| 457 | $L_{A457}$ |
| 458 | $L_{A458}$ |
| 459 | $L_{A459}$ |
| 460 | $L_{A460}$ |
| 461 | $L_{A461}$ |
| 462 | $L_{A462}$ |

| Compound Number | $L_A$ |
|---|---|
| 463 | $L_{A463}$ |
| 464 | $L_{A464}$ |
| 465 | $L_{A465}$ |
| 466 | $L_{A466}$ |
| 467 | $L_{A467}$ |
| 468 | $L_{A468}$ |
| 469 | $L_{A469}$ |
| 470 | $L_{A470}$ |
| 471 | $L_{A471}$ |
| 472 | $L_{A472}$ |
| 473 | $L_{A473}$ |
| 474 | $L_{A474}$ |
| 475 | $L_{A475}$ |
| 476 | $L_{A476}$ |
| 477 | $L_{A477}$ |
| 478 | $L_{A478}$ |
| 479 | $L_{A479}$ |
| 480 | $L_{A480}$ |
| 481 | $L_{A481}$ |
| 482 | $L_{A482}$ |
| 483 | $L_{A483}$ |
| 484 | $L_{A484}$ |
| 485 | $L_{A485}$ |
| 486 | $L_{A486}$ |
| 487 | $L_{A487}$ |
| 488 | $L_{A488}$ |
| 489 | $L_{A489}$ |
| 490 | $L_{A490}$ |
| 491 | $L_{A491}$ |
| 492 | $L_{A492}$ |
| 493 | $L_{A493}$ |
| 494 | $L_{A494}$ |
| 495 | $L_{A495}$ |
| 496 | $L_{A496}$ |
| 497 | $L_{A497}$ |
| 498 | $L_{A498}$ |
| 499 | $L_{A499}$ |
| 500 | $L_{A500}$ |
| 501 | $L_{A501}$ |
| 502 | $L_{A502}$ |
| 503 | $L_{A503}$ |
| 504 | $L_{A504}$ |
| 505 | $L_{A505}$ |
| 506 | $L_{A506}$ |
| 507 | $L_{A507}$ |
| 508 | $L_{A508}$ |
| 509 | $L_{A509}$ |
| 510 | $L_{A510}$ |
| 511 | $L_{A511}$ |
| 512 | $L_{A512}$ |
| 513 | $L_{A513}$ |
| 514 | $L_{A514}$ |
| 515 | $L_{A515}$ |
| 516 | $L_{A516}$ |
| 517 | $L_{A517}$ |
| 518 | $L_{A518}$ |
| 519 | $L_{A519}$ |
| 520 | $L_{A520}$ |
| 521 | $L_{A521}$ |
| 522 | $L_{A522}$ |
| 523 | $L_{A523}$ |
| 524 | $L_{A524}$ |
| 525 | $L_{A525}$ |
| 526 | $L_{A526}$ |
| 527 | $L_{A527}$ |
| 528 | $L_{A528}$ |
| 529 | $L_{A529}$ |
| 530 | $L_{A530}$ |
| 531 | $L_{A531}$ |
| 532 | $L_{A532}$ |
| 533 | $L_{A533}$ |
| 534 | $L_{A534}$ |
| 535 | $L_{A535}$ |
| 536 | $L_{A536}$ |
| 537 | $L_{A537}$ |
| 538 | $L_{A538}$ |

| Compound Number | $L_A$ |
|---|---|
| 539 | $L_{A539}$ |
| 540 | $L_{A540}$ |
| 541 | $L_{A541}$ |
| 542 | $L_{A542}$ |
| 543 | $L_{A543}$ |
| 544 | $L_{A544}$ |
| 545 | $L_{A545}$ |
| 546 | $L_{A546}$ |
| 547 | $L_{A547}$ |
| 548 | $L_{A548}$ |
| 549 | $L_{A549}$ |
| 550 | $L_{A550}$ |
| 551 | $L_{A551}$ |
| 552 | $L_{A552}$ |
| 553 | $L_{A553}$ |
| 554 | $L_{A554}$ |
| 555 | $L_{A555}$ |
| 556 | $L_{A556}$ |
| 557 | $L_{A557}$ |
| 558 | $L_{A558}$ |
| 559 | $L_{A559}$ |
| 560 | $L_{A560}$ |
| 561 | $L_{A561}$ |
| 562 | $L_{A562}$ |
| 563 | $L_{A563}$ |
| 564 | $L_{A564}$ |
| 565 | $L_{A565}$ |
| 566 | $L_{A566}$ |
| 567 | $L_{A567}$ |
| 568 | $L_{A568}$ |
| 569 | $L_{A569}$ |
| 570 | $L_{A570}$ |
| 571 | $L_{A571}$ |
| 572 | $L_{A572}$ |
| 573 | $L_{A573}$ |
| 574 | $L_{A574}$ |
| 575 | $L_{A575}$ |
| 576 | $L_{A576}$ |
| 577 | $L_{A577}$ |
| 578 | $L_{A578}$ |
| 579 | $L_{A579}$ |
| 580 | $L_{A580}$ |
| 581 | $L_{A581}$ |
| 582 | $L_{A582}$ |
| 583 | $L_{A583}$ |
| 584 | $L_{A584}$ |
| 585 | $L_{A585}$ |
| 586 | $L_{A586}$ |
| 587 | $L_{A587}$ |
| 588 | $L_{A588}$ |
| 589 | $L_{A589}$ |
| 590 | $L_{A590}$ |
| 591 | $L_{A591}$ |
| 592 | $L_{A592}$ |
| 593 | $L_{A593}$ |
| 594 | $L_{A594}$ |
| 595 | $L_{A595}$ |
| 596 | $L_{A596}$ |
| 597 | $L_{A597}$ |
| 598 | $L_{A598}$ |
| 599 | $L_{A599}$ |
| 600 | $L_{A600}$ |
| 601 | $L_{A601}$ |
| 602 | $L_{A602}$ |
| 603 | $L_{A603}$ |
| 604 | $L_{A604}$ |
| 605 | $L_{A605}$ |
| 606 | $L_{A606}$ |
| 607 | $L_{A607}$ |
| 608 | $L_{A608}$ |
| 609 | $L_{A609}$ |
| 610 | $L_{A610}$ |
| 611 | $L_{A611}$ |
| 612 | $L_{A612}$ |
| 613 | $L_{A613}$ |
| 614 | $L_{A614}$ |

-continued

| Compound Number | $L_A$ |
|---|---|
| 615 | $L_{A615}$ |
| 616 | $L_{A616}$ |
| 617 | $L_{A617}$ |
| 618 | $L_{A618}$ |
| 619 | $L_{A619}$ |
| 620 | $L_{A620}$ |
| 621 | $L_{A621}$ |
| 622 | $L_{A622}$ |
| 623 | $L_{A623}$ |
| 624 | $L_{A624}$ |
| 625 | $L_{A625}$ |
| 626 | $L_{A626}$ |
| 627 | $L_{A627}$ |
| 628 | $L_{A628}$ |
| 629 | $L_{A629}$ |
| 630 | $L_{A630}$ |
| 631 | $L_{A631}$ |
| 632 | $L_{A632}$ |
| 633 | $L_{A633}$ |
| 634 | $L_{A634}$ |
| 635 | $L_{A635}$ |
| 636 | $L_{A636}$ |
| 637 | $L_{A637}$ |
| 638 | $L_{A638}$ |
| 639 | $L_{A639}$ |
| 640 | $L_{A640}$ |
| 641 | $L_{A641}$ |
| 642 | $L_{A642}$ |
| 643 | $L_{A643}$ |
| 644 | $L_{A644}$ |
| 645 | $L_{A645}$ |
| 646 | $L_{A646}$ |
| 647 | $L_{A647}$ |
| 648 | $L_{A648}$ |
| 649 | $L_{A649}$ |
| 650 | $L_{A650}$ |
| 651 | $L_{A651}$ |
| 652 | $L_{A652}$ |
| 653 | $L_{A653}$ |
| 654 | $L_{A654}$ |
| 655 | $L_{A655}$ |
| 656 | $L_{A656}$ |
| 657 | $L_{A657}$ |
| 658 | $L_{A658}$ |
| 659 | $L_{A659}$ |
| 660 | $L_{A660}$ |
| 661 | $L_{A661}$ |
| 662 | $L_{A662}$ |
| 663 | $L_{A663}$ |
| 664 | $L_{A664}$ |
| 665 | $L_{A665}$ |
| 666 | $L_{A666}$ |
| 667 | $L_{A667}$ |
| 668 | $L_{A668}$ |
| 669 | $L_{A669}$ |
| 670 | $L_{A670}$ |
| 671 | $L_{A671}$ |
| 672 | $L_{A672}$ |
| 673 | $L_{A673}$ |
| 674 | $L_{A674}$ |
| 675 | $L_{A675}$ |
| 676 | $L_{A676}$ |
| 677 | $L_{A677}$ |
| 678 | $L_{A678}$ |
| 679 | $L_{A679}$ |
| 680 | $L_{A680}$ |
| 681 | $L_{A681}$ |
| 682 | $L_{A682}$ |
| 683 | $L_{A683}$ |
| 684 | $L_{A684}$ |
| 685 | $L_{A685}$ |
| 686 | $L_{A686}$ |
| 687 | $L_{A687}$ |
| 688 | $L_{A688}$ |
| 689 | $L_{A689}$ |
| 690 | $L_{A690}$ |

-continued

| Compound Number | $L_A$ |
|---|---|
| 691 | $L_{A691}$ |
| 692 | $L_{A692}$ |
| 693 | $L_{A693}$ |
| 694 | $L_{A694}$ |
| 695 | $L_{A695}$ |
| 696 | $L_{A696}$ |
| 697 | $L_{A697}$ |
| 698 | $L_{A698}$ |
| 699 | $L_{A699}$ |
| 700 | $L_{A700}$ |
| 701 | $L_{A701}$ |
| 702 | $L_{A702}$ |
| 703 | $L_{A703}$ |
| 704 | $L_{A704}$ |
| 705 | $L_{A705}$ |
| 706 | $L_{A706}$ |
| 707 | $L_{A707}$ |
| 708 | $L_{A708}$ |
| 709 | $L_{A709}$ |
| 710 | $L_{A710}$ |
| 711 | $L_{A711}$ |
| 712 | $L_{A712}$ |
| 713 | $L_{A713}$ |
| 714 | $L_{A714}$ |
| 715 | $L_{A715}$ |
| 716 | $L_{A716}$ |
| 717 | $L_{A717}$ |
| 718 | $L_{A718}$ |
| 719 | $L_{A719}$ |
| 720 | $L_{A720}$ |
| 721 | $L_{A721}$ |
| 722 | $L_{A722}$ |
| 723 | $L_{A723}$ |
| 724 | $L_{A724}$ |
| 725 | $L_{A725}$ |
| 726 | $L_{A726}$ |
| 727 | $L_{A727}$ |
| 728 | $L_{A728}$ |
| 729 | $L_{A729}$ |
| 730 | $L_{A730}$ |
| 731 | $L_{A731}$ |
| 732 | $L_{A732}$ |
| 733 | $L_{A733}$ |
| 734 | $L_{A734}$ |
| 735 | $L_{A735}$ |
| 736 | $L_{A736}$ |
| 737 | $L_{A737}$ |
| 738 | $L_{A738}$ |
| 739 | $L_{A739}$ |
| 740 | $L_{A740}$ |
| 741 | $L_{A741}$ |
| 742 | $L_{A742}$ |
| 743 | $L_{A743}$ |
| 744 | $L_{A744}$ |
| 745 | $L_{A745}$ |
| 746 | $L_{A746}$ |
| 747 | $L_{A747}$ |
| 748 | $L_{A748}$ |
| 749 | $L_{A749}$ |
| 750 | $L_{A750}$ |
| 751 | $L_{A751}$ |
| 752 | $L_{A752}$ |
| 753 | $L_{A753}$ |
| 754 | $L_{A754}$ |
| 755 | $L_{A755}$ |
| 756 | $L_{A756}$ |
| 757 | $L_{A757}$ |
| 758 | $L_{A758}$ |
| 759 | $L_{A759}$ |
| 760 | $L_{A760}$ |
| 761 | $L_{A761}$ |
| 762 | $L_{A762}$ |
| 763 | $L_{A763}$ |
| 764 | $L_{A764}$ |
| 765 | $L_{A765}$ |
| 766 | $L_{A766}$ |

-continued

| Compound Number | $L_A$ |
|---|---|
| 767 | $L_{A767}$ |
| 768 | $L_{A768}$ |
| 769 | $L_{A769}$ |
| 770 | $L_{A770}$ |
| 771 | $L_{A771}$ |
| 772 | $L_{A772}$ |
| 773 | $L_{A773}$ |
| 774 | $L_{A774}$ |
| 775 | $L_{A775}$ |
| 776 | $L_{A776}$ |
| 777 | $L_{A777}$ |
| 778 | $L_{A778}$ |
| 779 | $L_{A779}$ |
| 780 | $L_{A780}$ |
| 781 | $L_{A781}$ |
| 782 | $L_{A782}$ |
| 783 | $L_{A783}$ |
| 784 | $L_{A784}$ |
| 785 | $L_{A785}$ |
| 786 | $L_{A786}$ |
| 787 | $L_{A787}$ |
| 788 | $L_{A788}$ |
| 789 | $L_{A789}$ |
| 790 | $L_{A790}$ |
| 791 | $L_{A791}$ |
| 792 | $L_{A792}$ |
| 793 | $L_{A793}$ |
| 794 | $L_{A794}$ |
| 795 | $L_{A795}$ |
| 796 | $L_{A796}$ |
| 797 | $L_{A797}$ |
| 798 | $L_{A798}$ |
| 799 | $L_{A799}$ |
| 800 | $L_{A800}$ |
| 801 | $L_{A801}$ |
| 802 | $L_{A802}$ |
| 803 | $L_{A803}$ |
| 804 | $L_{A804}$ |
| 805 | $L_{A805}$ |
| 806 | $L_{A806}$ |
| 807 | $L_{A807}$ |
| 808 | $L_{A808}$ |
| 809 | $L_{A809}$ |
| 810 | $L_{A810}$ |
| 811 | $L_{A811}$ |
| 812 | $L_{A812}$ |
| 813 | $L_{A813}$ |
| 814 | $L_{A814}$ |
| 815 | $L_{A815}$ |
| 816 | $L_{A816}$ |
| 817 | $L_{A817}$ |
| 818 | $L_{A818}$ |
| 819 | $L_{A819}$ |
| 820 | $L_{A820}$ |
| 821 | $L_{A821}$ |
| 822 | $L_{A822}$ |
| 823 | $L_{A823}$ |
| 824 | $L_{A824}$ |
| 825 | $L_{A825}$ |
| 826 | $L_{A826}$ |
| 827 | $L_{A827}$ |
| 828 | $L_{A828}$ |
| 829 | $L_{A829}$ |
| 830 | $L_{A830}$ |
| 831 | $L_{A831}$ |
| 832 | $L_{A832}$ |
| 833 | $L_{A833}$ |
| 834 | $L_{A834}$ |
| 835 | $L_{A835}$ |
| 836 | $L_{A836}$ |
| 837 | $L_{A837}$ |
| 838 | $L_{A838}$ |
| 839 | $L_{A839}$ |
| 840 | $L_{A840}$ |
| 841 | $L_{A841}$ |
| 842 | $L_{A842}$ |

-continued

| Compound Number | $L_A$ |
|---|---|
| 843 | $L_{A843}$ |
| 844 | $L_{A844}$ |
| 845 | $L_{A845}$ |
| 846 | $L_{A846}$ |
| 847 | $L_{A847}$ |
| 848 | $L_{A848}$ |
| 849 | $L_{A849}$ |
| 850 | $L_{A850}$ |
| 851 | $L_{A851}$ |
| 852 | $L_{A852}$ |
| 853 | $L_{A853}$ |
| 854 | $L_{A854}$ |
| 855 | $L_{A855}$ |
| 856 | $L_{A856}$ |
| 857 | $L_{A857}$ |
| 858 | $L_{A858}$ |
| 859 | $L_{A859}$ |
| 860 | $L_{A860}$ |
| 861 | $L_{A861}$ |
| 862 | $L_{A862}$ |
| 863 | $L_{A863}$ |
| 864 | $L_{A864}$ |
| 865 | $L_{A865}$ |
| 866 | $L_{A866}$ |
| 867 | $L_{A867}$ |
| 868 | $L_{A868}$ |
| 869 | $L_{A869}$ |
| 870 | $L_{A870}$ |
| 871 | $L_{A871}$ |
| 872 | $L_{A872}$ |
| 873 | $L_{A873}$ |
| 874 | $L_{A874}$ |
| 875 | $L_{A875}$ |
| 876 | $L_{A876}$ |
| 877 | $L_{A877}$ |
| 878 | $L_{A878}$ |
| 879 | $L_{A879}$ |
| 880 | $L_{A880}$ |
| 881 | $L_{A881}$ |
| 882 | $L_{A882}$ |
| 883 | $L_{A883}$ |
| 884 | $L_{A884}$ |
| 885 | $L_{A885}$ |
| 886 | $L_{A886}$ |
| 887 | $L_{A887}$ |
| 888 | $L_{A888}$ |
| 889 | $L_{A889}$ |
| 890 | $L_{A890}$ |
| 891 | $L_{A891}$ |
| 892 | $L_{A892}$ |
| 893 | $L_{A893}$ |
| 894 | $L_{A894}$ |
| 895 | $L_{A895}$ |
| 896 | $L_{A896}$ |
| 897 | $L_{A897}$ |
| 898 | $L_{A898}$ |
| 899 | $L_{A899}$ |
| 900 | $L_{A900}$ |
| 901 | $L_{A901}$ |
| 902 | $L_{A902}$ |
| 903 | $L_{A903}$ |
| 904 | $L_{A904}$ |
| 905 | $L_{A905}$ |
| 906 | $L_{A906}$ |
| 907 | $L_{A907}$ |
| 908 | $L_{A908}$ |
| 909 | $L_{A909}$ |
| 910 | $L_{A910}$ |
| 911 | $L_{A911}$ |
| 912 | $L_{A912}$ |
| 913 | $L_{A913}$ |
| 914 | $L_{A914}$ |
| 915 | $L_{A915}$ |
| 916 | $L_{A916}$ |
| 917 | $L_{A917}$ |
| 918 | $L_{A918}$ |

-continued

| Compound Number | $L_A$ |
|---|---|
| 919 | $L_{A919}$ |
| 920 | $L_{A920}$ |
| 921 | $L_{A921}$ |
| 922 | $L_{A922}$ |
| 923 | $L_{A923}$ |
| 924 | $L_{A924}$ |
| 925 | $L_{A925}$ |
| 926 | $L_{A926}$ |
| 927 | $L_{A927}$ |
| 928 | $L_{A928}$ |
| 929 | $L_{A929}$ |
| 930 | $L_{A930}$ |
| 931 | $L_{A931}$ |
| 932 | $L_{A932}$ |
| 933 | $L_{A933}$ |
| 934 | $L_{A934}$ |
| 935 | $L_{A935}$ |
| 936 | $L_{A936}$ |
| 937 | $L_{A937}$ |
| 938 | $L_{A938}$ |
| 939 | $L_{A939}$ |
| 940 | $L_{A940}$ |
| 941 | $L_{A941}$ |
| 942 | $L_{A942}$ |
| 943 | $L_{A943}$ |
| 944 | $L_{A944}$ |
| 945 | $L_{A945}$ |
| 946 | $L_{A946}$ |
| 947 | $L_{A947}$ |
| 948 | $L_{A948}$ |
| 949 | $L_{A949}$ |
| 950 | $L_{A950}$ |
| 951 | $L_{A951}$ |
| 952 | $L_{A952}$ |
| 953 | $L_{A953}$ |
| 954 | $L_{A954}$ |
| 955 | $L_{A955}$ |
| 956 | $L_{A956}$ |
| 957 | $L_{A957}$ |
| 958 | $L_{A958}$ |
| 959 | $L_{A959}$ |
| 960 | $L_{A960}$. |

20. The compound of claim 1, wherein the compound is selected from the group consisting of:

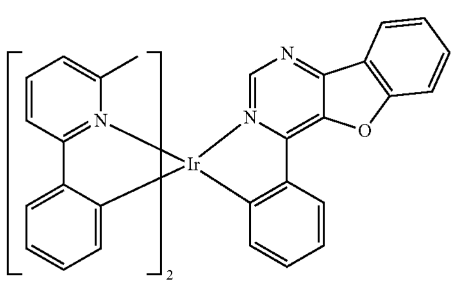

and

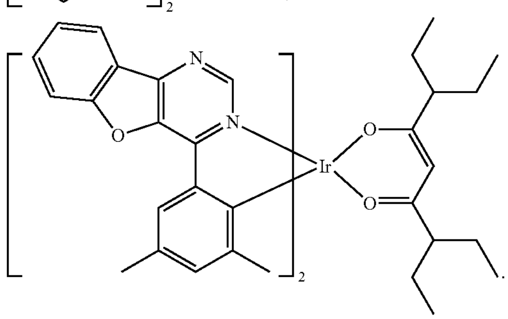

21. A first device comprising a first organic light emitting device, the first organic light emitting device comprising:

an anode;

a cathode; and an organic layer, disposed between the anode and the cathode, comprising a compound comprising a ligand $L_A$ of formula I:

(I)

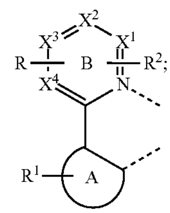

wherein ring A is a 5-membered or 6-membered carbocyclic or heterocyclic ring;

wherein R is fused to ring B and has formula II:

(II)

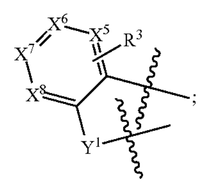

wherein the wave lines indicate bonds to ring B;

wherein $R^1$and $R^3$ each independently represent mono, di, tri, or tetra substitution, or no substitution;

wherein $R^2$ represents mono or di substitution, or no substitution;

wherein $X^1$, $X^2$, $X^3$, $X^4$, $X^5$, $X^6$, $X^7$, and $X^8$ are each independently carbon or nitrogen;

wherein at least one of $X^1$, $X^2$, $X^3$, $X^4$, $X^5$, $X^6$, $X^7$, and $X^8$ is nitrogen;

wherein $Y^1$ is selected from the group consisting of BR', NR', PR', O, S, Se, C═O, S═O, $SO_2$, CR'R", SiR'R", and GeR'R";

wherein $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, or wherein any two adjacent substituents are optionally joined to form a ring, which can be further substituted;

wherein the ligand $L_A$ is coordinated to a metal M;

wherein the ligand $L_A$ is optionally linked with other ligands to comprise a tridentate, tetradentate, pentadentate or hexadentate ligand; and wherein M is optionally coordinated to other ligands.

22. A formulation comprising a compound comprising ligand $L_A$ of formula I:

(II)

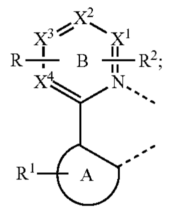

wherein ring A is a 5-membered or 6-membered carbocyclic or heterocyclic ring;

wherein R is fused to ring B and has formula II:

(II)

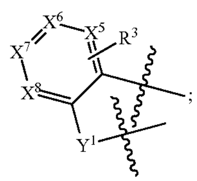

wherein the wave lines indicate bonds to ring B;

wherein $R^1$ and $R^3$ each independently represent mono, di, tri, or tetra substitution, or no substitution;

wherein $R^2$ represents mono or di substitution, or no substitution;

wherein $X^1$, $X^2$, $X^3$, $X^4$, $X^5$, $X^6$, $X^7$, and $X^8$ are each independently carbon or nitrogen;

wherein at least one of $X^1$, $X^2$, $X^3$, $X^4$, $X^5$, $X^6$, $X^7$, and $X^8$ is nitrogen;

wherein $Y^1$ is selected from the group consisting of BR', NR', PR', O, S, Se, C═O, S═O, $SO_2$, CR'R", SiR'R", and GeR'R";

wherein $R^1$, $R^2$, $R^3$, R', and R" are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, or wherein any two adjacent substituents are optionally joined to form a ring, which can be further substituted;

wherein the ligand $L_A$ is coordinated to metal M;

wherein the ligand $L_A$ is optionally linked with other ligands to comprise a tridentate, tetradentate, pentadentate or hexadentate ligand; and wherein M is optionally coordinated to other ligands.

* * * * *